US009780069B2

(12) United States Patent
Haga et al.

(10) Patent No.: US 9,780,069 B2
(45) Date of Patent: Oct. 3, 2017

(54) SEMICONDUCTOR DEVICE

(71) Applicant: ROHM CO., LTD., Kyoto (JP)

(72) Inventors: Motoharu Haga, Kyoto (JP); Shingo Yoshida, Kyoto (JP); Yasumasa Kasuya, Kyoto (JP); Toichi Nagahara, Kyoto (JP); Akihiro Kimura, Kyoto (JP); Kenji Fujii, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 199 days.

(21) Appl. No.: 14/664,168

(22) Filed: Mar. 20, 2015

(65) Prior Publication Data

US 2015/0200181 A1 Jul. 16, 2015

Related U.S. Application Data

(63) Continuation of application No. 13/379,329, filed as application No. PCT/JP2010/060308 on Jun. 17, 2010, now abandoned.

(30) Foreign Application Priority Data

Jun. 18, 2009 (JP) ................................ 2009-145637
Jun. 24, 2009 (JP) ................................ 2009-149856
(Continued)

(51) Int. Cl.
*H01L 23/00* (2006.01)
*H01L 23/31* (2006.01)
(Continued)

(52) U.S. Cl.
CPC ............ *H01L 24/85* (2013.01); *B23K 20/005* (2013.01); *B23K 20/10* (2013.01); *B23K 20/24* (2013.01);
(Continued)

(58) Field of Classification Search
CPC . H01L 2224/85205; H01L 2224/45147; H01L 2224/78301; H01L 2924/01046;
(Continued)

(56) References Cited

U.S. PATENT DOCUMENTS 4,705,204 A 11/1987 Hirota et al.
5,736,791 A 4/1998 Fujiki et al.
(Continued)

FOREIGN PATENT DOCUMENTS

CN 1291348 A 4/2001
CN 1113412 C 7/2003
(Continued)

*Primary Examiner* — Nathan W Ha
(74) *Attorney, Agent, or Firm* — Rabin & Berdo, P.C.

(57) ABSTRACT

A semiconductor device according to the present invention includes a semiconductor chip, an electrode pad made of a metal material containing aluminum and formed on a top surface of the semiconductor chip, an electrode lead disposed at a periphery of the semiconductor chip, a bonding wire having a linearly-extending main body portion and having a pad bond portion and a lead bond portion formed at respective ends of the main body portion and respectively bonded to the electrode pad and the electrode lead, and a resin package sealing the semiconductor chip, the electrode lead, and the bonding wire, the bonding wire is made of copper, and the entire electrode pad and the entire pad bond portion are integrally covered by a water-impermeable film.

20 Claims, 255 Drawing Sheets

(30) Foreign Application Priority Data

| | | | |
|---|---|---|---|
| Jun. 29, 2009 | (JP) | ................................ | 2009-153919 |
| Sep. 7, 2009 | (JP) | ................................ | 2009-206139 |
| Oct. 20, 2009 | (JP) | ................................ | 2009-241547 |
| Oct. 20, 2009 | (JP) | ................................ | 2009-241548 |
| Oct. 20, 2009 | (JP) | ................................ | 2009-241549 |
| Oct. 20, 2009 | (JP) | ................................ | 2009-241591 |
| Nov. 10, 2009 | (JP) | ................................ | 2009-256873 |
| Nov. 10, 2009 | (JP) | ................................ | 2009-256874 |
| Nov. 10, 2009 | (JP) | ................................ | 2009-256875 |
| Nov. 10, 2009 | (JP) | ................................ | 2009-256877 |
| Nov. 10, 2009 | (JP) | ................................ | 2009-256878 |
| Nov. 10, 2009 | (JP) | ................................ | 2009-256879 |
| Nov. 10, 2009 | (JP) | ................................ | 2009-256880 |
| Nov. 24, 2009 | (JP) | ................................ | 2009-266678 |
| Jan. 5, 2010 | (JP) | ................................ | 2010-000556 |
| Feb. 25, 2010 | (JP) | ................................ | 2010-040398 |

(51) Int. Cl.

| | |
|---|---|
| ***H01L 23/495*** | (2006.01) |
| ***B23K 20/00*** | (2006.01) |
| ***B23K 20/10*** | (2006.01) |
| ***B23K 20/24*** | (2006.01) |
| ***H01L 21/56*** | (2006.01) |

(52) U.S. Cl.

CPC .......... *H01L 21/56* (2013.01); *H01L 23/3107* (2013.01); *H01L 23/4952* (2013.01); *H01L 23/49503* (2013.01); *H01L 23/49513* (2013.01); *H01L 23/49548* (2013.01); *H01L 23/49582* (2013.01); *H01L 24/03* (2013.01); *H01L 24/05* (2013.01); *H01L 24/29* (2013.01); *H01L 24/32* (2013.01); *H01L 24/45* (2013.01); *H01L 24/48* (2013.01); *H01L 24/83* (2013.01); *H01L 24/49* (2013.01); *H01L 24/78* (2013.01); *H01L 2224/02166* (2013.01); *H01L 2224/04042* (2013.01); *H01L 2224/05554* (2013.01); *H01L 2224/05624* (2013.01); *H01L 2224/2919* (2013.01); *H01L 2224/2929* (2013.01); *H01L 2224/29111* (2013.01); *H01L 2224/29113* (2013.01); *H01L 2224/29118* (2013.01); *H01L 2224/29339* (2013.01); *H01L 2224/32225* (2013.01); *H01L 2224/32245* (2013.01); *H01L 2224/45015* (2013.01); *H01L 2224/45124* (2013.01); *H01L 2224/45144* (2013.01); *H01L 2224/45147* (2013.01); *H01L 2224/48091* (2013.01); *H01L 2224/48247* (2013.01); *H01L 2224/48451* (2013.01); *H01L 2224/48453* (2013.01); *H01L 2224/48465* (2013.01); *H01L 2224/48471* (2013.01); *H01L 2224/48479* (2013.01); *H01L 2224/48507* (2013.01); *H01L 2224/48624* (2013.01); *H01L 2224/48639* (2013.01); *H01L 2224/48724* (2013.01); *H01L 2224/48739* (2013.01); *H01L 2224/48747* (2013.01); *H01L 2224/48824* (2013.01); *H01L 2224/48839* (2013.01); *H01L 2224/48847* (2013.01); *H01L 2224/49171* (2013.01); *H01L 2224/73265* (2013.01); *H01L 2224/78301* (2013.01); *H01L 2224/78303* (2013.01); *H01L 2224/78307* (2013.01); *H01L 2224/78309* (2013.01); *H01L 2224/838* (2013.01); *H01L 2224/8314* (2013.01); *H01L 2224/83192* (2013.01); *H01L 2224/83439* (2013.01); *H01L 2224/85045* (2013.01); *H01L 2224/85051* (2013.01); *H01L 2224/8592* (2013.01); *H01L 2224/85181* (2013.01); *H01L 2224/85205* (2013.01); *H01L 2224/85439* (2013.01); *H01L 2224/85986* (2013.01); *H01L 2224/92* (2013.01); *H01L 2224/92247* (2013.01); *H01L 2224/97* (2013.01); *H01L 2924/0102* (2013.01); *H01L 2924/0103* (2013.01); *H01L 2924/014* (2013.01); *H01L 2924/01004* (2013.01); *H01L 2924/0104* (2013.01); *H01L 2924/01005* (2013.01); *H01L 2924/0105* (2013.01); *H01L 2924/01006* (2013.01); *H01L 2924/01007* (2013.01); *H01L 2924/01012* (2013.01); *H01L 2924/01013* (2013.01); *H01L 2924/01014* (2013.01); *H01L 2924/01015* (2013.01); *H01L 2924/01016* (2013.01); *H01L 2924/01019* (2013.01); *H01L 2924/01022* (2013.01); *H01L 2924/01023* (2013.01); *H01L 2924/01028* (2013.01); *H01L 2924/01029* (2013.01); *H01L 2924/0132* (2013.01); *H01L 2924/01033* (2013.01); *H01L 2924/0133* (2013.01); *H01L 2924/01045* (2013.01); *H01L 2924/01046* (2013.01); *H01L 2924/01047* (2013.01); *H01L 2924/01051* (2013.01); *H01L 2924/01066* (2013.01); *H01L 2924/01073* (2013.01); *H01L 2924/01074* (2013.01); *H01L 2924/01075* (2013.01); *H01L 2924/01078* (2013.01); *H01L 2924/01079* (2013.01); *H01L 2924/01082* (2013.01); *H01L 2924/01083* (2013.01); *H01L 2924/01204* (2013.01); *H01L 2924/01206* (2013.01); *H01L 2924/01322* (2013.01); *H01L 2924/01327* (2013.01); *H01L 2924/04941* (2013.01); *H01L 2924/04953* (2013.01); *H01L 2924/05042* (2013.01); *H01L 2924/0665* (2013.01); *H01L 2924/10162* (2013.01); *H01L 2924/10253* (2013.01); *H01L 2924/12042* (2013.01); *H01L 2924/15747* (2013.01); *H01L 2924/181* (2013.01); *H01L 2924/18301* (2013.01); *H01L 2924/19107* (2013.01); *H01L 2924/20752* (2013.01)

(58) Field of Classification Search

CPC ................. H01L 2924/14; H01L 24/85; H01L 2224/48247; H01L 23/49548; H01L 23/3107; H01L 23/49503; H01L 23/49513; H01L 24/49; H01L 24/03; H01L 2224/05554; H01L 2224/02166; H01L 2224/04042

USPC .......................................................... 257/666

See application file for complete search history.

(56) References Cited

U.S. PATENT DOCUMENTS

| | | | | |
|---|---|---|---|---|
| 6,011,305 | A | 1/2000 | Suzuki et al. | |
| 6,033,937 | A * | 3/2000 | Manteghi .......... | H01L 23/49582 257/E23.033 |
| 6,180,891 | B1 * | 1/2001 | Murdeshwar ........ | B23K 20/005 174/260 |
| 2001/0019180 | A1 | 9/2001 | Aoyagi et al. | |
| 2004/0032279 | A1 | 2/2004 | Ishio et al. | |
| 2005/0151253 | A1 | 7/2005 | Nonaka et al. | |
| 2005/0284913 | A1 | 12/2005 | Lim et al. | |
| 2007/0057021 | A1 | 3/2007 | Ikeda et al. | |
| 2009/0159650 | A1 | 6/2009 | Ikeda et al. | |
| 2009/0243054 | A1 | 10/2009 | Yeung et al. | |

(56) References Cited

U.S. PATENT DOCUMENTS

| | | | |
|---|---|---|---|
| 2010/0213619 A1 | 8/2010 | Uno et al. | |
| 2011/0223718 A1 | 9/2011 | Ikeda et al. | |

FOREIGN PATENT DOCUMENTS

| | | | |
|---|---|---|---|
| CN | 1503337 | A | 6/2004 |
| CN | 1988144 | A | 6/2007 |
| EP | 0205190 | A2 | 12/1986 |
| JP | 5226189 | | 2/1977 |
| JP | 61285743 | | 12/1986 |
| JP | 62219628 | | 9/1987 |
| JP | 6351649 | | 3/1988 |
| JP | 63128634 | | 6/1988 |
| JP | 63151054 | | 6/1988 |
| JP | 63283137 | | 11/1988 |
| JP | 1286345 | | 11/1989 |
| JP | 2163951 | | 6/1990 |
| JP | 438859 | | 2/1992 |
| JP | 529495 | | 2/1993 |
| JP | 5326650 | | 12/1993 |
| JP | 680696 | | 10/1994 |
| JP | 7122562 | | 5/1995 |
| JP | 8213422 | A | 8/1996 |
| JP | 8250628 | | 9/1996 |
| JP | 934600 | | 2/1997 |
| JP | 10261664 | | 9/1998 |
| JP | 11135542 | | 5/1999 |
| JP | 11191561 | | 7/1999 |
| JP | 2000195892 | A | 7/2000 |
| JP | 200153207 | A | 2/2001 |
| JP | 2001185552 | A | 7/2001 |
| JP | 20046740 | A | 1/2004 |
| JP | 200479774 | A | 3/2004 |
| JP | 2005108954 | A | 4/2005 |
| JP | 200613512 | A | 1/2006 |
| JP | 200767158 | A | 3/2007 |
| JP | 2008181908 | A | 8/2008 |
| JP | 200929919 | A | 2/2009 |
| JP | 200959962 | A | 3/2009 |
| JP | 2009059878 | A | 3/2009 |

* cited by examiner

| WIRE DIAMETER=38μm | | | | | | | |
|---|---|---|---|---|---|---|---|
| | | COMPARATIVE EXAMPLE 1 | EXAMPLE 1 | COMPARATIVE EXAMPLE 2 | EXAMPLE 2 | COMPARATIVE EXAMPLE 3 | EXAMPLE 3 |
| CAPILLARY | THERMAL CONDUCTIVITY | 4.2 (W/m·K) | 17.7 (W/m·K) | 4.2 (W/m·K) | 17.7 (W/m·K) | 4.2 (W/m·K) | 17.7 (W/m·K) |
| | MATERIAL | CERAMIC | POLYCRYSTALLINE RUBY | CERAMIC | POLYCRYSTALLINE RUBY | CERAMIC | POLYCRYSTALLINE RUBY |
| FAB | | INTENDED FAB DIAMETER : 70um (FAB DIAMETER/WIRE DIAMETER=1.84) | | INTENDED FAB DIAMETER : 75um (FAB DIAMETER/WIRE DIAMETER=1.97) | | INTENDED FAB DIAMETER : 80um (FAB DIAMETER/WIRE DIAMETER=2.11) | |
| | | FAB VOLUME/(WIRE DIAMETER)$^3$=3.27 | | FAB VOLUME/(WIRE DIAMETER)$^3$=4.02 | | FAB VOLUME/(WIRE DIAMETER)$^3$=4.88 | |
| CURRENT APPLICATION CONDITIONS | | APPLIED CURRENT : 120mA APPLICATION TIME : 650μsec | | APPLIED CURRENT : 120mA APPLICATION TIME : 730μsec | | APPLIED CURRENT : 120mA APPLICATION TIME : 880μsec | |
| FAB SHAPE MODE | TRUE SPHERE | 105/200 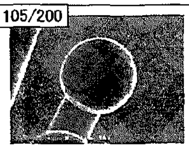 | 168/200 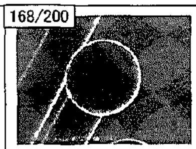 | 154/200 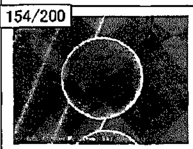 | 182/200 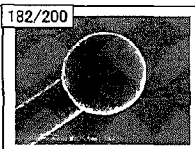 | 171/200 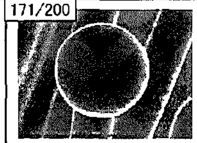 | 174/200 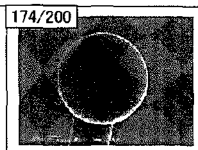 |
| | OFF-CENTER | 53/200 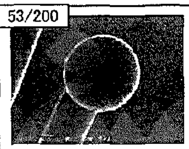 | 24/200 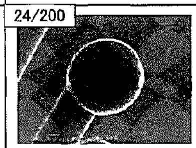 | 25/200 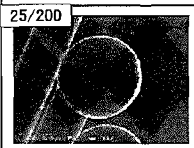 | 15/200 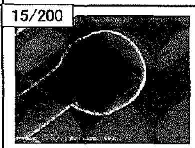 | 20/200 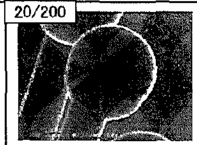 | 13/200 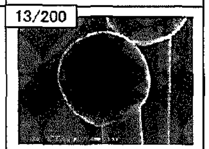 |
| | CLUB | 31/200 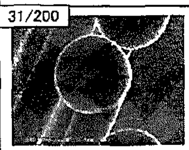 | 8/200 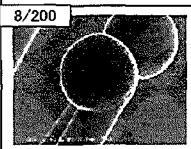 | 14/200 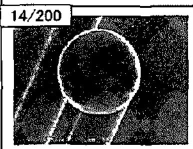 | 3/200 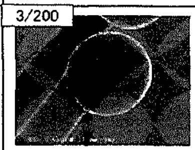 | 7/200 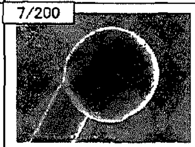 | 3/200 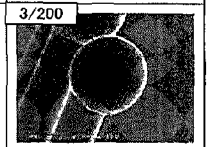 |
| | UNMELTED | 11/200 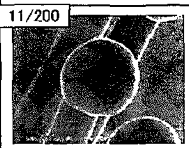 | — | 7/200 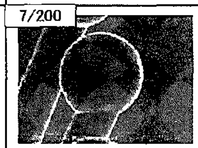 | — | 2/200 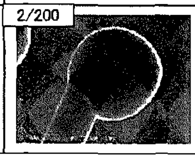 | — |

FIG. 25

| | | | | | | | | |
|---|---|---|---|---|---|---|---|---|
| | | WIRE DIAMETER= 38μm | | | WIRE DIAMETER= 30μm | | | |
| | | COMPARATIVE EXAMPLE 4 | EXAMPLE 4 | EXAMPLE 5 | COMPARATIVE EXAMPLE 6 | EXAMPLE 6 | COMPARATIVE EXAMPLE 7 | EXAMPLE 7 |
| CAPILLARY | THERMAL CONDUCTI-VITY | 4.2 (W/m·K) | 17.7 (W/m·K) | 43.0 (W/m·K) | 4.2 (W/m·K) | 17.7 (W/m·K) | 4.2 (W/m·K) | 17.7 (W/m·K) |
| | MATERIAL | CERAMIC | POLYCRYSTALLINE RUBY | MONOCRYSTALLINE RUBY | CERAMIC | POLYCRYSTALLINE RUBY | CERAMIC | POLYCRYSTALLINE RUBY |
| FAB | | INTENDED FAB DIAMETER : 85um (FAB DIAMETER/WIRE DIAMETER=2.24) | | INTENDED FAB DIAMETER : 70um (FAB DIAMETER/WIRE DIAMETER=1.84) | INTENDED FAB DIAMETER : 54um (FAB DIAMETER/WIRE DIAMETER=1.80) | | INTENDED FAB DIAMETER : 57um (FAB DIAMETER/WIRE DIAMETER=1.90) | |
| | | FAB VOLUME/(WIRE DIAMETER)$^3$=5.86 | | FAB VOLUME/(WIRE DIAMETER)$^3$=3.27 | FAB VOLUME/(WIRE DIAMETER)$^3$=3.05 | | FAB VOLUME/(WIRE DIAMETER)$^3$=3.59 | |
| CURRENT APPLICATION CONDITIONS | | APPLIED CURRENT : 120mA APPLICATION TIME : 960μsec | | APPLIED CURRENT : 125mA APPLICATION TIME : 650μsec | APPLIED CURRENT : 60mA APPLICATION TIME : 760μsec | | APPLIED CURRENT : 60mA APPLICATION TIME : 840μsec | |
| FAB SHAPE MODE | TRUE SPHERE | 197/200 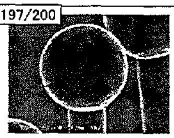 | 194/200 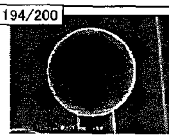 | 186/200  | 129/200 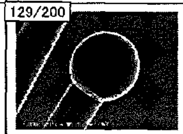 | 192/200 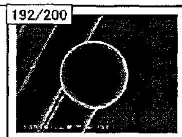 | 150/200 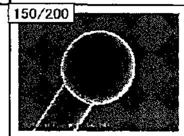 | 200/200 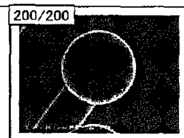 |
| | OFF-CENTER | 3/200 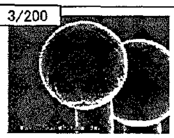 | 6/200 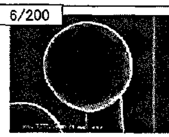 | 7/200 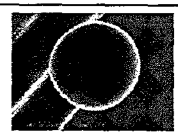 | 38/200 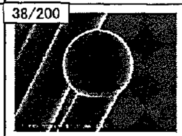 | 3/200 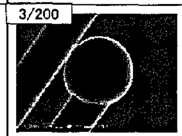 | 39/200 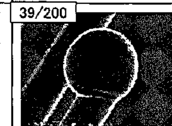 | — |
| | CLUB | — | — | 7/200  | 17/200 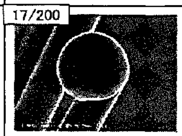 | 5/200 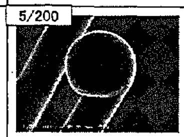 | 8/200 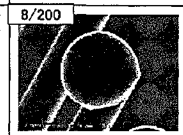 | — |
| | UNMELTED | — | — | — | 16/200 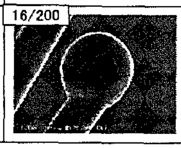 | — | 3/200 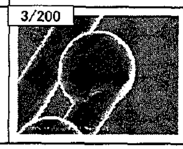 | — |

FIG. 26

| WIRE DIAMETER=25 μm | | | | | |
|---|---|---|---|---|---|
| | | COMPARATIVE EXAMPLE 8 | EXAMPLE 8 | COMPARATIVE EXAMPLE 9 | EXAMPLE 9 |
| CAPILLARY | THERMAL CONDUCTIVITY | 4.2 (W/m・K) | 17.7 (W/m・K) | 4.2 (W/m・K) | 17.7 (W/m・K) |
| | MATERIAL | CERAMIC | POLYCRYSTALLINE RUBY | CERAMIC | POLYCRYSTALLINE RUBY |
| FAB | | INTENDED FAB DIAMETER : 35um (FAB DIAMETER/WIRE DIAMETER=1.40) | | INTENDED FAB DIAMETER : 42um (FAB DIAMETER/WIRE DIAMETER=1.68) | |
| | | FAB VOLUME/(WIRE DIAMETER)$^3$=1.44 | | FAB VOLUME/(WIRE DIAMETER)$^3$=2.48 | |
| CURRENT APPLICATION CONDITIONS | | APPLIED CURRENT : 40mA APPLICATION TIME : 550 μsec | | APPLIED CURRENT : 40mA APPLICATION TIME : 690 μsec | |
| FAB SHAPE MODE | TRUE SPHERE | 173/200 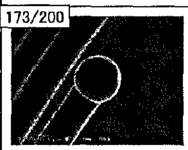 | 184/200 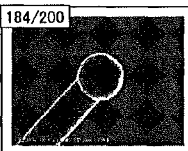 | 150/200 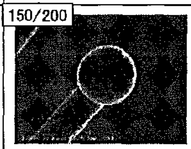 | 200/200 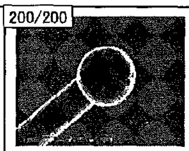 |
| | OFF-CENTER | 17/200 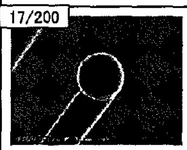 | 9/200 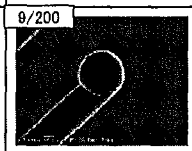 | 23/200 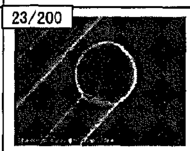 | – |
| | CLUB | 5/200 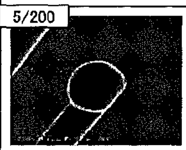 | 2/200 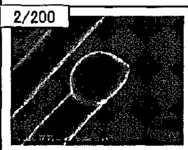 | 12/200 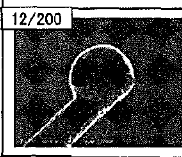 | – |
| | UNMELTED | 5/200 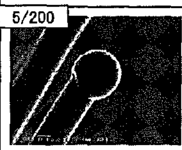 | 5/200 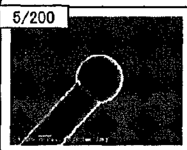 | 15/200 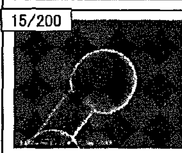 | – |

| | 100h | 200h | 300h | 500h | 700h | 1000h |
|---|---|---|---|---|---|---|
| EXAMPLE | 0/10 | 0/10 | 0/10 | 2/9 | 2/7 | 3/5 |
| COMPARATIVE EXAMPLE | 5/10 | 3/5 | 0/2 | 1/1 | | |

UNIT (PCS.)

FIG. 230

| | 100h | 200h | 300h | 500h | 700h | 1000h |
|---|---|---|---|---|---|---|
| EXAMPLE | 0/30 | - | 0/30 | 0/30 | 0/30 | 0/30 |
| COMPARATIVE EXAMPLE | 0/30 | - | 0/30 | 6/30 | 12/24 | 11/12 |

UNIT (PCS.)

52U

SEMICONDUCTOR DEVICE

CROSS-REFERENCE TO RELATED APPLICATIONS

This application is a continuation application of U.S. application Ser. No. 13/379,329, filed Feb. 28, 2012, which is a National Stage application of International Application PCT/JP2010/060308 having the International Filing Date of Jun. 17, 2010, and having the benefit of the earlier filing dates of Japanese Application No. 2009-145637, filed Jun. 18, 2009, Japanese Application No. 2009-149856, filed Jun. 24, 2009, Japanese Application No. 2009-153919, filed Jun. 29, 2009, Japanese Application No. 2009-206139, filed Sep. 7, 2009, Japanese Application No. 2009-241547, filed Oct. 20, 2009, Japanese Application No. 2009-241548, filed Oct. 20, 2009, Japanese Application No. 2009-241549, filed Oct. 20, 2009, Japanese Application No. 2009-241591, filed Oct. 20, 2009, Japanese Application No. 2009-256873, filed Nov. 10, 2009, Japanese Application No. 2009-256874, filed Nov. 10, 2009, Japanese Application No. 2009-256875, filed Nov. 10, 2009, Japanese Application No. 2009-256877, filed Nov. 10, 2009, Japanese Application No. 2009-256878, filed Nov. 10, 2009, Japanese Application No. 2009-256879, filed Nov. 10, 2009, Japanese Application No. 2009-256880, filed Nov. 10, 2009, Japanese Application No. 2009-266678, filed Nov. 24, 2009, Japanese Application No. 2010-000556, filed Jan. 5, 2010, and Japanese Application No. 2010-040398, filed Feb. 25, 2010. All of the identified applications are fully incorporated herein by reference.

FIELD OF THE ART

The present invention relates to a semiconductor device.

BACKGROUND ART

Semiconductor devices are normally distributed in a state where a semiconductor chip is sealed (packaged) together with bonding wires by a resin. Inside the package, electrode pads of the semiconductor chip are electrically connected by the bonding wires to electrode leads that are partially exposed from the resin package. Electrical connection of the semiconductor chip and a mounting board is thus achieved by connecting the electrode leads as external terminals to wirings on a mounting board.

Although conventionally, gold wires are mainly used as the bonding wires connecting the electrode pads and the electrode leads, recently, the use of copper wires that are cheaper than gold wires is being examined for reducing the use of high-priced gold.

PRIOR ART DOCUMENT(S)

Patent Document(s)

Patent Document 1: Japanese Published Unexamined Patent Application No. Hei 10-261664

OUTLINE OF THE INVENTION

Object(s) of the Invention

However, when a semiconductor device is placed under a high humidity environment, water may penetrate into an interior of the package. For example, water vapor inside a test tank readily penetrates into the interior of the package during execution of a humidity resistance evaluation test, such as a PCT (pressure cooker test), HAST (highly accelerated temperature and humidity stress test).

In a case where copper wires are used as the wires connected to electrode pads made of aluminum that have become the mainstream in recent years, corrosion of aluminum proceeds readily near a bond interface of an electrode pad and a bonding wire when the penetrating water enters the bond interface. An electrically open state may thus occur between the pad and the wire.

An object of the present invention is to provide a semiconductor device that can be improved in reliability of connection of a bonding wire made of copper with an electrode pad made of a metal material that contains aluminum.

Means for Achieving the Object(s)

A semiconductor device according to the present invention for achieving the above object includes a semiconductor chip, an electrode pad made of a metal material containing aluminum and formed on a top surface of the semiconductor chip, an electrode lead disposed at a periphery of the semiconductor chip, a bonding wire having a linearly-extending main body portion and having a pad bond portion and a lead bond portion formed at respective ends of the main body portion and respectively bonded to the electrode pad and the electrode lead, and a resin package sealing the semiconductor chip, the electrode lead, and the bonding wire, the bonding wire is made of copper, and the entire electrode pad and the entire pad bond portion are integrally covered by a water-impermeable film.

By this arrangement, the entire electrode pad and the entire pad bond portion are integrally covered by the water-impermeable film. A peripheral edge of a bond interface (pad bond interface) of the electrode pad and the pad bond portion is thereby covered by the water-impermeable film without being exposed.

Thus, even if water penetrates into an interior of the resin package, the water can be blocked by the water-impermeable film and contact of the pad bond interface with water can be suppressed. Consequently, progress of corrosion of the electrode pad can be suppressed and occurrence of an electrically open state between the pad and the wire can be suppressed. Connection reliability of the semiconductor device can thus be improved.

BRIEF DESCRIPTION OF THE DRAWINGS

FIG. 24 is a diagram showing SEM images and FAB forming conditions of Examples 1 to 3 and Comparative Examples 1 to 3 of the third preferred embodiment.

FIG. 25 is a diagram showing SEM images and FAB forming conditions of Examples 4 to 7 and Comparative Examples 4 to 7 of the third preferred embodiment.

FIG. 26 is a diagram showing SEM images and FAB forming conditions of Examples 8 and 9 and Comparative Examples 8 and 9 of the third preferred embodiment.

FIG. 86 is a schematic plan view of the semiconductor device shown in FIG. 85 as viewed from a rear surface side and shows a state where illustration of a resin package is omitted.

FIG. 87 is a schematic sectional view of a second modification example of the semiconductor device shown in FIG. 83.

FIG. 88 is a schematic plan view of the semiconductor device shown in FIG. 87 as viewed from a rear surface side and shows a state where illustration of a resin package is omitted.

FIG. 89 is a schematic sectional view of a third modification example of the semiconductor device shown in FIG. 83.

FIG. 90 is a schematic plan view of the semiconductor device shown in FIG. 89 as viewed from a rear surface side and shows a state where illustration of a resin package is omitted.

FIG. 91 is a schematic sectional view of a fourth modification example of the semiconductor device shown in FIG. 83.

FIG. 92 is a schematic sectional view of a semiconductor device according to another mode of the first modification example.

FIG. 93 is a schematic sectional view of a semiconductor device according to another mode of the second modification example.

FIG. 94 is a schematic sectional view of a semiconductor device according to another mode of the third modification example.

FIG. 95 is a schematic bottom view of a semiconductor device according to an eleventh preferred embodiment of the present invention.

FIG. 96 is a schematic sectional view of the semiconductor device according to the eleventh preferred embodiment of the present invention.

FIG. 97 is an enlarged view of principal portions of a portion surrounded by a broken-line circle in FIG. 96.

Figure 2:
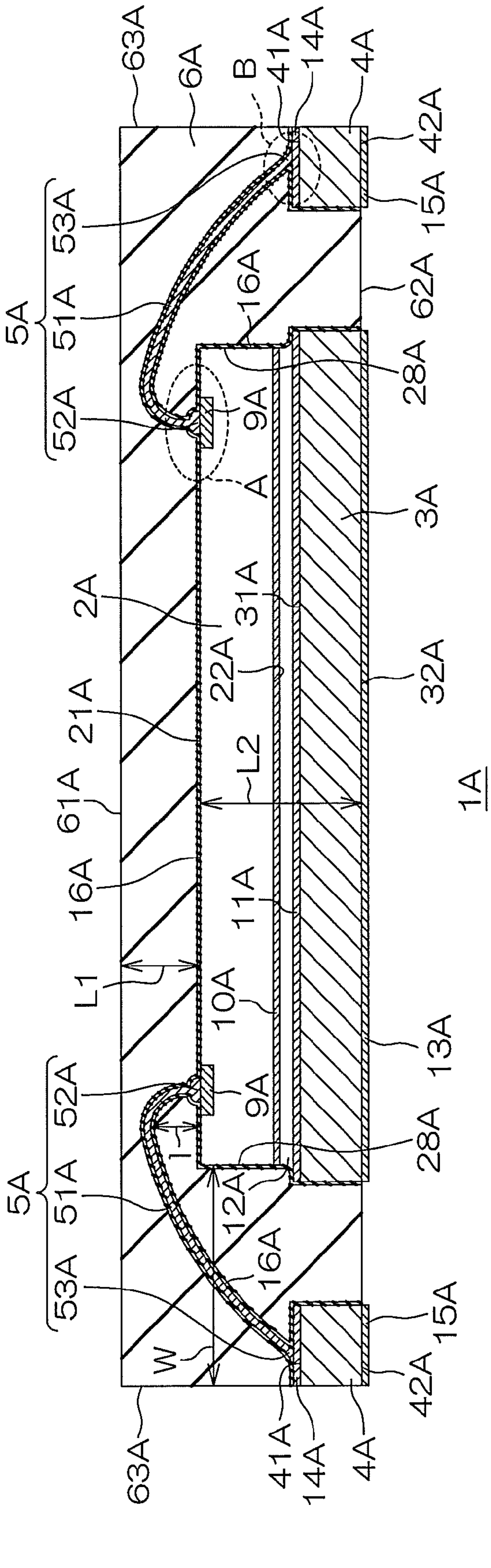
FIG. 2 is a schematic sectional view of the semiconductor device according to the first preferred embodiment of the present invention.
Figure 98A:
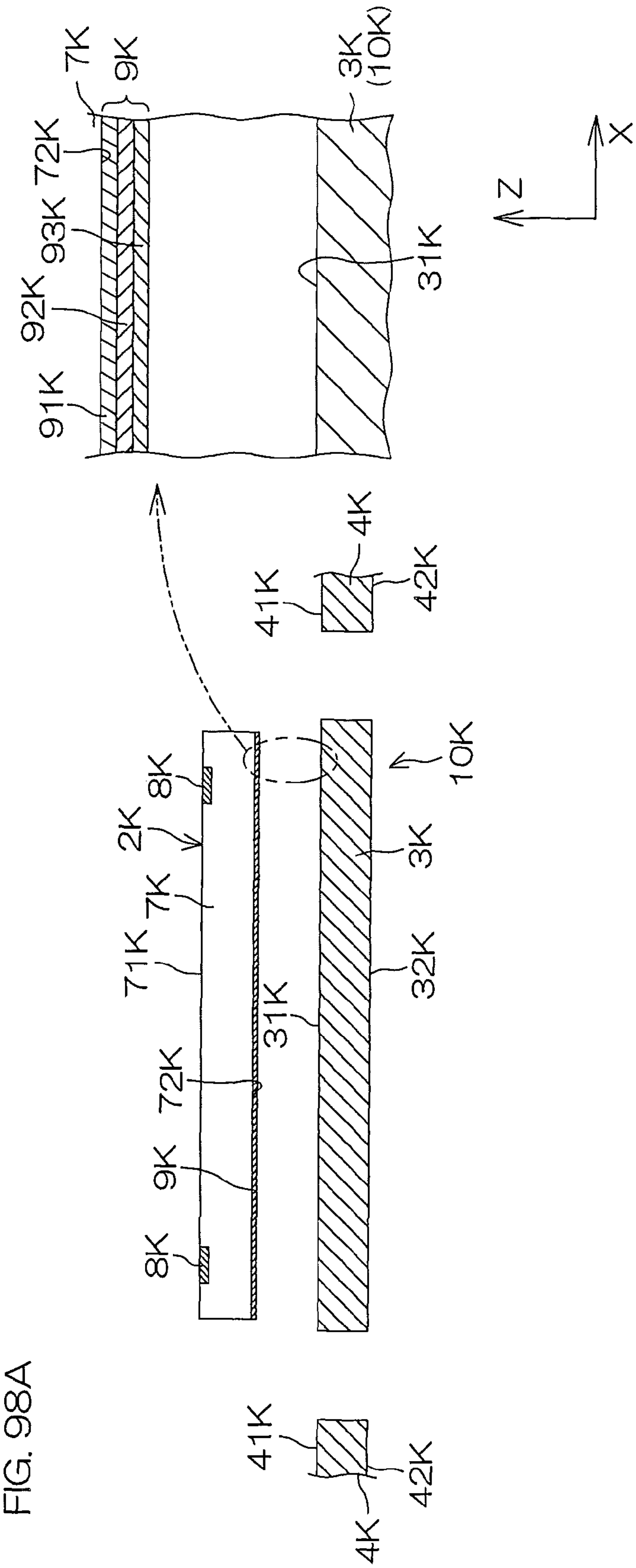

FIG. 98A is a schematic sectional view for describing a method for manufacturing the semiconductor device shown in FIG. 2.

Figure 98B:
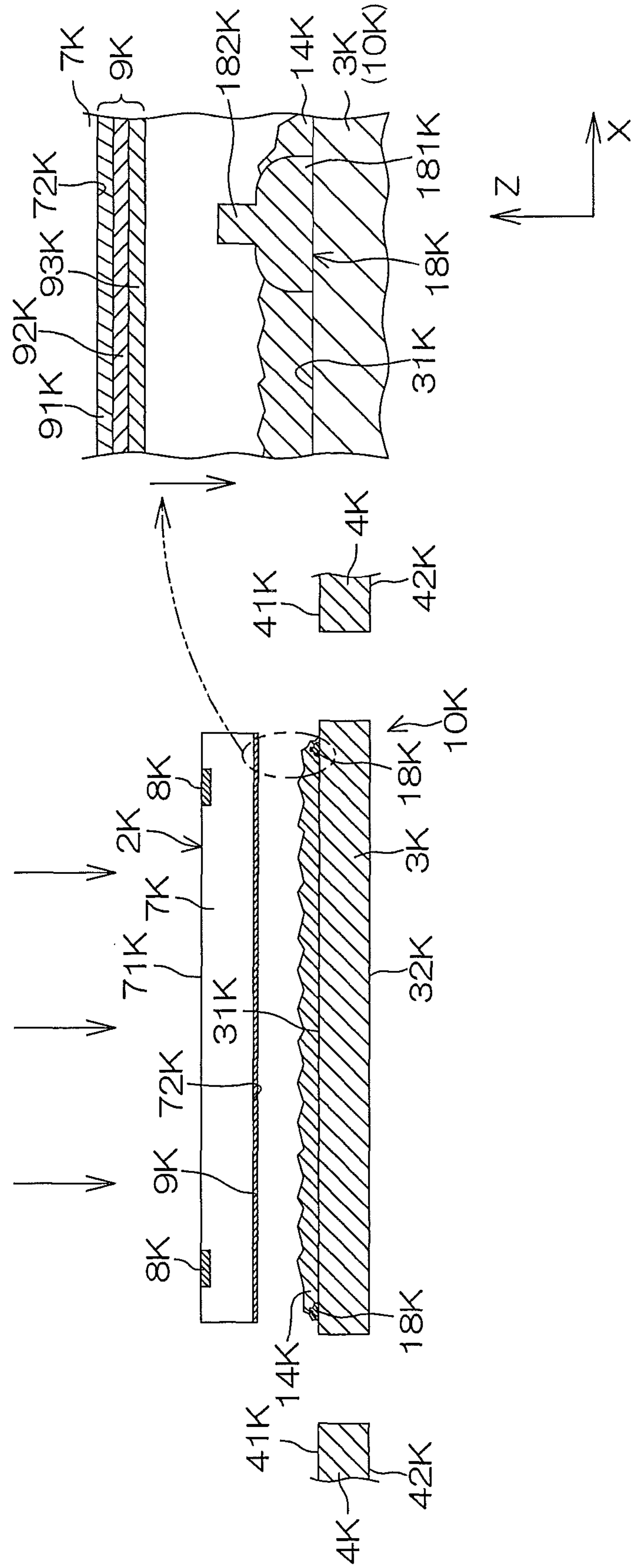

FIG. 98B is a schematic sectional view of a step subsequent to that of FIG. 98A.

Figure 98C:
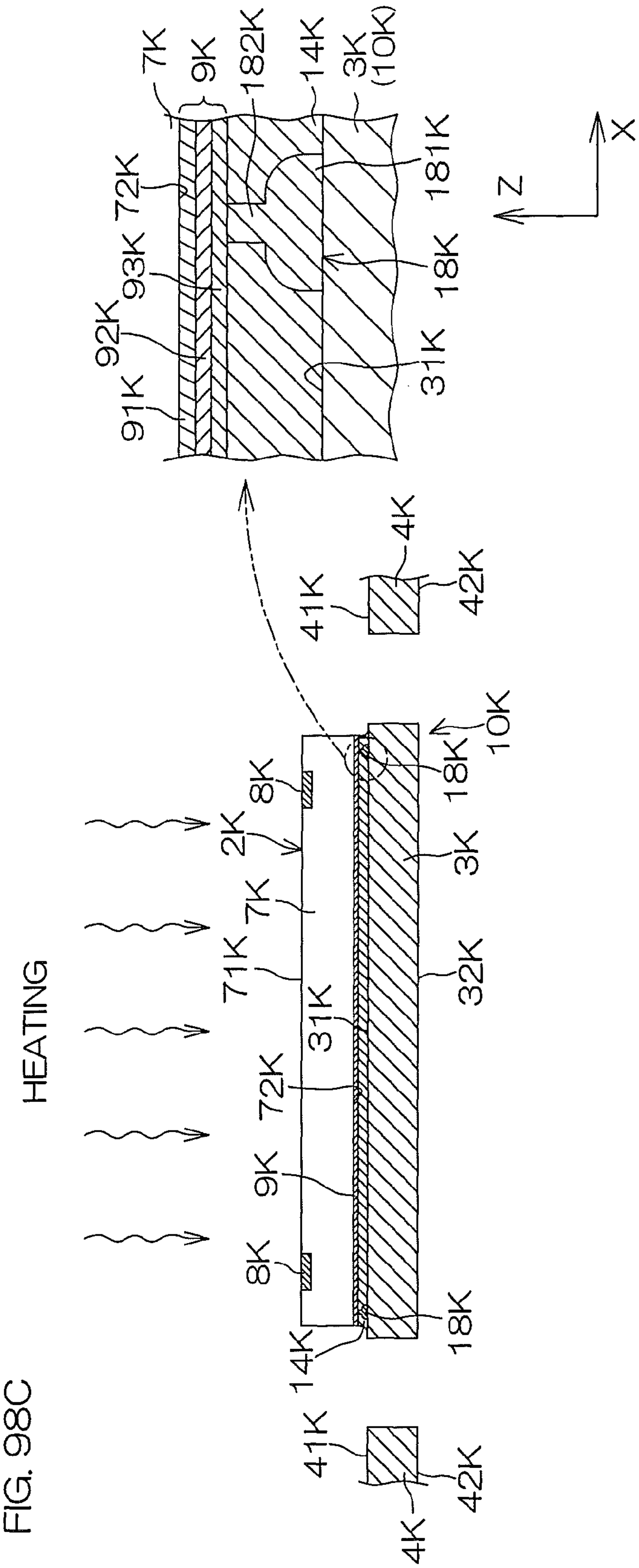

FIG. 98C is a schematic sectional view of a step subsequent to that of FIG. 98B.

Figure 98D:
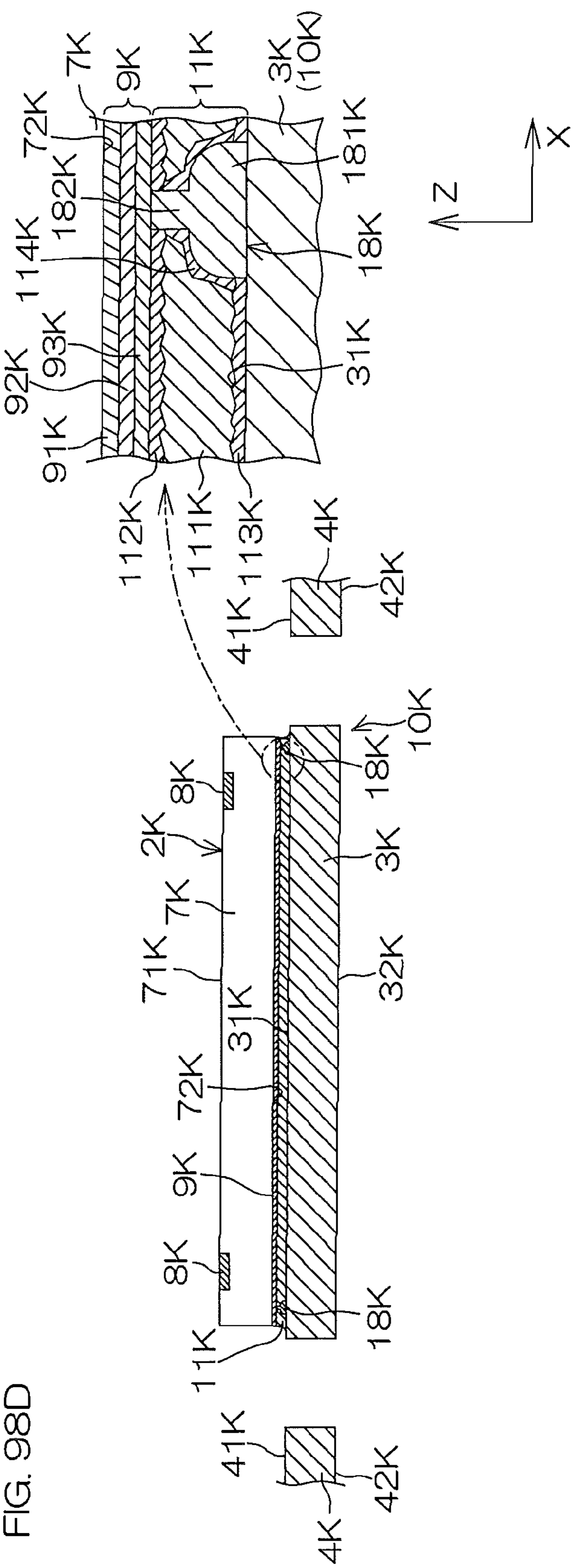

FIG. 98D is a schematic sectional view of a step subsequent to that of FIG. 98C.

Figure 96:
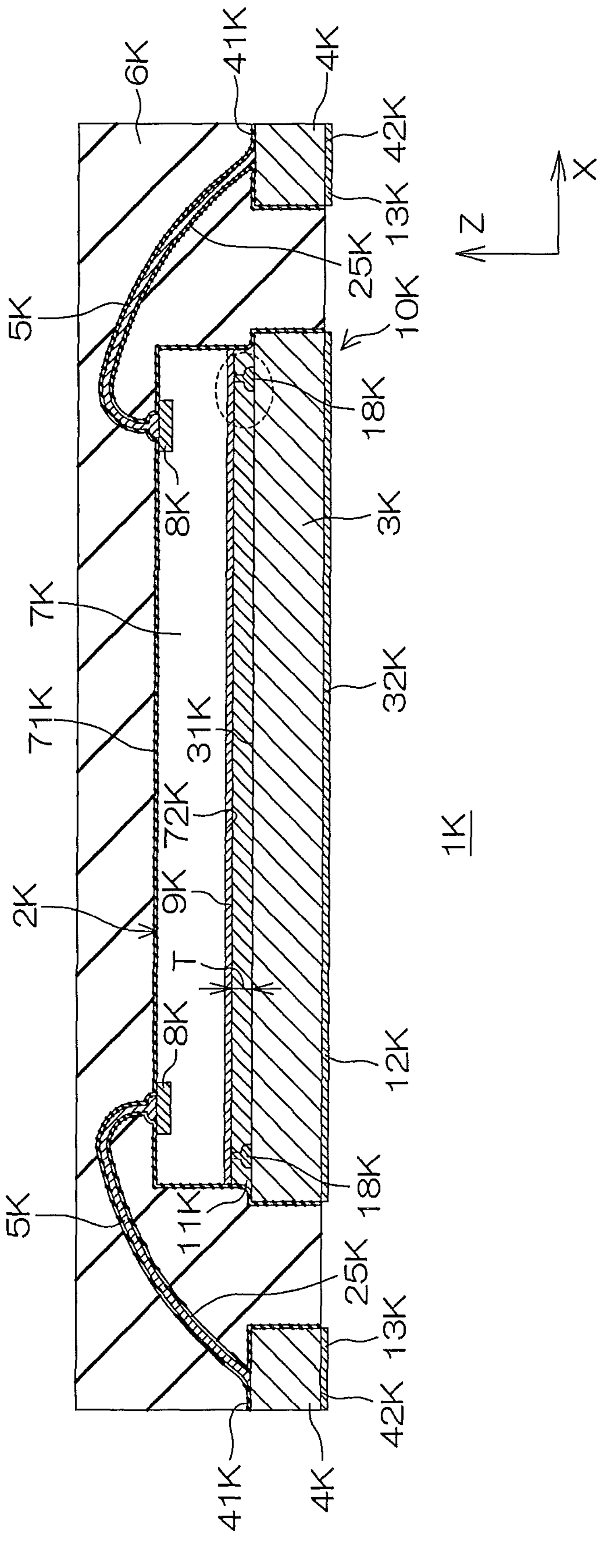
Figure 99:
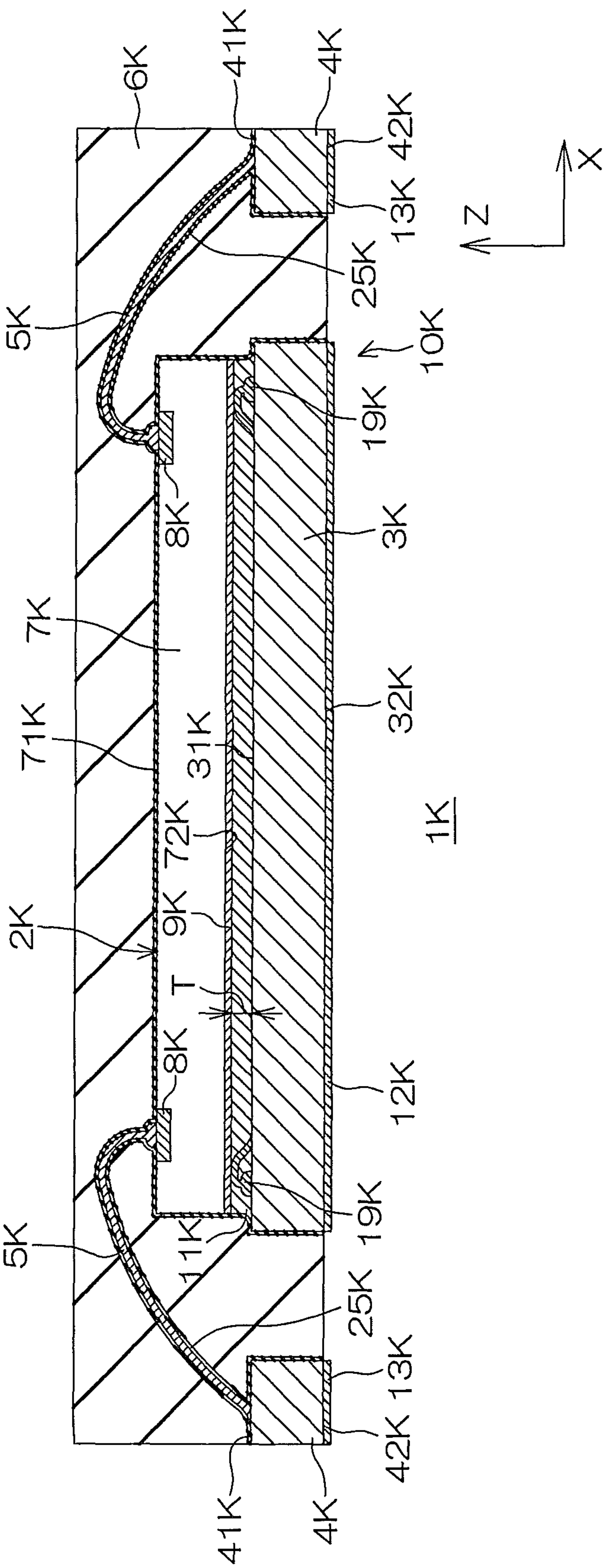

FIG. 99 is a diagram of a first modification example of the semiconductor device of FIG. 96.

Figure 100:
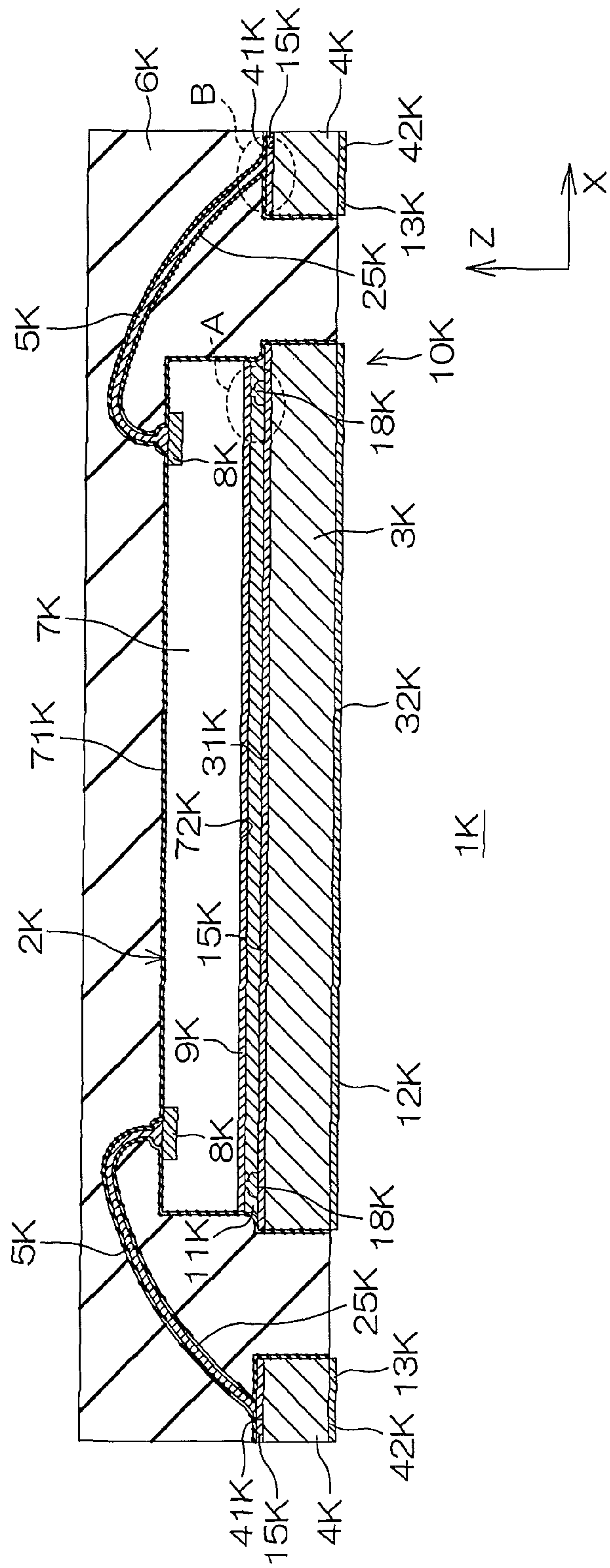

FIG. 100 is a diagram of a second modification example of the semiconductor device of FIG. 96.

Figure 101A:
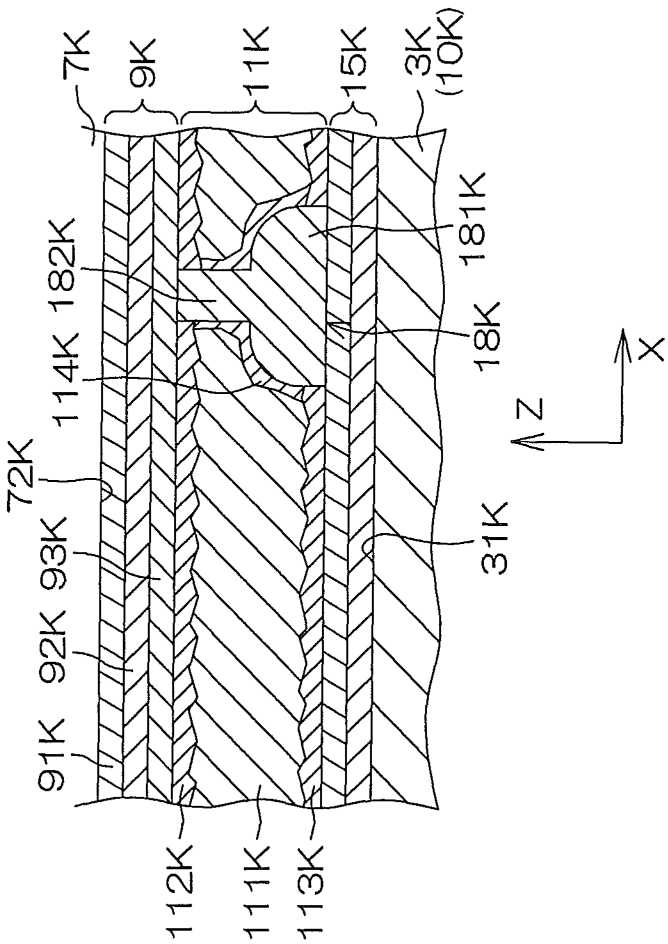

FIG. 101A is an enlarged view of principal portions of a portion surrounded by a broken-line circle A in FIG. 100.

Figure 101B:
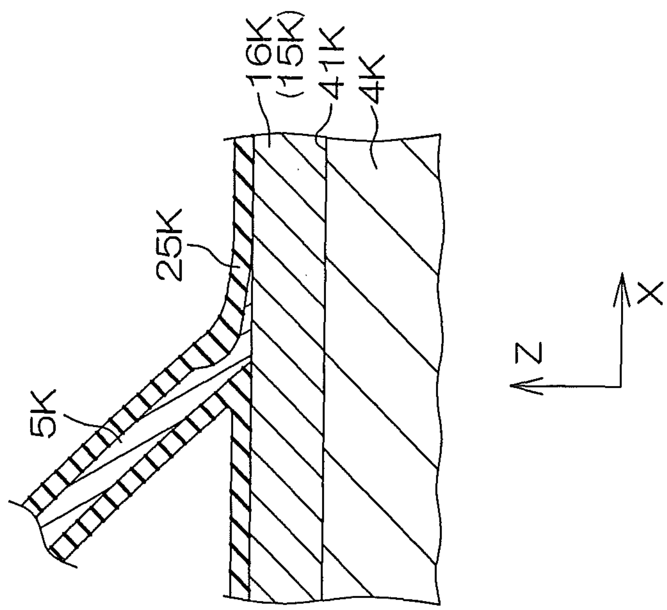

FIG. 101B is an enlarged view of principal portions of a portion surrounded by a broken-line circle B in FIG. 100.

Figure 102:
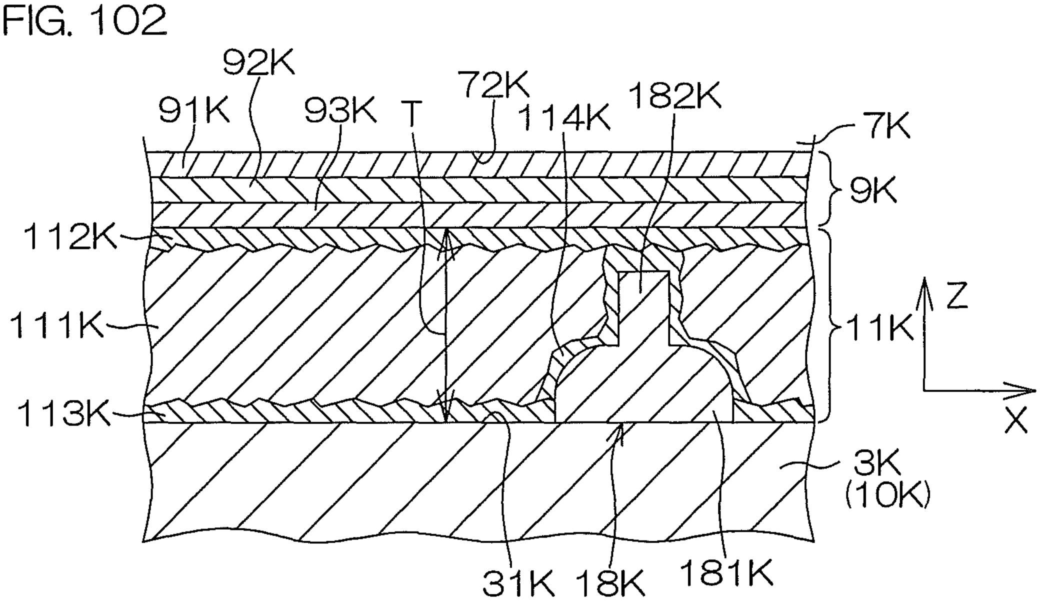

FIG. 102 is a diagram of the second modification example of the semiconductor device of FIG. 96.

Figure 103:
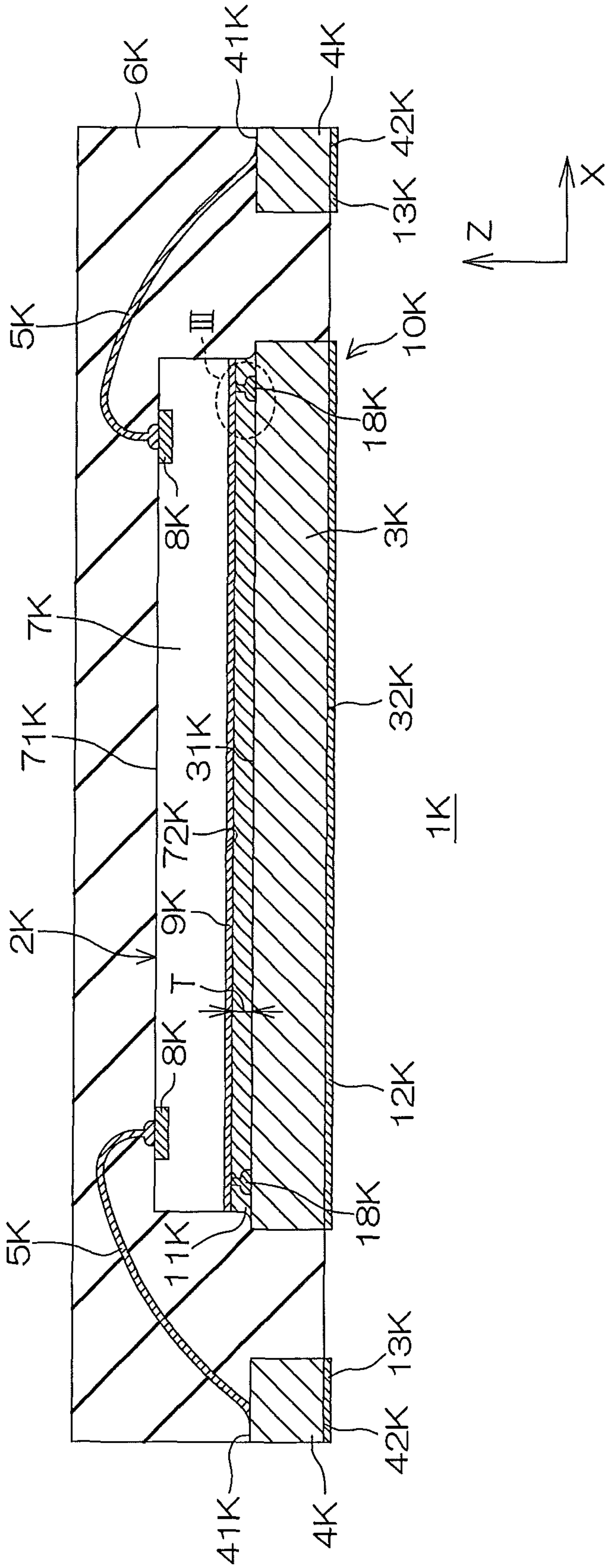

FIG. 103 is a diagram of a third modification example of the semiconductor device of FIG. 96.

Figure 104:
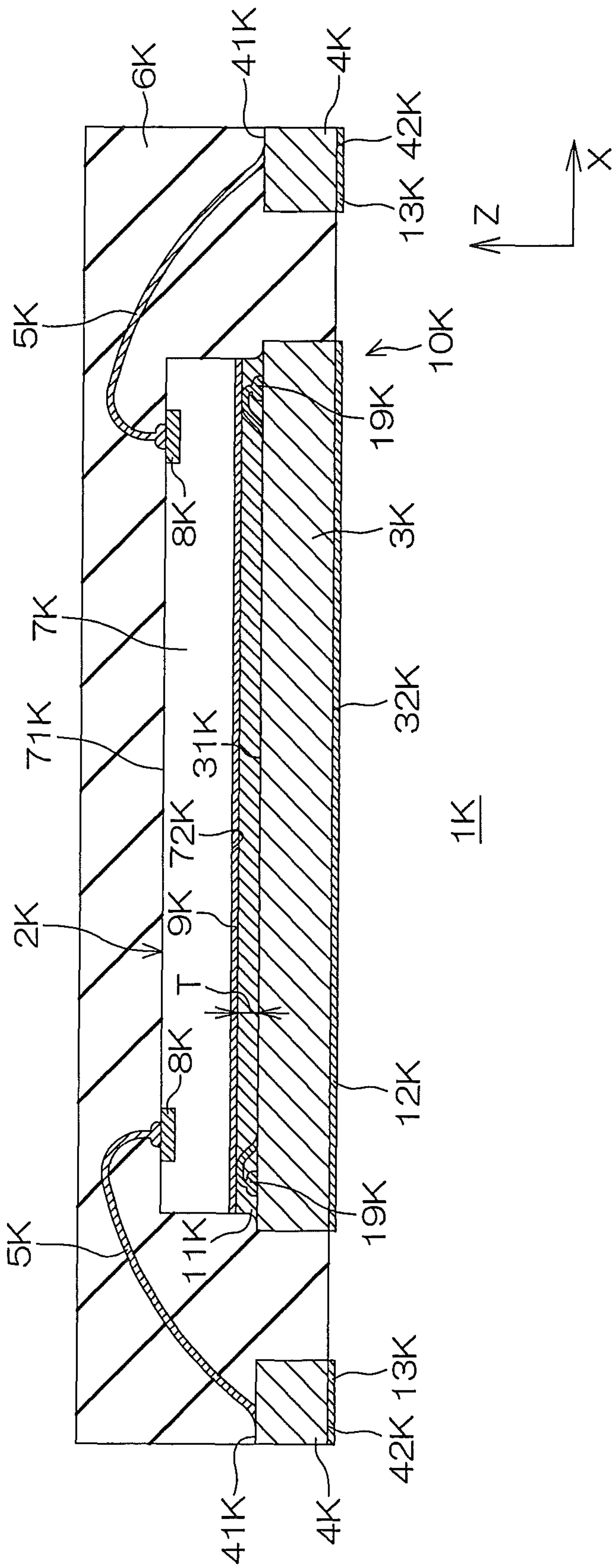

FIG. 104 is a schematic sectional view of a semiconductor device according to another mode of the first modification example.

Figure 105:
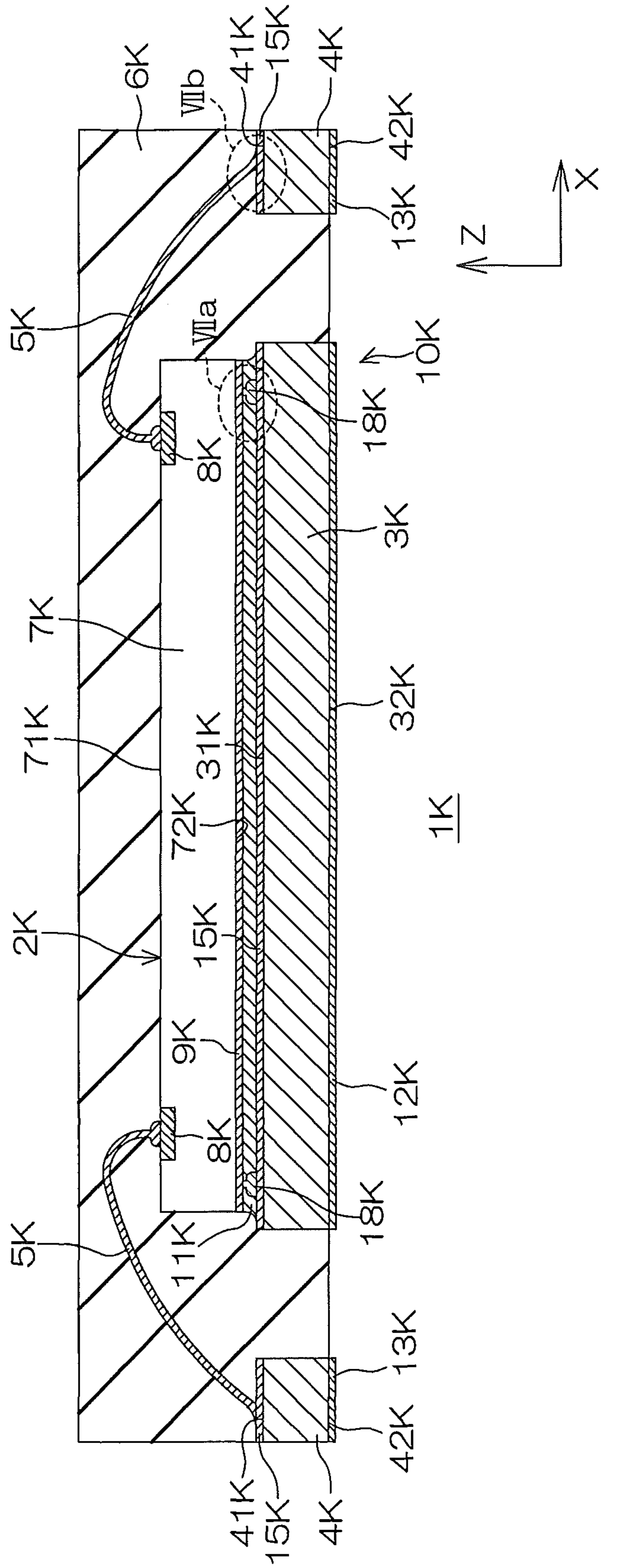

FIG. 105 is a schematic sectional view of a semiconductor device according to another mode of the second modification example.

Figure 106:
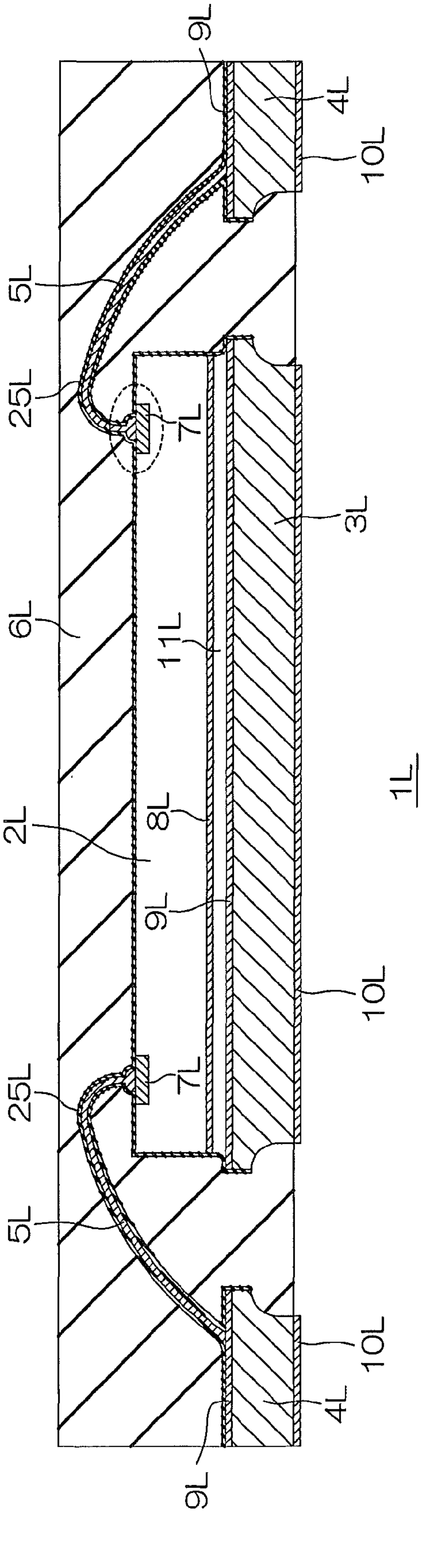

FIG. 106 is a schematic sectional view of a semiconductor device according to a twelfth preferred embodiment of the present invention.

Figure 107:
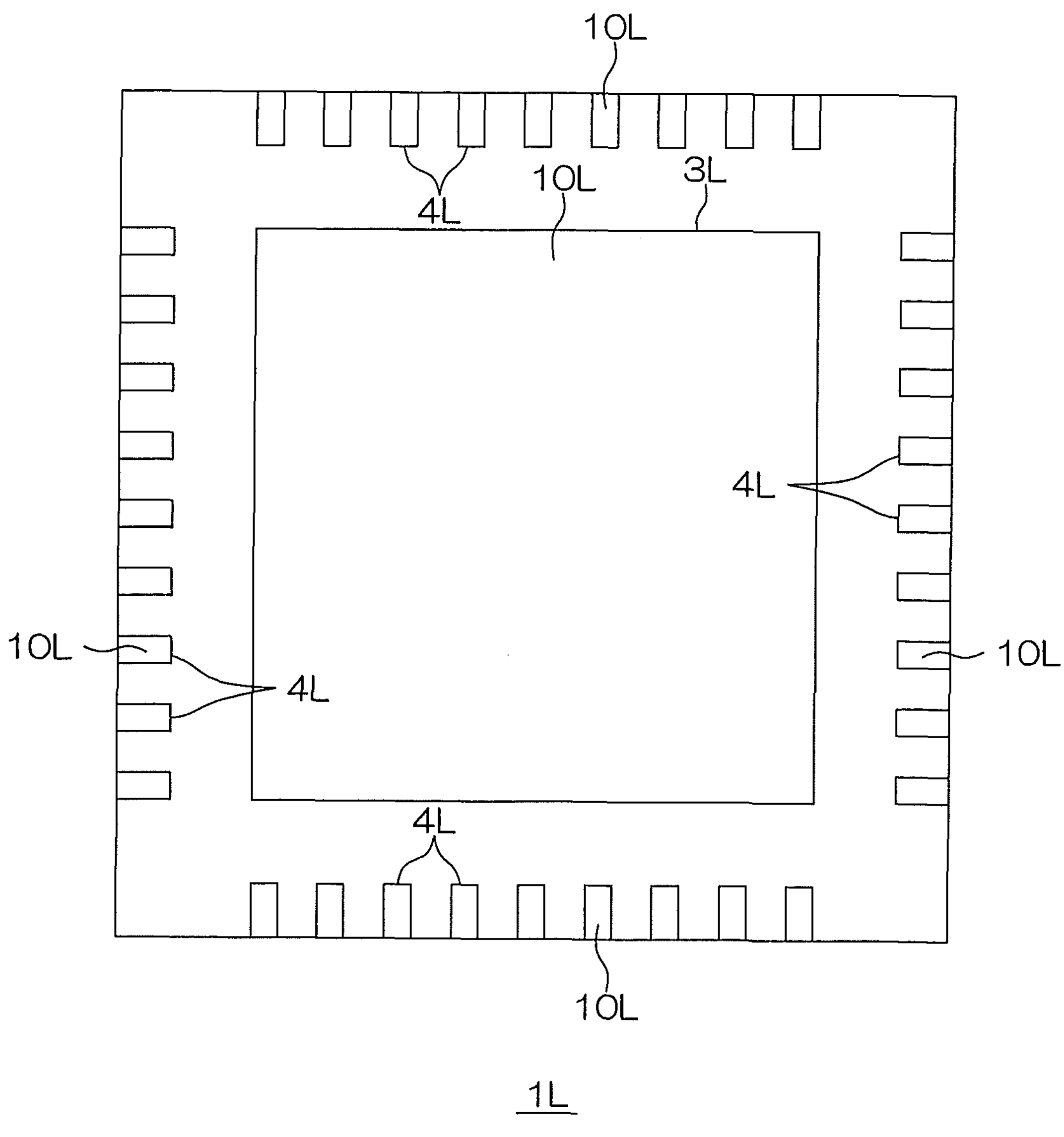

FIG. 107 is a schematic bottom view of the semiconductor device shown in FIG. 106.

Figure 108:
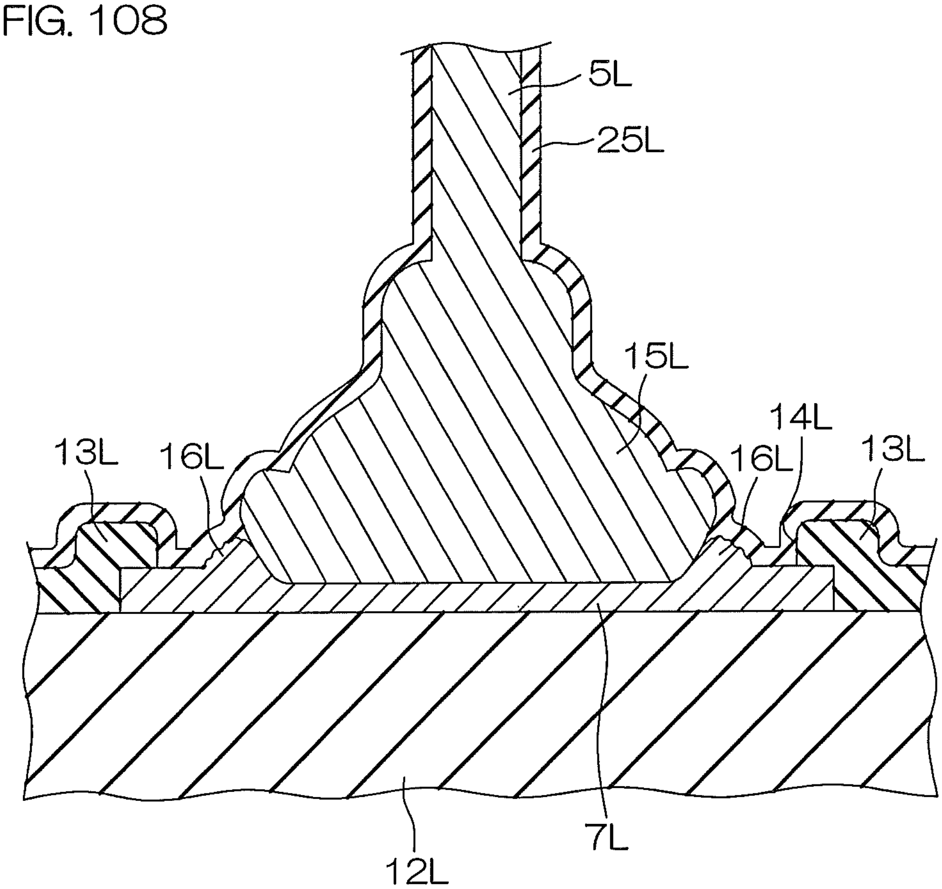

FIG. 108 is an enlarged view of a portion surrounded by broken lines shown in FIG. 106.

Figure 109A:
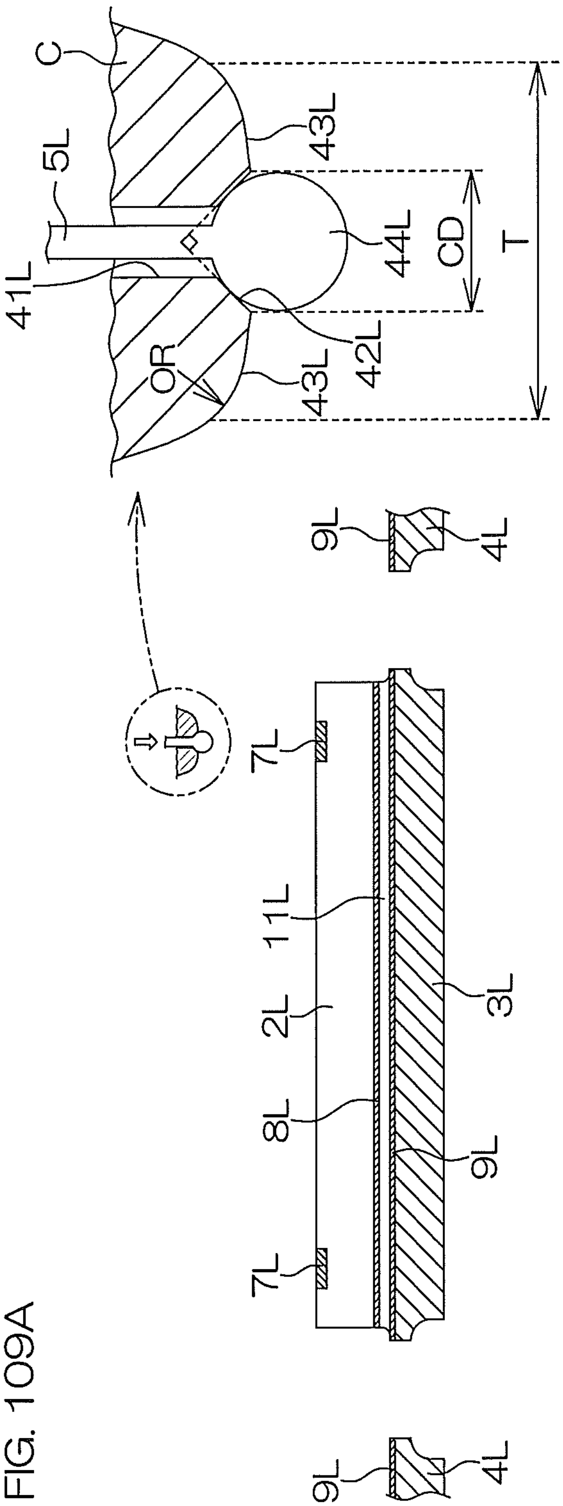

FIG. 109A is a schematic sectional view of a state in a middle of manufacture (middle of wire bonding) of the semiconductor device shown in FIG. 106.

Figure 109B:
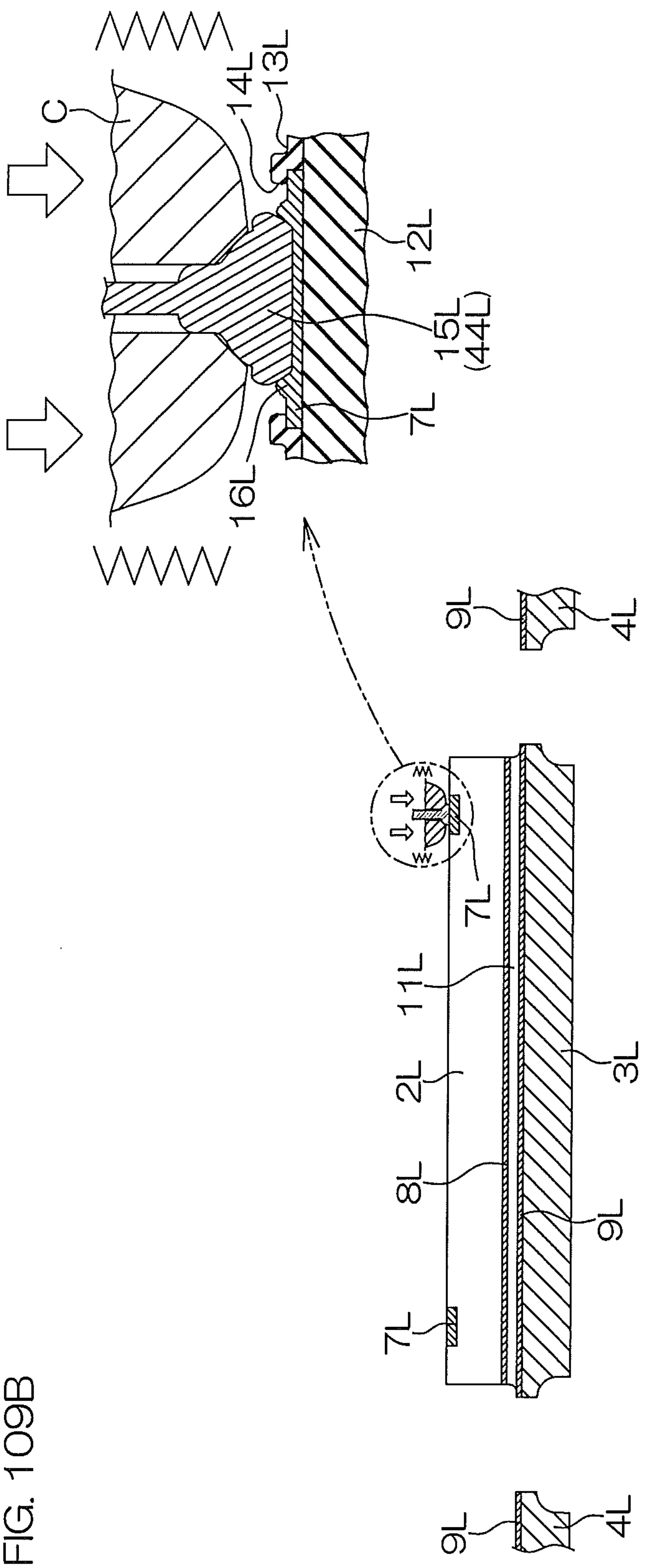

FIG. 109B is a schematic sectional view of a step subsequent to that of FIG. 109A.

Figure 109C:
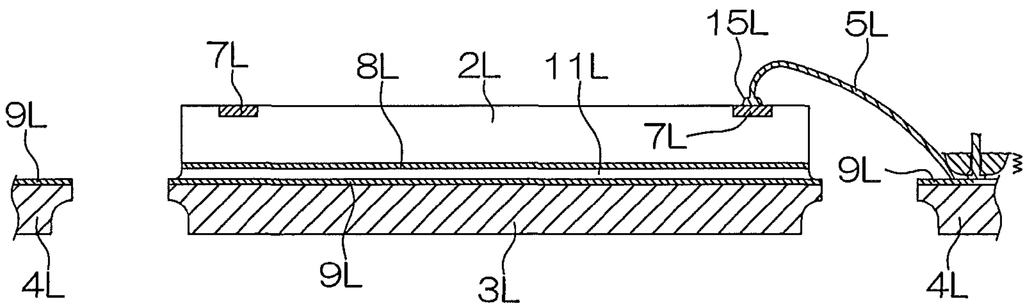

FIG. 109C is a schematic sectional view of a step subsequent to that of FIG. 109B.

Figure 109D:
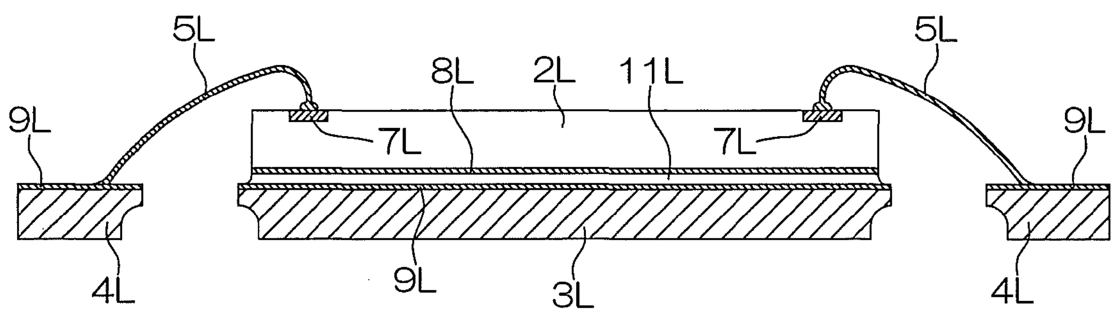

FIG. 109D is a schematic sectional view of a step subsequent to that of FIG. 109C.

Figure 110:
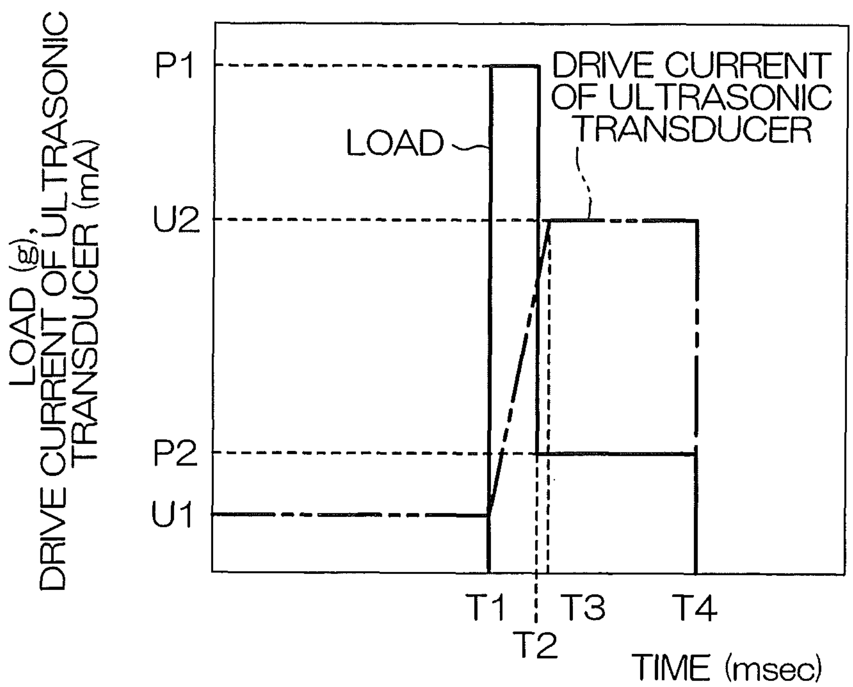

FIG. 110 is a graph of changes with time of a load applied to an FAB and a driving current applied to an ultrasonic transducer during bonding of the FAB to a pad.

Figure 111:
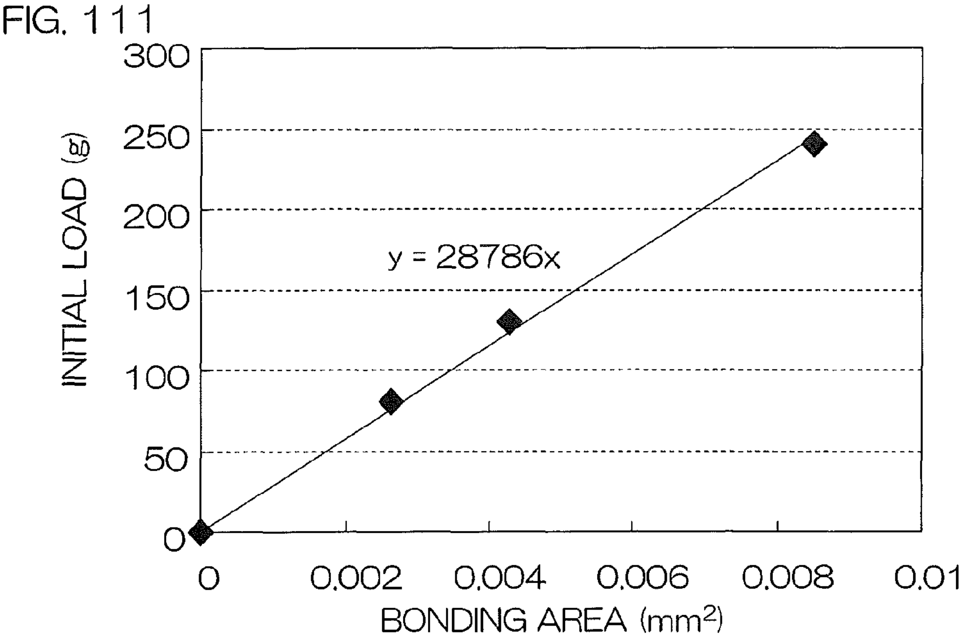

FIG. 111 is a graph of a relationship between an area of bonding of a first ball portion to a pad and an initial load.

Figure 112:
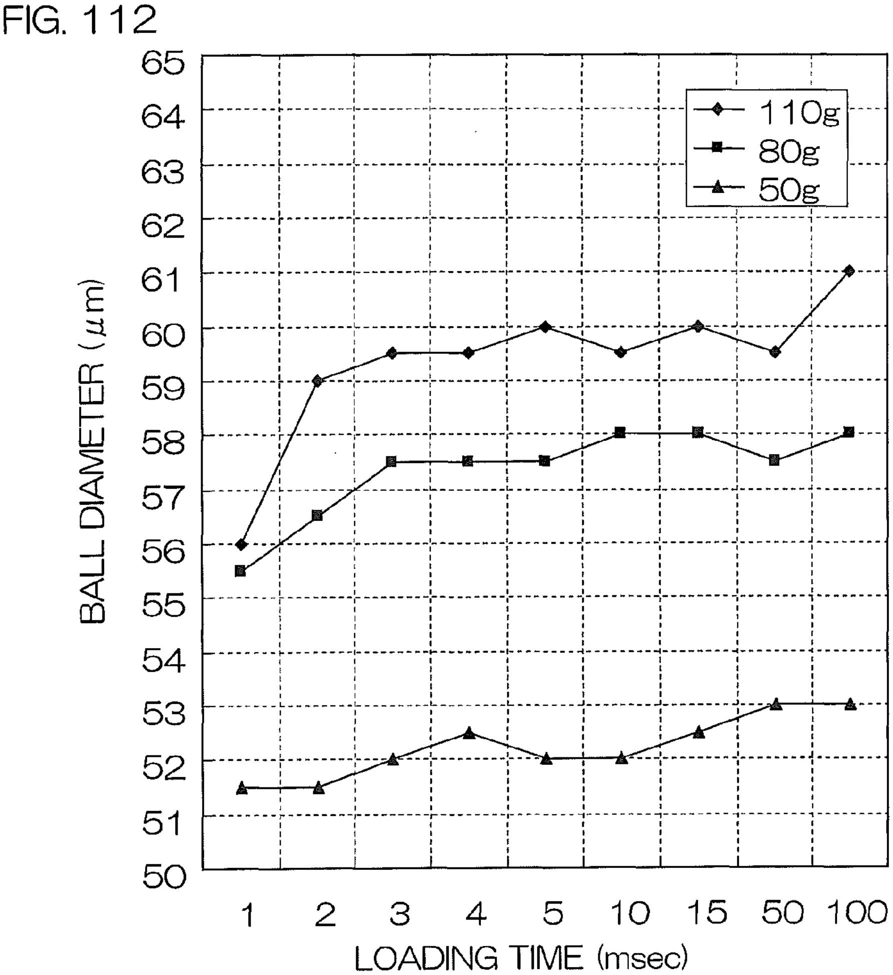

FIG. 112 is a graph of changes with time of diameters (ball diameters) measured in test 1.

Figure 113:
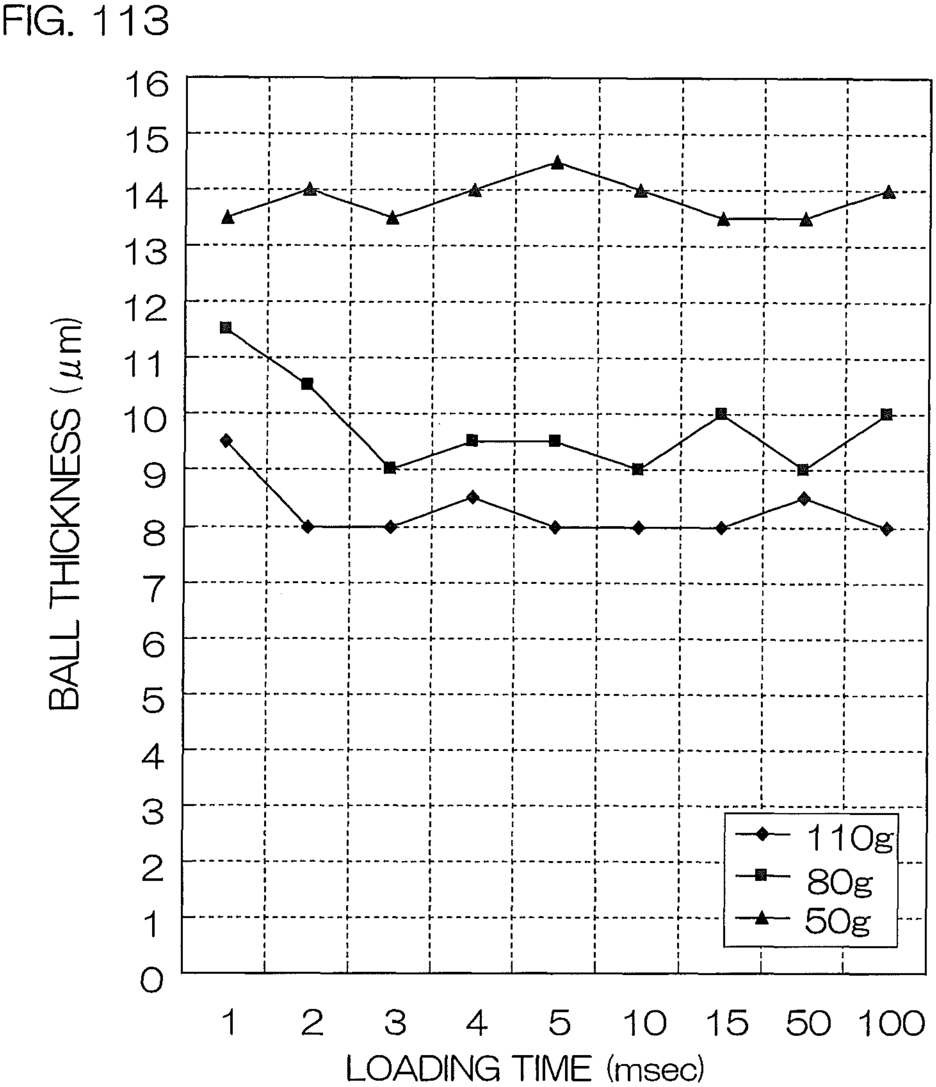

FIG. 113 is a graph of changes with time of thicknesses (ball thicknesses) measured in test 1.

Figure 114:
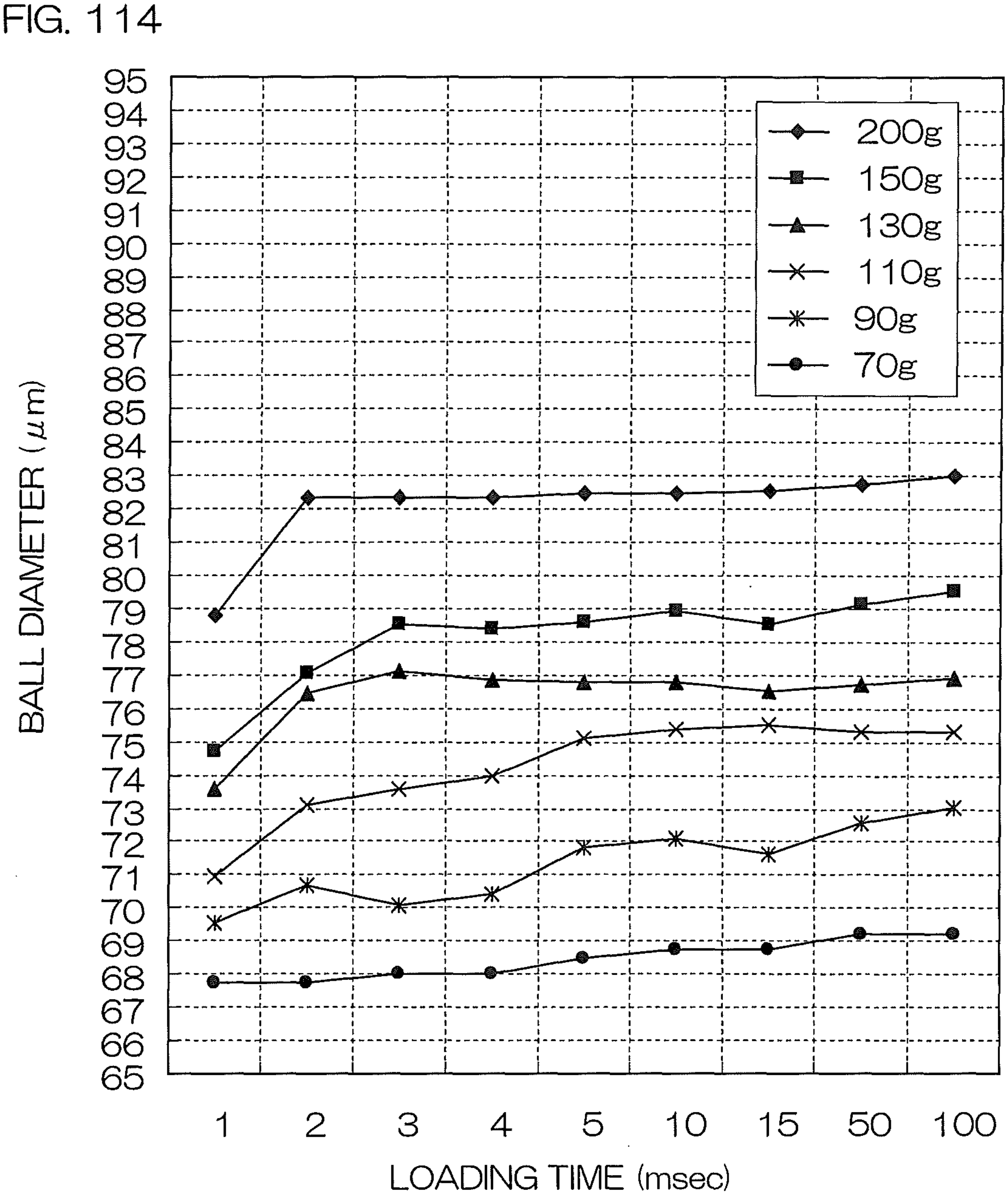

FIG. 114 is a graph of changes with time of diameters (ball diameters) measured in test 2.

Figure 115:
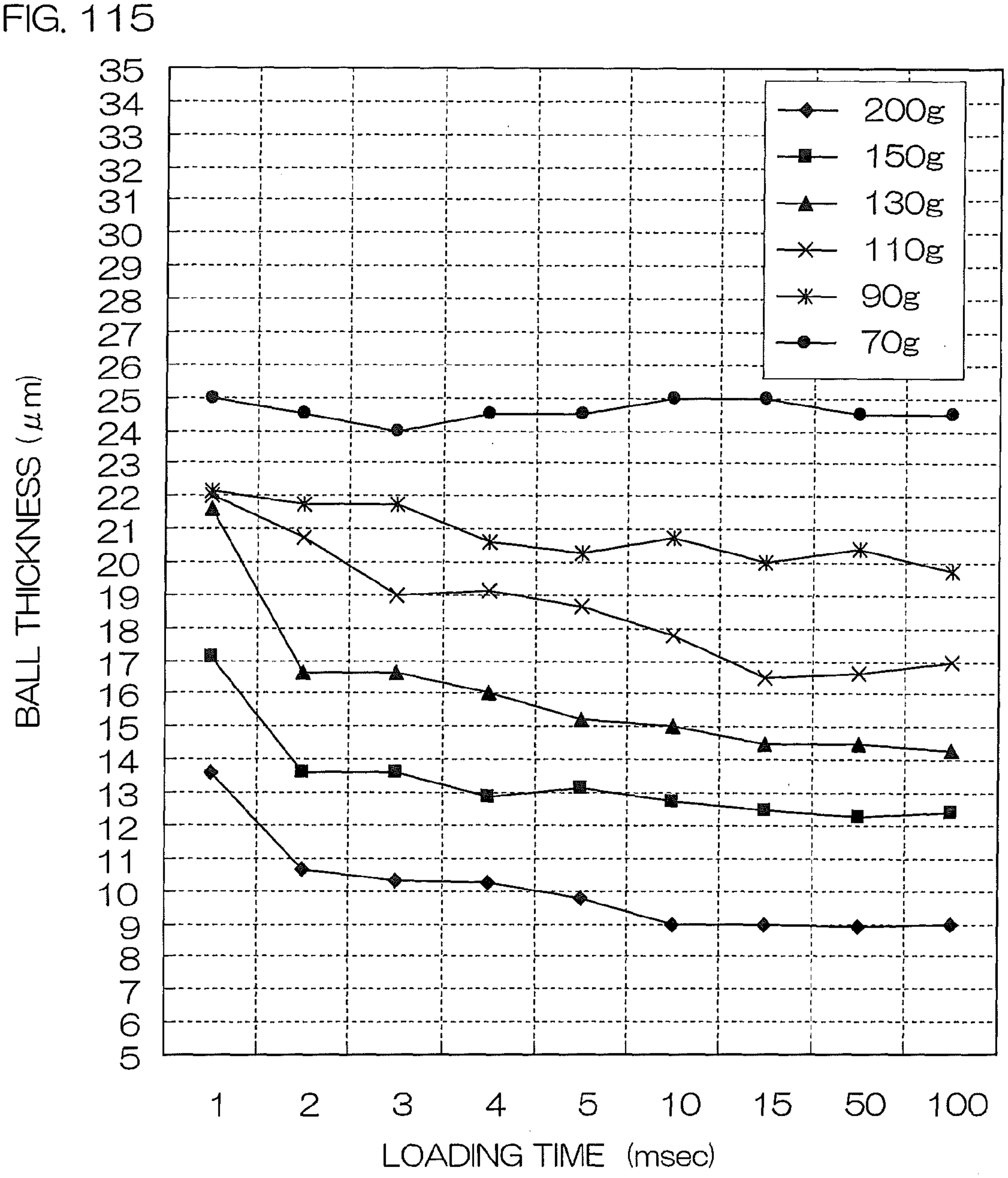

FIG. 115 is a graph of changes with time of thicknesses (ball thicknesses) measured in test 2.

Figure 116:
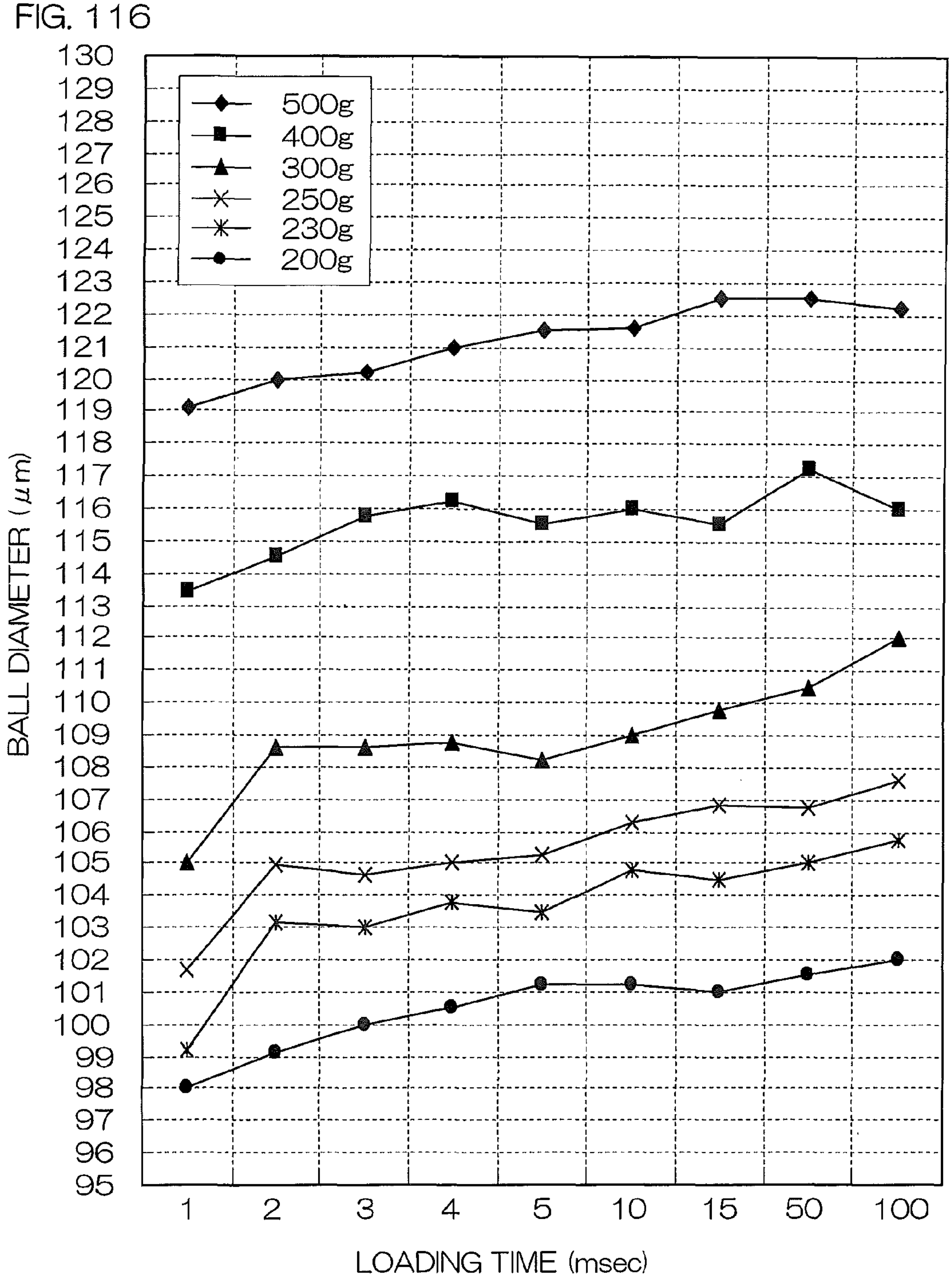

FIG. 116 is a graph of changes with time of diameters (ball diameters) measured in test 3.

Figure 117:
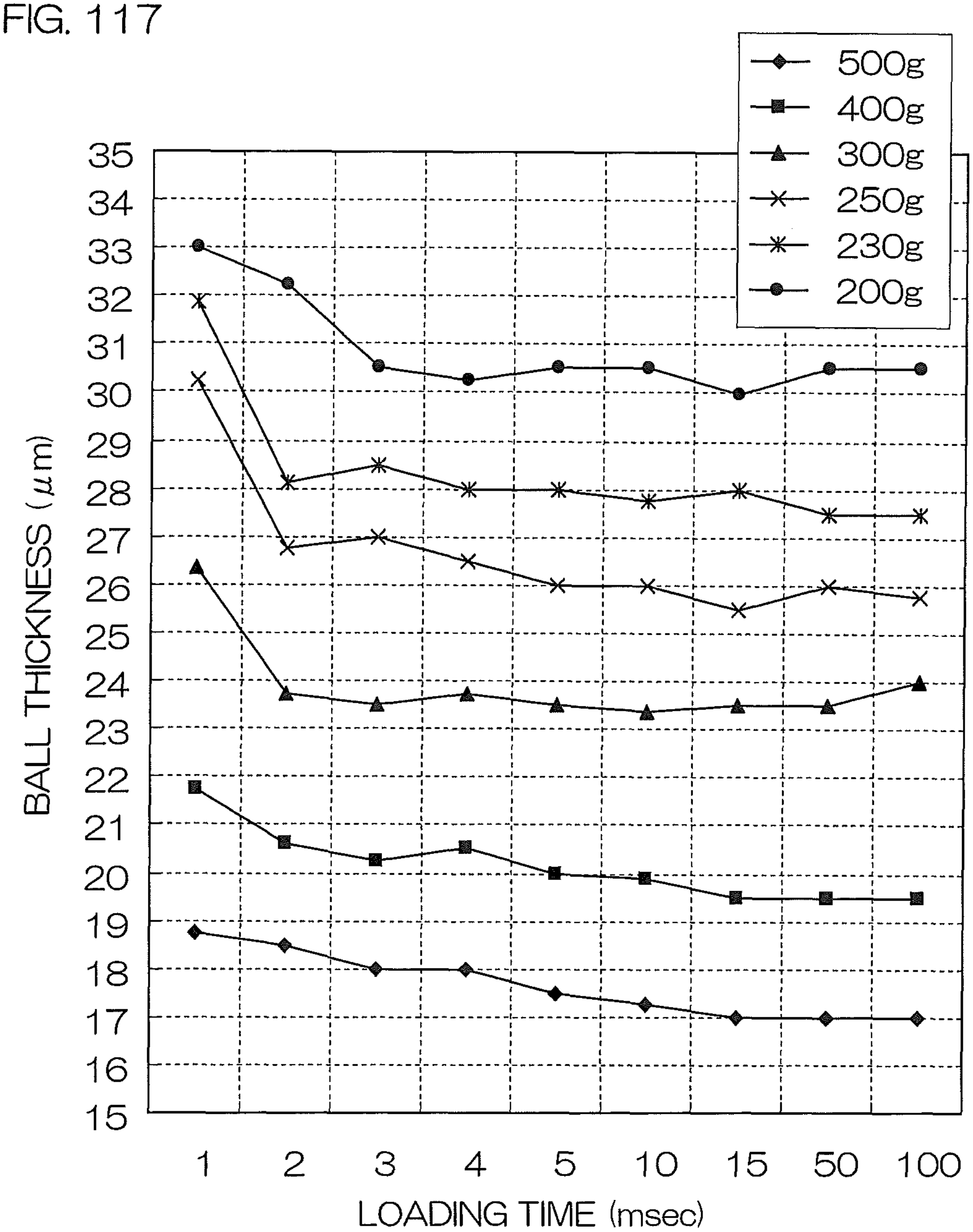

FIG. 117 is a graph of changes with time of thicknesses (ball thicknesses) measured in test 3.

Figure 118:
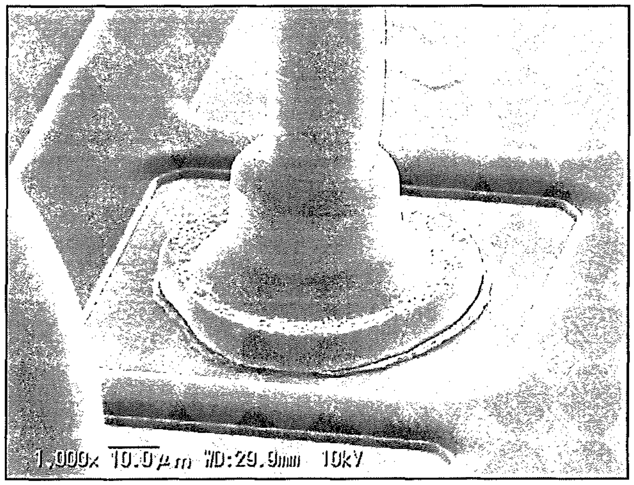

FIG. 118 is an SEM image of a vicinity of a first ball portion formed when an initial load is applied to the FAB.

Figure 119:
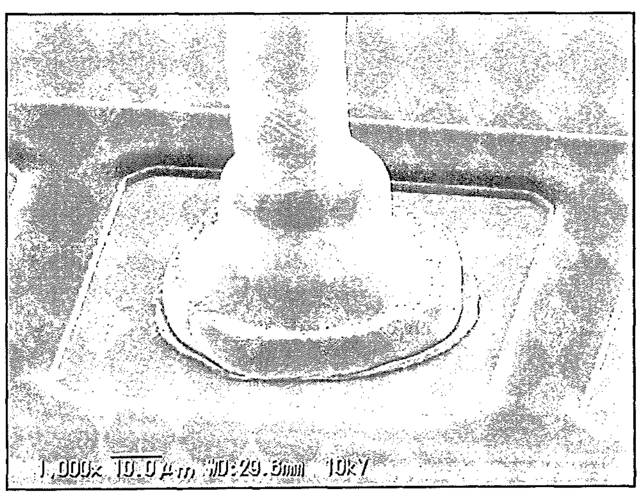

FIG. 119 is an SEM image of a vicinity of a first ball portion formed when a movement speed of the FAB to the pad is increased.

Figure 120:
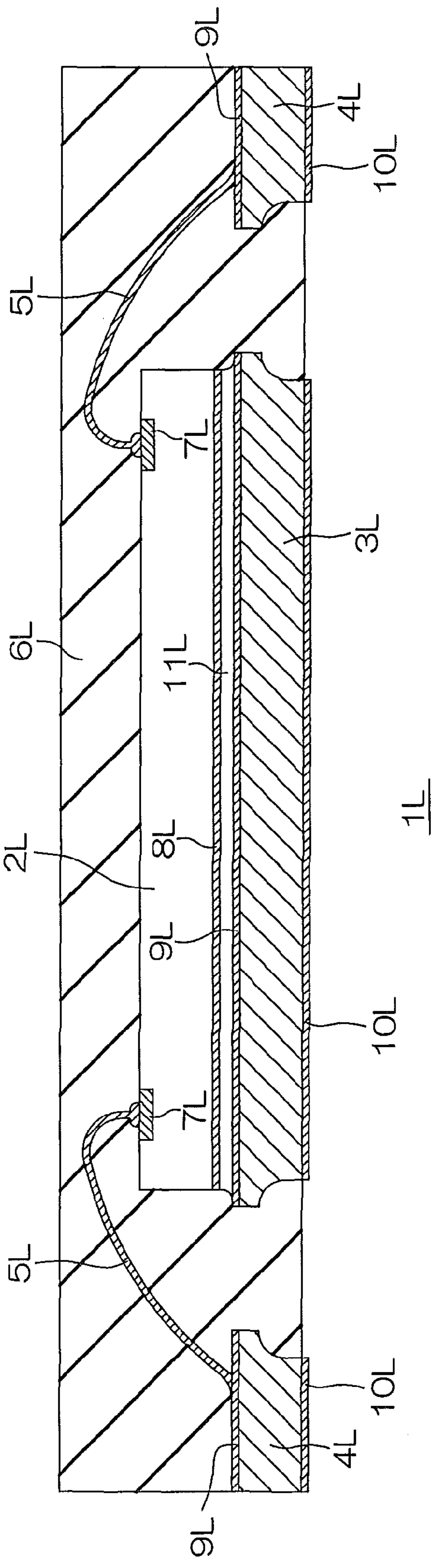

FIG. 120 is a modification example of the semiconductor device of FIG. 106.

Figure 121:
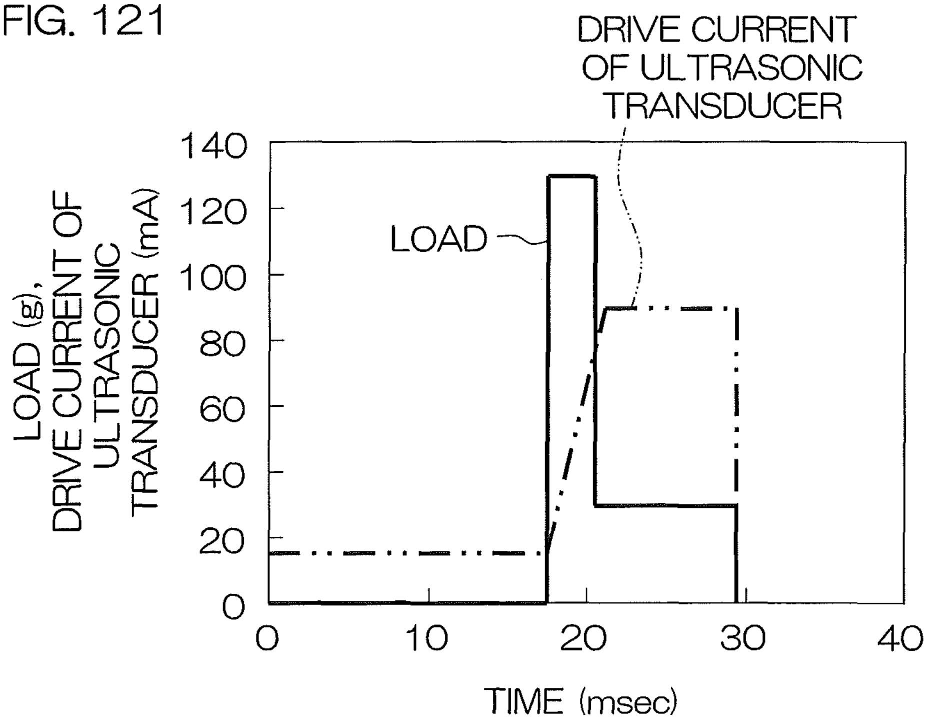

FIG. 121 is a graph of changes with time of a load applied to an FAB and a driving current applied to an ultrasonic transducer during bonding of the FAB to a pad in Example 1 of the twelfth preferred embodiment.

Figure 122:
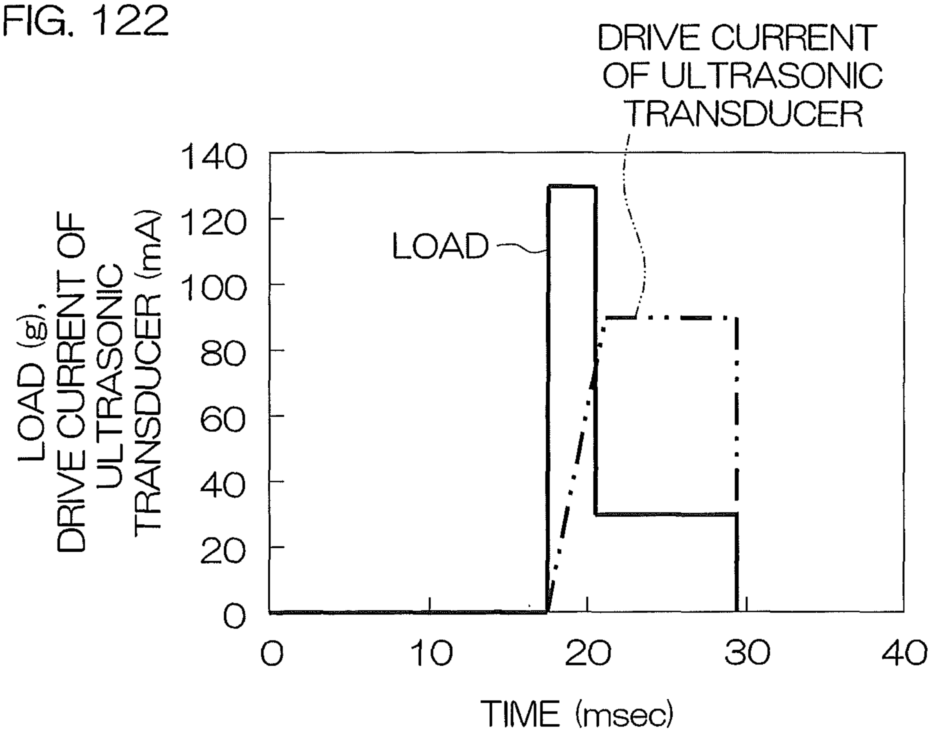

FIG. 122 is a graph of changes with time of a load applied to an FAB and a driving current applied to an ultrasonic transducer during bonding of the FAB to a pad in Comparative Example 1 of the twelfth preferred embodiment.

Figure 123:
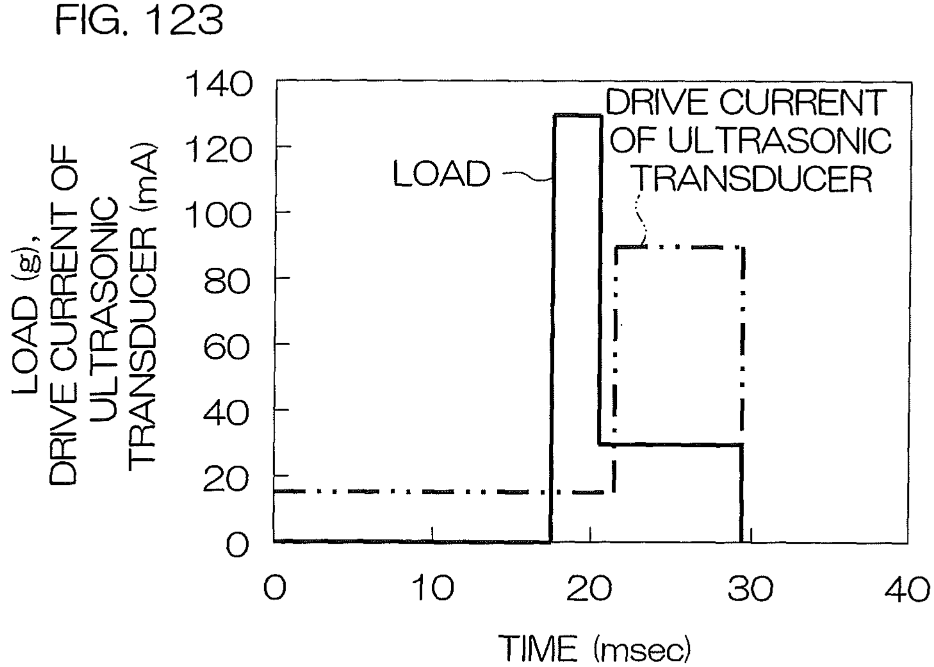

FIG. 123 is a graph of changes with time of a load applied to an FAB and a driving current applied to an ultrasonic transducer during bonding of the FAB to a pad in Comparative Example 2 of the twelfth preferred embodiment.

Figure 124:
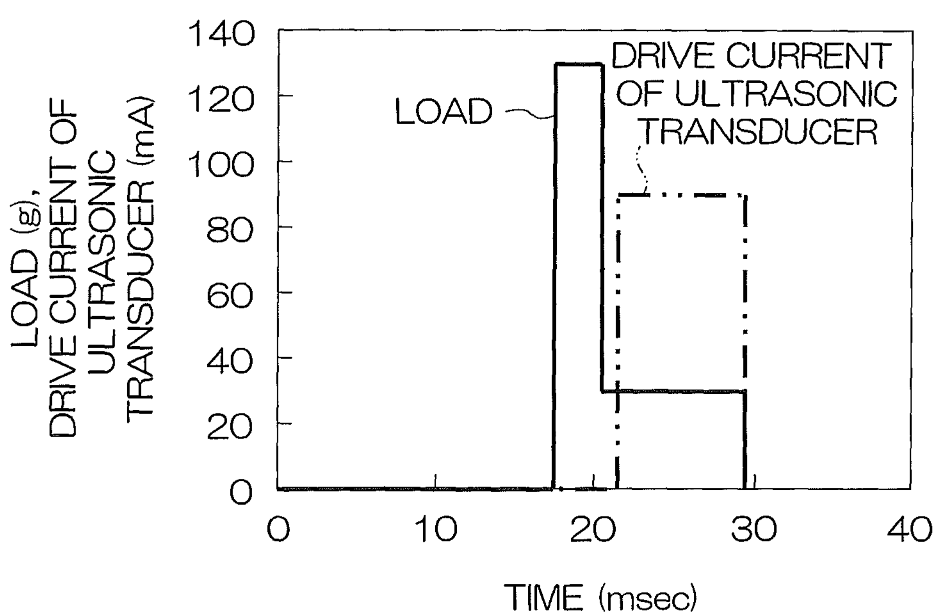

FIG. 124 is a graph of changes with time of a load applied to an FAB and a driving current applied to an ultrasonic transducer during bonding of the FAB to a pad in Comparative Example 3 of the twelfth preferred embodiment.

Figure 125:
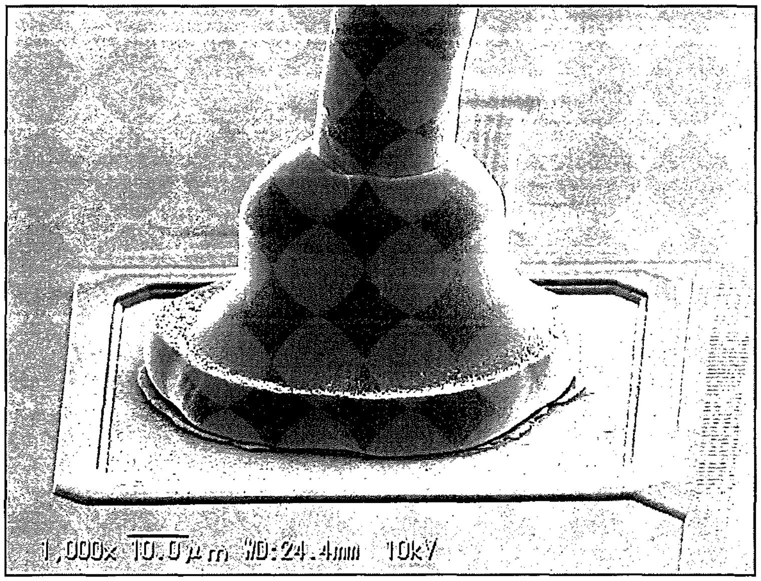

FIG. 125 is an SEM image of a vicinity of a first ball portion of Example 1 of the twelfth preferred embodiment.

Figure 126:
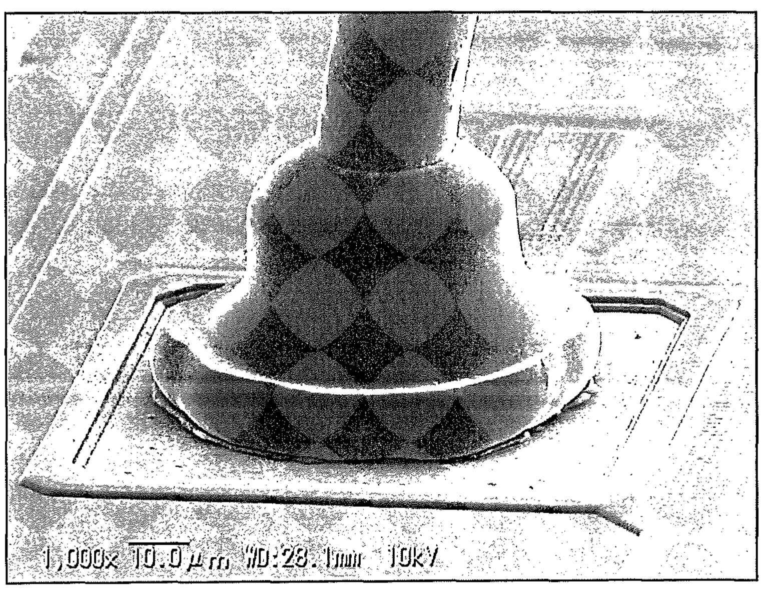

FIG. 126 is an SEM image of a vicinity of a first ball portion of Comparative Example 1 of the twelfth preferred embodiment.

Figure 127:
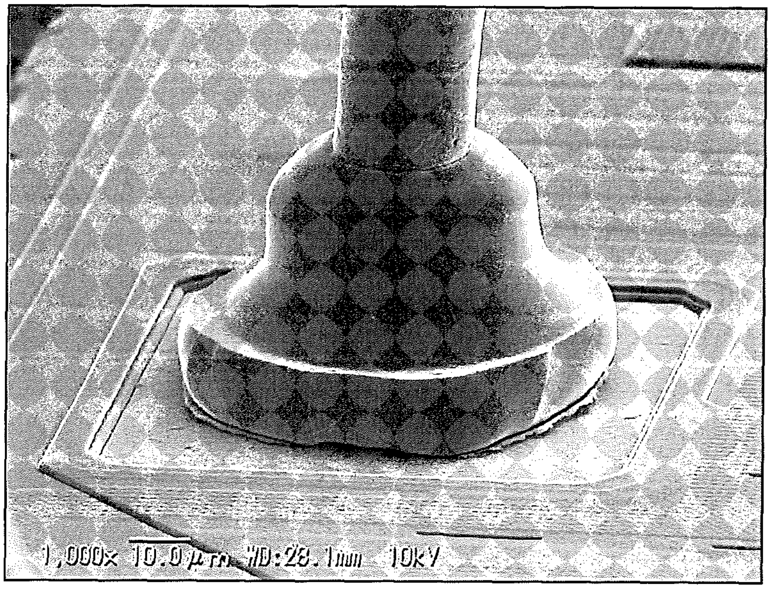

FIG. 127 is an SEM image of a vicinity of a first ball portion of Comparative Example 2 of the twelfth preferred embodiment.

Figure 128:
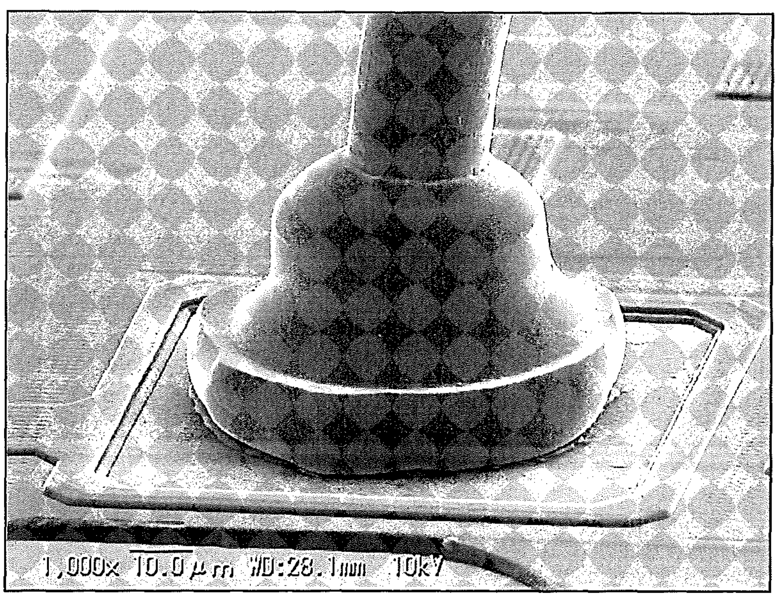

FIG. 128 is an SEM image of a vicinity of a first ball portion of Comparative Example 3 of the twelfth preferred embodiment.

Figure 129:
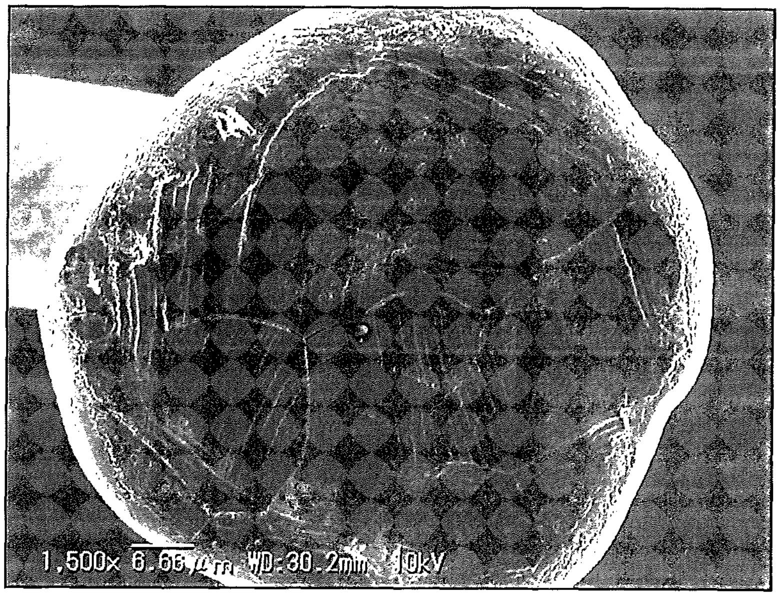

FIG. 129 is an SEM image of a bond surface of the first ball portion of Example 1 of the twelfth preferred embodiment.

Figure 130:
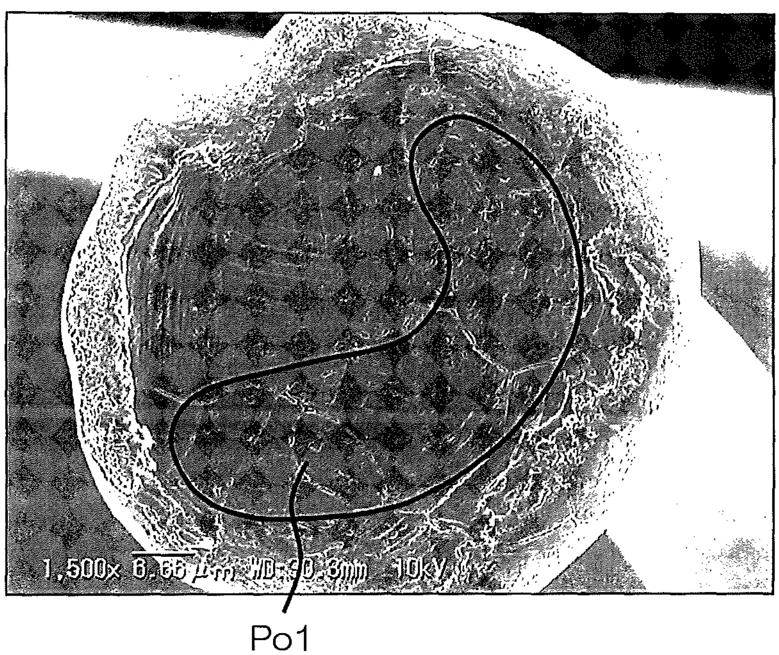

FIG. 130 is an SEM image of a bond surface of the first ball portion of Comparative Example 1 of the twelfth preferred embodiment.

Figure 131:
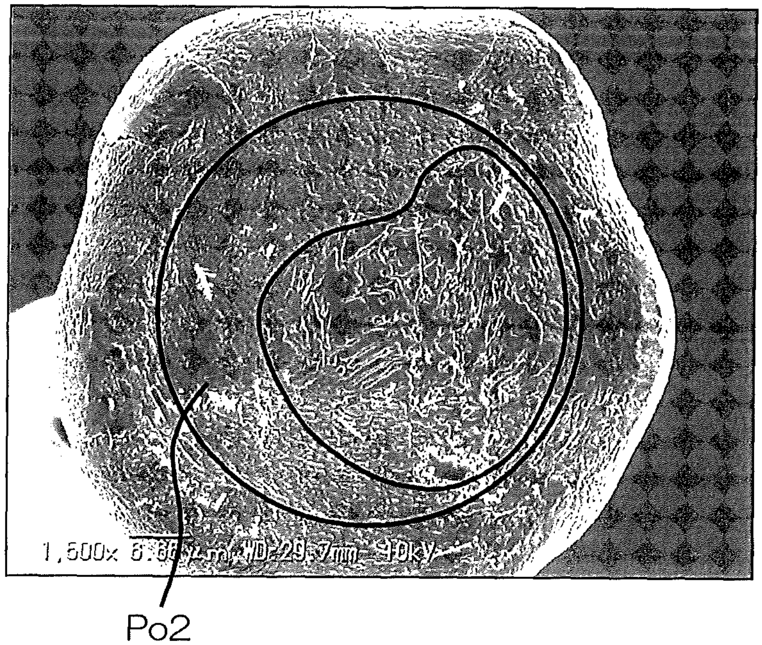

FIG. 131 is an SEM image of a bond surface of the first ball portion of Comparative Example 2 of the twelfth preferred embodiment.

Figure 132:
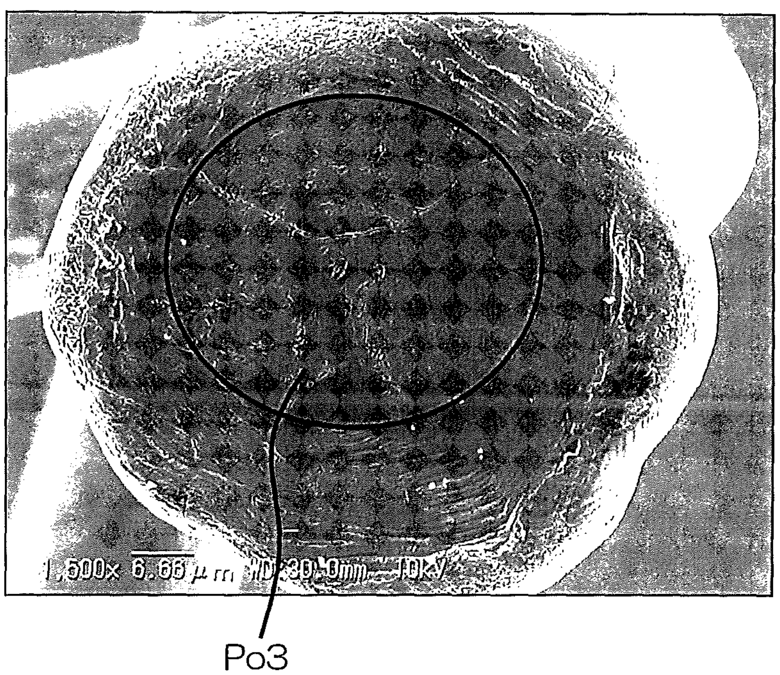

FIG. 132 is an SEM image of a bond surface of the first ball portion of Comparative Example 3 of the twelfth preferred embodiment.

Figure 133:
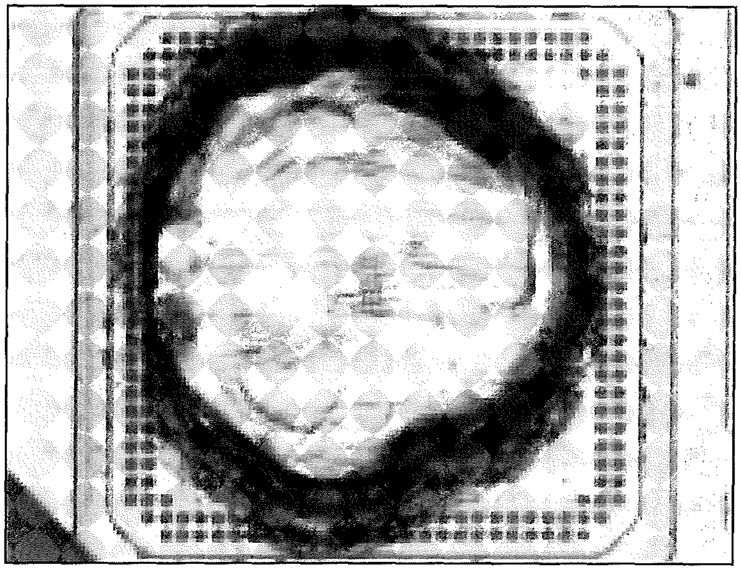

FIG. 133 is an image of a pad of Example 1 of the twelfth preferred embodiment.

Figure 134:
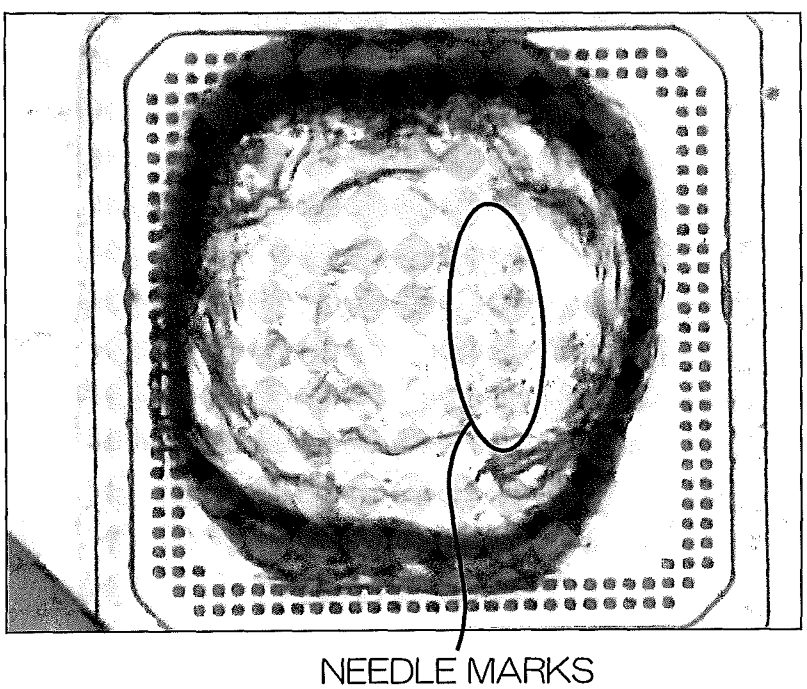

FIG. 134 is an image of a pad of Comparative Example 1 of the twelfth preferred embodiment.

Figure 135:
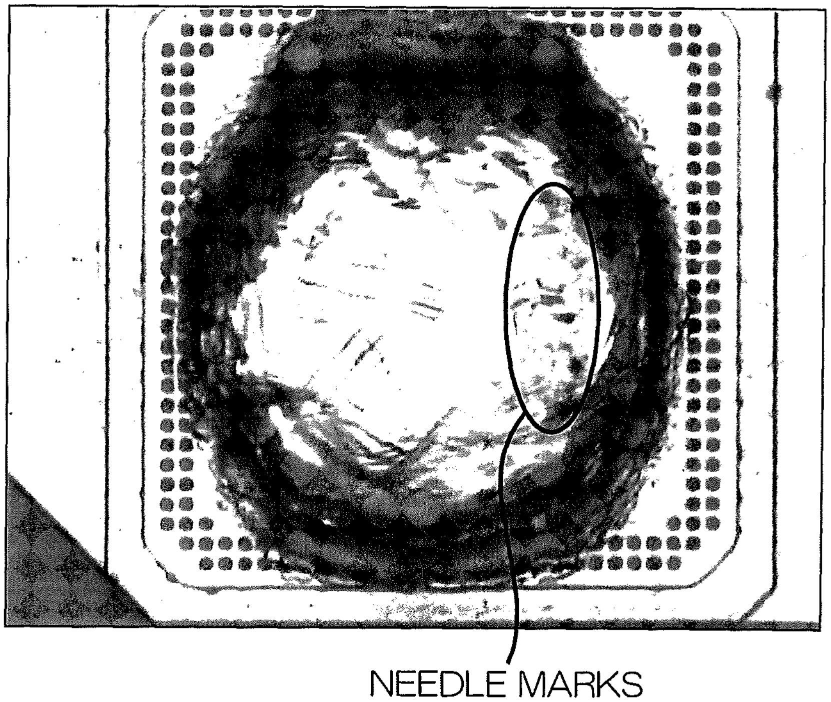

FIG. 135 is an image of a pad of Comparative Example 2 of the twelfth preferred embodiment.

Figure 136:
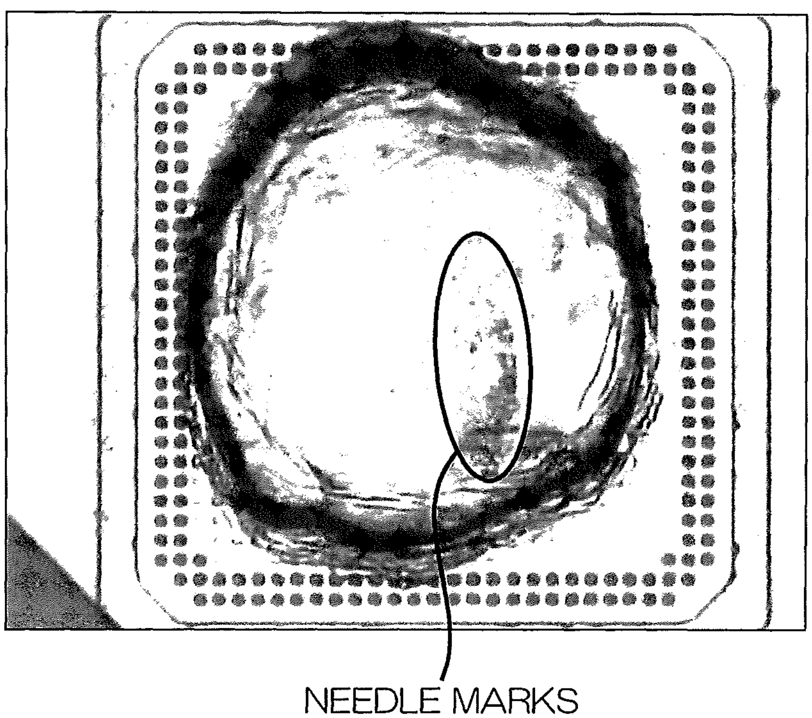

FIG. 136 is an image of a pad of Comparative Example 3 of the twelfth preferred embodiment.

Figure 137:
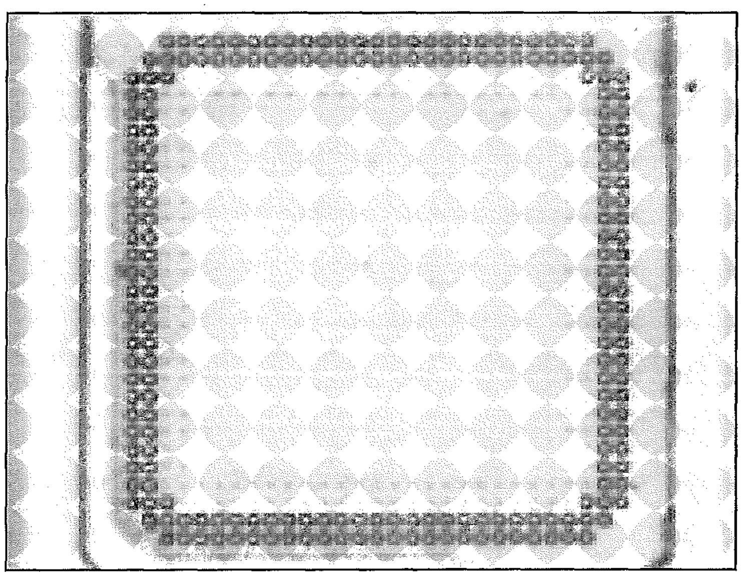

FIG. 137 is an image of a top surface of an interlayer insulating film of Example 1 of the twelfth preferred embodiment.

Figure 138:
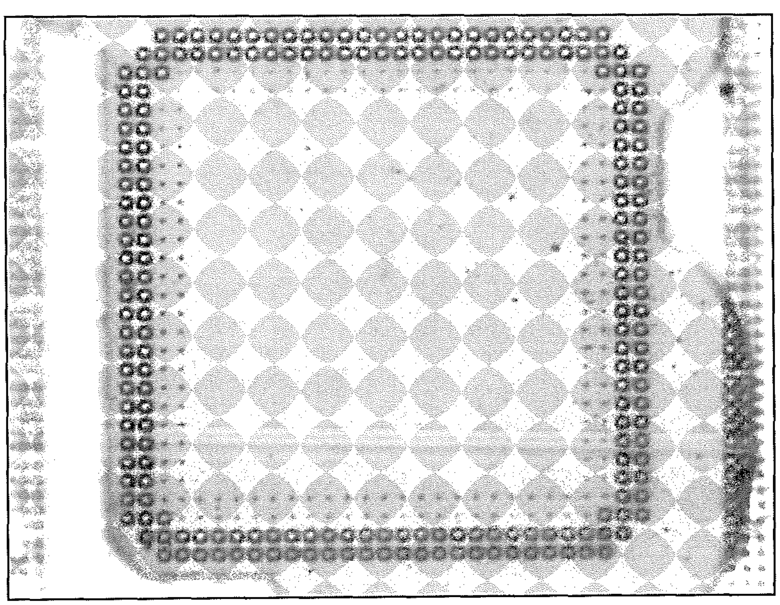

FIG. 138 is an image of a top surface of an interlayer insulating film of Comparative Example 1 of the twelfth preferred embodiment.

Figure 139:
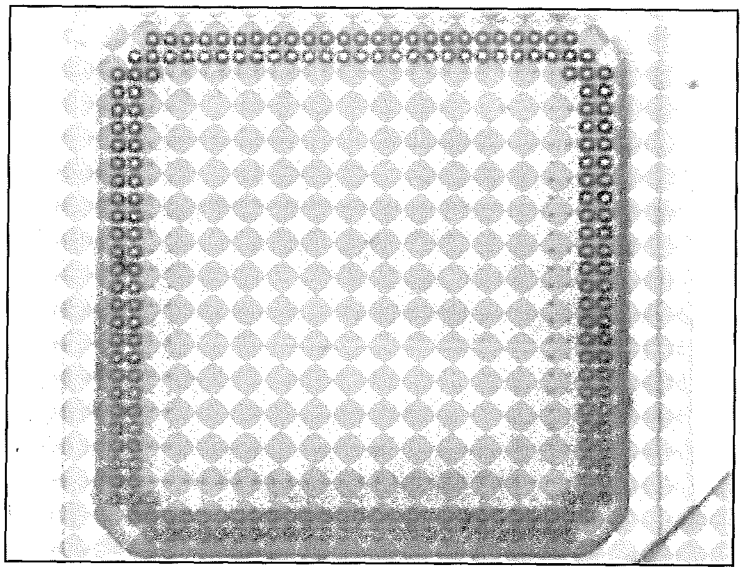

FIG. 139 is an image of a top surface of an interlayer insulating film of Comparative Example 2 of the twelfth preferred embodiment.

Figure 140:
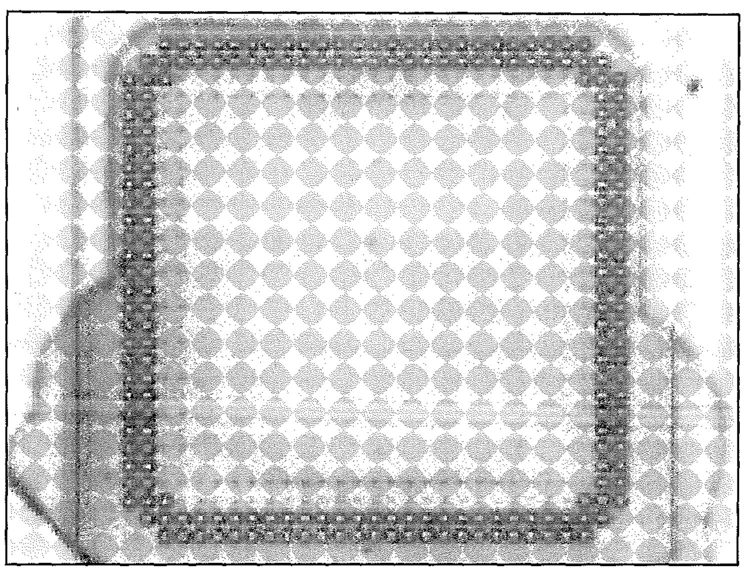

FIG. 140 is an image of a top surface of an interlayer insulating film of Comparative Example 3 of the twelfth preferred embodiment.

Figure 141:
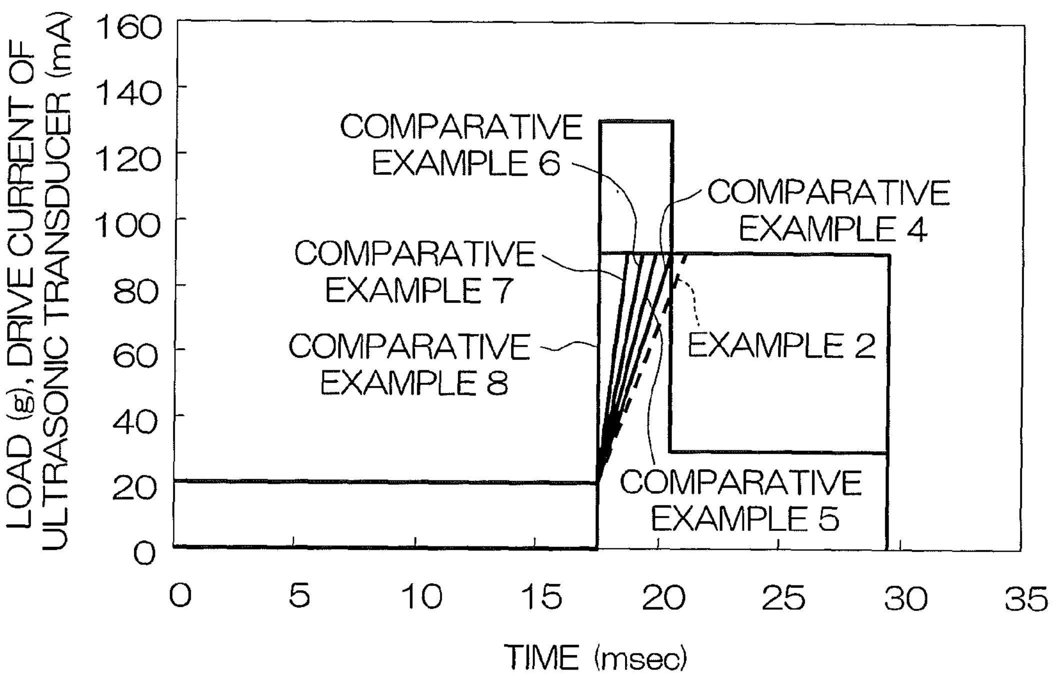

FIG. 141 is a graph of changes with time of a load applied to an FAB and a driving current applied to an ultrasonic transducer during bonding of the FAB to a pad in Example 2 and Comparative Examples 4 to 8 of the twelfth preferred embodiment.

Figure 142:
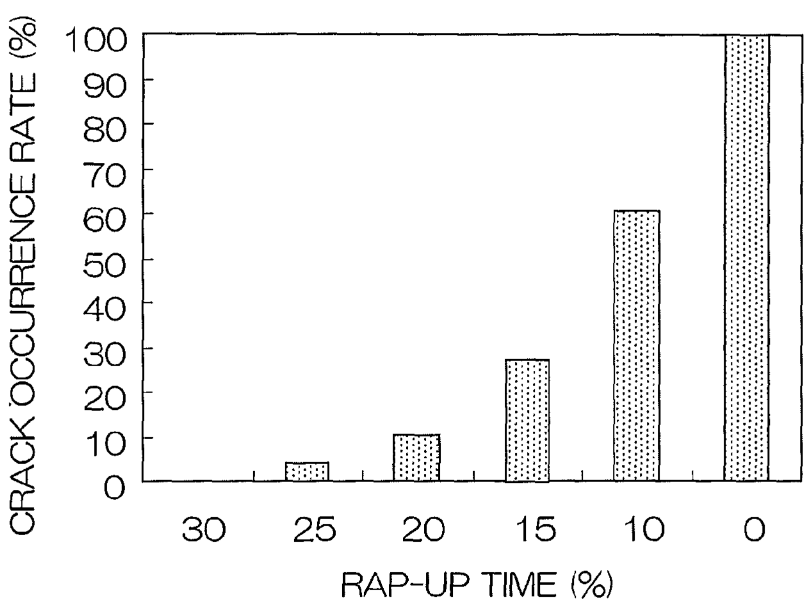

FIG. 142 is a graph of crack occurrence rates in Example 2 and Comparative Examples 4 to 8 of the twelfth preferred embodiment.

Figure 143:
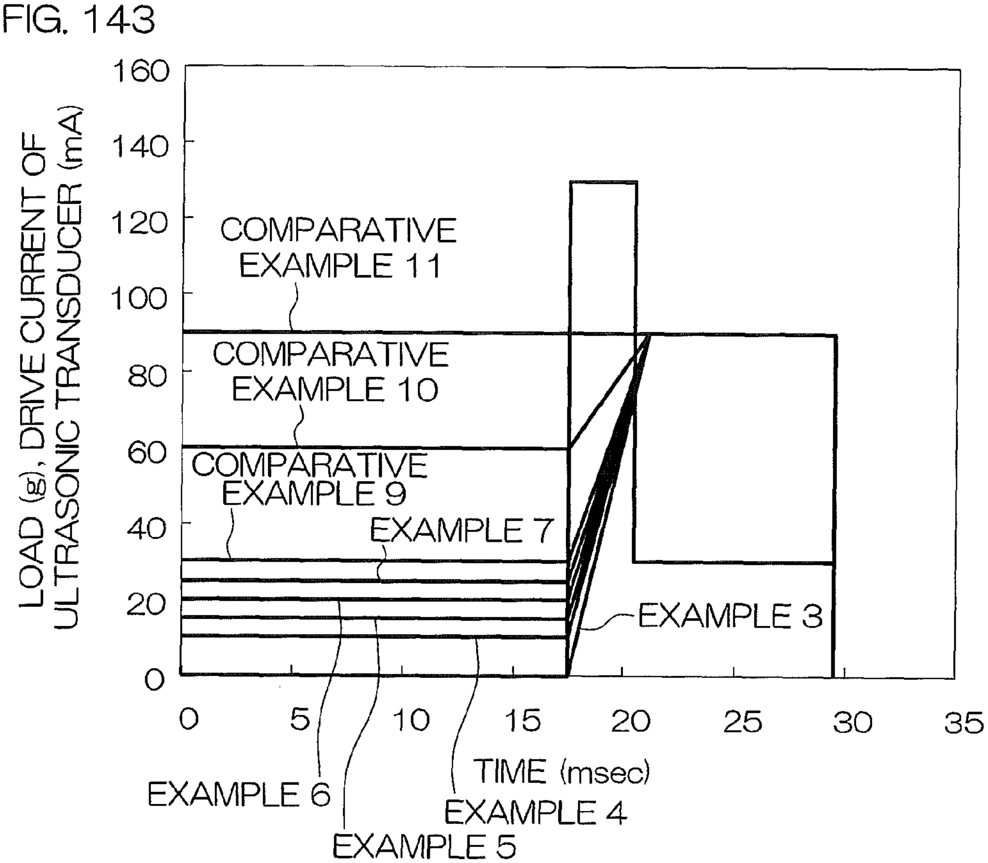

FIG. 143 is a graph of changes with time of a load applied to an FAB and a driving current applied to an ultrasonic transducer during bonding of the FAB to a pad in Examples 3 to 7 and Comparative Examples 9 to 11 of the twelfth preferred embodiment.

Figure 144:
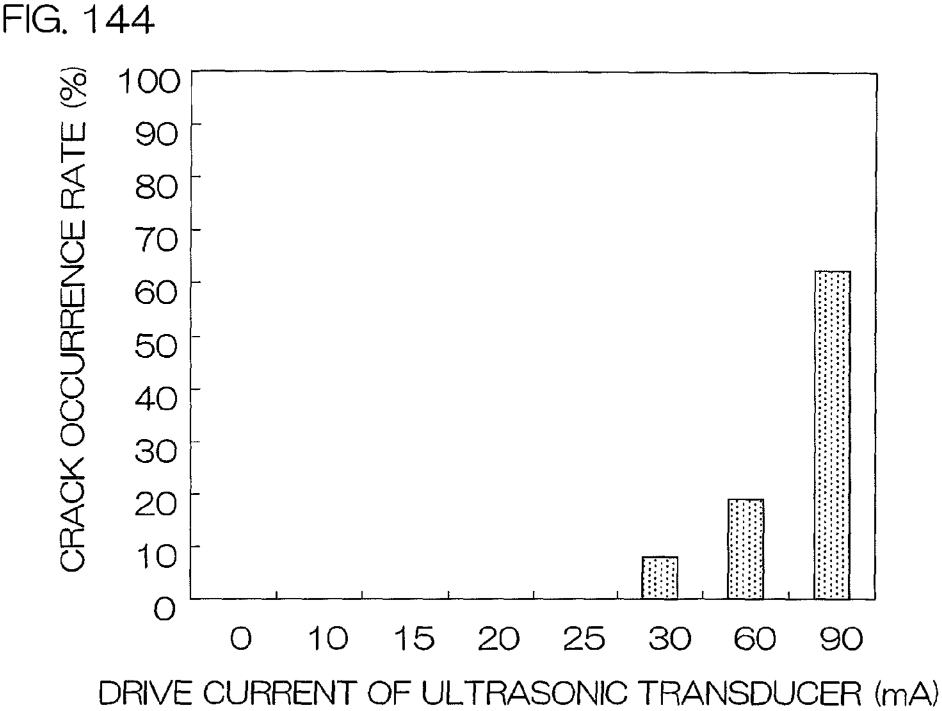

FIG. 144 is a graph of crack occurrence rates in Examples 3 to 7 and Comparative Examples 9 to 11 of the twelfth preferred embodiment.

Figure 145:
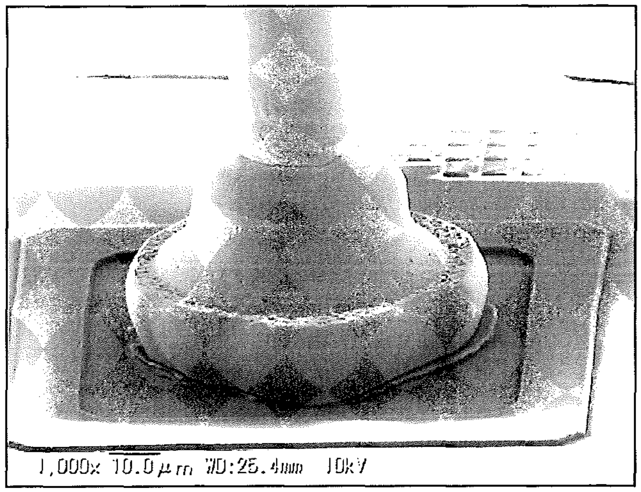

FIG. 145 is an SEM image of a vicinity of a first ball portion of Example 8 of the twelfth preferred embodiment.

Figure 146:
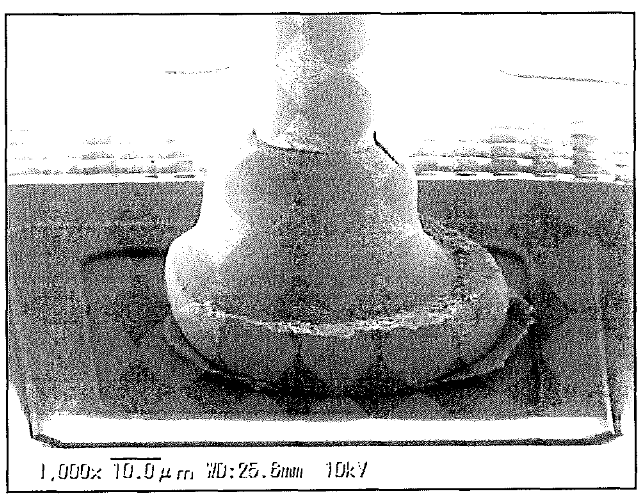

FIG. 146 is an SEM image of a vicinity of a first ball portion of Comparative Example 12 of the twelfth preferred embodiment.

Figure 147:
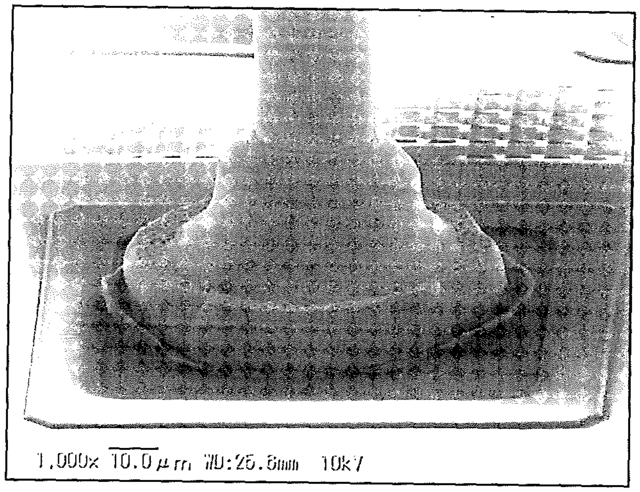

FIG. 147 is an SEM image of a vicinity of a first ball portion of Comparative Example 13 of the twelfth preferred embodiment.

Figure 148:
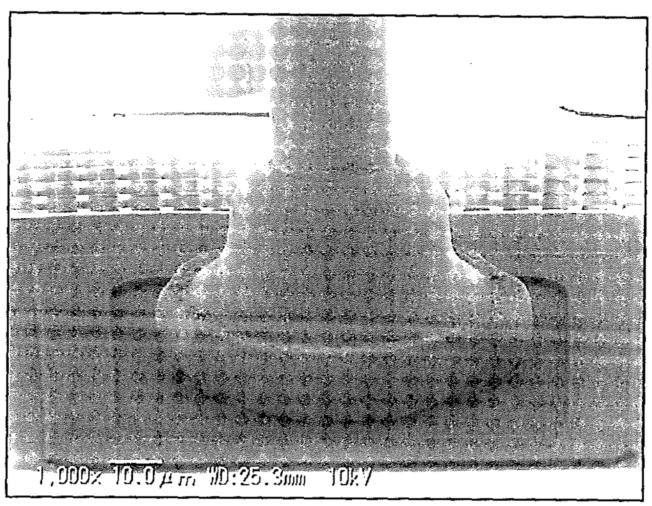

FIG. 148 is an SEM image of a vicinity of a first ball portion of Comparative Example 14 of the twelfth preferred embodiment.

Figure 149:
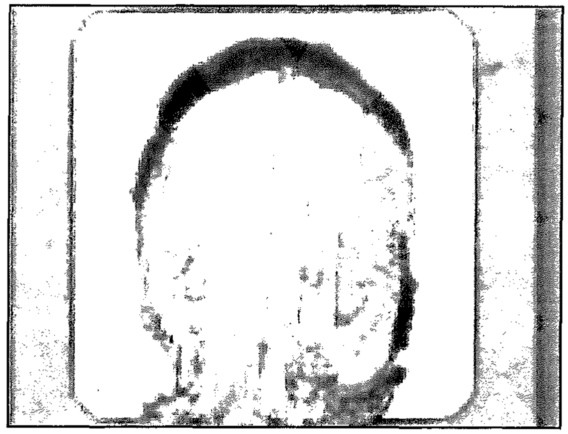

FIG. 149 is an image of a pad after breakage of Example 8 of the twelfth preferred embodiment.

Figure 150:

FIG. 150 is an image of a pad after breakage of Comparative Example 12 of the twelfth preferred embodiment.

Figure 151:
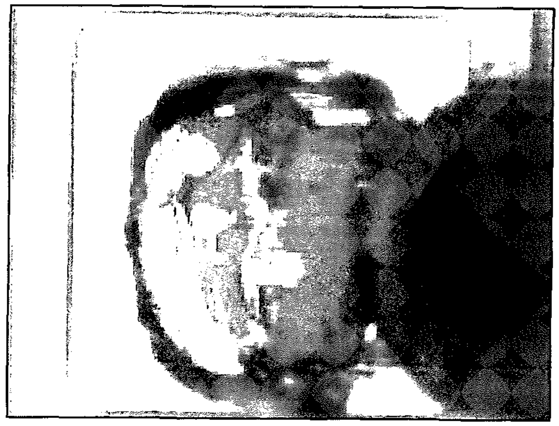

FIG. 151 is an image of a pad after breakage of Comparative Example 13 of the twelfth preferred embodiment.

Figure 152:
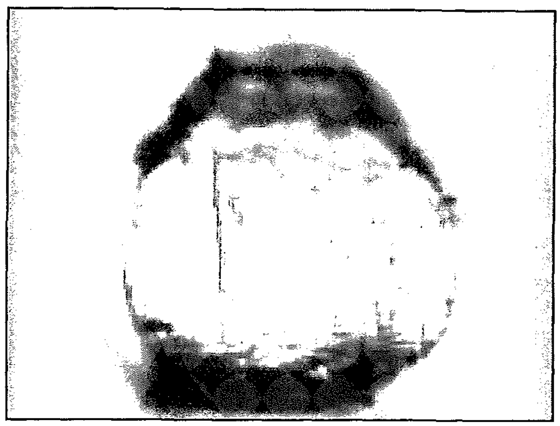

FIG. 152 is an image of a bottom surface of a first ball portion (surface bonded to a pad) after breakage of Comparative Example 13 of the twelfth preferred embodiment.

Figure 153:

FIG. 153 is an image of a pad after breakage of Comparative Example 13 of the twelfth preferred embodiment.

Figure 154:
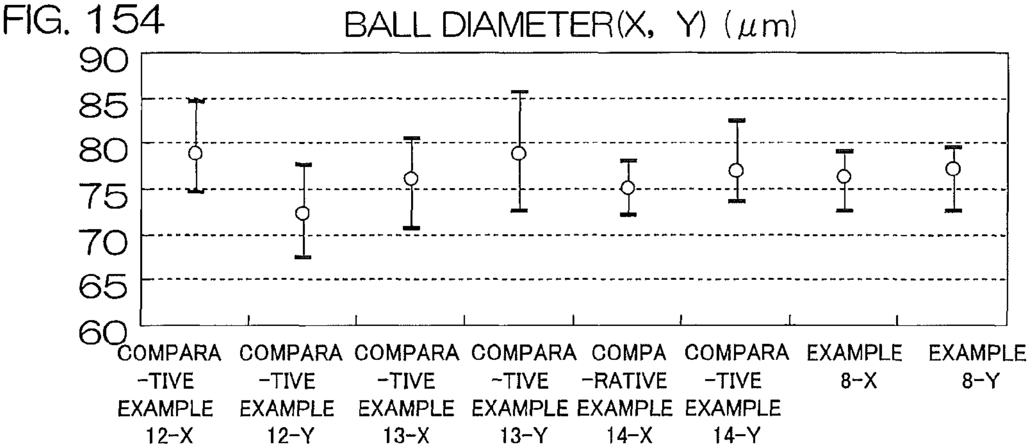

FIG. 154 is a graph of measurement results of diameters of first ball portions of Example 8 and Comparative Examples 12 to 14 of the twelfth preferred embodiment.

Figure 155:
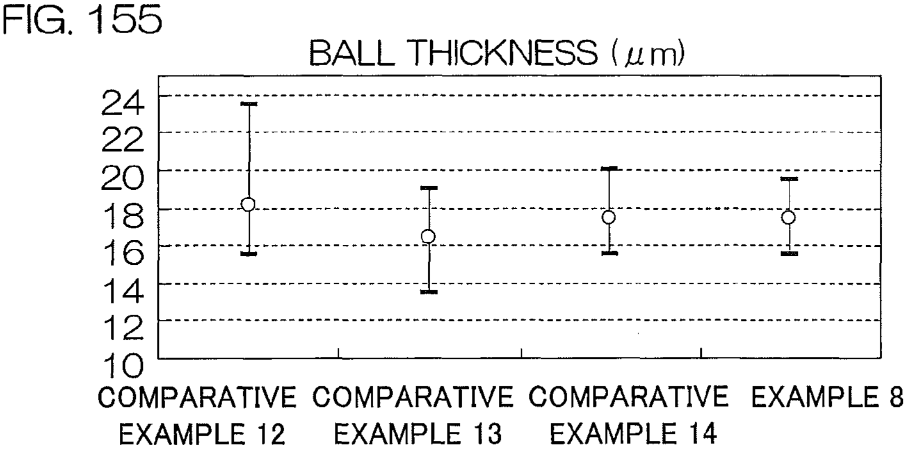

FIG. 155 is a graph of measurement results of thicknesses of first ball portions of Example 8 and Comparative Examples 12 to 14 of the twelfth preferred embodiment.

Figure 156:
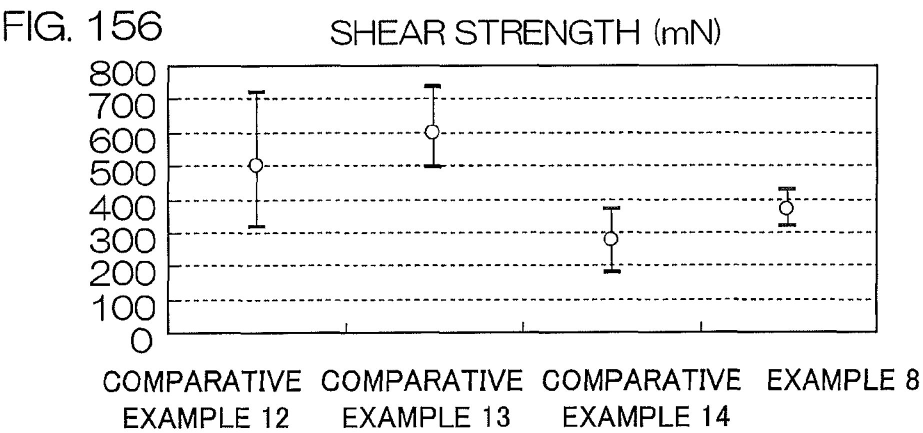

FIG. 156 is a graph of measurement results of forces (shear strengths) required for breakage of portions of bonding of the first ball portion and pad of Example 8 and Comparative Examples 12 to 14 of the twelfth preferred embodiment.

Figure 157:
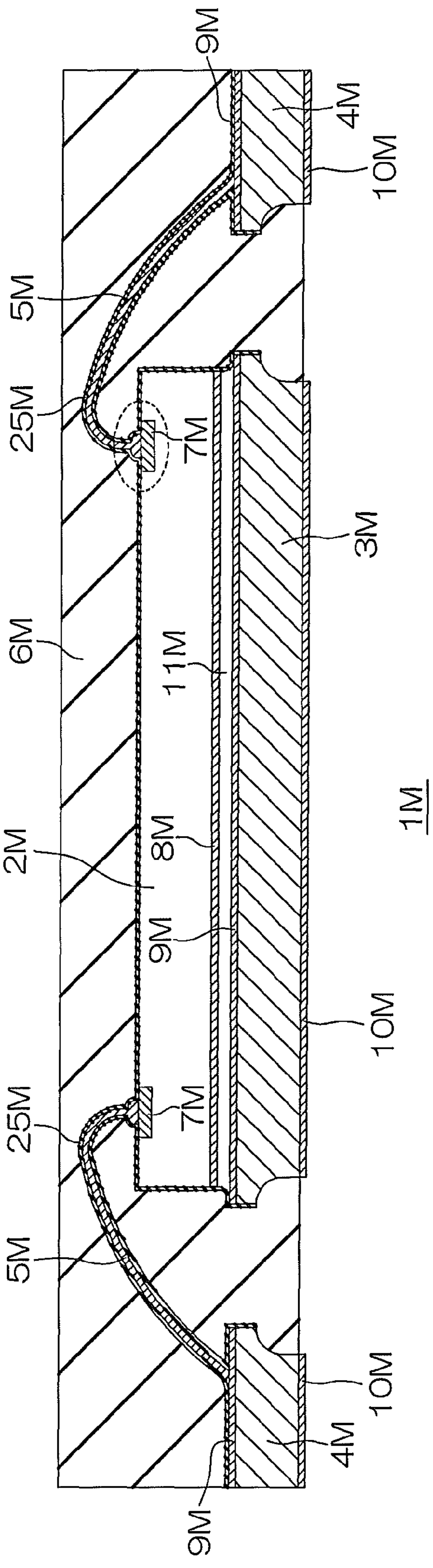

FIG. 157 is a schematic sectional view of a semiconductor device according to a thirteenth preferred embodiment of the present invention.

Figure 158:
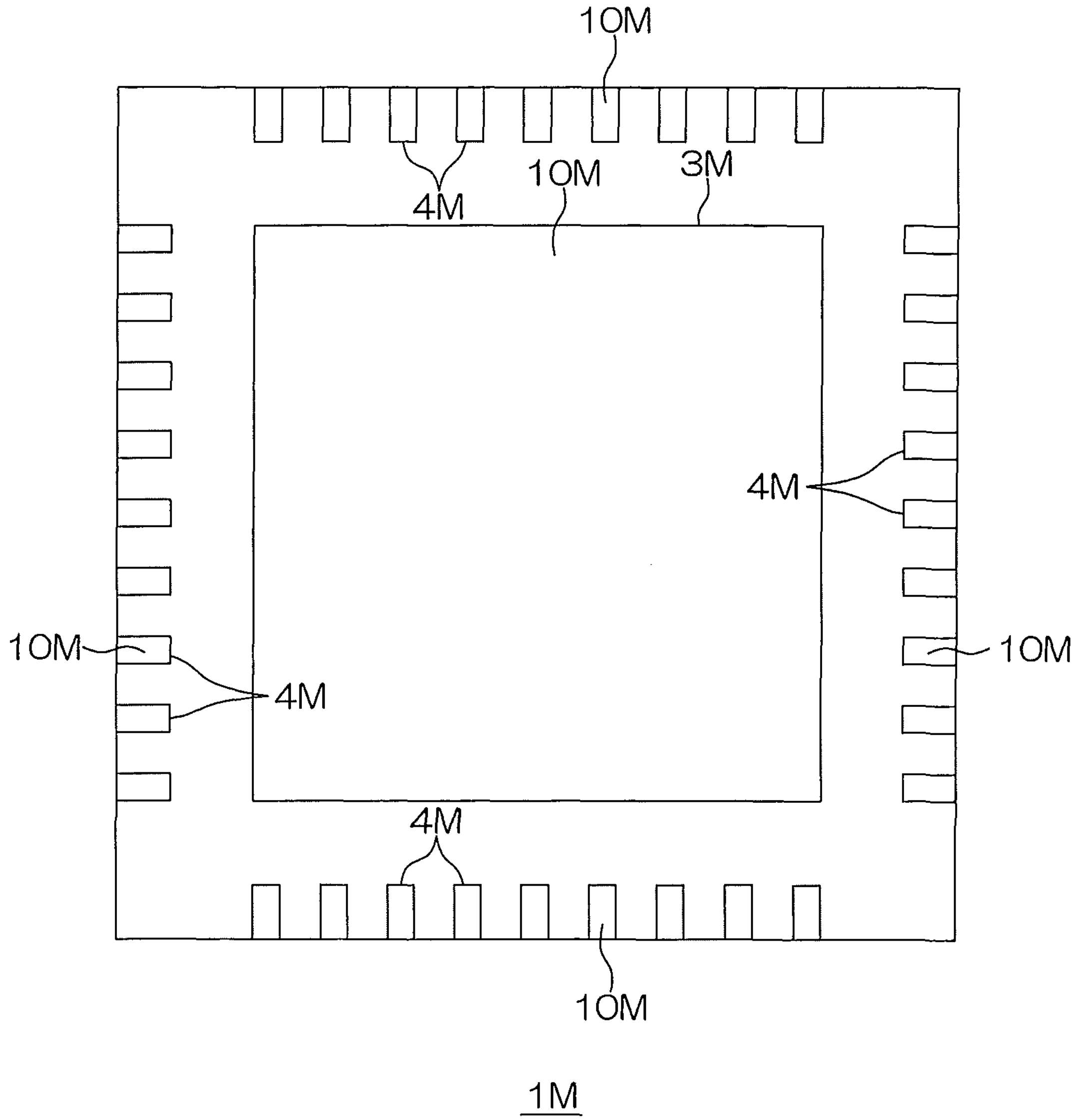

FIG. 158 is a schematic bottom view of the semiconductor device shown in FIG. 157.

Figure 159:
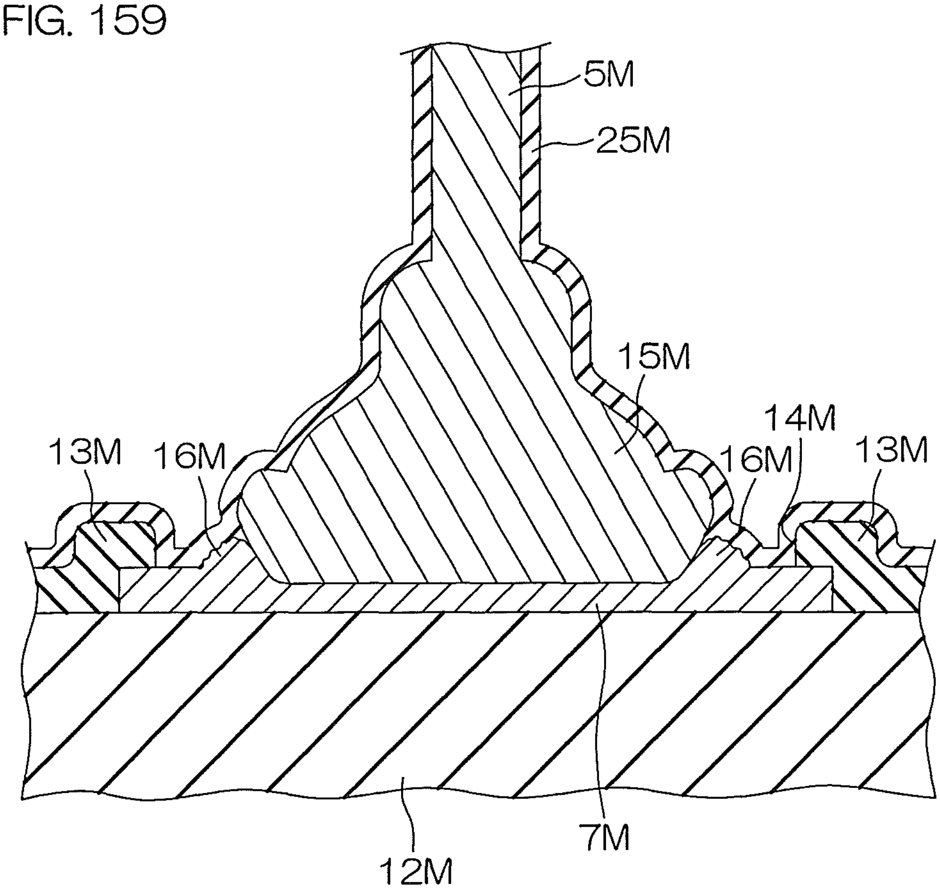

FIG. 159 is an enlarged view of a portion surrounded by broken lines shown in FIG. 157.

Figure 160A:
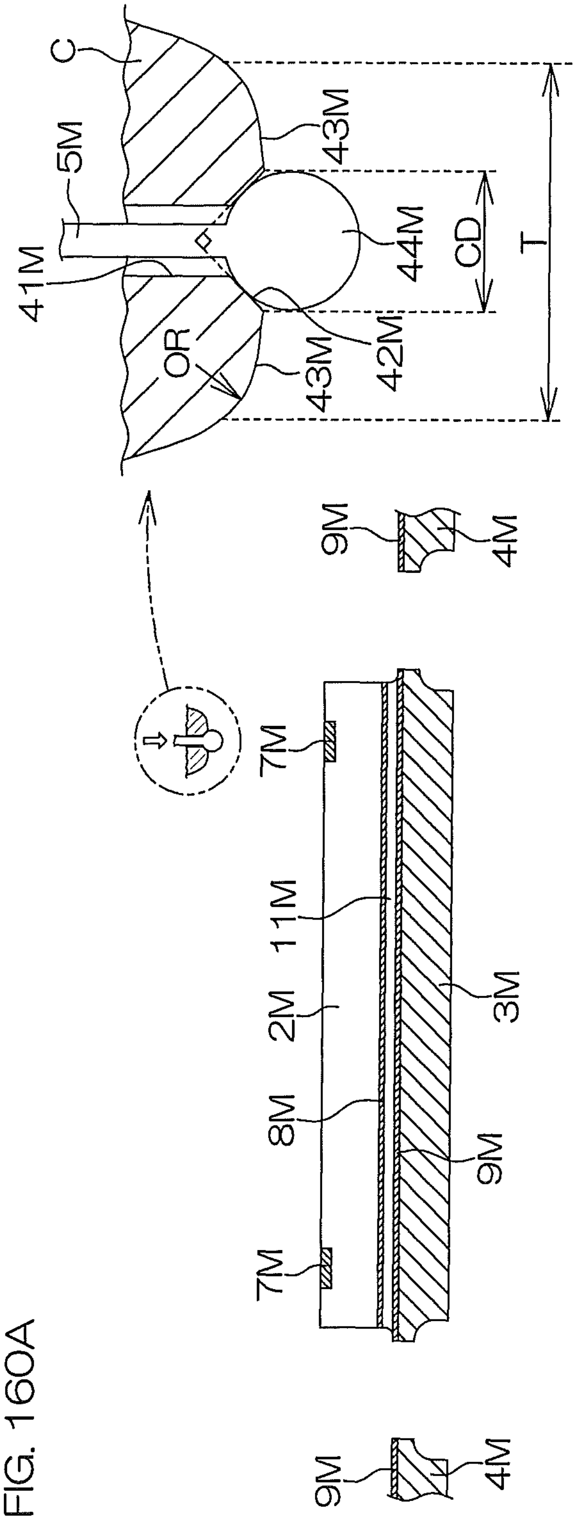

FIG. 160A is a schematic sectional view of a state in a middle of manufacture (middle of wire bonding) of the semiconductor device shown in FIG. 157.

Figure 160B:
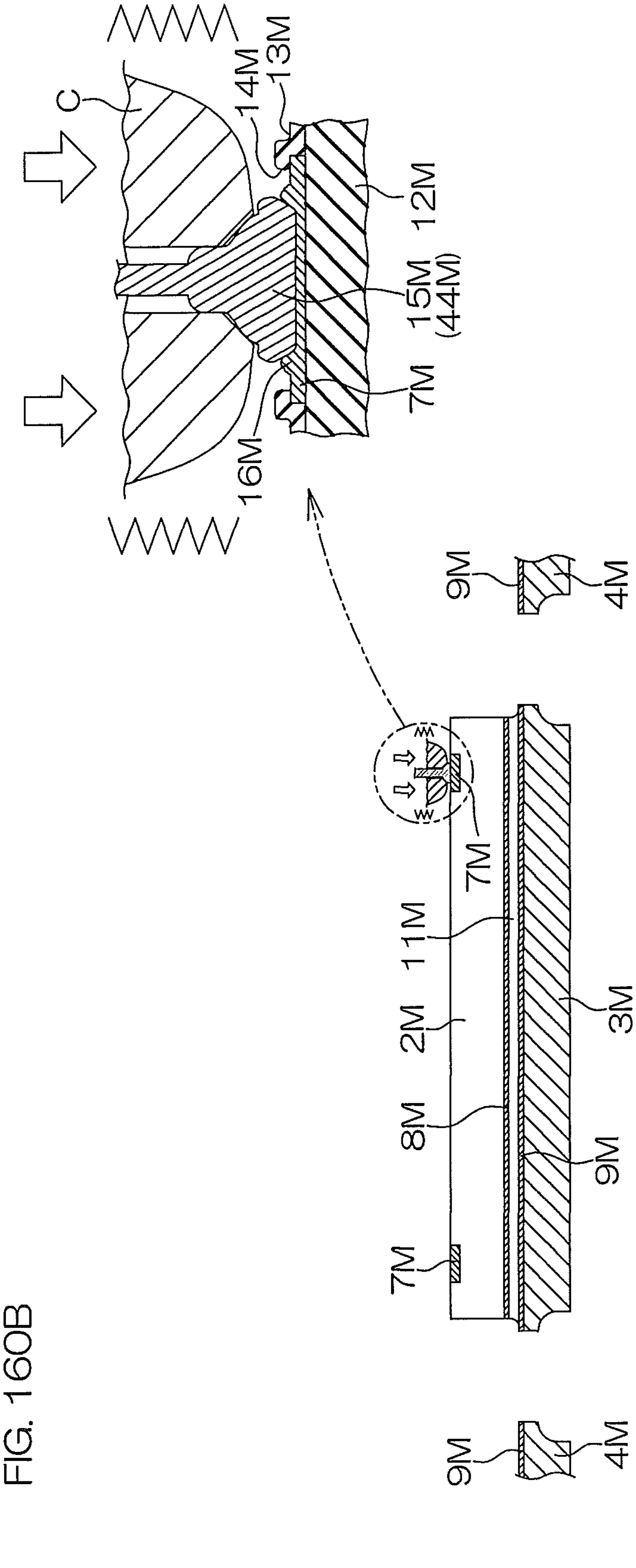

FIG. 160B is a schematic sectional view of a step subsequent to that of FIG. 160A.

Figure 160C:
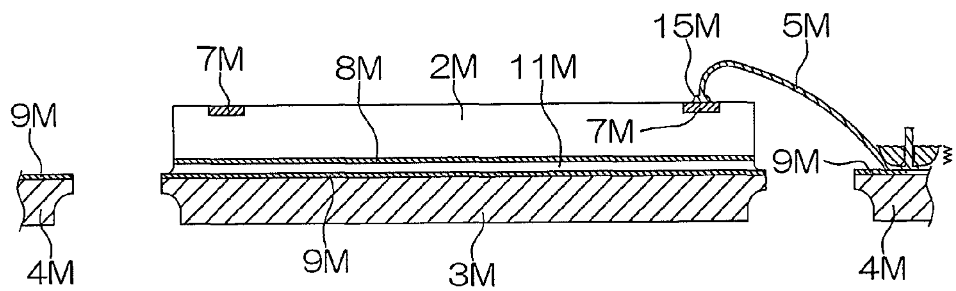

FIG. 160C is a schematic sectional view of a step subsequent to that of FIG. 160B.

Figure 160D:
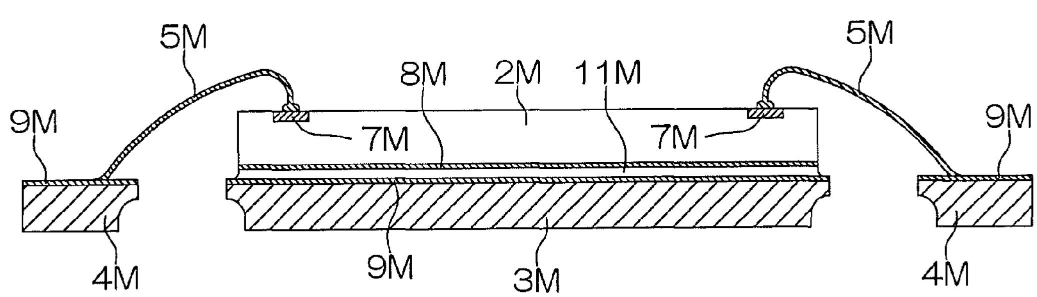

FIG. 160D is a schematic sectional view of a step subsequent to that of FIG. 160C.

Figure 161:
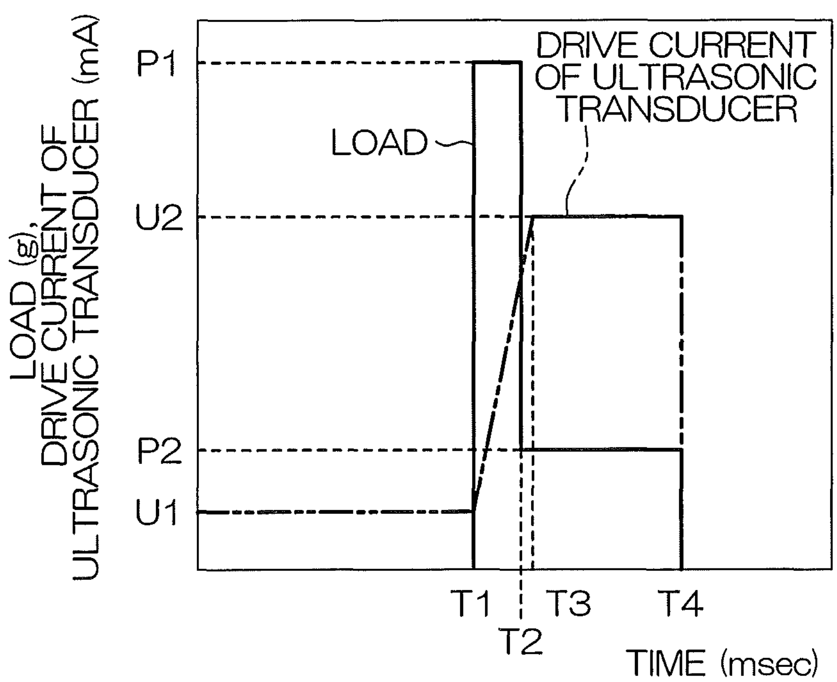

FIG. 161 is a graph of changes with time of a load applied to an FAB and a driving current applied to an ultrasonic transducer during bonding of the FAB to a pad.

Figure 162:
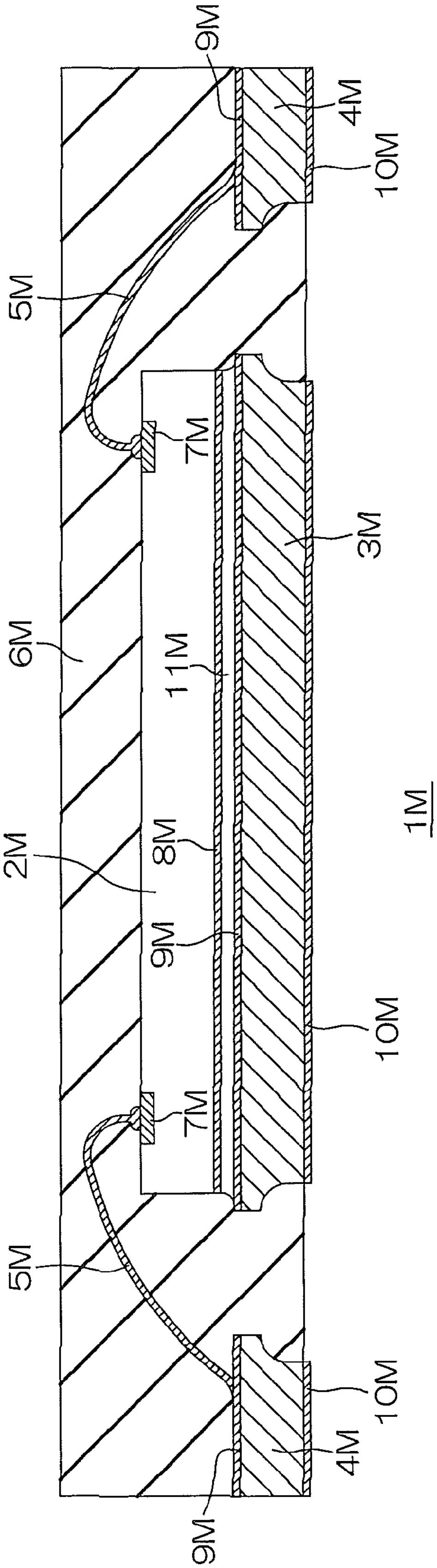

FIG. 162 is a diagram of a modification example of the semiconductor device of FIG. 157.

Figure 163:
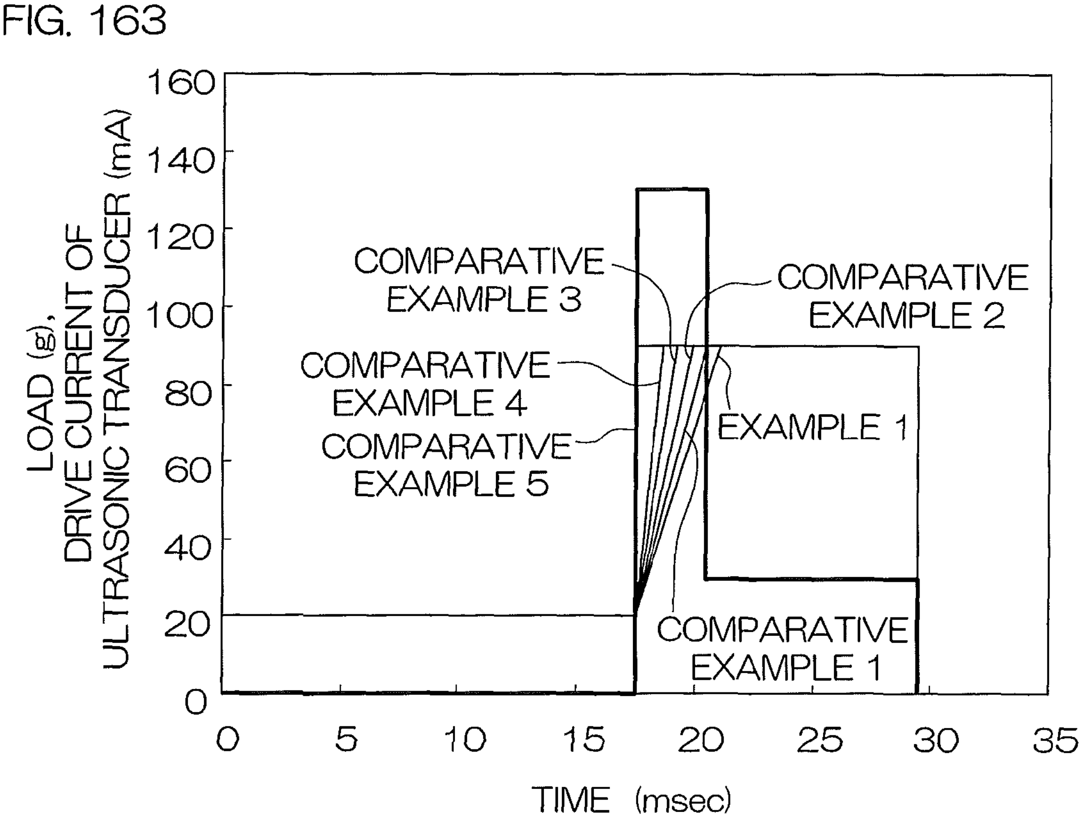

FIG. 163 is a graph of changes with time of a load applied to an FAB and a driving current applied to an ultrasonic transducer during bonding of the FAB to a pad in Example 1 and Comparative Examples 1 to 5 of the thirteenth preferred embodiment.

Figure 164:
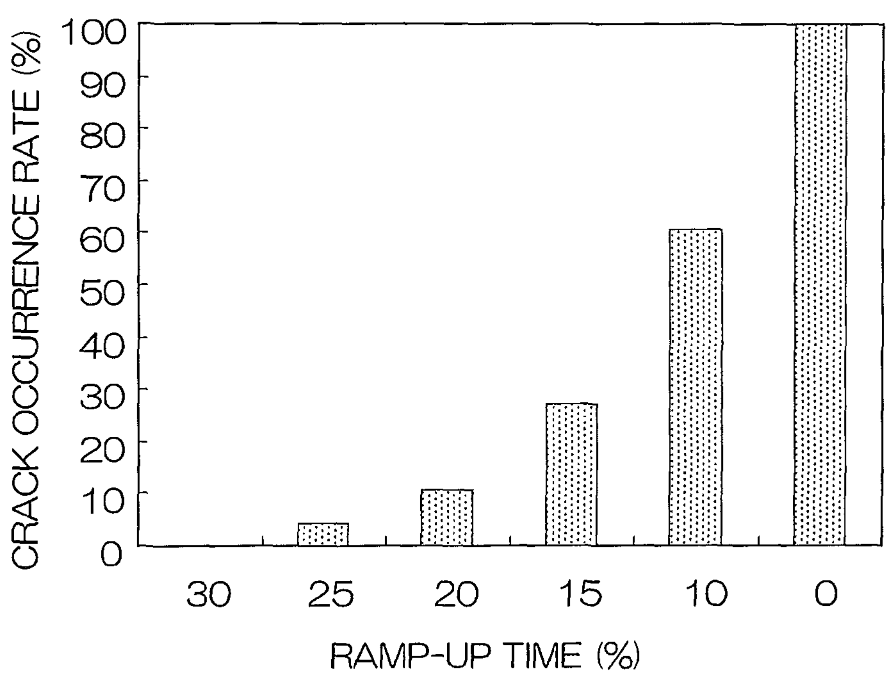

FIG. 164 is a graph of crack occurrence rates in Example 1 and Comparative Examples 1 to 5 of the thirteenth preferred embodiment.

Figure 165:
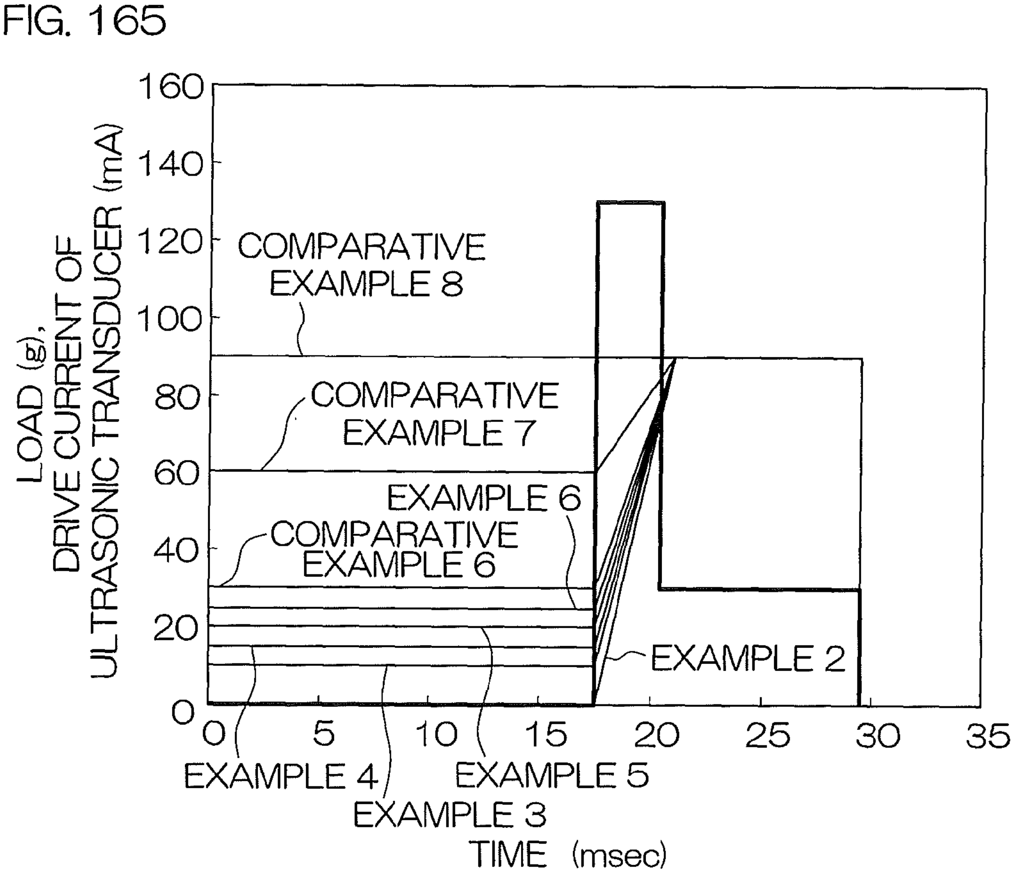

FIG. 165 is a graph of changes with time of a load applied to an FAB and a driving current applied to an ultrasonic transducer during bonding of the FAB to a pad in Examples 2 to 6 and Comparative Examples 6 to 8 of the thirteenth preferred embodiment.

Figure 166:
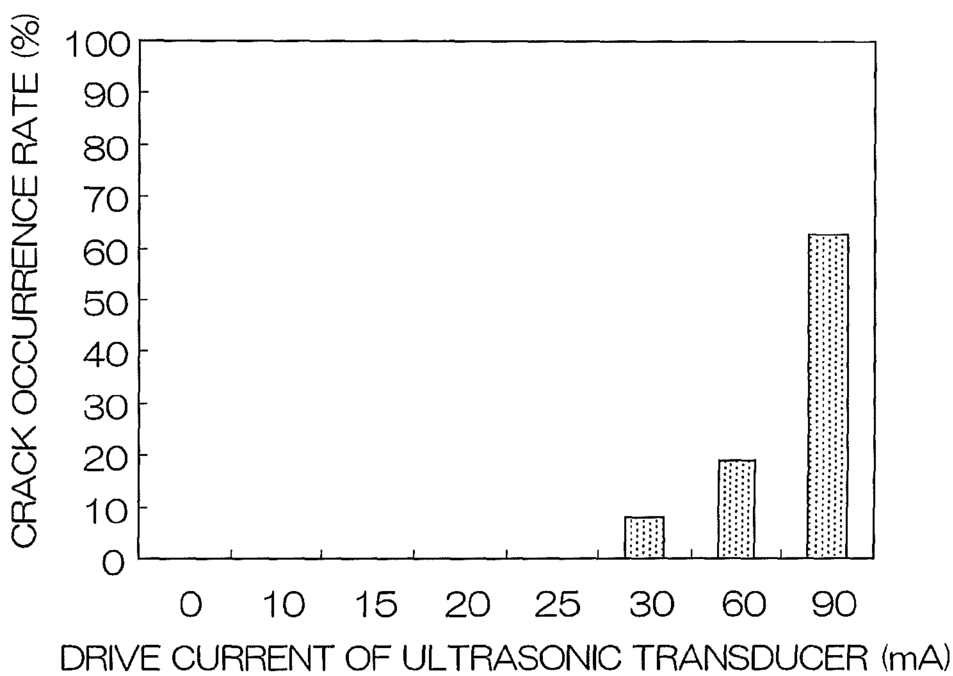

FIG. 166 is a graph of crack occurrence rates in Examples 2 to 6 and Comparative Examples 6 to 8 of the thirteenth preferred embodiment.

Figure 167:
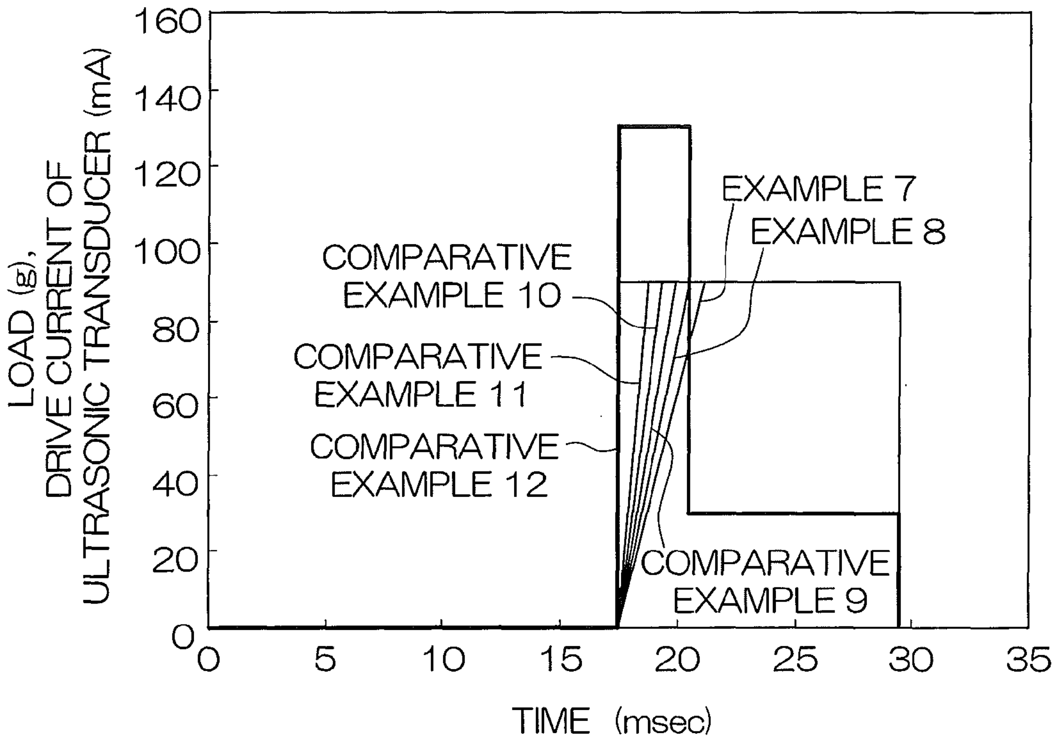

FIG. 167 is a graph of changes with time of a load applied to an FAB and a driving current applied to an ultrasonic transducer during bonding of the FAB to a pad in Examples 7 and 8 and Comparative Examples 9 to 12 of the thirteenth preferred embodiment.

Figure 168:
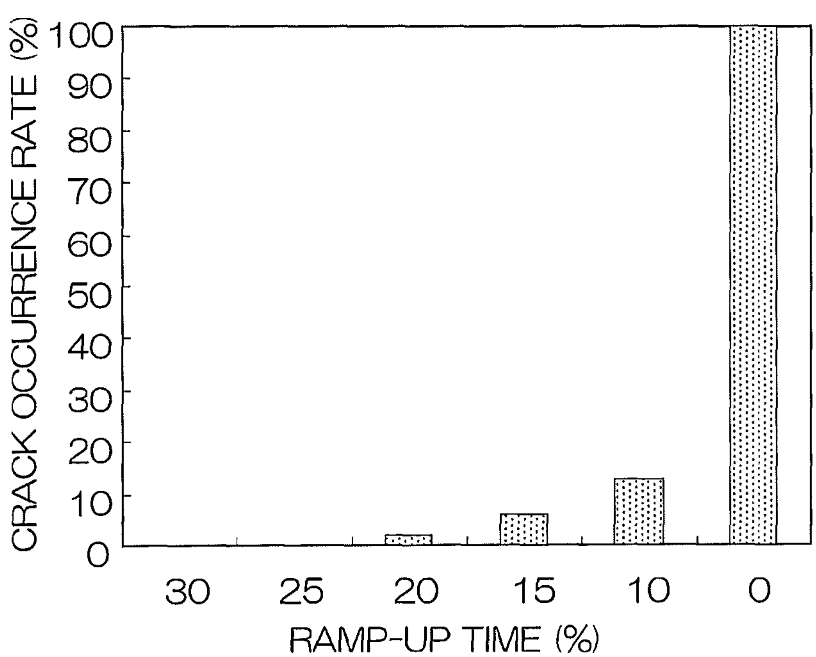

FIG. 168 is a graph of crack occurrence rates in Examples 7 and 8 and Comparative Examples 9 to 12 of the thirteenth preferred embodiment.

Figure 169:
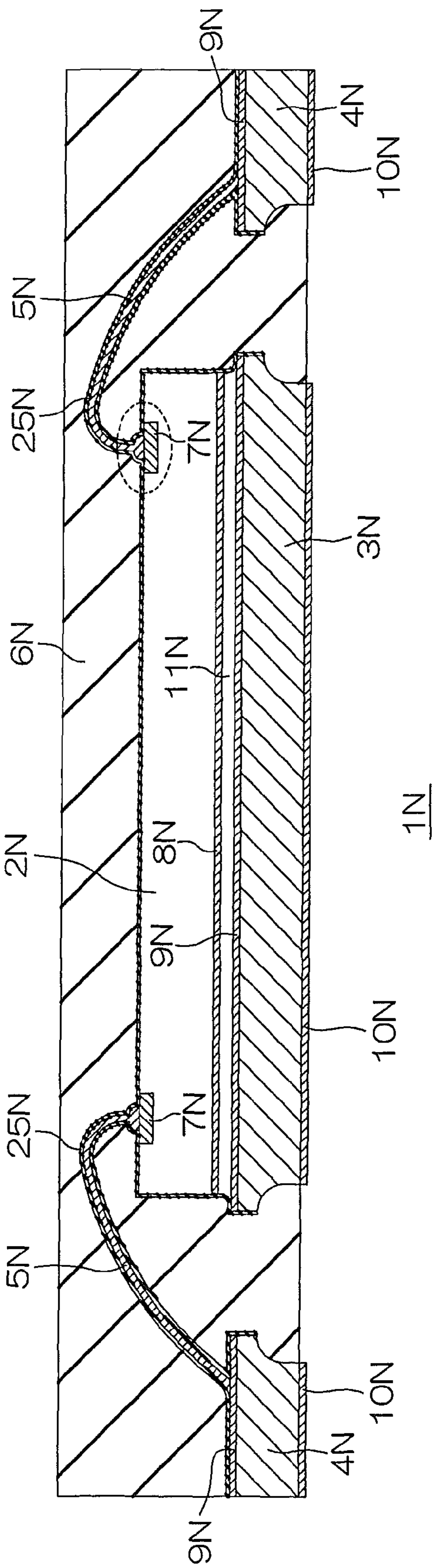

FIG. 169 is a schematic sectional view of a semiconductor device according to a fourteenth preferred embodiment of the present invention.

Figure 170:
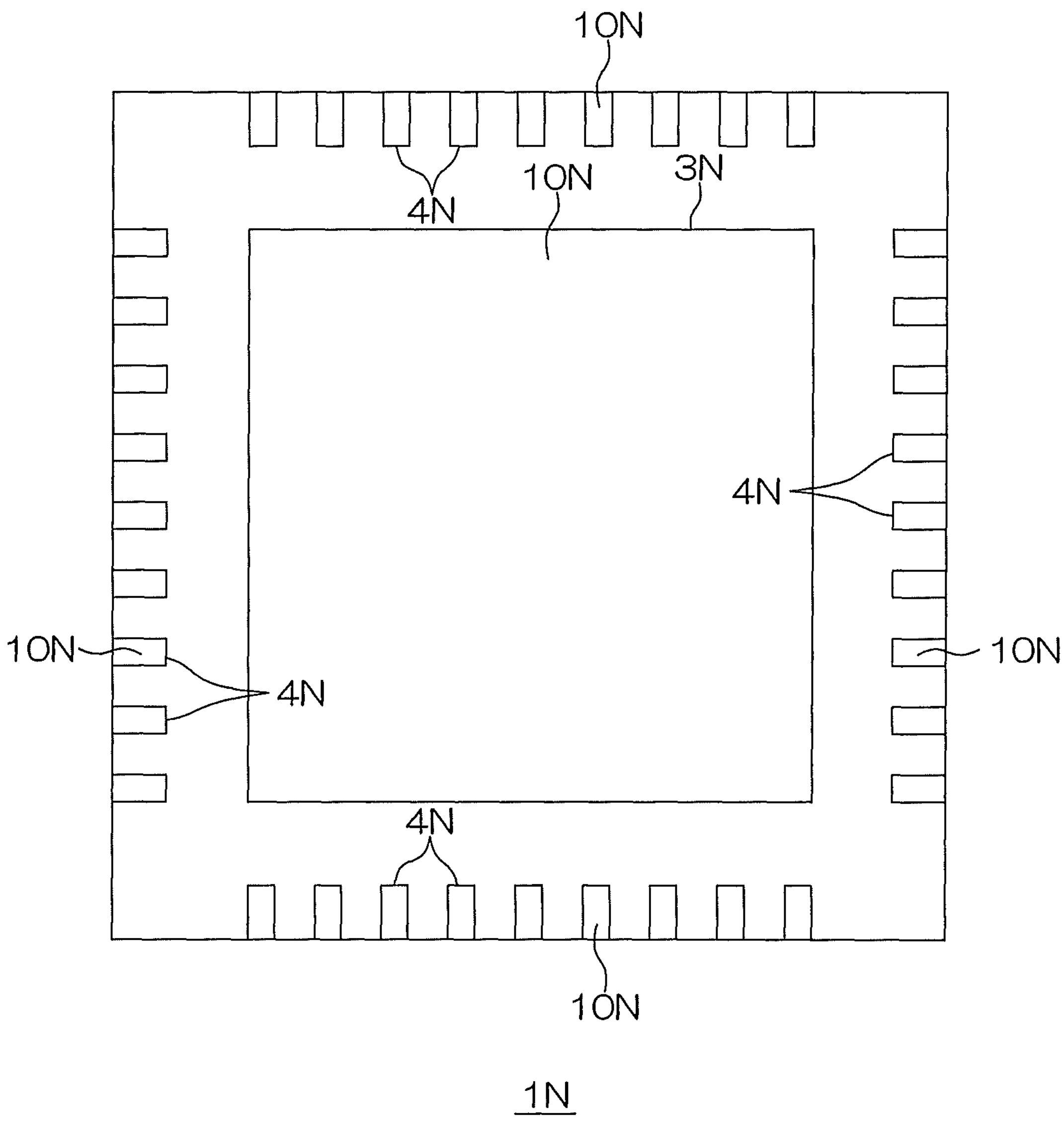

FIG. 170 is a schematic bottom view of the semiconductor device shown in FIG. 169.

Figure 171:
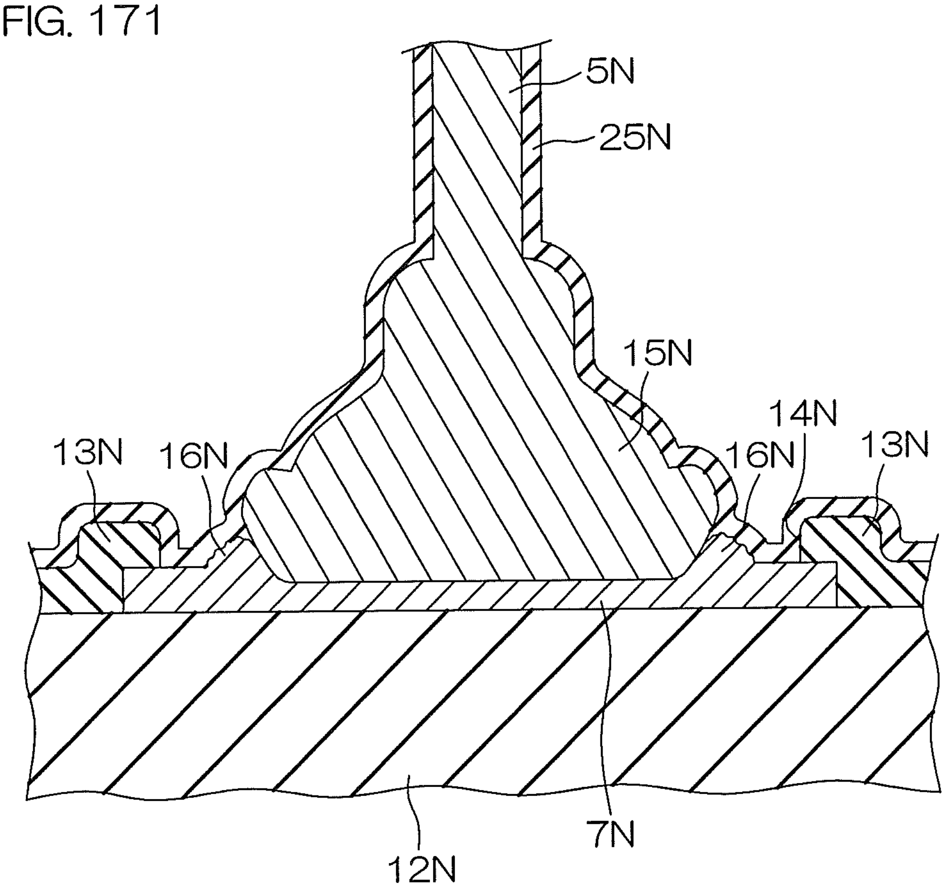

FIG. 171 is an enlarged view of a portion surrounded by broken lines shown in FIG. 169.

Figure 172A:
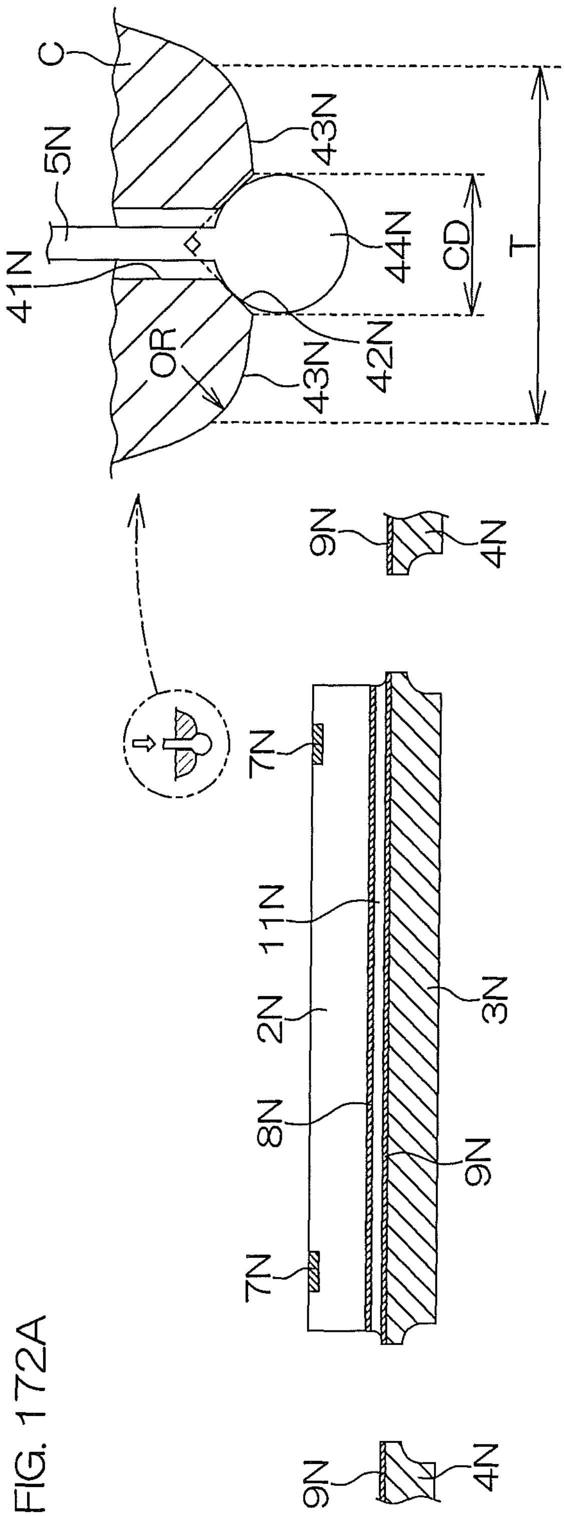

FIG. 172A is a schematic sectional view of a state in a middle of manufacture (middle of wire bonding) of the semiconductor device shown in FIG. 169.

Figure 172B:
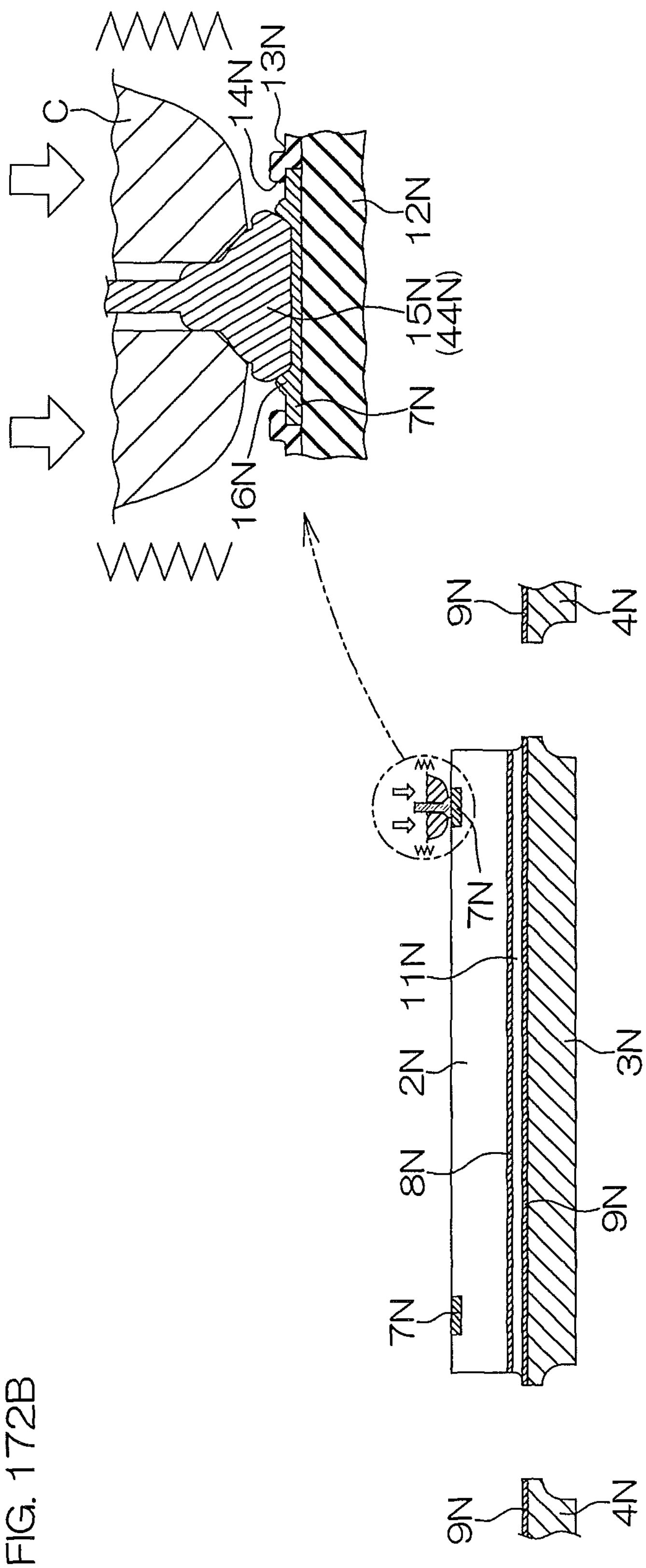

FIG. 172B is a schematic sectional view of a step subsequent to that of FIG. 172A.

Figure 172C:
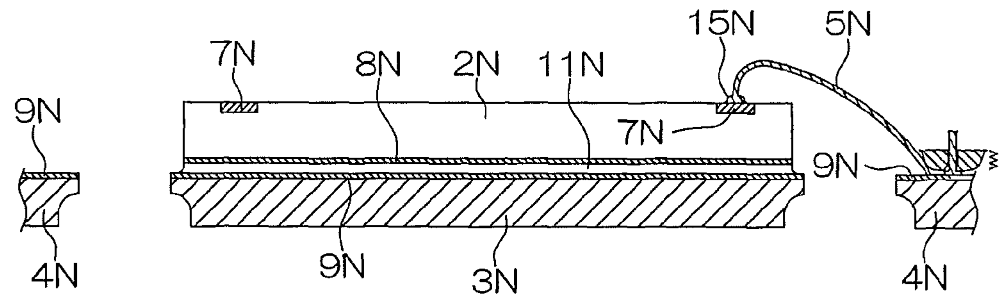

FIG. 172C is a schematic sectional view of a step subsequent to that of FIG. 172B.

Figure 172D:
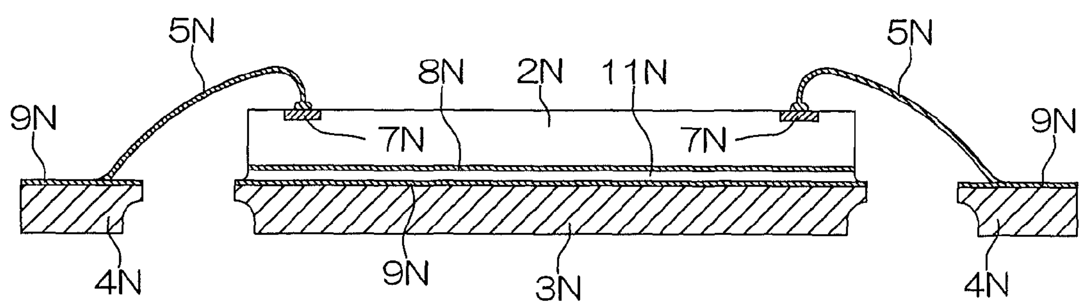

FIG. 172D is a schematic sectional view of a step subsequent to that of FIG. 172C.

Figure 173:
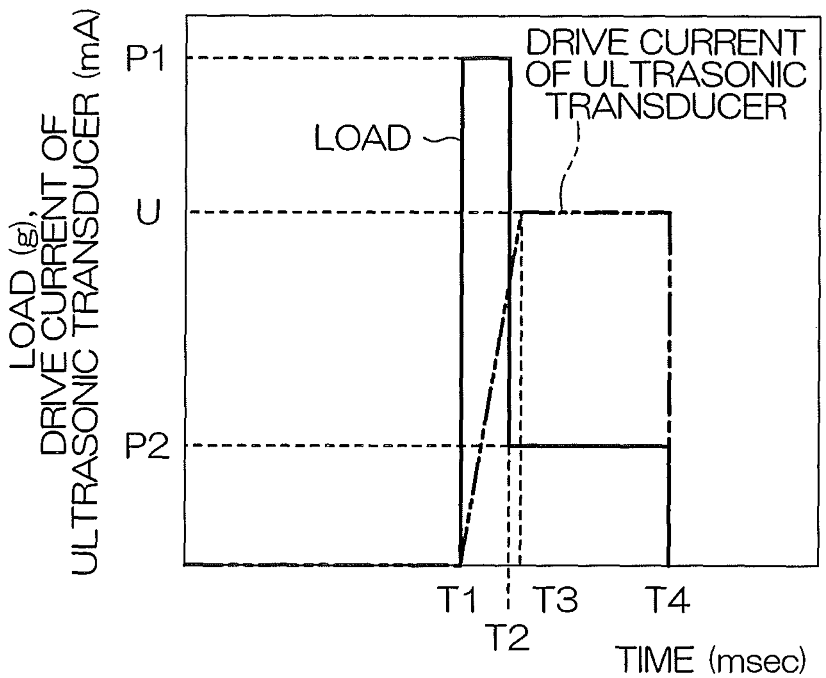

FIG. 173 is a graph of changes with time of a load applied to an FAB and a driving current applied to an ultrasonic transducer during bonding of the FAB to a pad.

Figure 174:
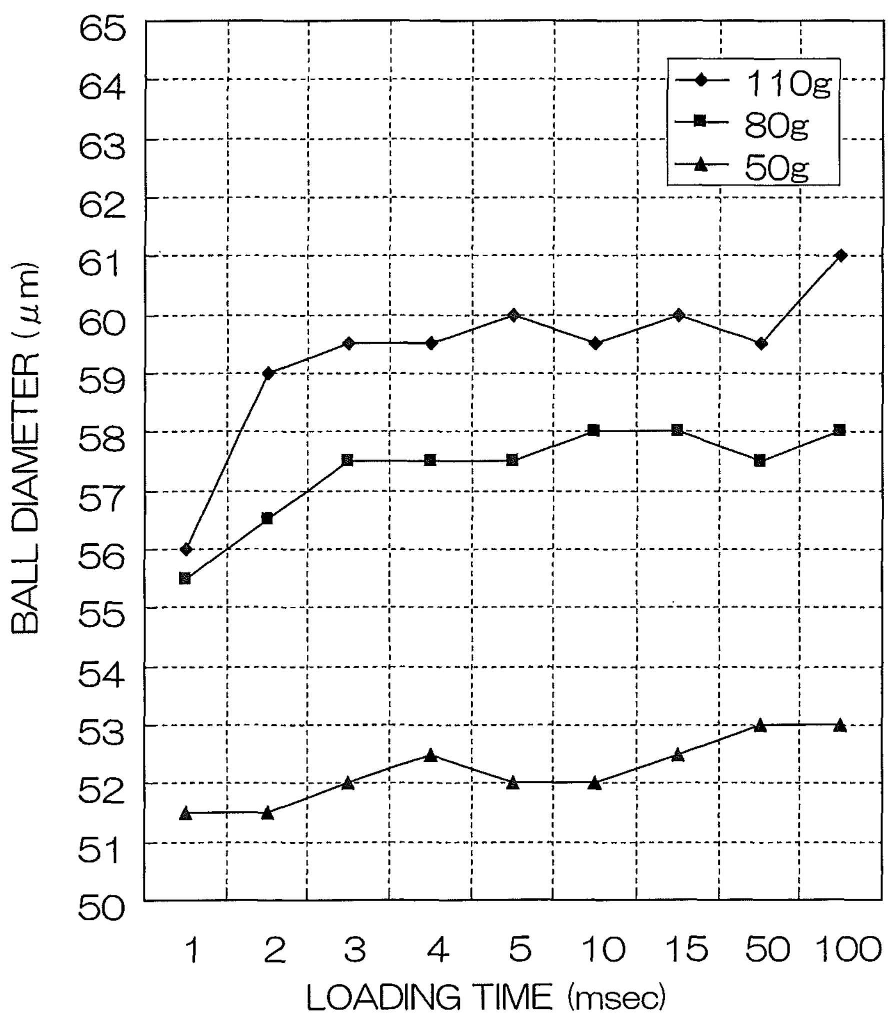

FIG. 174 is a graph of changes with time of diameters (ball diameters) measured in test 1.

Figure 175:
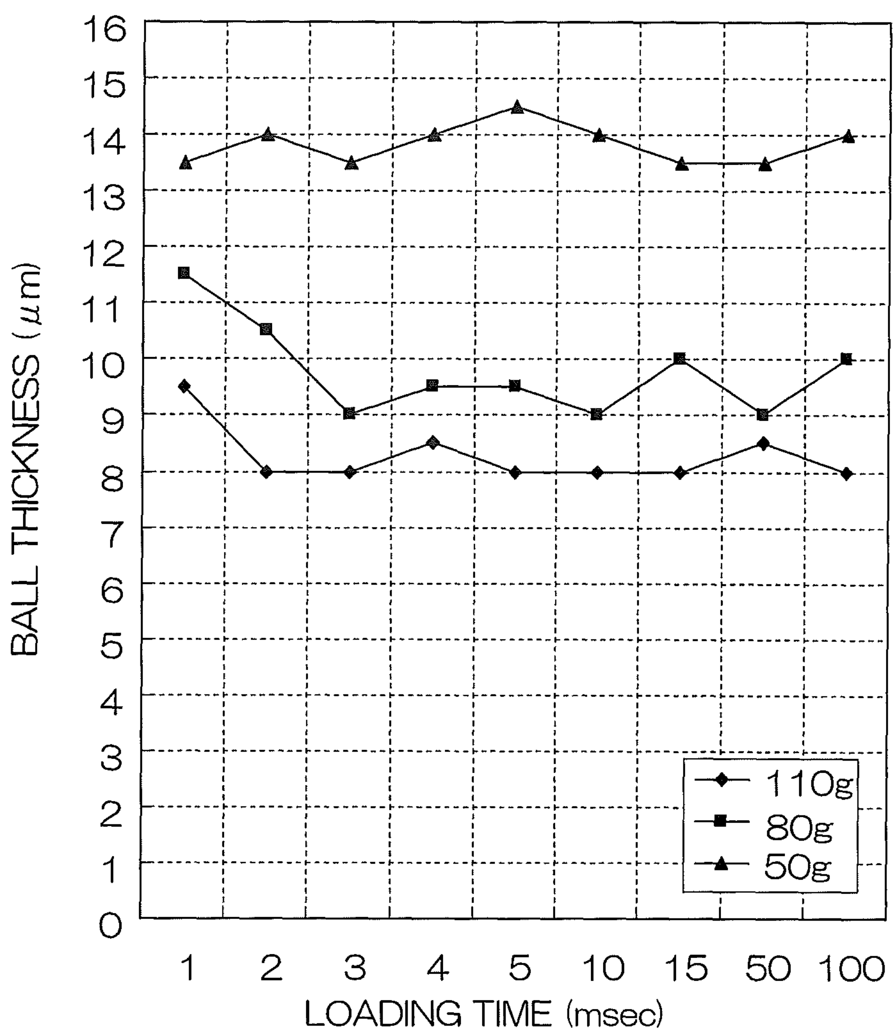

FIG. 175 is a graph of changes with time of thicknesses (ball thicknesses) measured in test 1.

Figure 176:
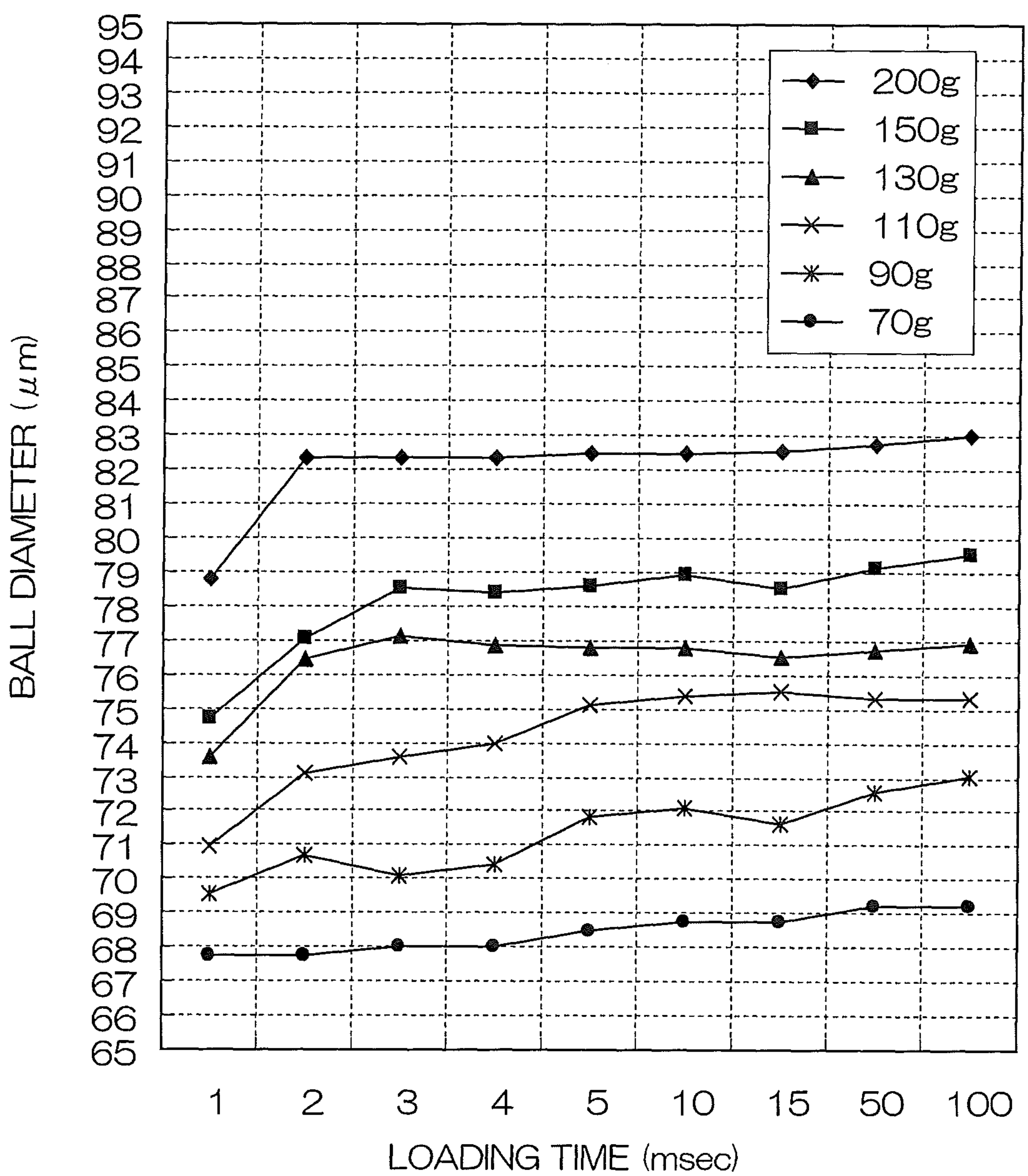

FIG. 176 is a graph of changes with time of diameters (ball diameters) measured in test 2.

Figure 177:
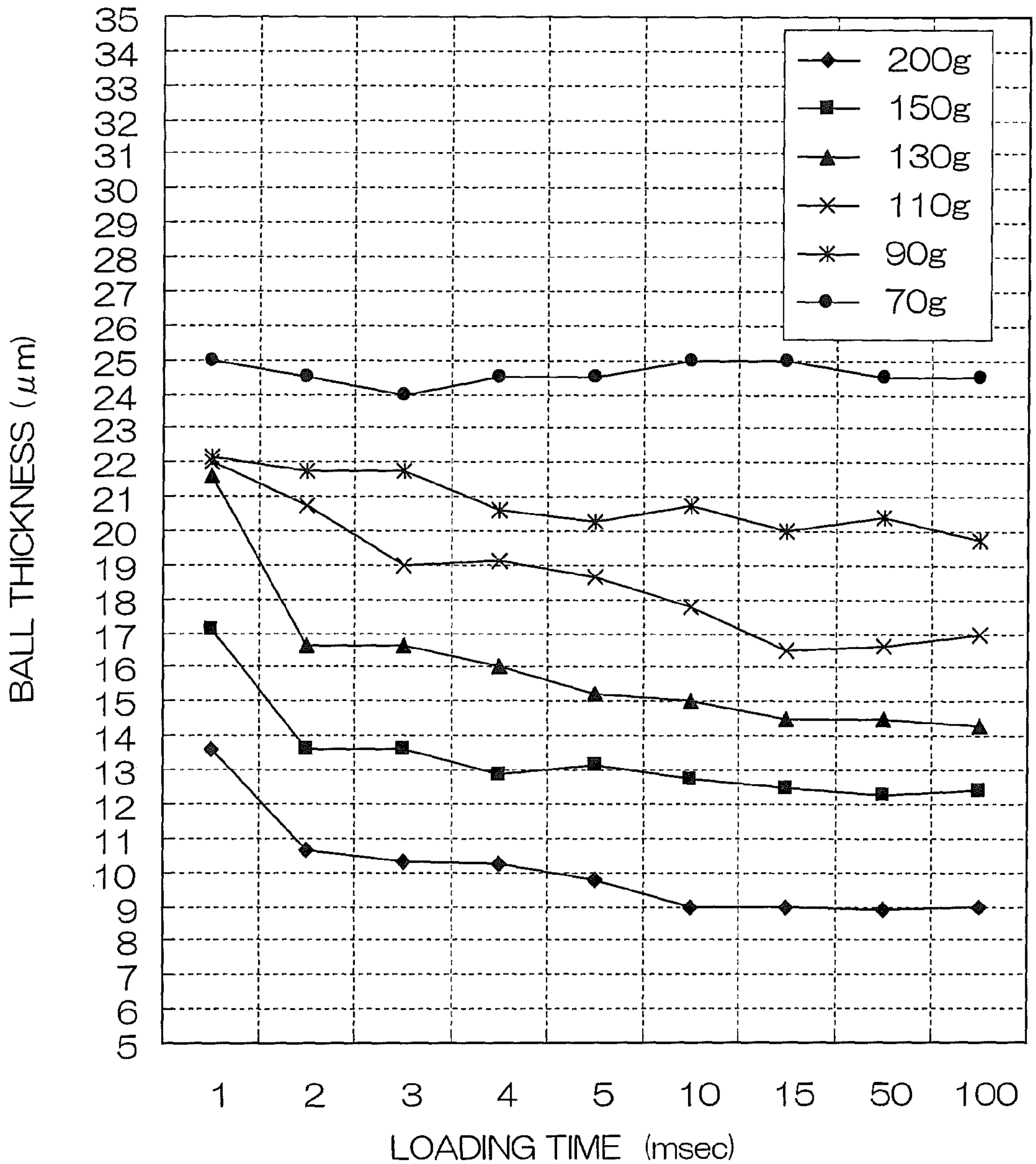

FIG. 177 is a graph of changes with time of thicknesses (ball thicknesses) measured in test 2.

Figure 178:
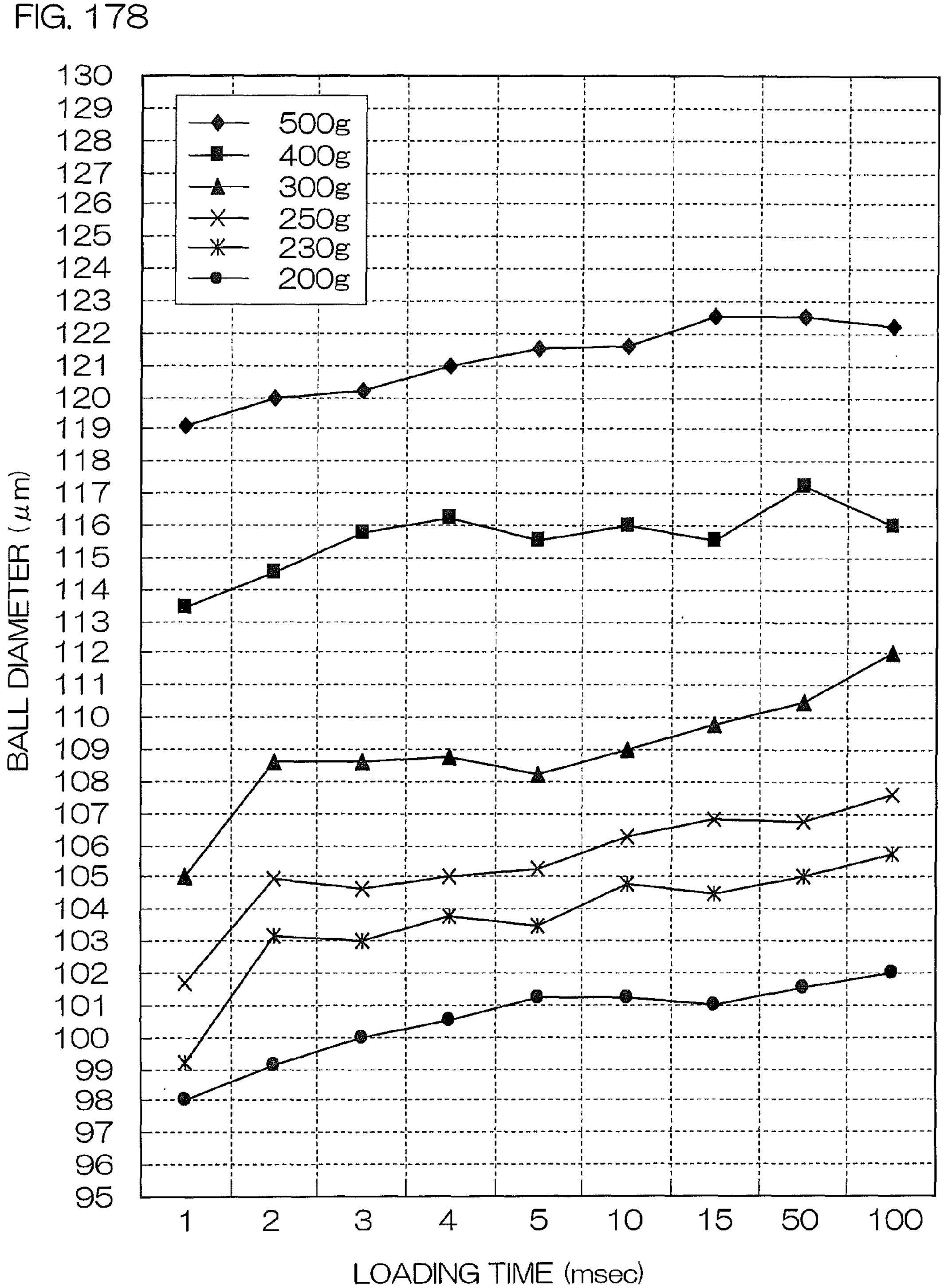

FIG. 178 is a graph of changes with time of diameters (ball diameters) measured in test 3.

Figure 179:
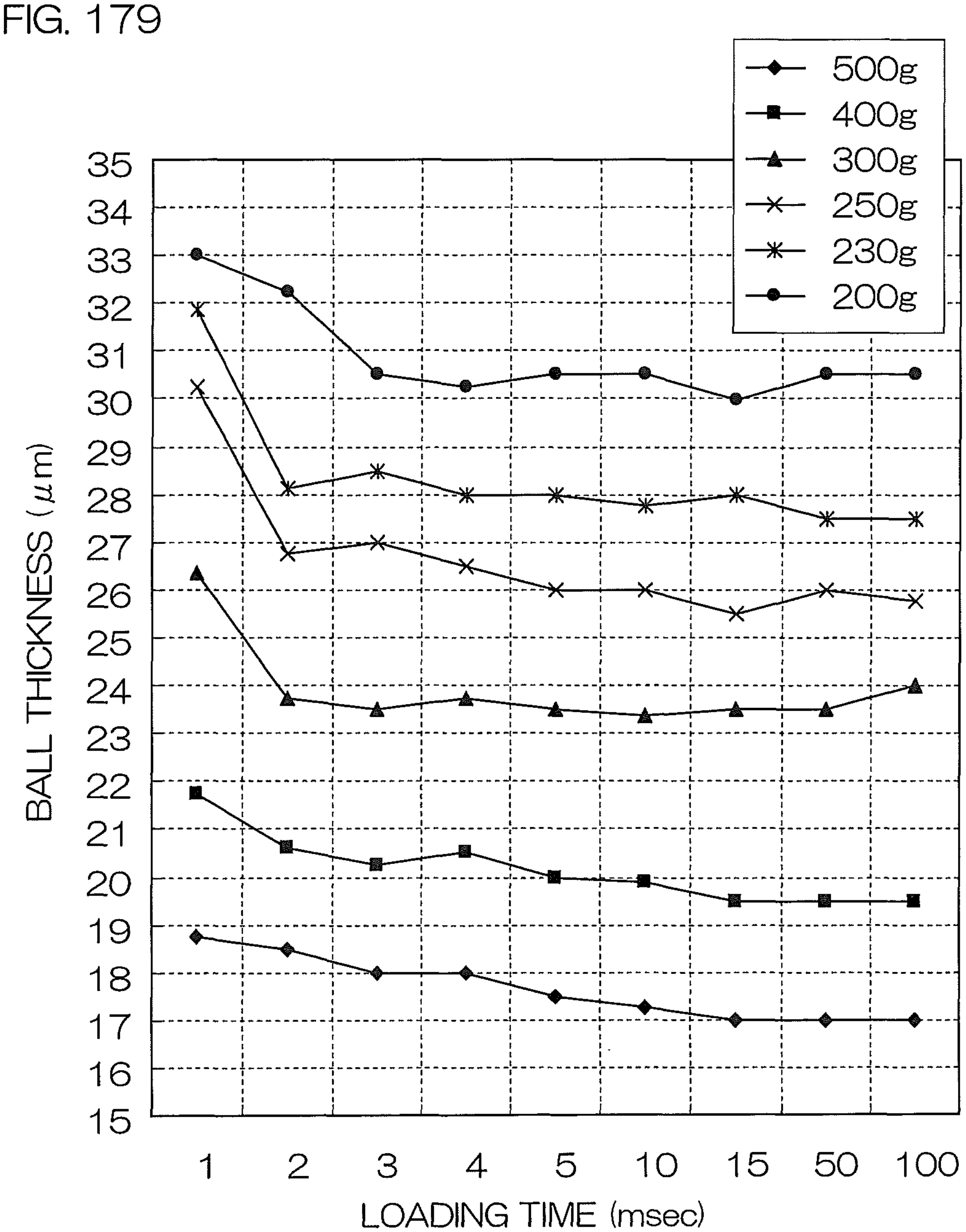

FIG. 179 is a graph of changes with time of thicknesses (ball thicknesses) measured in test 3.

Figure 180:
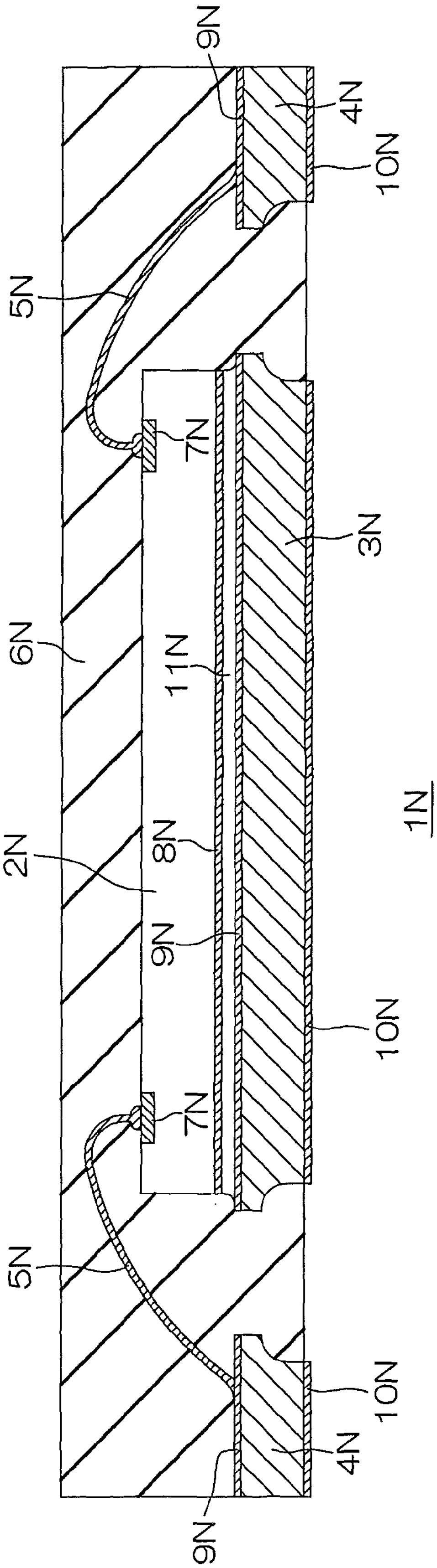

FIG. 180 is a diagram of a modification example of the semiconductor device of FIG. 169.

Figure 181:
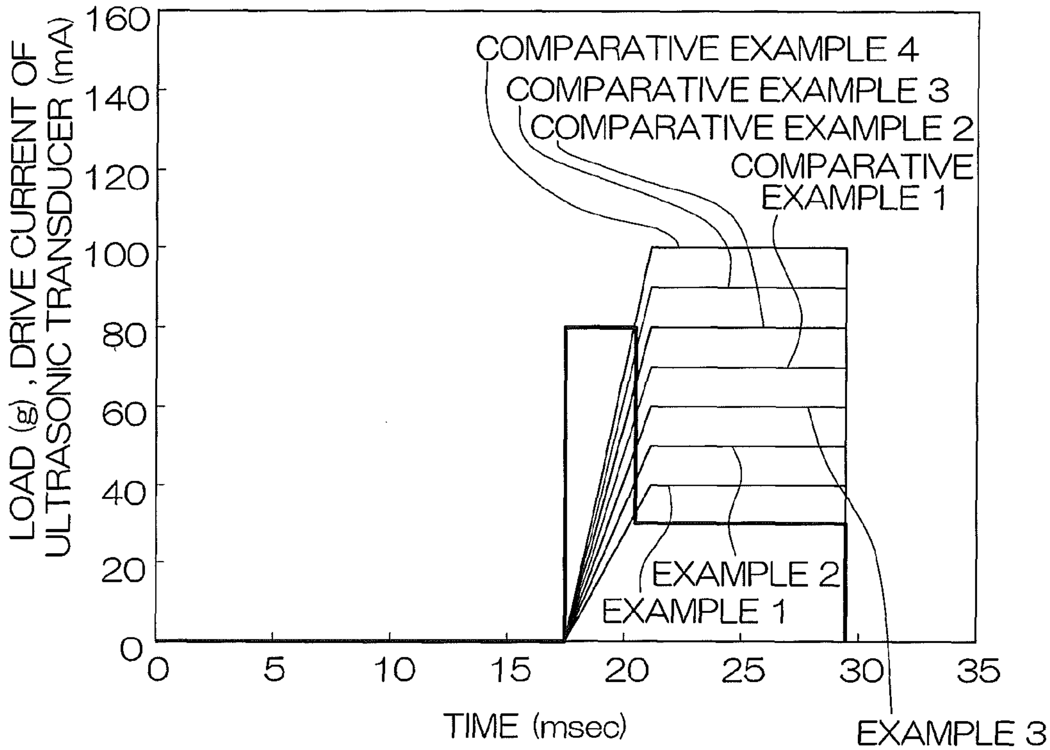

FIG. 181 is a graph of changes with time of a load applied to an FAB and a driving current applied to an ultrasonic transducer during bonding of the FAB to a pad in Examples 1 to 3 and Comparative Examples 1 to 4 of the fourteenth preferred embodiment.

Figure 182:
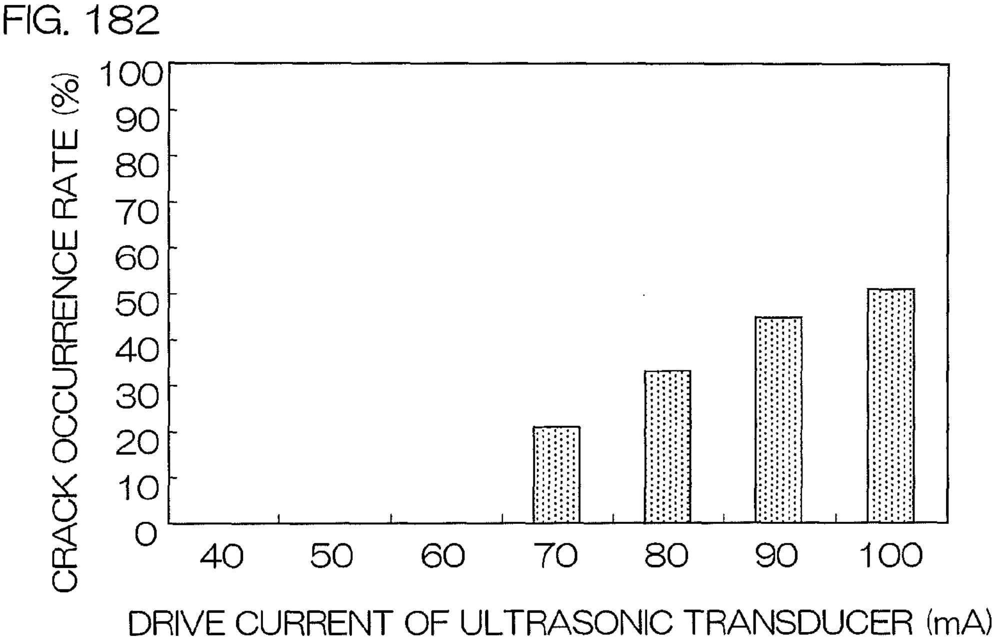

FIG. 182 is a graph of crack occurrence rates in Examples 1 to 3 and Comparative Examples 1 to 4 of the fourteenth preferred embodiment.

Figure 183:
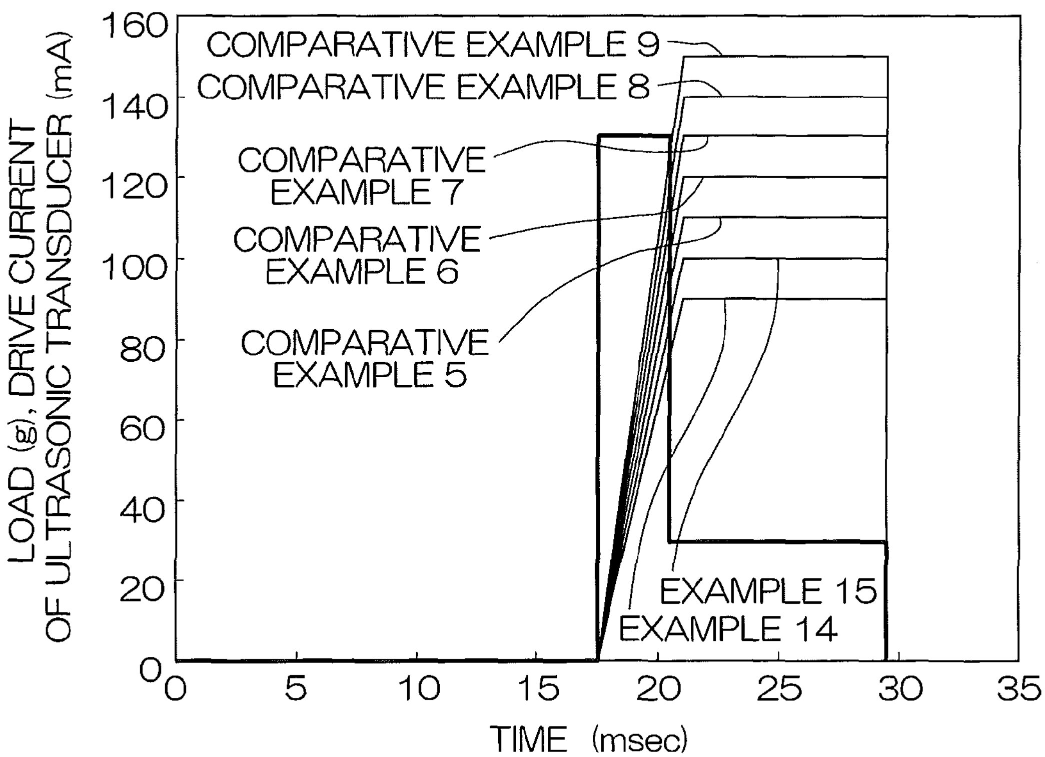

FIG. 183 is a graph of changes with time of a load applied to an FAB and a driving current applied to an ultrasonic transducer during bonding of the FAB to a pad in Examples 4 and 5 and Comparative Examples 5 to 9 of the fourteenth preferred embodiment.

Figure 184:
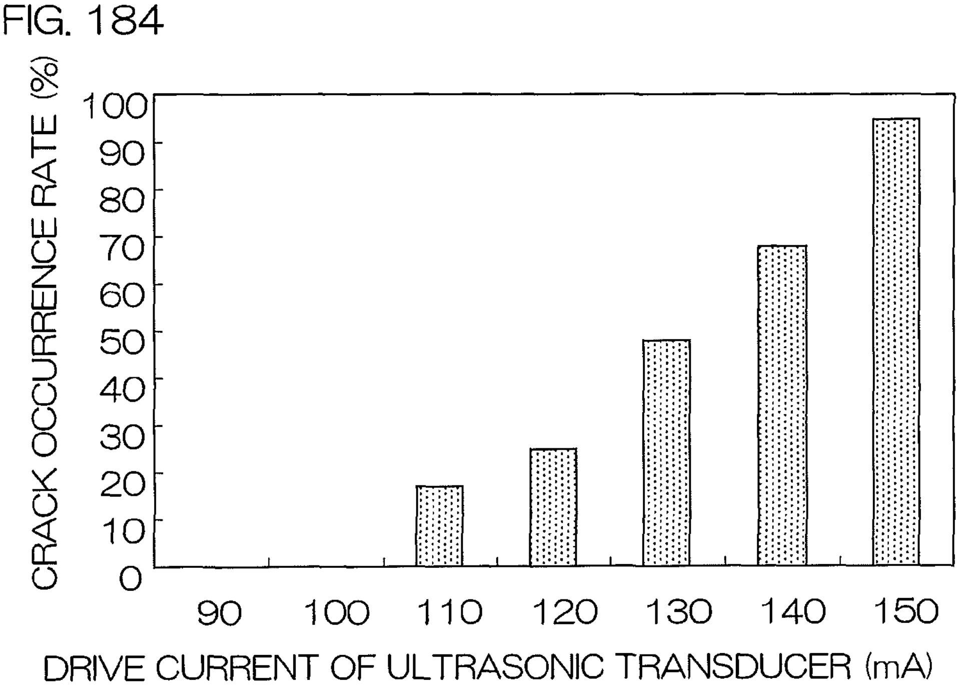

FIG. 184 is a graph of crack occurrence rates in Examples 4 and 5 and Comparative Examples 5 to 9 of the fourteenth preferred embodiment.

Figure 185:
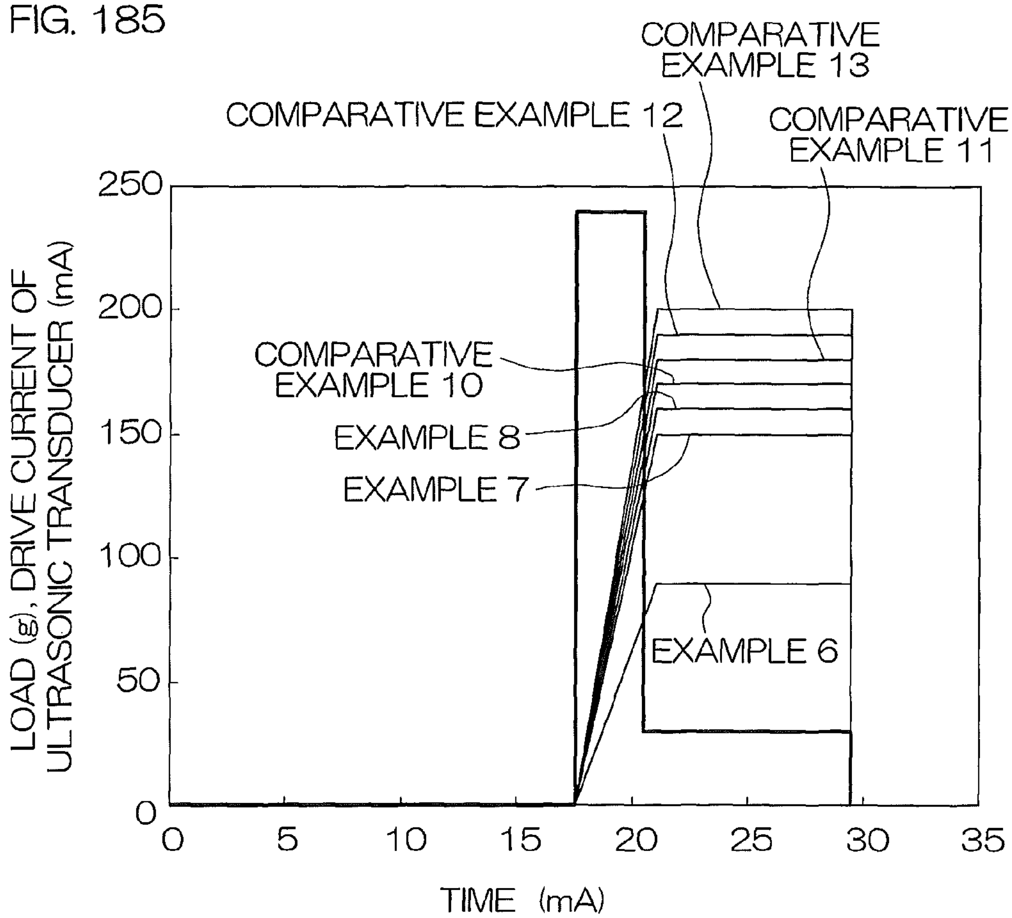

FIG. 185 is a graph of changes with time of a load applied to an FAB and a driving current applied to an ultrasonic transducer during bonding of the FAB to a pad in Examples 6 to 8 and Comparative Examples 10 to 13 of the fourteenth preferred embodiment.

Figure 186:
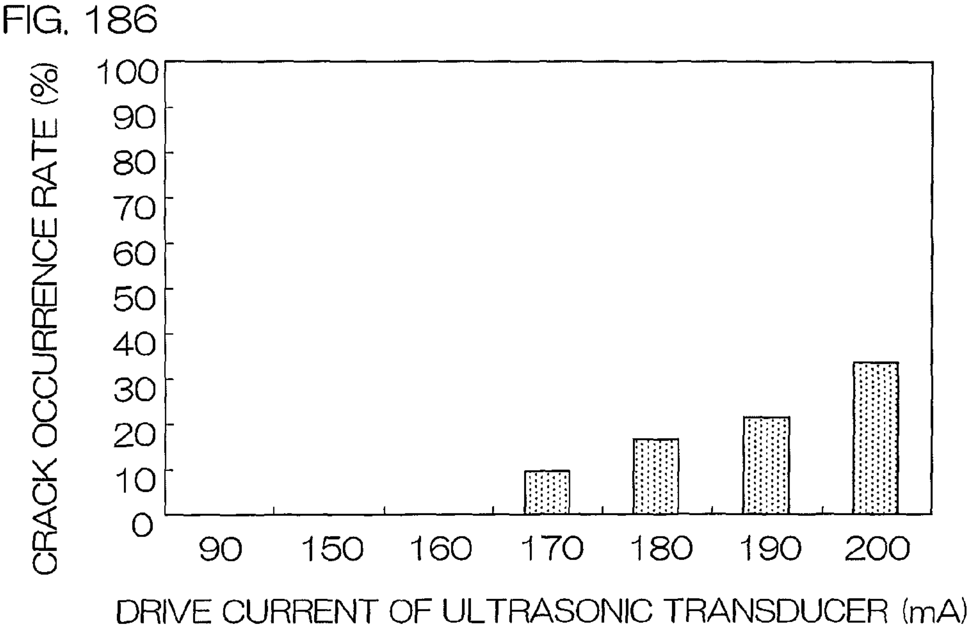

FIG. 186 is a graph of crack occurrence rates in Examples 6 to 8 and Comparative Examples 10 to 13 of the fourteenth preferred embodiment.

Figure 187:
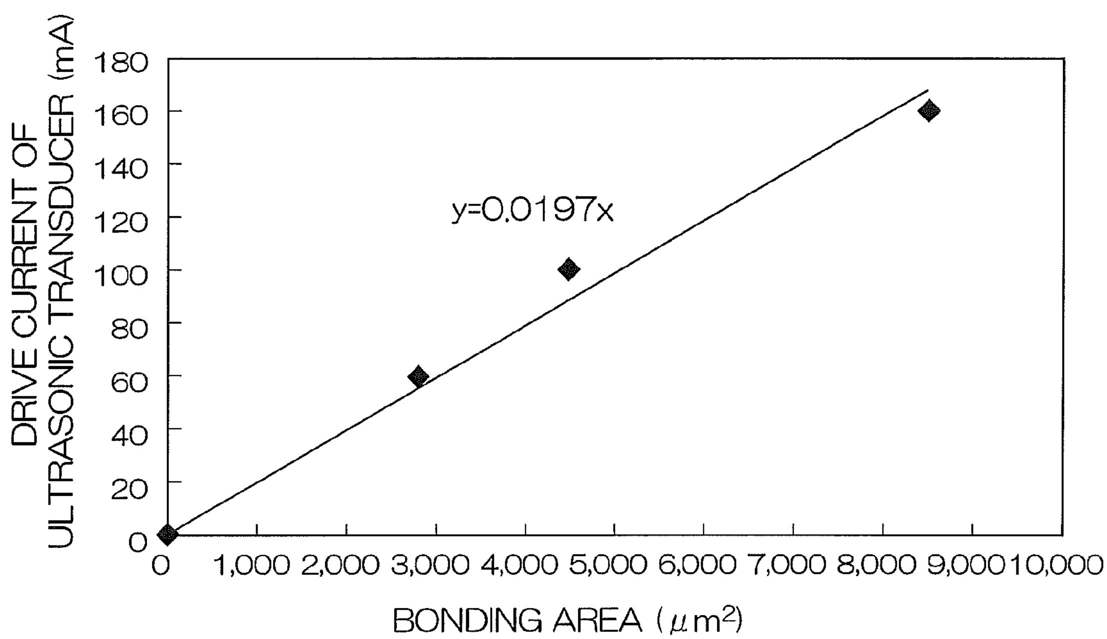

FIG. 187 is a graph of a relationship between an area of bonding of a first ball portion to a pad and a driving current of an ultrasonic transducer.

Figure 188:
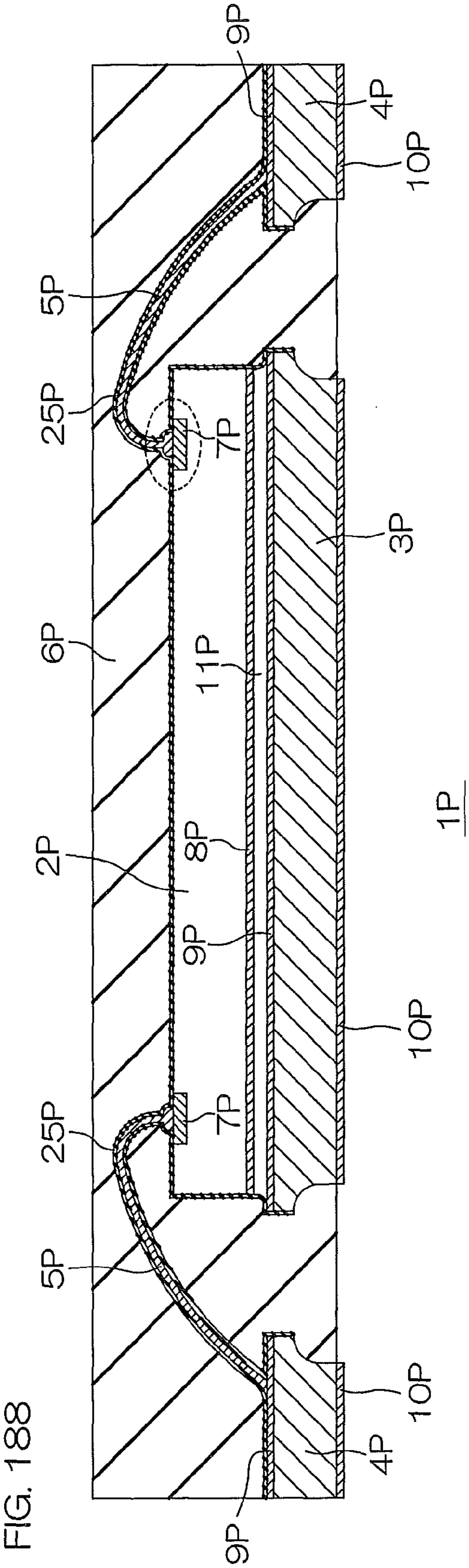

FIG. 188 is a schematic sectional view of a semiconductor device according to a fifteenth preferred embodiment of the present invention.

Figure 189:
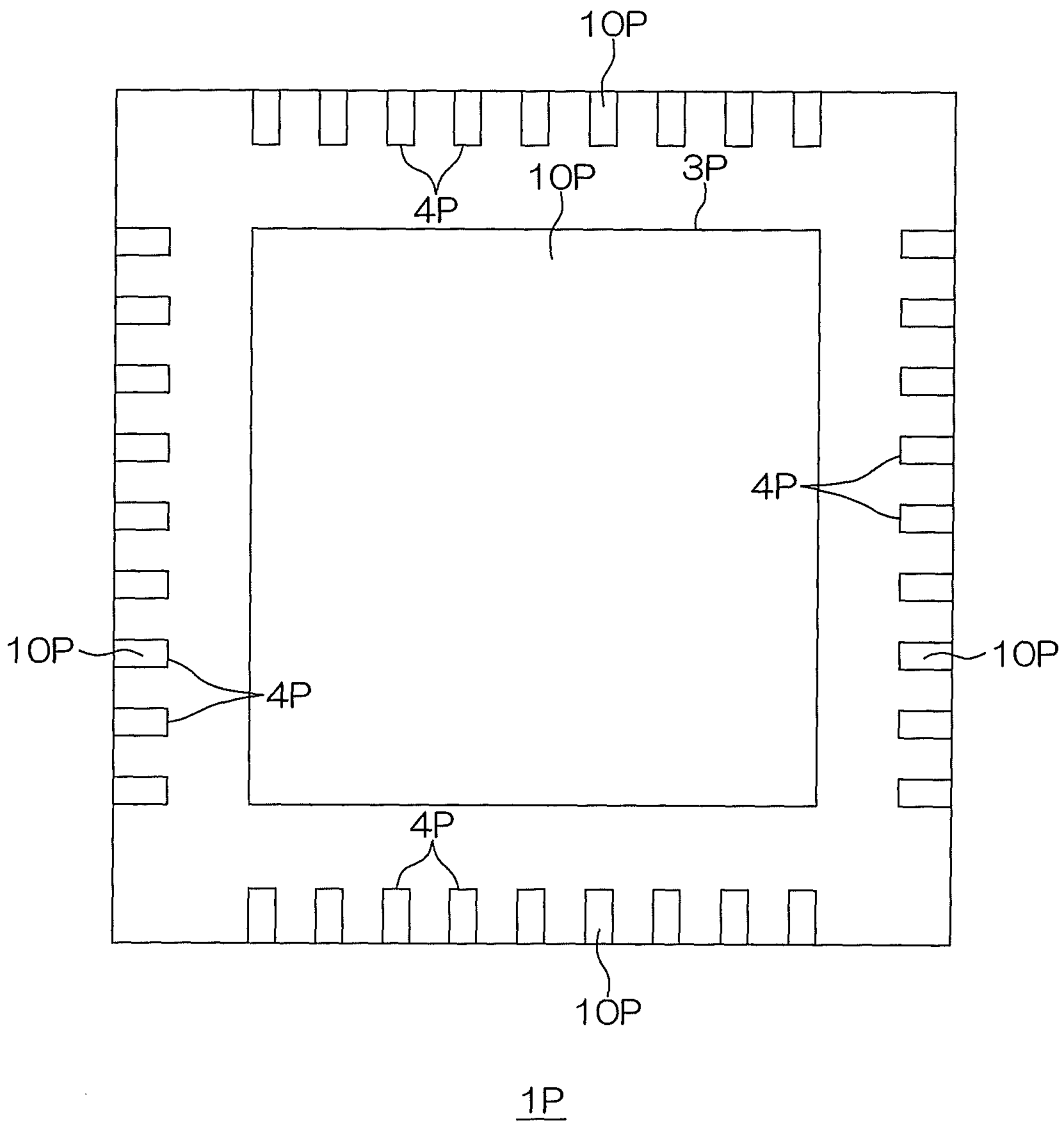

FIG. 189 is a schematic bottom view of the semiconductor device shown in FIG. 188.

Figure 190:
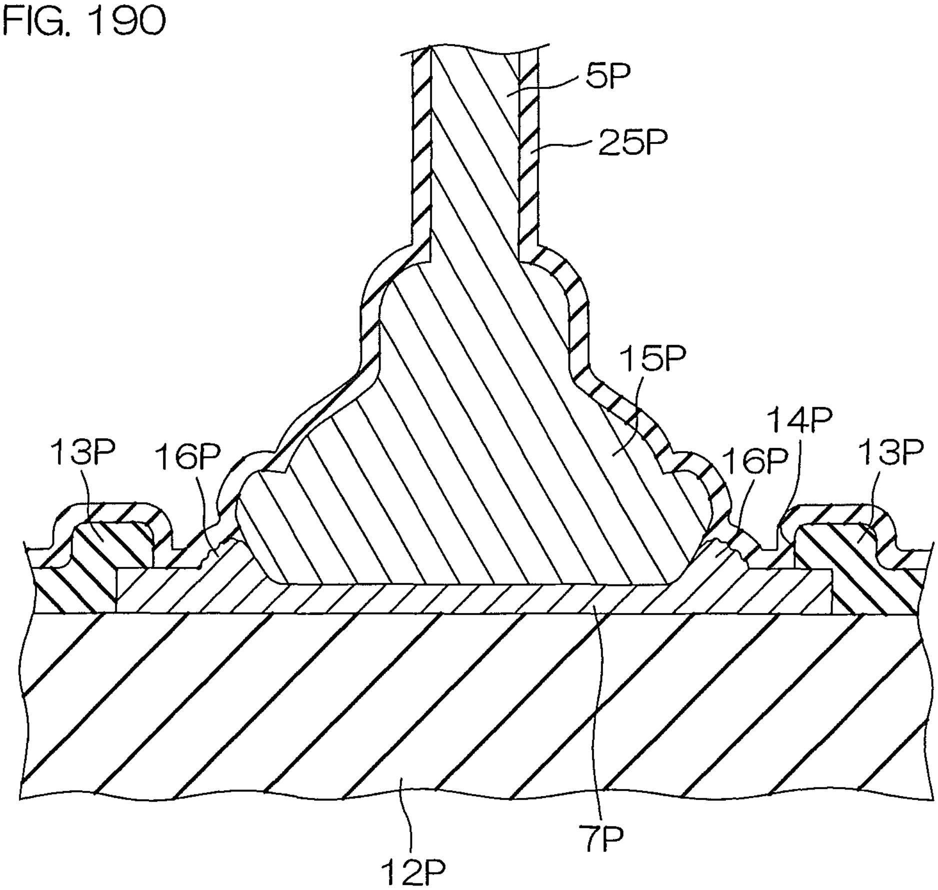

FIG. 190 is an enlarged view of a portion surrounded by broken lines shown in FIG. 188.

Figure 191A:
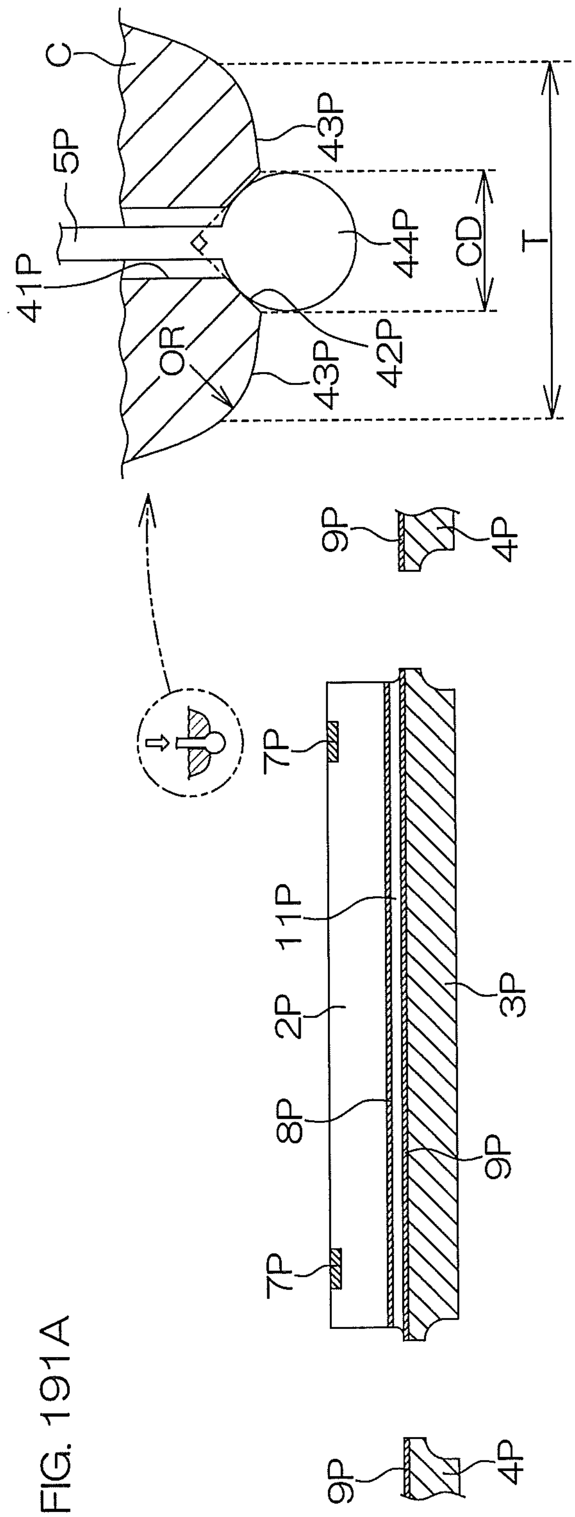

FIG. 191A is a schematic sectional view of a state in a middle of manufacture (middle of wire bonding) of the semiconductor device shown in FIG. 188.

Figure 191B:
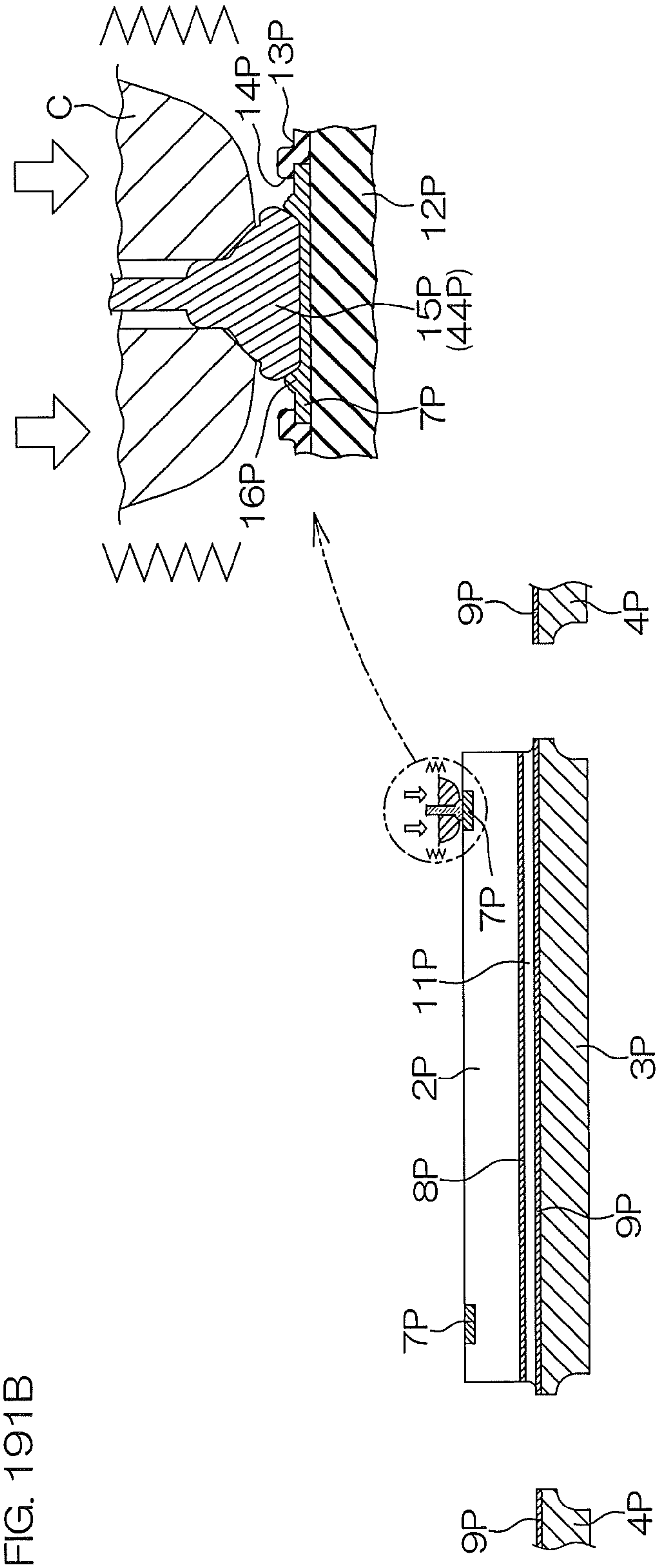

FIG. 191B is a schematic sectional view of a step subsequent to that of FIG. 191A.

Figure 191C:
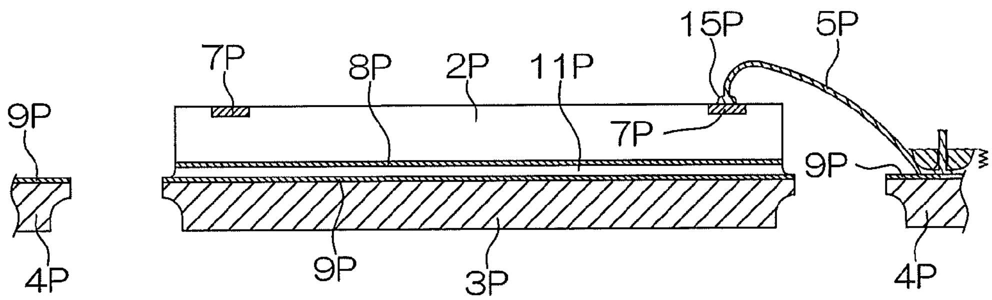

FIG. 191C is a schematic sectional view of a step subsequent to that of FIG. 191B.

Figure 191D:
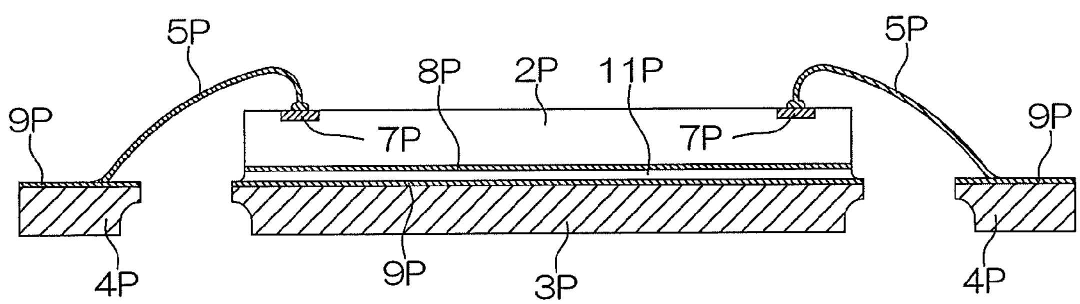

FIG. 191D is a schematic sectional view of a step subsequent to that of FIG. 191C.

Figure 192:
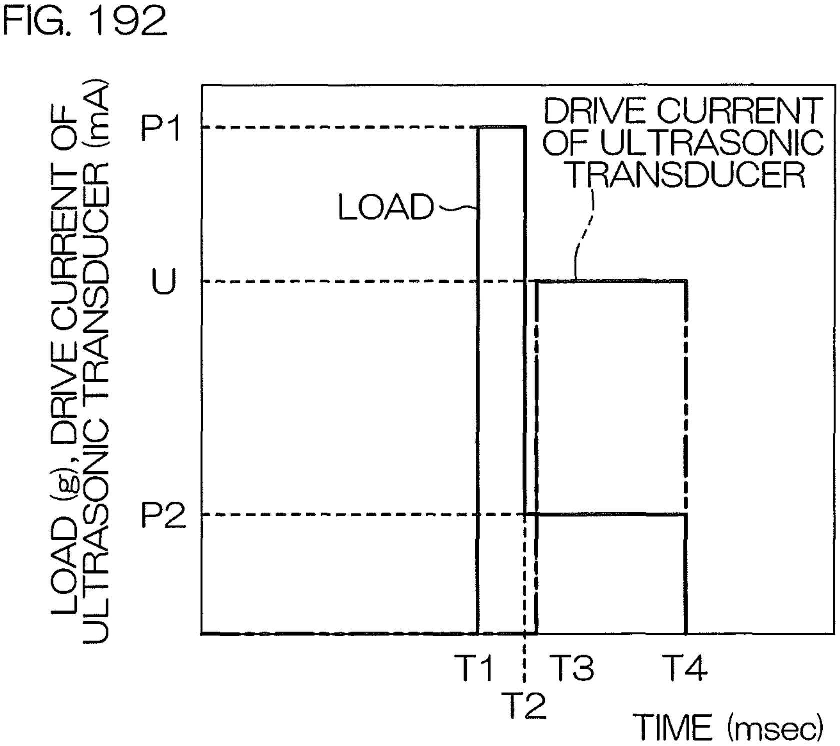

FIG. 192 is a graph of changes with time of a load applied to an FAB and a driving current applied to an ultrasonic transducer during bonding of the FAB to a pad.

Figure 193:
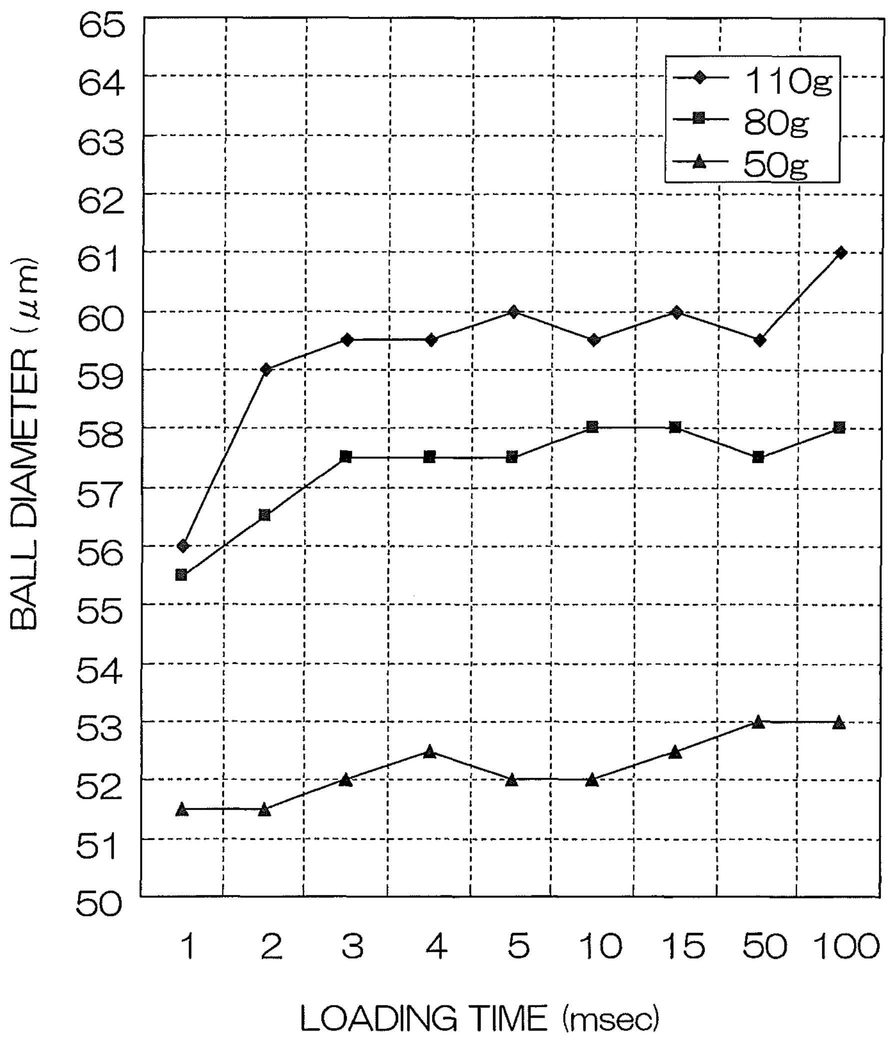

FIG. 193 is a graph of changes with time of diameters (ball diameters) measured in test 1.

Figure 194:
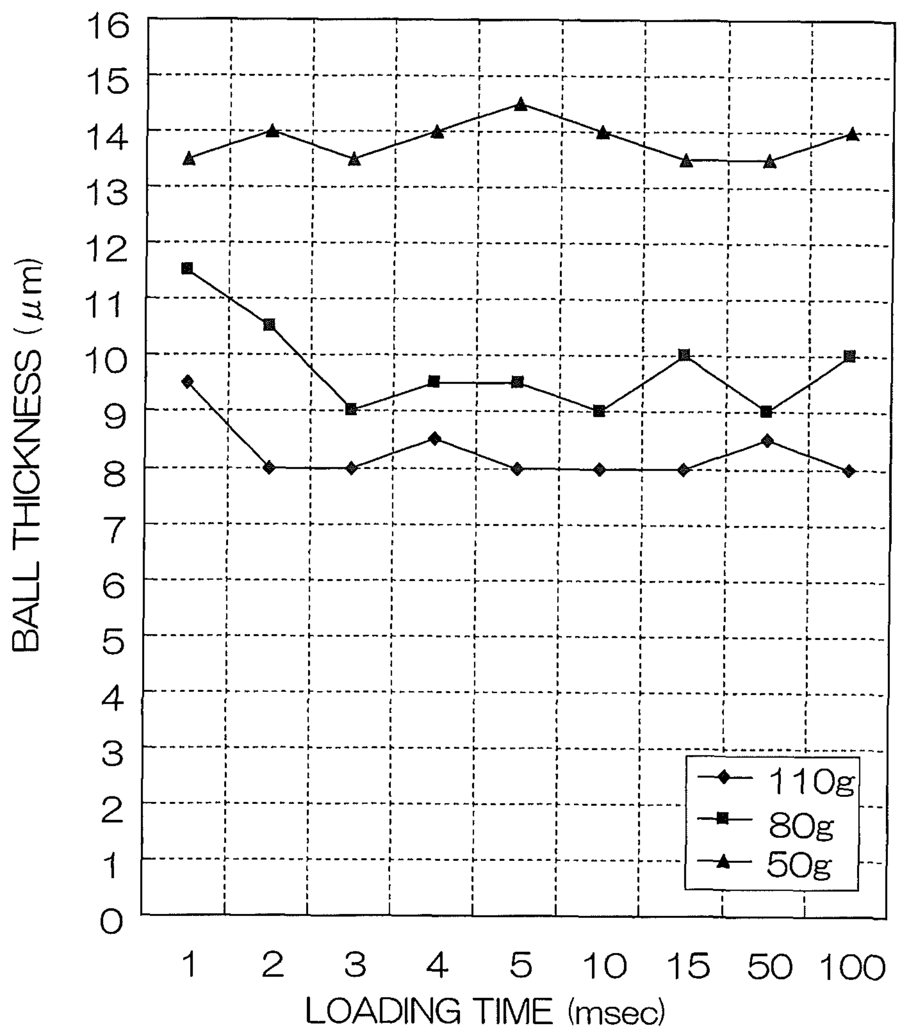

FIG. 194 is a graph of changes with time of thicknesses (ball thicknesses) measured in test 1.

Figure 195:
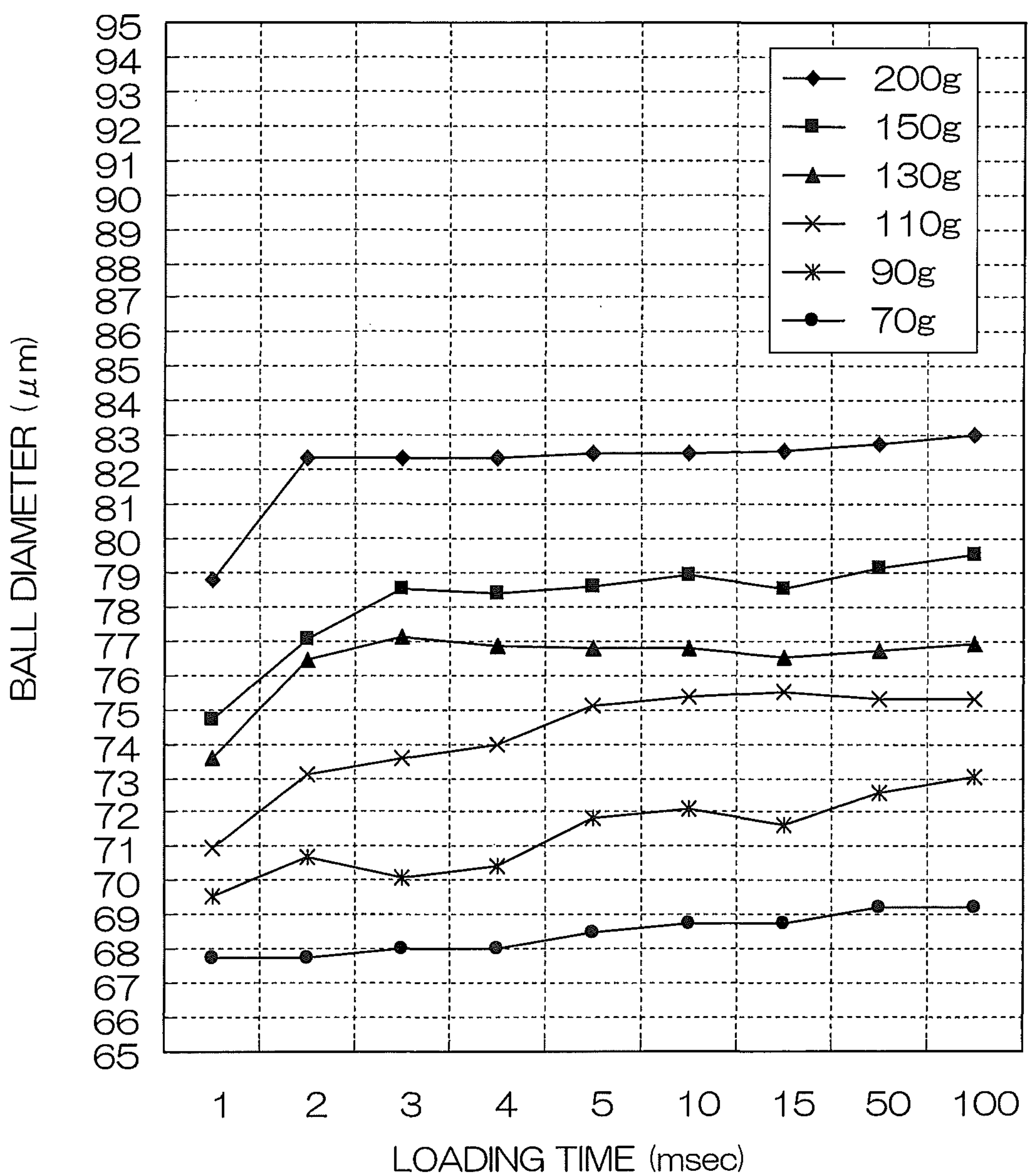

FIG. 195 is a graph of changes with time of diameters (ball diameters) measured in test 2.

Figure 196:
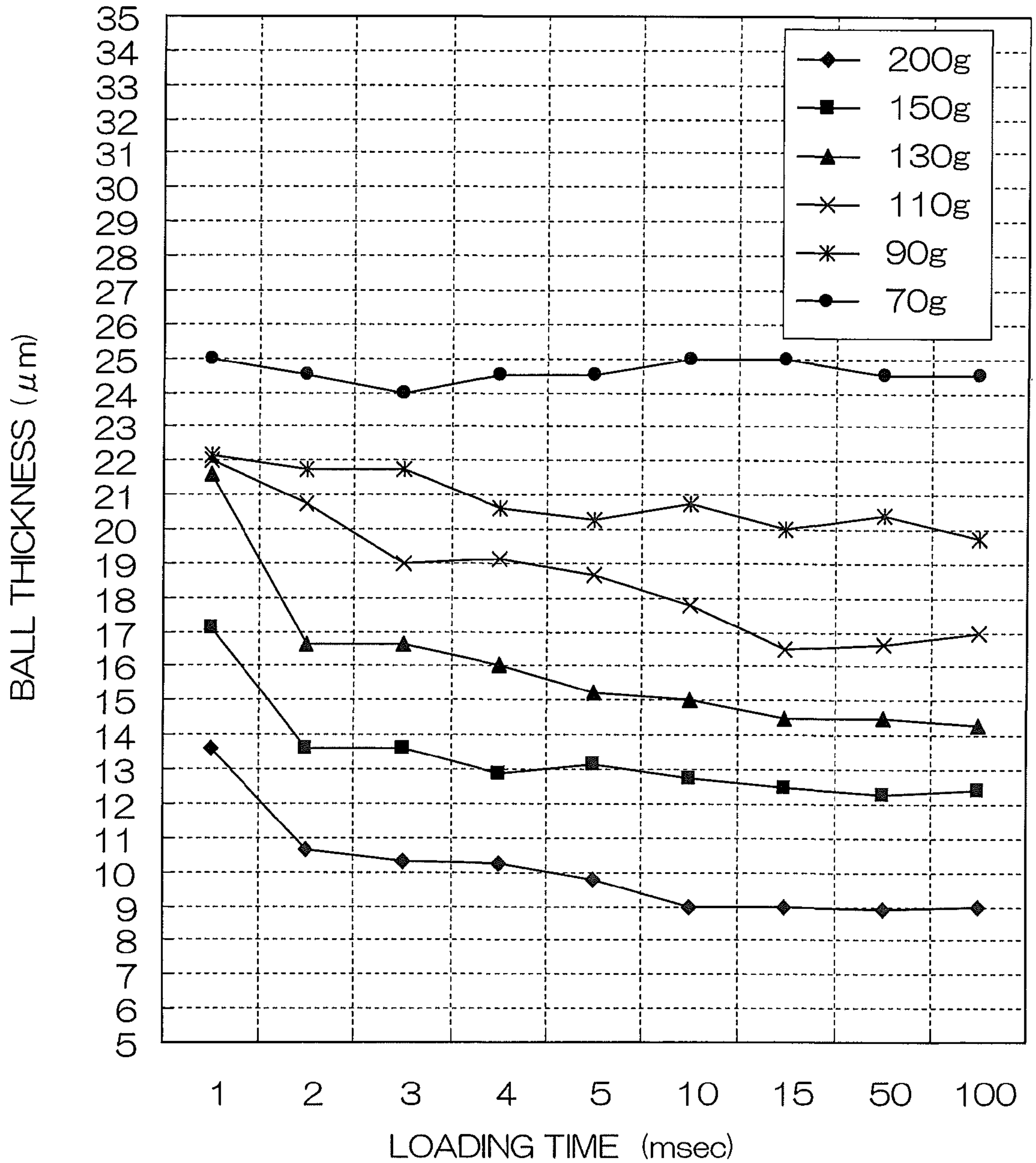

FIG. 196 is a graph of changes with time of thicknesses (ball thicknesses) measured in test 2.

Figure 197:
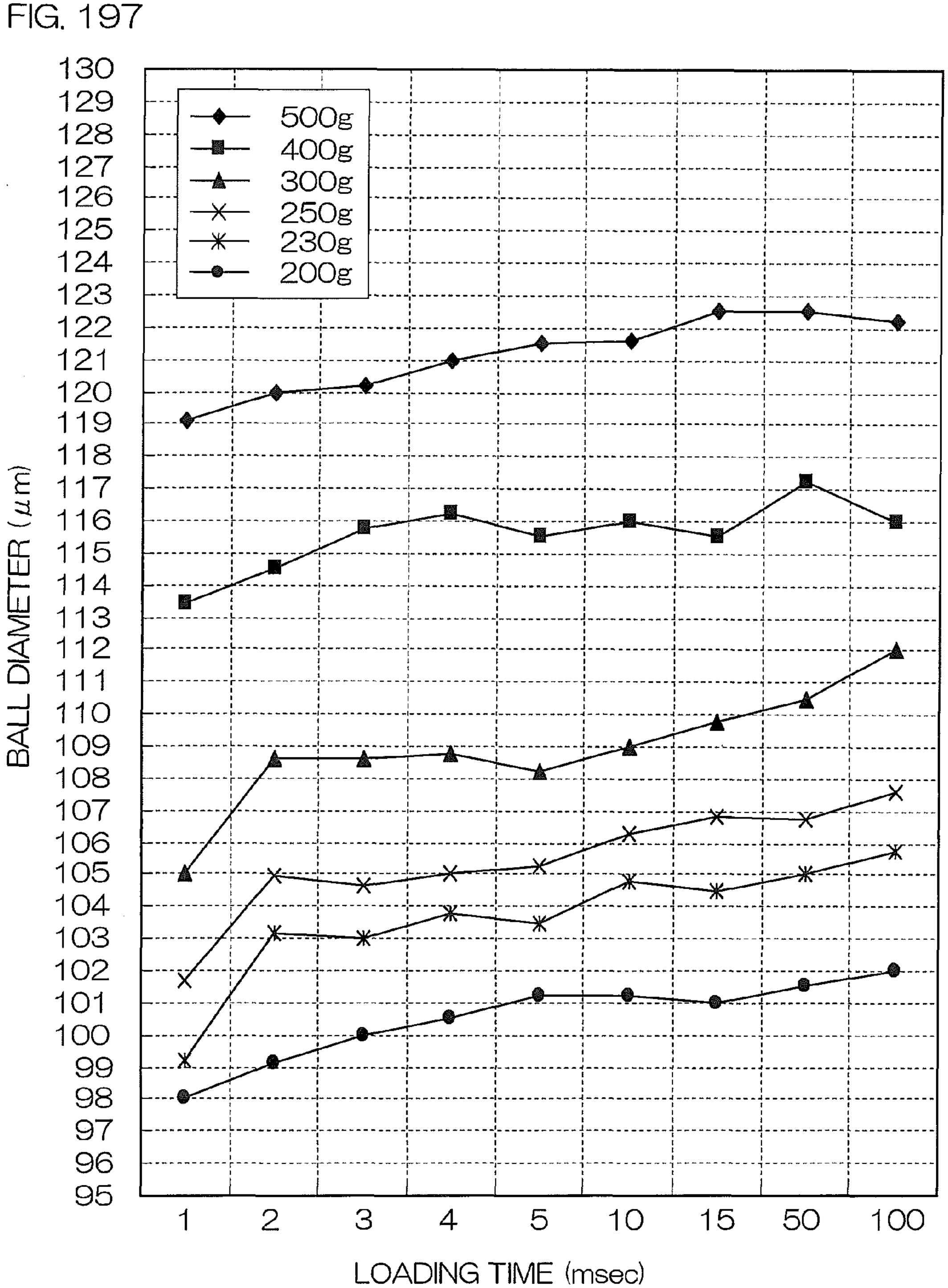

FIG. 197 is a graph of changes with time of diameters (ball diameters) measured in test 3.

Figure 198:
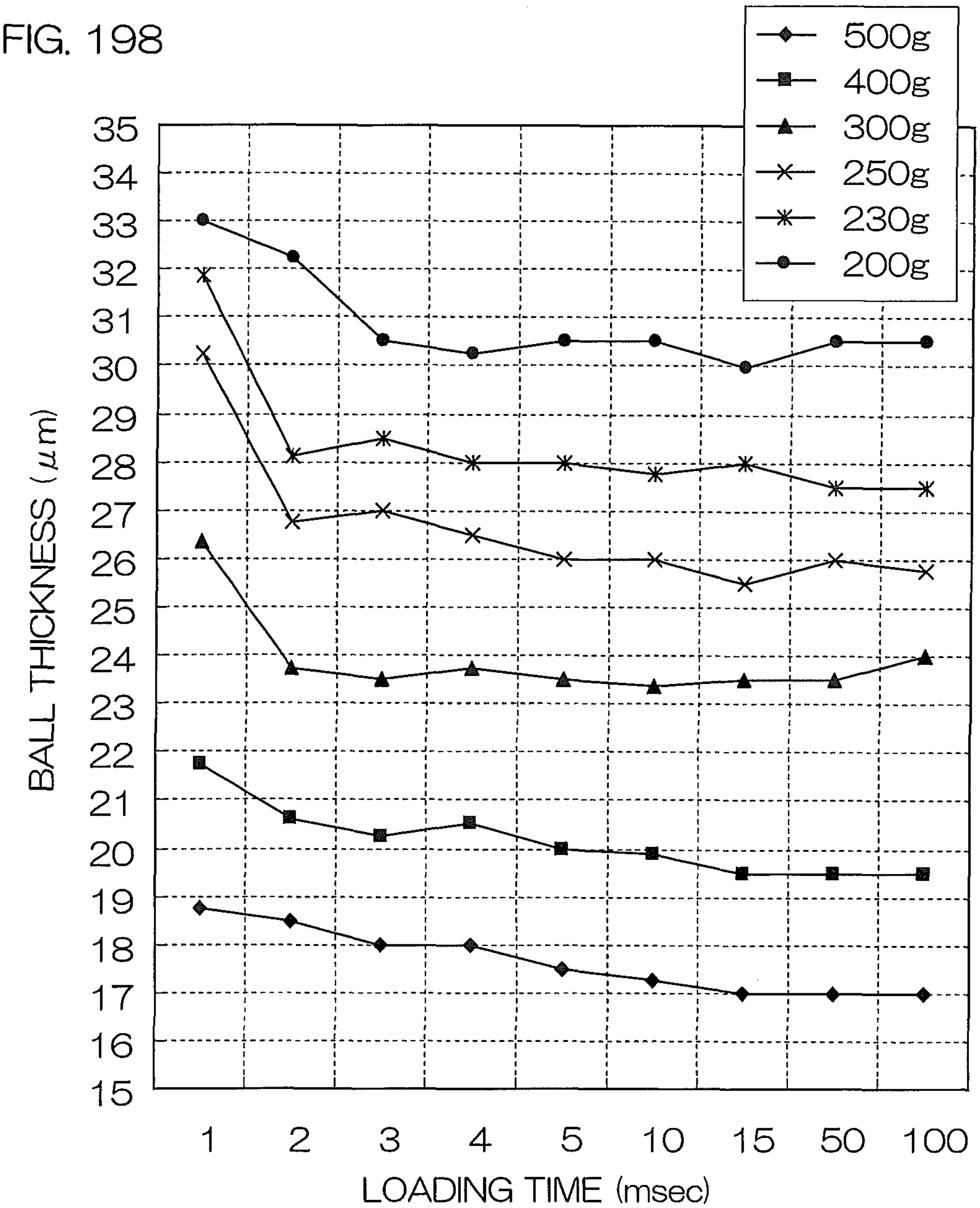

FIG. 198 is a graph of changes with time of thicknesses (ball thicknesses) measured in test 3.

Figure 199:
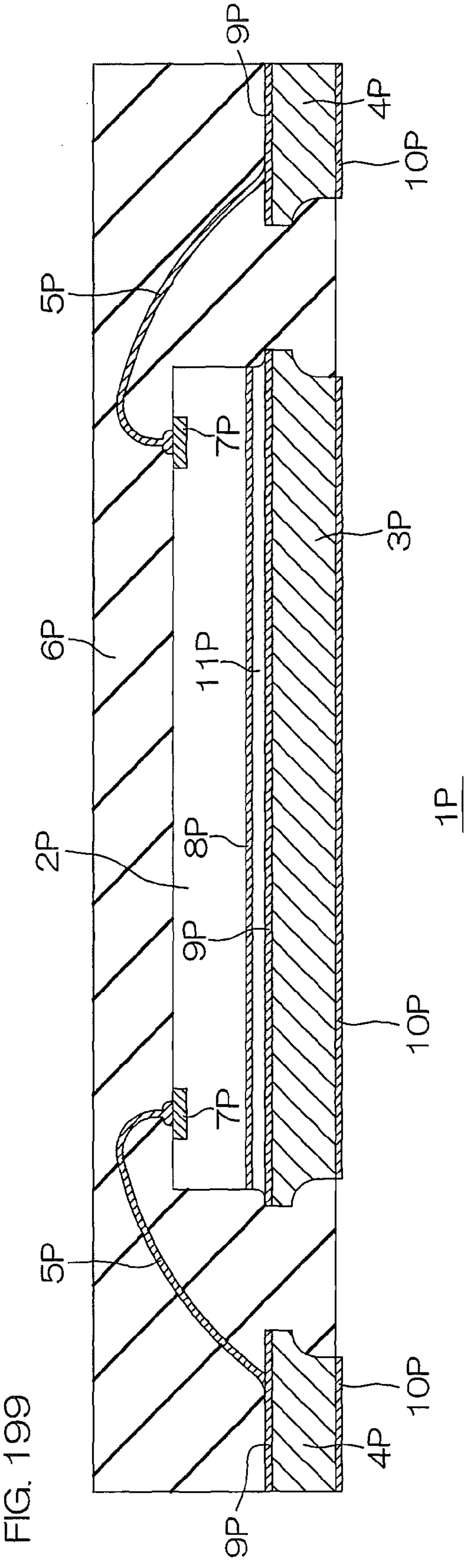

FIG. 199 is a modification example of the semiconductor device of FIG. 188.

Figure 200:
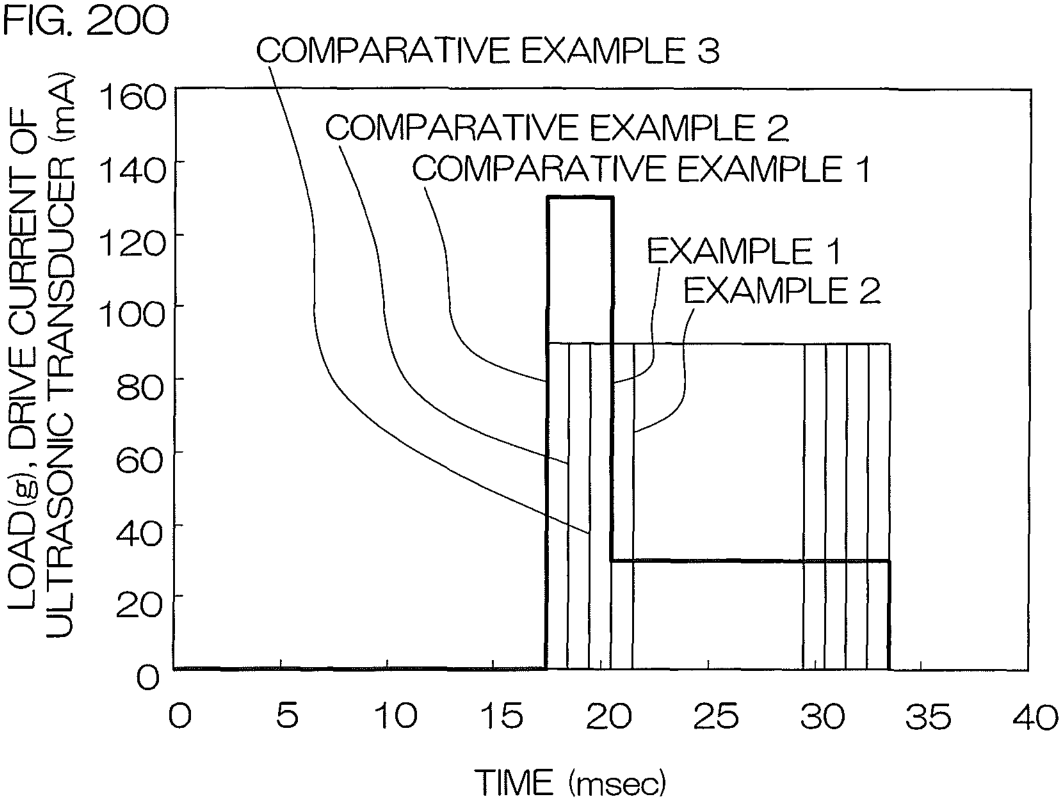

FIG. 200 is a graph of changes with time of a load applied to an FAB and a driving current applied to an ultrasonic transducer during bonding of the FAB to a pad in Examples 1 and 2 and Comparative Examples 1 to 3 of the fifteenth preferred embodiment.

Figure 201:
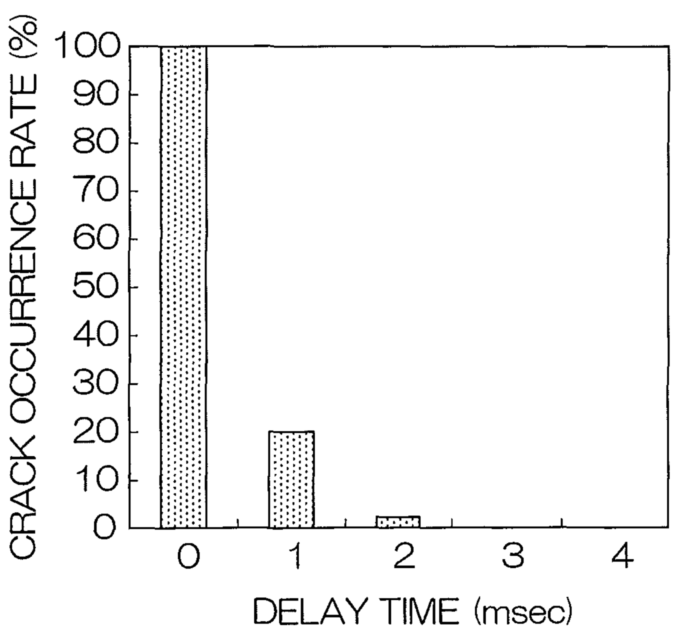

FIG. 201 is a graph of crack occurrence rates in Examples 1 and 2 and Comparative Examples 1 to 3 of the fifteenth preferred embodiment.

Figure 202:
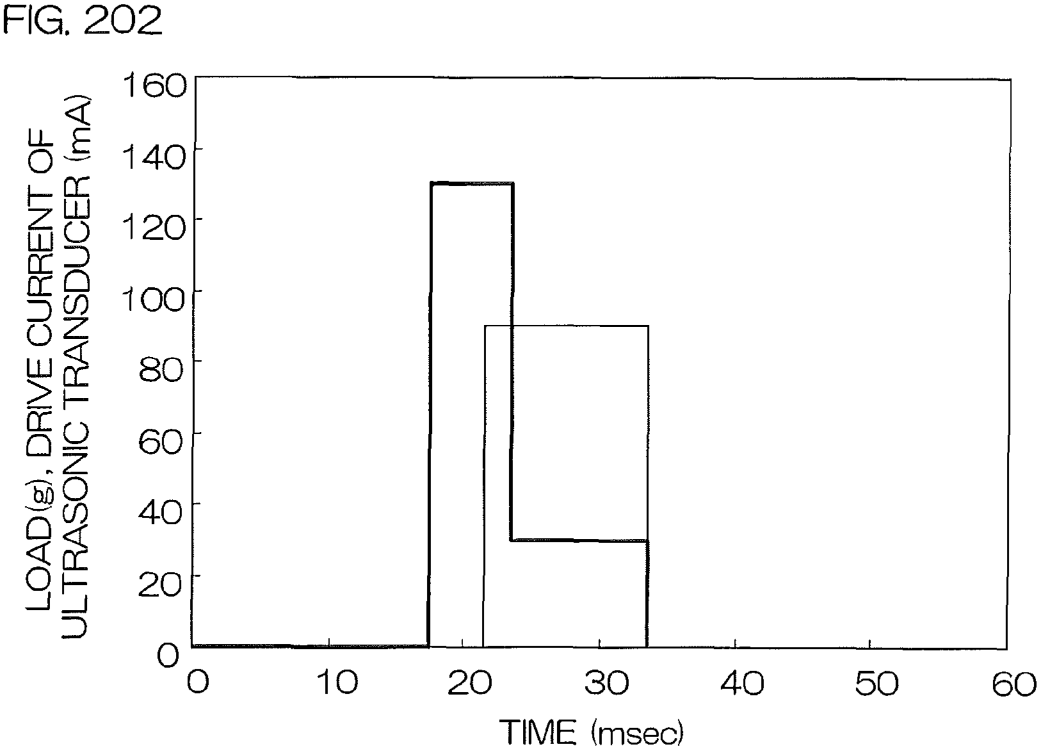

FIG. 202 is a graph of changes with time of a load applied to an FAB and a driving current applied to an ultrasonic transducer during bonding of the FAB to a pad in Example 3 of the fifteenth preferred embodiment.

Figure 203:
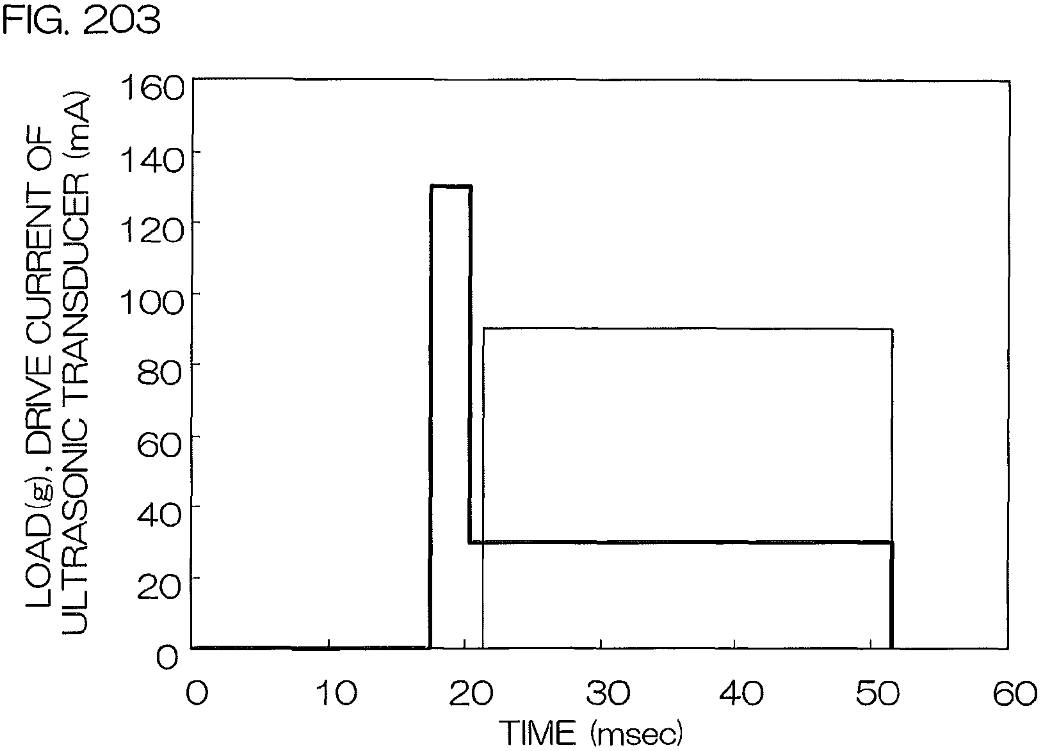

FIG. 203 is a graph of changes with time of a load applied to an FAB and a driving current applied to an ultrasonic transducer during bonding of the FAB to a pad in Example 4 of the fifteenth preferred embodiment.

Figure 204:
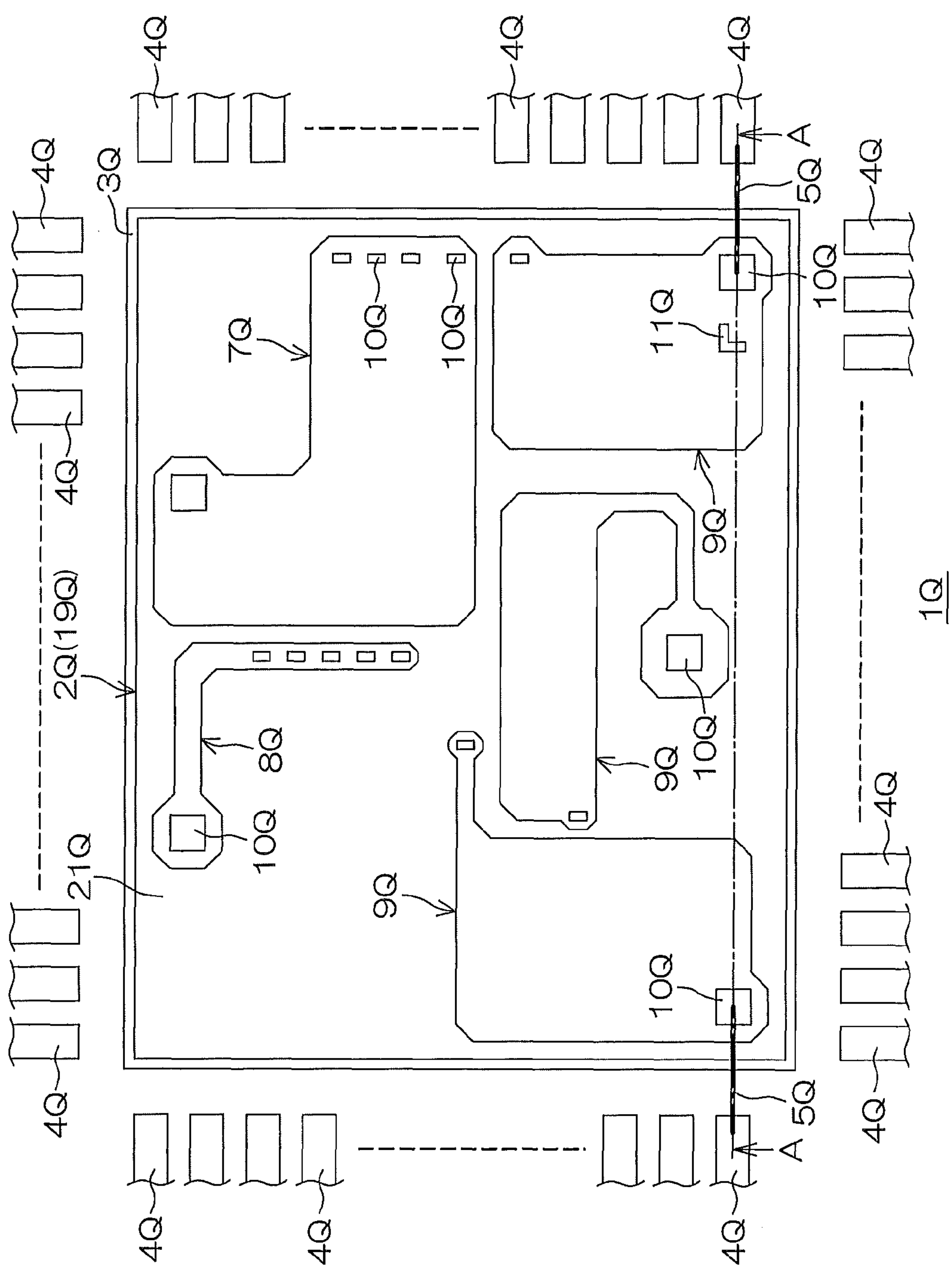

FIG. 204 is an illustrative plan view of a semiconductor device.

Figure 205:
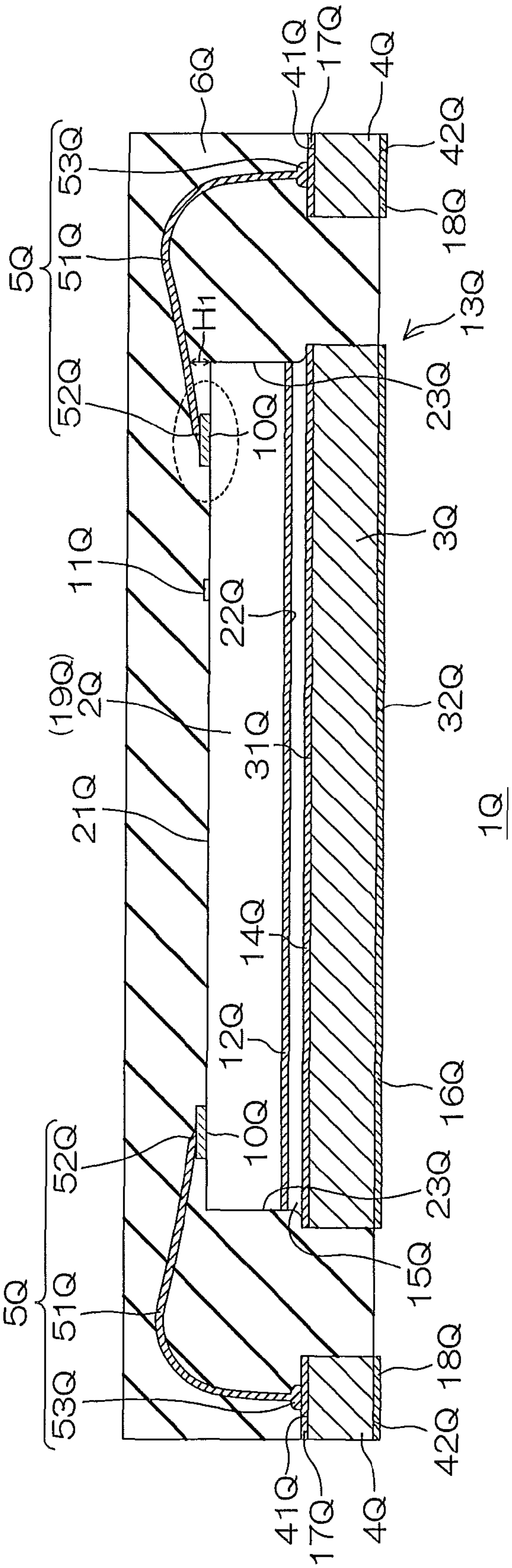

FIG. 205 is a sectional view taken along line A-A of the semiconductor device shown in FIG. 204.

Figure 206:
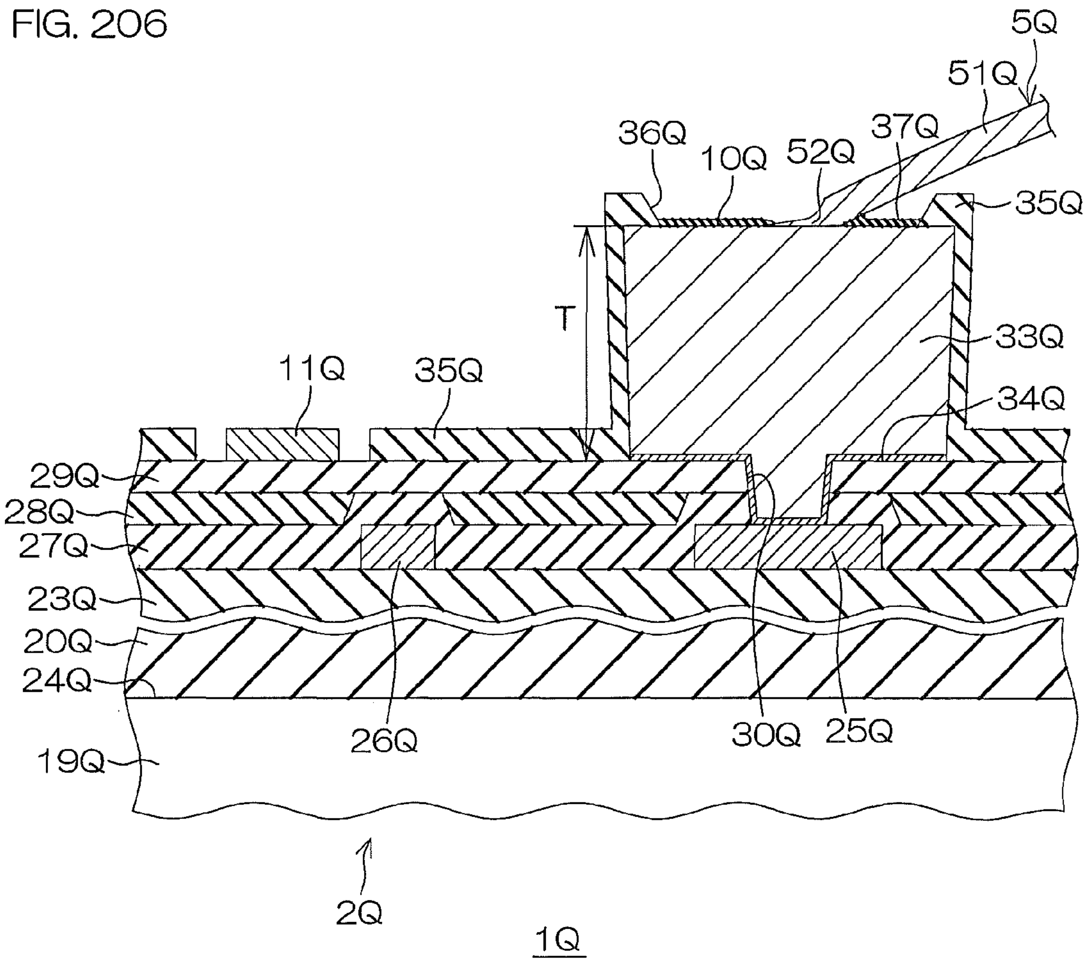

FIG. 206 is an enlarged view of principal portions of a portion surrounded by a broken-line circle in FIG. 205.

Figure 207A:
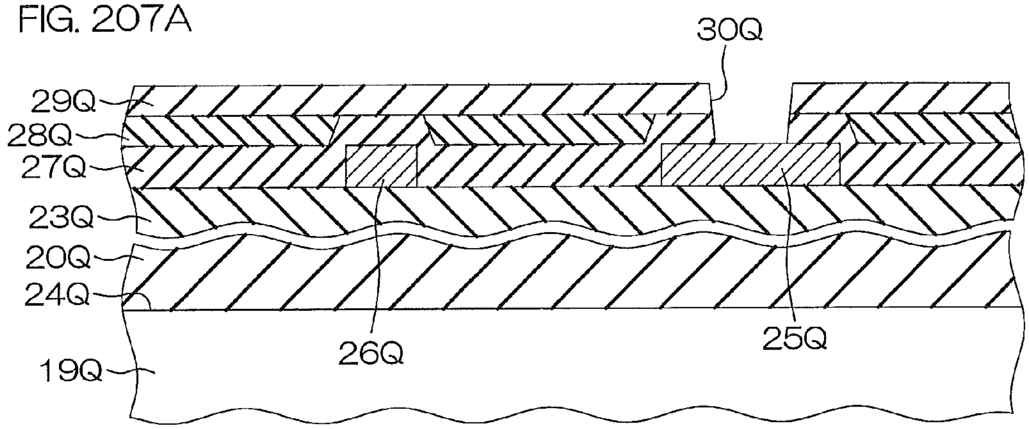

FIG. 207A is a schematic sectional view of a state in a middle of manufacture of the semiconductor device shown in FIG. 205.

Figure 207B:
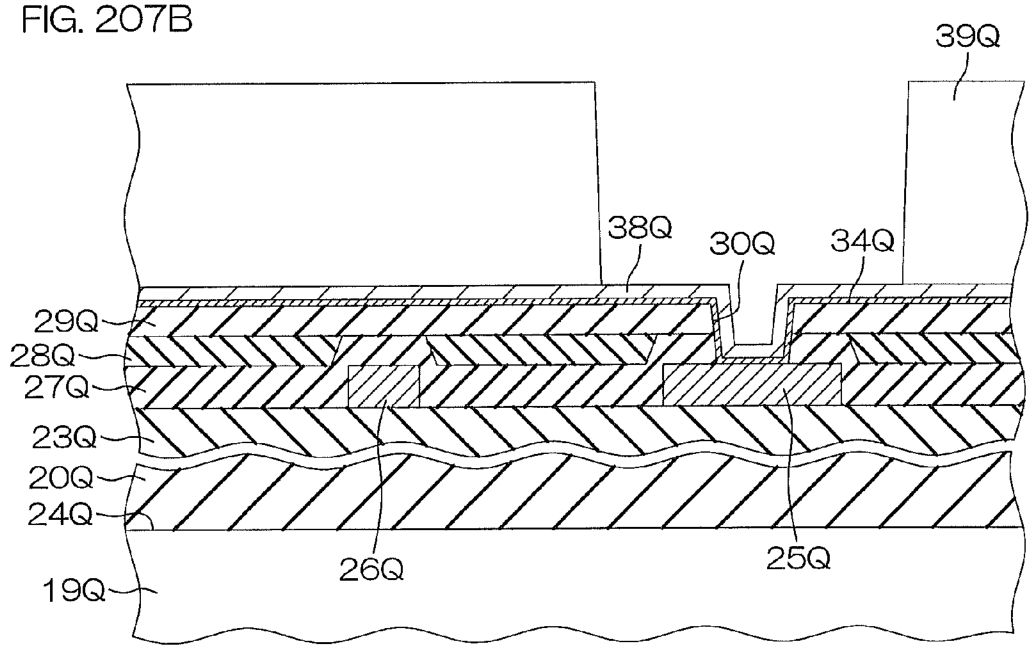

FIG. 207B is a schematic sectional view of a step subsequent to that of FIG. 207A.

Figure 207C:
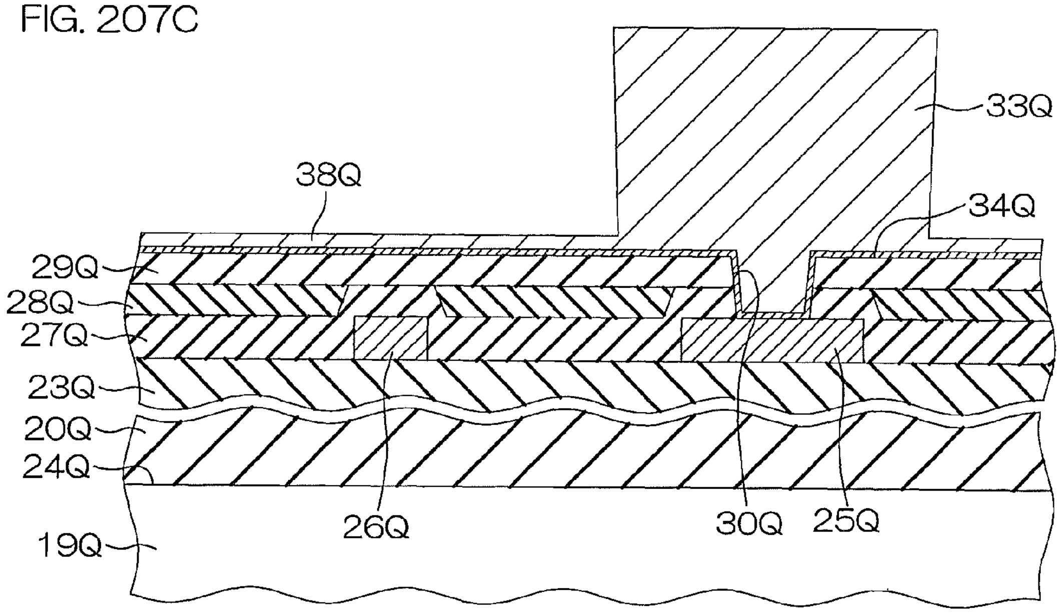

FIG. 207C is a schematic sectional view of a step subsequent to that of FIG. 207B.

Figure 207D:
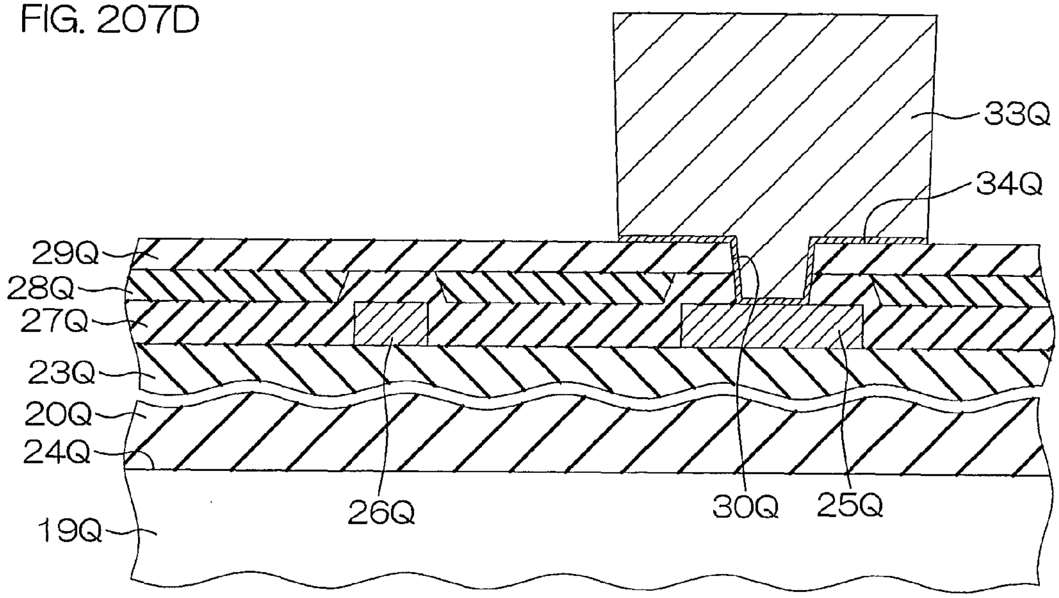

FIG. 207D is a schematic sectional view of a step subsequent to that of FIG. 207C.

Figure 207E:
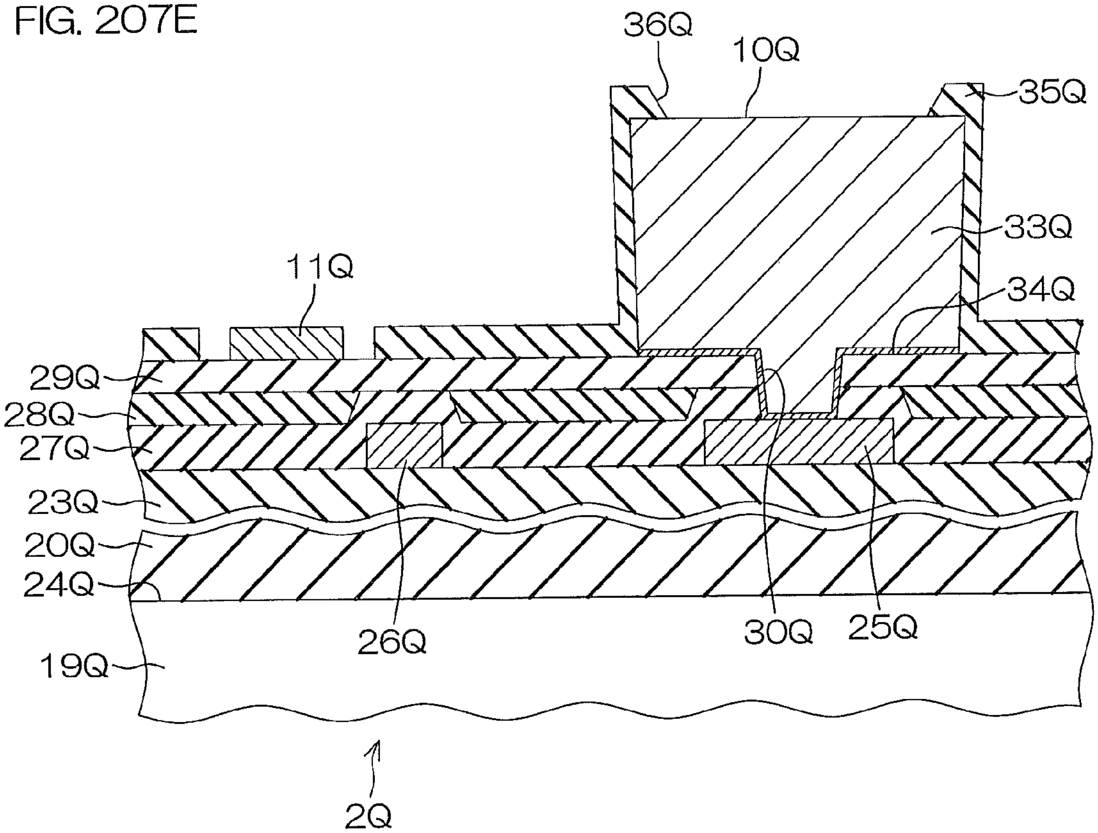

FIG. 207E is a schematic sectional view of a step subsequent to that of FIG. 207D.

Figure 207F:
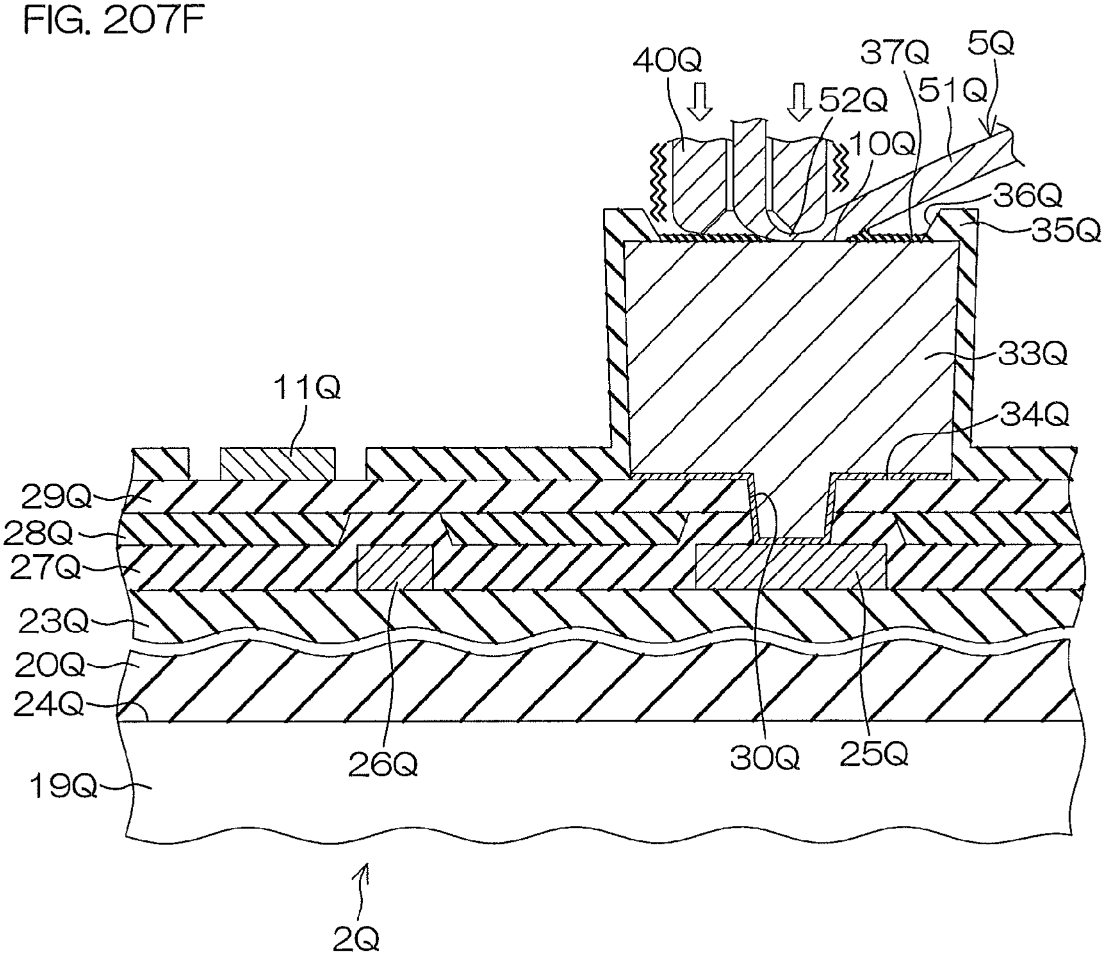

FIG. 207F is a schematic sectional view of a step subsequent to that of FIG. 207E.

Figure 208:
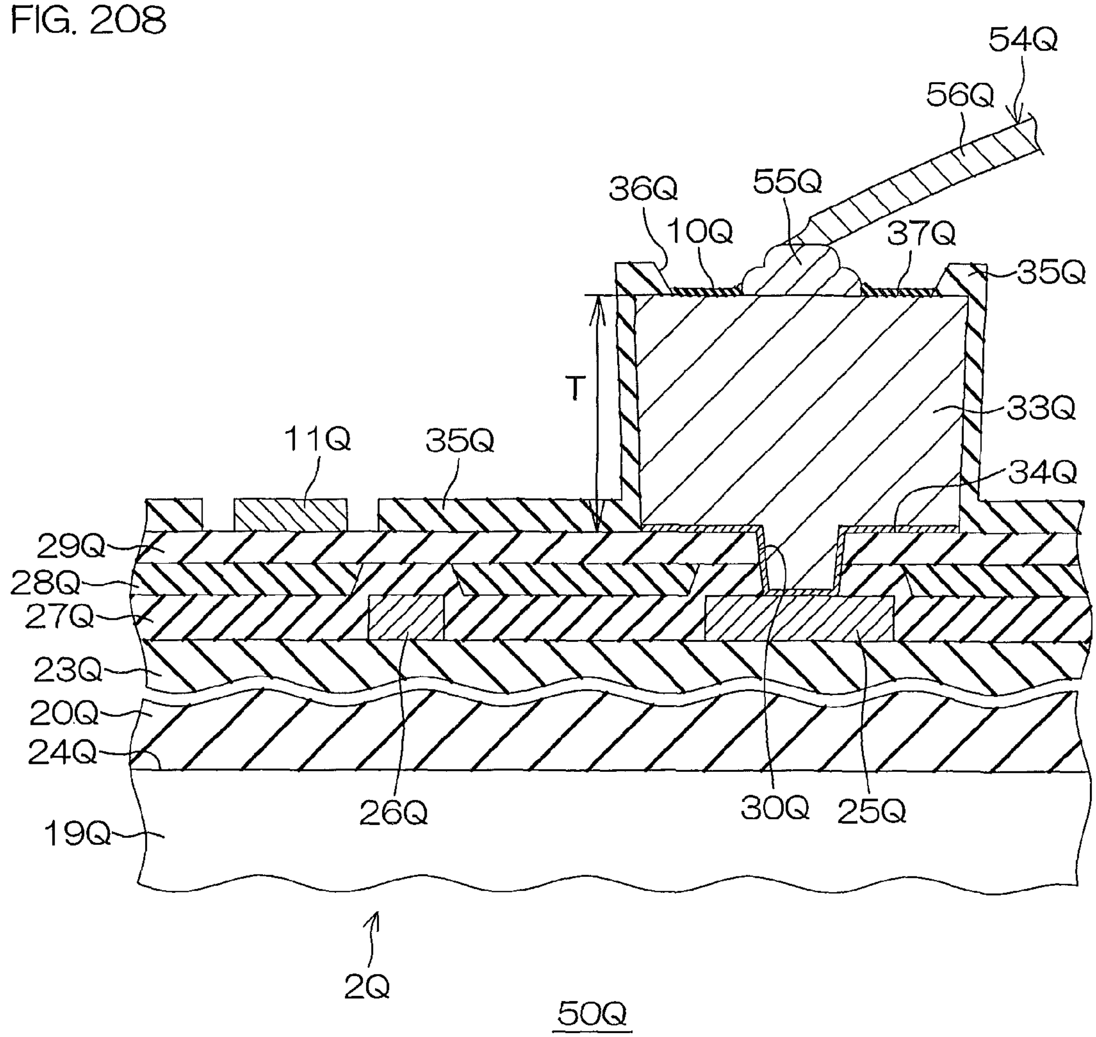

FIG. 208 is a diagram of a modification example of the semiconductor device of FIG. 205.

Figure 209:
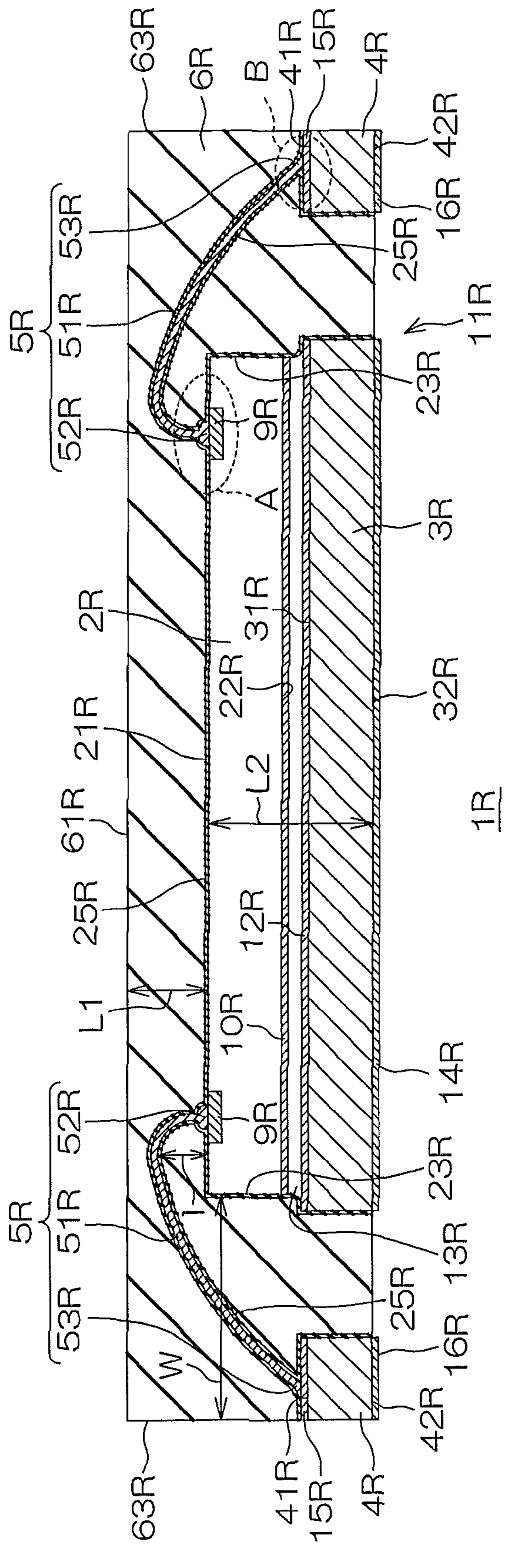

FIG. 209 is a schematic sectional view of a semiconductor device according to a seventeenth preferred embodiment of the present invention.

Figure 210B:
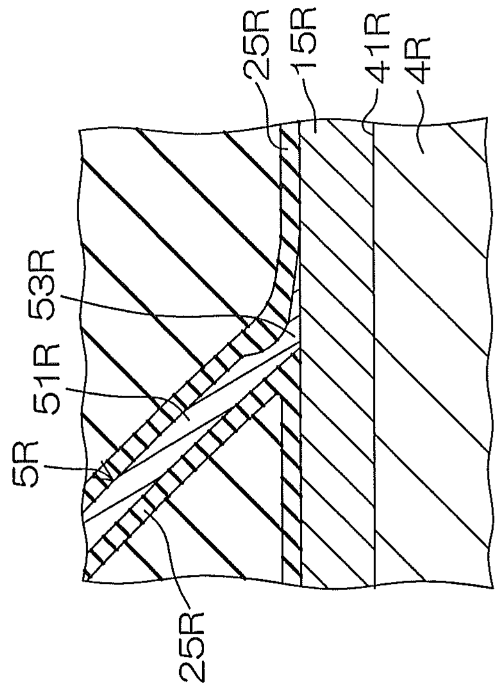
Figure 210A:
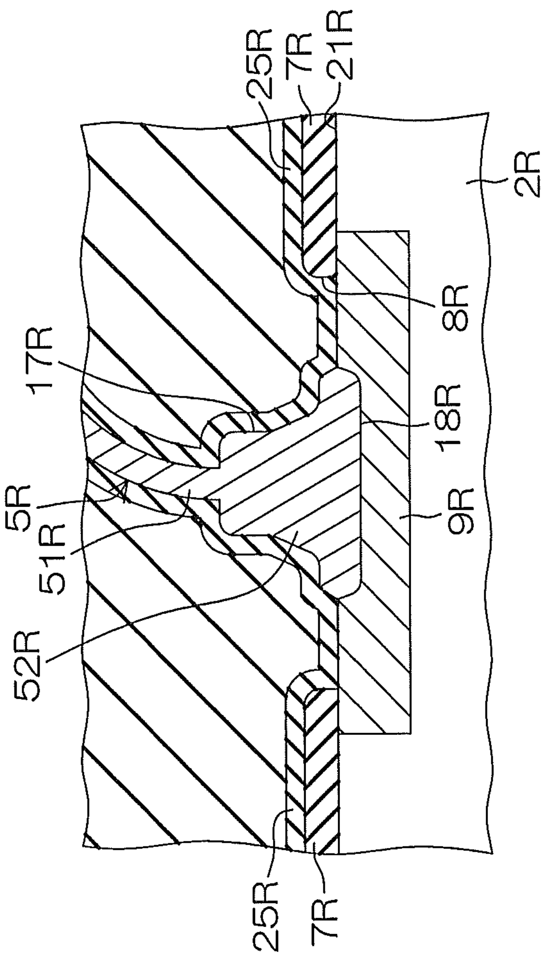

FIG. 210A is an enlarged view of principal portions of a portion surrounded by a broken-line circle A in FIG. 209.

FIG. 210B is an enlarged view of principal portions of a portion surrounded by a broken-line circle B in FIG. 209.

Figure 211:
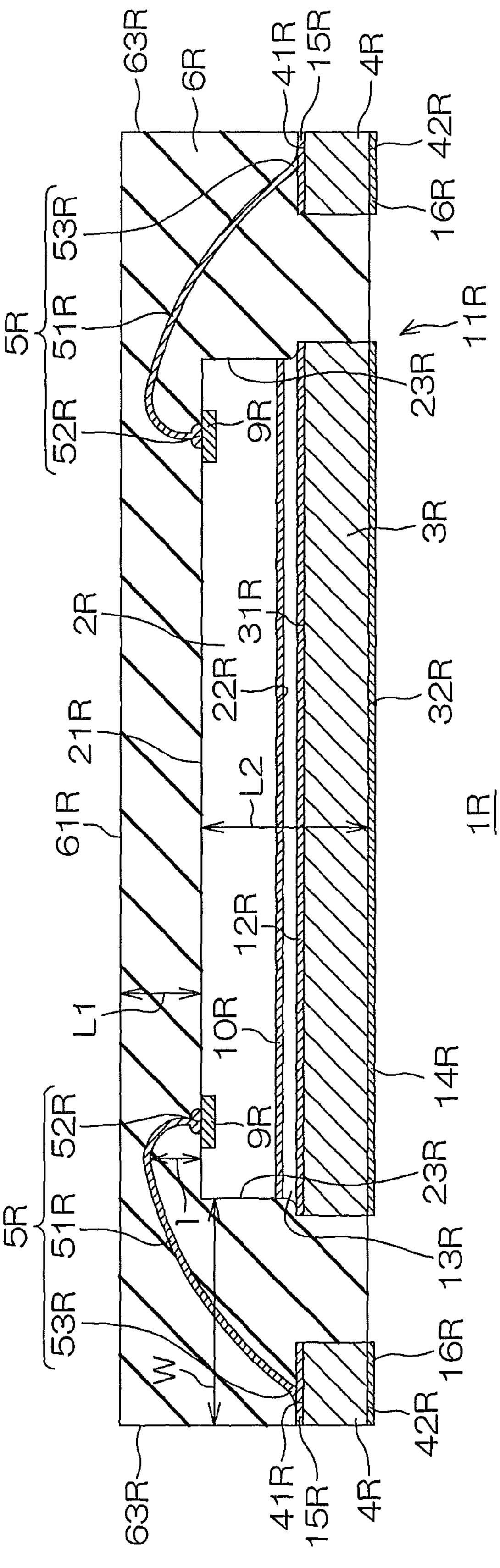

FIG. 211 is a diagram of a modification example of the semiconductor device of FIG. 209.

Figure 212:
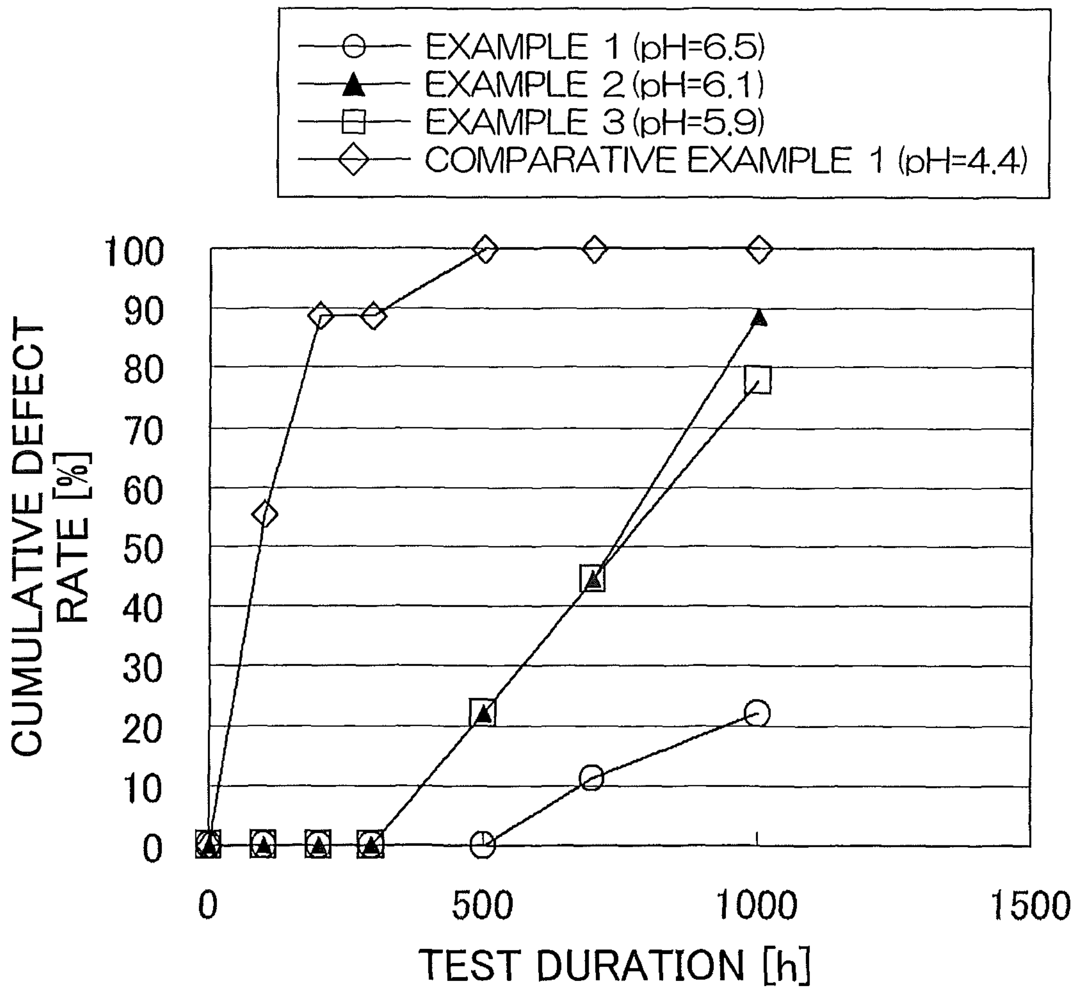

FIG. 212 is a graph of relationships of HAST time and defect rate of an example and a comparative example of the seventeenth preferred embodiment.

Figure 213:
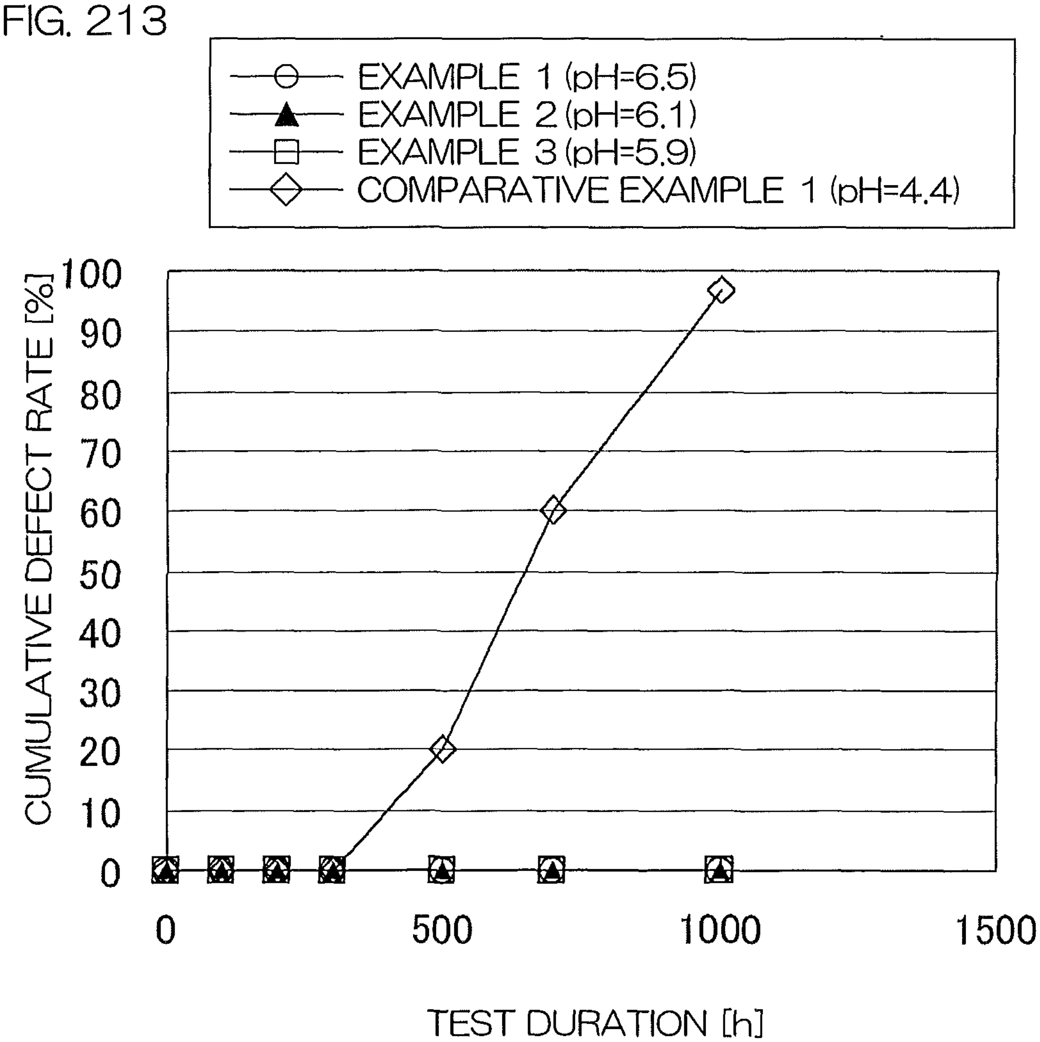

FIG. 213 is a graph of relationships of PCT time and defect rate of the example and the comparative example of the seventeenth preferred embodiment.

Figure 214:
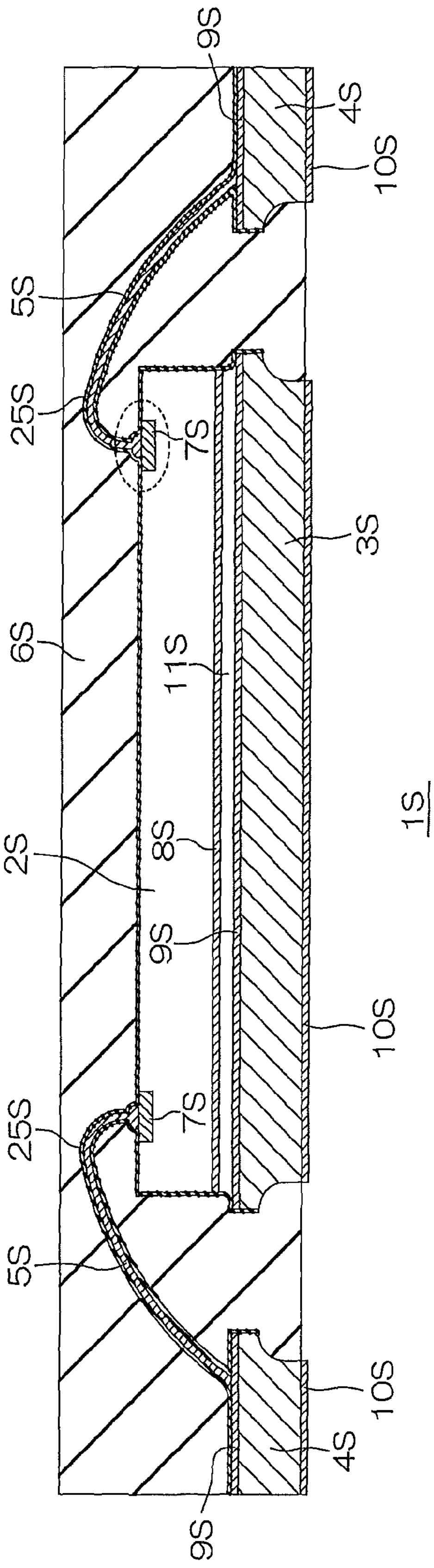

FIG. 214 is a schematic sectional view of a semiconductor device according to an eighteenth preferred embodiment of the present invention.

Figure 215:
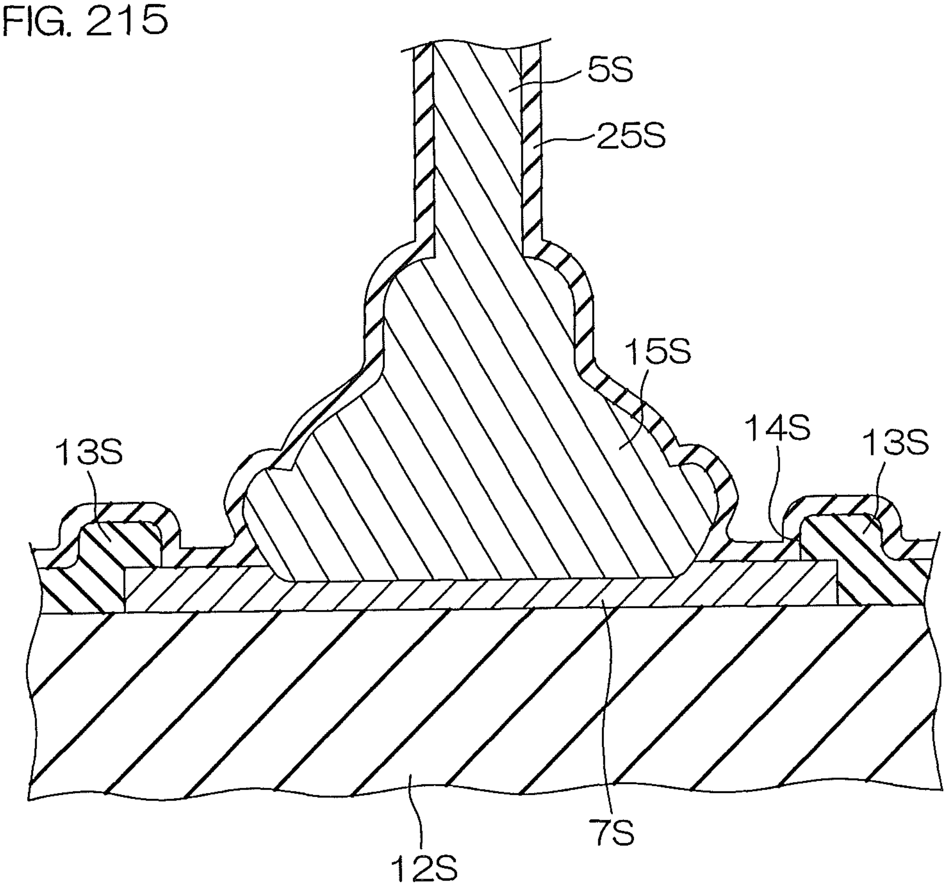

FIG. 215 is a schematic sectional view of a bond portion of a pad with a copper wire (portion surrounded by broken lines shown in FIG. 214).

Figure 216:
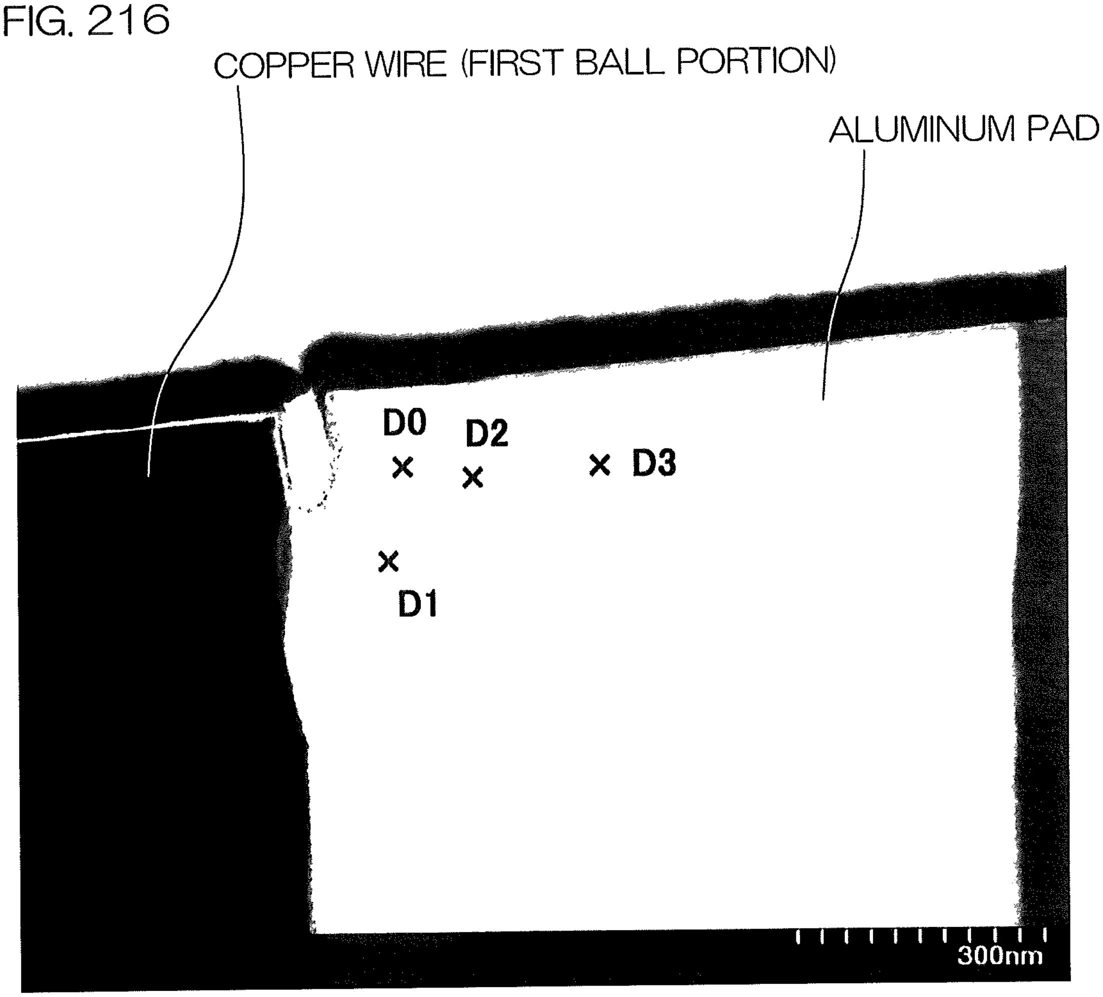

FIG. 216 is a TEM image of a bond portion of a peripheral edge portion of a first ball portion with an aluminum pad (vicinity of a bond interface) in a sample in which a resin package is made of a material without an ion capturing component added.

Figure 217:
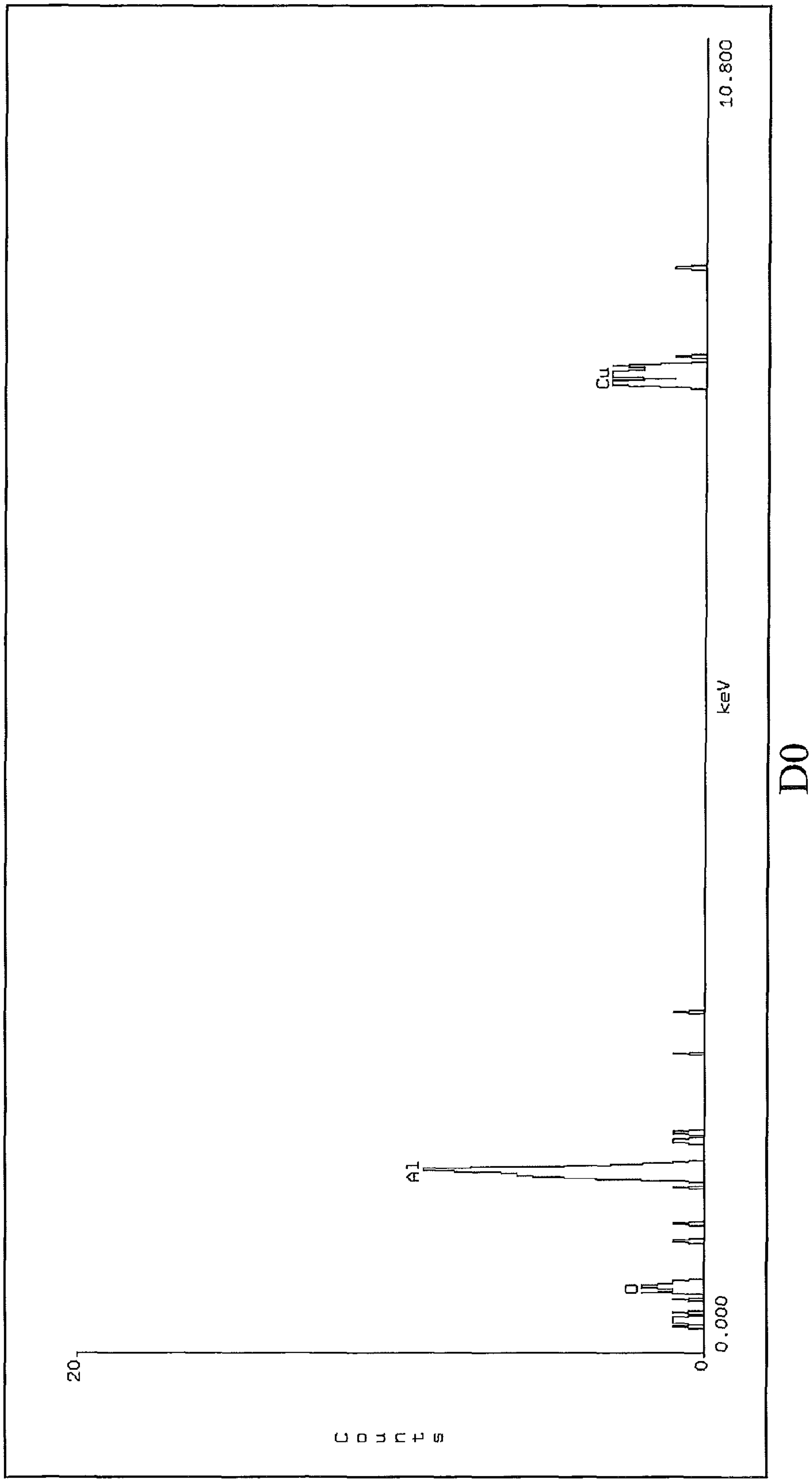

FIG. 217 is a diagram of analysis results of component elements at a location D0 shown in the TEM image of FIG. 216.

Figure 218:
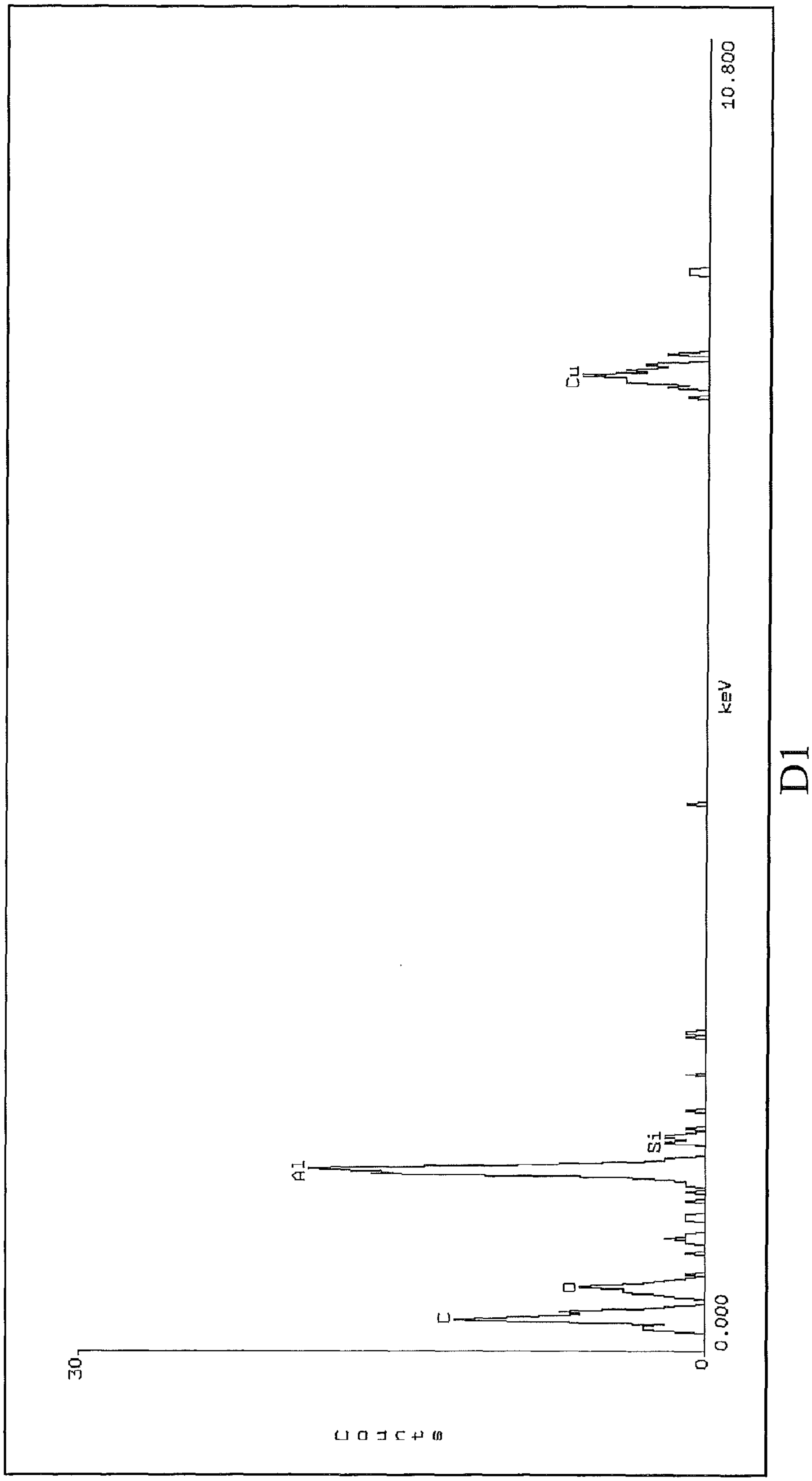

FIG. 218 is a diagram of analysis results of component elements at a location D1 shown in the TEM image of FIG. 216.

Figure 219:
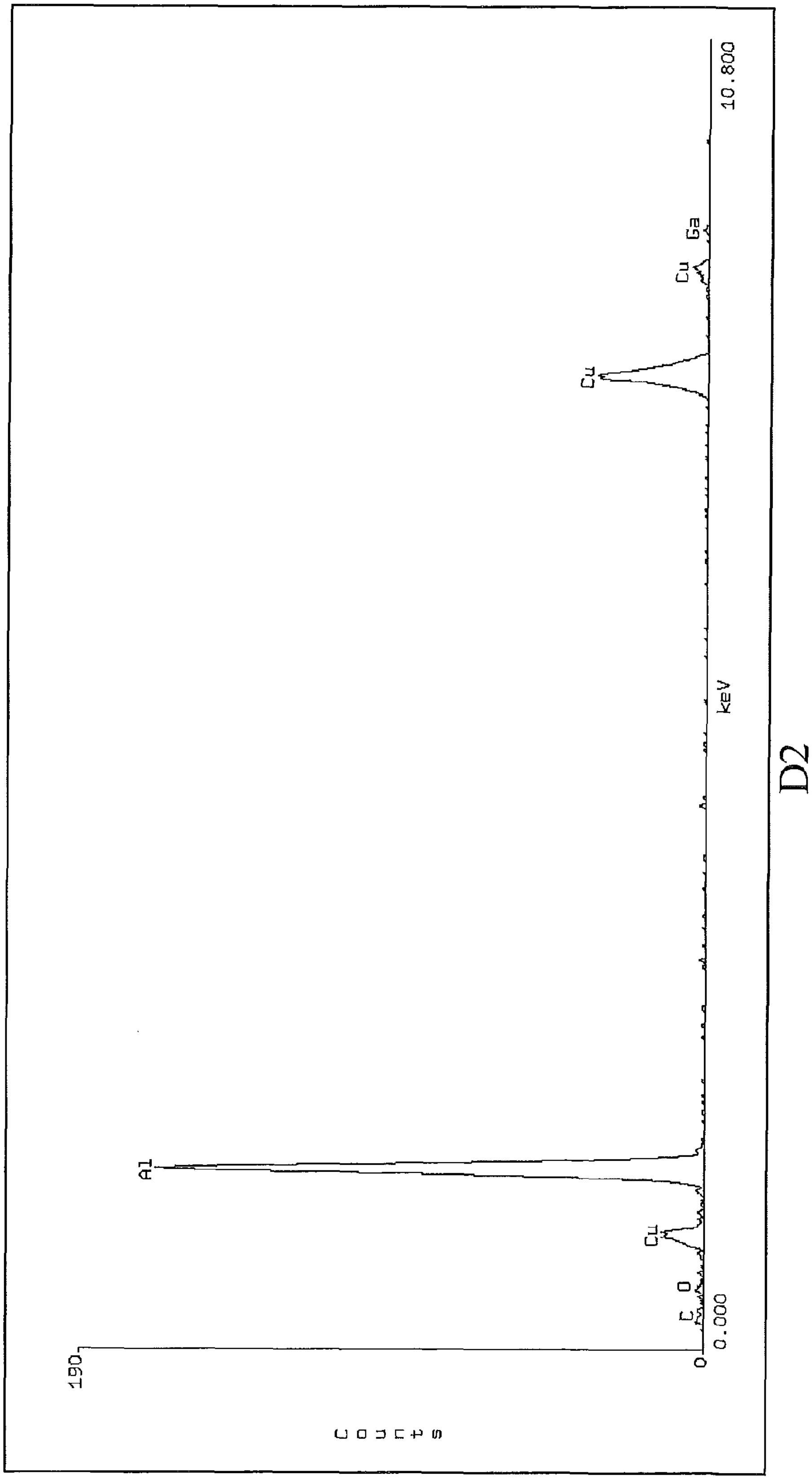

FIG. 219 is a diagram of analysis results of component elements at a location D2 shown in the TEM image of FIG. 216.

Figure 220:
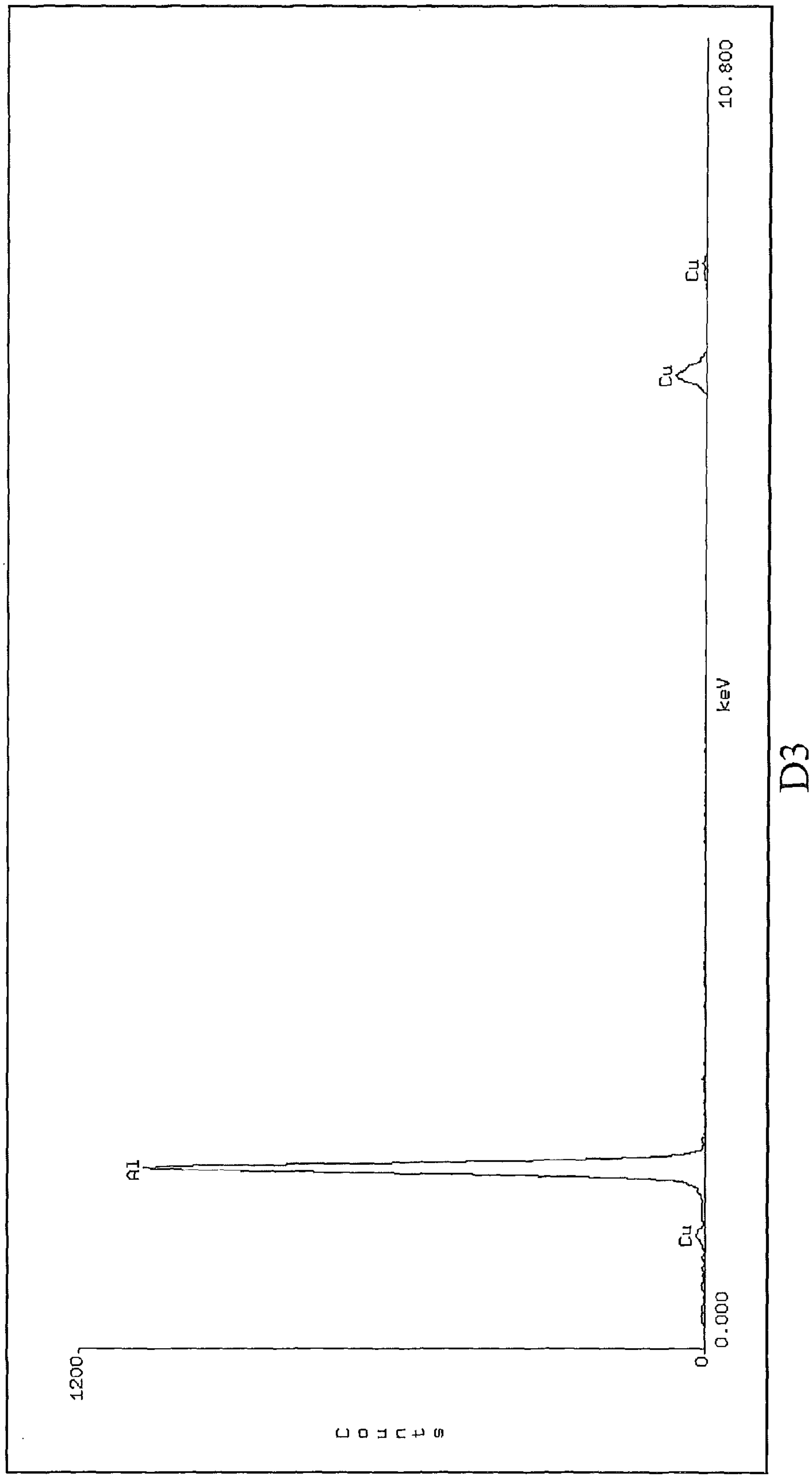

FIG. 220 is a diagram of analysis results of component elements at a location D3 shown in the TEM image of FIG. 216.

Figure 221:
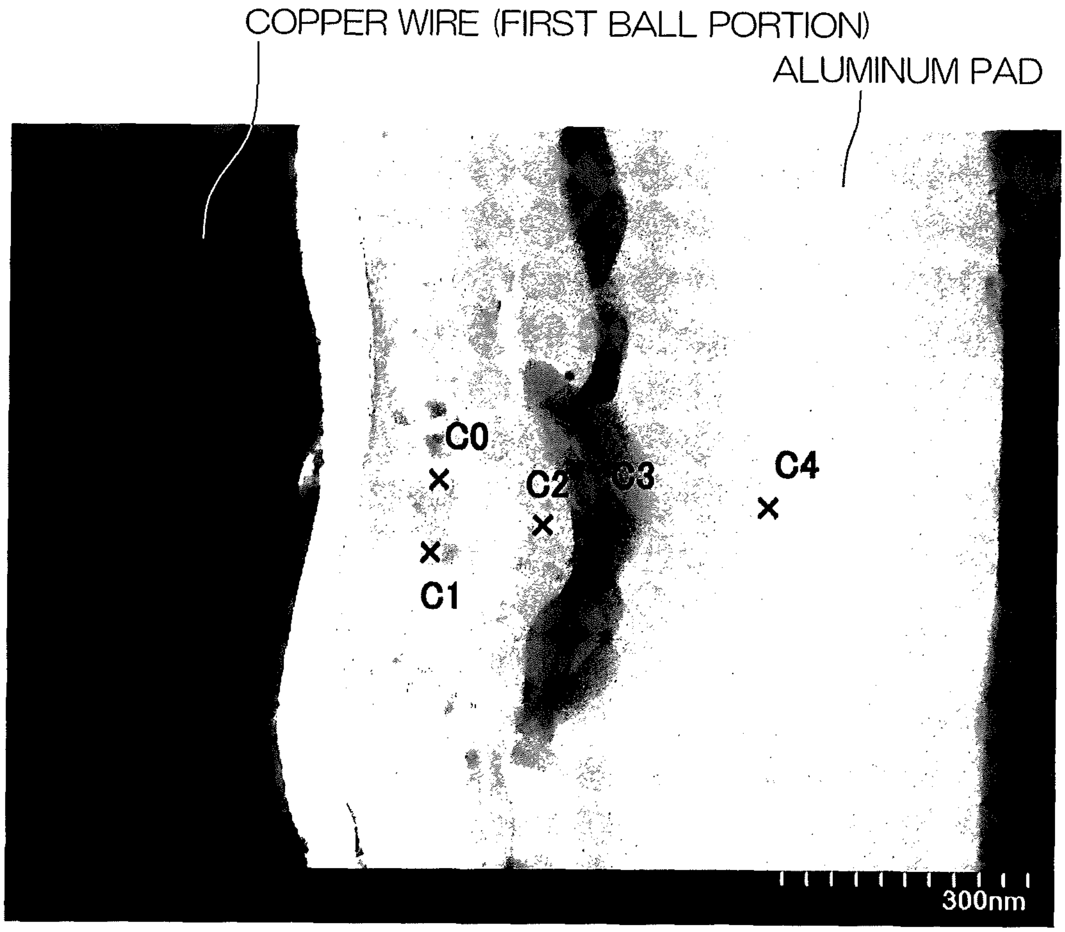

FIG. 221 is a TEM image of a bond portion of a central portion of a first ball portion with an aluminum pad (vicinity of a bond interface) in a sample in which the resin package is made of the material without an ion capturing component added.

Figure 222:
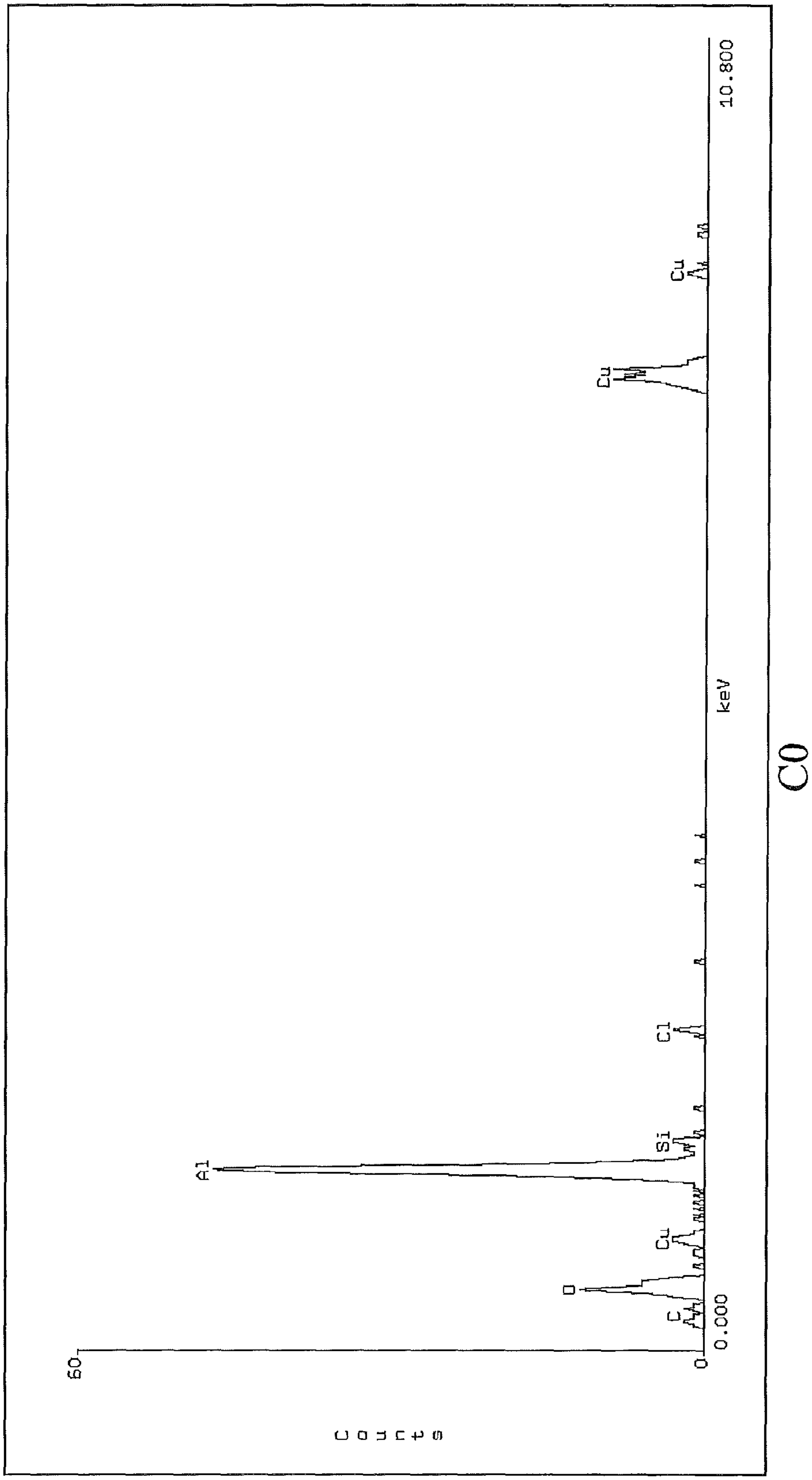

FIG. 222 is a diagram of analysis results of component elements at a location C0 shown in the TEM image of FIG. 221.

Figure 223:
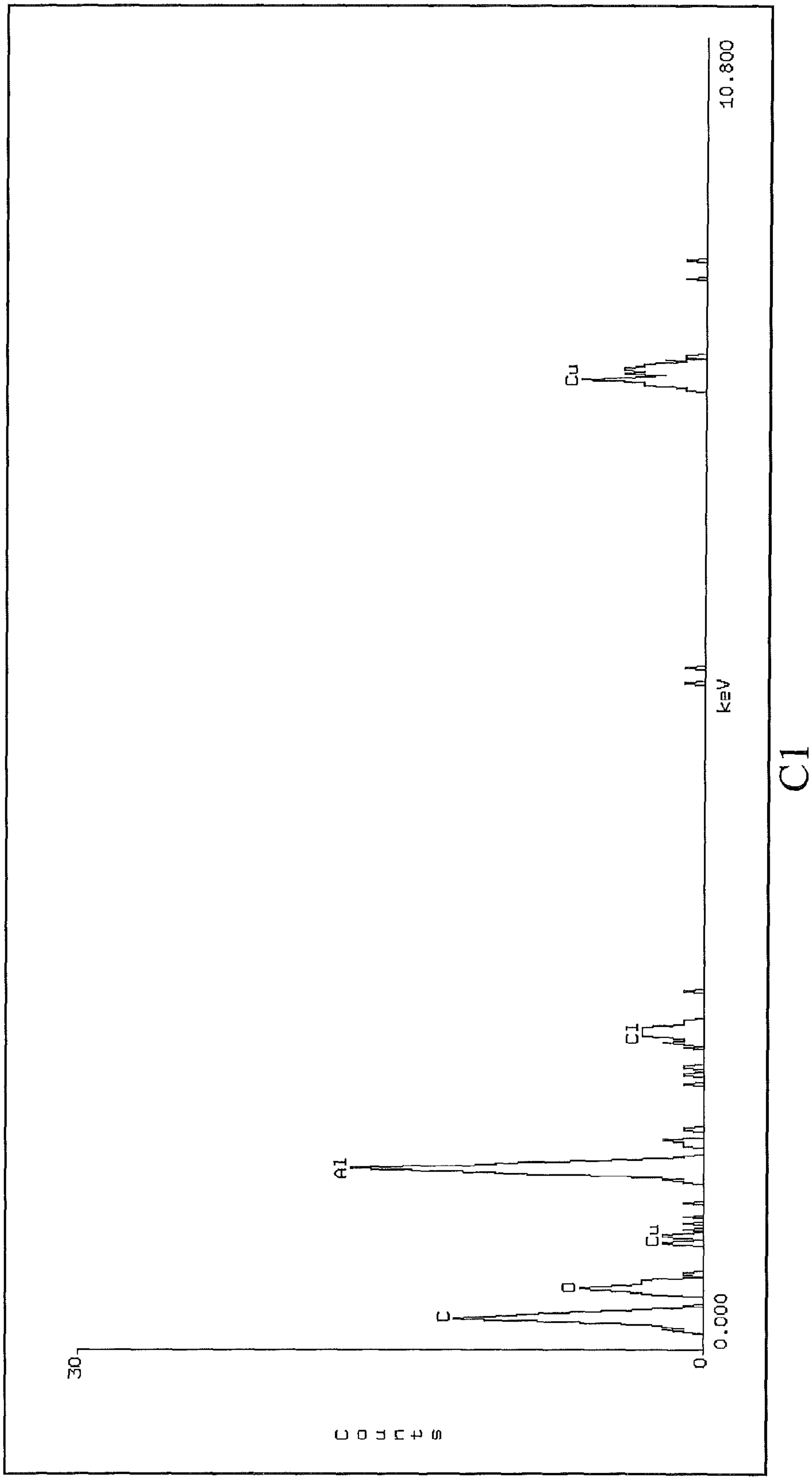

FIG. 223 is a diagram of analysis results of component elements at a location C1 shown in the TEM image of FIG. 221.

Figure 224:
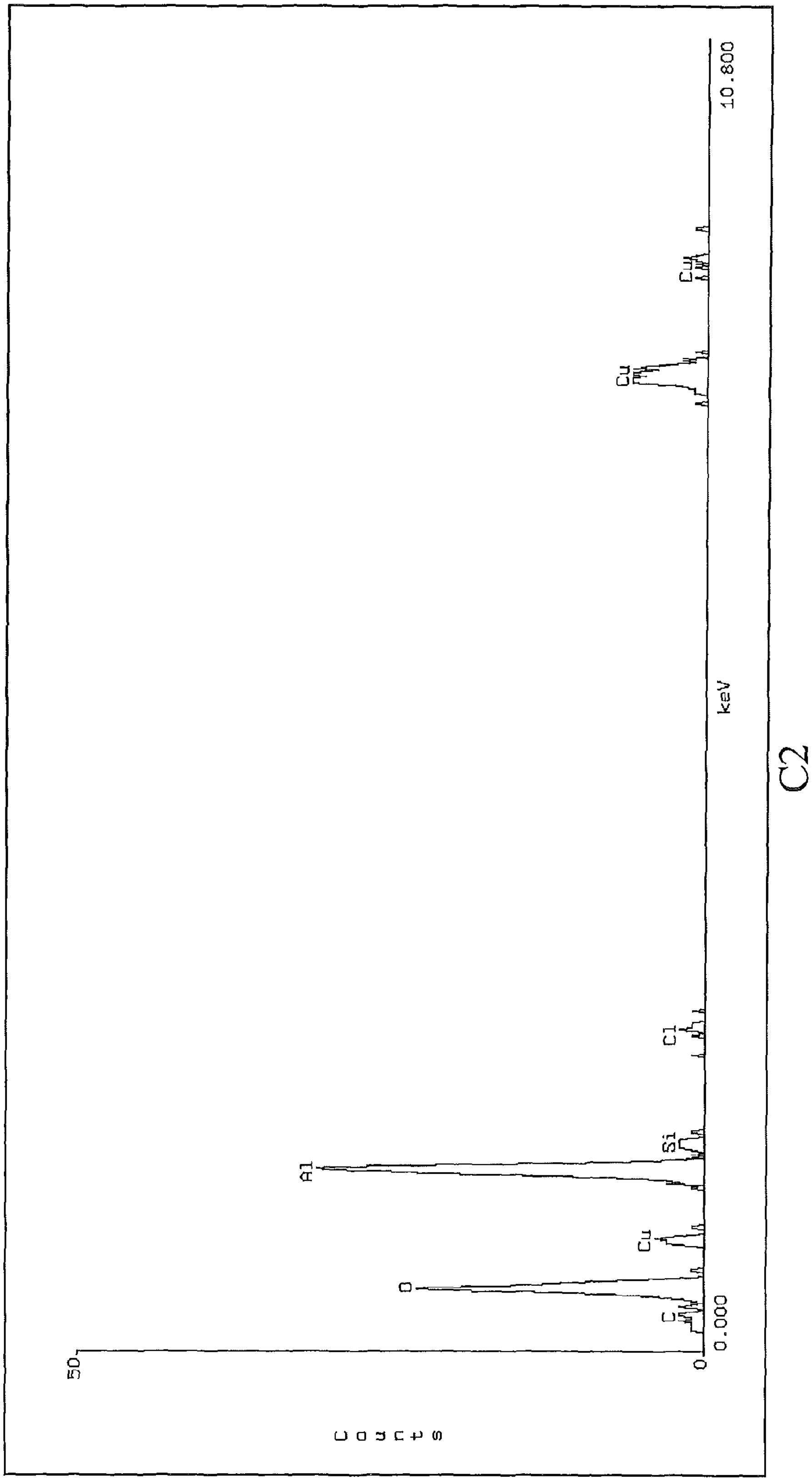

FIG. 224 is a diagram of analysis results of component elements at a location C2 shown in the TEM image of FIG. 221.

Figure 225:
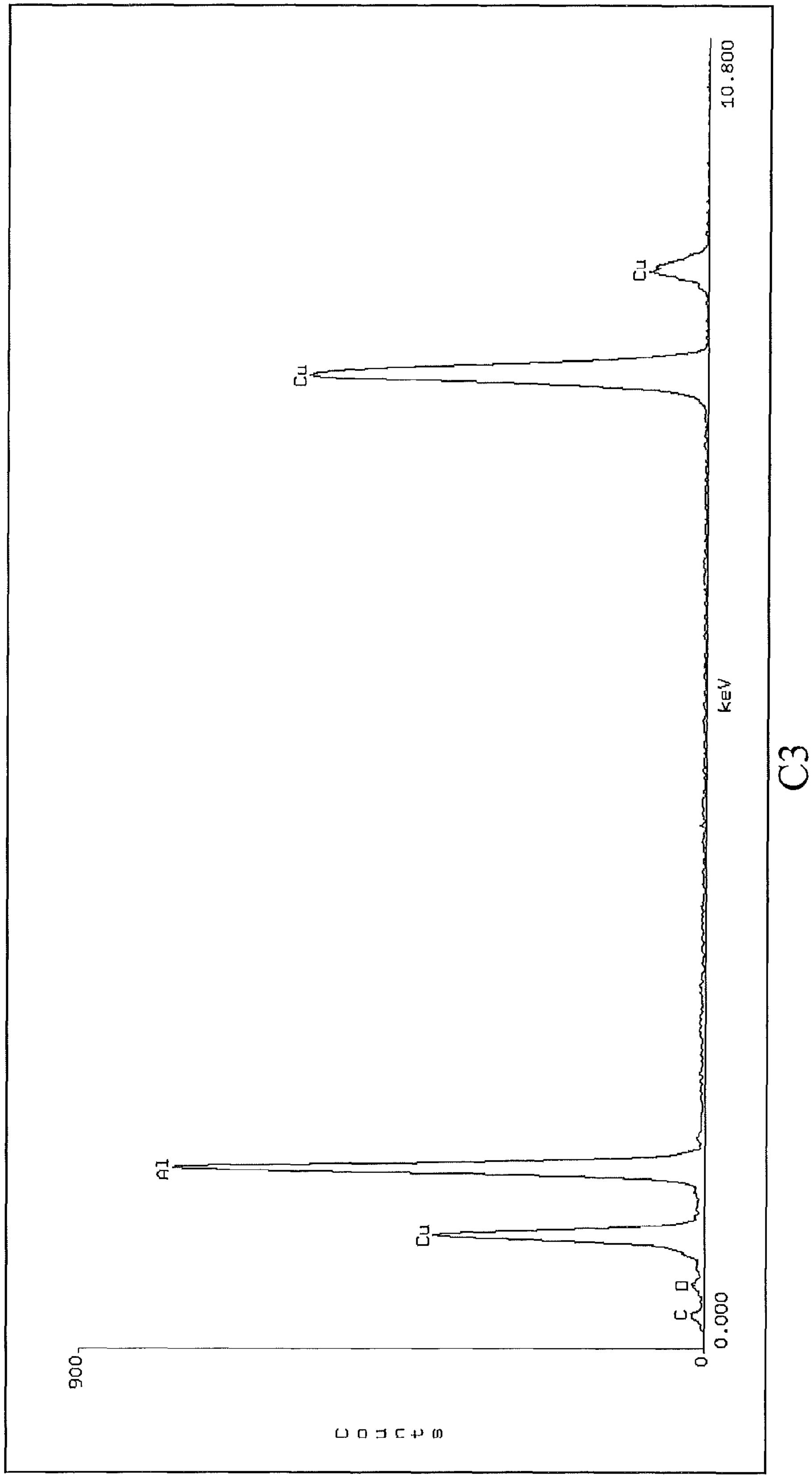

FIG. 225 is a diagram of analysis results of component elements at a location C3 shown in the TEM image of FIG. 221.

Figure 226:
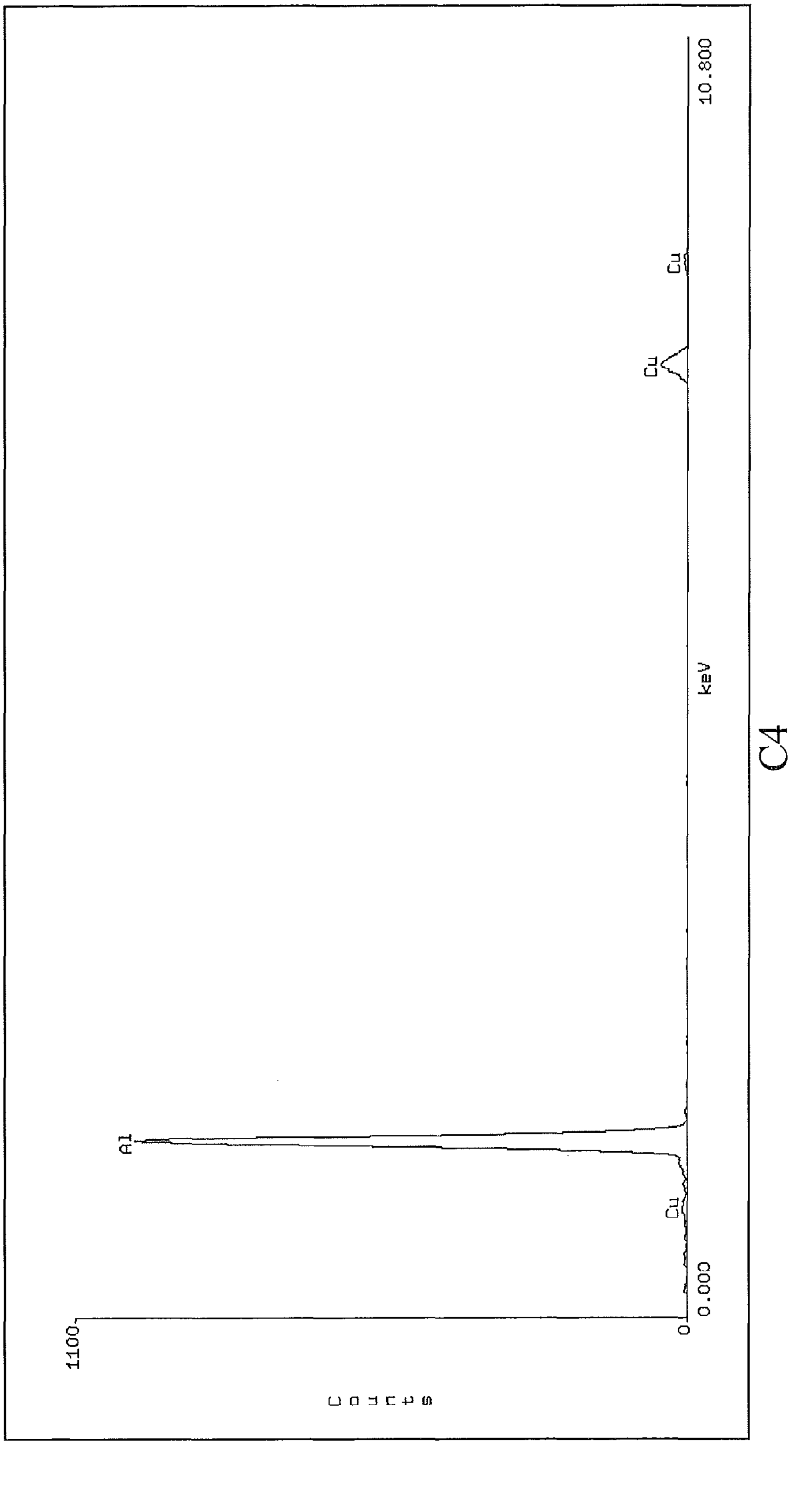

FIG. 226 is a diagram of analysis results of component elements at a location C4 shown in the TEM image of FIG. 221.

Figure 227A:
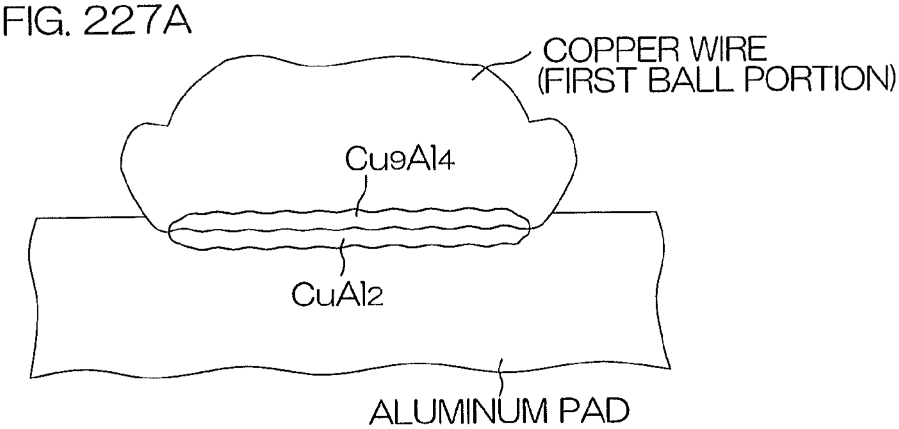

FIG. 227A is an illustrative sectional view (part 1) of a bond portion of a copper wire with an aluminum pad in a sample in which the resin package is made of the material without an ion capturing component added.

Figure 227B:
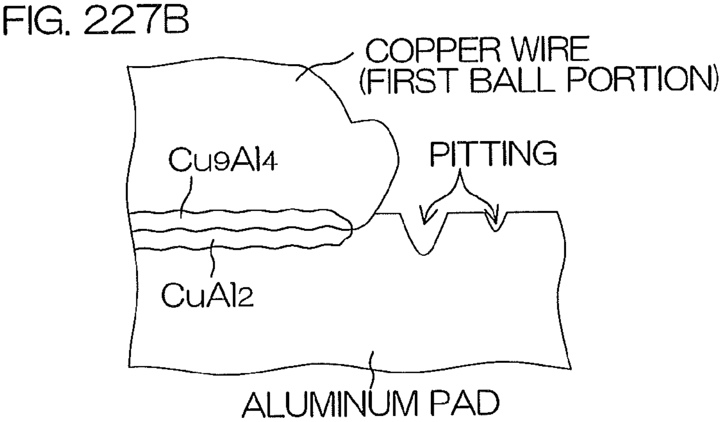

FIG. 227B is an illustrative sectional view (part 2) of the bond portion of the copper wire with the aluminum pad in the sample in which the resin package is made of the material without an ion capturing component added.

Figure 227C:
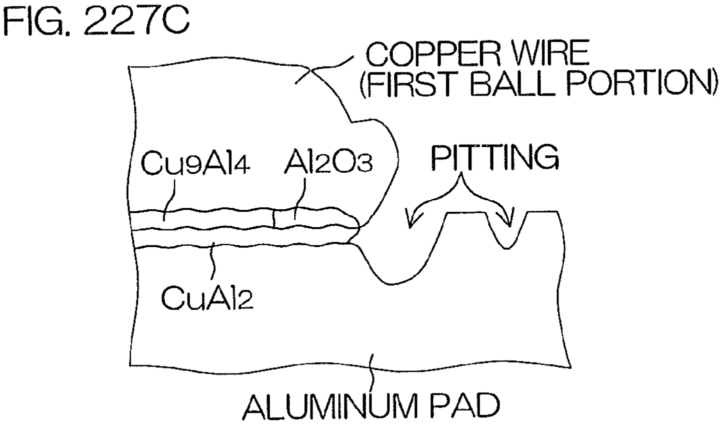

FIG. 227C is an illustrative sectional view (part 3) of the bond portion of the copper wire with the aluminum pad in the sample in which the resin package is made of the material without an ion capturing component added.

Figure 228:
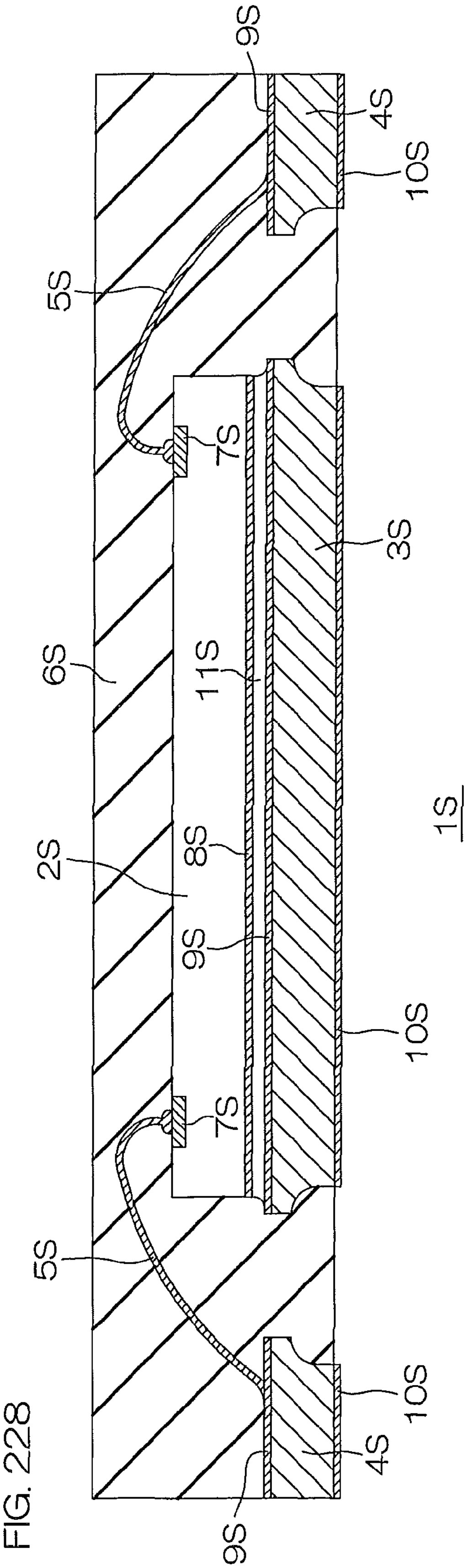

FIG. 228 is a diagram of a modification example of the semiconductor device of FIG. 214.

FIG. 229 is a table of results of a highly accelerated stress test performed on a semiconductor device according to the eighteenth preferred embodiment and a semiconductor device according to a comparative example.

FIG. 230 is a table of results of a pressure cooker test performed on the semiconductor device according to the eighteenth preferred embodiment and the semiconductor device according to the comparative example.

Figure 231:
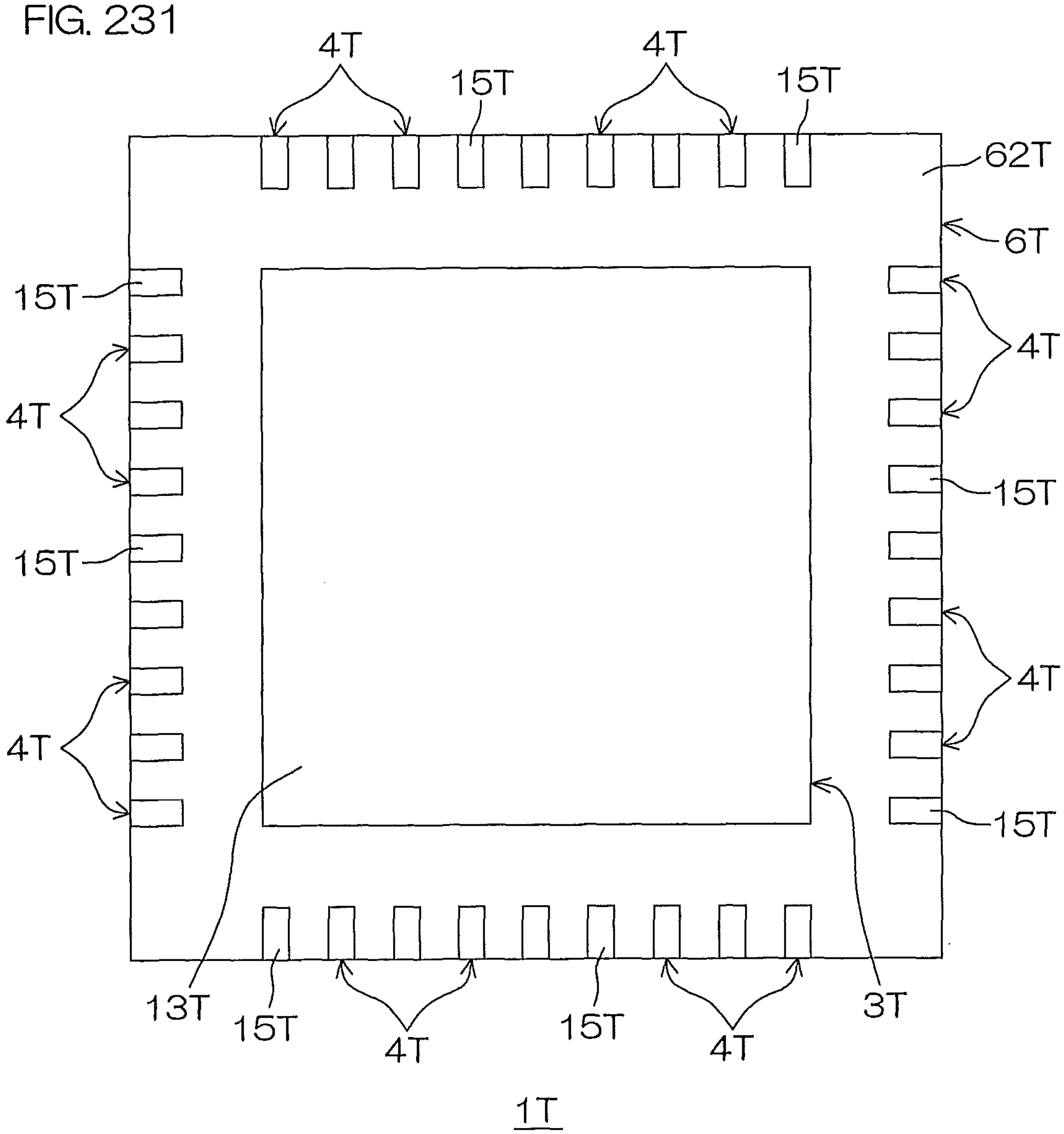

FIG. 231 is a schematic bottom view of a semiconductor device according to a nineteenth preferred embodiment of the present invention.

Figure 232:
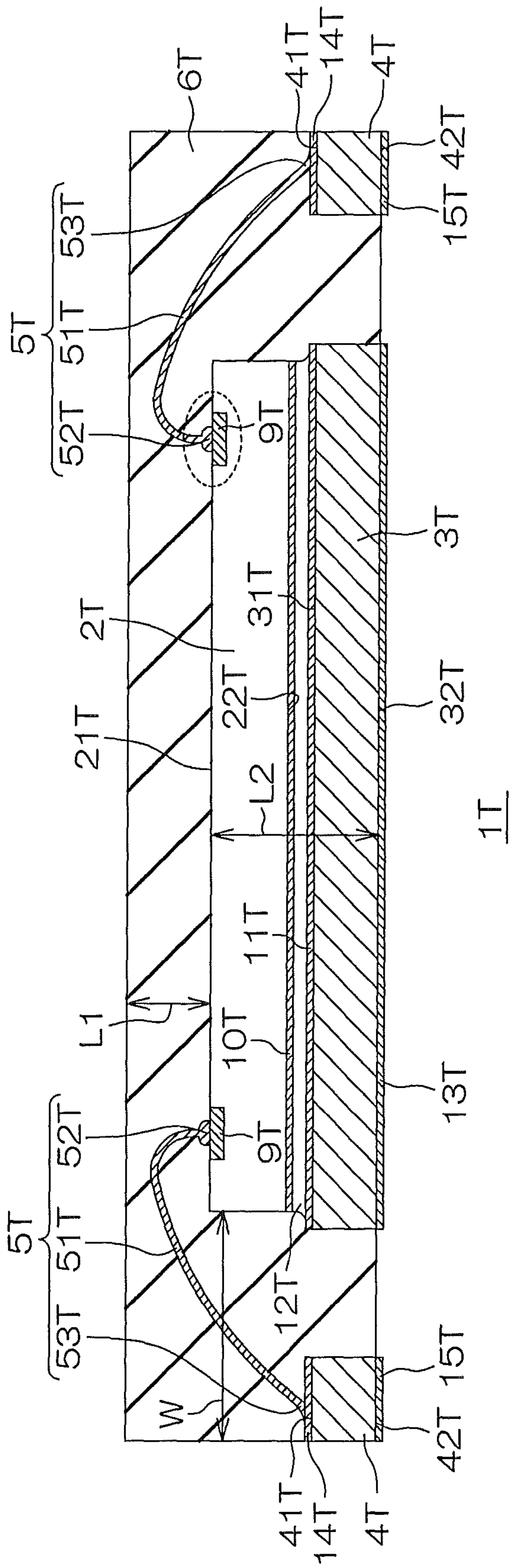

FIG. 232 is a schematic sectional view of the semiconductor device according to the nineteenth preferred embodiment of the present invention.

Figure 233:
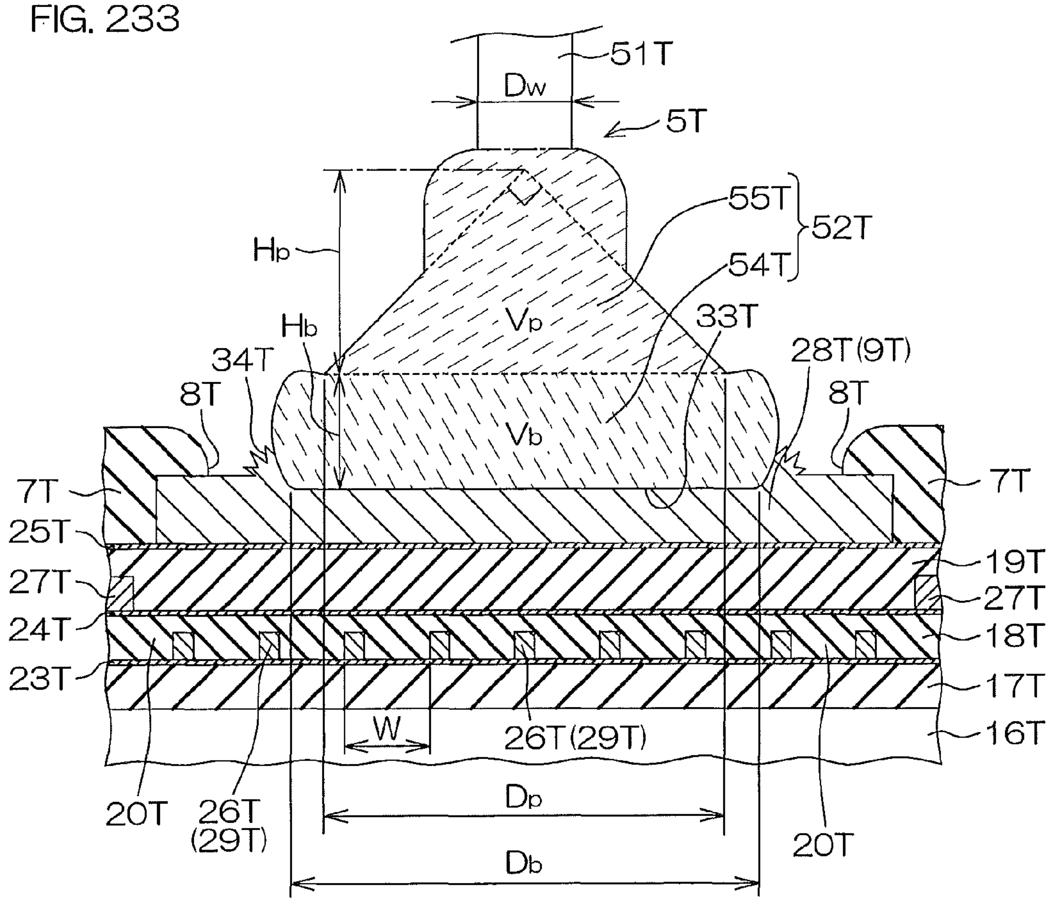

FIG. 233 is an enlarged view of a portion surrounded by a broken-line circle in FIG. 232.

Figure 234:
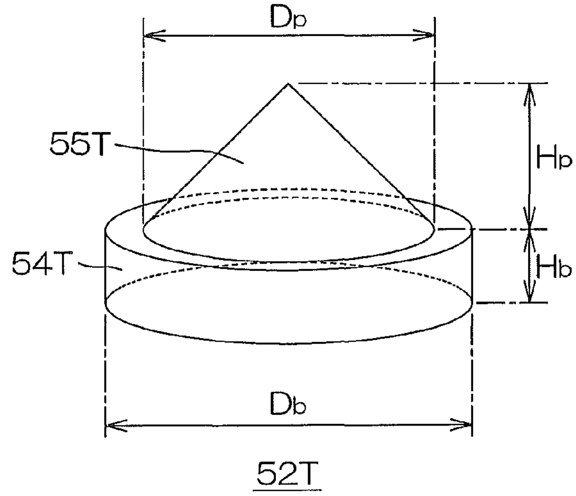

FIG. 234 is a conceptual diagram for determining a volume of a pad bond portion.

Figure 235:
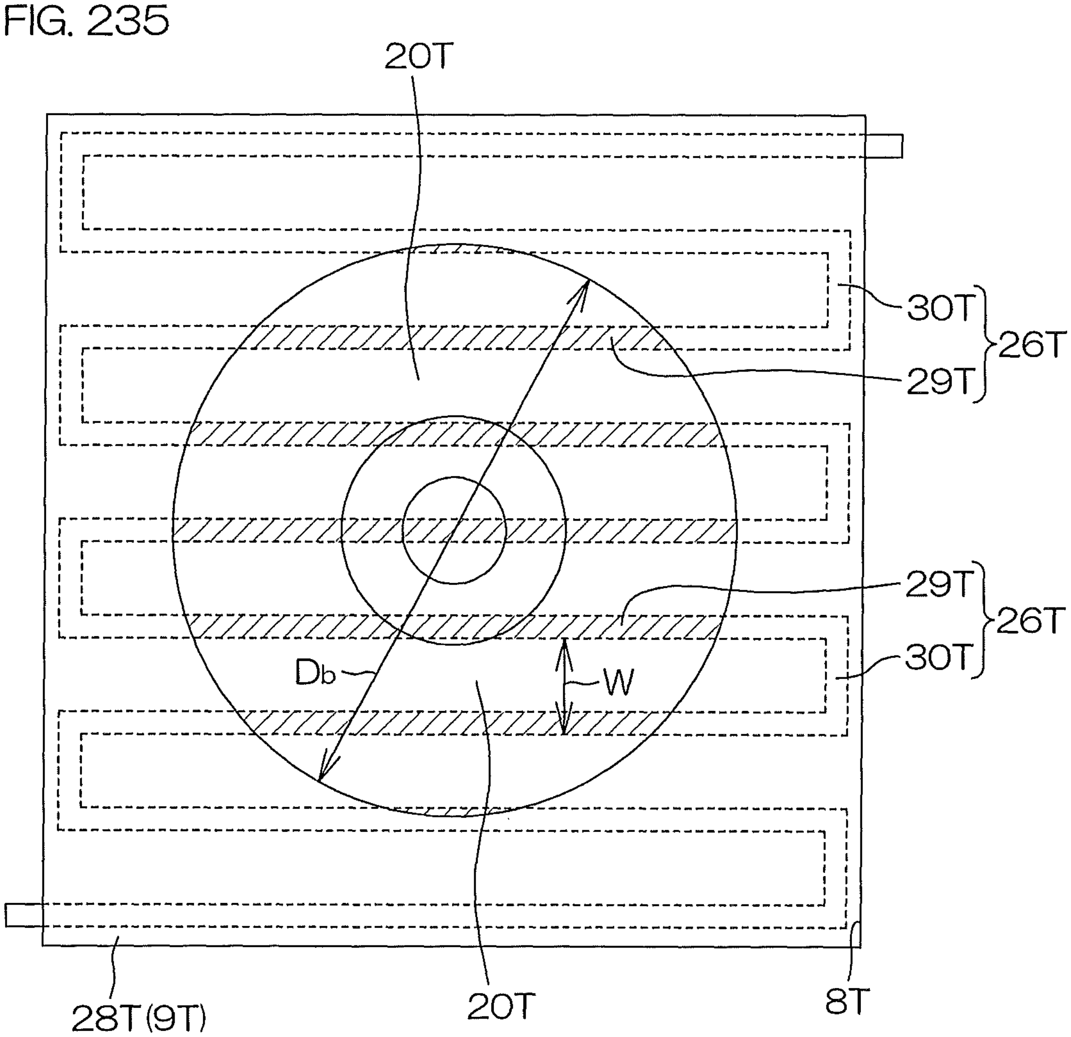

FIG. 235 is a plan view of an electrode pad shown in FIG. 233.

Figure 236A:
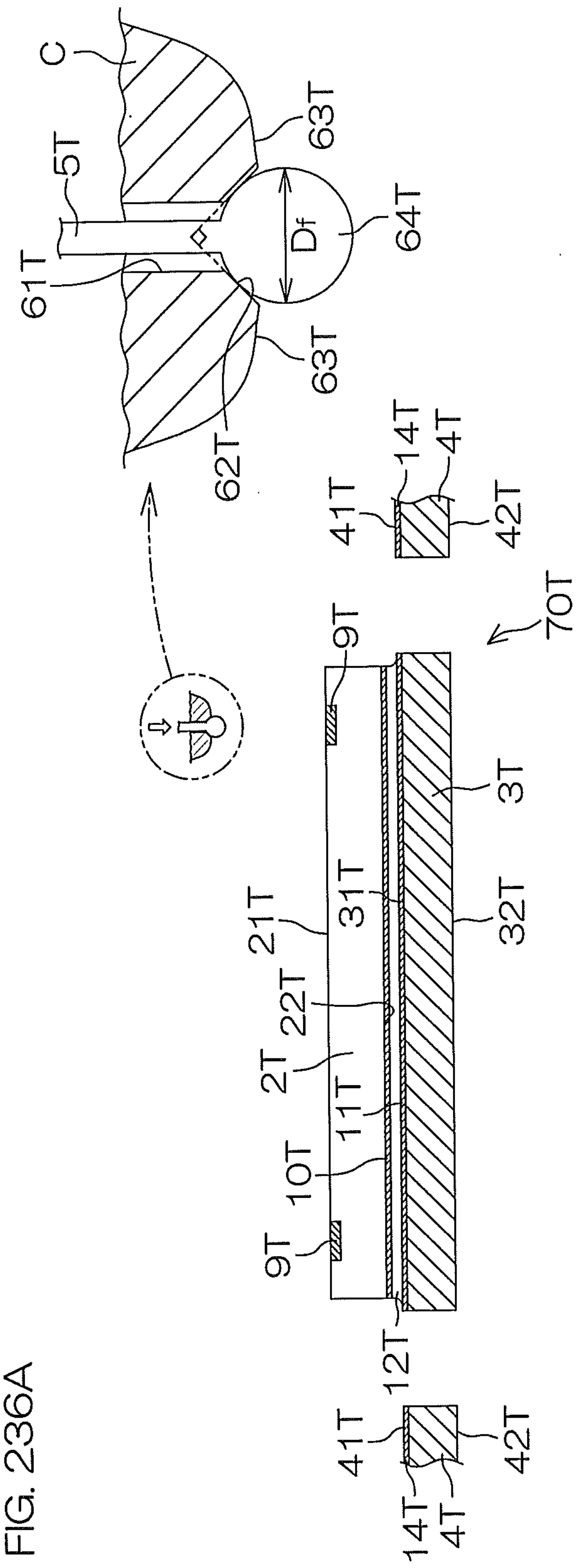

FIG. 236A is a schematic sectional view for describing a method for manufacturing the semiconductor device of FIG. 232.

Figure 236B:
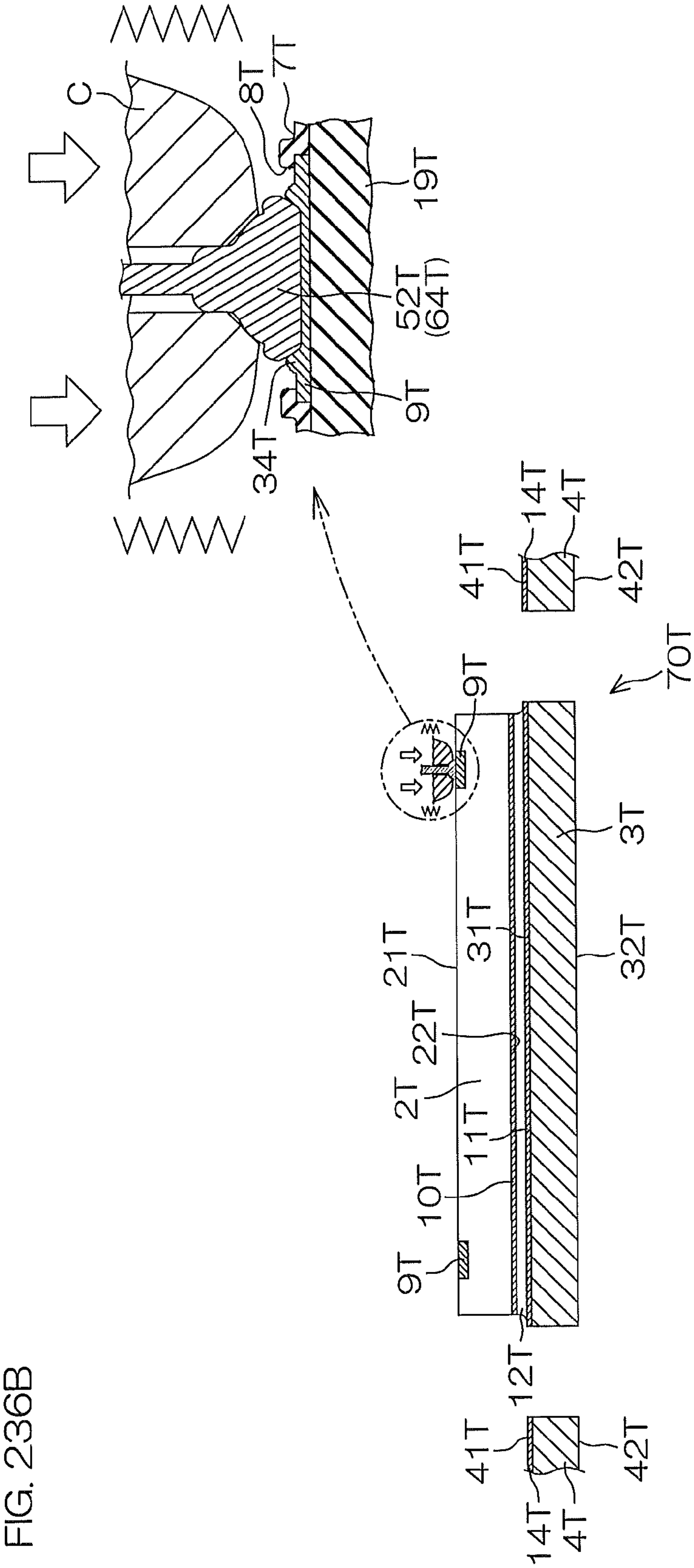

FIG. 236B is a schematic sectional view of a step subsequent to that of FIG. 236A.

Figure 236C:
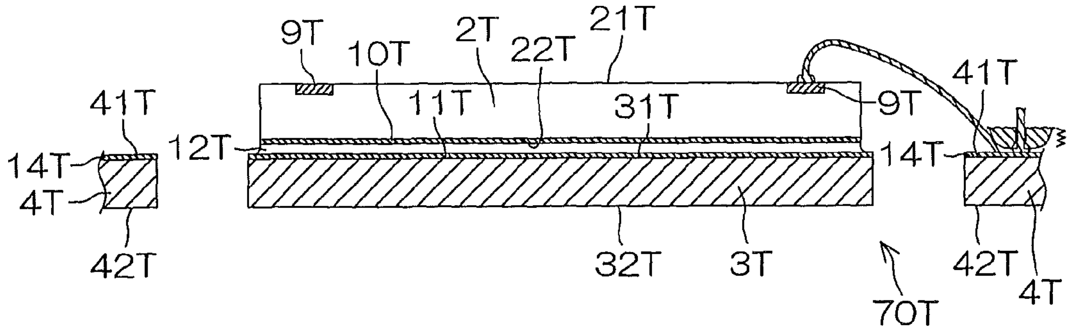

FIG. 236C is a schematic sectional view of a step subsequent to that of FIG. 236B.

Figure 236D:
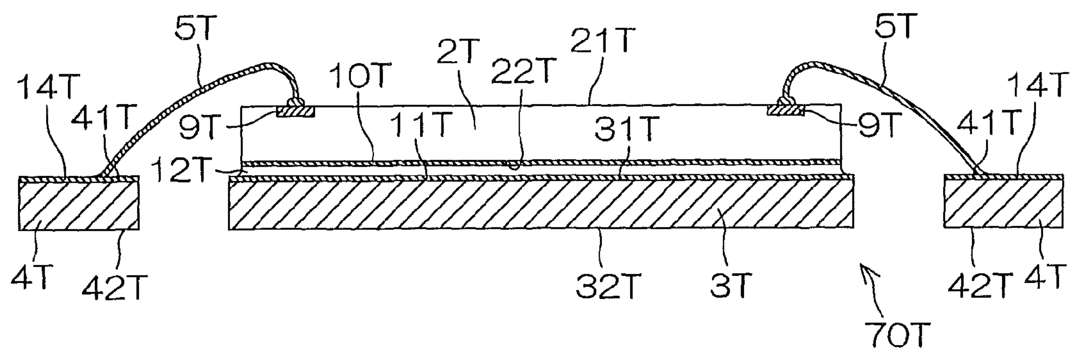

FIG. 236D is a schematic sectional view of a step subsequent to that of FIG. 236C.

Figure 237:
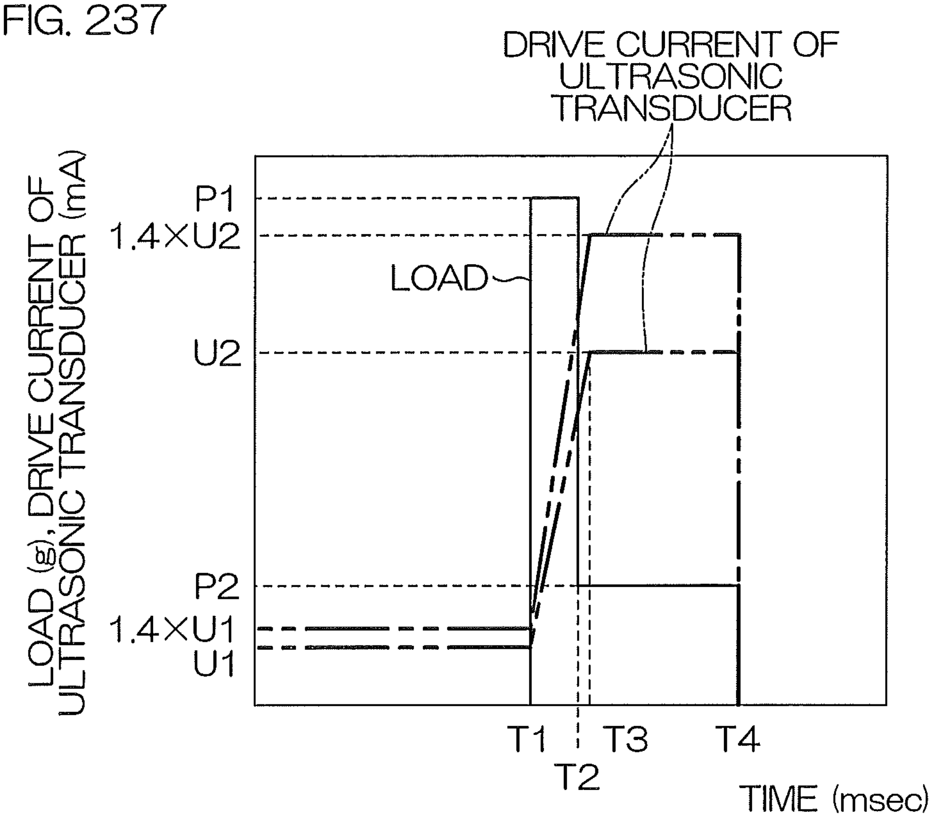

FIG. 237 is a graph of changes with time of a load applied to an FAB and a driving current applied to an ultrasonic transducer during bonding of the FAB to a pad.

Figure 238:
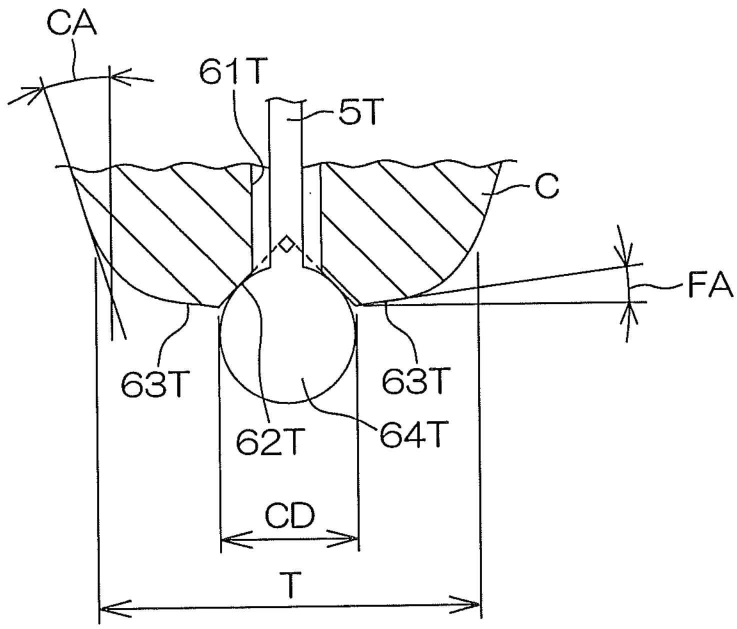

FIG. 238 is a schematic sectional view of a standard type capillary.

Figure 239:
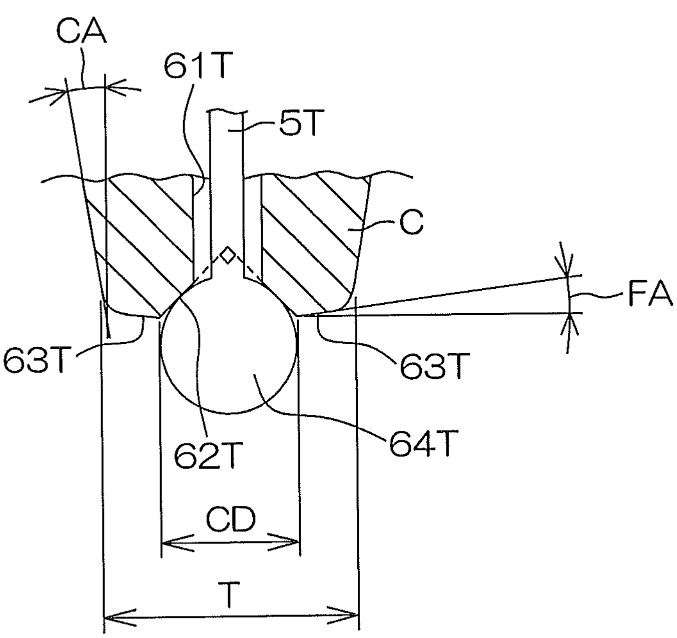

FIG. 239 is a schematic sectional view of a bottleneck type capillary.

Figure 240:
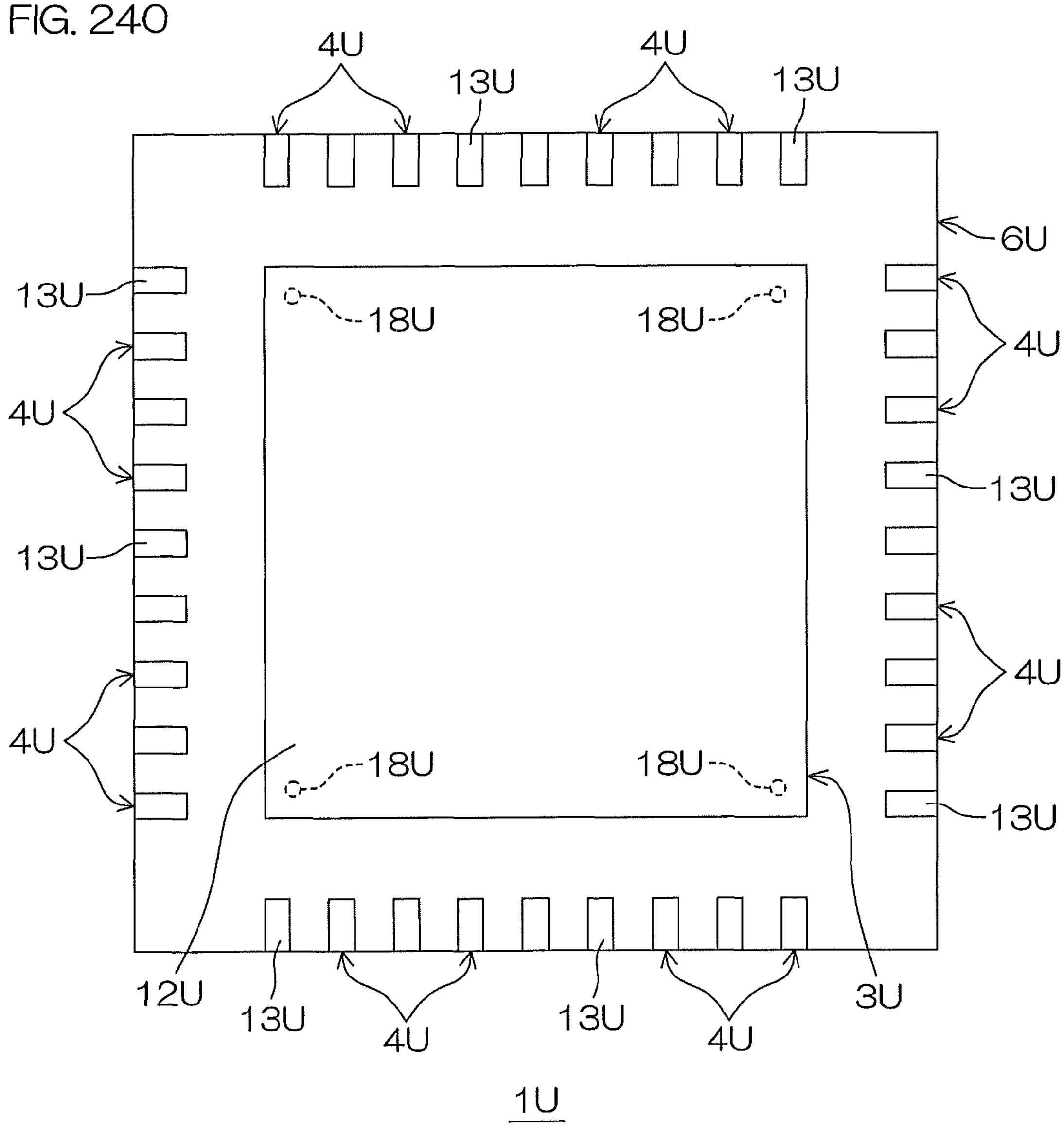

FIG. 240 is a schematic bottom view of a semiconductor device according to a twentieth preferred embodiment of the present invention.

Figure 241:
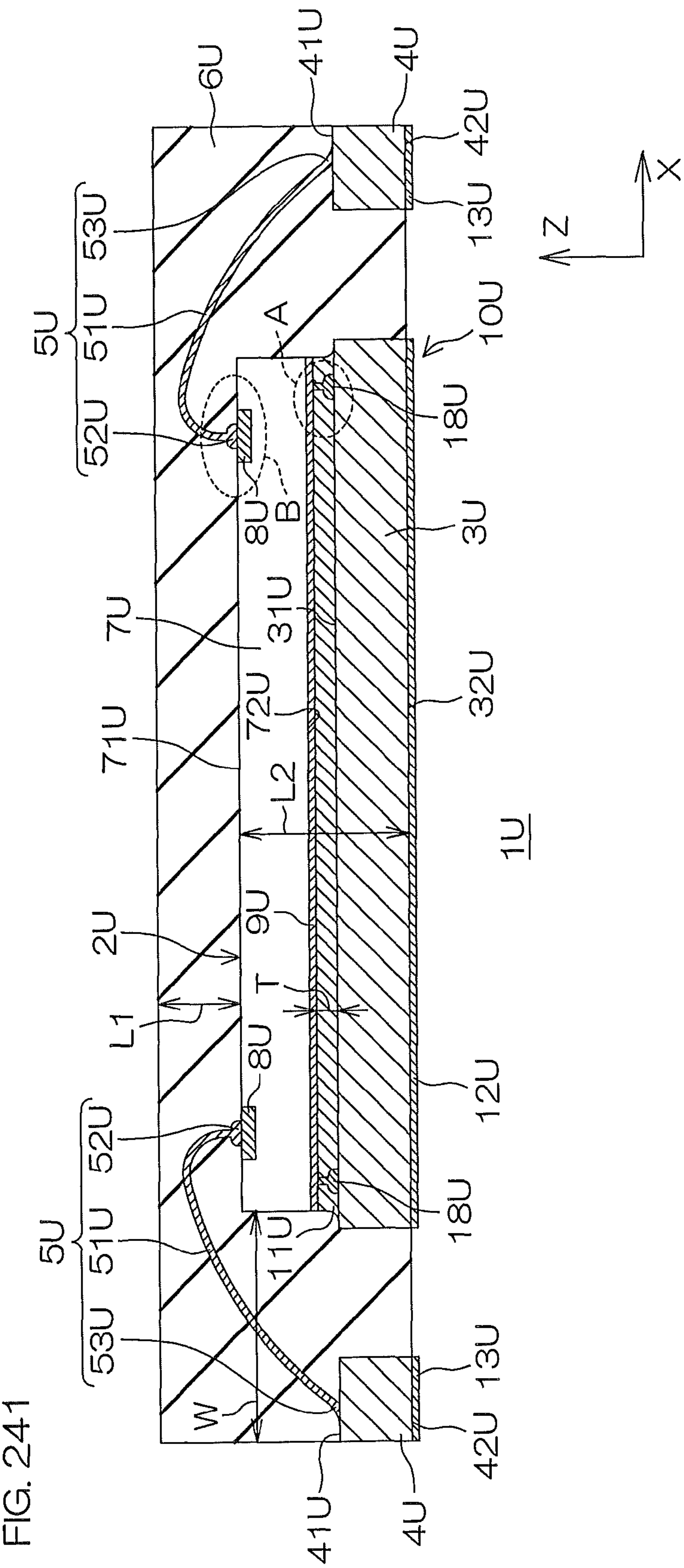

FIG. 241 is a schematic sectional view of the semiconductor device according to the twentieth preferred embodiment of the present invention.

Figure 242:
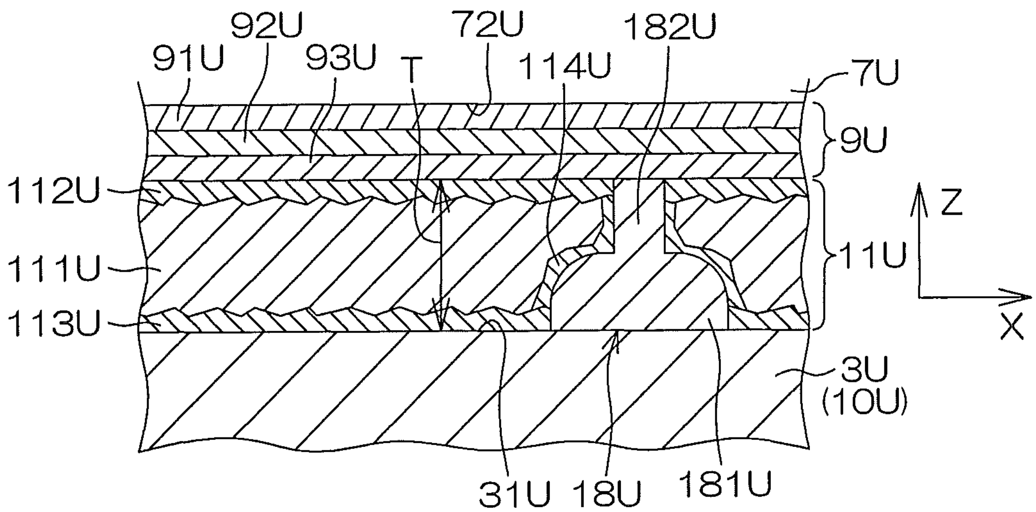

FIG. 242 is an enlarged view of principal portions of a portion surrounded by a broken-line circle A in FIG. 241.

Figure 243:
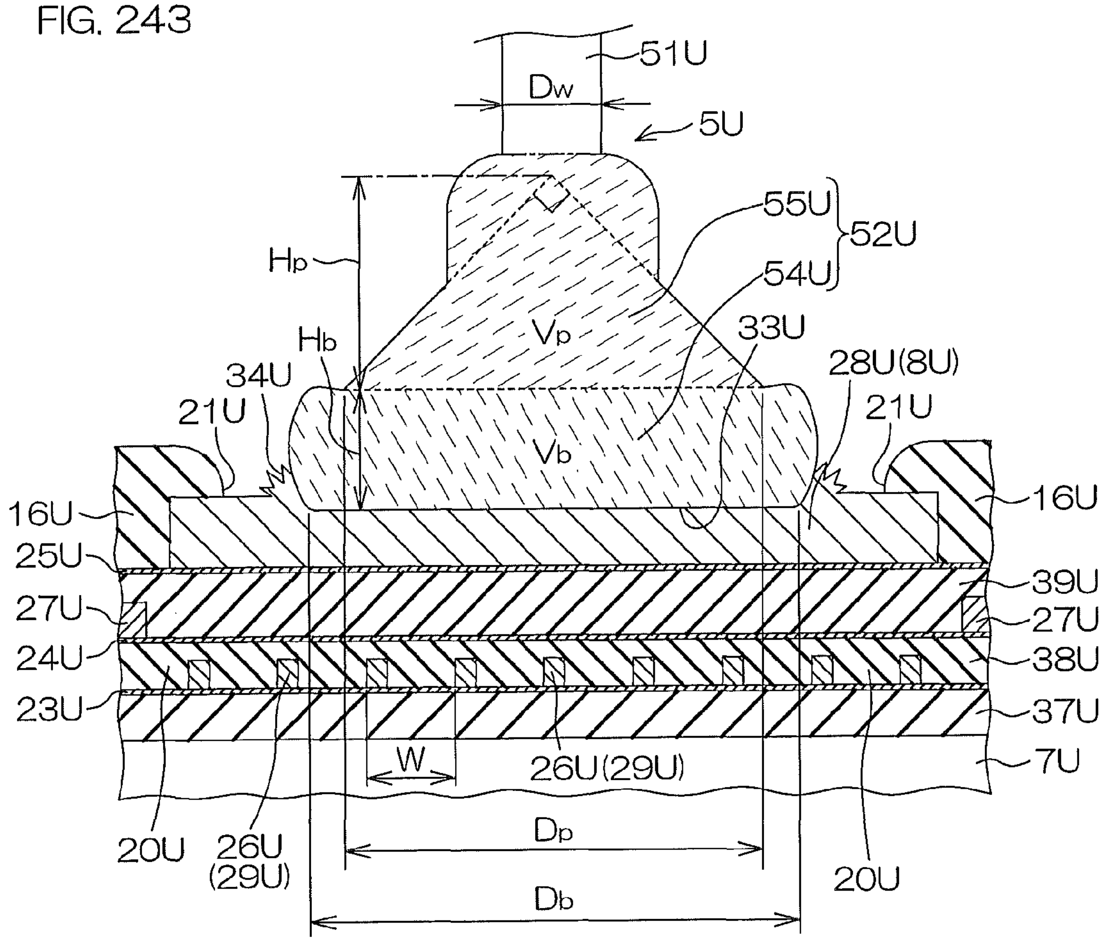

FIG. 243 is an enlarged view of principal portions of a portion surrounded by a broken-line circle B in FIG. 241.

Figure 244:
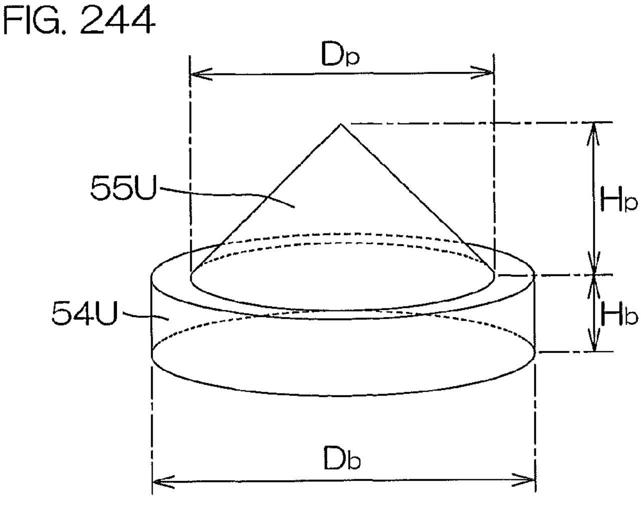

FIG. 244 is a conceptual diagram for determining a volume of a pad bond portion.

Figure 245:
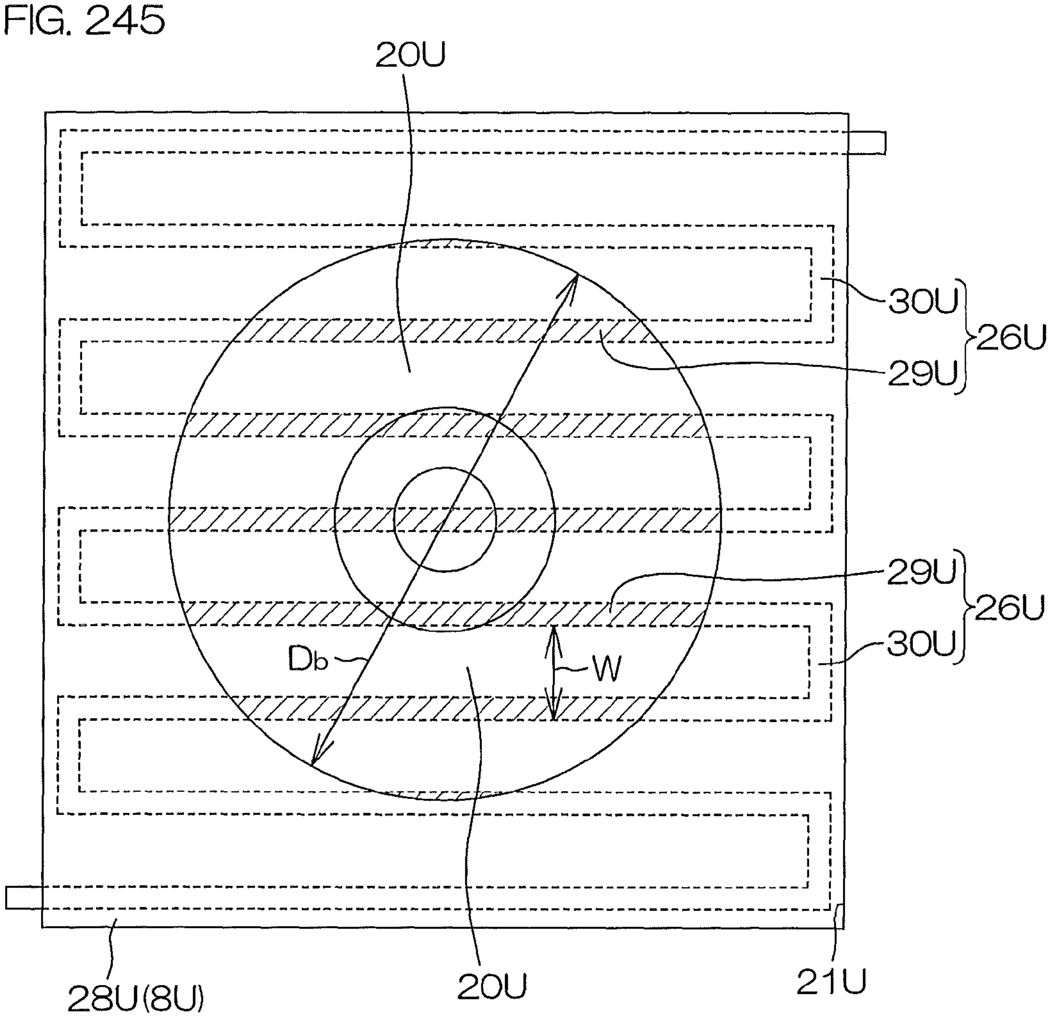

FIG. 245 is a plan view of an electrode pad shown in FIG. 244.

Figure 246A:
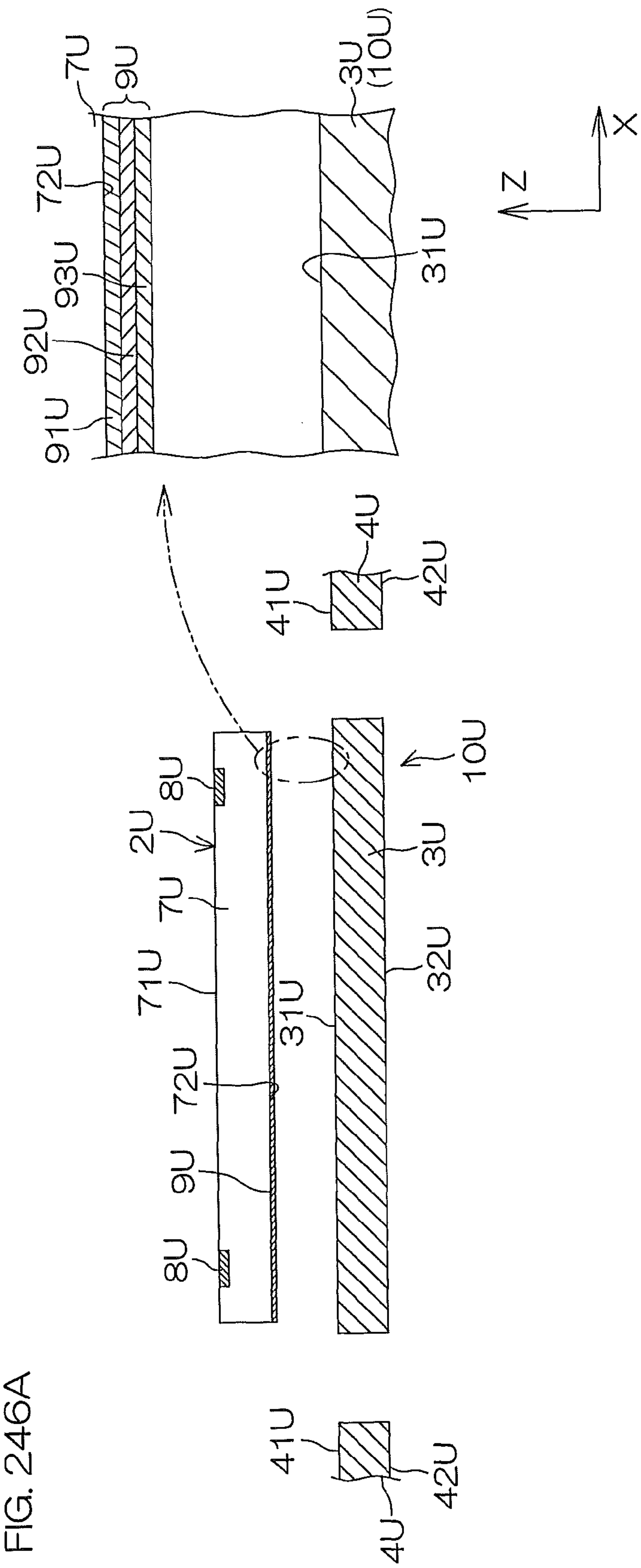

FIG. 246A is a schematic sectional view for describing a method for manufacturing the semiconductor device of FIG. 241.

Figure 246B:
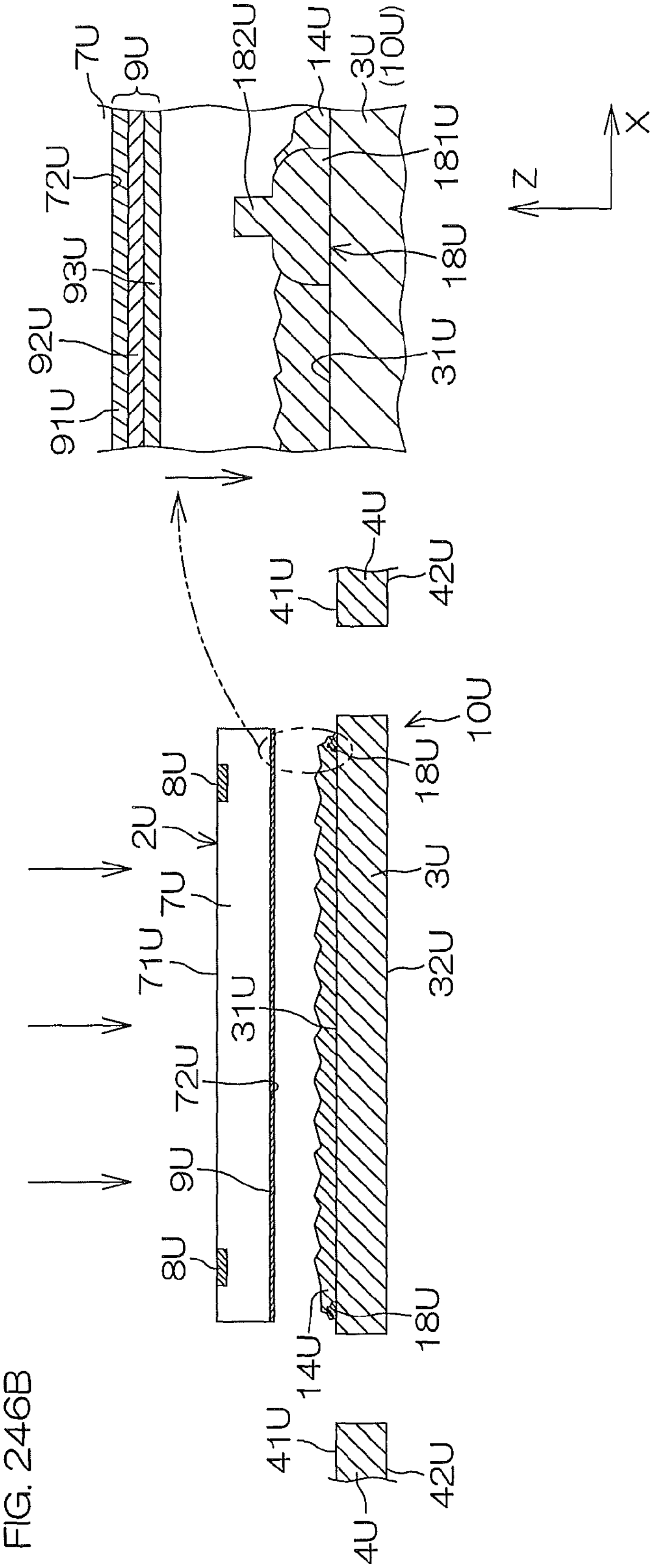

FIG. 246B is a schematic sectional view of a step subsequent to that of FIG. 246A.

Figure 246C:
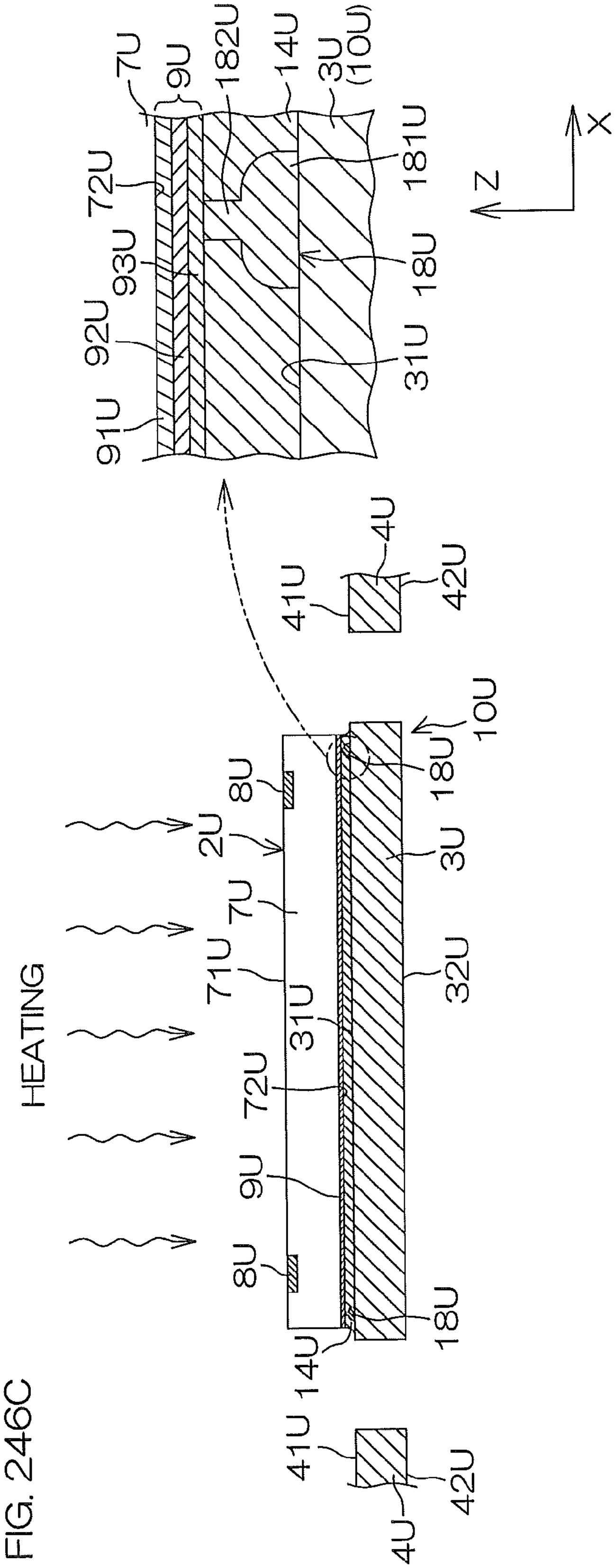

FIG. 246C is a schematic sectional view of a step subsequent to that of FIG. 246B.

Figure 246D:
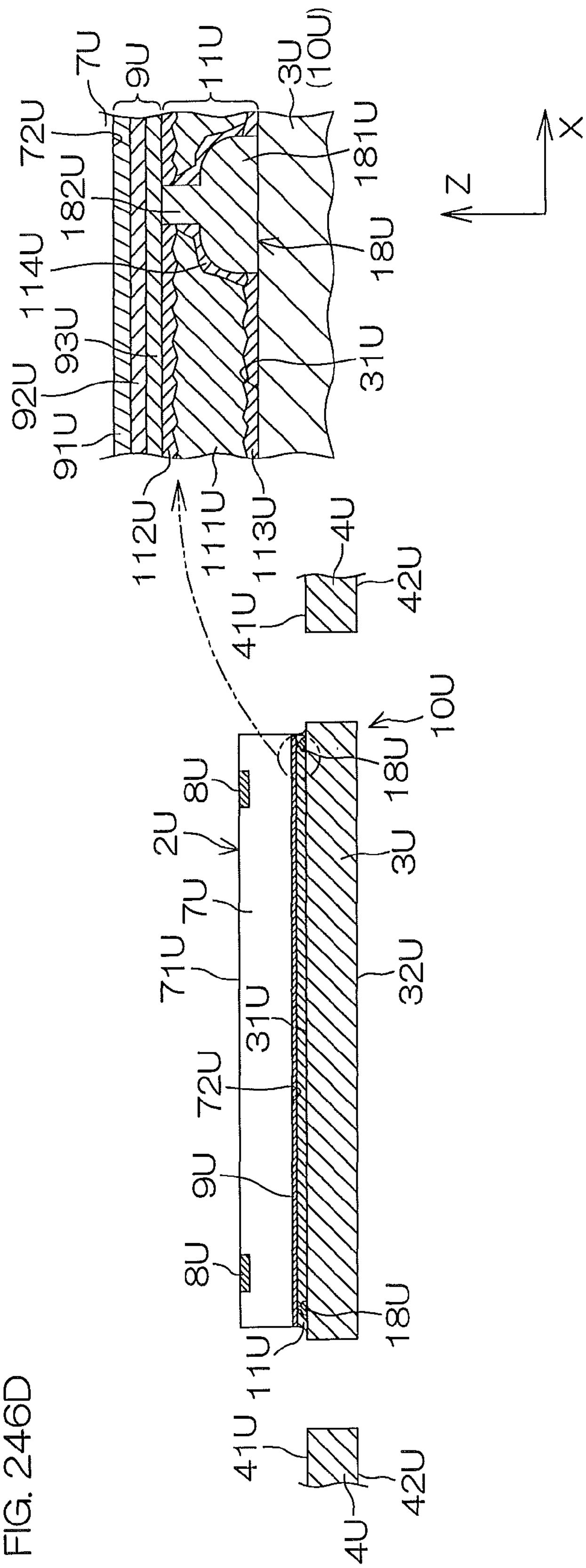

FIG. 246D is a schematic sectional view of a step subsequent to that of FIG. 246C.

Figure 246E:
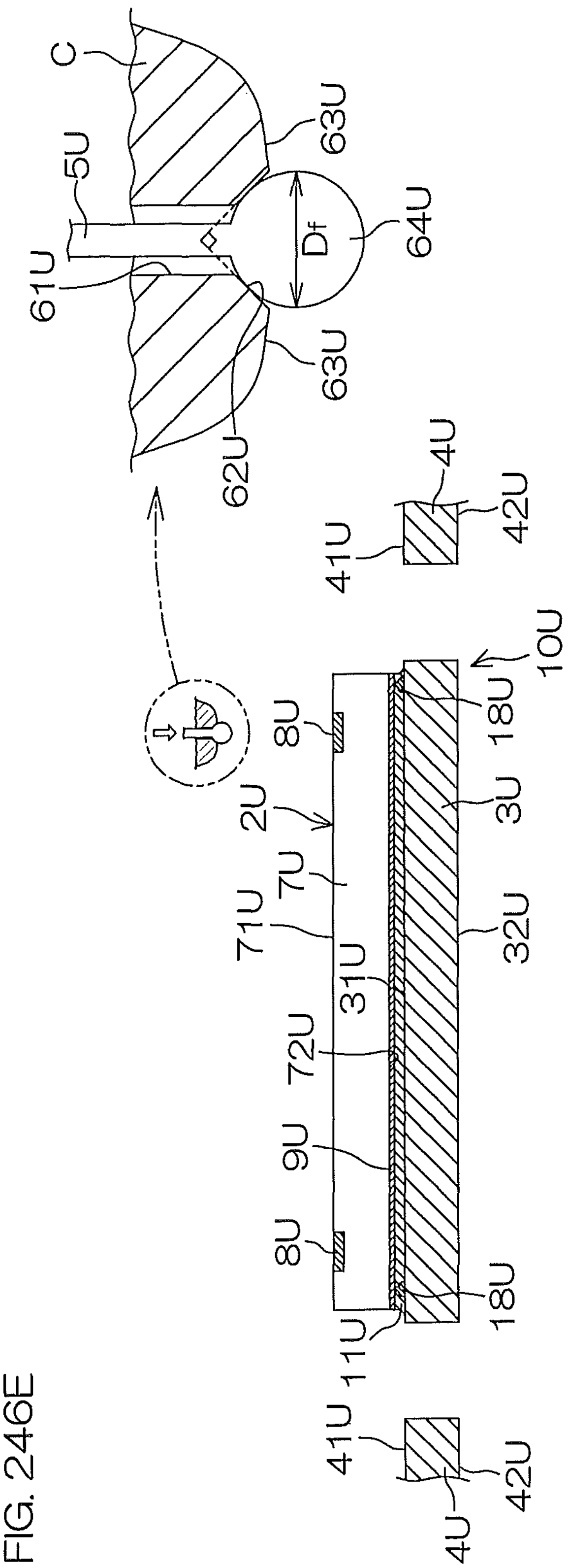

FIG. 246E is a schematic sectional view of a step subsequent to that of FIG. 246D.

Figure 246F:
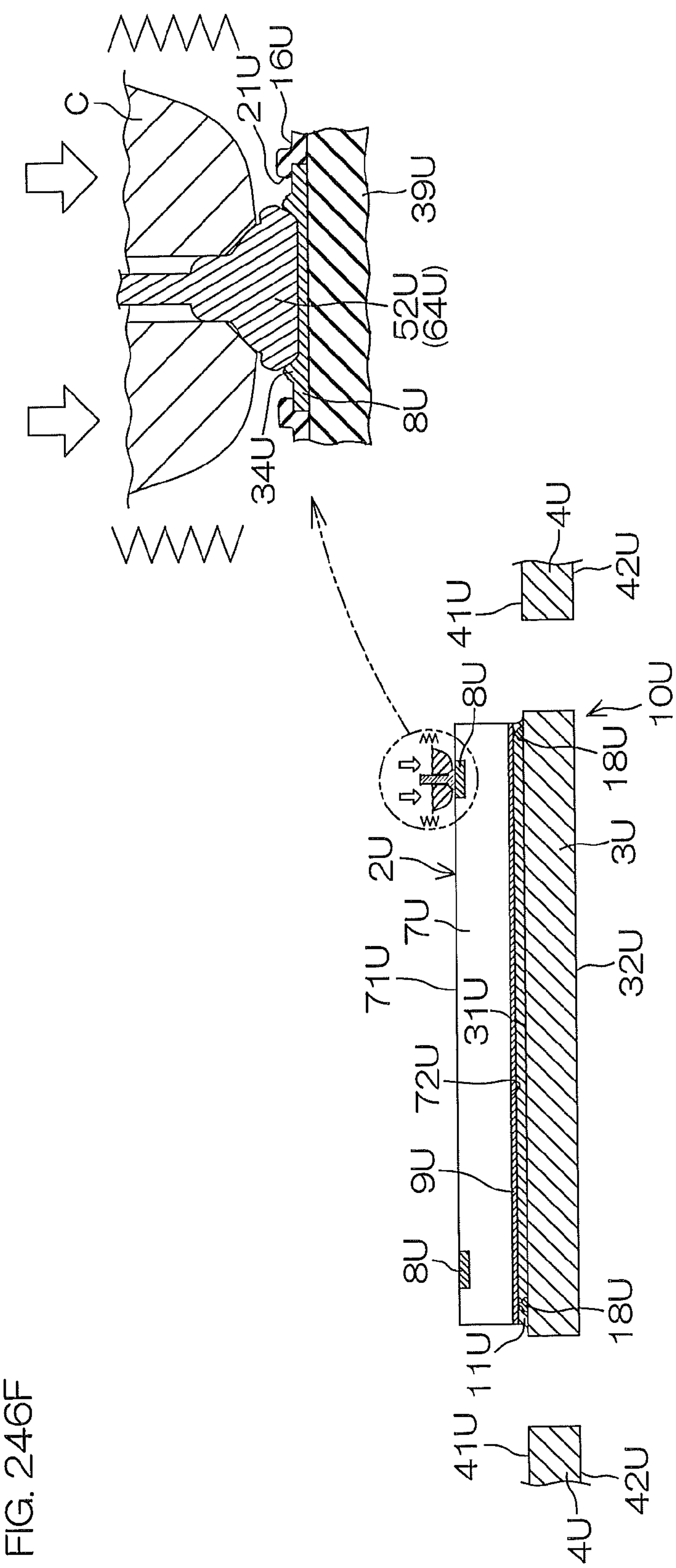

FIG. 246F is a schematic sectional view of a step subsequent to that of FIG. 246E.

Figure 246G:
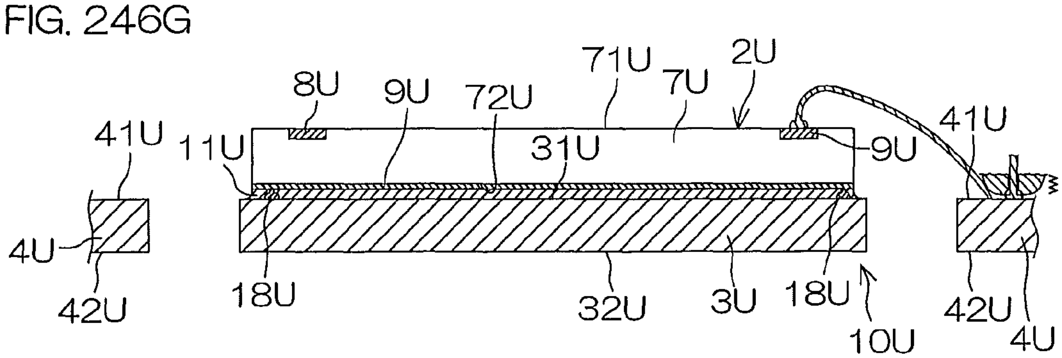

FIG. 246G is a schematic sectional view of a step subsequent to that of FIG. 246F.

Figure 246H:
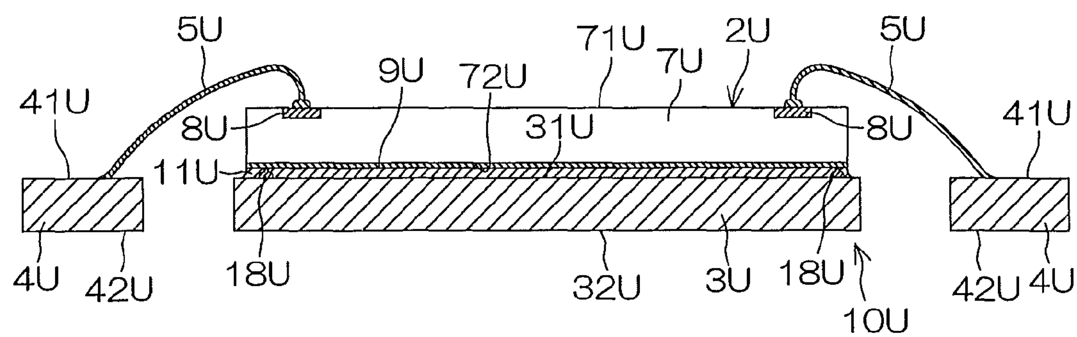

FIG. 246H is a schematic sectional view of a step subsequent to that of FIG. 246G.

Figure 247:
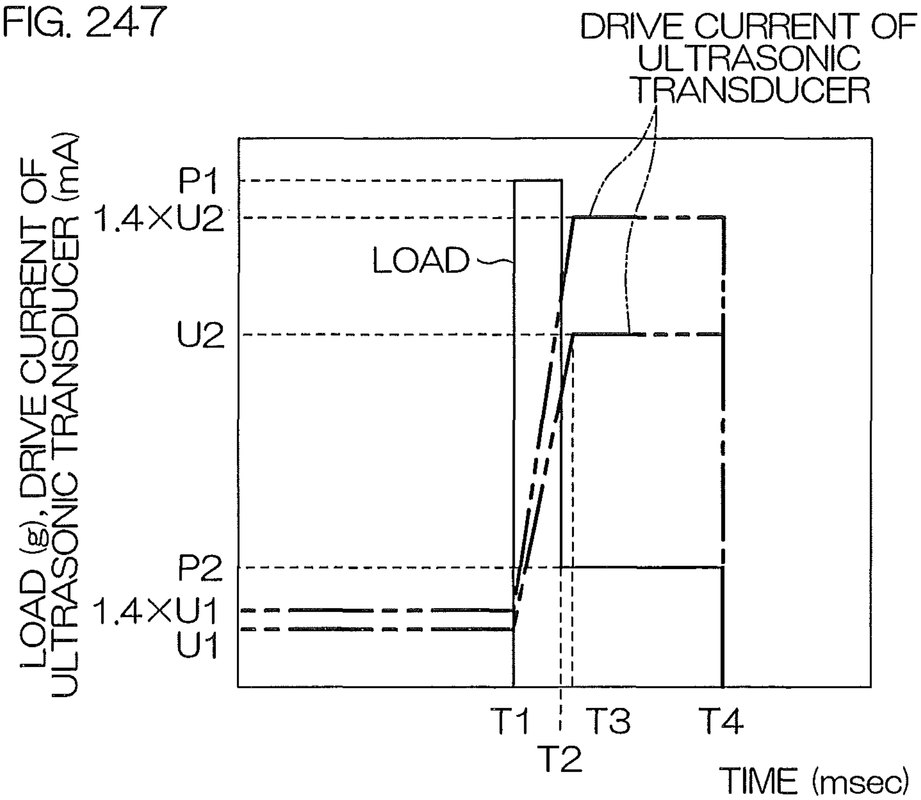

FIG. 247 is a graph of changes with time of a load applied to an FAB and a driving current applied to an ultrasonic transducer during bonding of the FAB to a pad.

Figure 248:
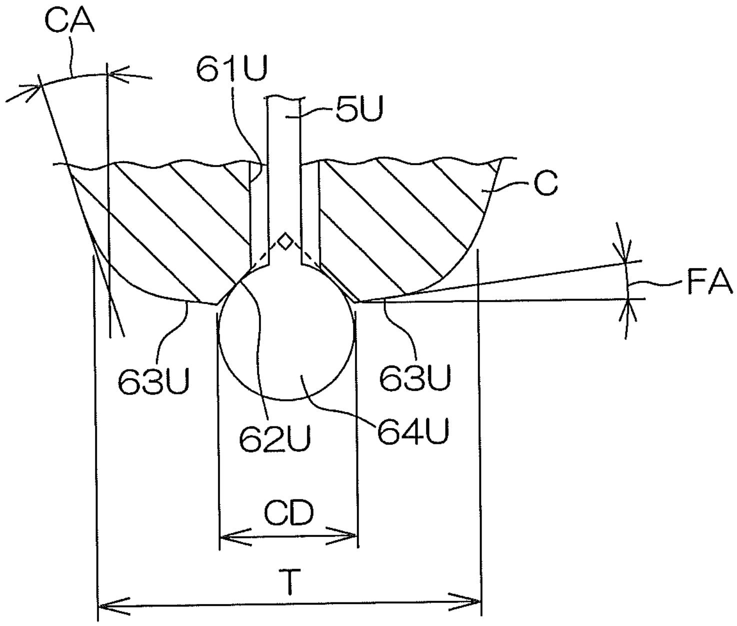

FIG. 248 is a schematic sectional view of a standard type capillary.

Figure 249:
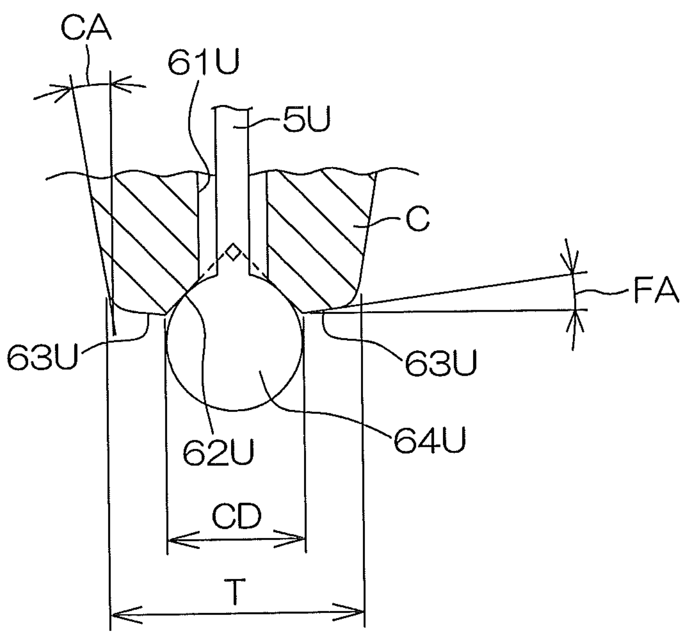

FIG. 249 is a schematic sectional view of a bottleneck type capillary.

MODE(S) FOR CARRYING OUT THE INVENTION

Preferred embodiments of the present invention shall now be described in detail with reference to the attached drawings.

First Preferred Embodiment FIG. 1 to FIG. 9

Figure 1:
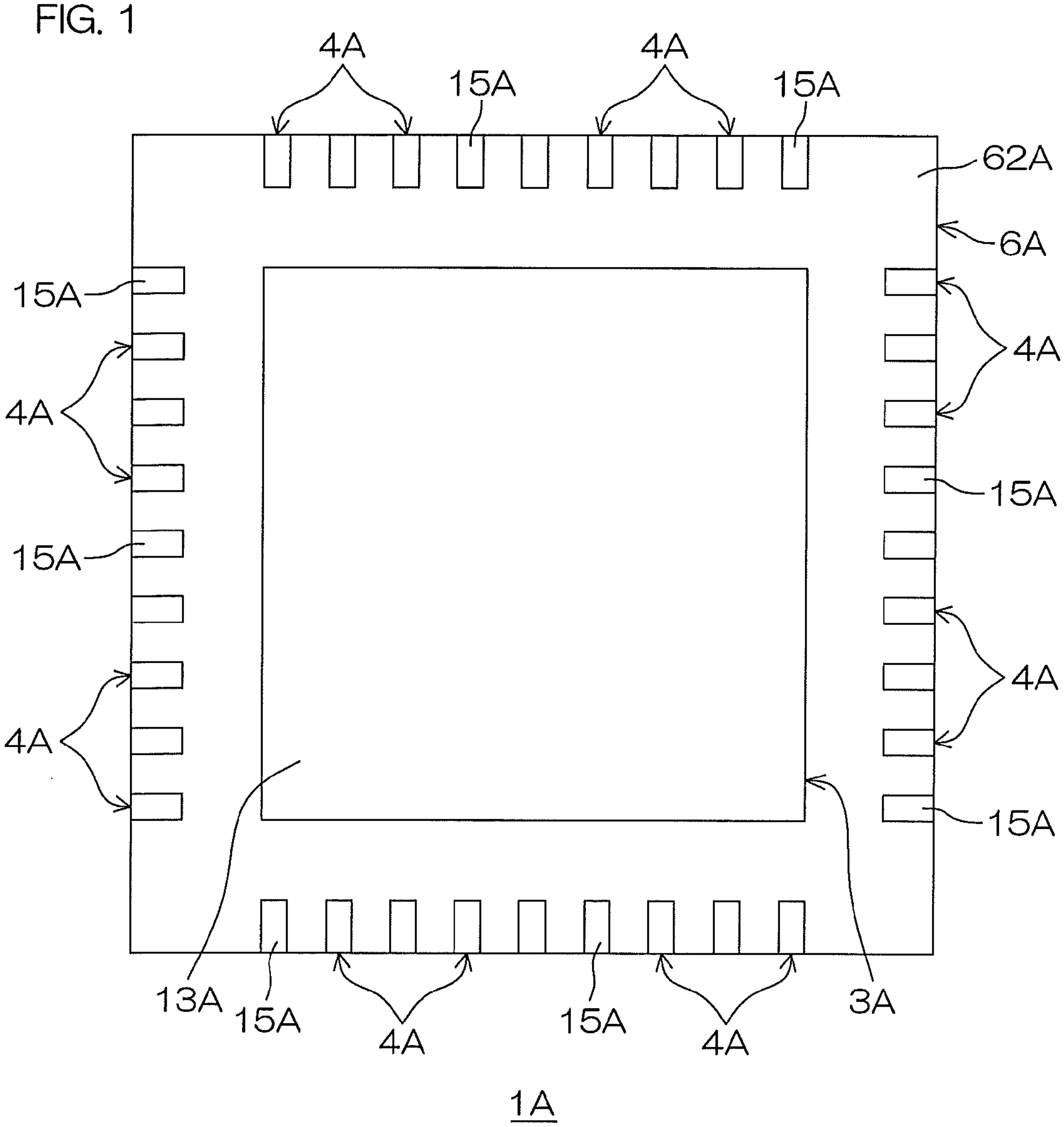
FIG. 1 is a schematic bottom view of a semiconductor device according to a first preferred embodiment of the present invention.
Figure 3B:
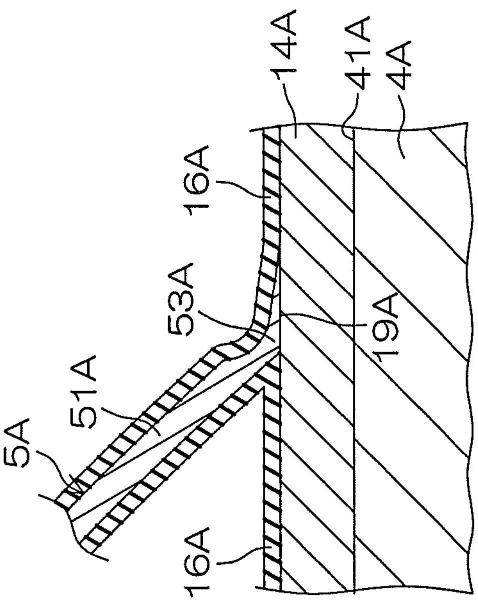
FIG. 3B is an enlarged view of principal portions of a portion surrounded by a broken-line circle B in FIG. 2.
Figure 3A:
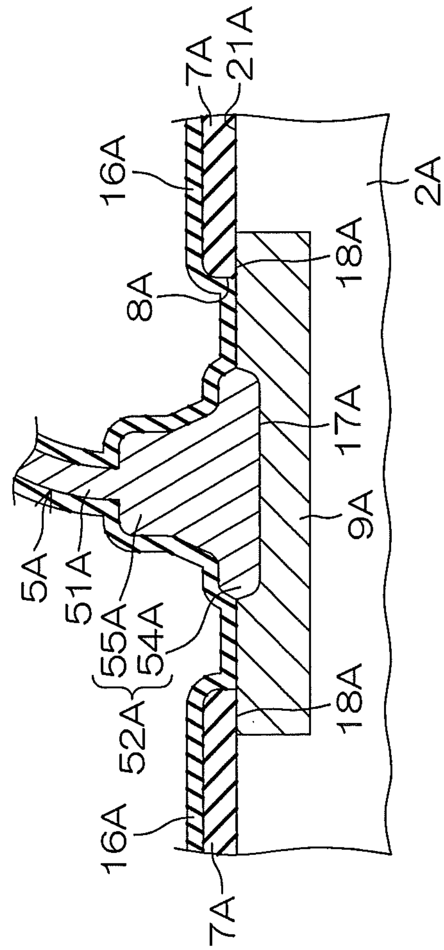
FIG. 3A is an enlarged view of principal portions of a portion surrounded by a broken-line circle A in FIG. 2.

FIG. 1 is a schematic bottom view of a semiconductor device according to a first preferred embodiment of the present invention. FIG. 2 is a schematic sectional view of the semiconductor device according to the first preferred embodiment of the present invention. FIG. 3A is an enlarged view of principal portions of a portion surrounded by a broken-line circle A in FIG. 2. FIG. 3B is an enlarged view of principal portions of a portion surrounded by a broken-line circle B in FIG. 2.

The semiconductor device 1A is a semiconductor device to which a QFN (quad flat non-leaded) configuration is applied. The semiconductor device 1A includes a semiconductor chip 2A, a die pad 3A supporting the semiconductor chip 2A, a plurality of electrode leads 4A disposed at a periphery of the semiconductor chip 2A, bonding wires 5A electrically connecting the semiconductor chip 2A and the electrode leads 4A, and a resin package 6A sealing the above components.

The semiconductor chip 2A has a quadrilateral shape in plan view and has, for example, a multilayer wiring structure arranged by laminating a plurality of wiring layers via interlayer insulating films. Also, the semiconductor chip 2A has a thickness, for example, of 220 to 240 μm (preferably, approximately 230 μm). As shown in FIG. 3A, a top surface 21A (surface at one side in a thickness direction) of the semiconductor chip 2A is covered by a top surface protective film 7A.

A plurality of pad openings 8A for exposing an uppermost wiring layer of the multilayer wiring structure are formed in the top surface protective film 7A.

Each pad opening 8A has a quadrilateral shape in plan view and the same number thereof are provided at each edge of the semiconductor chip 2A. The respective pad openings 8A are disposed at equal intervals along the respective sides of the semiconductor chip 2A. From each pad opening 8A, a portion of the wiring layer is exposed as an electrode pad 9A of the semiconductor chip 2A.

The uppermost wiring layer exposed as the electrode pads 9A is made of a metal material that contains Al (aluminum) and is specifically made of a metal material having Al as a main component (for example, an Al—Cu alloy, etc.).

Meanwhile, a rear surface metal 10A that contains, for example, Au, Ni, Ag, etc., is formed on a rear surface 22A (surface at the other side in the thickness direction) of the semiconductor chip 2A.

The die pad 3A is made, for example, of a metal thin plate (for example, Cu or 42 alloy (an alloy containing Fe-42% Ni) and has a larger quadrilateral shape (for example, approximately 2.7 mm square in plan view) than the semiconductor chip 2A. Also, the die pad 3A has a thickness of 190 to 210 μm (preferably, approximately 200 μm). A pad plating layer 11A that contains Ag, etc., is formed on a top surface 31A (surface at one side in the thickness direction) of the die pad 3A.

The semiconductor chip 2A and the die pad 3A are bonded to each other in a state where the rear surface 22A of the semiconductor chip 2A and the top surface 31A of the die pad 3A face each other as bonded surfaces with a bonding material 12A interposed between the rear surface 22A and the top surface 31A. The semiconductor chip 2A is thereby supported by the die pad 3A in an orientation where the top surface 21A faces upward.

The bonding material 12A is made, for example, of solder paste or other conductive paste. As the bonding material 12A, an insulating paste, such as a silver paste, an alumina paste, may be applied and in this case, the rear surface metal 10A and/or the pad plating layer 11A may be omitted. Also, in the state where the semiconductor chip 2A and the die pad 3A are bonded, a thickness of the bonding material 12A is, for example, 10 to 20 μm.

A rear surface 32A (surface at the other side in the thickness direction) of the die pad 3A is exposed from the resin package 6A. A solder plating layer 13A made, for example, of a metal material, such as tin (Sn), tin-silver alloy (Sn—Ag), is formed on the exposed other-side surface.

The electrode leads 4A are made of the same metal thin plate (containing, for example, Cu or 42 alloy (Fe-42% Ni, etc.) as the die pad 3A. The electrode leads 4A are disposed at the periphery of the semiconductor chip 2A with the same number thereof being disposed at both sides in respective directions orthogonal to respective side surfaces of the die pad 3A. The electrode leads 4A that face each side surface of the die pad 3A are disposed at equal intervals in a direction parallel to the facing side surface. A length of each electrode lead 4A in the direction of facing the die pad 3A is, for example, 450 to 500 μm (preferably, approximately 500 μm). A lead plating layer 14A that contains Ag, etc., is formed on a top surface 41A (surface at one side in the thickness direction) of each electrode lead 4A.

Meanwhile, a rear surface 42A (surface at the other side in the thickness direction) of each electrode lead 4A is exposed from the resin package 6A. A solder plating layer 15A made, for example, of a metal material, such as tin (Sn), tin-silver alloy (Sn—Ag), is formed on the exposed rear surface 42A.

Each bonding wire 5A is made of copper (for example, a high-purity copper of no less than 99.9999% (6N) purity or no less than 99.99% (4N) purity that may contain a minute amount of impurity). Each bonding wire 5A includes a linearly-extending, cylindrical main body portion 51A and includes a pad bond portion 52A and a lead bond portion 53A formed at respective ends of the main body portion 51A and respectively bonded to an electrode pad 9A and an electrode lead 4A.

The main body portion 51A is curved parabolically upward from the one end at the electrode pad 9A side toward an outer side of the semiconductor chip 2A and made impingent at an acute angle at the other end on the top surface 41A of the electrode lead 4A. An interval I between a lower end at a topmost portion of the main body portion 51A and the top surface 21A of the semiconductor chip 2A is, for example, 150 to 170 μm (preferably, approximately 160 μm).

The pad bond portion 52A is smaller than the electrode pad 9A in plan view. The pad bond portion 52A has a humped shape in sectional view that integrally includes a disk-shaped base portion 54A, which, at its other side in the thickness direction, enters uniformly into a top layer portion of the electrode pad 9A, and a bell-shaped projecting portion 55A projecting from the one side of the base portion 54A and having a tip connected to the one end of the main body portion 51A.

The lead bond portion 53A has a wedge-like shape in sectional view that is relatively thick at the one end side close to the main body portion 51A and becomes relatively thinner toward the other end side away from the main body portion 51A.

In the semiconductor device 1A, the entire top surface 21A and side surfaces 28A of the semiconductor chip 2A, the entire top surface 31A and side surfaces of the die pad 3A, the entire top surfaces 41A and side surfaces inside the resin package 6A of the electrode leads 4A, and the entire bonding wires 5A are covered by an integral water-impermeable metal film 16A.

The water-impermeable insulating film 16A is made of an insulating material capable of preventing permeation of water and is made, for example, of silicon oxide, which is used as an interlayer insulating material, or silicon nitride, which is used as a material of the top surface protective film 7A, etc. Also, the water-impermeable insulating film 16A is thinner than the top surface protective film 7A and is, for example, 0.5 to 3 μm thick.

As shown in FIG. 3A, in a vicinity of the pad bond portion 52A of each bonding wire 5A, the water-impermeable insulating film 16A integrally covers an entirety of the electrode pad 9A that protrudes to an outer side of the pad bond portion 52A in plan view and an entirety of a top surface of the pad bond portion 52A together with a top surface of the top surface protective film 7A. A periphery edge of a bond interface (pad bond interface 17A) of the electrode pad 9A and the pad bond portion 52A and a periphery edge of a bond interface (protective film lamination interface 18A) of the electrode pad 9A and the top surface protective film 7A are thereby covered by the water-impermeable insulating film 16A without any exposure whatsoever.

Meanwhile, as shown in FIG. 3B, in a vicinity of the lead bond portion 53A of each bonding wire 5A, the water-impermeable insulating film 16A integrally covers an entirety of the top surface 41A (lead plating layer 14A) of the electrode lead 4A and an entirety of a top surface of the lead bond portion 53A. A periphery edge of a bond interface (lead bond interface 19A) of the electrode lead 4A and the lead bond portion 53A is thereby covered by the water-impermeable insulating film 16A without any exposure whatsoever.

As the resin package 6A, a known material, such as an epoxy resin, may be applied. The resin package 6A makes up an outer shape of the semiconductor device 1A and is formed to a substantially rectangular parallelepiped shape. In terms of size, the resin package 6A has a planar size, for example, of approximately 4 mm square and a thickness, for example, of approximately 0.85 mm.

With the semiconductor device 1A, an interval L1 between the top surface 21A of the semiconductor chip 2A and a top surface (upper surface) 61A of the resin package 6A is less than a minimum distance W between a side surface 28A of the semiconductor chip 2A and a side surface 63A of the resin package 6A. Specifically, the interval L1 is, for example, 375 to 425 μm and preferably, approximately 400 μm, and the minimum distance W is, for example, 800 to 1000 μm and preferably, approximately 900 μm.

Also, the interval L1 is no more than a distance L2 (for example, of 425 to 475 μm and preferably, approximately 450 μm) between the top surface 21A of the semiconductor chip 2A and a rear surface 62A of the resin package 6A (rear surface 32A of the die pad 3A).

By being designed so that the interval L1 is comparatively small as described above, the semiconductor device 1A is formed as a thin type QFN package.

FIG. 4A to FIG. 4E are schematic sectional views for describing a method for manufacturing the semiconductor device of FIG. 2 in order of process.

To manufacture the semiconductor device 1A, for example, first, a lead frame 20A that includes a plurality of units each integrally having a die pad 3A and electrode leads 4A is prepared. In FIG. 4A to FIG. 4E, an entire view of the lead frame 20A is abbreviated and the die pad 3A and electrode leads 4A of just a single unit necessary for mounting a single semiconductor chip 2A are shown.

Next, a metal plating of Ag, etc., is applied to a top surface of the lead frame 20A by a plating method. The pad plating layer 11A and the lead plating layer 14A are thereby formed at the same time.

Figure 4A:
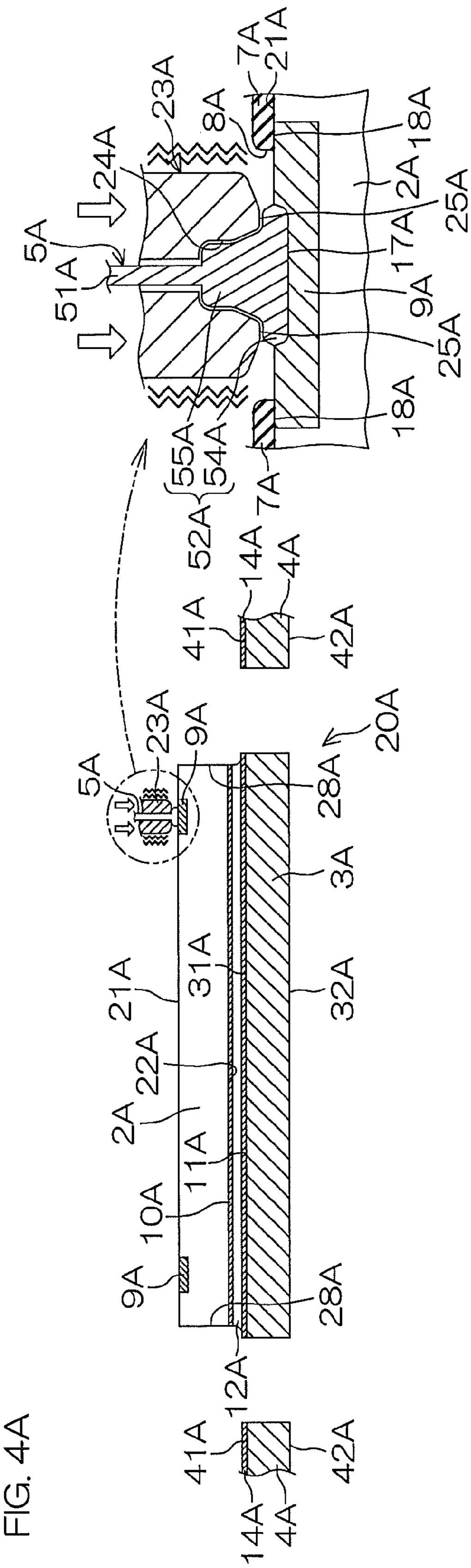
FIG. 4A is a schematic sectional view for describing a method for manufacturing the semiconductor device of FIG. 2.

Next, as shown in FIG. 4A, the semiconductor chips 2A are die bonded via the bonding material 12A to all die pads 3A on the lead frame 20A. An FAB (free air ball) is then formed on a tip portion (one end portion) of a bonding wire 5A, held by a capillary 23A of a wire bonder (not shown), by application of a current to the tip portion. The capillary 23A then moves to a position directly above an electrode pad 9A and descends so that the FAB contacts the electrode pad 9A. In this process, a load (open arrows in FIG. 4A) and ultrasonic waves (zigzag lines in FIG. 4A) are applied from the capillary 23A to the FAB and the FAB is thereby deformed according to a shape of a chamfer 24A of the capillary 23A. The one end portion of the bonding wire 5A is thereby bonded as the pad bond portion 52A to the electrode pad 9A and a first bond is formed.

Figure 4B:
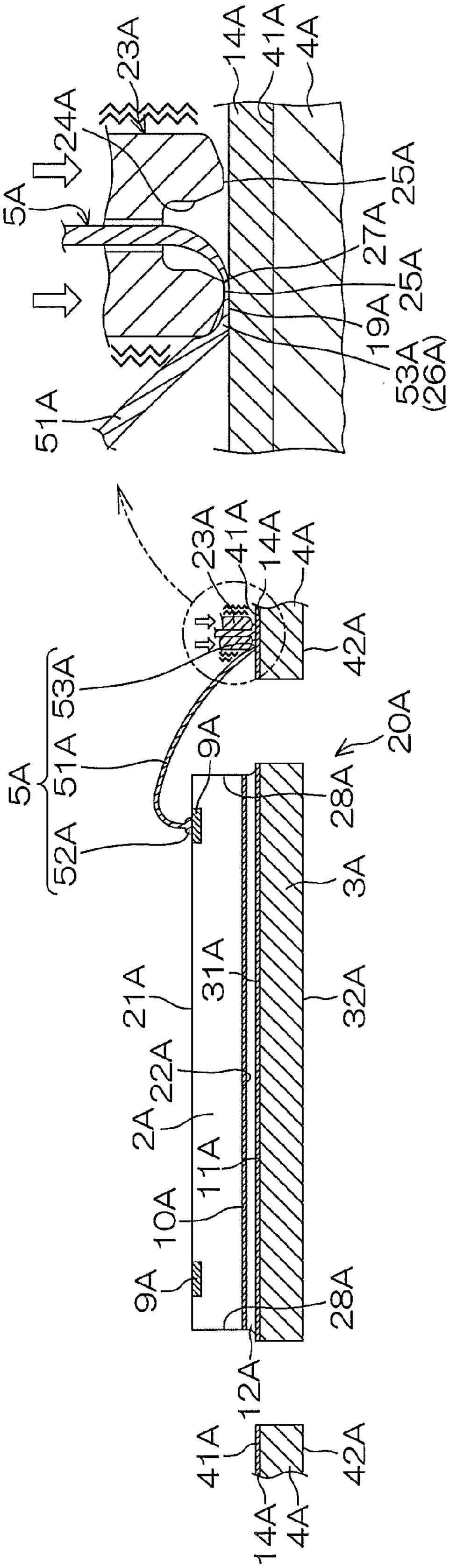
FIG. 4B is a diagram of a step subsequent to that of FIG. 4A.

After the first bond has been formed, the capillary 23A rises to a fixed height and moves to a position directly above an electrode lead 4A. Then, as shown in FIG. 4B, the capillary 23A descends again and the bonding wire 5A contacts the electrode lead 4A. In this process, a load (open arrows in FIG. 4B) and ultrasonic waves (zigzag lines in FIG. 4B) are applied from the capillary 23A to the bonding wire 5A so that the bonding wire 5A deforms according to a shape of a face 25A of the capillary 23A and is bonded to the electrode lead 4A (forming of a stitch bond 26A and a tail bond 27A).

The capillary 23A then rises and in a state where a tail of a fixed length is secured from a tip of the capillary 23A, the bonding wire 5A is broken from a position of the tail bond 27A. The other end of the bonding wire 5A bonded by the stitch bond 26 remains as the lead bond portion 53A on the electrode lead 4A and a second bond is thereby formed.

Figure 4C:
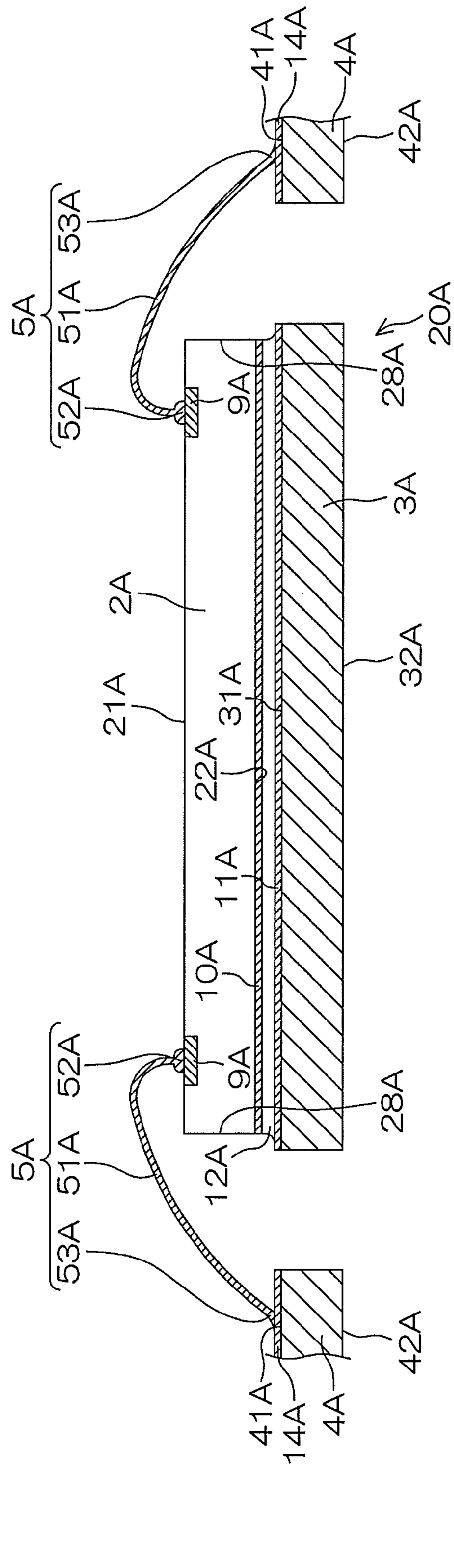
FIG. 4C is a diagram of a step subsequent to that of FIG. 4B.

Thereafter, as shown in FIG. 4C, the same process as that of FIG. 4B is performed so that the respective electrode pads 9A of all semiconductor chips 2A and the electrode leads 4A corresponding to the respective electrode pads 9A are connected by the bonding wires 5A.

After all of the wire bonding ends, an insulating material (silicon oxide, silicon nitride, etc.) is deposited by a CVD method onto each semi-finished semiconductor device 1A, including the semiconductor chip 2A, the bonding wires 5A, and the electrode leads 4A, under a temperature condition, for example, of 350 to 450° C. The water-impermeable insulating film 16A that integrally covers the entire top surface 21A and side surfaces 28A of the semiconductor chip 2A, the entire top surface 31A and side surfaces of the die pad 3A, the entire top surfaces 41A and side surfaces of the electrode leads 4A, and the entire bonding wires 5A is thereby formed.

The CVD method is not restricted in particular and, for example, a known CVD method, such as a thermal CVD method, plasma CVD method, may be applied.

Figure 4D:
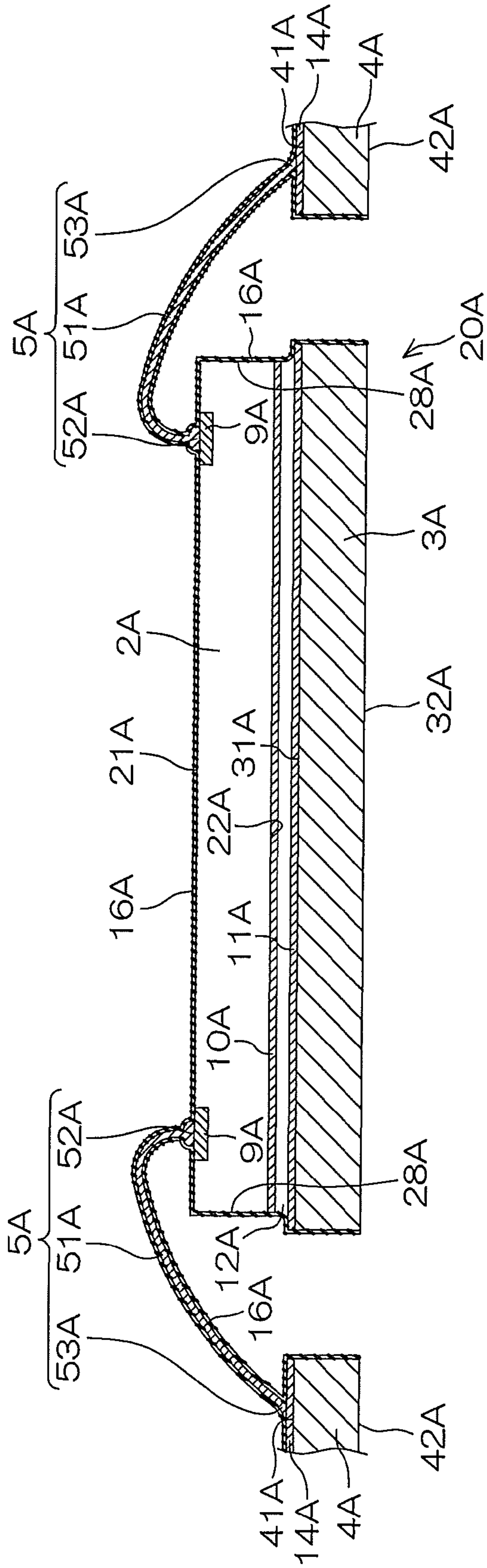
FIG. 4D is a diagram of a step subsequent to that of FIG. 4C.
Figure 4E:
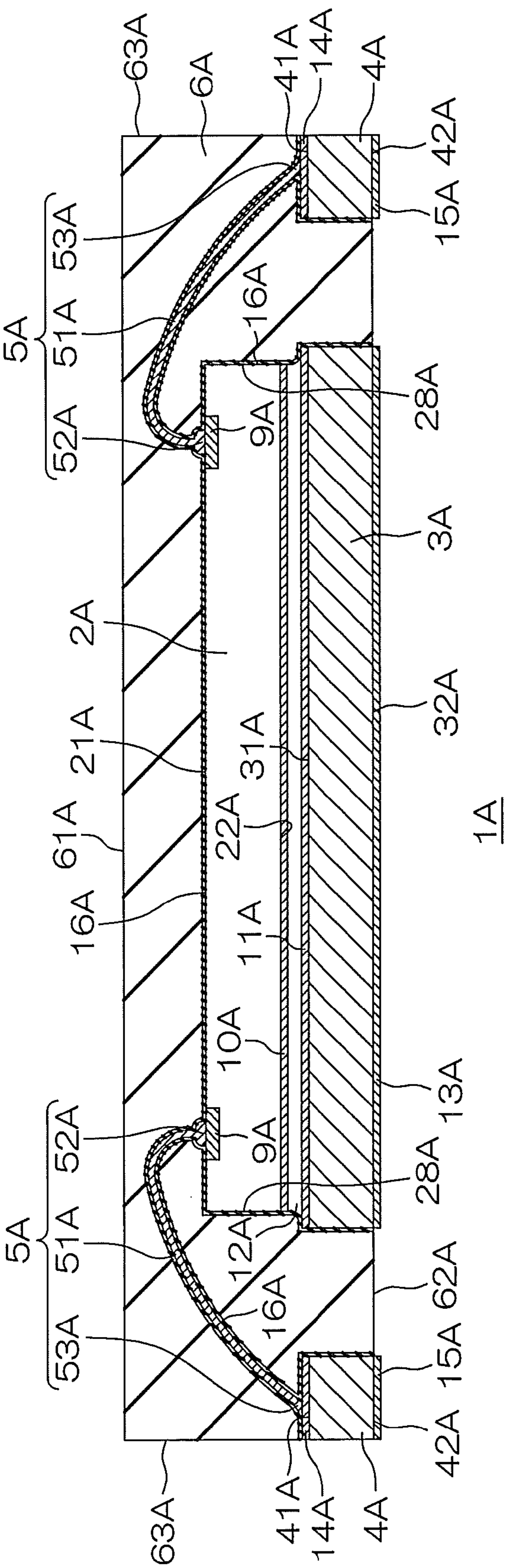
FIG. 4E is a diagram of a step subsequent to that of FIG. 4D.

Next, as shown in FIG. 4E, the lead frame 20A is set in a forming mold and all semiconductor chips 2A are sealed in a batch together with the lead frame 20A by the resin package 6A. Solder plating layers 13A and 15A are then formed on the rear surfaces 32A of the die pads 3A and the rear surfaces 42A of the electrode leads 4A that are exposed from the resin package 6A. Lastly, a dicing saw is used to cut the lead frame 20A together with the resin package 6A to sizes of the respective semiconductor devices 1A and the individual semiconductor devices 1A one of which is shown in FIG. 1 and FIG. 2 are thereby obtained.

As described above, with the semiconductor device 1A, the entire top surface 21A of the semiconductor chip 2A, the entire top surface 31A of the die pad 3A, the entire top surfaces 41A of the electrode leads 4A, and the entire bonding wires 5A are covered by the integral water-impermeable insulating film 16A.

The periphery edge of the bond interface (pad bond interface 17A) of each electrode pad 9A and pad bond portion 52A and the periphery edge of the bond interface (protective film lamination interface 18A) of each electrode pad 9A and the top surface protective film 7A are thereby covered by the water-impermeable insulating film 16A without any exposure whatsoever.

Thus, even if water penetrates into an interior of the resin package 6A, the water can be blocked by the water-impermeable insulating film 16A and contact of the pad bond interfaces 17A with water can be suppressed. Consequently, progress of corrosion of the electrode pads 9A can be suppressed and occurrence of electrically open states between pads and wires (electrically open states at the first bonds) can be suppressed. Connection reliability of the semiconductor device 1A can thus be improved.

Especially, in a thin package, such as the semiconductor device 1A, the pad bond portions 52A on the semiconductor chip 2A tend to be exposed to water entering into an interior of the package from the top surface 61A of the resin package 6A. However, even with such a thin-package semiconductor device 1A, the connection reliability of the semiconductor device 1A can be improved effectively by the water-impermeable insulating film 16A.

Specifically, an electrically open state at a first bond is considered to occur by the following process.

For example, water (water vapor) may enter into the interior of the resin package 6A through a gap between the resin package 6A and the die pad 3A or an electrode lead 4A, etc., while a PCT, HAST, or other humidity resistance evaluation test is being performed.

Meanwhile, at each pad bond interface 17A, a difference between an ionization tendency of Al contained in the material of the electrode pad 9A and an ionization tendency of Cu of the bonding wire 5A causes a voltaic cell, with the electrode pad 9A containing the Al of higher ionization tendency as an anode and the bonding wire 5A containing the Cu of lower ionization tendency as a cathode, to be formed.

When water contacts a pad bond interface 17A, a minute current flows between the electrode pad 9A and the bonding wire 5A so that a reaction in which the Al of the electrode pad 9A ionizes and supplies an electron to the Cu of the bonding wire 5A is promoted, thereby promoting corrosion of the electrode pad 9A.

On the other hand, with the semiconductor device 1A, even if water penetrates into the interior of the resin package 6A, contact of the penetrating water with the pad bond interfaces 17A can be suppressed reliably as described above and progress of corrosion of the electrode pad 9A can thus be suppressed.

Also, with the semiconductor device 1A, the periphery edge of the bond interface (lead bond interface 19A) of each electrode lead 4A and the lead bond portion 53A is covered by the water-impermeable insulating film 16A without any exposure whatsoever. Thus, even if water penetrates into the interior of the resin package 6A, the water can be blocked by the water-impermeable insulating film 16A and contact of the lead bond interfaces 19A with water can be suppressed. Consequently, the reliability of lead-wire connections can be maintained.

Also, the film that prevents the permeation of water is an insulating film and thus even if a metal portion besides the electrode pads 9A is exposed at the top surface 21A of the semiconductor chip 2A, the metal portion is covered by the water-impermeable insulating film 16A that covers the entire chip top surface 21A. Contact of the metal portion with the water penetrating into the interior of the resin package 6A can thus be suppressed. Consequently, corrosion of the metal portion can be suppressed. Also, mutual electrical insulation among such metal members as the metal portion, the electrode pads 9A, and the bonding wires 5A can be secured.

Further, in forming the water-impermeable insulating film 16A, the CVD method, which is a conventionally proven thin film forming technique, is used. The water-impermeable insulating film 16A can thus be formed easily.

Also, the CVD method is excellent in step covering property and thus even if the form of bonding of the electrode pad 9A with the pad bond portion 52A is complex, the water-impermeable insulating film 16A can be formed uniformly by suitably controlling the film forming conditions.

Also, in a case where the water-impermeable insulating film 16A is formed by a thermal CVD method, the low directionality of the thermal CVD method enables the water-impermeable insulating film 16A to wrap around even to a rear surface side of the bonding wire 5A that is hidden due to overlapping of the bonding wire 5A and the electrode lead 4*a* in plan view as shown in FIG. 3B. Consequently, entire bonding wires 5A can be covered more easily.

Also, the film forming conditions can be controlled to easily increase the thickness of the water-impermeable insulating film 16A. By increasing the thickness of the water-impermeable insulating film 16A, impacts transmitted to the electrode pads 9A and the pad bond portions 52A can be relaxed. Consequently, occurrence of cracks at the electrode pads 9A and the pad bond portions 52A can be suppressed.

Figure 5:
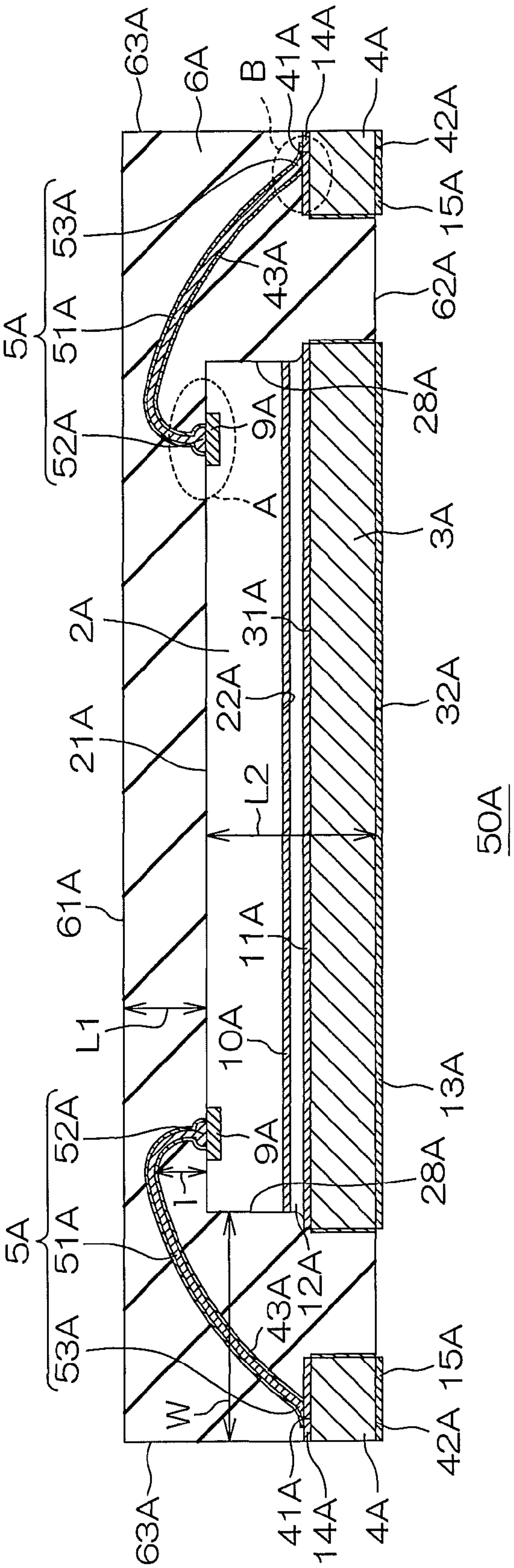
FIG. 5 is a schematic sectional view of a semiconductor device according to a modification example of the semiconductor device of FIG. 2.
Figure 6A:
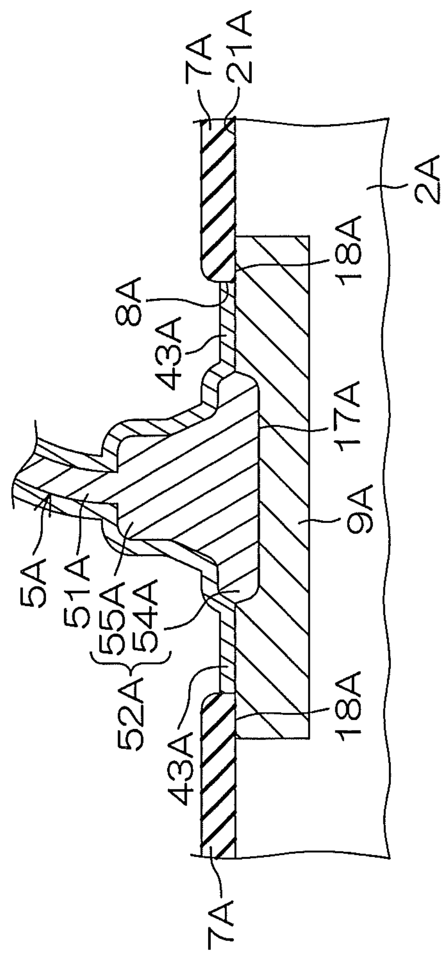
FIG. 6A is an enlarged view of principal portions of a portion surrounded by a broken-line circle A in FIG. 5.
Figure 6B:
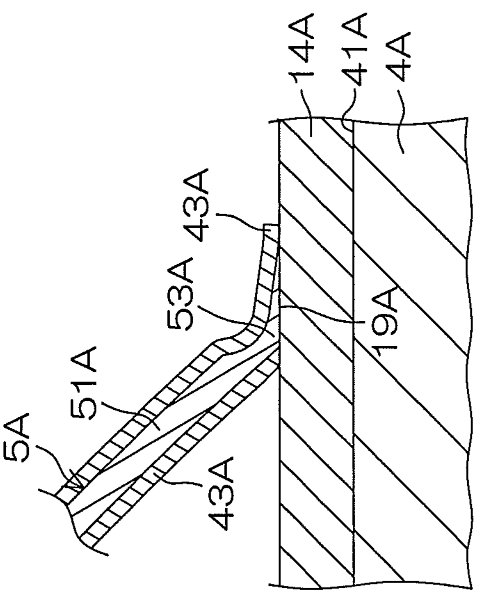
FIG. 6B is an enlarged view of principal portions of a portion surrounded by a broken-line circle B in FIG. 5.

FIG. 5 is a schematic sectional view of a semiconductor device according to a modification example of the semiconductor device shown in FIG. 2. FIG. 6A is an enlarged view of principal portions of a portion surrounded by a broken-line circle A in FIG. 5. FIG. 6B is an enlarged view of principal portions of a portion surrounded by a broken-line circle B in FIG. 5. In FIG. 5, and FIGS. 6A and 6B, portions corresponding to respective portions shown in FIG. 1 to FIGS. 3A and 3B are provided with the same reference symbols as the respective portions. Also, detailed description concerning portions provided with the same reference symbols shall be omitted in the following description.

With the semiconductor device 50A, entire electrode pads 9A, entire side surfaces of the die pad 3A, entire side surfaces of the electrode leads 4A inside the resin package 6A, and entire bonding wires 5A are covered by an integral water-impermeable metal film 43A.

The water-impermeable metal film 43A is made of a metal material capable of preventing the permeation of water and is made, for example, of nickel or palladium, etc., and is preferably made of nickel. The water-impermeable metal film 43A is thinner than the top surface protective film 7A and is, for example, 0.5 to 3 μm thick.

As shown in FIG. 6A, in the vicinity of the pad bond portion 52A of each bonding wire 5A, the water-impermeable metal film 43A does not cover the top surface of the top surface protective film 7A but integrally covers the entire electrode pad 9A that protrudes to the outer side of the pad bond portion 52A in plan view and the entire top surface of the pad bond portion 52A. The periphery edge of the bond interface (pad bond interface 17A) of the electrode pad 9A and the pad bond portion 52A is thereby covered by the water-impermeable metal film 43A without any exposure whatsoever.

Meanwhile, as shown in FIG. 6B, in the vicinity of the lead bond portion 53A of each bonding wire 5A, the water-impermeable metal film 43A integrally covers the entire top surface 41A (lead plating layer) of the electrode lead 4A and the entire top surface of the lead bond portion 53A. The periphery edge of the bond interface (lead bond interface 19A) of the electrode lead 4A and the lead bond portion 53A is thereby covered by the water-impermeable metal film 43A without any exposure whatsoever.

Arrangements besides the above are the same as those of the first preferred embodiment described above.

FIG. 7A to FIG. 7E are schematic sectional views for describing a method for manufacturing the semiconductor device of FIG. 5 in order of process.

Figure 7A:
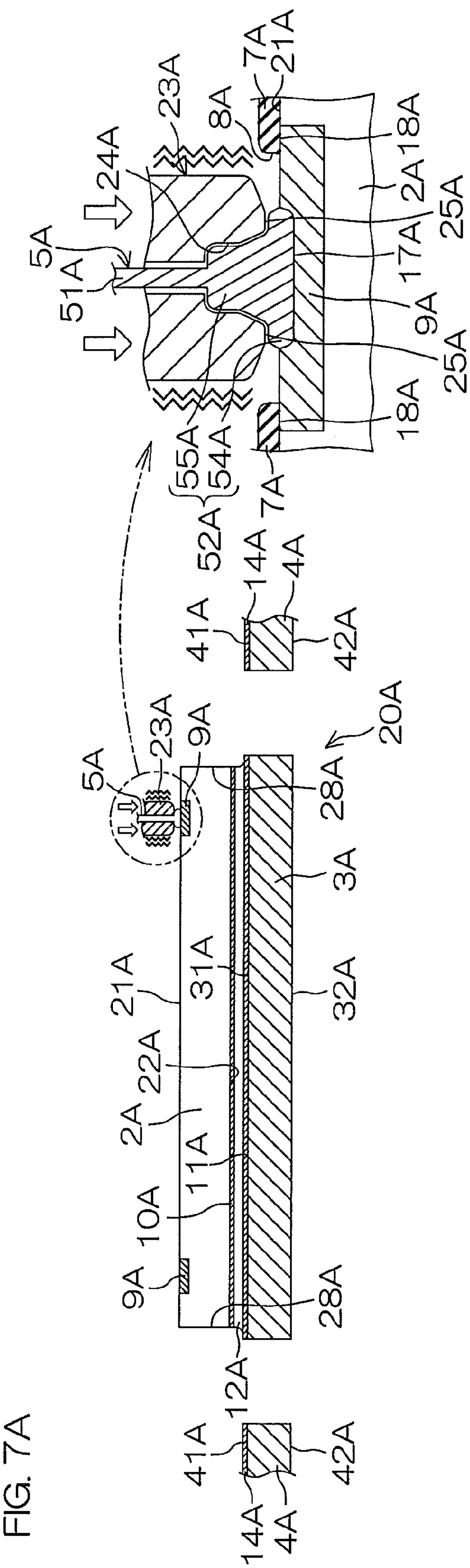
FIG. 7A is a schematic sectional view for describing a method for manufacturing the semiconductor device of FIG. 5.
Figure 7B:
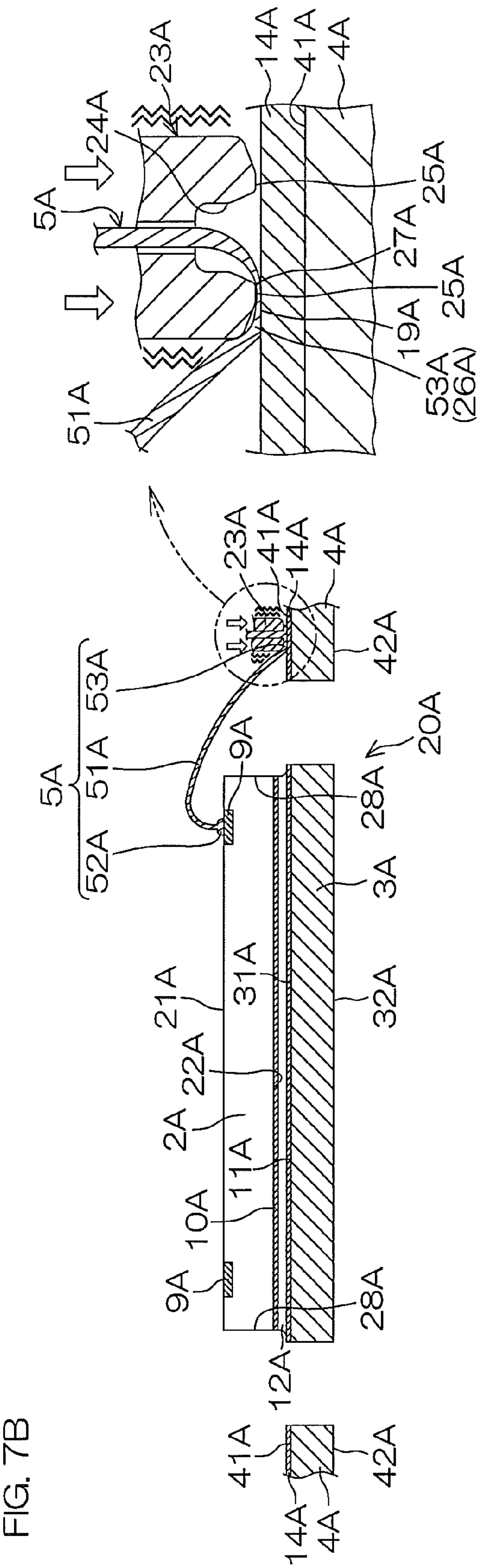
FIG. 7B is a diagram of a step subsequent to that of FIG. 7A.
Figure 7C:
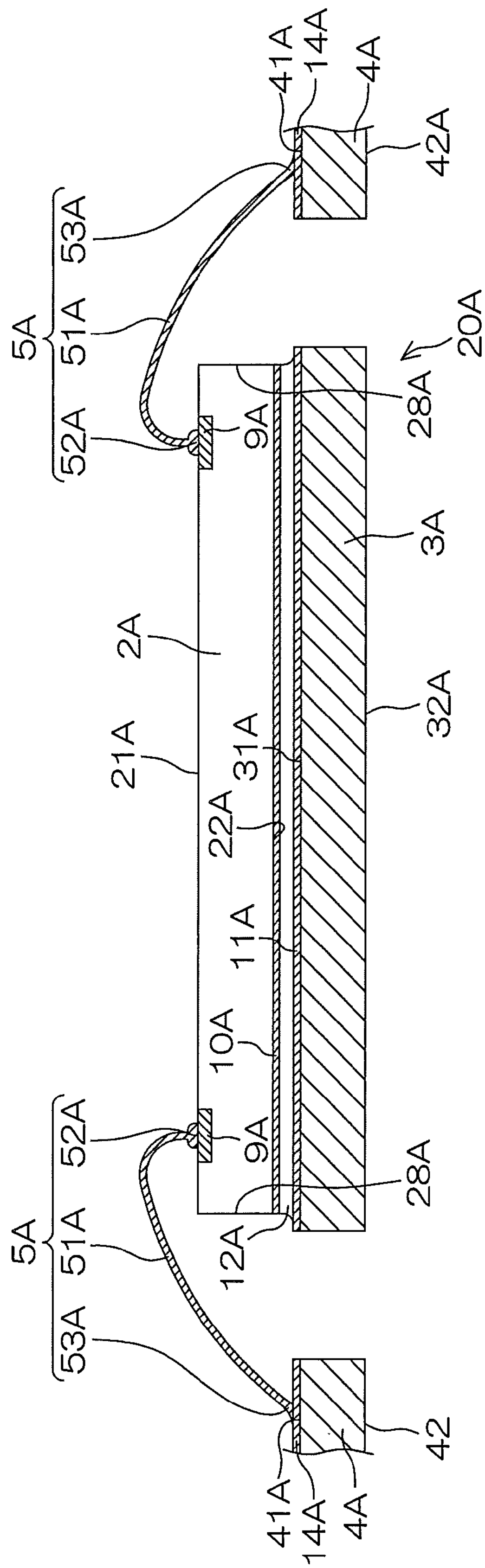
FIG. 7C is a diagram of a step subsequent to that of FIG. 7B.
Figure 7D:
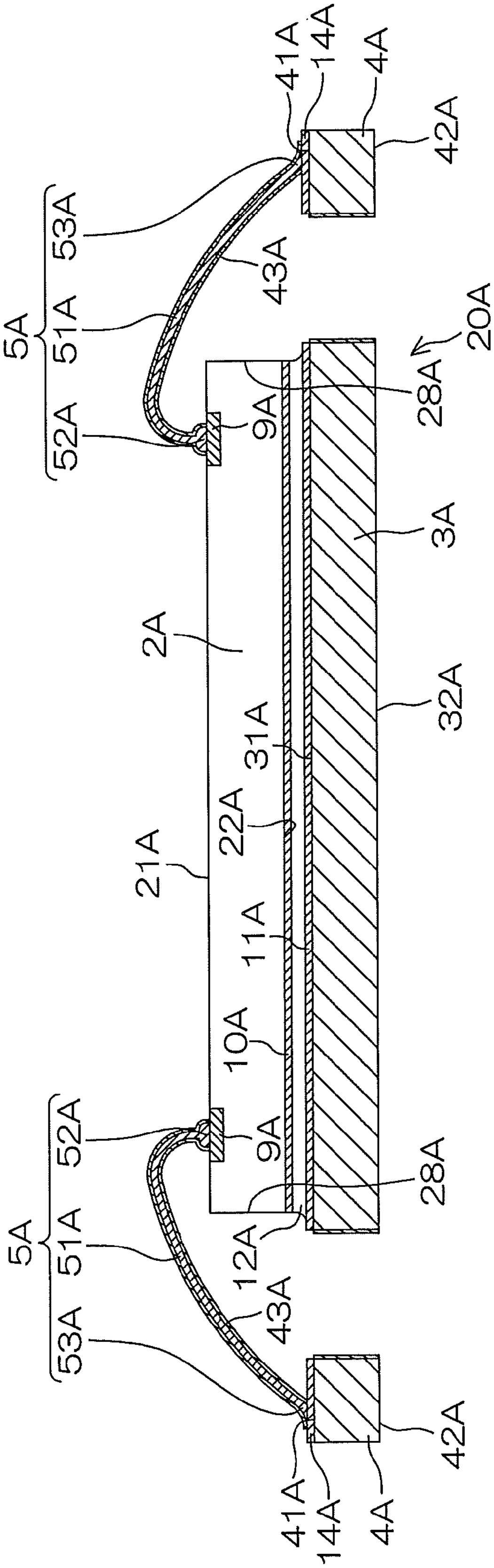
FIG. 7D is a diagram of a step subsequent to that of FIG. 7C.

As shown in FIG. 7A to 7C, the same processes as those of FIG. 4A to FIG. 4C are performed to die-bond the semiconductor chips 2A to all die pads 3A on the lead frame 20A, and the respective electrode pads 9A of all semiconductor chips 2A and the electrode leads 4A corresponding to the respective electrode pads 9A are connected by the bonding wires 5A.

After all of the wire bonding ends, plating of a metal material (nickel, palladium, etc.) is applied by an electroless plating method to exposed metal portions of each semi-finished semiconductor device 50A, including the electrode pads 9A, the bonding wires 5A, and the electrode leads 4A. The water-impermeable metal film 43A that integrally covers at least the portions made of Cu and Al, such as the entire electrode pads 9A, the entire side surfaces of the die pads 3A, the entire side surfaces of the electrode leads 4A inside the resin package 6A, and the entire bonding wires 5A is thereby formed.

Figure 7E:
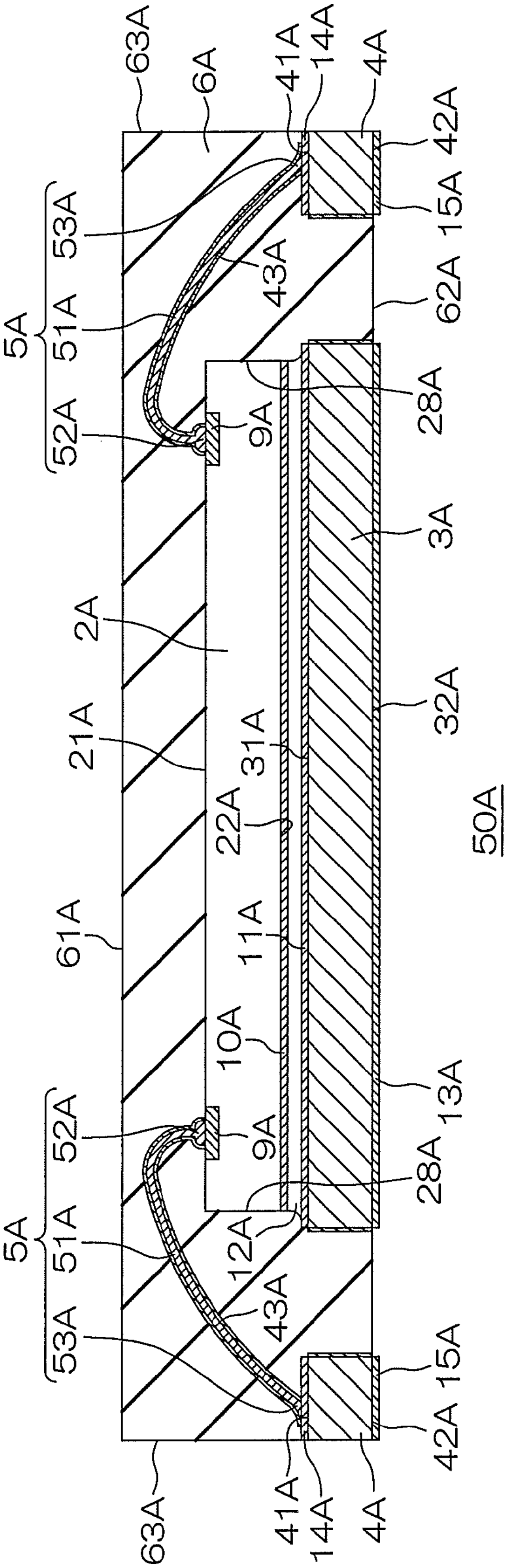
FIG. 7E is a diagram of a step subsequent to that of FIG. 7D.

Thereafter, as shown in FIG. 7E, the same process as that of FIG. 4E is performed. That is, all semiconductor chips 2A on the lead frame 20A are sealed in a batch by the resin package 6A and the lead frame 20A is cut together with the resin package 6A. The individual semiconductor devices 50A one of which shown in FIG. 5 are thereby obtained.

As described above, with the semiconductor device 50A, the entire electrode pads 9A, the entire side surfaces of the die pads 3A, the entire side surfaces of the electrode leads 4A inside the resin package 6A, and the entire bonding wires 5A are covered by the integral water-impermeable metal film 43A.

The periphery edge of the bond interface (pad bond interface 17A) of each electrode pad 9A and pad bond portion 52A is thereby covered by the water-impermeable metal film 43A without any exposure whatsoever.

Thus, even if water penetrates into the interior of the resin package 6A, the water can be blocked by the water-impermeable metal film 43A and contact of the pad bond interfaces 17A with water can be suppressed. Consequently, progress of corrosion of the electrode pads 9A can be suppressed and occurrence of electrically open states between pads and wires (electrically open states at the first bonds) can be suppressed. Connection reliability of the semiconductor device 50A can thus be improved.

Also, with the semiconductor device 50A, the periphery edge of the bond interface (lead bond interface 19A) of each electrode lead 4A and the lead bond portion 53A is covered by the water-impermeable metal film 43A without any exposure whatsoever. Thus, even if water penetrates into an interior of the resin package 6A, the water can be blocked by the water-impermeable metal film 43A and contact of the lead bond interfaces 19A with water can be suppressed. Consequently, the reliability of lead-wire connections can be maintained.

Also, the film that prevents the permeation of water is a metal film, and although depending on the type of material used, an alloy can thus be formed at an interface between the electrode pad 9A and/or bonding wire 5A and the water-impermeable metal film 43A. The water-impermeable metal film 43A can be improved in covering property by the forming of the alloy. In particular, a nickel film is an effective protective material against chemical corrosion and is low in cost. Further, aluminum readily forms an alloy with copper. Thus, by using a nickel film, the water-impermeable metal film 43A of excellent covering property can be formed at low cost.

Although the first preferred embodiment of the present invention has been described above, the first preferred embodiment may also be modified as follows.

Figure 8:
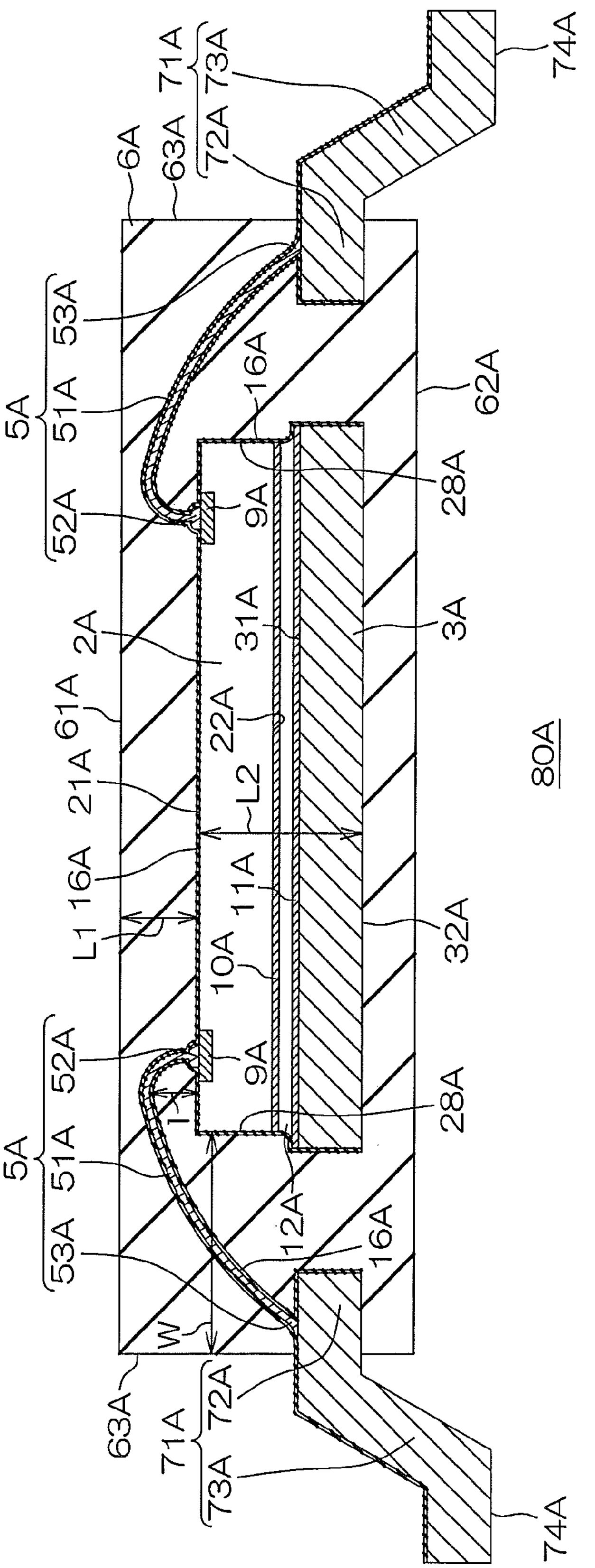
FIG. 8 is a schematic sectional view of a semiconductor device according to a modification example of the semiconductor device of FIG. 2.
Figure 9:
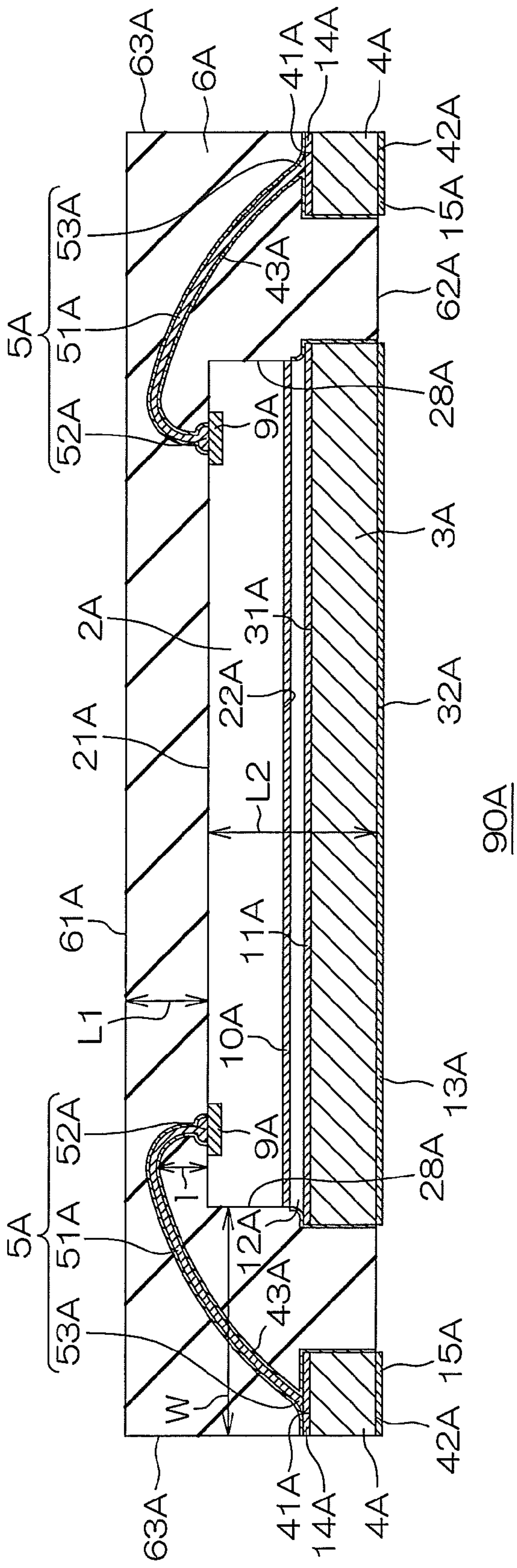
FIG. 9 is a schematic sectional view of a semiconductor device according to a modification example of the semiconductor device of FIG. 2.

For example, although a QFN type semiconductor device was taken up in the above description of the preferred embodiment, the present invention may also be applied, for example, to a QFP (quad flat package) type semiconductor device 80A such as shown in FIG. 8 (in FIG. 8, 71A indicates an electrode lead 71A that integrally includes an inner lead 72A sealed by the resin package 6A and an outer lead 73A exposed from the resin package 6A). In this case, a mask is preferably applied to a rear surface 74A of the outer lead 73A to prevent deposition of insulation material on the rear surface 74A of the outer lead 73A during execution of the CVD method. Besides this, the present invention may also be applied to semiconductor devices of other package types such as SOP (small outline package).

Also, the water-impermeable insulating film 16A may be formed using a spin coating method or other thin film forming technique besides the CVD method mentioned above.

Also, the water-impermeable insulating film 16A may integrally cover just the entire top surfaces of the electrode pads 9A and the entire top surfaces of the pad bond portions 52A. To form such a water-impermeable insulating film 16A, for example, an insulating material is dripped onto the pad bond portions 52A by a known potting technique or other method after all of the wire bonding is ended.

Also, although with the above-described preferred embodiment, a case where the water-impermeable metal film 43A is formed by the electroless plating method was taken up, the water-impermeable metal film 43A may be formed by an electroplating method instead. For example, if, in a case where the bonding material 12A is made of a conductive paste, the water-impermeable metal film 43A is formed by the electroplating method, side surfaces of the bonding material 12A and the top surfaces 41A of the electrode leads 4A will also be covered by the water-impermeable metal film 43A as in a semiconductor device 90A shown in FIG. 9.

On the other hand, in a case where the bonding material 12A is made of an insulating paste, although the water-impermeable metal film 43A will be formed on the top surfaces 41A of the electrode leads 4A, it will not be formed on the side surfaces of the bonding material 12A.

Second Preferred Embodiment FIG. 10 to FIG. 17

By disclosure of a second preferred embodiment, a second issue concerning a second background art described below can be resolved in addition to the issues described above in the "OBJECT(S) OF THE INVENTION."

(1) Second Background Art

Semiconductor devices are normally distributed in a state where a semiconductor chip is sealed (packaged) together with bonding wires by a resin. Inside the package, electrode pads of the semiconductor chip are electrically connected by the bonding wires to electrode leads that are partially exposed from the resin package. Thus, by connecting the electrode leads as external terminals to wirings on a mounting board, electrical connection of the semiconductor chip and the mounting board is achieved.

Figure 16:
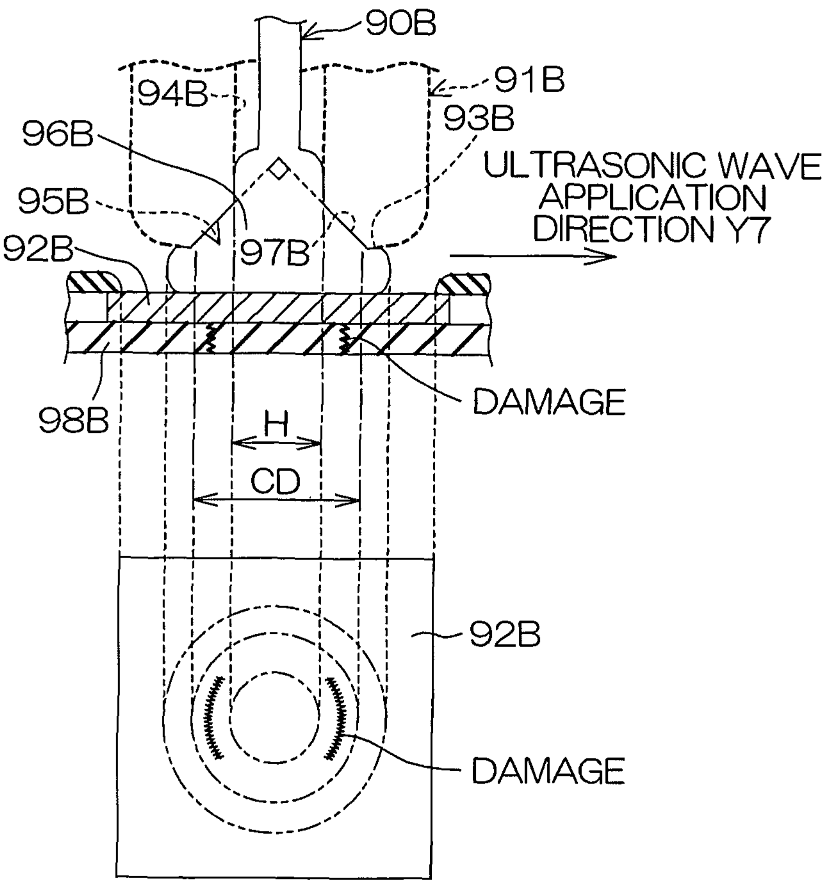
FIG. 16 is an enlarged view of principal portions of a first bond portion in a conventional semiconductor device.

Each bonding wire is connected to each of an electrode pad and an electrode lead using, for example, a wire bonder (not shown) that includes a capillary 91B shown in FIG. 16. The capillary 91B has a substantially cylindrical shape with a straight hole 94B, through which the bonding wire 90B is inserted, formed at a center, and during wire bonding, the bonding wire 90B is fed out from a tip of the straight hole 94B.

A face portion 93B, which has an annular shape in plan view and is substantially perpendicular to a longitudinal direction of the straight hole 94B, and a chamfer portion 95B, which is recessed in the longitudinal direction of the straight hole 94B from the face portion 93B, are formed at a tip portion of the capillary 91B. A side surface 97B of the chamfer portion 95B is formed to a conical surface and a cross-sectional shape thereof extends rectilinearly from an inner circumferential circle of the face portion 93B to a circumferential surface of the straight hole 94B.

To form each first bond, which is a bond of a bonding wire and an electrode pad, first, a current is applied to a tip portion of the bonding wire 90B held by the capillary 91B and the wire material is melted by the heat of the resulting spark. The molten wire material becomes an FAB (free air ball) due to surface tension.

Next, the capillary 91B moves to a position directly above an electrode pad 92B and thereafter descends so that the FAB contacts the electrode pad 92B. In this process, ultrasonic waves are applied to the FAB along a Y7 direction (hereinafter, "ultrasonic wave application direction Y7") while a load is applied to the FAB by the capillary 91B.

A portion of the FAB is thereby made to spread below the face portion 93B while another portion is pushed inside the straight hole 94B and a remaining portion remains inside the chamfer portion 95B. A first bond portion 96B of humped shape in sectional view is thereby formed in accordance with the shape of the tip of the capillary 91B.

(2) Second Issue

However, in a case where the cross-sectional shape of the side surface 97B of the chamfer portion 95B extends rectilinearly as in the capillary 91B shown in FIG. 16, the side surface 97B of the chamfer portion 95B forms corners with the circumferential surface of the straight hole 94B and the end surface of the face portion 93B. Thus, during bonding of the bonding wire 90B, stress in a direction along the ultrasonic wave application direction Y7 may concentrate at specific locations of portions of the first bond portion 96B inside the chamfer portion 95B (specifically, portions between planar projection curves of a hole diameter H and a chamfer diameter CD of the capillary 91B).

Thus, in the electrode pad 92B and an interlayer insulating film 98B below it, stress may concentrate and cause the interlayer insulating film 98B to crack and become damaged at portions directly below the stress concentration locations of the first bond portion 96B. Specifically, flaws that face each other in the ultrasonic wave application direction Y7 occur at portions between the planar projection curves of the hole diameter H and the chamfer diameter CD of the capillary 91B in the interlayer insulating film 98B in a state where the bonding wire 90B is removed (see figure at lower side of FIG. 16).

Thus, a second object of the present invention related to the second preferred embodiment is to provide a semiconductor device and a method for manufacturing the semiconductor device, with which, in connecting an electrode pad and a bonding wire, stress applied to the electrode pad is relaxed to enable suppression of occurrence of damage below the electrode pad.

(3) Disclosure of a Specific Preferred Embodiment

Figure 10:
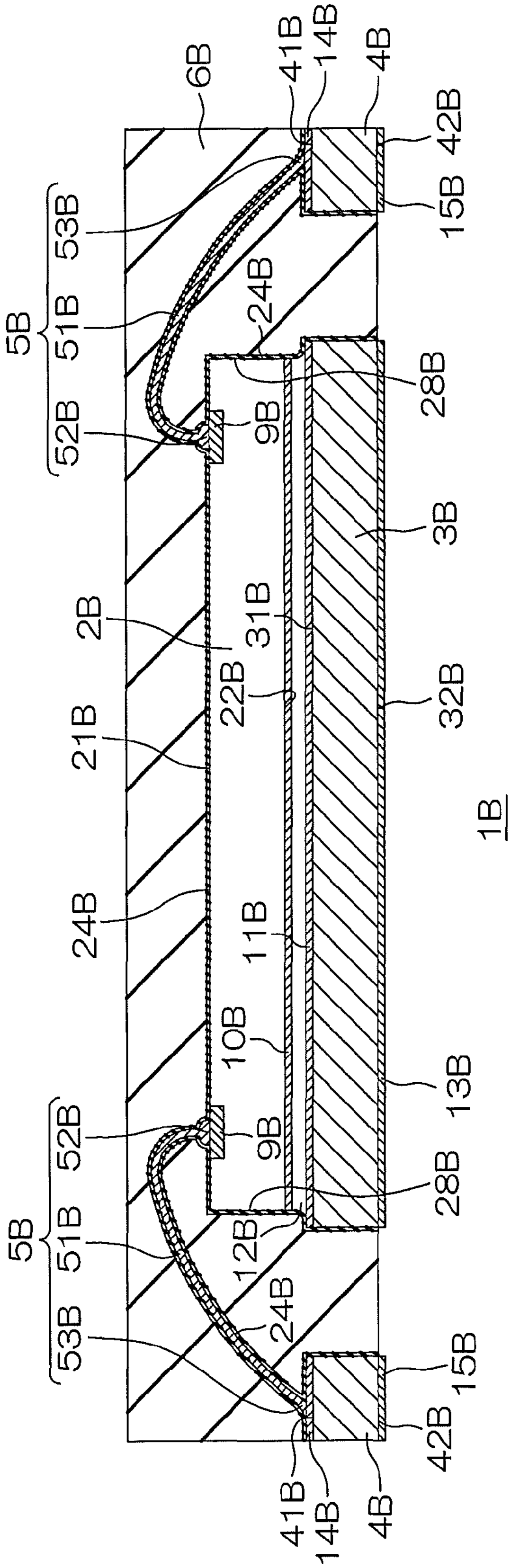
FIG. 10 is a schematic sectional view of a semiconductor device according to a second preferred embodiment of the present invention.
Figure 11:
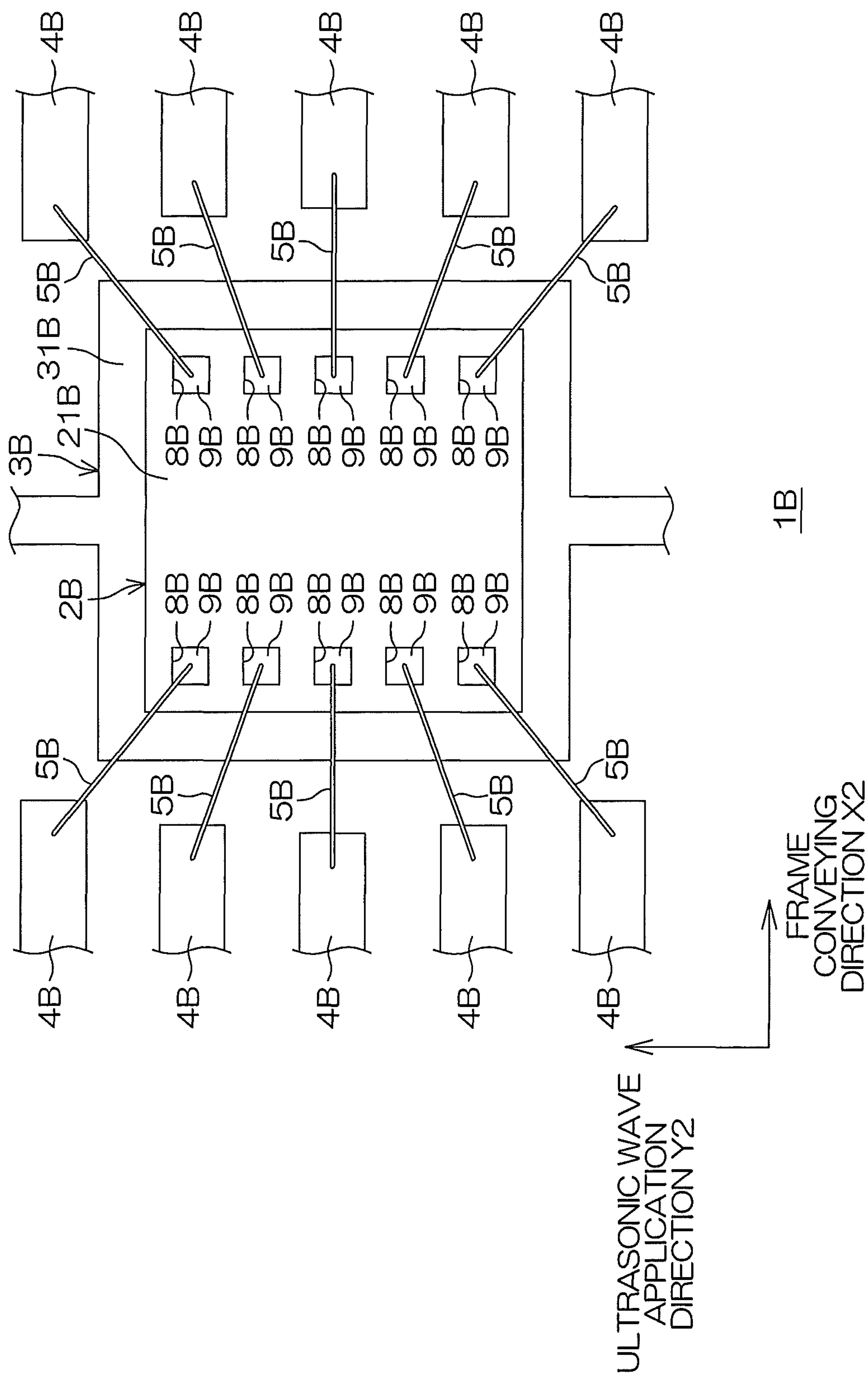
FIG. 11 is an exploded plan view of the semiconductor device of FIG. 10 with a resin package removed.
Figure 12A:
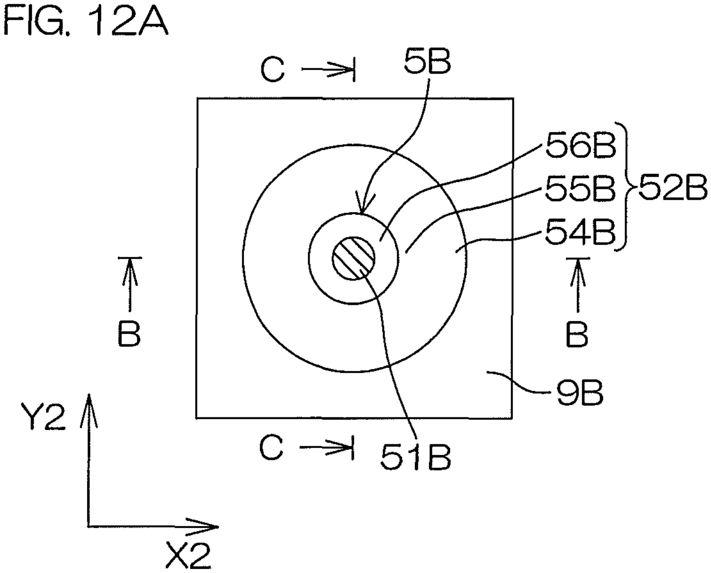
FIG. 12A is an enlarged view of a vicinity of an electrode pad of FIG. 11.
Figure 12B:
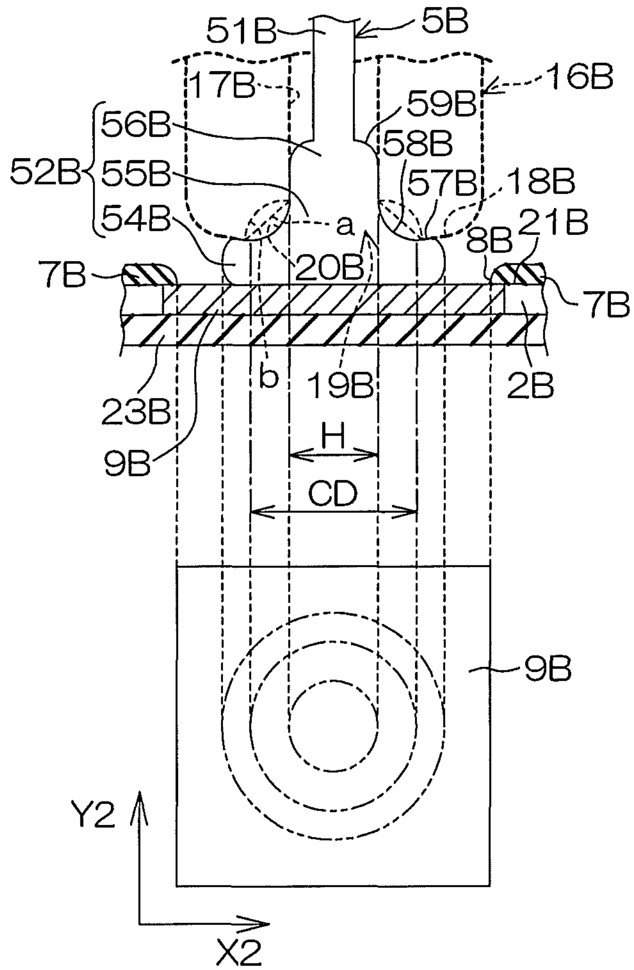
FIG. 12B is a sectional view taken along the sectioning line B-B of FIG. 12A.
Figure 12C:
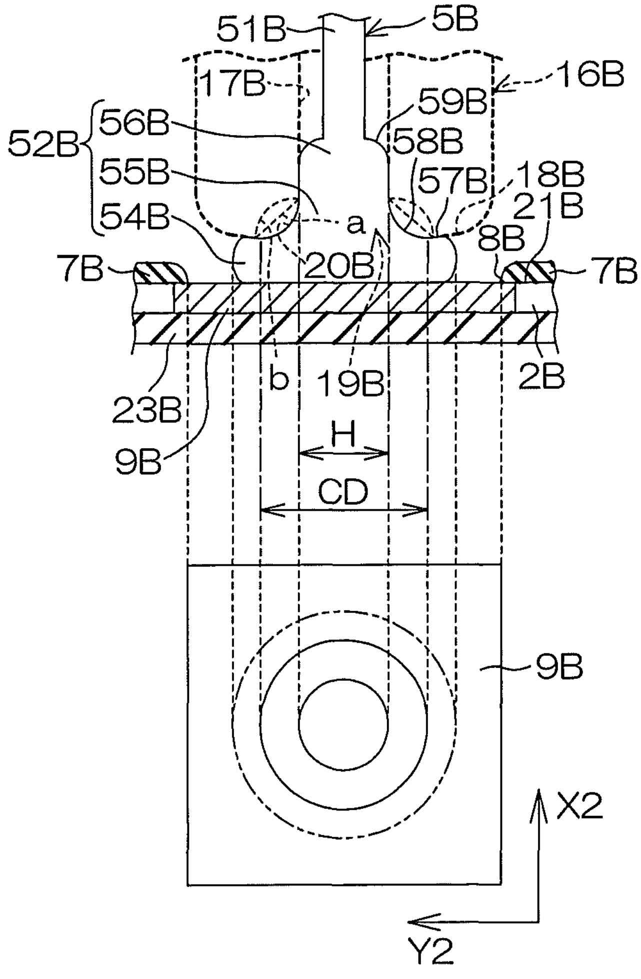
FIG. 12C is a sectional view taken along the sectioning line C-C of FIG. 12A.

FIG. 10 is a schematic sectional view of a semiconductor device according to the second preferred embodiment of the present invention. FIG. 11 is an exploded plan view of the semiconductor device of FIG. 10 with a resin package removed. FIG. 12A is an enlarged view of a vicinity of an electrode pad of FIG. 11. FIG. 12B is a sectional view taken along the sectioning line B-B of FIG. 12A. FIG. 12C is a sectional view taken along the sectioning line C-C of FIG. 12A. In FIG. 12B and FIG. 12C, a plan view of the electrode pad in a state where a bonding wire is removed is shown as a supplementary diagram.

The semiconductor device 1B is a semiconductor device to which an SON (small outline non-leaded) configuration is applied. The semiconductor device 1B includes a semiconductor chip 2B, a die pad 3B supporting the semiconductor chip 2B, a plurality of electrode leads 4B disposed at a periphery of the semiconductor chip 2B, bonding wires 5B electrically connecting the semiconductor chip 2B and the electrode leads 4B, and a resin package 6B sealing the above components.

The semiconductor chip 2B has a quadrilateral shape in plan view and has, for example, a multilayer wiring structure arranged by laminating a plurality of wiring layers via interlayer insulating films. The semiconductor chip 2B has a thickness, for example, of 220 to 240 μm (preferably, approximately 230 μm). As shown in FIG. 12, a top surface 21B (surface at one side in a thickness direction) of the semiconductor chip 2B is covered by a top surface protective film 7B.

A plurality of pad openings 8B for exposing an uppermost wiring layer of the multilayer wiring structure are formed in the top surface protective film 7B.

Each pad opening 8B has a quadrilateral shape in plan view and the same number thereof are provided at each of a pair of mutually opposing edge portions of the semiconductor chip 2B. The respective pad openings 8B are disposed at equal intervals along the edge portions. A portion of the wiring layer is exposed as an electrode pad 9B of the semiconductor chip 2B from each pad opening 8B.

The uppermost wiring layer exposed as the electrode pads 9B is made, for example, of a metal material containing Al (aluminum) and is specifically made of a metal material having Al as a main component (for example, an Al—Cu alloy, etc.).

Below each electrode pad 9B is formed an interlayer insulating film 23B for insulating the uppermost wiring layer and a wiring layer (lower wiring layer) below the uppermost wiring layer.

Meanwhile, a rear surface metal 10B that contains, for example, Au, Ni, Ag, etc., is formed on a rear surface 22B (surface at the other side in the thickness direction) of the semiconductor chip 2B.

The die pad 3B is made, for example, of a metal thin plate (for example, Cu or 42 alloy (an alloy containing Fe-42% Ni) and has a larger quadrilateral shape (for example, approximately 2.7 mm square in plan view) than the semiconductor chip 2B in plan view. Also, the die pad 3B has a thickness of 190 to 210 μm (preferably, approximately 200 μm). A pad plating layer 11B that contains Ag, etc., is formed on a top surface 31B (surface at one side in the thickness direction) of the die pad 3B.

The semiconductor chip 2B and the die pad 3B are bonded to each other in a state where the rear surface 22B of the semiconductor chip 2B and the top surface 31B of the die pad 3B face each other as bond surfaces with a bonding material 12B interposed between the rear surface 22B and the top surface 31B. The semiconductor chip 2B is thereby supported by the die pad 3B in an orientation where the top surface 21B faces upward.

The bonding material 12B is made, for example, of solder paste or other conductive paste. As the bonding material 12B, an insulating paste, such as a silver paste, an alumina paste, may be applied, and in this case, the rear surface metal 10B and/or the pad plating layer 11B may be omitted. Also, in the state where the semiconductor chip 2B and the die pad 3B are bonded, a thickness of the bonding material 12B is, for example, 10 to 20 μm.

A rear surface 32B (surface at the other side in the thickness direction) of the die pad 3B is exposed from the resin package 6B. A solder plating layer 13B made, for example, of a metal material, such as tin (Sn), tin-silver alloy (Sn—Ag), is formed on the exposed other-side surface.

The electrode leads 4B are made of the same metal thin plate (containing, for example, Cu or 42 alloy (Fe-42% Ni, etc.) as the die pad 3B. The electrode leads 4B are disposed at the periphery of the semiconductor chip 2B, with the same number thereof being disposed at each of side surfaces, which, among the four side surfaces of die pad 3B, are disposed at both sides of a direction orthogonal to the two side surfaces at the sides at which the electrode pads 9B are disposed. The electrode leads 4B that face each side surface of the die pad 3B are disposed at equal intervals in a direction parallel to the facing side surface. A length of each electrode lead 4B in the direction of facing the die pad 3B is, for example, 240 to 260 μm (preferably, approximately 250 μm). A lead plating layer 14B that contains Ag, etc., is formed on a top surface 41B (surface at one side in the thickness direction) of each electrode lead 4B.

Meanwhile, a rear surface 42B (surface at the other side in the thickness direction) of each electrode lead 4B is exposed from the resin package 6B. A solder plating layer 15B made, for example, of a metal material, such as tin (Sn), tin-silver alloy (Sn—Ag), is formed on the exposed rear surface 42B.

Each bonding wire 5B is made, for example, of copper (for example, a high-purity copper of no less than 99.9999% (6N) purity or no less than 99.99% (4N) purity that may contain a minute amount of impurity), or gold, etc. Each bonding wire 5B includes a linearly-extending, cylindrical main body portion 51B and includes a pad bond portion 52B and a lead bond portion 53B formed at respective ends of the main body portion 51B and respectively bonded to an electrode pad 9B and an electrode lead 4B.

The main body portion 51B is curved parabolically upward from the one end at the electrode pad 9B side toward an outer side of the semiconductor chip 2B and made impingent at an acute angle at the other end on the top surface 41B of the electrode lead 4B.

The pad bond portion 52B is smaller than the electrode pad 9B in plan view. The pad bond portion 52B has a humped shape that integrally includes a substantially disk-shaped base portion 54B, which, at its other side in the thickness direction, contacts a top surface of the electrode pad 9B, a mesa portion 55B, which is an intermediate portion formed at the one side of the base portion 54, and a bell-shaped projecting portion 56B projecting from the one side of the mesa portion 55B and having a tip connected to the one end of the main body portion 51B.

A top surface (surface formed by an upper surface 57B of the base portion 54B, a side surface 58B of the mesa portion 55B, and a side surface 59B of the projecting portion 56B) of the humped-shape pad bond portion 52B is formed to a smooth shape without corners.

Specifically, the mesa portion 55B disposed at a middle of the pad bond portion 52B has the side surface 58B, which, in a section taken perpendicular to the electrode pad 9B, has a non-rectilinear cross-sectional shape that is curved at a uniform curvature across its entire periphery so as to bulge toward an interior of the pad bond portion 52B and thereby decrease in diameter toward one side thereof.

The projecting portion 56B at an upper side of the mesa portion 55B has the side surface 59B that is curved at a uniform curvature across its entire periphery so as to bulge toward an outer side of the pad bond portion 52B and thereby decrease in diameter toward one side thereof with a circular upper end of the mesa portion 55B as an inflection curve with respect to the side surface 58B of the mesa portion 55B.

The base portion 54B at a lower side of the mesa portion 55B has the planar upper surface 57B, an entire periphery of which is formed by a collection of tangents to a circular lower end of the mesa portion 55B.

The top surface of the pad bond portion 52 that is formed as a continuation of the surfaces 57B to 59B is thus formed to a smooth shape without corners.

The pad bond portion 52B of such a shape can be formed by a wire bonding method using, for example, a capillary 16B indicated by broken lines in FIG. 12 in a manufacturing process of the semiconductor device 1B.

In the manufacturing process of the semiconductor device 1B, a lead frame that includes a plurality of units each integrally having a die pad 3B and electrode leads 4B is conveyed in a X2 direction (hereinafter, "frame conveying direction X2" (the same applies in FIG. 12)) of FIG. 11, and mounting of the semiconductor chip 2B, wire bonding across the electrode pads 9B and the electrode leads 4B, and other processes are applied to the conveyed lead frame to manufacture the semiconductor device 1B.

In the wire bonding process, a wire bonder (not shown) including the capillary 16B is used.

The capillary 16B has a substantially cylindrical shape with a straight hole 17B, through which the bonding wire 5B is inserted, formed at a center, and during wire bonding, the bonding wire 5B is fed out from a tip of the straight hole 17B.

A face portion 18B, which is substantially perpendicular to a longitudinal direction of the straight hole 17B and, in plan view, has an annular shape concentric to the straight hole 17B, and a chamfer portion 19B, which is recessed in the longitudinal direction of the straight hole 17B from the face portion 18B, are formed at a tip portion of the capillary 16B.

A side surface 20B of the chamfer portion 19B is formed to a non-rectilinear curve in sectional view that bulges toward an interior of the straight hole 17B at a uniform curvature across its entire circumference from an inner circumferential circle of the face portion 18B to a circumferential surface of the straight hole 17B.

To form the pad bond portion 52B using the capillary 16B, for example, a current is first applied to the tip portion (one end portion) of the bonding wire 5B held by the capillary 16B to form an FAB (free air ball) at the tip portion.

Next, the capillary 16B moves to a position directly above an electrode pad 9B and thereafter descends while maintaining parallelism of the electrode pad 9B and the face portion 18B so that the FAB contacts the electrode pad 9B. In this process, ultrasonic waves are applied to the FAB along a Y2 direction (hereinafter, "ultrasonic wave application direction Y2" (the same applies in FIG. 12)) orthogonal to the frame conveying direction X2 while a load is applied to the FAB by the capillary 16B, and a portion of the FAB is thereby made to spread below the face portion 18B to form the base portion 54B while another portion is pushed inside the straight hole 17B to form the projecting portion 56B. The mesa portion 55B is formed by the remaining portion that remains inside the chamfer portion 19B. The one end portion of the bonding wire 5B is thereby bonded as the pad bond portion 52B to the electrode pad 9B and a first bond is formed.

With the pad bond portion 52B formed using the capillary 16B, the mesa portion 55B is formed according to the shape of the side surface 20B of the chamfer portion 19B, and thus the side surface 58B of the mesa portion 55B is formed so that a cross-sectional shape when a section is taken along the ultrasonic wave application direction Y2 is that depicted by line-symmetrical hyperbolic curves (curves) having a normal to the electrode pad 9B as a symmetry axis.

The lead bond portion 53B has a wedge-like shape in sectional view that is relatively thick at the one end side close to the main body portion 51B and becomes relatively thin toward the other end side away from the main body portion 51B.

As in the first preferred embodiment, in the semiconductor device 1B, the entire top surface 21B and side surfaces 28B of the semiconductor chip 2B, the entire top surface 31B and side surfaces of the die pad 3B, the entire top surfaces 41B and side surfaces inside the resin package 6B of the electrode leads 4B, and the entire bonding wires 5B are covered by an integral water-impermeable insulating film 24B.

As the resin package 6B, a known material, such as an epoxy resin, may be applied. The resin package 6B makes up an outer shape of the semiconductor device 1B and is formed to a substantially rectangular parallelepiped shape. In terms of size, the resin package 6B has a planar size, for example, of approximately 4 mm square and a thickness, for example, of 0.60 to 0.70 mm and preferably, approximately 0.65 mm.

As described above, with the semiconductor device 1B, the pad bond portion 52B of the bonding wire 5B is formed using the capillary 16B that has the chamfer portion 19B having the side surface 20B (curved surface) that bulges toward an interior of the straight hole 17B. The side surface 58B of the mesa portion 55B of the pad bond portion 52B is thereby formed so that a cross-sectional shape when a section is taken along the ultrasonic wave application direction Y2 is that depicted by line-symmetrical hyperbolic curves (curves) having a normal to the electrode pad 9B as a symmetry axis.

For example, if in the pad bond portion 52B, the side surface of the portion formed in accordance with the shape of the chamfer portion 19B of the capillary 16B is a flat surface indicated by broken line a in FIG. 12 or a curved surface indicated by broken lines b that bulges outward of the pad bond portion 52B, stress may concentrate at specific locations of the mesa portion 55B.

On the other hand, with a curved surface such as the side surface 58B that bulges toward an interior of the pad bond portion 52B, stress applied to the mesa portion 55B of the pad bond portion 52B during the forming of the pad bond portion 52B can be dispersed across the entire side surface 58B of the mesa portion 55B and prevented from concentrating at specific locations of the mesa portion 55B. Consequently, stress applied to the electrode pad 9B can be relaxed and occurrence of damage in the interlayer insulating film 23B below the electrode pad 9B can be suppressed. That is, as shown in FIG. 12B and FIG. 12C, with the semiconductor device 1B, notable damage does not occur at the interlayer insulating film 23B in the state where the bonding wire 5B is removed.

Also, the side surface 58B of the mesa portion 55B is formed as a curved surface that is curved at a uniform curvature across its entire circumference and thus stress applied to the mesa portion 55B can be dispersed efficiently across the entire side surface 58B of the mesa portion 55B. Stress applied to the electrode pad 9B can thus be relaxed further.

In consideration of a case where the bonding wire 5B is made of copper, the load and ultrasonic waves applied in forming the pad bond portion 52B must be made greater than those in a case of using a gold wire because copper is harder and more difficult to deform than gold.

Stress applied to the mesa portion 55B of the pad bond portion 52B is thus greater than that in the case using the gold wire and when such a large stress is applied to the electrode pad 9B, not only may the interlayer insulating film 23B become damaged but a crack or other large damage may occur in the semiconductor chip 2B as well.

However, with the above-described shape of the side surface 58B of the mesa portion 55B, even if a large stress is applied, the stress can be relaxed effectively. Damaging of the interlayer insulating film 23B and occurrence of crack in the semiconductor chip 2B can thus be suppressed.

Although the second preferred embodiment of the present invention has been described above, the second preferred embodiment may also be modified as follows.

Figure 13A:
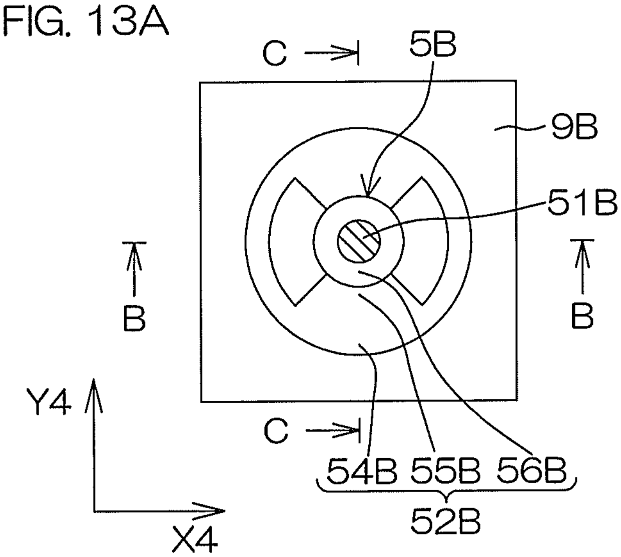
FIG. 13A is a diagram of a first modification example of the semiconductor device of FIG. 10 and is a diagram corresponding to FIG. 12A.
Figure 13B:
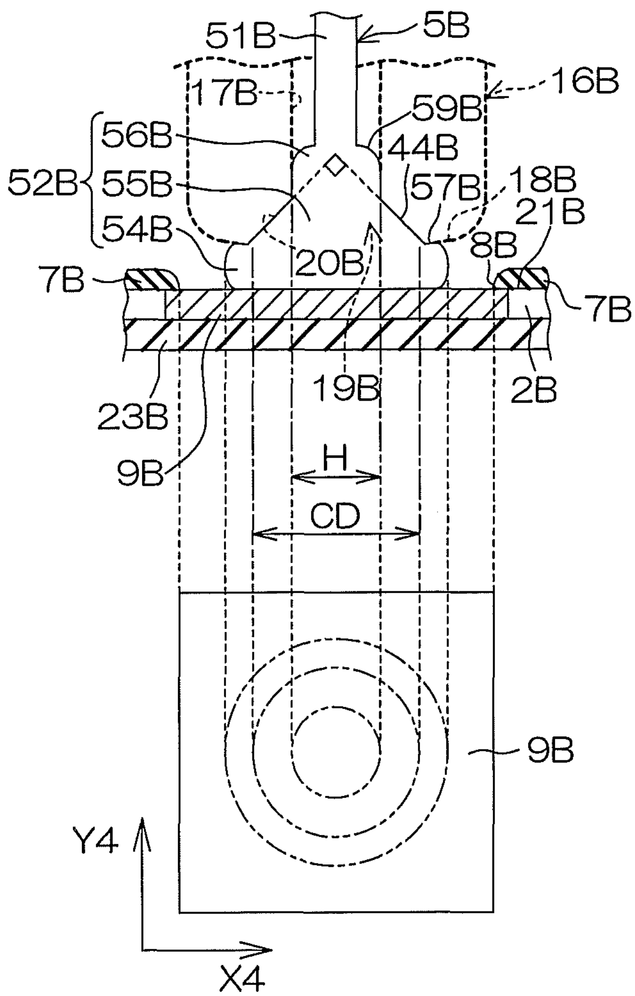
FIG. 13B is a diagram of the first modification example of the semiconductor device of FIG. 10 and is a diagram corresponding to FIG. 12B.
Figure 13C:
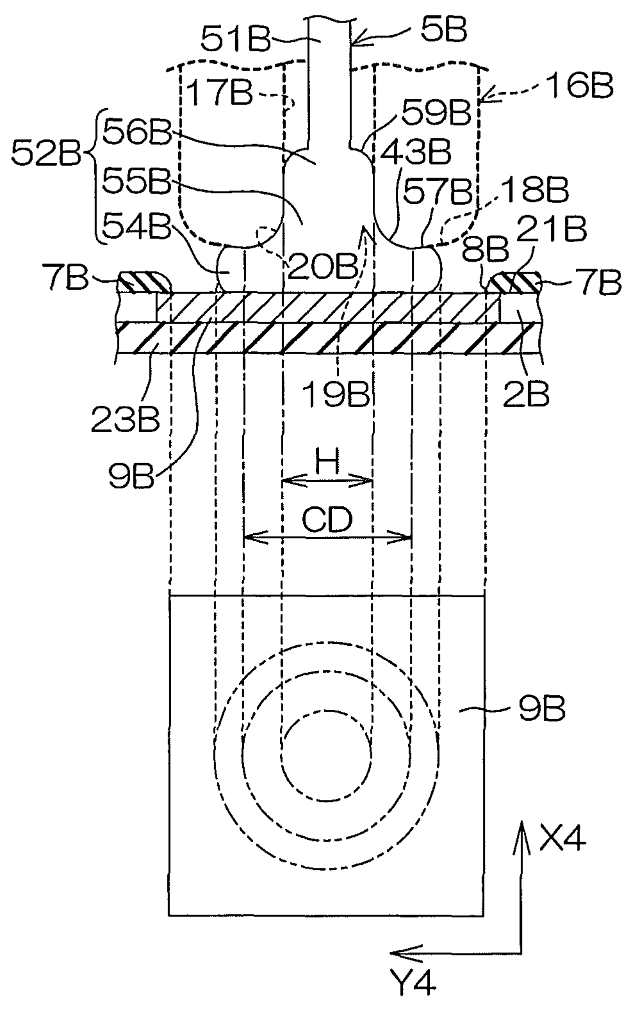
FIG. 13C is a diagram of the first modification example of the semiconductor device of FIG. 10 and is a diagram corresponding to FIG. 12C.

For example, although in the preferred embodiment, the side surface 20B of the chamfer portion 19B has a cross-sectional shape that is a non-rectilinear curve across its entire circumference, a portion may be of a curved shape and a remaining portion may be rectilinear as shown in FIG. 13A to FIG. 13C. In this case, the ultrasonic waves for the first bond are applied along a Y4 direction (hereinafter, "ultrasonic wave application direction Y4") that intersects the curved-shape portion of the side surface 20B. A side surface (curved surface) 43 having a curved cross-sectional shape when sectioning is performed along the ultrasonic wave application direction Y4 and a side surface (flat surface) 44 having a rectilinear cross-sectional shape when sectioning is performed along a direction (for example, the frame conveying direction X4) intersecting the ultrasonic wave application direction Y4 are thereby formed on the mesa portion 55B.

Figure 14:
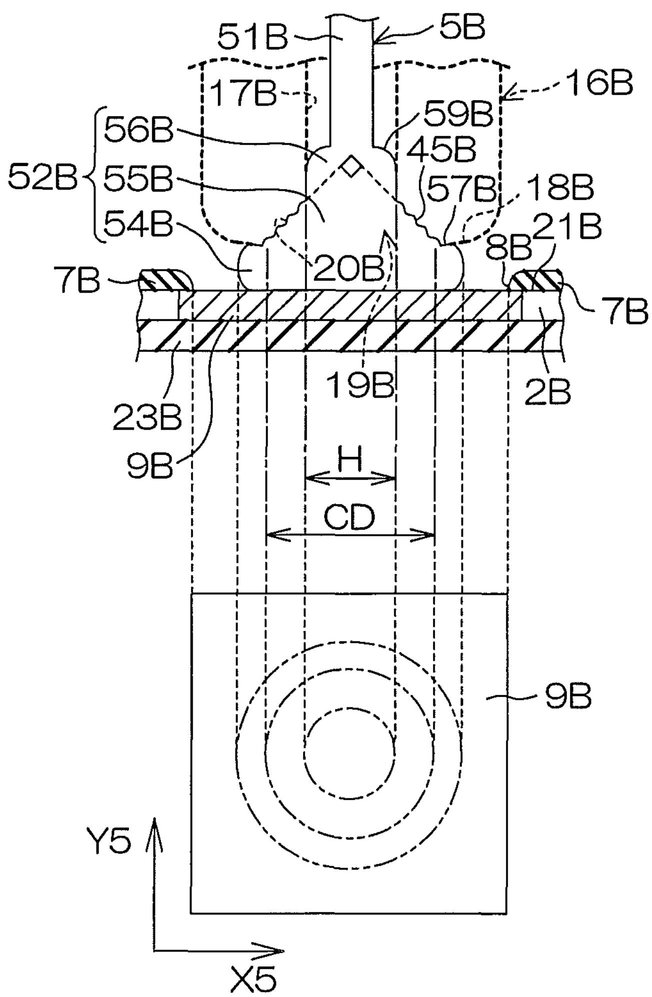
FIG. 14 is a diagram of a second modification example of the semiconductor device of FIG. 10.
Figure 15:
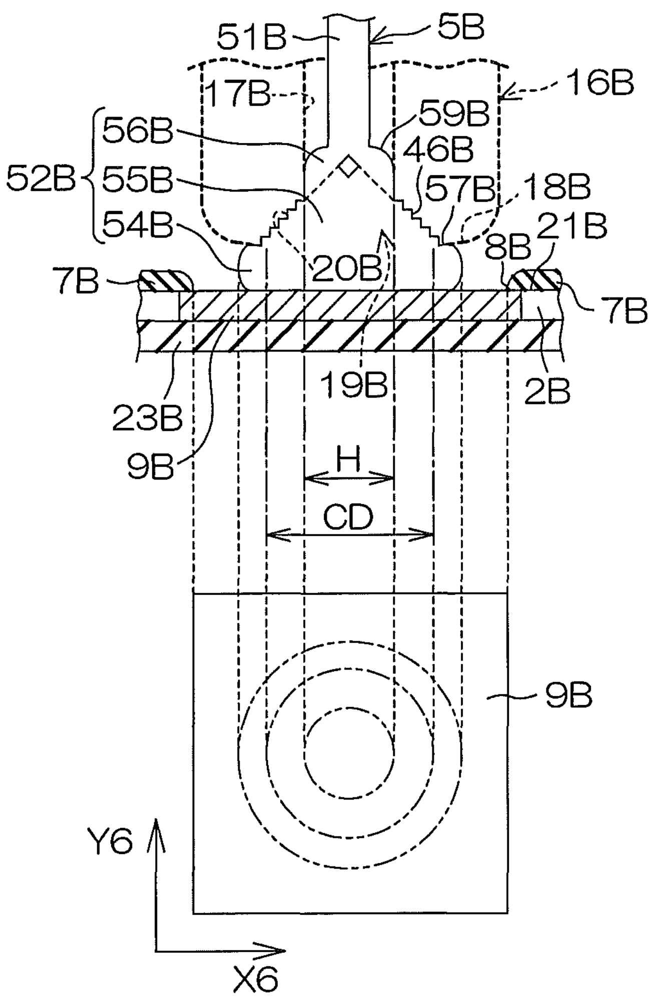
FIG. 15 is a diagram of a third modification example of the semiconductor device of FIG. 10.

Also, the side surface of non-rectilinear shape in sectional view of the mesa portion 55B is not required to have a curved shape and may, for example, be a side surface 45B with a cross-sectional shape that is a curved waveform (for example, an arcuate waveform, sinusoidal waveform, etc.) as shown in FIG. 14 or a side surface 46B with a cross-sectional shape that is a rectilinear waveform (for example, a triangular waveform, etc.). The side surface 45B and the side surface 46B can be formed by the capillary 16B having the chamfer portion 19B with the side surface 20B formed in accordance with the corresponding cross-sectional shape. In FIG. 14 and FIG. 15, Y5 and Y6 indicate ultrasonic wave application directions Y5 and Y6, respectively, and X5 and X6 indicate frame conveying directions X5 and X6, respectively.

Figure 17:
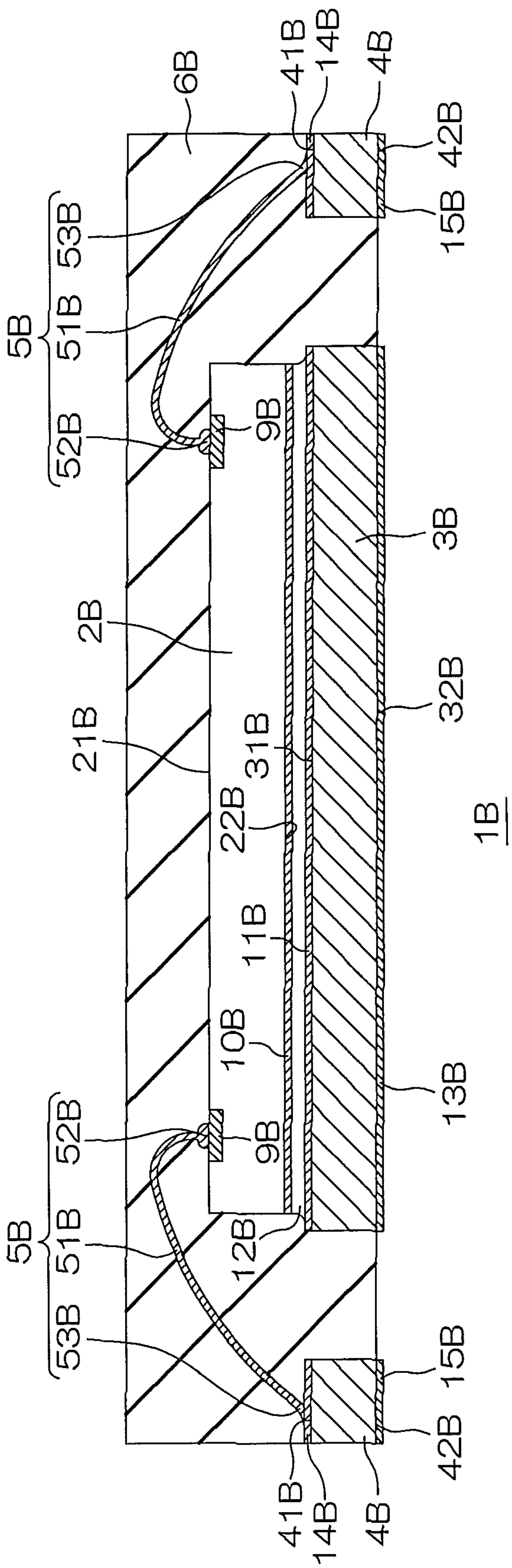
FIG. 17 is a diagram of a fourth modification example of the semiconductor device of FIG. 10.

Also, although with the preferred embodiment described above, a mode in which the bonding wires 5B are covered by the water-impermeable insulating film 24B was described as an example, the water-impermeable insulating film 24B may be omitted as shown in FIG. 17 as long as at least the second object for resolving the second issue is achieved.

Also, although an SON type semiconductor device was taken up in the above description of the preferred embodiment, the present invention may also be applied to semiconductor devices of other package types, for example, QFN (quad flat non-leaded), QFP (quad flat package), SOP (small outline package), etc.

Third Preferred Embodiment FIG. 18 to FIG. 26

By disclosure of a third preferred embodiment, a third issue concerning a third background art described below can be resolved in addition to the issues described above in the "OBJECT(S) OF THE INVENTION."

(1) Third Background Art

Semiconductor devices are normally distributed in a state where a semiconductor chip is sealed (packaged) together with bonding wires by a resin. Inside the package, electrode pads of the semiconductor chip are electrically connected by the bonding wires to electrode leads that are partially exposed from the resin package. Thus, by connecting the electrode leads as external terminals to wirings on a mounting board, electrical connection of the semiconductor chip and the mounting board is achieved.

Although conventionally, gold wires are mainly used as the bonding wires connecting the electrode pads and the electrode leads, recently, the use of copper wires, which are cheaper than gold wires, is being examined for reducing the use of high-priced gold.

A first bond, which is a bond of a bonding wire and an electrode pad, is formed, for example, by first applying a current to a tip portion of a bonding wire held by a capillary of a wire bonder and melting the wire material by heat of a resulting spark. The molten wire material becomes an FAB (free air ball) due to surface tension.

Next, the capillary moves to a position directly above an electrode pad and thereafter descends so that the FAB contacts the electrode pad. In this process, a load and ultrasonic waves are applied to the FAB by the capillary. The FAB is thereby deformed in accordance with a shape of the tip of the capillary and a first bond portion is formed.

(2) Third Issue

Copper excels over gold in thermal conductivity and electrical conductivity and thus by adoption of copper wires, improvement in thermal conductivity and electrical conductivity of bonding wires is anticipated in addition to reduction in cost.

However, generally in forming the first bond, a capillary made of a ceramic-based material with a thermal conductivity of 3 to 5 W/m·K is used. Thus, to prevent non-melting of the wire and form, an FAB with stability, an FAB having a diameter of approximately 2.5 times a wire diameter must be formed intentionally.

Thus, when a copper wire that is thick with respect to electrode pads of narrow pitch is used, a problem such as protrusion of the FAB from the electrode pad, occurs during bonding. The wire diameter of the copper wire used is thus calculated back from the pitch of the electrode pads and an FAB diameter suited for the pitch and must be made comparatively thin in a case of bonding to electrode pads of narrow pitch. There is thus a problem that effective use of the excellent thermal conductivity and electrical conductivity of copper wires cannot be made.

Thus, a third object of the present invention related to the third preferred embodiment is to provide a semiconductor device that is made low in cost and capable of being improved in thermal conductivity and electrical conductivity of bonding wires by use of bonding wires made of copper.

Yet another object is to provide a method for manufacturing semiconductor device with which, in bonding a bonding wire made of copper and an electrode pad, a metal ball of comparatively small diameter can be formed with stability at a tip portion of the bonding wire.

(3) Disclosure of a Specific Preferred Embodiment

Figure 18:
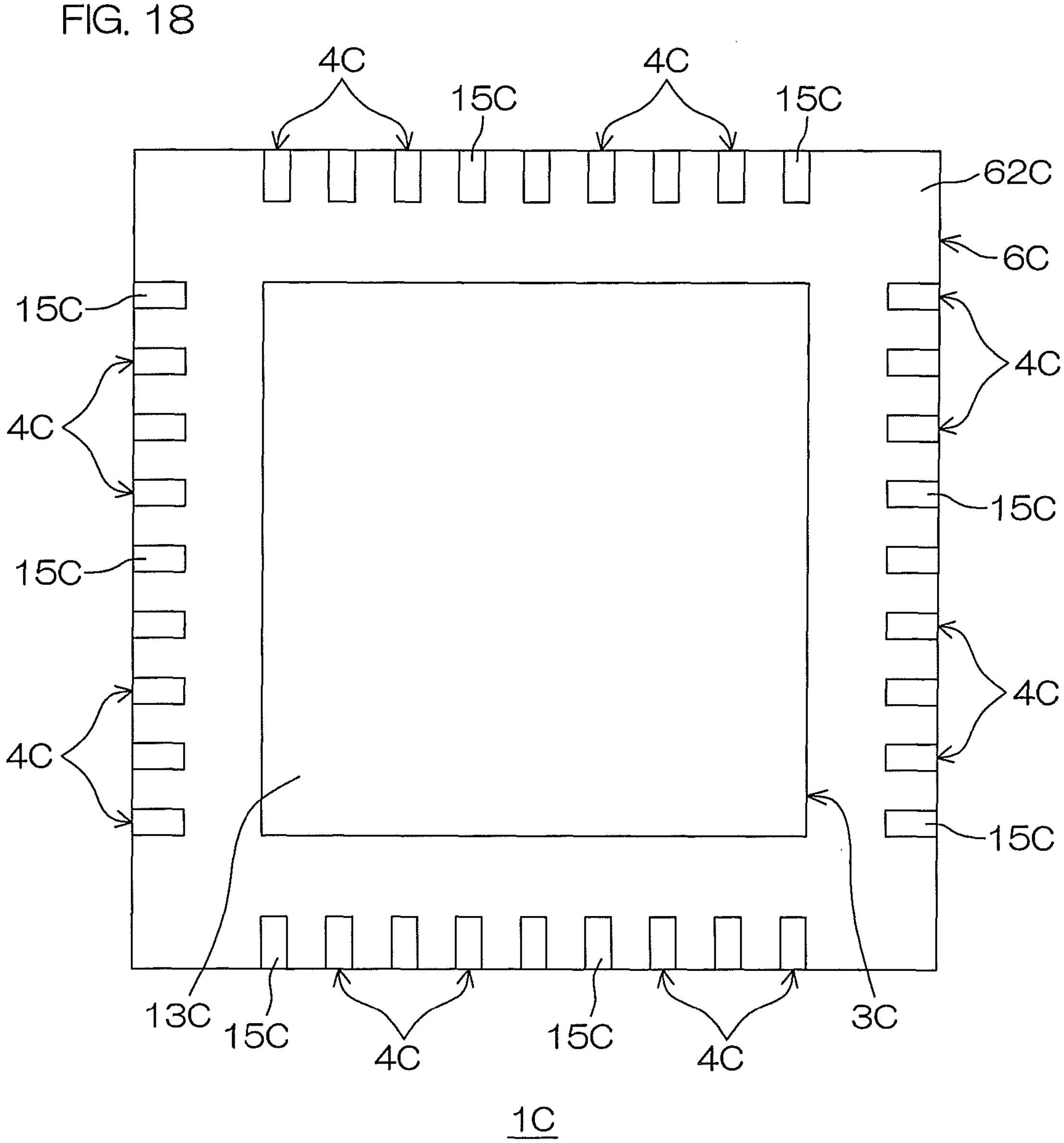
FIG. 18 is a schematic bottom view of a semiconductor device according to a third preferred embodiment of the present invention.
Figure 19:
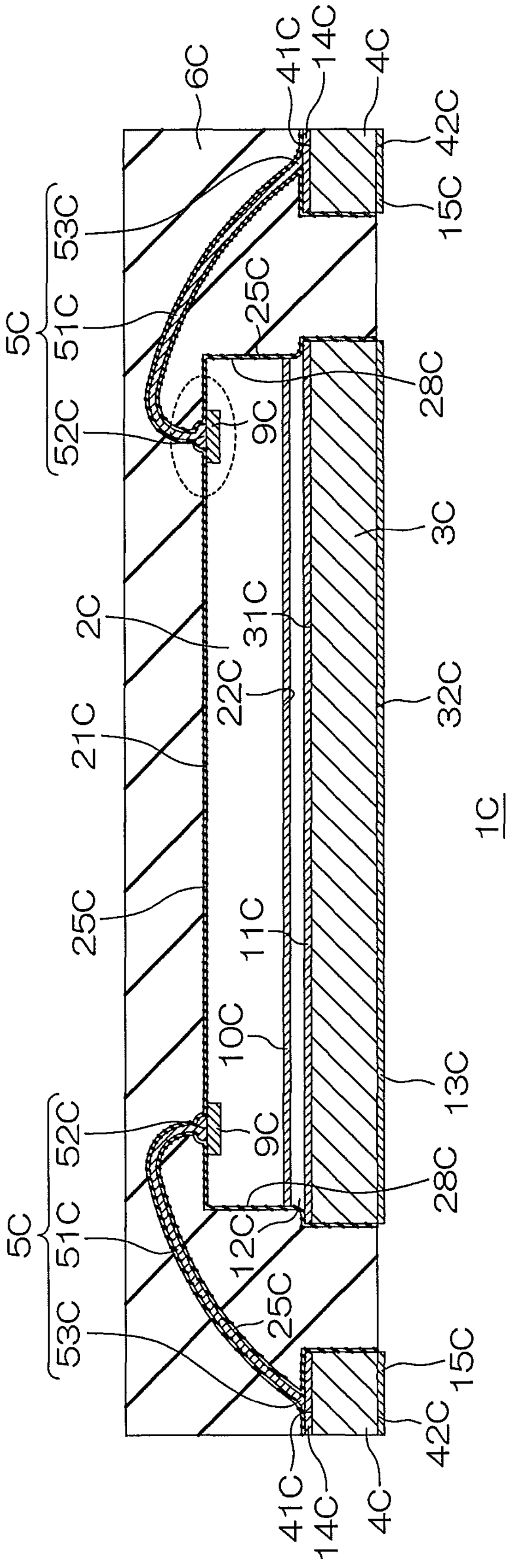
FIG. 19 is a schematic sectional view of the semiconductor device according to the third preferred embodiment of the present invention.
Figure 20:
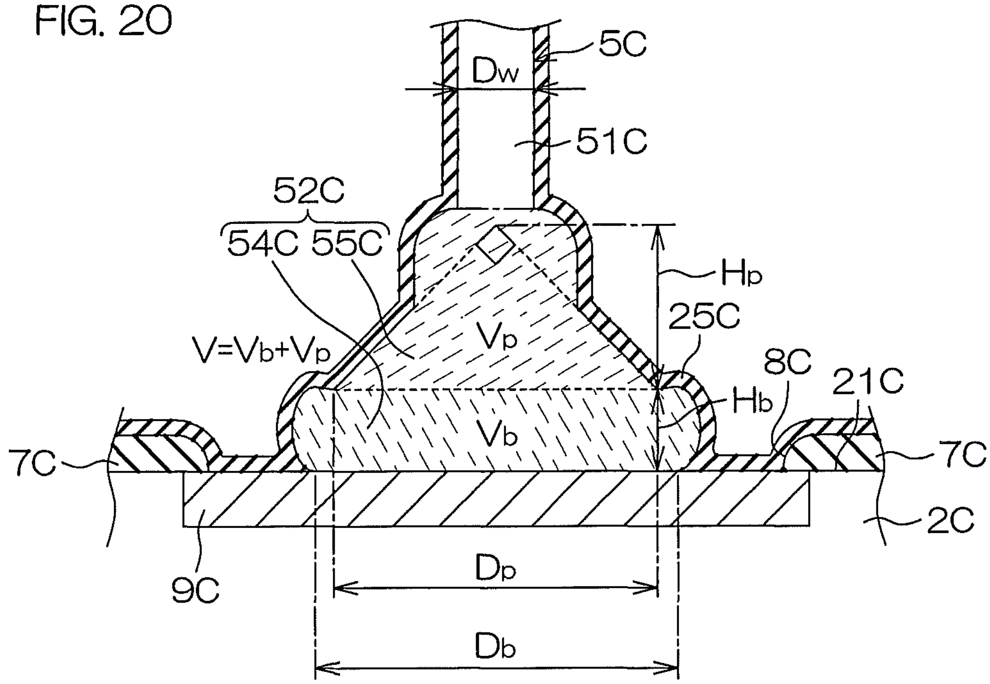
FIG. 20 is an enlarged view of a portion surrounded by a broken-line circle in FIG. 19.
Figure 21:
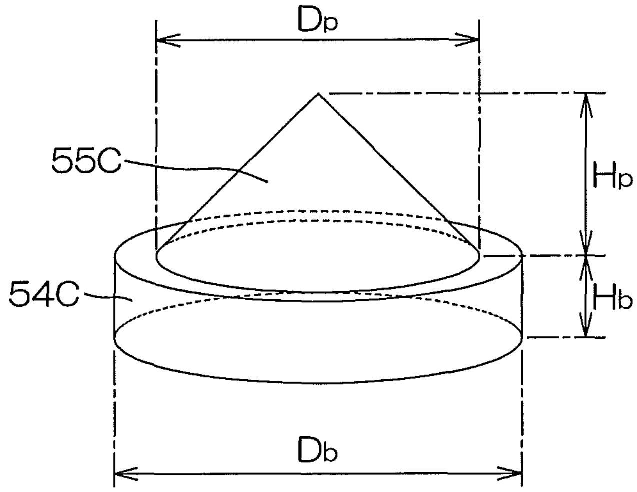
FIG. 21 is a conceptual diagram for determining a volume of a pad bond portion.

FIG. 18 is a schematic bottom view of a semiconductor device according to the third preferred embodiment of the present invention. FIG. 19 is a schematic sectional view of the semiconductor device according to the third preferred embodiment of the present invention. FIG. 20 is an enlarged view of a portion surrounded by a broken-line circle in FIG. 19. FIG. 21 is a conceptual diagram for determining a volume of a pad bond portion.

The semiconductor device 1C is a semiconductor device to which a QFN (quad flat non-leaded) configuration is applied. The semiconductor device 1C includes a semiconductor chip 2C, a die pad 3C supporting the semiconductor chip 2C, a plurality of electrode leads 4C disposed at a periphery of the semiconductor chip 2C, bonding wires 5C electrically connecting the semiconductor chip 2C and the electrode leads 4C, and a resin package 6C sealing the above components.

The semiconductor chip 2C has a quadrilateral shape in plan view and has, for example, a multilayer wiring structure arranged by laminating a plurality of wiring layers via interlayer insulating films. Also, the semiconductor chip 2C has a thickness, for example, of 220 to 240 μm (preferably, approximately 230 μm). As shown in FIG. 20, a top surface 21C (surface at one side in a thickness direction) of the semiconductor chip 2C is covered by a top surface protective film 7C.

A plurality of pad openings 8C for exposing an uppermost wiring layer of the multilayer wiring structure are formed in the top surface protective film 7C.

Each pad opening 8C has a quadrilateral shape in plan view and the same number thereof are provided at each edge of the semiconductor chip 2C. The respective pad openings 8C are disposed at equal intervals along the respective sides of the semiconductor chip 2C. A portion of the wiring layer is exposed as an electrode pad 9C of the semiconductor chip 2C from each pad opening 8C.

The uppermost wiring layer exposed as the electrode pads 9C is made, for example, of a metal material that contains Al (aluminum) and is specifically made of a metal material having Al as a main component (for example, an Al—Cu alloy, etc.).

Meanwhile, a rear surface metal 10C that contains, for example, Au, Ni, Ag, etc., is formed on a rear surface 22C (surface at the other side in the thickness direction) of the semiconductor chip 2C.

The die pad 3C is made, for example, of a metal thin plate (for example, Cu or 42 alloy (an alloy containing Fe-42% Ni) and has a larger quadrilateral shape (for example, approximately 2.7 mm square in plan view) than the semiconductor chip 2C in plan view. Also, the die pad 3C has a thickness of 190 to 210 μm (preferably, approximately 200 μm). A pad plating layer 11C that contains Ag, etc., is formed on a top surface 31C (surface at one side in the thickness direction) of the die pad 3C.

The semiconductor chip 2C and the die pad 3C are bonded to each other in a state where the rear surface 22C of the semiconductor chip 2C and the top surface 31C of the die pad 3C face each other as bond surfaces with a bonding material 12C interposed between the rear surface 22C and the top surface 31C. The semiconductor chip 2C is thereby supported by the die pad 3C in an orientation where the top surface 21C faces upward.

The bonding material 12C is made, for example, of solder paste or other conductive paste. As the bonding material 12C, an insulating paste, such as a silver paste, an alumina paste, may be applied and in this case, the rear surface metal 10C and/or the pad plating layer 11C may be omitted. Also, in the state where the semiconductor chip 2C and the die pad 3C are bonded, a thickness of the bonding material 12C is, for example, 10 to 20 μm.

A rear surface 32C (surface at the other side in the thickness direction) of the die pad 3C is exposed from the resin package 6C. A solder plating layer 13C made, for example, of a metal material, such as tin (Sn), tin-silver alloy (Sn—Ag), is formed on the exposed other-side surface.

The electrode leads 4C are made of the same metal thin plate (containing, for example, Cu or 42 alloy (Fe-42% Ni, etc.) as the die pad 3C. The electrode leads 4C are disposed at the periphery of the semiconductor chip 2C with the same number thereof being disposed at both sides in respective directions orthogonal to respective side surfaces of the die pad 3C. The electrode leads 4C that face each side surface of the die pad 3C are disposed at equal intervals in a direction parallel to the facing side surface. A length of each electrode lead 4C in the direction of facing the die pad 3C is, for example, 240 to 260 μm (preferably, approximately 250 μm). A lead plating layer 14C that contains Ag, etc., is formed on a top surface 41C (surface at one side in the thickness direction) of each electrode lead 4C.

Meanwhile, a rear surface 42C (surface at the other side in the thickness direction) of each electrode lead 4C is exposed from the resin package 6C. A solder plating layer 15C made, for example, of a metal material, such as tin (Sn), tin-silver alloy (Sn—Ag), is formed on the exposed rear surface 42C.

Each bonding wire 5C is made of copper (for example, a high-purity copper of no less than 99.9999% (6N) purity or no less than 99.99% (4N) purity that may contain a minute amount of impurity). Each bonding wire 5C includes a linearly-extending, cylindrical main body portion 51C and includes a pad bond portion 52C and a lead bond portion 53C formed at respective ends of the main body portion 51C and respectively bonded to an electrode pad 9C and an electrode lead 4C.

The main body portion 51C is curved parabolically upward from the one end at the electrode pad 9C side toward an outer side of the semiconductor chip 2C and made impingent at an acute angle at the other end on the top surface 41C of the electrode lead 4C.

The pad bond portion 52C is smaller than the electrode pad 9C in plan view. The pad bond portion 52C has a humped shape in sectional view that integrally includes a substantially cylindrical base portion 54C, which, at its other side in the thickness direction, contacts a top surface of the electrode pad 9C, and a substantially umbrella-shaped projecting portion 55C projecting from the one side of the base portion 54C and having a tip connected to the one end of the main body portion 51C.

Also, with the bonding wire 5C, ratio ($V/(D_w)^3$) of a volume V of the pad bond portion 52C with respect to a cube of a wire diameter $D_w$ of the main body portion 51C (diameter of the main body portion 51C) is 1.8 to 5.6.

The volume V of the pad bond portion 52C is determined, for example, by determining a volume $V_b$ of the substantially cylindrical base portion 54C and a volume $V_p$ of the substantially umbrella-shaped projecting portion 55C as approximate values and adding the approximate values.

The volume $V_b$ of the base portion 54C can be determined as an approximate value based on a volume of a cylinder with a diameter $D_b$ and a height $H_b$ which the base portion 54C is conceptually deemed to be as shown in FIG. 21. That is, the volume $V_b$ of the base portion 54C can be expressed as $V_b \approx \pi(D_b/2)^2 \cdot H_b$.

Meanwhile, the projecting portion 55C has a substantially umbrella-like shape formed by using a cone as a base and forming a top portion of the cone to a cylindrical shape having a height direction as an axis, and thus the volume Vp of the projecting portion 55C can be determined as an approximate value based on a volume of a cone with a diameter Dp and a height Hp which the projecting portion 55C is conceptually deemed to be as shown in FIG. 21. That is, the volume Vp of the projecting portion 55C can be expressed as $Vb \approx \pi(Dp/2)2 \cdot Hp/3$.

The lead bond portion 53C has a wedge-like shape in sectional view that is relatively thick at the one end side close to the main body portion 51C and becomes relatively thinner toward the other end side away from the main body portion 51C.

As in the first preferred embodiment, in the semiconductor device 1C, the entire top surface 21C and side surfaces 28C of the semiconductor chip 2C, the entire top surface 31C and side surfaces of the die pad 3C, the entire top surfaces 41C and side surfaces inside the resin package 6C of the electrode leads 4C, and the entire bonding wires 5C are covered by an integral water-impermeable insulating film 25C.

As the resin package 6C, a known material, such as an epoxy resin, may be applied. The resin package 6C makes up an outer shape of the semiconductor device 1C and is formed to a substantially rectangular parallelepiped shape. In terms of size, the resin package 6C has a planar size, for example, of approximately 4 mm square and a thickness, for example, of 0.60 to 0.70 mm and preferably, approximately 0.65 mm.

FIG. 22A to FIG. 22E are schematic sectional views for describing a method for manufacturing the semiconductor device shown in FIG. 19 in order of process.

To manufacture the semiconductor device 1C, for example, first, a lead frame 20C that includes a plurality of units each integrally having a die pad 3C and electrode leads 4C is prepared. In FIG. 22A to FIG. 22E, an entire view of the lead frame 20C is abbreviated and the die pad 3C and electrode leads 4C of just a single unit necessary for mounting a single semiconductor chip 2C are shown.

Next, a metal plating of Ag, etc., is applied to a top surface of the lead frame 20C by a plating method. The pad plating layer 11C and the lead plating layer 14C are thereby formed at the same time.

Figure 22A:
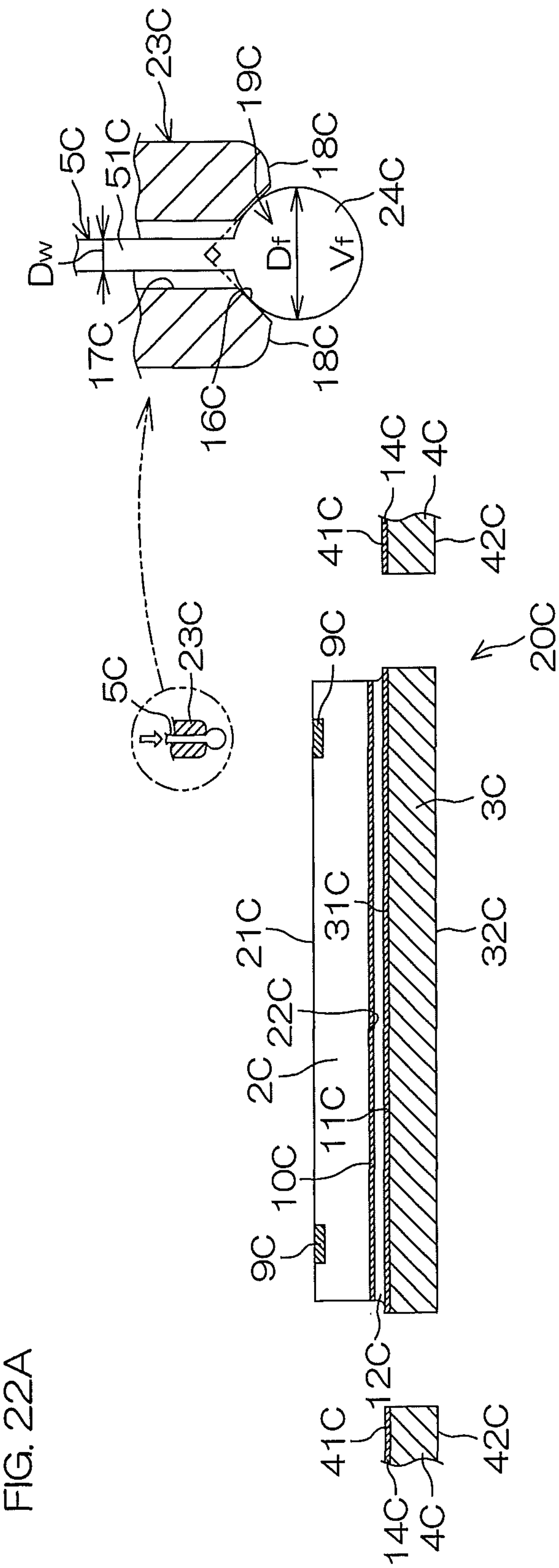
FIG. 22A is a schematic sectional view for describing a method for manufacturing the semiconductor device of FIG. 2.

Next, as shown in FIG. 22A, the semiconductor chips 2C are die bonded via the bonding material 12C to all die pads 3C on the lead frame 20C.

Next, bonding of each bonding wire 5C is performed by a wire bonder (not shown) that includes a capillary 23C.

The capillary 23C included in the wire bonder is made of a material with a thermal conductivity of 15 to 45 W/m·K and preferably, 17 to 43 W/m·K. Specifically, the capillary is made of polycrystalline ruby (with a thermal conductivity, for example, of approximately 17 to 19 W/m·K) or monocrystalline ruby (with a thermal conductivity, for example, of approximately 41 to 43 W/m·K).

The capillary 23C has a substantially cylindrical shape with a straight hole 17C, through which the bonding wire 5C is inserted, formed at a center, and during wire bonding, the bonding wire 5C is fed out from a tip of the straight hole 17C.

A face portion 18C, which is substantially perpendicular to a longitudinal direction of the straight hole 17C and, in plan view, has an annular shape concentric to the straight hole 17C, and a chamfer portion 19C, which is recessed in the longitudinal direction of the straight hole 17C from the face portion 18C, are formed at a tip portion of the capillary 23C.

A side surface 16C of the chamfer portion 19C is formed to a conical surface connecting an inner circumferential circle of the face portion 18C and a circumferential surface of the straight hole 17C. The side surface 16C is thus rectilinear in sectional view and in the present preferred embodiment, an apex angle (chamfer angle) thereof is set, for example, to 90°.

In the wire bonding process, first, a current is applied to a tip portion (one end portion) of the bonding wire 5C held by the capillary 23C to forma spherical FAB 24C (free air ball) at the tip portion. The applied current I is set to a larger value the larger the wire diameter $D_w$ of the main body portion 51C, and for example, I=40 mA when $D_w$=25 μm, I=60 mA when $D_w$=30 μm, and I=120 mA when $D_w$=38 μm. A current application time is set to an appropriate length according to a diameter $D_f$ of the FAB 24C.

A volume $V_f$ of the FAB 24C thus formed may be expressed using the diameter $D_f$ of the FAB 24C as $V_f = 4/3 \cdot \pi \cdot (D_f/2)^3$.

Figure 22B:
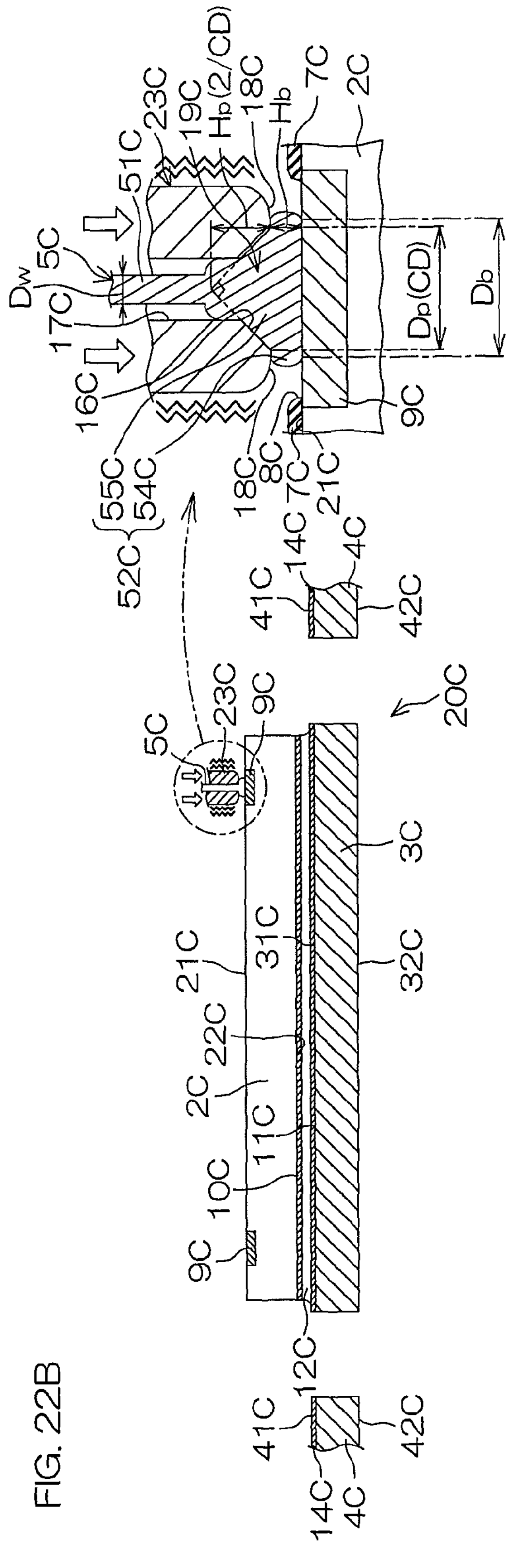
FIG. 22B is a diagram of a step subsequent to that of FIG. 22A.

Next, as shown in FIG. 22B, the capillary 23C moves to a position directly above an electrode pad 9C and thereafter descends so that the FAB 24C contacts the electrode pad 9C. In this process, a load (open arrows in FIG. 22B) and ultrasonic waves (zigzag lines in FIG. 22B) are applied from the capillary 23C to the FAB 24C. The applied load W is set in accordance with the wire diameter $D_w$ of the main body portion 51C and the intended diameter $D_b$ of the base portion 54C and, for example, W=80 g when $D_w$=25 μm and $D_b$=46 μm, W=130 g when $D_w$=30 μm and $D_b$=60 μm, and W=240 g when $D_w$=38 μm and $D_b$=85 μm. Also, the applied ultrasonic waves, in terms of output values of the apparatus, are of 120 kHz and 50 to 120 mA.

A portion of the FAB 24C is thereby made to spread below the face portion 18C to form the base portion 54C while the remaining portion of the FAB 24C remains inside the chamfer portion 19C while being pushed inside the straight hole 17C to form the projecting portion 55C. The one end portion of the bonding wire 5C is thereby bonded as the pad bond portion 52C to the electrode pad 9C and a first bond is formed.

Thereby, at the projecting portion 55C, a conical surface with a planar shape in sectional view is formed along the side surface 16C of the chamfer portion 19C. Thus, in computing the volume $V_p$ of the projecting portion 55C, a diameter (chamfer diameter) CD of the chamfer portion 19C may be used in place of the diameter $D_p$ of the cone, and in a case where the chamfer angle is 90°, CD/2 may be used in place of the height $H_p$.

Figure 22C:
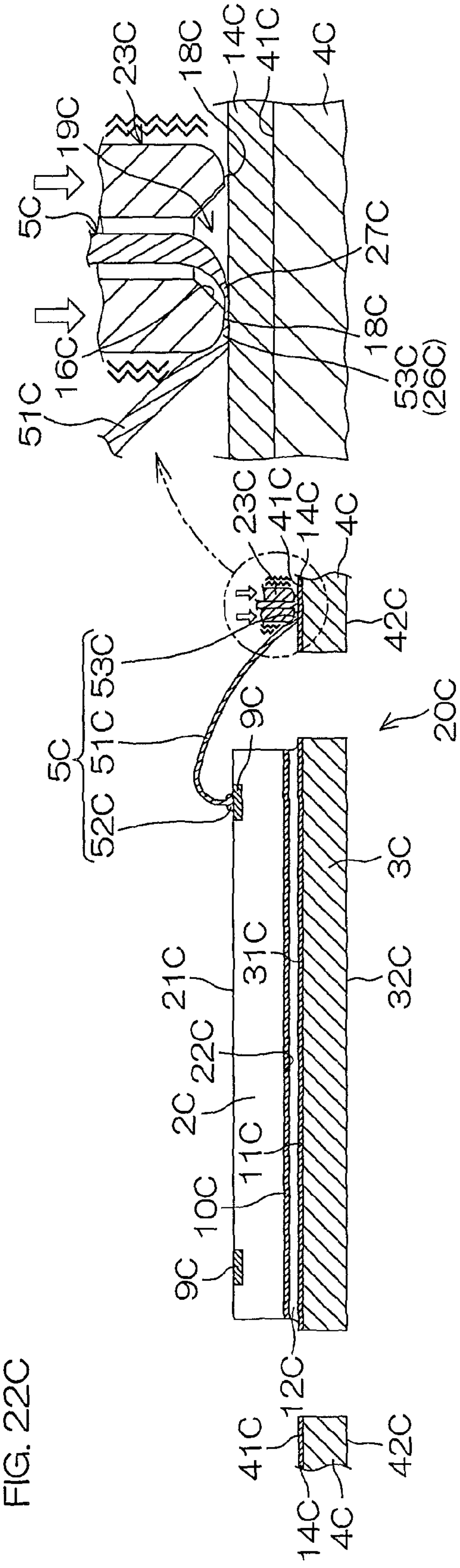
FIG. 22C is a diagram of a step subsequent to that of FIG. 22B.

After the first bond has been formed, the capillary 23C rises to a fixed height and moves to a position directly above an electrode lead 4C. Then, as shown in FIG. 22C, the capillary 23C descends again and the bonding wire 5C contacts the electrode lead 4C. In this process, a load (open arrows in FIG. 22C) and ultrasonic waves (zigzag lines in FIG. 22C) are applied from the capillary 23C to the bonding wire 5C so that the bonding wire 5C deforms according to the shape of the face portion 18C of the capillary 23C and is bonded to the electrode lead 4C (forming of a stitch bond 26C and a tail bond 27C).

The capillary 23C then rises and in a state where a tail of a fixed length is secured from a tip of the capillary 23C, the bonding wire 5C is broken from a position of the tail bond 27C. The other end of the bonding wire 5C that has been stitch bonded thus remains as the lead bond portion 53C on the electrode lead 4C and a second bond is thereby formed.

Figure 22D:
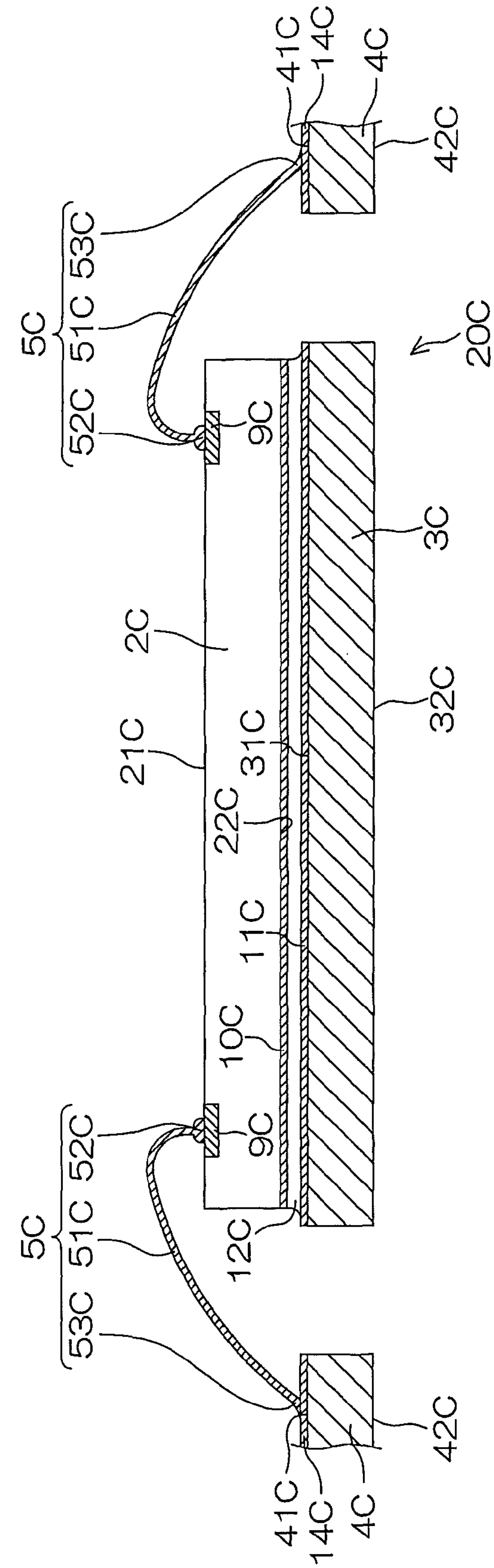
FIG. 22D is a diagram of a step subsequent to that of FIG. 22C.

Thereafter, as shown in FIG. 22D, the same processes as those of FIG. 22A to 22C are performed so that the respective electrode pads 9C of all semiconductor chips 2C and the electrode leads 4C corresponding to the respective electrode pads 9C are connected by the bonding wires 5C.

Figure 22E:
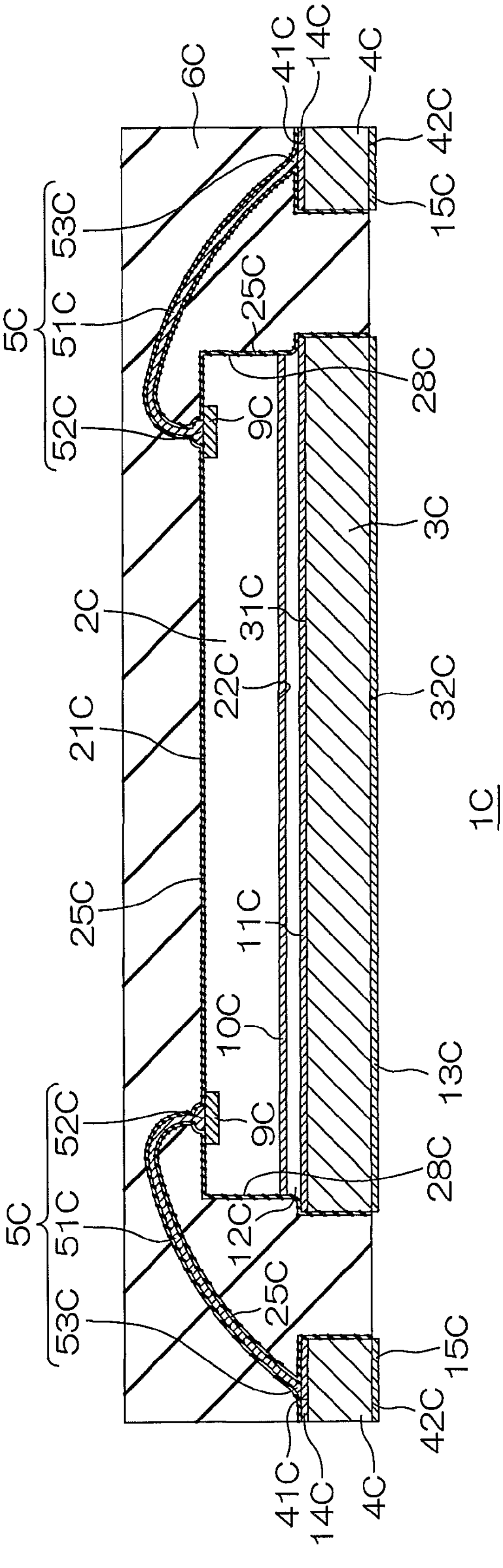
FIG. 22E is a diagram of a step subsequent to that of FIG. 22D.

After all of the wire bonding ends, the water-impermeable insulating film 25C is formed by the same method as that of FIG. 4D. After the forming of the water-impermeable insulating film 25C, the lead frame 20C is set in a forming mold and all semiconductor chips 2C are sealed in a batch together with the lead frame 20C by the resin package 6C as shown in FIG. 22E. Solder plating layers 13C and 15C are then formed on the rear surfaces 32C of the die pads 3C and the rear surfaces 42C of the electrode leads 4C that are exposed from the resin package 6C. Lastly, a dicing saw is used to cut the lead frame 20C together with the resin package 6C to sizes of the respective semiconductor devices 1C and the individual semiconductor devices 1C one of which is shown in FIG. 19 are thereby obtained.

As described above, with the present manufacturing method, the capillary 23C made of the material with a thermal conductivity of 15 to 45 W/m·K is used in forming the FAB 24C of the bonding wire 5C made of copper. The FAB 24C of comparatively small diameter, with which a magnitude ($D_f/D_w$) of the diameter $D_f$ with respect to the wire diameter $D_w$ of the main body portion 51C of the bonding wire 5C is 1.5 to 2.2 times can thereby be formed with stability. For example, in a case where the wire diameter $D_w$=25 μm, the FAB 24C with a $D_f/D_w$ of no less than 1.5 can be formed with stability, in a case where the wire diameter $D_w$=30 μm, the FAB 24C with a $D_f/D_w$ of no less than 1.8 can be formed with stability, and in a case where the wire diameter $D_w$=38 μm, the FAB 24C with a $D_f/D_w$ of no less than 1.9 can be formed with stability.

The volume $V_f$ of the FAB 24C with the diameter $D_f$ is 1.8 to 5.6 times the cube of the wire diameter $D_w$ of the main body portion 51C (that is, $V_f/(D_w)^3$=1.8 to 5.6).

The pad bond portion 52C formed by the FAB 24C of the above-described diameter being ultrasonically vibrated while being pressed by the capillary 23C thus has a volume V of 1.8 to 5.6 times the cube of the wire diameter $D_w$ of the main body portion 51C. That is, the ratio ($V/(D_w)^3$) of the volume V of the pad bond portion 52C with respect to the cube of the wire diameter $D_w$ of the main body portion 51C is 1.8 to 5.6.

By computing the volume $V_f$ of the FAB 24C and the volume V of the pad bond portion 52C, for example, under the following computing conditions, it is confirmed that (Computing conditions) Diameter $D_f$ of the FAB 24C=60 μm, chamfer diameter CD of the capillary 23C=66 μm, chamfer angle=90°, diameter $D_b$ of the base portion 54C of the pad bond portion 52C=76 μm, and height $H_b$ of the base portion 54C of the pad bond portion 52C=18 μm.

In this case, the volume $V_f$ of the FAB 24C is: $V_f=4/3\cdot\pi\cdot(D_f/2)^3=4/3\cdot\pi\cdot(30)^3\approx113{,}040\ \mu m^3$.

Meanwhile, the volume V of the pad bond portion 52C is (volume $V_b$ of the base portion 54C)+(volume $V_p$ of the projecting portion 55C) and thus, $V=\{\pi(D_b/2)^2\cdot H_b\}+\{\pi(D_p/2)^2\cdot H_p/3\}$. As described above, $D_p$ is CD and $H_p$ is CD/2 and thus, the volume V of the pad bond portion 52C is: $V=\{\pi(76/2)^2\cdot18\}+\{\pi(66/2)^2\cdot(66/2)/3\}\approx81{,}615+37614=119{,}229\ \mu m^3$.

Based on (the volume V of the pad bond portion 52C)−(the volume $V_f$ of the FAB 24C), the error between the volumes is 6189 $\mu m^3$, and this is approximately 5% of each of the volumes. The volume V of the pad bond portion 52C is an approximate value. Thus, by computing the volume V of the pad bond portion 52C, the volume $V_f$ of the FAB 24C used in forming the pad bond portion 52C can be determined.

Comparatively thick bonding wires can thus be used regardless of the magnitude of the pitch of the electrode pads 9C and thus the bonding wires 5C can be improved in thermal conductivity and electrical conductivity. Also, the cost can be reduced in comparison to a case where gold wires are used because copper wires are used.

The applied current I during forming of the FAB 24C is set to a larger value the greater the wire diameter $D_w$ of the main body portion 51C, and the FAB 24C that is closer to a true sphere can thus be formed with high efficiency.

Although the third preferred embodiment of the present invention has been described above, the third preferred embodiment may also be modified as follows.

For example, although a QFN type semiconductor device was taken up in the above description of the preferred embodiment, the present invention may also be applied to semiconductor devices of other package types, for example, the QFP (quad flat package), SOP (small outline package), etc.

Figure 23:
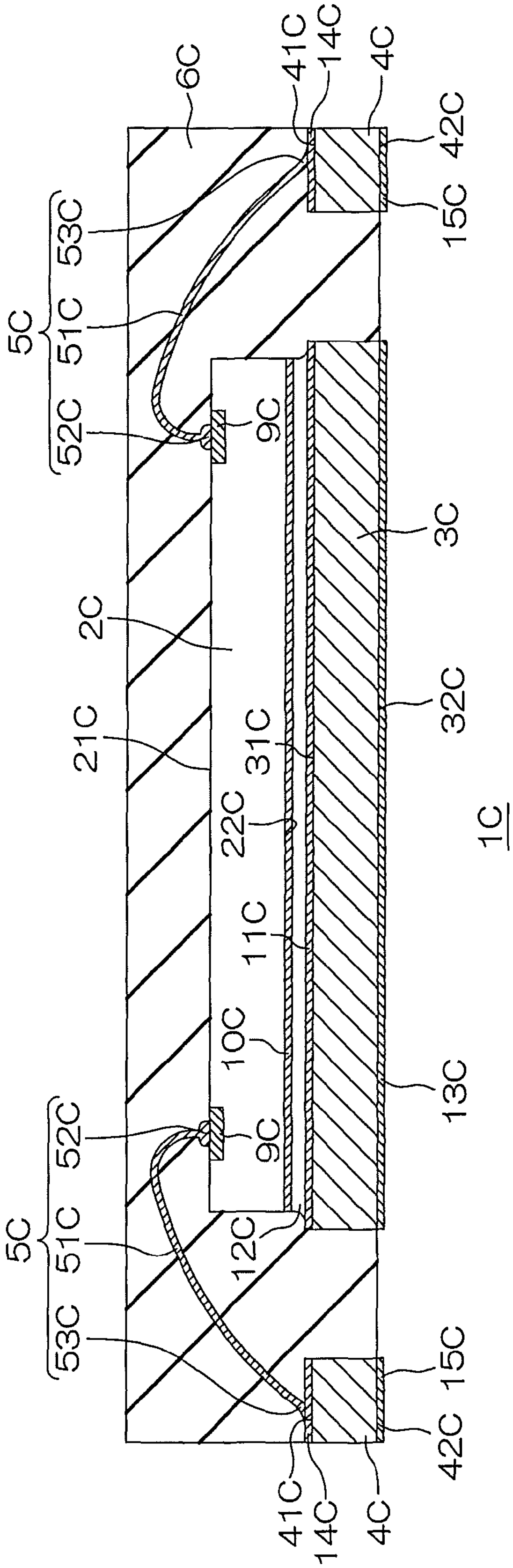
FIG. 23 is a diagram of a modification example of the semiconductor device of FIG. 19.

Also, although with the above-described preferred embodiment, a mode in which the bonding wires 5C are covered by the water-impermeable insulating film 25C was described as an example, the water-impermeable insulating film 25C may be omitted as shown in FIG. 23 as long as at least the third object for resolving the third issue is achieved.

Next, experiments related to the third preferred embodiment were performed. The present invention is not restricted by the following examples.

Example 1

A copper bonding wire of 38 μm wire diameter was held by a capillary (made of polycrystalline ruby; thermal conductivity: 17.7 W/m·K) and by applying a 120 mA current to a tip portion of the wire for 650 μsec, a 70 μm diameter FAB (FAB diameter/wire diameter=1.84; FAB volume/(wire diameter)$^3$=3.27) was prepared. The above operation was performed on each of 200 copper bonding wires.

Electron beam scanning of the FAB of each bonding wire was then performed using a scanning electron microscope (SEM) and SEM images were obtained by image processing of information detected thereby. By observation of the SEM images obtained, the shape of each FAB was judged from among the modes indicated below SEM images of the respective shape modes are shown in FIG. 24. In FIG. 24, a numeral indicated at an upper left of each SEM image indicates the number of bonding wires of the corresponding mode. For example, "168/200" indicated for a true sphere mode indicates that of the 200 bonding wires, the FAB shape was of the true sphere mode with 168 bonding wires.

(Types of Shape Modes)

True sphere: The FAB is a true sphere and a center thereof is positioned along an axis of the bonding wire.

Off-center: Although the FAB is a true sphere, the position of the center thereof slightly deviates from the axis of the bonding wire.

Club: The FAB has a shape similar to a golf club head.

Unmelted: The bonding wire did not melt sufficiently and an FAB could not be formed.

Examples 2 to 9

FABs were prepared on each of three types of copper bonding wires of different wire diameters (wire diameter=38

μm, 30 μm, and 25 μm) using the same capillary as that of Example 1, with the exception of Example 5. In Example 5, a capillary made of monocrystalline ruby and having thermal conductivity of 43.0 W/m·K was used.

Thereafter, by the same method as that of Example 1, SEM images of the FABs of the respective bonding wires were observed to judge the shape of each FAB from among the modes indicated below. The SEM images obtained are shown in FIG. 24 to FIG. 26. The wire diameters of the wires, the FAB diameters, and the current application conditions are as indicated in the respective figures.

Comparative Example 1

A copper bonding wire of 38 μm wire diameter was held by a capillary (made of ceramic; thermal conductivity: 4.2 W/m·K) and by applying a 120 mA current to a tip portion of the wire for 650 μsec, a 70 μm diameter FAB (FAB diameter/wire diameter=1.84; FAB volume/(wire diameter)$^3$=3.27) was prepared. The above operation was performed on each of 200 copper bonding wires.

Thereafter, by the same method as that of Example 1, SEM images of the FABs of the respective bonding wires were observed to judge the shape of each FAB from among the modes indicated below. The SEM images of the respective shape modes are shown in FIG. 24.

Comparative Examples 2 to 8

FABs were prepared on each of three types of copper bonding wires of different wire diameters (wire diameter=38 μm, 30 μm, and 25 μm) using the same capillary as that of Comparative Example 1.

Thereafter, by the same method as that of Example 1, SEM images of the FABs of the respective bonding wires were observed to judge the shape of each FAB from among the modes indicated below. The SEM images obtained are shown in FIG. 24 to FIG. 26. The wire diameters of the wires, the FAB diameters, and the current application conditions are as indicated in the respective figures.

Evaluation

As demonstrated by Examples 1 to 9, it was confirmed that, in the cases of using the capillaries with thermal conductivities of 17.7 W/m·K and 430 W/m·K to intentionally form FABs with the magnitudes (FAB diameter/wire diameter) of the diameter with respect to the wire diameter of the wire being 1.5 to 2.2 times, FABs of any one of the true sphere mode, off-center mode, and club mode can be formed reliably without occurrence of the failure mode in which the copper bonding wire is unmelted. It was thus confirmed that FABs of comparatively small diameter with a volume of 1.8 to 5.6 times the cube of the wire diameter of the bonding wire (FAB volume/(wire diameter)$^3$=1.8 to 5.6) can be formed with stability.

Fourth Preferred Embodiment FIG. 27 to FIG. 36

By disclosure of a fourth preferred embodiment, a fourth issue concerning a fourth background art described below can be resolved in addition to the issues described above in the "OBJECT(S) OF THE INVENTION."

(1) Fourth Background Art

Semiconductor devices are normally distributed in a state where a semiconductor chip is sealed (packaged) together with bonding wires by a resin. Inside the package, electrode pads of the semiconductor chip are electrically connected by the bonding wires to electrode leads that are partially exposed from the resin package. Thus, by connecting the electrode leads as external terminals to wirings on a mounting board, electrical connection of the semiconductor chip and the mounting board is achieved.

Although conventionally, gold wires are mainly used as the bonding wires connecting the electrode pads and the electrode leads, recently, the use of copper wires, which are cheaper than gold wires, is being examined for reducing the use of high-priced gold.

A first bond, which is a bond of a bonding wire and an electrode pad, is formed, for example, by first applying a current to a tip portion of a bonding wire held by a capillary of a wire bonder and melting the wire material by heat of a resulting spark. The molten wire material becomes an FAB (free air ball) due to surface tension.

Next, the capillary moves to a position directly above an electrode pad and thereafter descends so that the FAB contacts the electrode pad. In this process, a load and ultrasonic waves of fixed levels are applied to the FAB by the capillary. The FAB is thereby deformed in accordance with a shape of the tip of the capillary and a first bond portion is formed.

(2) Fourth Issue

However, copper is harder and more difficult to deform than gold and thus when a first bond is formed using a copper wire under the same bonding conditions (load, magnitude of ultrasonic waves, etc.) as those for a gold wire, the copper wire and an electrode pad may not be bonded satisfactorily and bond failure may occur.

Thus, a fourth object of the present invention related to the fourth preferred embodiment is to provide a wire bonding method capable of suppressing bond failures of copper bonding wires with respect to electrode pads and a semiconductor device prepared using the method.

(3) Disclosure of a Specific Preferred Embodiment

FIG. 287 is a schematic bottom view of a semiconductor device according to the fourth preferred embodiment of the present invention. FIG. 288 is a schematic sectional view of the semiconductor device according to the fourth preferred embodiment of the present invention. FIG. 289 is an enlarged view of a portion surrounded by a broken-line circle in FIG. 288.

The semiconductor device 1D is a semiconductor device to which a QFN (quad flat non-leaded) configuration is applied. The semiconductor device 1D includes a semiconductor chip 2D, a die pad 3D supporting the semiconductor chip 2D, a plurality of electrode leads 4D disposed at a periphery of the semiconductor chip 2D, bonding wires 5D electrically connecting the semiconductor chip 2D and the electrode leads 4D, and a resin package 6D sealing the above components.

Figure 29:
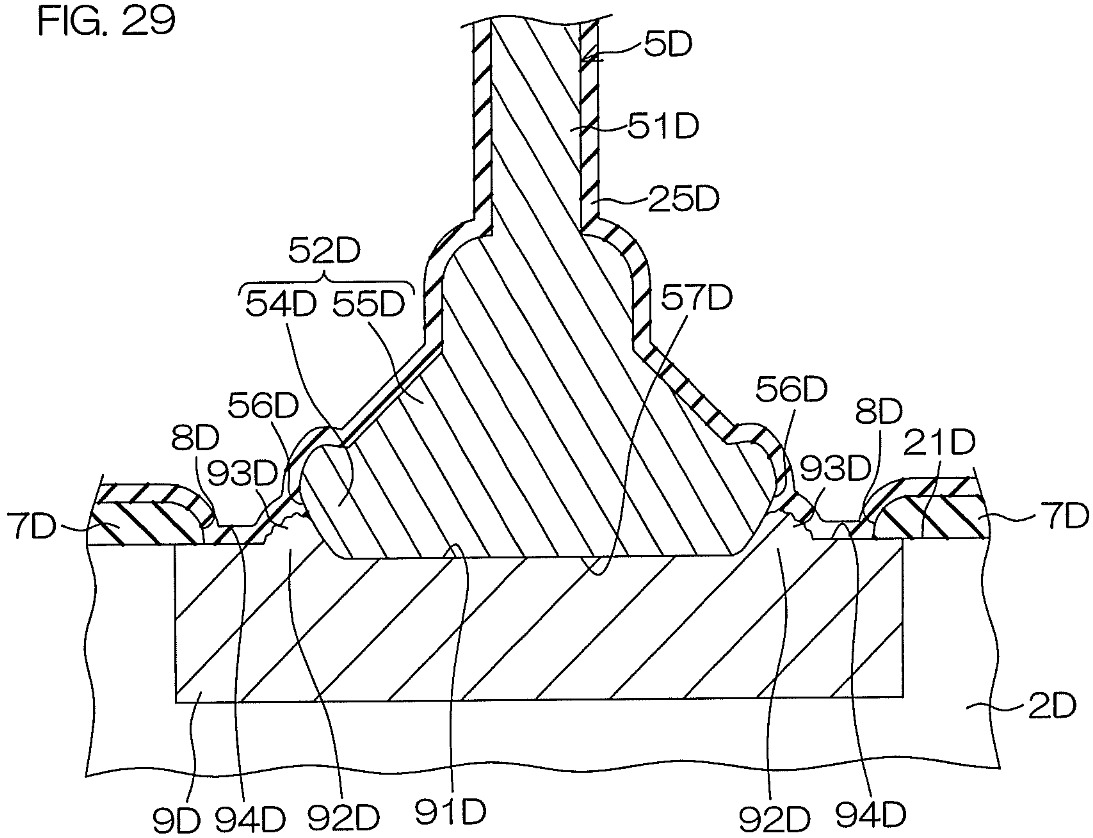
FIG. 29 is an enlarged view of a portion surrounded by a broken-line circle in FIG. 28.

The semiconductor chip 2D has a quadrilateral shape in plan view and has, for example, a multilayer wiring structure arranged by laminating a plurality of wiring layers via interlayer insulating films. Also, the semiconductor chip 2D has a thickness, for example, of 220 to 240 μm (preferably, approximately 230 μm). As shown in FIG. 29, a top surface 21D (surface at one side in a thickness direction) of the semiconductor chip 2D is covered by a top surface protective film 7D.

A plurality of pad openings 8D for exposing an uppermost wiring layer of the multilayer wiring structure are formed in the top surface protective film 7D.

Each pad opening 8D has a quadrilateral shape in plan view and the same number thereof are provided at each edge of the semiconductor chip 2D. The respective pad openings 8D are disposed at equal intervals along the respective sides of the semiconductor chip 2D. A portion of the wiring layer is exposed as an electrode pad 9D of the semiconductor chip 2D from each pad opening 8D.

The uppermost wiring layer exposed as the electrode pads 9D is made, for example, of a metal material that contains Al (aluminum) and is specifically made of a metal material having Al as a main component (for example, an Al—Cu alloy, etc.).

Meanwhile, a rear surface metal 10D that contains, for example, Au, Ni, Ag, etc., is formed on a rear surface 22D (surface at the other side in the thickness direction) of the semiconductor chip 2D.

The die pad 3D is made, for example, of a metal thin plate (for example, Cu or 42 alloy (an alloy containing Fe-42% Ni) and has a larger quadrilateral shape (for example, approximately 2.7 mm square in plan view) than the semiconductor chip 2D in plan view. Also, the die pad 3D has a thickness of 190 to 210 μm (preferably, approximately 200 μm). A pad plating layer 11D that contains Ag, etc., is formed on a top surface 31D (surface at one side in the thickness direction) of the die pad 3D.

The semiconductor chip 2D and the die pad 3D are bonded to each other in a state where the rear surface 22D of the semiconductor chip 2D and the top surface 31D of the die pad 3D face each other as bond surfaces with a bonding material 12D interposed between the rear surface 22D and the top surface 31D. The semiconductor chip 2D is thereby supported by the die pad 3D in an orientation where the top surface 21D faces upward.

The bonding material 12D is made, for example, of solder paste or other conductive paste. As the bonding material 12D, an insulating paste, such as a silver paste, an alumina paste, may be applied and in this case, the rear surface metal 10D and/or the pad plating layer 11D may be omitted. Also, in the state where the semiconductor chip 2D and the die pad 3D are bonded, a thickness of the bonding material 12D is, for example, 10 to 20 μm.

A rear surface 32D (surface at the other side in the thickness direction) of the die pad 3D is exposed from the resin package 6D. A solder plating layer 13D made, for example, of a metal material, such as tin (Sn), tin-silver alloy (Sn—Ag), is formed on the exposed other-side surface.

The electrode leads 4D are made of the same metal thin plate (containing, for example, Cu or 42 alloy (Fe-42% Ni, etc.) as the die pad 3D. The electrode leads 4D are disposed at the periphery of the semiconductor chip 2D with the same number thereof being disposed at both sides in respective directions orthogonal to respective side surfaces of the die pad 3D. The electrode leads 4D that face each side surface of the die pad 3D are disposed at equal intervals in a direction parallel to the facing side surface. A length of each electrode lead 4D in the direction of facing the die pad 3D is, for example, 390 to 410 μm (preferably, approximately 400 μm). A lead plating layer 14D that contains Ag, etc., is formed on a top surface 41D (surface at one side in the thickness direction) of each electrode lead 4D.

Meanwhile, a rear surface 42D (surface at the other side in the thickness direction) of each electrode lead 4D is exposed from the resin package 6D. A solder plating layer 15D made, for example, of a metal material, such as tin (Sn), tin-silver alloy (Sn—Ag), is formed on the exposed rear surface 42D.

Each bonding wire 5D is made of copper (for example, a high-purity copper of no less than 99.9999% (6N) purity or no less than 99.99% (4N) purity that may contain a minute amount of impurity). Each bonding wire 5D includes a linearly-extending, cylindrical main body portion 51D and includes a pad bond portion 52D and a lead bond portion 53D formed at respective ends of the main body portion 51D and respectively bonded to an electrode pad 9D and an electrode lead 4D.

The main body portion 51D is curved parabolically upward from the one end at the electrode pad 9D side toward an outer side of the semiconductor chip 2D and made impingent at an acute angle at the other end on the top surface 41D of the electrode lead 4D.

The pad bond portion 52D is smaller than the electrode pad 9D in plan view. The pad bond portion 52D has a humped shape in sectional view that integrally includes a substantially disk-shaped base portion 54D, which, at its other side in the thickness direction, contacts a top surface of the electrode pad 9D, and a substantially umbrella-shaped projecting portion 55D projecting from the one side of the base portion 54D and having a tip connected to the one end of the main body portion 51D.

A side surface 56D of the base portion 54D is curved so as to bulge outward in a radial direction beyond an outer periphery of a surface at the other side (rear surface 57D of the base portion 54D) that has a substantially circular shape in plan view and contacts the electrode pad 9D. Thus, in plan view, the base portion 54D overlaps with a substantially circular bond region 91D, which is a portion of the electrode pad 9D that contacts the rear surface 57D and is bonded to the base portion 54D, and a peripheral region 92D of substantially annular shape that surrounds the bond region 91D and does not contact the base portion 54D.

In the peripheral region 92D of the electrode pad 9D, a protruding portion 93D is formed by a material of the electrode pad 9D being pressingly spread and raised by an FAB 24D (to be described below) during bonding of the bonding wire 5D. The protruding portion 93D is not lifted above a top surface 94D of the electrode pad 9D and contacts the top surface 94D.

The lead bond portion 53D has a wedge-like shape in sectional view that is relatively thick at the one end side close to the main body portion 51D and becomes relatively thinner toward the other end side away from the main body portion 51D.

As in the first preferred embodiment, in the semiconductor device 1D, the entire top surface 21D and side surfaces 28D of the semiconductor chip 2D, the entire top surface 31D and side surfaces of the die pad 3D, the entire top surfaces 41D and side surfaces inside the resin package 6D of the electrode leads 4D, and the entire bonding wires 5D are covered by an integral water-impermeable insulating film 25D.

As the resin package 6D, a known material, such as an epoxy resin, may be applied. The resin package 6D makes up an outer shape of the semiconductor device 1D and is formed to a substantially rectangular parallelepiped shape. In terms of size, the resin package 6D has a planar size, for example, of approximately 4 mm square and a thickness, for example, of 0.80 to 0.90 mm and preferably, approximately 0.85 mm.

Figure 27:
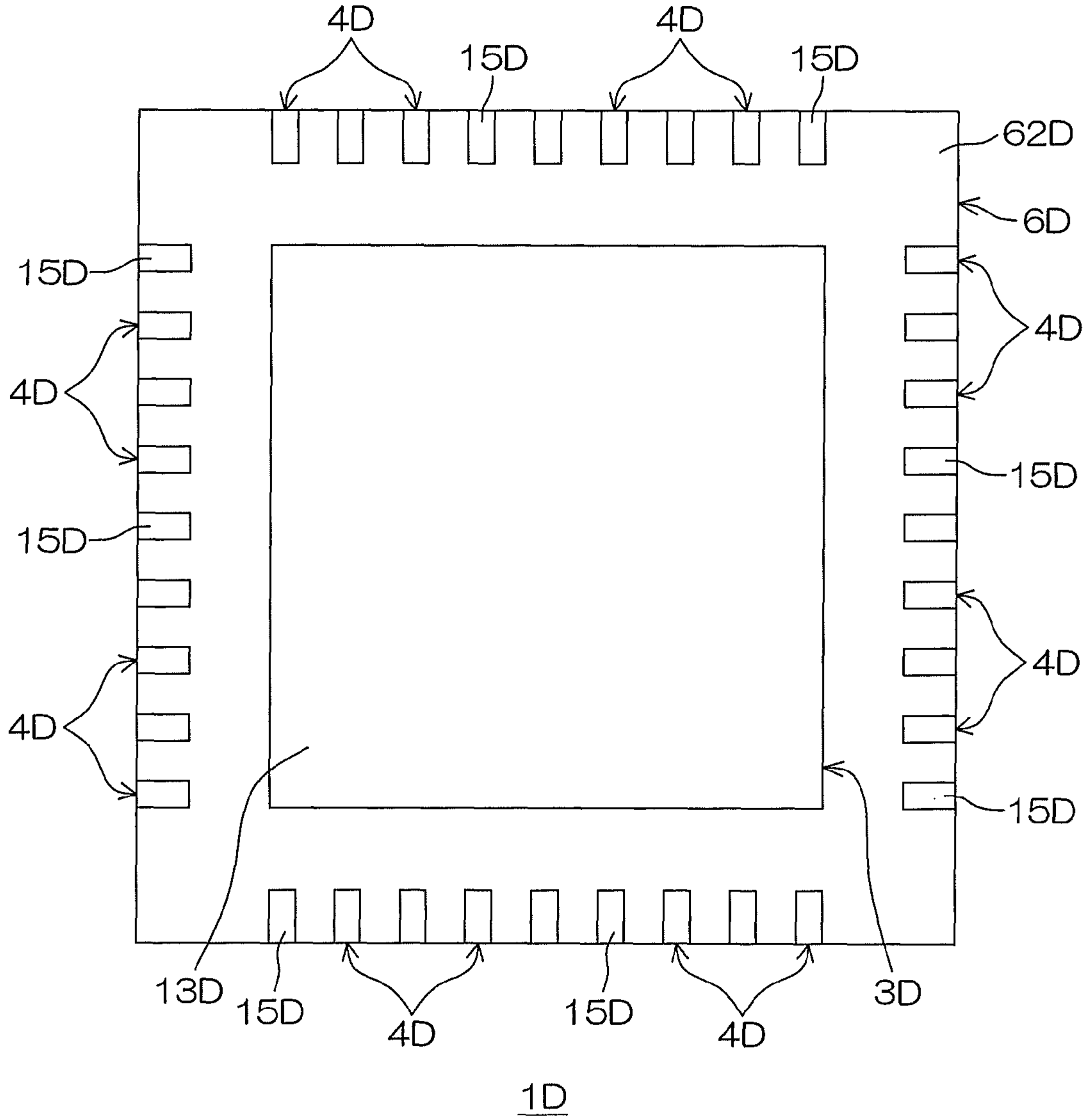
FIG. 27 is a schematic bottom view of a semiconductor device according to a fourth preferred embodiment of the present invention.
Figure 28:
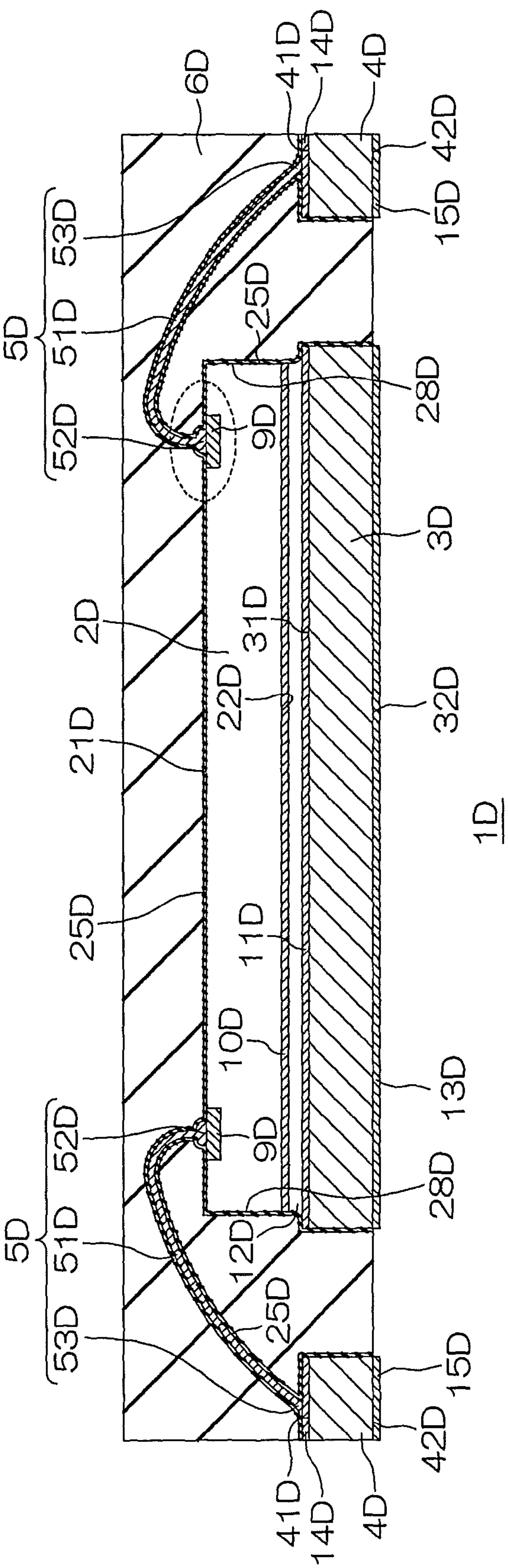
FIG. 28 is a schematic sectional view of the semiconductor device according to the fourth preferred embodiment of the present invention.

FIG. 30A to FIG. 30E are schematic sectional views for describing a method for manufacturing the semiconductor device shown in FIG. 27 and FIG. 28 in order of process.

To manufacture the semiconductor device 1D, for example, first, a lead frame 20D that includes a plurality of units each integrally having a die pad 3D and electrode leads 4D is prepared. In FIG. 30A to FIG. 30E, an entire view of the lead frame 20D is abbreviated and the die pad 3D and electrode leads 4D of just a single unit necessary for mounting a single semiconductor chip 2D are shown.

Next, a metal plating of Ag, etc., is applied to a top surface of the lead frame 20D by a plating method. The pad plating layer 11D and the lead plating layer 14D are thereby formed at the same time.

Figure 30A:
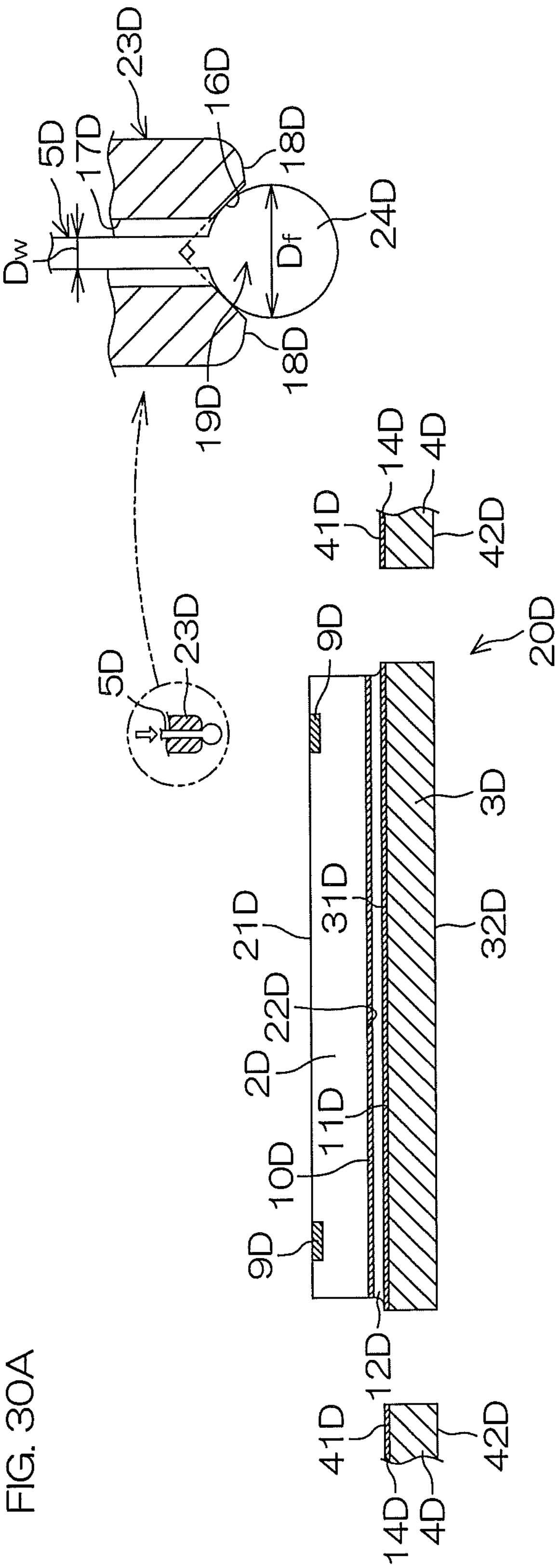
FIG. 30A is a schematic sectional view for describing a method for manufacturing the semiconductor device of FIG. 27.

Next, as shown in FIG. 30A, the semiconductor chips 2D are die bonded via the bonding material 12D to all die pads 3D on the lead frame 20D.

Next, bonding of each bonding wire 5D is performed by a wire bonder (not shown) that includes a capillary 23D.

The capillary 23D included in the wire bonder has a substantially cylindrical shape with a straight hole 17D, through which the bonding wire 5D is inserted, formed at a center, and during wire bonding, the bonding wire 5D is fed out from a tip of the straight hole 17D.

A face portion 18D, which is substantially perpendicular to a longitudinal direction of the straight hole 17D and, in plan view, has an annular shape concentric to the straight hole 17D, and a chamfer portion 19D, which is recessed in the longitudinal direction of the straight hole 17D from the face portion 18D, are formed at a tip portion of the capillary 23D.

A side surface 16D of the chamfer portion 19D is formed to a conical surface connecting an inner circumferential circle of the face portion 18D and a circumferential surface of the straight hole 17D. The side surface 16D is thus rectilinear in sectional view and in the present preferred embodiment, an apex angle (chamfer angle) thereof is set, for example, to 90°.

In the wire bonding process, first, a spherical FAB 24D (free air ball) is formed on a tip portion (one end portion) of the bonding wire 5D held by the capillary 23D by application of a current to the tip portion. The applied current I is set to a larger value the larger a wire diameter (diameter) $D_w$ of the main body portion 51D, and for example, I=40 mA when $D_w$=25 μm, I=60 mA when $D_w$=30 μm, and I=120 mA when $D_w$=38 μm. A current application time is set to an appropriate length according to an intended diameter $D_f$ of the FAB 24D.

Figure 30B:
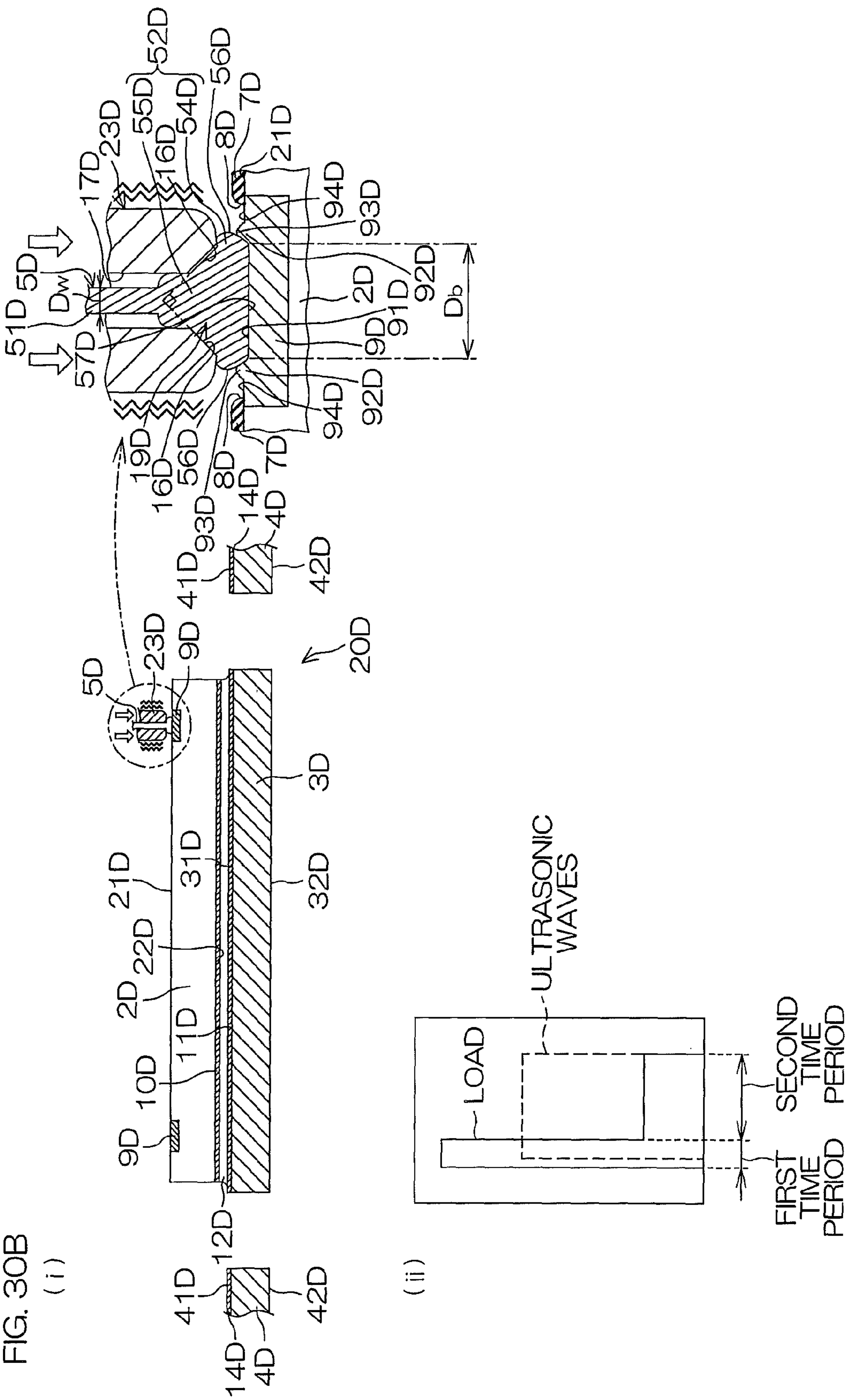
FIG. 30B is a diagram of a step subsequent to that of FIG. 30A.

Next, as shown in FIG. 30B(i), the capillary 23D moves to a position directly above an electrode pad 9D and thereafter descends so that the FAB 24D contacts the electrode pad 9D. In this process, a load (open arrows in FIG. 30B(i)) and ultrasonic waves (zigzag lines in FIG. 30B(i)) are applied from the capillary 23D to the FAB 24D.

In the application of the load and the ultrasonic waves, in a first time period (for example, of 1 to 5 msec and preferably, approximately 3 msec) at an initial stage of pressing after the FAB 24D has descended and contacted the electrode pad 9D, a relatively large load is applied, and thereafter during a second time period (for example, of 2 to 20 msec) longer than the first time period, a relatively small load is applied as shown in FIG. 30B(ii).

The relatively large load W is set in accordance with the wire diameter $D_w$ of the main body portion 51C and an intended diameter $D_b$ of the base portion 54D and, for example, W=80 g when $D_w$=25 μm and $D_b$=58 μm, W=130 g when $D_w$=30 μm and $D_b$=74 μm, and W=240 g when $D_w$=38 μm and $D_b$=104 μm.

Also, in the initial stage of pressing of the FAB 24D, the ultrasonic waves are, for example, not applied at the same time as the relatively large load but is applied immediately after (for example, 1 msec after) the application of the relatively large load and is thereafter applied continuously at a fixed magnitude until the end of application of the load (for example, 2 to 20 msec). The applied ultrasonic waves, in terms of output values of the apparatus are, for example, of 120 kHz and 50 to 120 mA. The ultrasonic waves may be applied in a period until the initial stage of pressing of the FAB 24D (for example, during descending of the FAB 24D).

The applications of the load and the ultrasonic waves are ended at the same time. Or, the application of the ultrasonic waves ends first and the application of the load ends thereafter. A portion of the FAB 24D is thereby made to spread below the face portion 18D to form the base portion 54D while the remaining portion remains inside the chamfer portion 19D while being pushed inside the straight hole 17D to form the projecting portion 55D. Consequently, the one end portion of the bonding wire 5D is bonded as the pad bond portion 52D to the electrode pad 9D, and a first bond is formed.

Figure 30C:
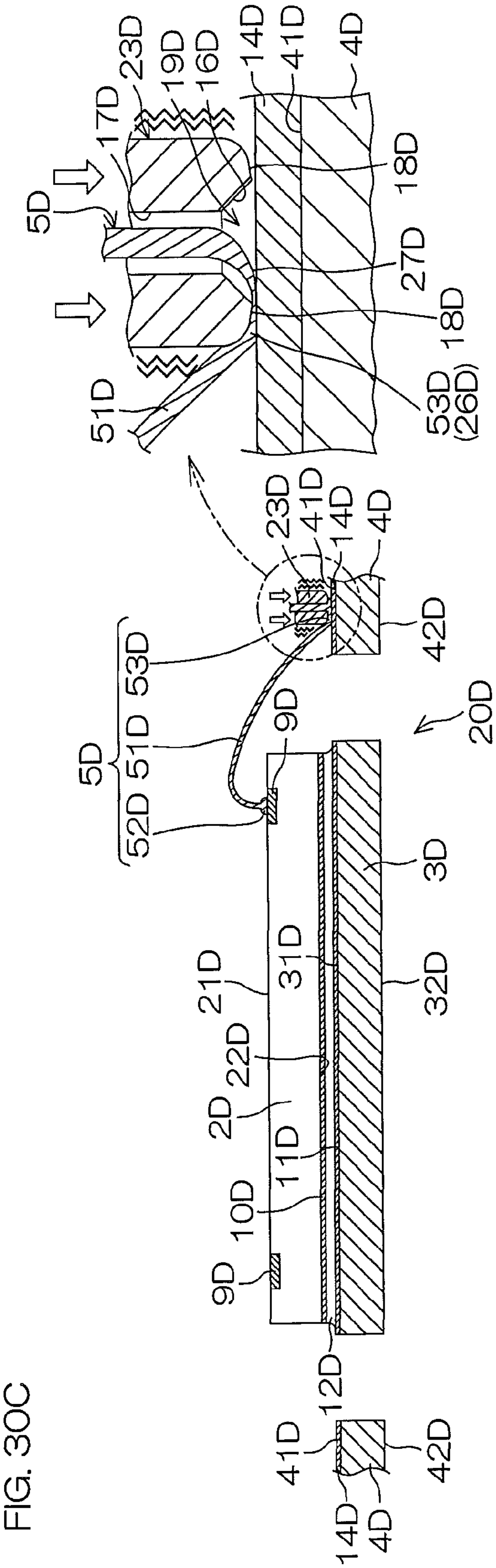
FIG. 30C is a diagram of a step subsequent to that of FIG. 30B.

After the first bond has been formed, the capillary 23D rises to a fixed height and moves to a position directly above an electrode lead 4D. Then, as shown in FIG. 30C, the capillary 23D descends again and the bonding wire 5D contacts the electrode lead 4D. In this process, a load (open arrows in FIG. 30C) and ultrasonic waves (zigzag lines in FIG. 30C) are applied from the capillary 23 to the bonding wire 5D so that the bonding wire 5D deforms according to the shape of the face portion 18D of the capillary 23D and is bonded to the electrode lead 4D (forming of a stitch bond 26D and a tail bond 27D).

The capillary 23D then rises and in a state where a tail of a fixed length is secured from a tip of the capillary 23D, the bonding wire 5D is broken from a position of the tail bond 27D. The other end of the bonding wire 5D that has been stitch bonded thus remains as the lead bond portion 53D on the electrode lead 4D and a second bond is thereby formed.

Figure 30D:
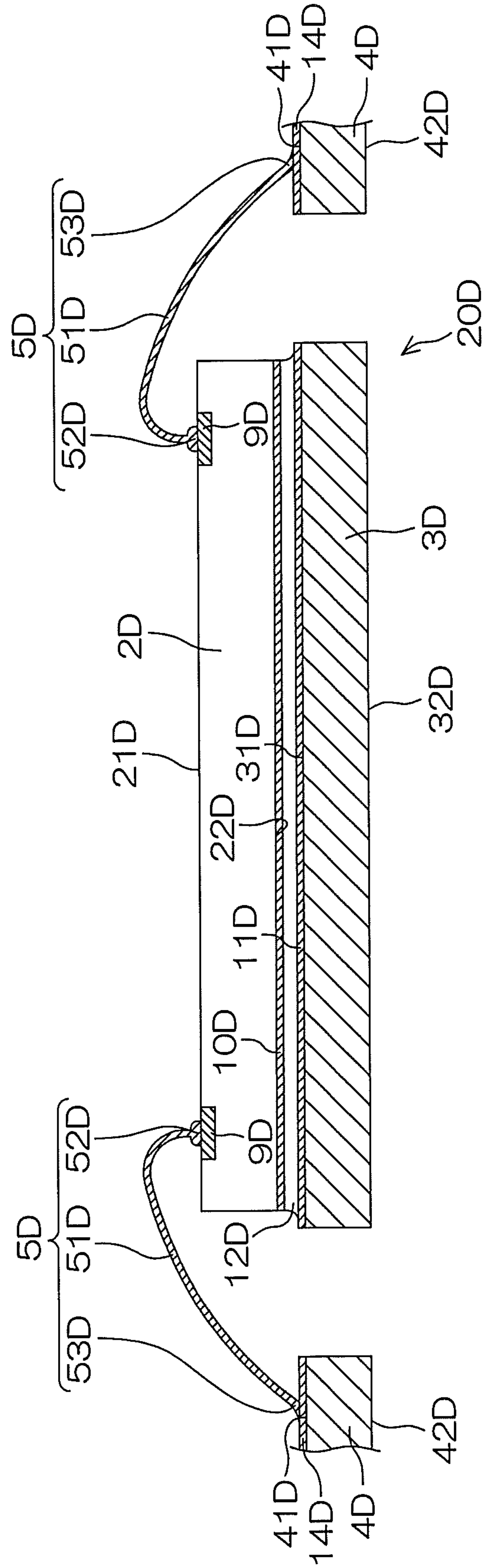
FIG. 30D is a diagram of a step subsequent to that of FIG. 30C.

Thereafter, as shown in FIG. 30D, the same processes as those of FIG. 30A to 30D are performed so that the respective electrode pads 9D of all semiconductor chips 2D and the electrode leads 4D corresponding to the respective electrode pads 9D are connected by the bonding wires 5D.

Figure 30E:
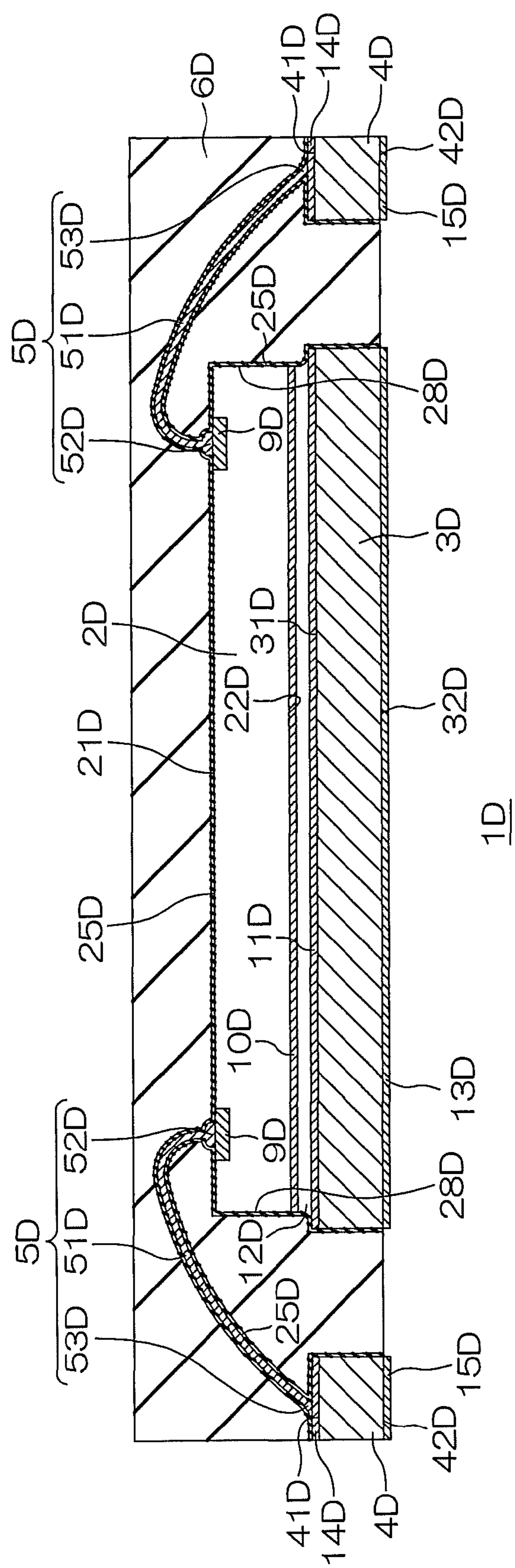
FIG. 30E is a diagram of a step subsequent to that of FIG. 30D.

After all of the wire bonding ends, the water-impermeable insulating film 25D is formed by the same method as that of FIG. 4D. After the forming of the water-impermeable insulating film 25D, the lead frame 20D is set in a forming mold and all semiconductor chips 2D are sealed in a batch together with the lead frame 20D by the resin package 6D as shown in FIG. 30E. Solder plating layers 13D and 15D are then formed on the rear surfaces 32D of the die pads 3D and the rear surfaces 42D of the electrode leads 4D that are exposed from the resin package 6D. Lastly, a dicing saw is used to cut the lead frame 20A together with the resin package 6D to sizes of the respective semiconductor devices 1D and the individual semiconductor devices 1D one of which is shown in FIG. 28 are thereby obtained.

As described above, with the present method, after the FAB 24D has been formed on the tip portion of the bonding wire 5D made of copper, the FAB 24D is bonded as the pad bond portion 52D to the electrode pad 9D by ultrasonically vibrating the FAB 24D while pressing it against the electrode pad 9D.

During bonding of the FAB 24D, a fixed load and ultrasonic waves are not applied for the same time period to the FAB 24D, but as shown in FIG. 30B (ii), in the first time period (initial stage of pressing) after the FAB 24D has descended and contacted the electrode pad 9D, the relatively large load is applied, and the ultrasonic waves are applied while applying the relatively large load during the first time period. Thus, during the first time period, the FAB 24D can be deformed effectively to the shape of the pad bond portion 52D.

Then, in a latter stage of pressing after the first time period, the relatively small load is applied for the second time period that is longer than the first time period. Thus, during the second time period, the bonding wire 5D can be bonded with excellent strength to the electrode pad 9D by the ultrasonic waves applied at the same time as the relatively small load.

Figure 31:
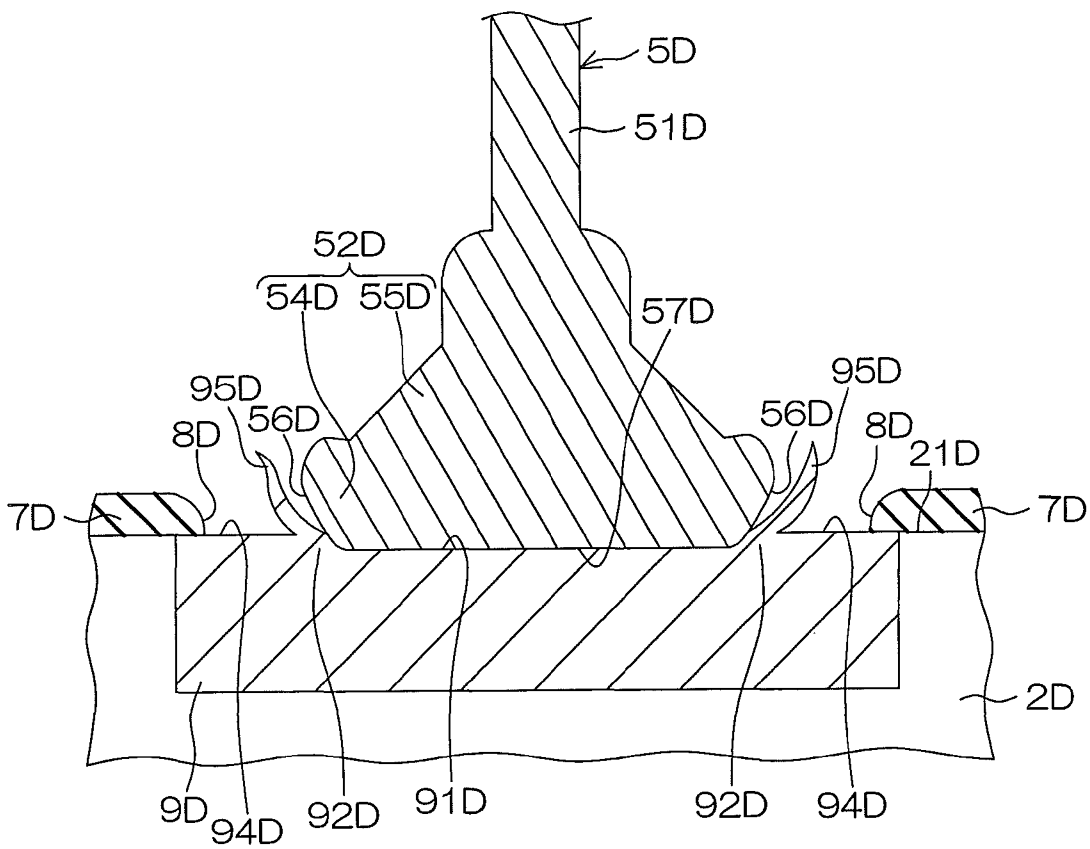
FIG. 31 is a diagram of a state of occurrence of excessive splash at an electrode pad.

In bonding the copper wire to the electrode pad, if the load and the ultrasonic waves are made greater than those in conditions for a gold wire and the large load and ultrasonic waves are applied at the fixed magnitudes for the same time period, so-called excessive splash, with which the material of the pad that is pressingly spread by the metal ball is lifted above the top surface of the electrode pad and protrudes greatly outward, may occur. For example, to describe using the reference symbols in FIG. 27 to FIG. 29, an excessive splash 95D that is lifted outward from the peripheral region 92D of the electrode pad 9D may occur as shown in FIG. 31.

However, with the above-described method, the load applied to the FAB 24D after the initial stage of pressing is made relatively small and the pressingly spreading of the electrode pad 9D due to the FAB 24D to which the ultrasonic waves are applied can be suppressed. Consequently, the occurrence of excessive splash at the electrode pad 9D can be suppressed.

Also, the relatively large load is applied to the electrode pad 9D only in the period of the initial stage and thus application of a large load to a portion directly below the electrode pad 9D can be suppressed. Occurrence of crack in the semiconductor chip 2D can thus be suppressed.

Thus, with the semiconductor device 1D obtained by the above-described method, the protruding portion 93D, with which the material of the electrode pad 9D is pressingly spread by the FAB 24D and protrudes upward during the bonding of the bonding wire 5D, can be held at simply rising from the top surface 94D of the electrode pad 9D and be prevented from being lifted from the top surface 94D.

Especially, in a semiconductor device, such as the semiconductor device 1D, in which the electrode pad 9D is made of a metal material that contains aluminum, excessive splash occurs readily in a case where a copper wire is used. However, even with such a semiconductor device 1D, excessive splash can be prevented effectively by using the wire bonding method of the present preferred embodiment.

Although the fourth preferred embodiment of the present invention has been described above, the fourth preferred embodiment may also be modified as follows.

For example, although a QFN type semiconductor device was taken up in the above description of the preferred embodiment, the present invention may also be applied to semiconductor devices of other package types, for example, the QFP (quad flat package), SOP (small outline package), etc.

Figure 32:
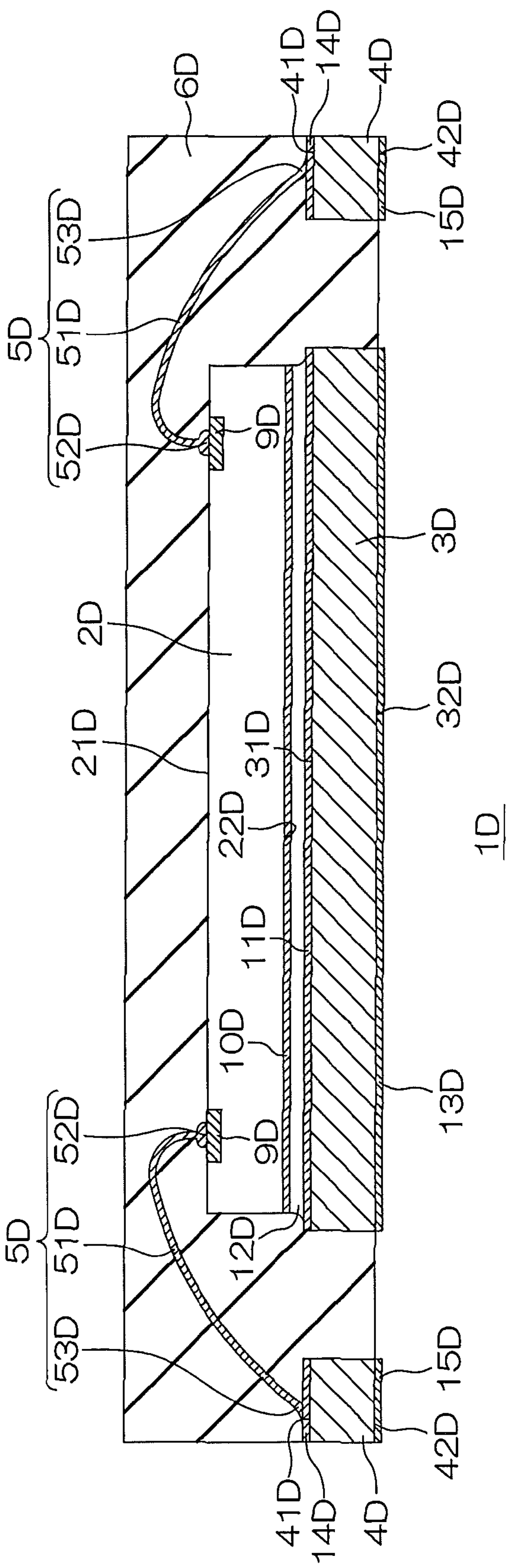
FIG. 32 is a diagram of a modification example of the semiconductor device of FIG. 28.

Also, although with the above-described preferred embodiment, a mode in which the bonding wires 5D are covered by the water-impermeable insulating film 25D was described as an example, the water-impermeable insulating film 25D may be omitted as shown in FIG. 32 as long as at least the fourth object for resolving the fourth issue is achieved.

Next, experiments related to the fourth preferred embodiment were performed. The present invention is not restricted by the following examples.

Example 1

A copper bonding wire of 25 μm wire diameter was held by a capillary and an FAB of 60 μm diameter was prepared at a tip portion thereof.

Figure 33:
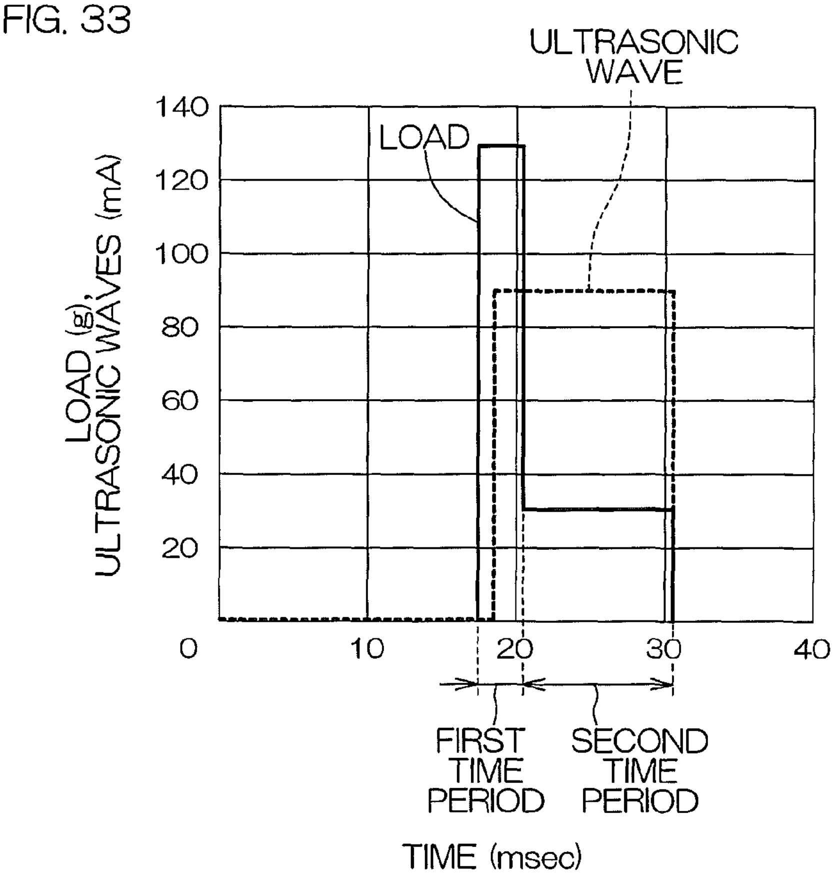
FIG. 33 is a timing chart of load and ultrasonic waves in Example 1 of the fourth preferred embodiment.

The capillary holding the FAB was then moved to a position directly above an electrode pad made of aluminum and then lowered at once onto the electrode pad to make the FAB collide against the electrode pad. In this process, a load of 130 g was applied instantaneously to the FAB and maintained at this magnitude for 3 msec as shown in FIG. 33. Thereafter, the load applied to the FAB was decreased instantaneously to 30 g and maintained at this magnitude for 9 msec. Meanwhile, ultrasonic waves were not applied until the FAB contacted the electrode pad, were applied at 90 mA instantaneously 1 msec after the application of the load of 130 g, and were maintained at this magnitude for 11 msec. The applications of the load and the ultrasonic waves were ended at the same time.

The FAB was bonded as a pad bond portion to the electrode pad by the above operation.

Comparative Example 1

A copper bonding wire of 25 μm wire diameter was held by a capillary and an FAB of 60 μm diameter was prepared at a tip portion thereof.

Figure 34:
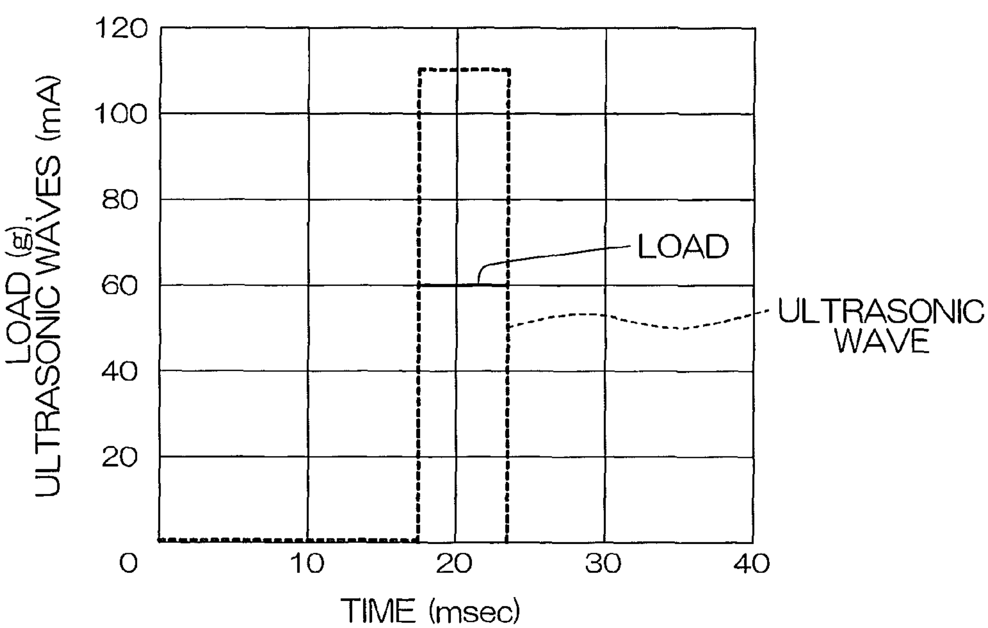
FIG. 34 is a timing chart of load and ultrasonic waves in Comparative Example 1 of the fourth preferred embodiment.

The capillary holding the FAB was then moved to a position directly above an electrode pad made of aluminum and then lowered at once onto the electrode pad to make the FAB collide against the electrode pad. In this process, a load of 60 g was applied instantaneously to the FAB and maintained at this magnitude for 6 msec as shown in FIG. 34. Meanwhile, ultrasonic waves were applied at 130 mA instantaneously at the same time as the application of the load of 60 g and were maintained at this magnitude for 6 msec. The applications of the load and the ultrasonic waves were ended at the same time.

The FAB was bonded as a pad bond portion to the electrode pad by the above operation.

<Evaluation of Splash>

Electron beam scanning of the pad bond portion formed in each of Example 1 and Comparative Example 1 was then performed using a scanning electron microscope (SEM) and SEM images were obtained by image processing of information detected thereby. By observation of the SEM images obtained, whether or not excessive splash occurred during bonding of each pad bond portion was confirmed. An SEM image of Example 1 is shown in FIG. 35 and an SEM image of Comparative Example 1 is shown in FIG. 36.

Figure 36:
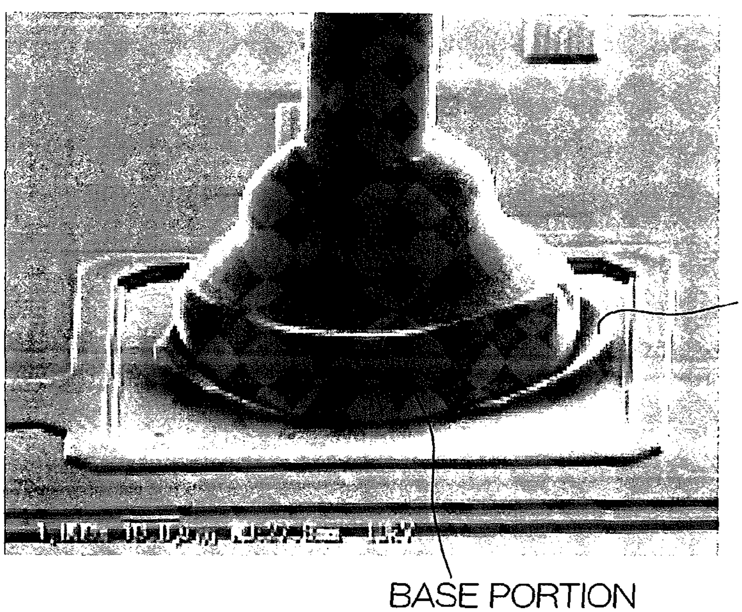
FIG. 36 is an SEM image of a pad bond portion of Comparative Example 1 of the fourth preferred embodiment.

As shown in FIG. 36, with Comparative Example 1 in which the load and ultrasonic waves of fixed levels were applied for the same time period in bonding the pad bond portion, it was confirmed that excessive splash occurred in which the electrode pad was pressingly spread by the FAB and material of the pad was lifted from a top surface of the electrode pad and protruded greatly outward.

Figure 35:
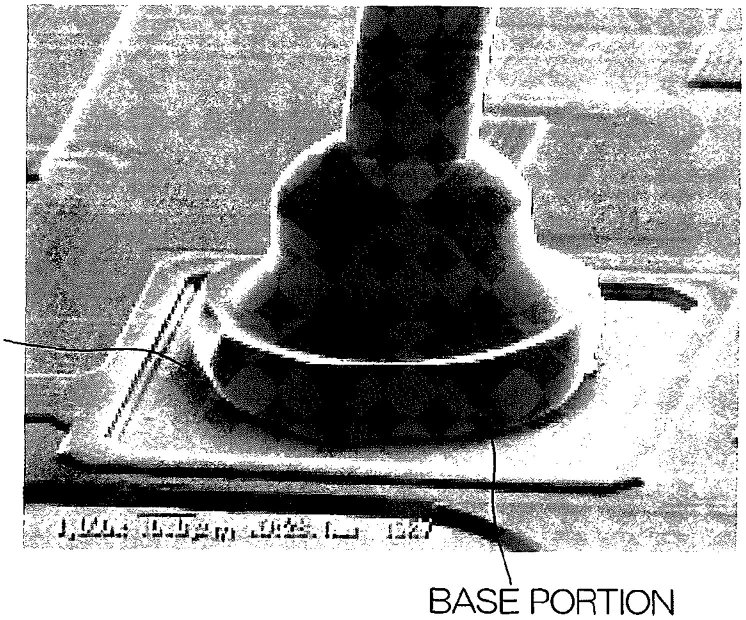
FIG. 35 is an SEM image of a pad bond portion of Example 1 of the fourth preferred embodiment.

On the other hand, as shown in FIG. 35, with Example 1 in which the relatively large load of 130 g was applied instantaneously at the initial stage of pressing of the FAB and thereafter the relatively small load of 30 g was applied instantaneously, it was confirmed that the portion of the pad material that was pressingly spread by the FAB remained at being simply raised and was not lifted from the top surface of the electrode pad.

Fifth Preferred Embodiment FIG. 37 to FIG. 43

By disclosure of a fifth preferred embodiment, a fifth issue concerning a fifth background art described below can be resolved in addition to the issues described above in the "OBJECT(S) OF THE INVENTION."

(1) Fifth Background Art

Semiconductor devices are normally distributed in a state where a semiconductor chip is sealed (packaged) together with bonding wires by a resin. Inside the package, electrode pads of the semiconductor chip are electrically connected by the bonding wires to electrode leads that are partially exposed from the resin package. By connecting the electrode leads as external terminals to wirings on a mounting board, electrical connection of the semiconductor chip and the mounting board is achieved.

Although conventionally, gold wires are mainly used as the bonding wires connecting the electrode pads and the electrode leads, recently, the use of copper wires, which are cheaper than gold wires, is being examined for reducing the use of high-priced gold.

A first bond, which is a bond of a bonding wire and an electrode pad, is formed, for example, by first applying energy to a tip portion of a bonding wire held by a capillary of a wire bonder and melting the wire material by heat of a resulting spark. The molten wire material becomes an FAB (free air ball) due to surface tension.

Next, the capillary moves to a position directly above an electrode pad and thereafter descends so that the FAB contacts the electrode pad. In this process, a load and ultrasonic waves are applied to the FAB by the capillary. The FAB is thereby deformed in accordance with a shape of the tip of the capillary and the first bond portion is formed.

(2) Fifth Issue

However, normally, Al wiring covered by an interlayer insulating film is disposed directly below the electrode pad so as to face the electrode pad. Also, a Ti/TiN layer (barrier layer) that is harder than the Al wiring is interposed between the interlayer insulating film and the electrode pad.

With such a structure, when a load is applied to the FAB put in contact with the electrode pad and the barrier layer is thereby pressed toward the Al wiring side, stress tends to concentrate at the relatively hard barrier layer due to the difference in hardness between the barrier layer and the wiring. Thus, depending on the magnitude of the stress concentrating at the barrier layer, a crack may occur in the barrier layer and cause a fault, such as short-circuiting between wirings.

Thus, a fifth object of the present invention related to the fifth preferred embodiment is to provide a semiconductor device with which, during bonding of a bonding wire made of copper and an electrode pad, occurrence of crack in a barrier layer directly below the electrode pad can be prevented.

(3) Disclosure of a Specific Preferred Embodiment

Figure 37:
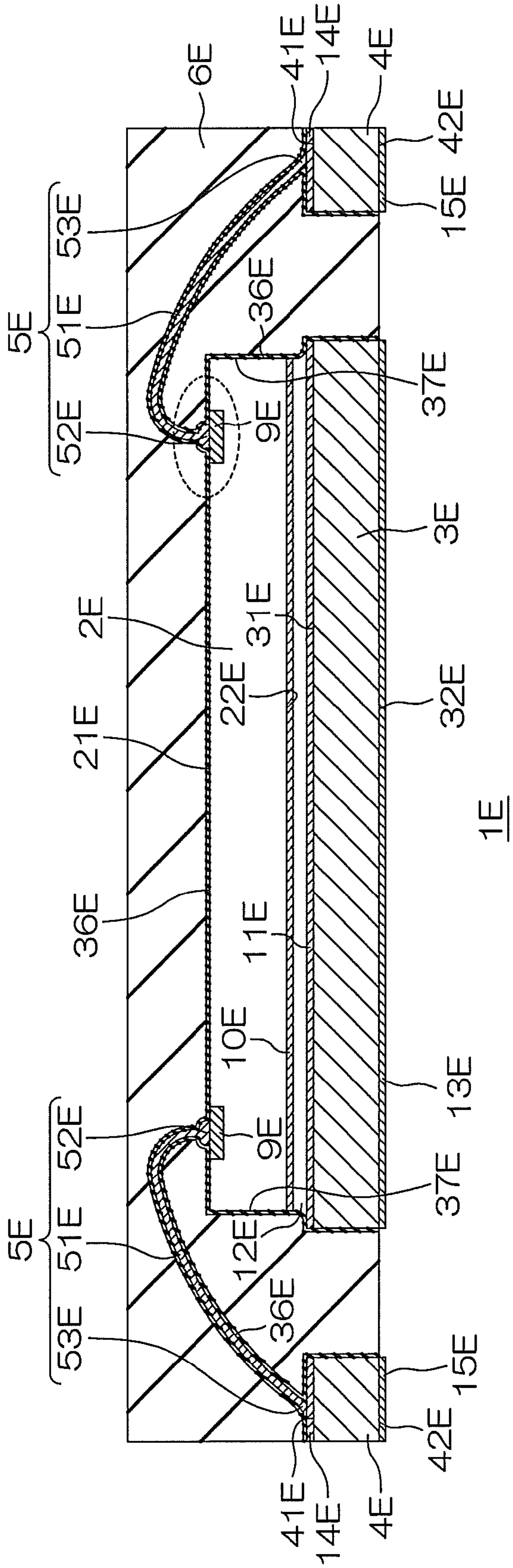
FIG. 37 is a schematic sectional view of a semiconductor device according to a fifth preferred embodiment of the present invention.

FIG. 37 is a schematic sectional view of a semiconductor device according to the fifth preferred embodiment of the present invention.

The semiconductor device 1E is a semiconductor device to which a QFN (quad flat non-leaded) configuration is applied. The semiconductor device 1E includes a semiconductor chip 2E, a die pad 3E supporting the semiconductor chip 2E, a plurality of electrode leads 4E disposed at a periphery of the semiconductor chip 2E, bonding wires 5E electrically connecting the semiconductor chip 2E and the electrode leads 4E, and a resin package 6E sealing the above components.

The semiconductor chip 2E has a quadrilateral shape in plan view and has a multilayer wiring structure arranged by laminating a plurality of wirings via interlayer insulating films. The multilayer wiring structure of the semiconductor chip 2E shall be described in detail later with reference to FIG. 38 and FIG. 39. The semiconductor chip 2E has a thickness, for example, of 220 to 240 μm (preferably, approximately 230 μm). A top surface 21E (surface at one side in a thickness direction) of the semiconductor chip 2E is covered by a top surface protective film 7E (see FIG. 38).

At the top surface 21E of the semiconductor chip 2E, portions of a wiring (a third wiring 28E to be described below) of the multilayer wiring structure are exposed as electrode pads 9E from pad openings 8E to be described below.

Meanwhile, a rear surface metal 10E that contains, for example, Au, Ni, Ag, etc., is formed on a rear surface 22E (surface at the other side in the thickness direction) of the semiconductor chip 2E.

The die pad 3E is made, for example, of a metal thin plate (for example, Cu or 42 alloy (an alloy containing Fe-42% Ni) and has a larger quadrilateral shape (for example, approximately 2.7 mm square in plan view) than the semiconductor chip 2E in plan view. Also, the die pad 3E has a thickness of 190 to 210 μm (preferably, approximately 200 μm). A pad plating layer 11E that contains Ag, etc., is formed on a top surface 31E (surface at one side in the thickness direction) of the die pad 3E.

The semiconductor chip 2E and the die pad 3E are bonded to each other in a state where the rear surface 22E of the semiconductor chip 2E and the top surface 31E of the die pad 3E face each other as bond surfaces with a bonding material 12E interposed between the rear surface 22E and the top surface 31E. The semiconductor chip 2E is thereby supported by the die pad 3E in an orientation where the top surface 21E faces upward.

The bonding material 12E is made, for example, of solder paste or other conductive paste. As the bonding material 12E, an insulating paste, such as a silver paste, an alumina paste, may be applied and in this case, the rear surface metal 10E and/or the pad plating layer 11E may be omitted. Also, in the state where the semiconductor chip 2E and the die pad 3E are bonded, a thickness of the bonding material 12E is, for example, 10 to 20 μm.

A rear surface 32E (surface at the other side in the thickness direction) of the die pad 3E is exposed from the resin package 6E. A solder plating layer 13E made, for example, of a metal material, such as tin (Sn), tin-silver alloy (Sn—Ag), is formed on the exposed other-side surface.

The electrode leads 4E are made, for example, of the same metal thin plate (containing, for example, Cu or 42 alloy (Fe-42% Ni, etc.) as the die pad 3E. The electrode leads 4E are disposed at the periphery of the semiconductor chip 2E at both sides in respective directions orthogonal to respective side surfaces of the die pad 3E. The electrode leads 4E that face each side surface of the die pad 3E are disposed at equal intervals in a direction parallel to the facing side surface. A length of each electrode lead 4E in the direction of facing the die pad 3E is, for example, 240 to 260 μm (preferably, approximately 250 μm). A lead plating layer 14E that contains Ag, etc., is formed on atop surface 41E (surface at one side in the thickness direction) of each electrode lead 4E.

Meanwhile, a rear surface 42E (surface at the other side in the thickness direction) of each electrode lead 4E is exposed from the resin package 6E. A solder plating layer 15E made, for example, of a metal material, such as tin (Sn), tin-silver alloy (Sn—Ag), is formed on the exposed rear surface 42E.

Each bonding wire 5E is made of copper (for example, a high-purity copper of no less than 99.9999% (6N) purity or no less than 99.99% (4N) purity that may contain a minute amount of impurity). Each bonding wire 5E includes a linearly-extending, cylindrical main body portion 51E and includes a pad bond portion 52E and a lead bond portion 53E formed at respective ends of the main body portion 51E and respectively bonded to an electrode pad 9E and an electrode lead 4E.

The main body portion 51E is curved parabolically upward from the one end at the electrode pad 9E side toward an outer side of the semiconductor chip 2E and made impingent at an acute angle at the other end on the top surface 41E of the electrode lead 4E.

The lead bond portion 53E has a wedge-like shape in sectional view that is relatively thick at the one end side close to the main body portion 51E and becomes relatively thinner toward the other end side away from the main body portion 51E.

As in the first preferred embodiment, in the semiconductor device 1E, the entire top surface 21E and side surfaces 37E of the semiconductor chip 2E, the entire top surface 31E and side surfaces of the die pad 3E, the entire top surfaces 41E and side surfaces inside the resin package 6E of the electrode leads 4E, and the entire bonding wires 5E are covered by an integral water-impermeable insulating film 36E.

As the resin package 6E, a known material, such as an epoxy resin, may be applied. The resin package 6E makes up an outer shape of the semiconductor device 1E and is formed to a substantially rectangular parallelepiped shape. In terms of size, the resin package 6E has a planar size, for example, of approximately 4 mm square and a thickness, for example, of 0.60 to 0.70 mm and preferably, approximately 0.65 mm.

Figure 38:
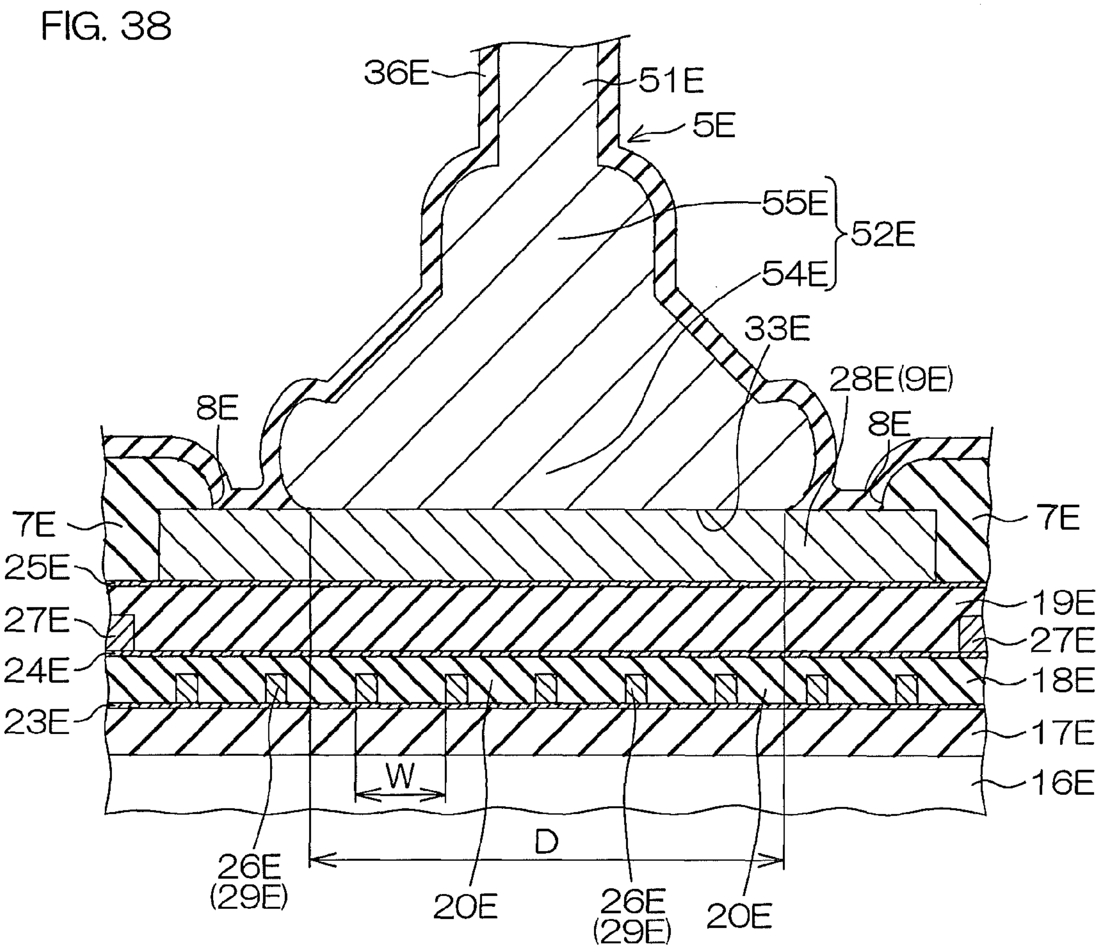
FIG. 38 is a sectional view of principal portions of a semiconductor chip and is an enlarged view of a portion surrounded by a broken-line circle in FIG. 38.
Figure 39:
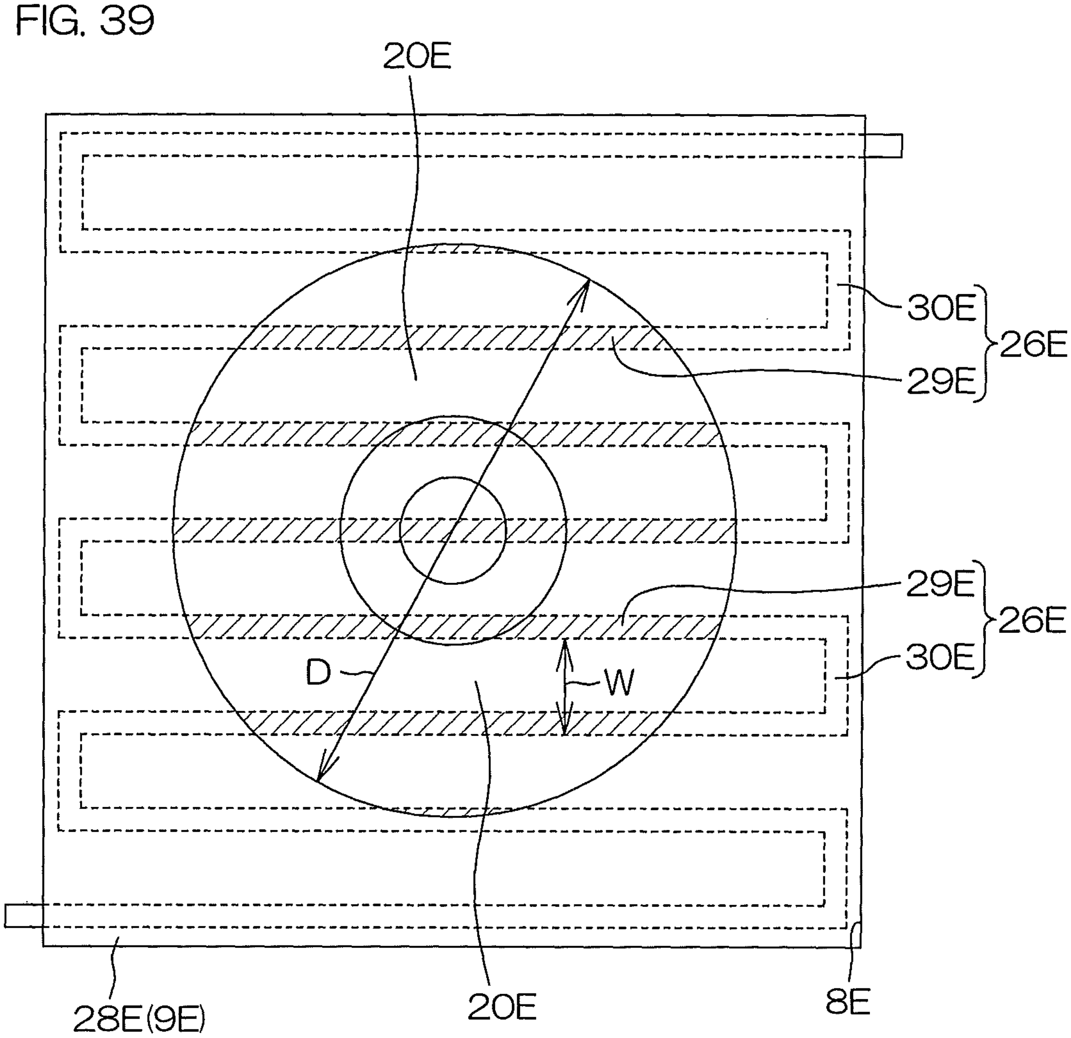
FIG. 39 is a plan view of an electrode pad shown in FIG. 38.

FIG. 38 is a sectional view of principal portions of the semiconductor chip and is an enlarged view of a portion surrounded by a broken-line circle in FIG. 37. FIG. 39 is a plan view of an electrode pad shown in FIG. 38.

The semiconductor chip 2E includes a semiconductor substrate 16E, first to third interlayer insulating films 17E to 19E laminated successively on the semiconductor substrate 16E, first to third barrier layers 23E to 25E formed on respective top surfaces of the first to third interlayer insulating films 17E to 19E, and the top surface protective film 7E covering the top surface 21E of the semiconductor chip 2E.

The semiconductor substrate 16E is made, for example, of silicon.

The first to third interlayer insulating films 17E to 19E are made, for example, of silicon oxide. A first wiring 26E is formed via the first barrier layer 23E on the first interlayer insulating film 17E. Also, a second wiring 27E is formed via the second barrier layer 24E on the second interlayer insulating film 18E. Also, the third wiring 28E is formed via the third barrier layer 25E on the third interlayer insulating film 19E.

The first to third wirings 26E to 28E are made of a metal material that is softer than the material of the first to third barrier layers 23E to 25E, and are made specifically of a metal material that contains Al (aluminum), and made specifically of a metal material having Al as a main component (for example, an Al—Cu alloy, etc.).

By being covered by the top surface protective film 7E, the third wiring 28E is formed between the uppermost interlayer insulating film (third interlayer insulating film 19E) and the top surface protective film 7E. The third wiring 28E has a quadrilateral shape (for example, a quadrilateral shape of 120 μm×120 μm) in plan view. Also, the third wiring 28E has a thickness, for example, of no less than 500 Å and preferably 7000 to 28000 Å.

The pad openings 8E for exposing the third wiring 28E as the electrode pads 9E are formed in the top surface protective film 7E that covers the third wiring 28E.

By being covered by the third interlayer insulating film 19E, the second wiring 27E is formed between the second interlayer insulating film 18E and the third interlayer insulating film 19E. The second wiring 27E is formed in a predetermined pattern. For example, it is formed in a pattern that does not overlap with the electrode pads 9E in plan view. The second wiring 27E has a thickness, for example, of 3000 to 9000 Å.

By being covered by the second interlayer insulating film 18E, the first wiring 26E is formed between the first interlayer insulating film 17E and the second interlayer insulating film 18E. The first wiring 26E is formed in a predetermined pattern. For example, directly below each electrode pad 9E, the first wiring 26E has a plurality of rectilinear portions 29E that extend parallel to each other and connecting portions 30E that connect ends at one side of adjacent rectilinear portions 29E and alternately connect ends at the other side of adjacent rectilinear portions 29E and is thereby formed in a meandering pattern that is bent in a substantially sinusoidal form. A single electrode pad 9E (third wiring 28E) thus faces a plurality of rectilinear portions 29E and sandwiched portions 20E of the second interlayer insulating film 18E that are sandwiched between the rectilinear portions 29E.

Mutual intervals between adjacent rectilinear portions 29E (pitch W of the rectilinear portion 29E) are, for example, all equal and are specifically 2 to 10 μm. Also, the first wiring 26E has a thickness, for example, of 3000 to 9000 Å.

The patterns of the first to third wirings 26E to 28E may be changed as suited in accordance with design rules of the semiconductor chip 2E and are not limited to the above-described patterns.

Each of the first to third barrier layers 23E to 25E is made, for example, titanium (TiN), titanium nitride (TiN), tungsten nitride (TiW), or a laminated structure of these, etc. Each of the first to third barrier layers 23E to 25E has a thickness that is less than the thickness of each of the first to third wirings 26E to 28E and is, for example, 500 to 2000 Å.

In plan view, the pad bond portion 52E of the bonding wire 5E that is bonded to the electrode pad 9E is smaller than the electrode pad 9E. The pad bond portion 52E has a humped shape in sectional view that integrally includes a disk-shaped base portion 54E, which, at its one side in the thickness direction, contacts a top surface of the electrode pad 9E, and a bell-shaped projecting portion 55E projecting from the other side of the base portion 54E and having a tip connected to the one end of the main body portion 51E.

With the semiconductor device 1E, an area of the first wiring 26E (area of slanted line portion in FIG. 39) that overlaps a bond region 33E of the bonding wire 5E and the electrode pad 9E in plan view is no more than 26.8% and preferably 0 to 25% of an area S of the bond region 33E.

The bond region 33E is a region of circular shape in plan view in which the base portion 54E of the pad bond portion 52E contacts the top surface of the electrode pad 9E, and its area S can be determined by a formula: $S=n(D/2)^2$ using a diameter D of the base portion 54E.

As described above, with the semiconductor device 1E, the area of the first wiring 26E overlapping the bond region 33E in plan view (overlap area of the first wiring 26E) is no more than 26.8% of the area of the bond region 33E, and thus an area by which each of the second and third barrier layers 24E and 25E directly below the electrode pad 9E faces the first wiring 26E is comparatively small. Thus, for example, even if the second and third barrier layers 24E and 25E are pressed toward the first wiring 26E side during bonding of the bonding wire 5E and the electrode pad 9E, deformations of the first wiring 26E and the second and third interlayer insulating films 18E and 19E due to the pressing are unlikely to occur, and concentration of stress at the second and third barrier layers 24E and 25E due to such deformations can be prevented. Consequently, occurrence of crack in the second and third barrier layers 24E and 25E can be prevented and the semiconductor device 1E can thus be improved in reliability.

When, for example, the overlap area of the first wiring 26E is 0% of the area of the bond region 33E, the semiconductor 1E can be made 0% in defect rate (without any cracks forming whatsoever) regardless of the thickness of the electrode pad 9E (thickness of the third wiring 28E).

Also, the first wiring 26E includes the plurality of rectilinear portions 29E that extend parallel with respect to each other and these are disposed at equal intervals. In such an arrangement, the overlap area of the plurality of rectilinear portions 29E (first wiring 26E) is a total of the overlap area of each rectilinear portion 29E and this total is no more than 26.8% of the area of the bond region 33E. The overlap areas of the respective rectilinear portions 29E are thus all less than 26.8% of the area of the bond region 33E.

A single electrode pad 9E (third wiring 28E) faces a plurality of rectilinear portions 29E and sandwiched portions 20E of the second interlayer insulating film 18E that are sandwiched between the rectilinear portions 29E. The plurality of rectilinear portions 29E, the overlap areas of each of which is less than 26.8% of the area of the bond region 33E, thus face the bond region 33E of the electrode pad 9E while being dispersed in stripe form. Thus, when the second and third barrier layers 24E and 25E are pressed toward the first wiring 26E side, deformation amounts of the first wiring 26E and the second and third interlayer insulating films 18E and 19E due to the pressing can be suppressed to small amounts. Stress concentration at specific locations in the second and third barrier layers 24E and 25E can consequently be suppressed. Occurrence of crack in the second and third barrier layers 24E and 25E can thus be prevented further.

Although the fifth preferred embodiment of the present invention has been described above, the fifth preferred embodiment may also be modified as follows.

For example, the patterns of the first and second wirings 26E and 27E below the electrode pad 9E may be changed as suited as long as the area of the wiring overlapping with the bond region 33E is no more than 26.8% of the area S of the bond region 33E.

Figure 40:
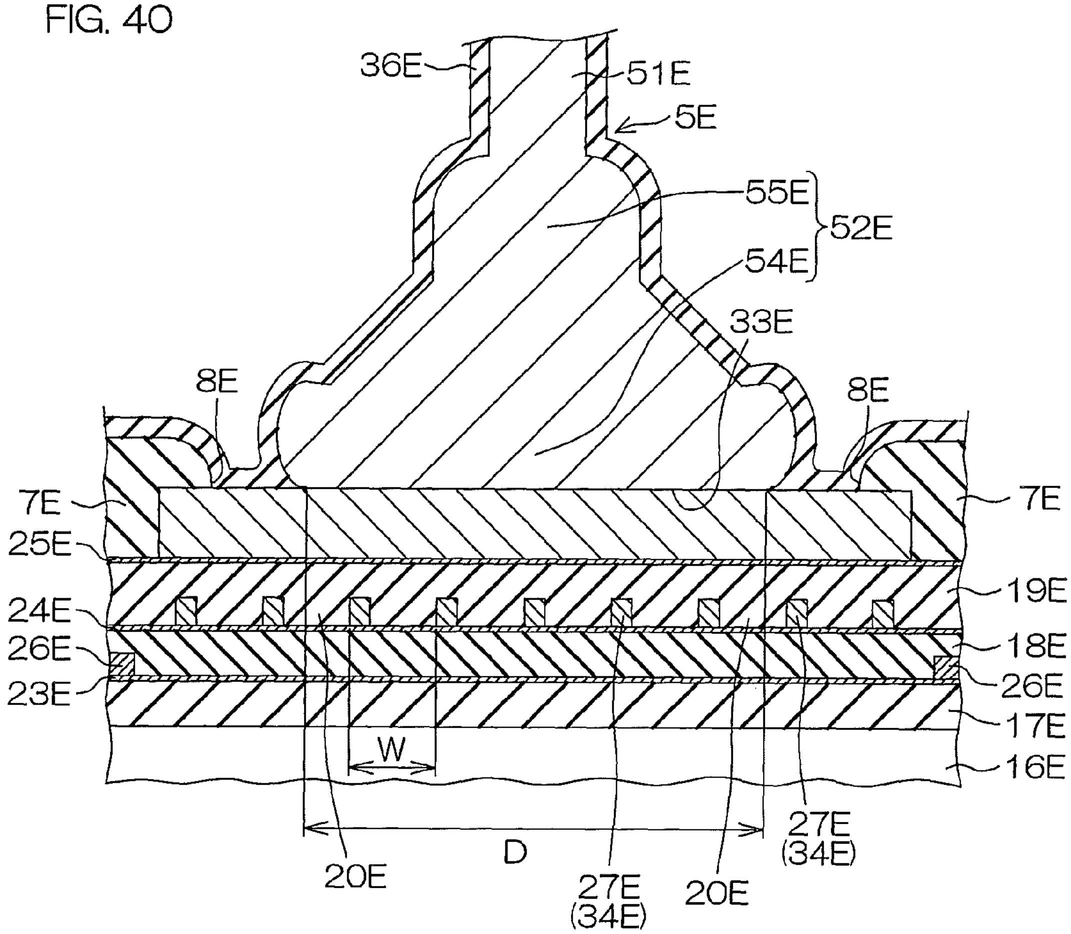
FIG. 40 is a diagram of a first modification example of the semiconductor device of FIG. 37 and is a diagram corresponding to FIG. 38.

For example, as shown in a first modification example in FIG. 40, the first wiring 26E may be formed to a pattern that does not overlap with the electrode pad 9E in plan view, and the second wiring 27E may have a plurality of rectilinear portions 34E that extend parallel to each other and connecting portions 35E that connect ends at one side of adjacent rectilinear portions 34E and alternately connect ends at the other side of adjacent rectilinear portions 34E and be formed in a meandering pattern that is bent in substantially sinusoidal form.

Figure 41:
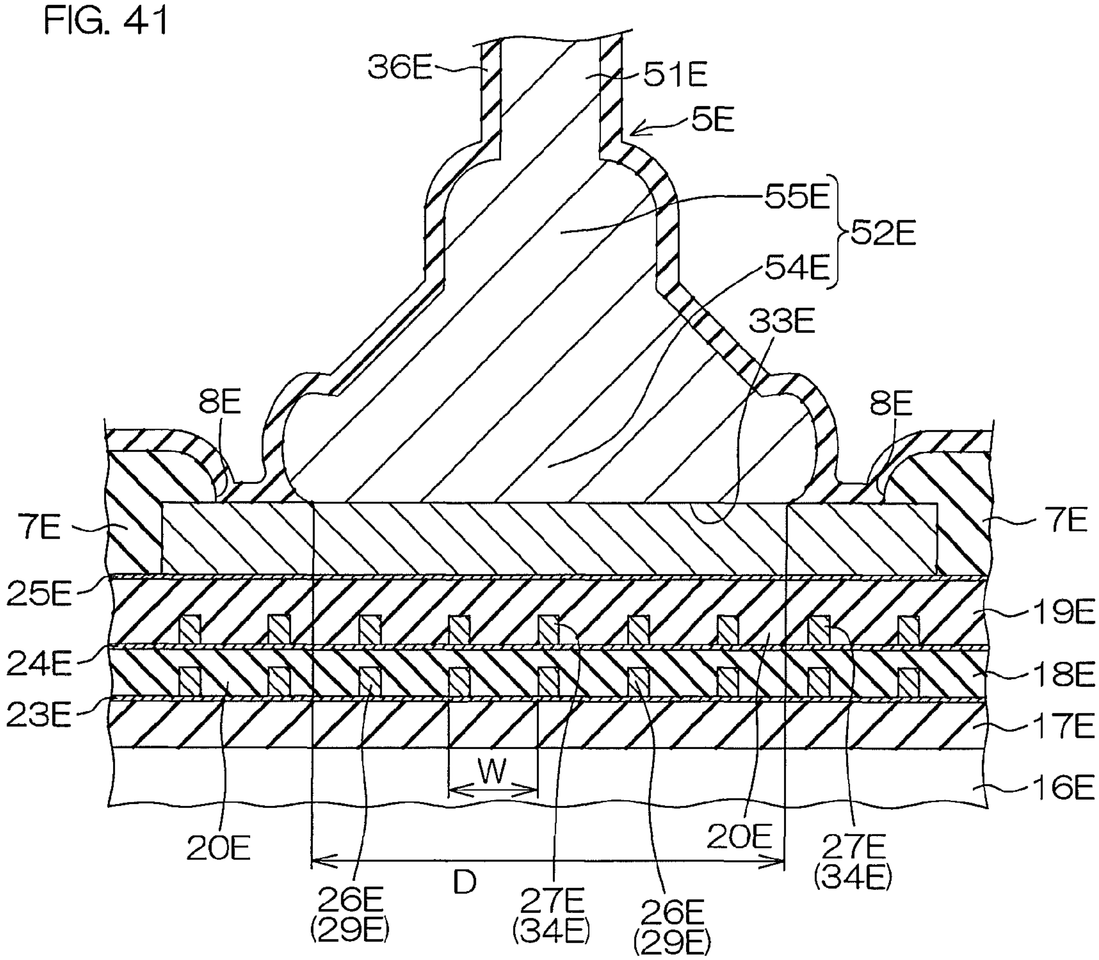
FIG. 41 is a diagram of a second modification example of the semiconductor device of FIG. 37 and is a diagram corresponding to FIG. 38.

Or, for example, as shown in a second modification example in FIG. 41, both the first and second wirings 26E and 27E may be formed in meandering patterns.

Also, vias that are electrically connected to the first to third wirings 26E to 28E may be formed in the first to third interlayer insulating films 17E to 19E.

Also, although with the preferred embodiment described above, the semiconductor device 1E with the three-layer wiring structure was taken up as an example, the wiring structure of the semiconductor device may be a two-layer structure, a four-layer structure, a five-layer structure, or a structure with no less than five layers.

Also, for example, although a QFN type semiconductor device was taken up in the above description of the preferred embodiment, the present invention may also be applied to semiconductor devices of other package types, for example, the SON (small outline non-leaded), QFP (quad flat package), SOP (small outline package), etc.

Figure 42:
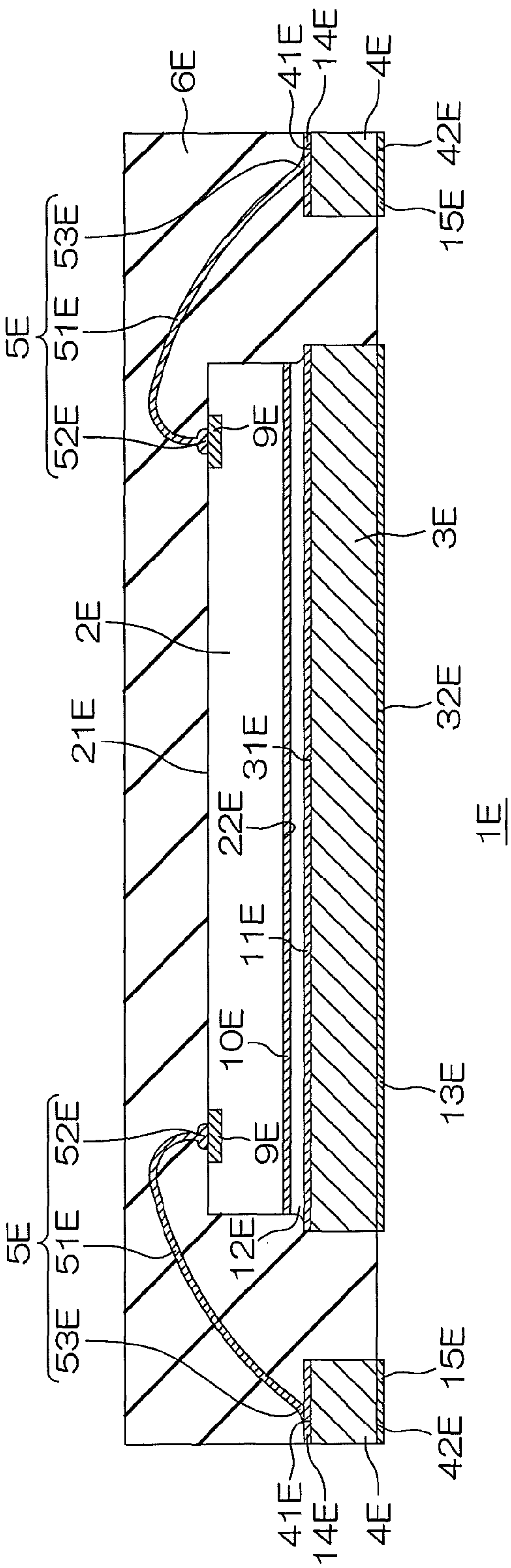
FIG. 42 is a diagram of a third modification example of the semiconductor device of FIG. 37.

Also, although with the above-described preferred embodiment, a mode in which the bonding wires 5E are covered by the water-impermeable insulating film 36E was described as an example, the water-impermeable insulating film 36E may be omitted as shown in FIG. 42 as long as at least the fifth object for resolving the fifth issue is achieved.

Next, experiments related to the fifth preferred embodiment were performed. The present invention is not restricted by the following examples.

Examples 1 to 3 and Comparative Examples 1 to 6

Figure 43:
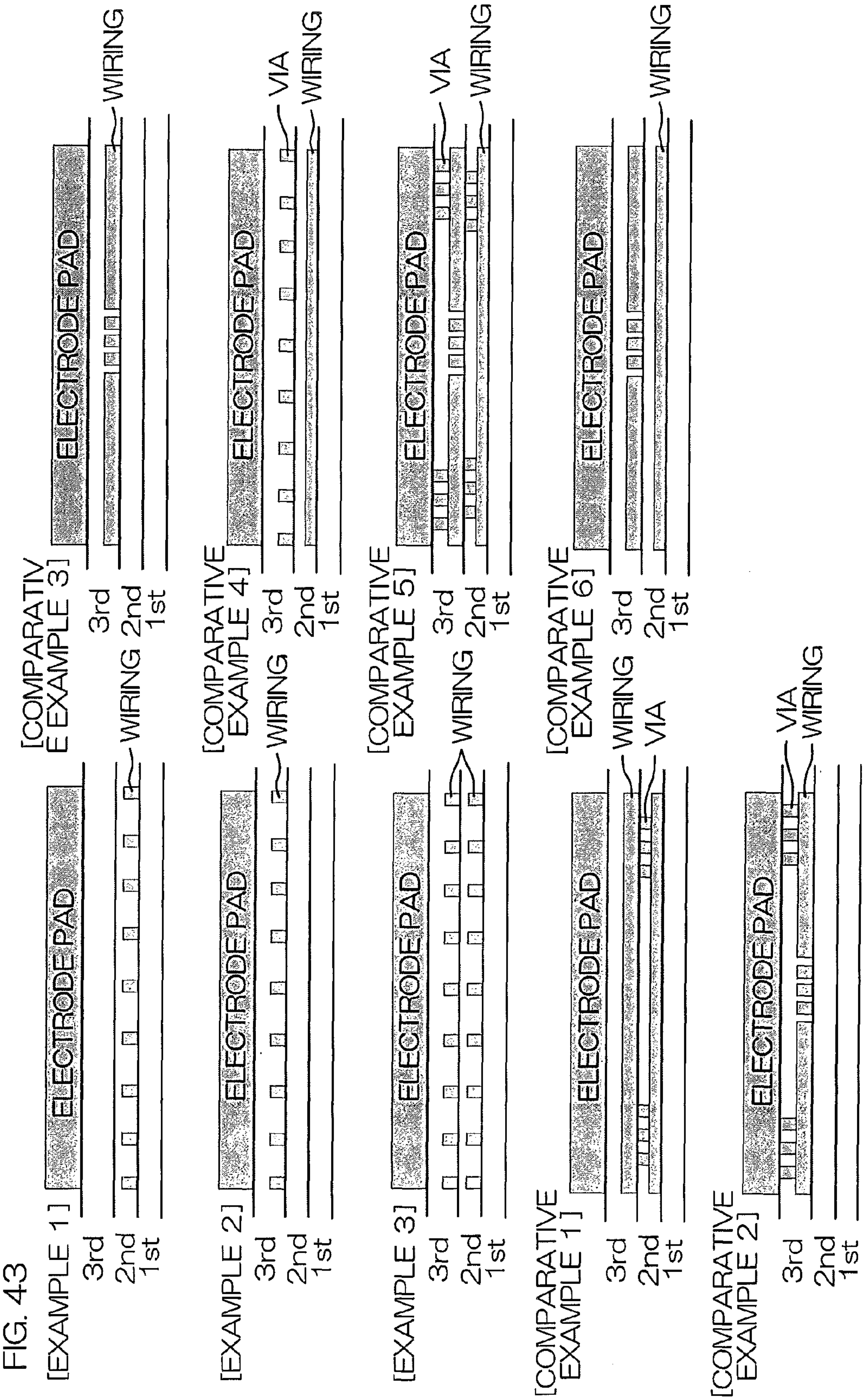
FIG. 43 shows schematic sectional views of semiconductor devices of examples and comparative examples of the fifth preferred embodiment, each showing a vicinity of an electrode pad in an enlarged manner.

With the respective examples and comparative examples, multilayer wiring structures shown in FIG. 43 were formed on semiconductor substrates. In FIG. 43, portions indicated as "first," "second," and "third" are interlayer insulating films, made of silicon oxide, that were successively laminated on each semiconductor substrate. Also, a Ti/TiN barrier layer was interposed between respective interlayer insulating films that are vertically adjacent to each other. Also, the electrode pads and the wirings were formed using aluminum. For all of the respective examples and comparative examples, three types, with which the electrode pad is 28000 Å, 15000 Å, and 5000 Å, respectively, were prepared.

The following tests were performed on each of the multilayer wiring structures prepared as described above.

First, a copper bonding wire of 25 μm wire diameter was held by a capillary and an FAB of 60 μm diameter was prepared at a tip portion thereof.

The capillary holding the FAB was then moved to a position directly above an electrode pad and then lowered at once onto the electrode pad to make the FAB collide against the electrode pad. In this process, a load of 130 g and ultrasonic waves (120 khz) of 210 mA were applied to the FAB. The bonding wire was thereby bonded to the electrode pad.

The test was performed on 120 electrode pads for each of the examples and comparative examples and the number of electrode pads (number of defective items) with which a crack occurred in the barrier layer during bonding was counted. The results are shown in Table 1. In Table 1, "Wiring/bond region (%)" is the proportion of the area of the wiring that overlaps the bond region with respect to the area of the bond region of the bonding wire and the electrode pad in plan view.

TABLE 1

| | Sectional structural diagram | Wiring/bond region (%) | Pad thickness (Å) 28000 | 15000 | 5000 | Number of defective items (pads) |
|---|---|---|---|---|---|---|
| Example 1 | See FIG. 43 | 26.8 | 0 | 0 | 0 | 0 |
| Example 2 | | 26.8 | 0 | 0 | 0 | 0 |
| Example 3 | | 26.8 | 0 | 0 | 0 | 0 |
| Comparative Example 1 | | 100 | 10 | 10 | 11 | 31 |

TABLE 1-continued

| | Sectional structural diagram | Wiring/bond region (%) | Pad thickness (Å) 28000 | 15000 | 5000 | Number of defective items (pads) |
|---|---|---|---|---|---|---|
| Comparative Example 2 | | 85.9 | 5 | 0 | 4 | 9 |
| Comparative Example 3 | | 85.9 | 1 | 0 | 2 | 3 |
| Comparative Example 4 | | 100 | 0 | 0 | 1 | 1 |
| Comparative Example 5 | | 100 | 2 | 1 | 4 | 7 |
| Comparative Example 6 | | 100 | 0 | 1 | 5 | 6 |

Sixth Preferred Embodiment FIG. 44 to FIG. 55

By disclosure of a sixth preferred embodiment, a sixth issue concerning a sixth background art described below can be resolved in addition to the issues described above in the "OBJECT(S) OF THE INVENTION."

(1) Sixth Background Art

A semiconductor device includes a semiconductor chip with a plurality of electrode pads formed thereon and a plurality of electrode leads disposed so as to surround the semiconductor chip. Each electrode pad and each electrode lead are electrically connected in a one-to-one manner by a single bonding wire. The semiconductor chip, the electrode leads, and the bonding wires are sealed (packaged) by a resin with a portion of each electrode lead being exposed.

Although conventionally, gold wires are mainly used as the bonding wires, recently, the use of copper wires, which are cheaper than gold wires, is being examined for reducing the use of high-priced gold.

To connect electrode pads and electrode leads by bonding wires, for example, a number or a positional pattern of the electrode pads on a semiconductor chip is first recognized by a wire bonder.

Next, by applying energy to a tip portion of a wire held by a capillary, the tip portion of the wire is melted by heat of a resulting spark and an FAB (free air ball) is formed.

The FAB is then made to contact an electrode pad, and by application of a load and ultrasonic waves to the FAB by the capillary, the FAB is deformed in accordance with a shape of the tip of the capillary and a first bond portion is formed.

After the forming of the first bond, the capillary moves from the electrode pad to an electrode lead and a wire loop spanning across the pad and the lead is thereby formed.

The bonding wire is then made to contact the electrode lead, and by application of a load and ultrasonic waves to the bonding wire by the capillary, the bonding wire deforms in accordance with a shape of a face of the capillary and is bonded to the electrode lead (formation of stitch bond and tail bond).

Thereafter, the capillary rises from the electrode lead, and with a tail of fixed length being secured from the tip of the capillary, the bonding wire is cut from the position of the tail bond. The other end of the bonding wire that was stitch bonded is thereby left on the electrode lead and a second bond portion is formed. By the above steps, connection of a single electrode pad and a single electrode lead is achieved.

All pad-lead combinations are connected by a cycle, made up of the above-described step of forming the FAB, step of forming of the first bond portion, and step of forming the second bond portion (step of cutting the wire), being repeated in that order continuously.

(2) Sixth Issue

While the cycles are being executed continuously (from a second cycle onwards), a size of the FAB (FAB diameter) of the copper wire is substantially fixed in all cycles because the heat received from the spark and a heater is stable in each cycle.

On the other hand, in a first cycle immediately after recognition of the electrode pads, an FAB of smaller diameter than the FABs of the second cycle onward is formed because the copper wire is cooled due to influence of forming gas (gas for suppressing oxidation of copper), etc., during recognition of the electrode pads and also because an ambient temperature environment of the copper wire is not stable due to the wire being separated from the heater.

Thus, a fault occurs in which the diameter and thickness of just the first bond portion of the bonding wire bonded in the first cycle are smaller than the diameter and thickness of the first bond portions of the other bonding wires.

For this problem, preparation of the FAB of the first cycle, not immediately after the recognition of the electrode pads, but in advance before the recognition of the electrode pads while the ambient temperature environment of the copper wire is stable may be considered. For example, in a case where wire bonding is performed continuously for a plurality of semiconductor chips, the ambient temperature environment of the copper wire is comparatively stable immediately after an end of a final cycle of the immediately prior wire bonding.

However, with the method of preparing the FAB in advance, the forming of the FAB to the bonding of the FAB are not executed as one series of steps and there is a time gap until the bonding of the FAB is performed. The FAB that has been prepared in advance may thus oxidize and a connection defect may thus occur between the electrode pad and the bonding wire.

Thus, a sixth object of the present invention related to the sixth preferred embodiment is to provide a semiconductor device that is low in cost due to use of bonding wires made of copper and enables connection defects of bonding wires with respect to a plurality of bonding objects to be suppressed while suppressing variation in sizes of metal balls, and a method for manufacturing the semiconductor device.

(3) Disclosure of a Specific Preferred Embodiment

Figure 44:
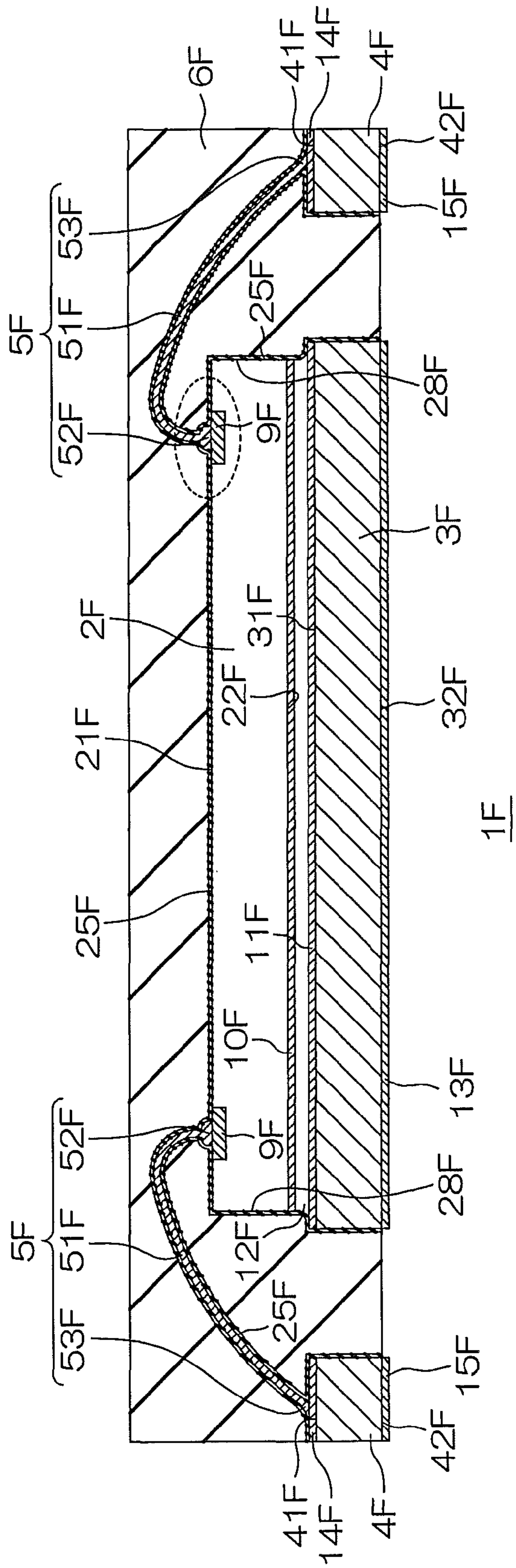
FIG. 44 is a schematic sectional view of a semiconductor device according to a sixth preferred embodiment of the present invention.
Figure 45:
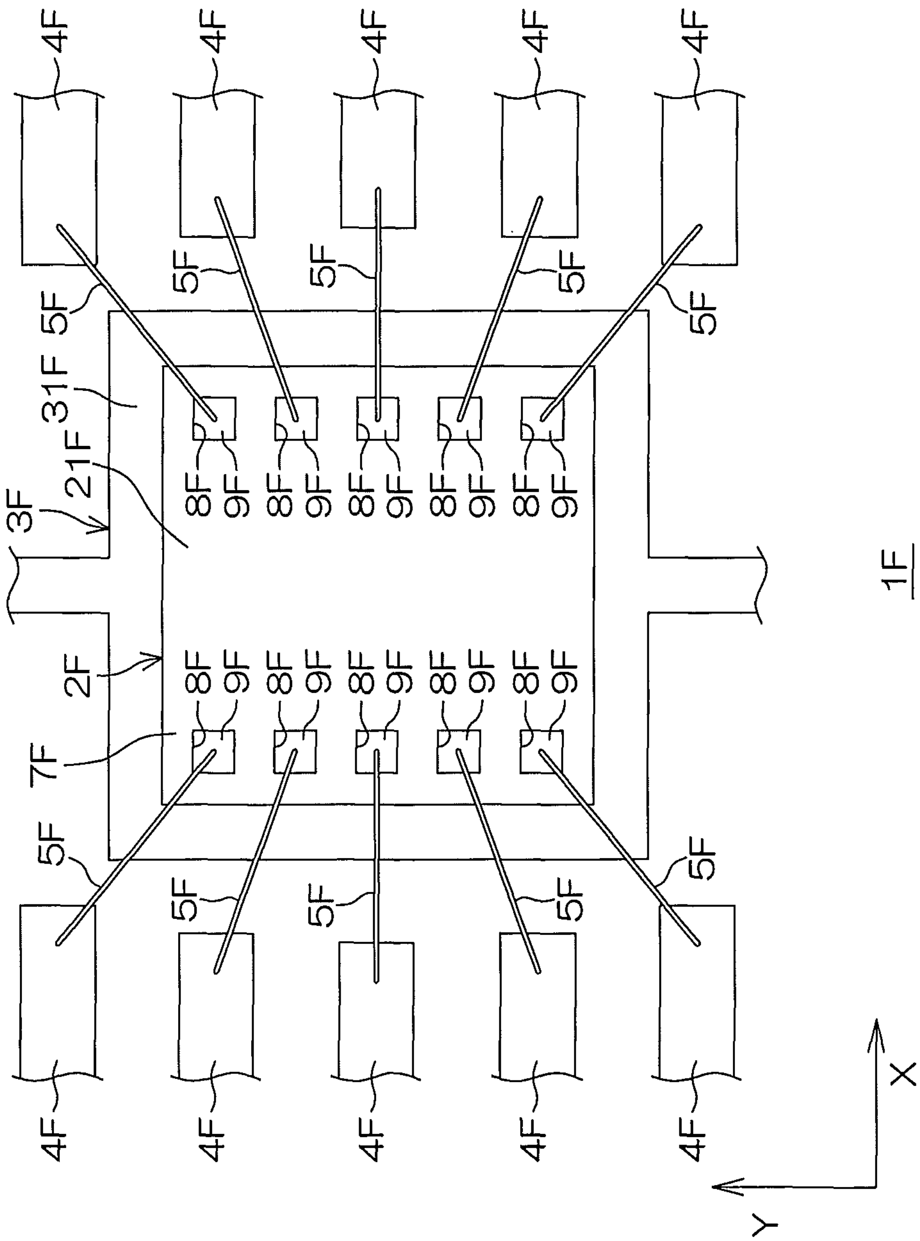
FIG. 45 is an exploded plan view of the semiconductor device of FIG. 44 with a resin package removed.

FIG. 44 is a schematic sectional view of a semiconductor device according to the sixth preferred embodiment of the present invention. FIG. 45 is an exploded plan view of the semiconductor device of FIG. 44 with a resin package removed.

The semiconductor device 1F is a semiconductor device to which an SON (small outline non-leaded) configuration is applied. The semiconductor device 1F includes a semiconductor chip 2F, a die pad 3F supporting the semiconductor chip 2F, a plurality of electrode leads 4F disposed at a periphery of the semiconductor chip 2F, bonding wires 5F electrically connecting the semiconductor chip 2F and the electrode leads 4F, and a resin package 6F sealing the above components.

The semiconductor chip 2F has a quadrilateral shape in plan view and has a multilayer wiring structure arranged by laminating a plurality of wiring layers via interlayer insulating films. The semiconductor chip 2F has a thickness, for example, of 220 to 240 μm (preferably, approximately 230 μm). A top surface 21F (surface at one side in a thickness direction) of the semiconductor chip 2F is covered by a top surface protective film 7F. For the sake of convenience, the present preferred embodiment shall be described below with two arbitrary mutually orthogonal directions among the plurality of directions along the top surface 21F of the semiconductor chip 2F being deemed to be an X direction and a Y direction, and further a direction orthogonal to both these directions (that is, a direction perpendicular to the top surface 21F) being deemed to be a Z direction.

A plurality of pad openings 8F for exposing the uppermost wiring layer of the multilayer wiring structure are formed in the top surface protective film 7F.

Each pad opening 8F has a quadrilateral shape in plan view and the same number thereof are provided at each of a pair of mutually opposing edge portions of the semiconductor chip 2F. The respective pad openings 8F are disposed at equal intervals along the edge portions. A portion of the wiring layer is exposed as an electrode pad 9F (bonding object) of the semiconductor chip 2F from each pad opening 8F.

The uppermost wiring layer exposed as the electrode pads 9D is made, for example, of a metal material that contains Al (aluminum) and is specifically made of a metal material having Al as a main component (for example, an Al—Cu alloy, etc.).

Meanwhile, a rear surface metal 10F that contains, for example, Au, Ni, Ag, etc., is formed on a rear surface 22F (surface at the other side in the thickness direction) of the semiconductor chip 2F.

The die pad 3F is made, for example, of a metal thin plate (for example, Cu or 42 alloy (an alloy containing Fe-42% Ni) and has a larger quadrilateral shape (for example, approximately 2.7 mm square in plan view) than the semiconductor chip 2F in plan view. Also, the die pad 3F has a thickness, for example, of 190 to 210 μm (preferably, approximately 200 μm). A pad plating layer 11F that contains Ag, etc., is formed on a top surface 31F (surface at one side in the thickness direction) of the die pad 3F.

The semiconductor chip 2F and the die pad 3F are bonded to each other in a state where the rear surface 22F of the semiconductor chip 2F and the top surface 31F of the die pad 3F face each other as bond surfaces with a bonding material 12F interposed between the rear surface 22F and the top surface 31F. The semiconductor chip 2F is thereby supported by the die pad 3F in an orientation where the top surface 21F faces upward.

The bonding material 12F is made, for example, of solder paste or other conductive paste. As the bonding material 12F, an insulating paste, such as a silver paste, an alumina paste, may be applied and in this case, the rear surface metal 10F and/or the pad plating layer 11F may be omitted. Also, in the state where the semiconductor chip 2F and the die pad 3F are bonded, a thickness of the bonding material 12F is, for example, 10 to 20 μm.

A rear surface 32F (surface at the other side in the thickness direction) of the die pad 3F is exposed from the resin package 6F. A solder plating layer 13F made, for example, of a metal material, such as tin (Sn), tin-silver alloy (Sn—Ag), is formed on the exposed other-side surface.

The electrode leads 4F are made of the same metal thin plate (containing, for example, Cu or 42 alloy (Fe-42% Ni, etc.) as the die pad 3F. The electrode leads 4F are disposed at the periphery of the semiconductor chip 2F with the same number thereof being disposed at both sides in directions orthogonal to two side surfaces, among the four side surfaces of the die pad 3F, at which the electrode pads 9F are disposed. The electrode leads 4F that face each side surface of the die pad 3F are disposed at equal intervals in a direction parallel to the facing side surface. A length of each electrode lead 4F in the direction of facing the die pad 3F is, for example, 450 to 550 μm (preferably, approximately 500 μm). A lead plating layer 14F that contains Ag, etc., is formed on a top surface 41F (surface at one side in the thickness direction) of each electrode lead 4F.

Meanwhile, a rear surface 42F (surface at the other side in the thickness direction) of each electrode lead 4F is exposed from the resin package 6F. A solder plating layer 15F made, for example, of a metal material, such as tin (Sn), tin-silver alloy (Sn—Ag), is formed on the exposed rear surface 42F.

Each bonding wire 5F is made of copper (for example, a high-purity copper of no less than 99.9999% (6N) purity or no less than 99.99% (4N) purity that may contain a minute amount of impurity). The same number of bonding wires 5F as the electrode pads 9F and electrode leads 4F are provided and the bonding wires 5F electrically connect the respective electrode pads 9F and the respective electrode leads 4F in a one-to-one manner.

Each bonding wire 5F includes a linearly-extending, cylindrical main body portion 51F and includes a pad bond portion 52F and a lead bond portion 53F formed at respective ends of the main body portion 51F and respectively bonded to an electrode pad 9F and an electrode lead 4F.

The main body portion 51F is curved parabolically upward from the one end at the electrode pad 9F side toward an outer side of the semiconductor chip 2F and made impingent at an acute angle at the other end on the top surface 41F of the electrode lead 4F.

The lead bond portion 53F has a wedge-like shape in sectional view that is relatively thick at the one end side close to the main body portion 51F and becomes relatively thinner toward the other end side away from the main body portion 51F.

As in the first preferred embodiment, in the semiconductor device 1F, the entire top surface 21F and side surfaces 28F of the semiconductor chip 2F, the entire top surface 31F and side surfaces of the die pad 3F, the entire top surfaces 41F and side surfaces inside the resin package 6F of the electrode leads 4F, and the entire bonding wires 5F are covered by an integral water-impermeable insulating film 25F.

As the resin package 6F, a known material, such as an epoxy resin, may be applied. The resin package 6F makes up an outer shape of the semiconductor device 1F and is formed to a substantially rectangular parallelepiped shape. In terms of size, the resin package 6F has a planar size, for example, of approximately 4 mm square and a thickness, for example, of 0.80 to 0.90 mm and preferably, approximately 0.85 mm.

Figure 46:
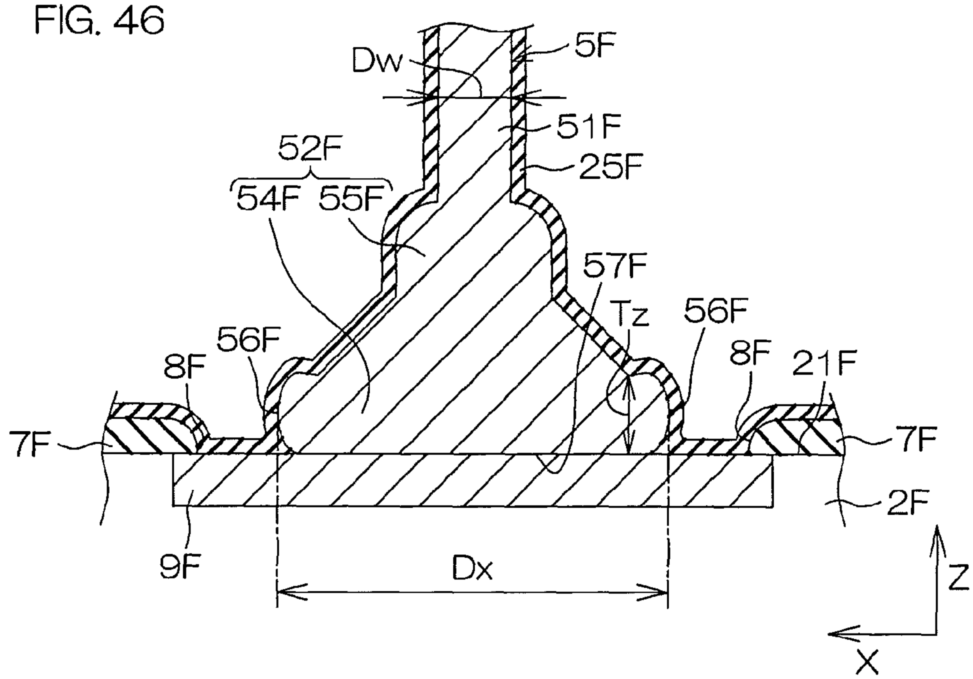
FIG. 46 is a sectional view of principal portions of a semiconductor chip and is an enlarged view of a portion surrounded by a broken-line circle in FIG. 44.
Figure 47:
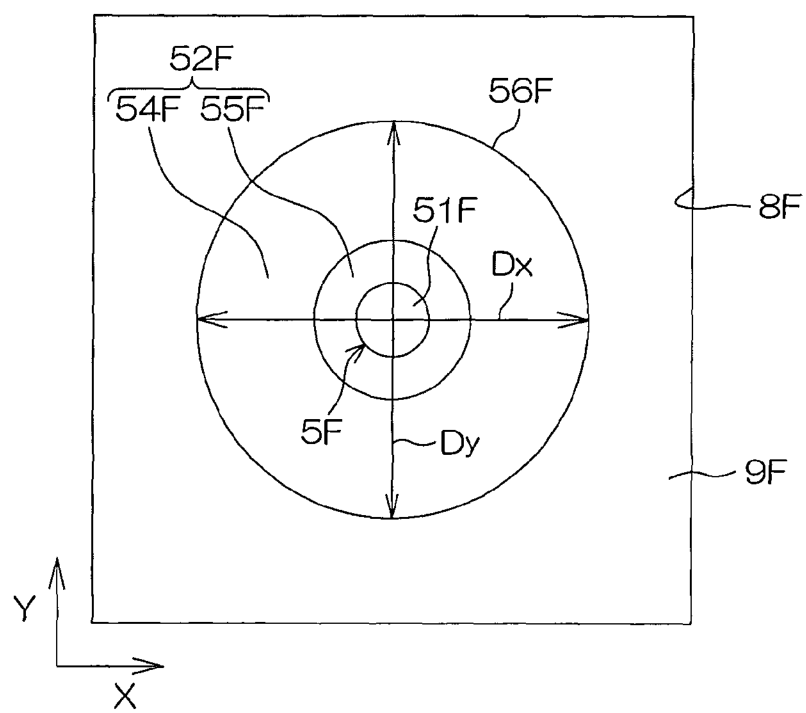
FIG. 47 is an enlarged plan view of an electrode pad shown in FIG. 46.

FIG. 46 is a sectional view of principal portions of the semiconductor chip and is an enlarged view of a portion surrounded by a broken-line circle in FIG. 44. FIG. 47 is an enlarged plan view of an electrode pad shown in FIG. 46.

The pad bond portion 52F is smaller than the electrode pad 9F in plan view. The pad bond portion 52F has a humped shape in sectional view that integrally includes a substantially disk-shaped base portion 54F, which, at its one side in the thickness direction, contacts a top surface of the electrode pad 9F, and a bell-shaped projecting portion 55F projecting from the other side of the base portion 54F and having a tip connected to the one end of the main body portion 51F.

A side surface 56F of the base portion 54F is curved so as to bulge outward in a radial direction beyond an outer periphery of a surface at the other side (rear surface 57F of the base portion 54F) that has a substantially circular shape in plan view and contacts the electrode pad 9F. A diameter of a most outwardly bulging portion of the base portion 54F (diameter of the base portion 54F) as the bond portion of the bonding wire 5F with respect to the electrode pad 9F is substantially the same in each of the X direction and the Y direction, and a diameter $D_x$ in the X direction and a diameter $D_y$ in the Y direction are, for example, both 70 to 80 μm. Also, the base portion 54F has a thickness $T_z$ (height in the Z direction) of, for example, 15 to 20 μm.

With the semiconductor device 1F, when V is a volume of each base portion 54F, a variation of the volumes V of the respective base portions 54F with respect to an average AVE of the volumes V of all base portions 54F is within ±15% and preferably, within ±10%. Specifically, a proportion of an absolute value of a difference between the average AVE and the volume V with respect to the average AVE (that is, (average AVE-volume V)/average AVE×100(%)) is no more than 15(%).

The volume V of the base portion 54F is, for example, expressed by a product of the diameters $D_x$ and $D_y$ of the base portion 54F and the thickness $T_z$ of the base portion 54F (that is, $V=D_x \times D_y \times T_z$). The volume V of the base portion 54F may be determined by conceptually deeming the base portion 54F to be a cylinder with a diameter $D_x$ or $D_y$ and a height $T_z$ and determining the volume as an approximate value based on the volume of the cylinder. That is, the volume may also be expressed as $V=\pi(D_x/2)^2 \cdot T_z$.

Also, a diameter $D_w$ of the main body portion 51F (diameter of the bonding wire 5F) is, for example, 28 to 38 μm.

FIG. 48A to FIG. 48E are schematic sectional views for describing a method for manufacturing the semiconductor device shown in FIG. 44 in order of process.

To manufacture the semiconductor device 1F, for example, first, a lead frame 20F that includes a plurality of units each integrally having a die pad 3F and electrode leads 4F is prepared. In FIG. 48A to FIG. 48E, an entire view of the lead frame 20F is abbreviated and the die pad 3F and electrode leads 4F of just a single unit necessary for mounting a single semiconductor chip 2F are shown.

Next, a metal plating of Ag, etc., is applied to a top surface of the lead frame 20F by a plating method. The pad plating layer 11F and the lead plating layer 14F are thereby formed at the same time.

Figure 48A:
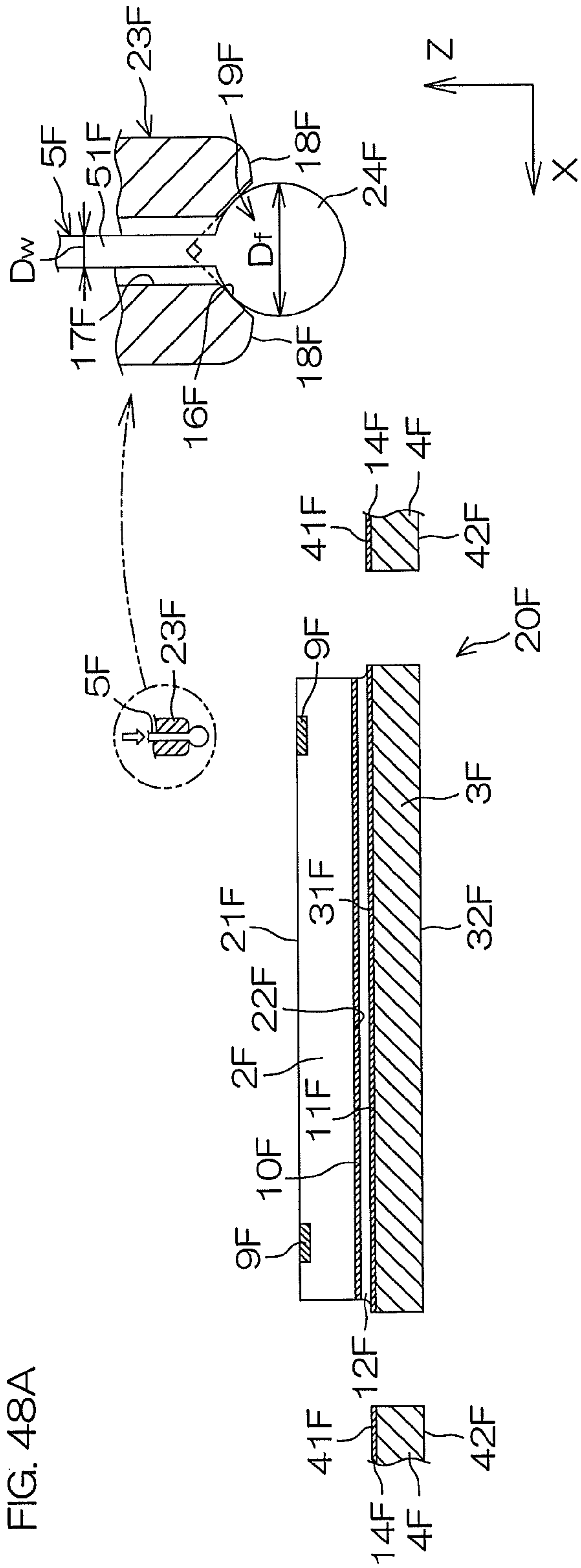
FIG. 48A is a schematic sectional view for describing a method for manufacturing the semiconductor device of FIG. 44.

Next, as shown in FIG. 48A, the semiconductor chips 2F are die bonded via the bonding material 12F to all die pads 3F on the lead frame 20F.

Next, wire bonding by a wire bonder (not shown) that includes a capillary 23F is performed successively one chip at a time on the plurality of semiconductor chips 2F.

The capillary 23F included in the wire bonder has a substantially cylindrical shape with a straight hole 17F, through which the bonding wire 5F is inserted, formed at a center, and during wire bonding, the bonding wire 5F is fed out from a tip of the straight hole 17F.

A face portion 18F, which is substantially perpendicular to a longitudinal direction of the straight hole 17F and, in plan view, has an annular shape concentric to the straight hole 17F in plan view, and a chamfer portion 19F, which is recessed in the longitudinal direction of the straight hole 17F from the face portion 18F, are formed at a tip portion of the capillary 23F.

A side surface 16F of the chamfer portion 19F is formed to a conical surface connecting an inner circumferential circle of the face portion 18F and a circumferential surface of the straight hole 17F. The side surface 16F is thus rectilinear in sectional view and in the present preferred embodiment, an apex angle (chamfer angle) thereof is set, for example, to 90°.

In the wire bonding of each semiconductor chip 2F, a step (FAB forming step) of forming an FAB (free air ball) on a tip portion (one end portion) of the bonding wire 5F, a step (first bonding step) of bonding the FAB to an electrode pad 9F, a step (second bonding step) of bonding the bonding wire 5F extending from the FAB to an electrode lead 4F, and a step (cutting step) of severing the bonding wire 5F from the capillary 23F are repeated in that order.

First, the number or positional pattern of the electrode pads 9F on the semiconductor chip 2F, on which wire bonding is performed first, is recognized by the wire bonder (recognition step).

The FAB step of the first cycle is then started. Specifically, a spherical FAB 24F is formed on a tip portion (one end portion) of the bonding wire 5F held by the capillary 23F by application of a current to the tip portion. The applied current $I_1$ is set in accordance with an intended diameter Df of the FAB 24F. For example, $I_1$=40 mA when Dw=25 μm, $I_1$=60 mA when Dw=30 μm, and $I_1$=120 mA when Dw=38 μm. An application time $t_1$ of the current $I_1$ is set in accordance with the intended diameter Df of the FAB 24F. For example, $t_1$=720 μsec when Dw=25 μm, $t_1$=830 μsec when Dw=30 μm, and $t_1$=960 μsec when Dw=38 μm.

In the FAB step of the first cycle, an energy expressed by the applied current $I_1$ multiplied by the application time $t_1$ ($I_1 \times t_1$) is applied to the bonding wire 5F as a first energy $E_1$ for forming the FAB 24F.

A flow rate of a forming gas supplied to the wire bonder (not shown) is set to an appropriate magnitude in accordance with the intended diameter Df of the FAB 24F. The forming gas is a gas for suppressing oxidation of the bonding wire 5F and contains, for example, $N_2$ or $H_2$.

Figure 48B:
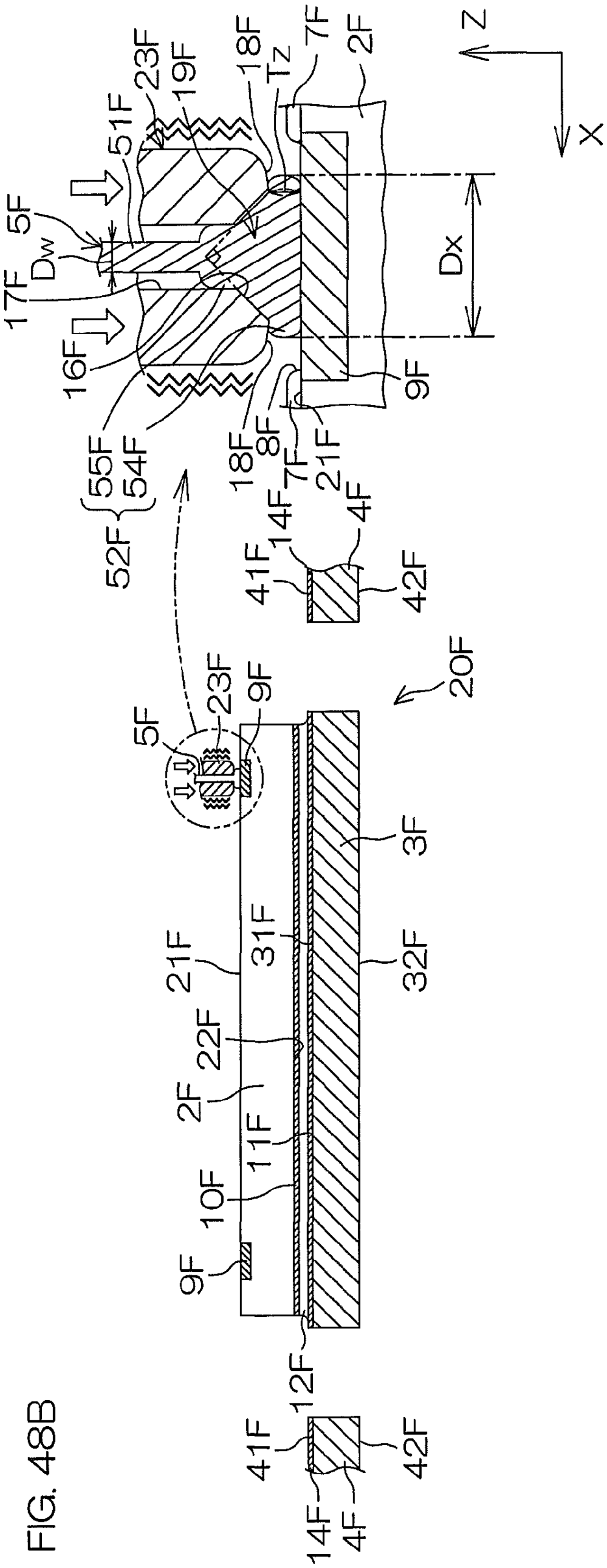
FIG. 48B is a diagram of a step subsequent to that of FIG. 48A.

Next, as shown in FIG. 48B, the capillary 23F moves to a position directly above an electrode pad 9F and thereafter descends so that the FAB 24F contacts the electrode pad 9F. In this process, a load (open arrows in FIG. 48B) and ultrasonic waves (zigzag lines in FIG. 48B) are applied from the capillary 23F to the FAB 24F. The applied load and the applied ultrasonic waves are set to appropriate magnitudes in accordance with the wire diameter Dw of the main body portion 51F and the intended diameters (Dx and Dy) and thickness (Tz) of the base portion 54F.

A portion of the FAB 24F is thereby made to spread below the face portion 18F to form the base portion 54F while the remaining portion of the FAB 24F remains inside the chamfer portion 19F while being pushed inside the straight hole 17F to form the projecting portion 55F. The one end portion of the bonding wire 5F is thereby bonded as the pad bond portion 52F to the electrode pad 9F, and a first bond is formed.

Figure 48C:
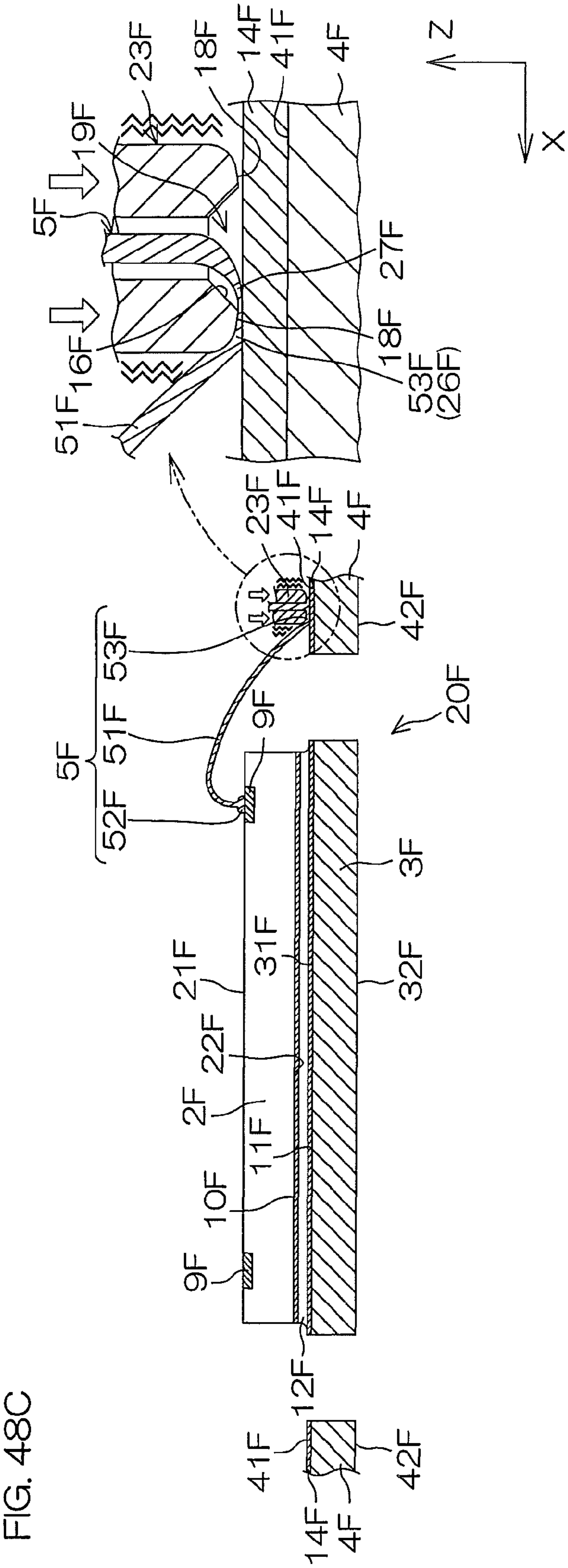
FIG. 48C is a diagram of a step subsequent to that of FIG. 48B.

After the first bond has been formed, the capillary 23F rises to a fixed height and moves to a position directly above an electrode lead 4F. Then, as shown in FIG. 48C, the capillary 23F descends again and the bonding wire 5F contacts the electrode lead 4F. In this process, a load (open arrows in FIG. 48C) and ultrasonic waves (zigzag lines in FIG. 48C) are applied from the capillary 23F to the bonding wire 5F so that the bonding wire 5F deforms according to the shape of the face portion 18F of the capillary 23F and is bonded to the electrode lead 4F (forming of a stitch bond 26F and a tail bond 27F), thereby forming the lead bond portion 53F as a second bond.

Figure 48D:
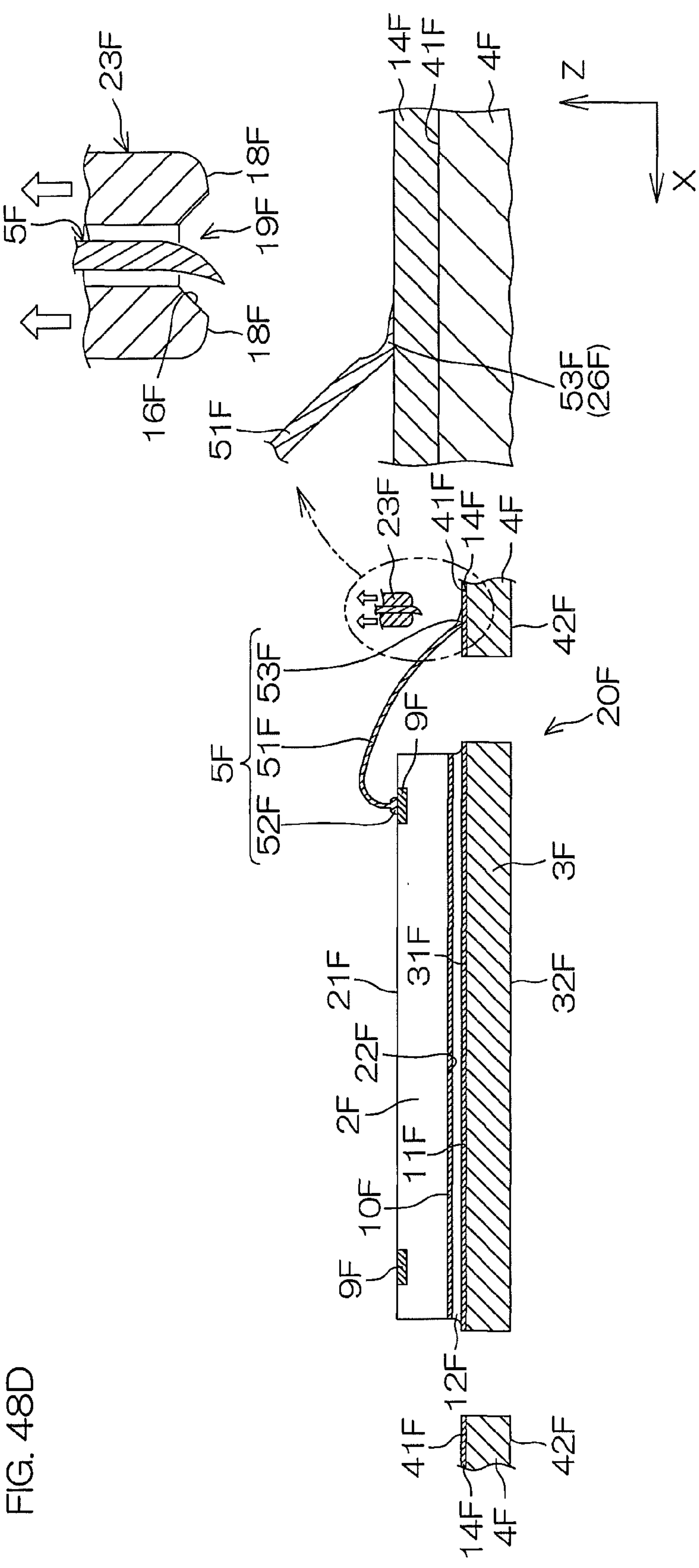
FIG. 48D is a diagram of a step subsequent to that of FIG. 48C.

Then, as shown in FIG. 48D, the capillary 23F rises and in a state where a tail of a fixed length is secured from a tip of the capillary 23F, the bonding wire 5F is broken from a position of the tail bond 27F.

Figure 48E:
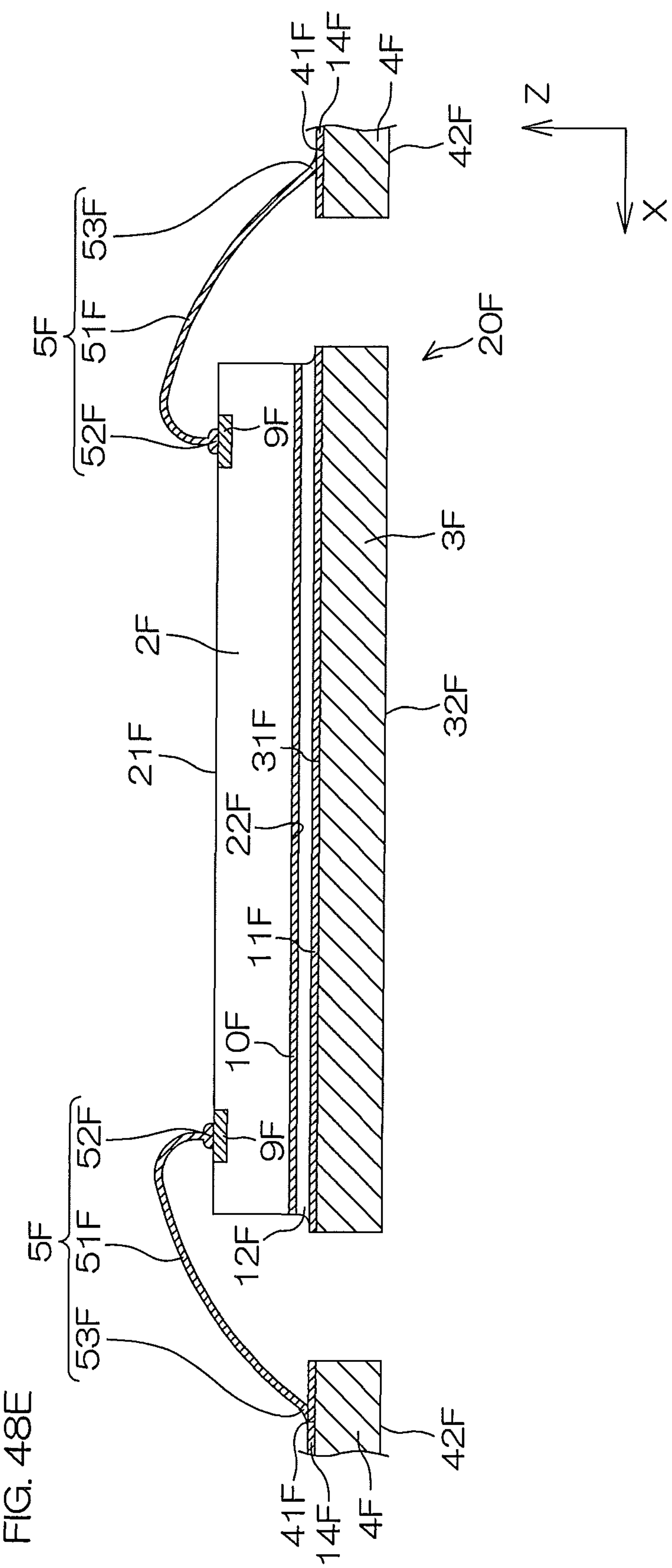
FIG. 48E is a diagram of a step subsequent to that of FIG. 48D.

Thereafter, as shown in FIG. 48E, the FAB forming step (FIG. 48A), the first bonding step (FIG. 48B), the second bonding step (FIG. 48C), and the cutting step (FIG. 48D) of the second cycle onward are repeated in that order, and all of the electrode pads 9F and electrode leads 4F of the first semiconductor chip 2F are connected by the bonding wires 5F.

In the FAB forming step of the second cycle onward, a second energy $E_2$ for forming the FAB 24F is set, for example, so that the first energy $E_1$ of first cycle is 105 to 115% and preferably, 108 to 112% of the second energy $E_2$. For example, when Dw=25 μm, the applied current $I_2$=40 mA is applied to the tip portion (one end portion) of the bonding wire 5F for the application time $t_2$=792 μsec, and when Dw=30 μm, $I_2$=60 mA and the application time $t_2$=913 μsec, and when Dw=38 μm, $I_2$=120 mA and the application time $t_2$=1056 μsec.

Also, the flow rate of the forming gas supplied to the wire bonder (not shown) is set, for example, to the same magnitude as the flow rate of the forming gas in the first cycle.

After the end of the wire bonding of the first semiconductor chip 2F, the number or positional pattern of the electrode pads 9F of a second semiconductor chip 2F is recognized by the wire bonder (recognition step). Then, in the same manner as in the case of the first semiconductor chip 2F, the FAB forming step (FIG. 48A), the first bonding step (FIG. 48B), the second bonding step (FIG. 48C), and the cutting step (FIG. 48D) are repeated a plurality of times (a plurality of cycles) in that order, and all of the electrode pads 9F and electrode leads 4F of the second semiconductor chip 2F are connected by the bonding wires 5F.

Thereafter, the recognition step and the wire bonding of repeating the FAB forming step, the first bonding step, the second bonding step, and the cutting step a plurality of times are performed on each of the remaining plurality of semiconductor chips 2F (the third semiconductor chip 2F and onward).

After the wire bonding of all semiconductor chips 2F on the lead frame 20F ends, the water-impermeable insulating film 25F is formed by the same method as that of FIG. 4D. After the forming of the water-impermeable insulating film 25F, the lead frame 20F is set in a forming mold and all semiconductor chips 2F are sealed in a batch together with the lead frame 20F by the resin package 6F. Solder plating layers 13F and 15F are then formed on the rear surfaces 32F of the die pads 3F and the rear surfaces 42F of the electrode leads 4F that are exposed from the resin package 6F. Lastly, a dicing saw is used to cut the lead frame 20A together with the resin package 6F to sizes of the respective semiconductor devices 1F and the individual semiconductor devices 1F one of which is shown in FIG. 44 are thereby obtained.

As described above, with the above method, in the wire bonding of each semiconductor chip 2F, the first energy $E_1$ (applied current $I_1$×application time $t_1$) applied to the bonding wire 5F in the FAB forming step of the first cycle is set higher than the second energy $E_2$ (applied current $I_2$×application time $t_2$) applied to the bonding wire 5F in the FAB forming step of the second cycle onward. For example, $t_1$ is made longer than $t_2$ with $I_2$ and $I_2$ being set to the same value. The ambient temperature environment of the bonding wire 5F in the first cycle can thus be stabilized. Consequently, a comparatively large FAB 24F can be formed in the first cycle.

Thus, for example, by adjusting the output of the wire bonder so that the application time $t_1$ is 105 to 115% of the application time $t_2$, the diameter Df of the FAB 24F in the first cycle can be made substantially the same as the diameter Df of the FAB 24F in the second cycle onward. Consequently, variation of the diameters Df of the FABs 24F can be suppressed throughout all cycles.

Also, for each semiconductor chip 2F, after the recognition step has ended, wire bonding is performed by the FAB forming step, the first bonding step, the second bonding step, and the cutting step being executed as one series of steps that is repeated a plurality of times. The FAB 24 prepared in each cycle is immediately bonded to the electrode pad 9F without being left to stand for a while. Oxidation of the FAB 24F can thus be suppressed and connection defects of the bonding wires with respect to electrode pads 9F can be suppressed.

Although the sixth preferred embodiment of the present invention has been described above, the sixth preferred embodiment may also be modified as follows.

For example, although with the preferred embodiment described above, only cases where the bonding object of the FAB 24F is an electrode pad 9F were taken up, the bonding object of the FAB 24F may, for example, be an electrode lead 4F or may be a stud bump formed on an electrode pad 9F or an electrode lead 4F, etc.

Also, for example, although an SON type semiconductor device was taken up in the above description of the preferred embodiment, the present invention may also be applied to semiconductor devices of other package types, for example, the QFN (quad flat non-leaded), QFP (quad flat package), SOP (small outline package), etc.

Figure 49:
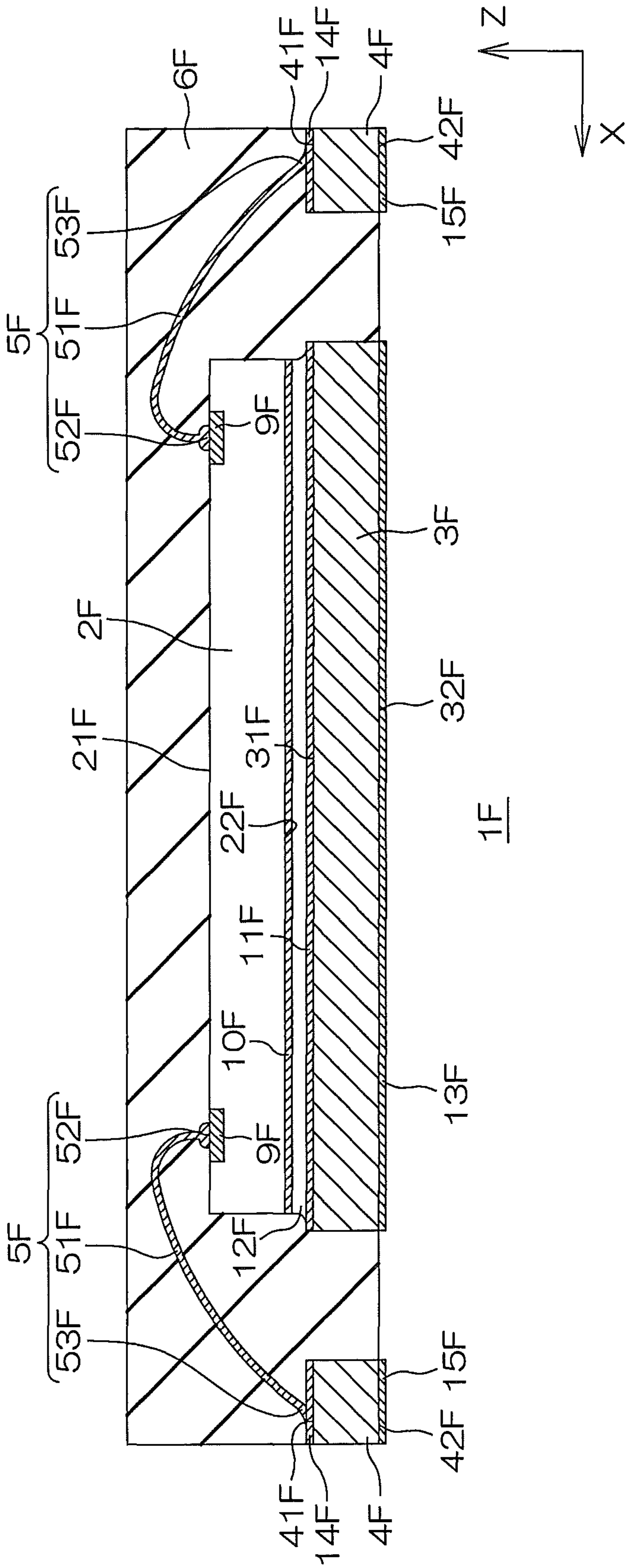
FIG. 49 is a diagram of a modification example of the semiconductor device of FIG. 44.

Also, although with the above-described preferred embodiment, a mode in which the bonding wires 5F are covered by the water-impermeable insulating film 25F was described as an example, the water-impermeable insulating film 25F may be omitted as shown in FIG. 49 as long as at least the sixth object for resolving the sixth issue is achieved.

Next, experiments related to the sixth preferred embodiment were performed. The present invention is not restricted by the following examples.

Example 1

A semiconductor chip having 144 electrode pads was die bonded onto a die pad of a lead frame having 144 electrode leads.

Next, a copper bonding wire of 30 μm wire diameter was held by a capillary and while supplying a forming gas at 0.3 L/min, a current $I_1$ of 60 mA was applied for 913 μsec ($t_1$) to a tip portion of the wire to prepare an FAB (FAB forming step).

The capillary holding the FAB was then moved to a position directly above an electrode pad and then lowered at once onto the electrode pad to make the FAB collide against the electrode pad. In this process, a load and ultrasonic waves were applied to the FAB. The bonding wire was thereby bonded as a pad bond portion to the electrode pad (first bonding step).

Next, the capillary was raised and after moving it to a position directly above an electrode lead, the capillary was lowered at once onto the electrode lead to make the bonding wire collide against the electrode pad. In this process, a load and ultrasonic waves were applied to the bonding wire. A stitch bond and a tail bond were thereby formed on the bonding wire and the bonding wire was bonded to the electrode lead (second bonding step).

Next, the capillary was raised, and in a state where a tail of a fixed length was secured from the tip of the capillary, the bonding wire was cut from the position of the tail bond (cutting step).

Thereafter, the cycle made up of the FAB forming step, the first bonding step, the second bonding step, and the cutting step was repeated 14 times continuously to connect 15 electrode pads and 15 electrode leads in a one-to-one manner by the bonding wires.

In the FAB forming step of each of the second to 15th cycles, a current $I_2$ of 60 mA was applied for 830 μsec ($t_2$) to the tip portion of the bonding wire to prepare the FAB. That is, in the first cycle, by setting the application time $t_1$ to 110% of the application time $t_2$ of the second cycle ($913(t_1)=830(t_2)\times1.1$), a first energy $E_1$ of 1.1 times a second energy $E_2$ of the second cycle was applied to the bonding wire to form the FAB.

Diameters Dx and Dy (diameters in the X and Y directions) of the base portion and thickness Tz (height in the Z direction) of the base portion of each pad bond portion thus formed were measured. The measured values of Dx, Dy, and Tz are shown in Table 2 below. Also, the variation of the volumes V of the respective base portions with respect to the average of the volumes V of all base portions was computed based on Dx, Dy, and Tz. The results are shown in Table 2.

Figure 50A:
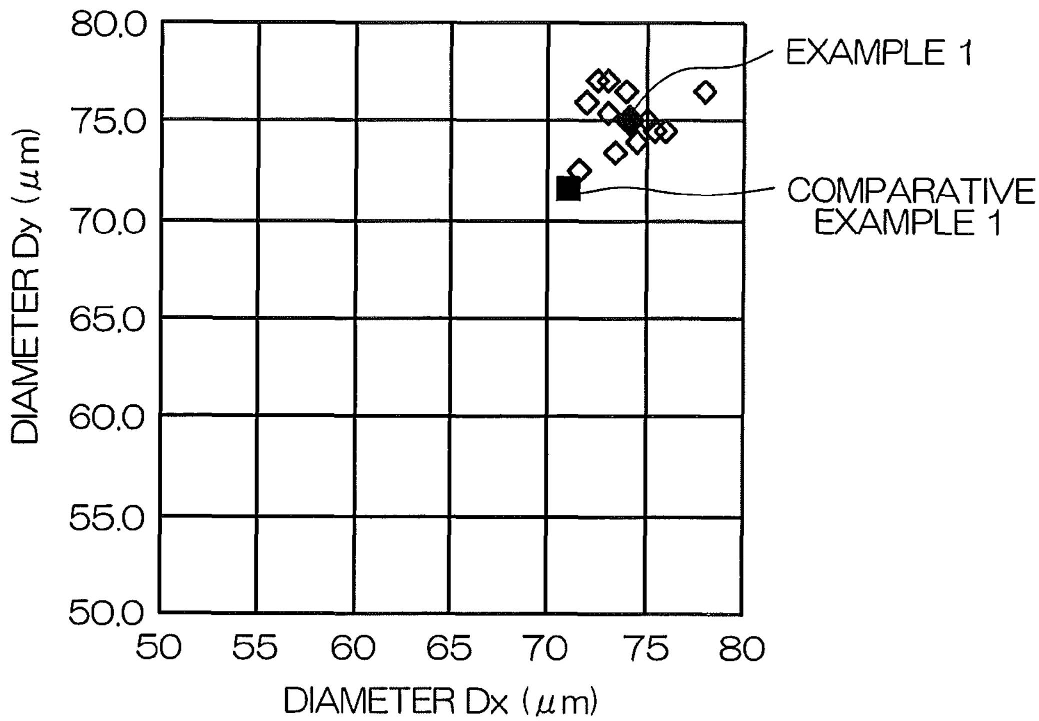
FIG. 50A is a distribution diagram of sizes of base portions of Example 1 and Comparative Example 1 of the sixth preferred embodiment and is a distribution diagram of base diameters in an X-direction and a Y-direction.
Figure 50B:
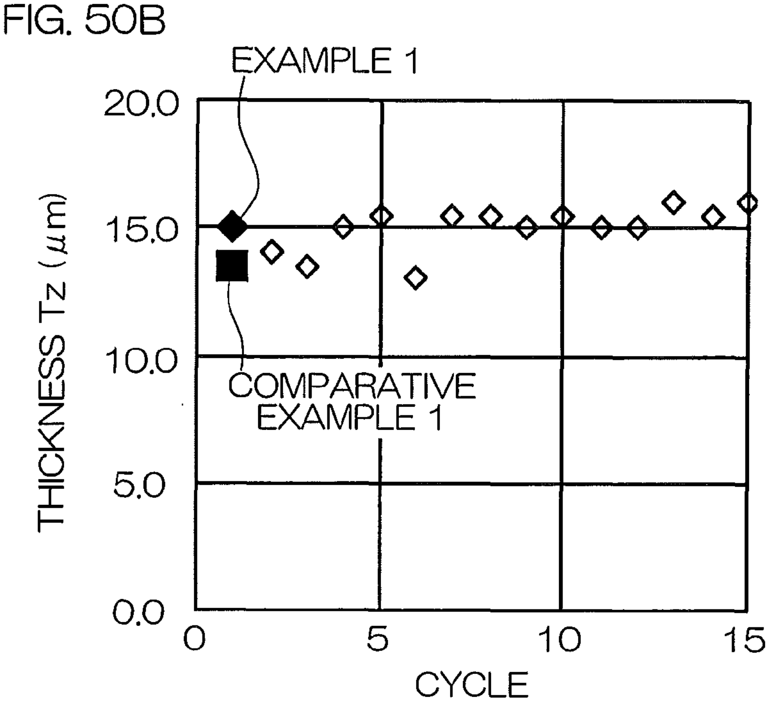
FIG. 50B is a distribution diagram of sizes of the base portions of Example 1 and Comparative Example 1 of the sixth preferred embodiment and is a distribution diagram of thickness in a Z-direction.

Also, a distribution of the diameters Dx and Dy of the base portions is shown in FIG. 50A. Also, a distribution of the thicknesses Tz of the base portions is shown in FIG. 50B. The X direction and the Y direction are two arbitrary mutually orthogonal directions among the plurality of directions along a top surface of the semiconductor chip, and the Z direction is a direction orthogonal to both the X and Y directions (that is, a direction perpendicular to the top surface of the semiconductor chip). Also, in FIGS. 50A and 50B, a plot of ♦ indicates the diameter or the thickness of the base portion formed in the first cycle, and a plot of ◊ indicates the diameters or the thicknesses of the base portions formed in the second cycle onward.

The average values of Dx, Dy, and Tz of the base portions of the second cycle onward were calculated as: diameter Dx: 73.9 μm; diameter Dy: 75.2 μm; and thickness Tz: 14.9 μm. Meanwhile, Dx, Dy, and Tz of the base portion of the first cycle were: diameter Dx: 74.1 μm; diameter Dy: 75.1 μm; and thickness Tz: 15.0 μm.

Comparative Example 1

Besides making the applied current $I_2$ in the FAB forming step of the first cycle the same as the applied current $I_2$ in the FAB forming step of the second cycle onward, the same semiconductor chip and lead frame as those of Example 1 were used to perform wire bonding by the same procedure and under the same conditions as Example 1.

Diameters Dx and Dy (diameters in the X and Y directions) of the base portion and thickness Tz (height in the Z direction) of the base portion of each pad bond portion thus formed were measured. The measured values of Dx, Dy, and Tz are shown in Table 5 below. Also, the variation of the volumes V of the respective base portions with respect to the average of the volumes V of all base portions was computed based on Dx, Dy, and Tz. The results are shown in Table 5.

Also, a distribution of the diameters Dx and Dy of the base portions is shown in FIG. 50A. Also, a distribution of the thicknesses Tz of the base portions is shown in FIG. 50B. In FIGS. 50A and 50B, a plot of ■ indicates the diameter or the thickness of the base portion formed in the first cycle, and the diameters or the thicknesses of the base portions formed in the second cycle onward are the same as those of Example 1.

Dx, Dy, and Tz of the base portion of the first cycle were: diameter Dx: 71.0 μm; diameter Dy: 71.5 μm; and thickness Tz: 13.5 μm; and confirmed to be smaller than the diameters and thickness of the base portion of the first cycle in Example 1.

Example 2

Besides using a lead frame having 48 electrode leads and a semiconductor chip having 48 electrode pads, wire bonding by the same procedure and under the same conditions as Example 1 was performed.

Diameters Dx and Dy (diameters in the X and Y directions) of the base portion and thickness Tz (height in the Z direction) of the base portion of each pad bond portion thus formed were measured. The measured values of Dx, Dy, and Tz are shown in Table 2 below. Also, the variation of the volumes V of the respective base portions with respect to the average of the volumes V of all base portions was computed based on Dx, Dy, and Tz. The results are shown in Table 2.

Figure 51A:
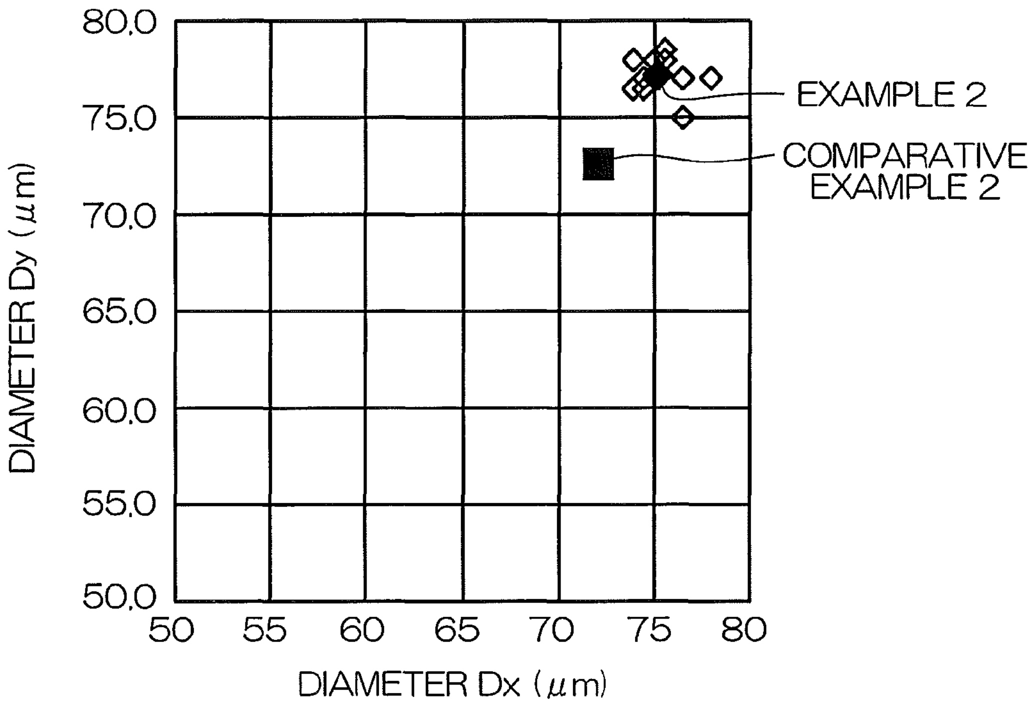
FIG. 51A is a distribution diagram of sizes of base portions of Example 2 and Comparative Example 2 of the sixth preferred embodiment and is a distribution diagram of base diameters in an X-direction and a Y-direction.
Figure 51B:
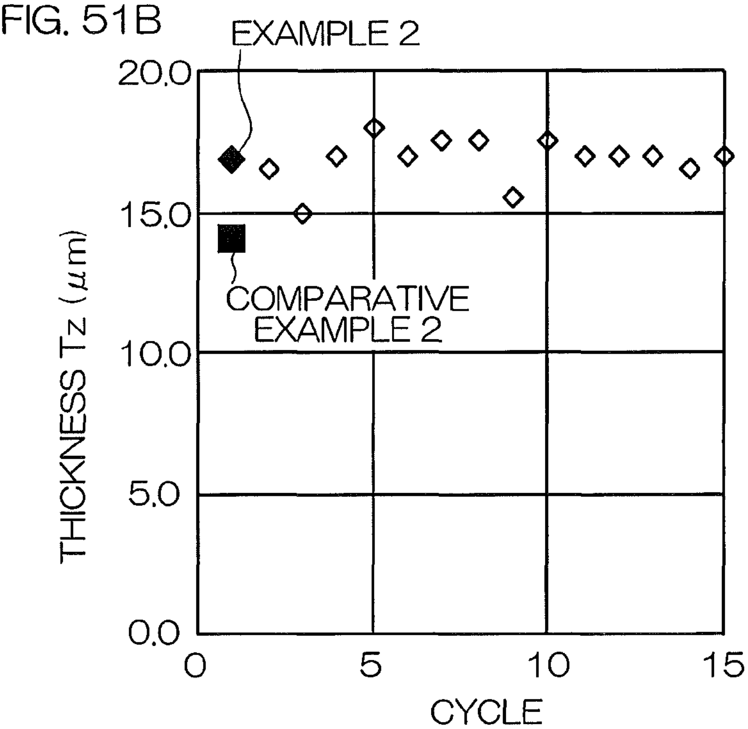
FIG. 51B is a distribution diagram of sizes of the base portions of Example 2 and Comparative Example 2 of the sixth preferred embodiment and is a distribution diagram of thickness in a Z-direction.

Also, a distribution of the diameters Dx and Dy of the base portions is shown in FIG. 51A. Also, a distribution of the thicknesses Tz of the base portions is shown in FIG. 51B. In FIGS. 51A and 51B, a plot of ♦ indicates the diameter or the thickness of the base portion formed in the first cycle, and a plot of ◊ indicates the diameters or the thicknesses of the base portions formed in the second cycle onward.

The average values of Dx, Dy, and Tz of the base portions of the second cycle onward were calculated to be: diameter Dx: 75.0 μm; diameter Dy: 76.8 μm; and thickness Tz: 16.7 μm. Meanwhile, Dx, Dy, and Tz of the base portion of the first cycle were: diameter Dx: 75.2 μm; diameter Dy: 77.1 μm; and thickness Tz: 16.9 μm.

Comparative Example 2

Besides making the application time $t_1$ in the FAB forming step of the first cycle the same as the application time $t_2$ in the FAB forming step of the second cycle onward, the same semiconductor chip and lead frame as those of Example 2 were used to perform wire bonding by the same procedure and under the same conditions as Example 2.

Diameters Dx and Dy (diameters in the X and Y directions) of the base portion and thickness Tz (height in the Z direction) of the base portion of each pad bond portion thus formed were measured. The measured values of Dx, Dy, and Tz are shown in Table 5 below. Also, the variation of the volumes V of the respective base portions with respect to the average of the volumes V of all base portions was computed based on Dx, Dy, and Tz. The results are shown in Table 5.

Also, a distribution of the diameters Dx and Dy of the base portions is shown in FIG. 51A. Also, a distribution of the thicknesses Tz of the base portions is shown in FIG. 51B. In FIGS. 51A and 51B, a plot of ■ indicates the diameter or the thickness of the base portion formed in the first cycle, and the diameters or the thicknesses of the base portions formed in the second cycle are the same as those of Example 2.

Dx, Dy, and Tz of the base portion of the first cycle were: diameter Dx: 72.0 μm; diameter Dy: 72.5 μm; and thickness Tz: 14.0 μm; and confirmed to be smaller than the diameters and thickness of the base portion of the first cycle in Example 2.

Example 3

Besides using a lead frame having 44 electrode leads and a semiconductor chip having 44 electrode pads, wire bonding by the same procedure and under the same conditions as Example 1 was performed.

Diameters Dx and Dy (diameters in the X and Y directions) of the base portion and thickness Tz (height in the Z direction) of the base portion of each pad bond portion thus formed were measured. The measured values of Dx, Dy, and Tz are shown in Table 3 below. Also, the variation of the volumes V of the respective base portions with respect to the average of the volumes V of all base portions was computed based on Dx, Dy, and Tz. The results are shown in Table 3.

Figure 52A:
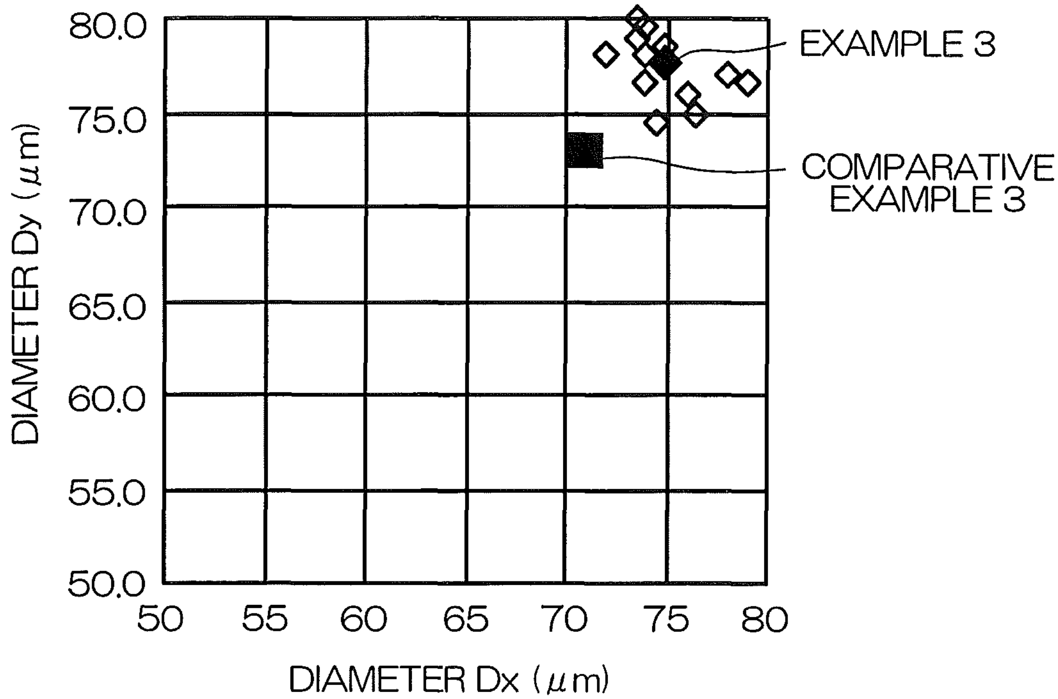
FIG. 52A is a distribution diagram of sizes of base portions of Example 3 and Comparative Example 3 of the sixth preferred embodiment and is a distribution diagram of base diameters in an X-direction and a Y-direction.
Figure 52B:
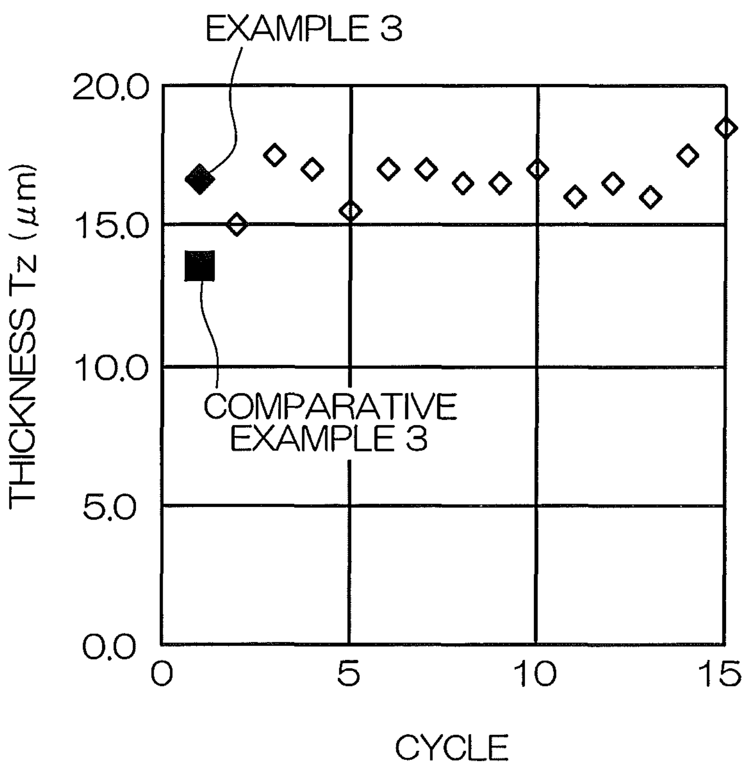
FIG. 52B is a distribution diagram of sizes of the base portions of Example 3 and Comparative Example 3 of the sixth preferred embodiment and is a distribution diagram of thickness in a Z-direction.

Also, a distribution of the diameters Dx and Dy of the base portions is shown in FIG. 52A. Also, a distribution of the thicknesses Tz of the base portions is shown in FIG. 52B. In FIGS. 52A and 52B, a plot of ♦ indicates the diameter or the thickness of the base portion formed in the first cycle, and a plot of ◇ indicates the diameters or the thicknesses of the base portions formed in the second cycle onward.

The average values of Dx, Dy, and Tz of the base portions of the second cycle onward were calculated to be: diameter Dx: 74.7 μm; diameter Dy: 77.3 μm; and thickness Tz: 16.5 μm. Meanwhile, Dx, Dy, and Tz of the base portion of the first cycle were: diameter Dx: 74.9 μm; diameter Dy: 77.6 μm; and thickness Tz: 16.7 μm.

Comparative Example 3

Besides making the application time $t_1$ in the FAB forming step of the first cycle the same as the application time $t_2$ in the FAB forming step of the second cycle onward, the same semiconductor chip and lead frame as those of Example 3 were used to perform wire bonding by the same procedure and under the same conditions as Example 3.

Diameters Dx and Dy (diameters in the X and Y directions) of the base portion and thickness Tz (height in the Z direction) of the base portion of each pad bond portion thus formed were measured. The measured values of Dx, Dy, and Tz are shown in Table 6 below. Also, the variation of the volumes V of the respective base portions with respect to the average of the volumes V of all base portions was computed based on Dx, Dy, and Tz. The results are shown in Table 6.

Also, a distribution of the diameters Dx and Dy of the base portions is shown in FIG. 52A. Also, a distribution of the thicknesses Tz of the base portions is shown in FIG. 52B. In FIGS. 52A and 52B, a plot of ■ indicates the diameter or the thickness of the base portion formed in the first cycle, and the diameters or the thicknesses of the base portions formed in the second cycle are the same as those of Example 3.

Dx, Dy, and Tz of the base portion of the first cycle were: diameter Dx: 71.0 μm; diameter Dy: 73.0 μm; and thickness Tz: 13.5 μm; and confirmed to be smaller than the diameters and thickness of the base portion of the first cycle in Example 3.

Example 4

Besides using a lead frame having 20 electrode leads and a semiconductor chip having 20 electrode pads, wire bonding by the same procedure and under the same conditions as Example 1 was performed.

Diameters Dx and Dy (diameters in the X and Y directions) of the base portion and thickness Tz (height in the Z direction) of the base portion of each pad bond portion thus formed were measured. The measured values of Dx, Dy, and Tz are shown in Table 3 below. Also, the variation of the volumes V of the respective base portions with respect to the average of the volumes V of all base portions was computed based on Dx, Dy, and Tz. The results are shown in Table 3.

Figure 53A:
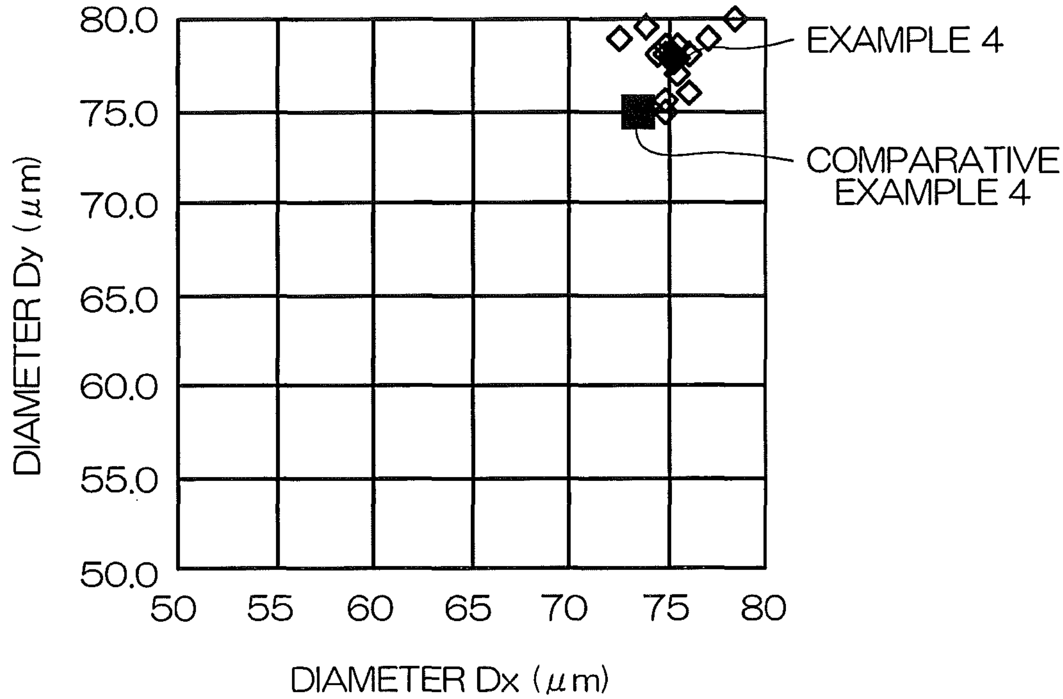
FIG. 53A is a distribution diagram of sizes of base portions of Example 4 and Comparative Example 4 of the sixth preferred embodiment and is a distribution diagram of base diameters in an X-direction and a Y-direction.
Figure 53B:
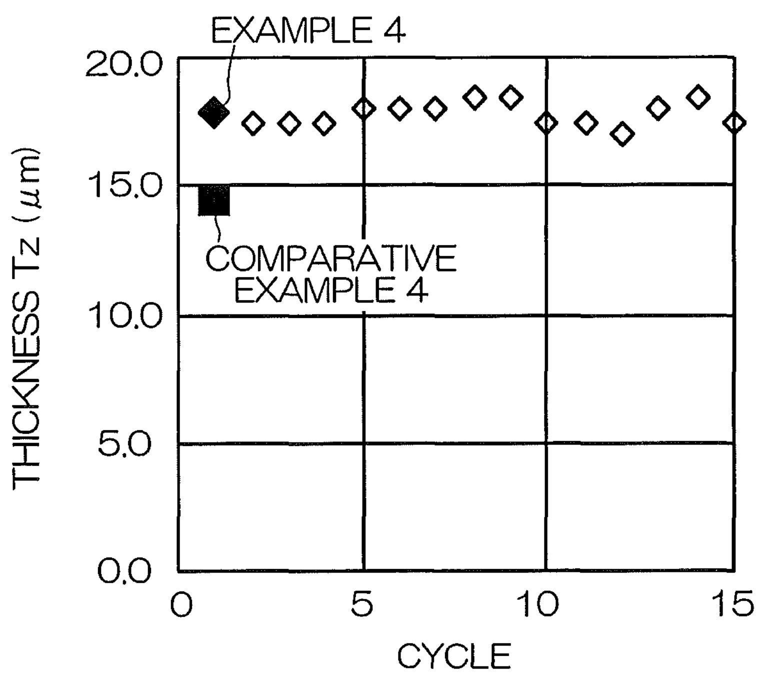
FIG. 53B is a distribution diagram of sizes of the base portions of Example 4 and Comparative Example 4 of the sixth preferred embodiment and is a distribution diagram of thickness in a Z-direction.

Also, a distribution of the diameters Dx and Dy of the base portions is shown in FIG. 53A. Also, a distribution of the thicknesses Tz of the base portions is shown in FIG. 53B. In FIGS. 53A and 53B, a plot of ♦ indicates the diameter or the thickness of the base portion formed in the first cycle, and a plot of ◇ indicates the diameters or the thicknesses of the base portions formed in the second cycle onward.

The average values of Dx, Dy, and Tz of the base portions of the second cycle onward were calculated to be: diameter Dx: 75.2 μm; diameter Dy: 77.7 μm; and thickness Tz: 17.6 μm. Meanwhile, Dx, Dy, and Tz of the base portion of the first cycle were: diameter Dx: 75.3 μm; diameter Dy: 77.9 μm; and thickness Tz: 17.8 μm.

Comparative Example 4

Besides making the application time $t_1$ in the FAB forming step of the first cycle the same as the application time $t_2$ in the FAB forming step of the second cycle onward, the same semiconductor chip and lead frame as those of Example 4 were used to perform wire bonding by the same procedure and under the same conditions as Example 4.

Diameters Dx and Dy (diameters in the X and Y directions) of the base portion and thickness Tz (height in the Z direction) of the base portion of each pad bond portion thus formed were measured. The measured values of Dx, Dy, and Tz are shown in Table 6 below. Also, the variation of the volumes V of the respective base portions with respect to the average of the volumes V of all base portions was computed based on Dx, Dy, and Tz. The results are shown in Table 6.

Also, a distribution of the diameters Dx and Dy of the base portions is shown in FIG. 53A. Also, a distribution of the thicknesses Tz of the base portions is shown in FIG. 53B. In FIGS. 53A and 53B, a plot of ■ indicates the diameter or the thickness of the base portion formed in the first cycle, and the diameters or the thicknesses of the base portions formed in the second cycle onward are the same as those of Example 4.

Dx, Dy, and Tz of the base portion of the first cycle were: diameter Dx: 73.5 μm; diameter Dy: 75.0 μm; and thickness Tz: 14.5 μm; and confirmed to be smaller than the diameters and thickness of the base portion of the first cycle in Example 4.

Example 5

Besides using a lead frame having 20 electrode leads and a semiconductor chip (chip differing from that of Example 4) having 20 electrode pads, wire bonding by the same procedure and under the same conditions as Example 1 was performed.

Diameters Dx and Dy (diameters in the X and Y directions) of the base portion and thickness Tz (height in the Z direction) of the base portion of each pad bond portion thus formed were measured. The measured values of Dx, Dy, and Tz are shown in Table 4 below. Also, the variation of the volumes V of the respective base portions with respect to the average of the volumes V of all base portions was computed based on Dx, Dy, and Tz. The results are shown in Table 4.

Figure 54A:
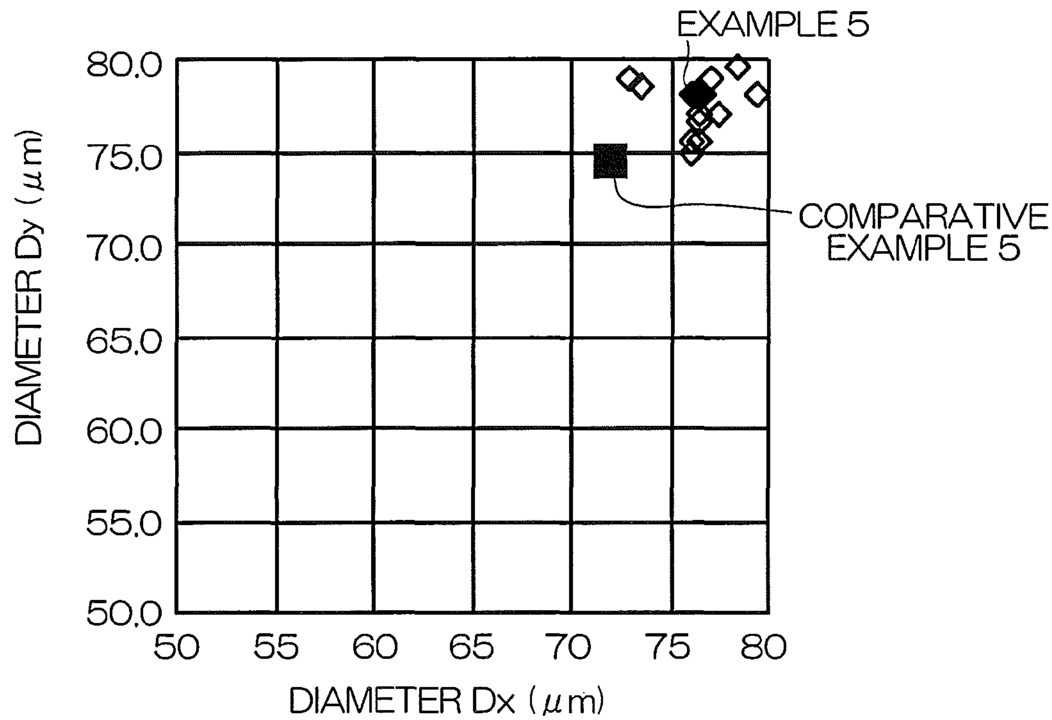
FIG. 54A is a distribution diagram of sizes of base portions of Example 5 and Comparative Example 5 of the sixth preferred embodiment and is a distribution diagram of base diameters in an X-direction and a Y-direction.

Also, a distribution of the diameters Dx and Dy of the base portions is shown in FIG. 54A. Also, a distribution of the thicknesses Tz of the base portions is shown in FIG. 54B.

Figure 54B:
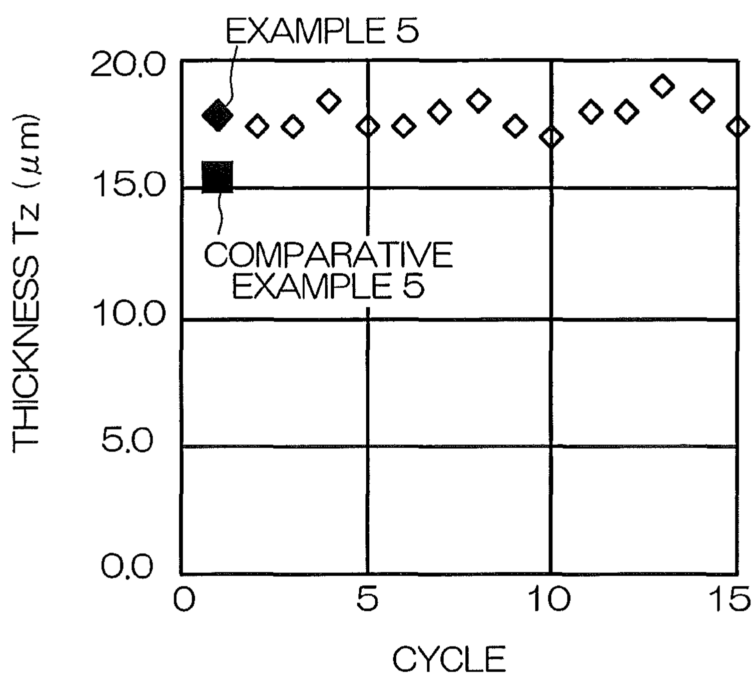
FIG. 54B is a distribution diagram of sizes of the base portions of Example 5 and Comparative Example 5 of the sixth preferred embodiment and is a distribution diagram of thickness in a Z-direction.

In FIGS. 54A and 54B, a plot of ♦ indicates the diameter or the thickness of the base portion formed in the first cycle, and a plot of ◇ indicates the diameters or the thicknesses of the base portions formed in the second cycle onward.

The average values of Dx, Dy, and Tz of the base portions of the second cycle onward were calculated to be: diameter Dx: 76.1 μm; diameter Dy: 77.8 μm; and thickness Tz: 17.7 μm. Meanwhile, Dx, Dy, and Tz of the base portion of the first cycle were: diameter Dx: 76.4 μm; diameter Dy: 78.0 μm; and thickness Tz: 17.9 μm.

Comparative Example 5

Besides making the application time $t_1$ in the FAB forming step of the first cycle the same as the application time $t_2$ in the FAB forming step of the second cycle onward, the same semiconductor chip and lead frame as those of Example 5 were used to perform wire bonding by the same procedure and under the same conditions as Example 5.

Diameters Dx and Dy (diameters in the X and Y directions) of the base portion and thickness Tz (height in the Z direction) of the base portion of each pad bond portion thus formed were measured. The measured values of Dx, Dy, and Tz are shown in Table 7 below. Also, the variation of the volumes of the respective base portions with respect to the average of the volumes of all base portions was computed based on Dx, Dy, and Tz. The results are shown in Table 7.

Also, a distribution of the diameters Dx and Dy of the base portions is shown in FIG. 54A. Also, a distribution of the thicknesses Tz of the base portions is shown in FIG. 54B. In FIGS. 54A and 54B, a plot of ■ indicates the diameter or the thickness of the base portion formed in the first cycle, and the diameters or the thicknesses of the base portions formed in the second cycle are the same as those of Example 5.

Dx, Dy, and Tz of the base portion of the first cycle were: diameter Dx: 72.0 μm; diameter Dy: 74.5 μm; and thickness Tz: 15.5 μm; and confirmed to be smaller than the diameters and thickness of the base portion of the first cycle in Example 5.

TABLE 2

| Cycle | Diameter Dx (μm) | Diameter Dy (μm) | Thickness Tz (μm) | Volume V (μm³) | AVE (μm³) | AVE − V (μm³) | Variation of volume V (%) (AVE − V)/AVE × 100 |
|---|---|---|---|---|---|---|---|
| Example 1 | | | | | | | |
| 1 | 74.1 | 75.1 | 15.0 | 83449.4 | 84513.0 | 1063.6 | 1.26 |
| 2 | 71.5 | 72.5 | 15.5 | 80348.1 | 84513.0 | 4164.9 | 4.98 |
| 3 | 78.0 | 76.5 | 13.5 | 80554.5 | 84513.0 | 3958.5 | 4.68 |
| 4 | 73.0 | 75.5 | 15.0 | 82672.5 | 84513.0 | 1840.5 | 2.18 |
| 5 | 72.5 | 77.0 | 15.5 | 86528.8 | 84513.0 | 2015.7 | 2.39 |
| 6 | 72.0 | 76.0 | 14.5 | 79344.0 | 84513.0 | 5169.0 | 6.12 |
| 7 | 73.5 | 73.5 | 15.5 | 83734.9 | 84513.0 | 778.2 | 0.92 |
| 8 | 74.5 | 74.0 | 15.5 | 85451.5 | 84513.0 | 938.5 | 1.11 |
| 9 | 75.5 | 74.5 | 15.0 | 84371.3 | 84513.0 | 141.8 | 0.17 |
| 10 | 74.0 | 75.0 | 15.5 | 86025.0 | 84513.0 | 1512.0 | 1.79 |
| 11 | 74.0 | 76.5 | 15.0 | 84915.0 | 84513.0 | 402.0 | 0.48 |
| 12 | 75.0 | 75.0 | 15.0 | 84375.0 | 84513.0 | 138.0 | 0.16 |
| 13 | 76.0 | 74.5 | 16.0 | 90592.0 | 84513.0 | 6079.0 | 7.19 |
| 14 | 73.0 | 77.0 | 15.5 | 87125.5 | 84513.0 | 2612.5 | 3.09 |
| 15 | 74.5 | 74.0 | 16.0 | 88208.0 | 84513.0 | 3695.0 | 4.37 |
| Total of volumes V (μm³) | | | | 1267695.4 | | | |
| Average AVE of volumes V (μm³) | | | | 84513.0 | | | |
| Example 2 | | | | | | | |
| 1 | 75.2 | 77.1 | 16.9 | 97762.8 | 97765.4 | 2.6 | 0.00 |
| 2 | 74.0 | 76.5 | 16.5 | 93406.5 | 97765.4 | 4358.9 | 4.46 |
| 3 | 74.0 | 76.5 | 15.0 | 84915.0 | 97765.4 | 12850.4 | 13.14 |
| 4 | 74.5 | 76.5 | 17.0 | 96887.3 | 97765.4 | 878.2 | 0.90 |
| 5 | 76.5 | 75.0 | 18.0 | 103275.0 | 97765.4 | 5509.6 | 5.64 |
| 6 | 78.0 | 77.0 | 17.0 | 102102.0 | 97765.4 | 4336.6 | 4.44 |
| 7 | 76.5 | 77.0 | 17.5 | 103083.8 | 97765.4 | 5318.3 | 5.44 |
| 8 | 75.0 | 77.0 | 17.5 | 101062.5 | 97765.4 | 3297.1 | 3.37 |
| 9 | 75.5 | 78.5 | 15.5 | 91864.6 | 97765.4 | 5900.8 | 6.04 |
| 10 | 74.0 | 78.0 | 17.5 | 101010.0 | 97765.4 | 3244.6 | 3.32 |
| 11 | 75.5 | 78.0 | 17.0 | 100113.0 | 97765.4 | 2347.6 | 2.40 |
| 12 | 74.5 | 77.0 | 17.0 | 97520.5 | 97765.4 | 244.9 | 0.25 |
| 13 | 74.0 | 76.5 | 17.0 | 96237.0 | 97765.4 | 1528.4 | 1.56 |
| 14 | 75.5 | 78.5 | 16.5 | 97791.4 | 97765.4 | 26.0 | 0.03 |
| 15 | 75.0 | 78.0 | 17.0 | 99450.0 | 97765.4 | 1684.6 | 1.72 |
| Total of volumes V (μm³) | | | | 1466481.3 | | | |
| Average AVE of volumes V (μm³) | | | | 97765.4 | | | |

TABLE 3

| Cycle | Diameter Dx (μm) | Diameter Dy (μm) | Thickness Tz (μm) | Volume V ($\mu m^3$) | AVE ($\mu m^3$) | AVE − V ($\mu m^3$) | Variation of volume V (%) (AVE − V)/ AVE × 100 |
|---|---|---|---|---|---|---|---|
| Example 3 | | | | | | | |
| 1 | 74.9 | 77.6 | 16.7 | 96985.8 | 96945.8 | 39.9 | 0.04 |
| 2 | 73.5 | 80.0 | 15.0 | 88200.0 | 96945.8 | 8745.8 | 9.02 |
| 3 | 74.5 | 74.5 | 17.5 | 97129.4 | 96945.8 | 183.5 | 0.19 |
| 4 | 74.0 | 79.5 | 17.0 | 100011.0 | 96945.8 | 3065.2 | 3.16 |
| 5 | 74.0 | 78.0 | 15.5 | 89466.0 | 96945.8 | 7479.8 | 7.72 |
| 6 | 76.0 | 76.0 | 17.0 | 98192.0 | 96945.8 | 1246.2 | 1.29 |
| 7 | 72.0 | 78.0 | 17.0 | 95472.0 | 96945.8 | 1473.8 | 1.52 |
| 8 | 78.0 | 77.0 | 16.5 | 99099.0 | 96945.8 | 2153.2 | 2.22 |
| 9 | 74.0 | 76.5 | 16.5 | 93406.5 | 96945.8 | 3539.3 | 3.65 |
| 10 | 76.5 | 75.0 | 17.0 | 97537.5 | 96945.8 | 591.7 | 0.61 |
| 11 | 75.0 | 78.5 | 16.0 | 94200.0 | 96945.8 | 2745.8 | 2.83 |
| 12 | 79.0 | 76.5 | 16.5 | 99717.8 | 96945.8 | 2771.9 | 2.86 |
| 13 | 73.5 | 79.0 | 16.0 | 92904.0 | 96945.8 | 4041.8 | 4.17 |
| 14 | 75.0 | 78.5 | 17.5 | 103031.3 | 96945.8 | 6085.4 | 6.28 |
| 15 | 74.0 | 79.5 | 18.5 | 108835.5 | 96945.8 | 11889.7 | 12.26 |
| Total of volumes V ($\mu m^3$) | | | | 1454187.6 | | | |
| Average AVE of volumes V ($\mu m^3$) | | | | 96945.8 | | | |
| Example 4 | | | | | | | |
| 1 | 75.3 | 77.9 | 17.8 | 104460.8 | 104490.3 | 29.4 | 0.03 |
| 2 | 75.0 | 75.5 | 17.5 | 99093.8 | 104490.3 | 5396.5 | 5.16 |
| 3 | 74.5 | 78.0 | 17.5 | 101692.5 | 104490.3 | 2797.8 | 2.68 |
| 4 | 74.0 | 79.5 | 17.5 | 102952.5 | 104490.3 | 1537.8 | 1.47 |
| 5 | 75.0 | 75.0 | 18.0 | 101250.0 | 104490.3 | 3240.3 | 3.10 |
| 6 | 77.0 | 79.0 | 18.0 | 109494.0 | 104490.3 | 5003.7 | 4.79 |
| 7 | 76.0 | 78.0 | 18.0 | 106704.0 | 104490.3 | 2213.7 | 2.12 |
| 8 | 78.5 | 80.0 | 18.5 | 116180.0 | 104490.3 | 11689.7 | 11.19 |
| 9 | 75.0 | 78.5 | 18.5 | 108918.8 | 104490.3 | 4428.5 | 4.24 |
| 10 | 72.5 | 79.0 | 17.5 | 100231.3 | 104490.3 | 4259.0 | 4.08 |
| 11 | 75.0 | 78.0 | 17.5 | 102375.0 | 104490.3 | 2115.3 | 2.02 |
| 12 | 75.5 | 77.0 | 17.0 | 98829.5 | 104490.3 | 5660.8 | 5.42 |
| 13 | 74.5 | 78.0 | 18.0 | 104595.0 | 104490.3 | 107.7 | 0.10 |
| 14 | 76.0 | 76.0 | 18.5 | 106856.0 | 104490.3 | 2365.7 | 2.26 |
| 15 | 75.5 | 78.5 | 17.5 | 103718.1 | 104490.3 | 772.2 | 0.74 |
| Total of volumes V ($\mu m^3$) | | | | 1567354.2 | | | |
| Average AVE of volumes V ($\mu m^3$) | | | | 104490.3 | | | |

TABLE 4

| Cycle | Diameter Dx (μm) | Diameter Dy (μm) | Thickness Tz (μm) | Volume V ($\mu m^3$) | AVE ($\mu m^3$) | AVE − V ($\mu m^3$) | Variation of volume V (%) (AVE − V)/ AVE × 100 |
|---|---|---|---|---|---|---|---|
| Example 5 | | | | | | | |
| 1 | 76.4 | 78.0 | 17.9 | 106667.0 | 106666.6 | 0.4 | 0.00 |
| 2 | 76.0 | 75.5 | 17.5 | 100415.0 | 106666.6 | 6251.6 | 5.86 |
| 3 | 76.5 | 77.0 | 17.5 | 103083.8 | 106666.6 | 3582.8 | 3.36 |
| 4 | 76.0 | 75.0 | 18.5 | 105450.0 | 106666.6 | 1216.6 | 1.14 |
| 5 | 78.5 | 79.5 | 17.5 | 109213.1 | 106666.6 | 2546.5 | 2.39 |
| 6 | 76.5 | 81.5 | 17.5 | 109108.1 | 106666.6 | 2441.5 | 2.29 |
| 7 | 76.0 | 78.0 | 18.0 | 106704.0 | 106666.6 | 37.4 | 0.04 |
| 8 | 76.5 | 76.5 | 18.5 | 108266.6 | 106666.6 | 1600.0 | 1.50 |
| 9 | 73.5 | 78.5 | 17.5 | 100970.6 | 106666.6 | 5696.0 | 5.34 |
| 10 | 77.5 | 77.0 | 17.0 | 101447.5 | 106666.6 | 5219.1 | 4.89 |
| 11 | 76.5 | 75.5 | 18.0 | 103963.5 | 106666.6 | 2703.1 | 2.53 |
| 12 | 73.0 | 79.0 | 18.0 | 103806.0 | 106666.6 | 2860.6 | 2.68 |
| 13 | 77.0 | 79.0 | 19.0 | 115577.0 | 106666.6 | 8910.4 | 8.35 |
| 14 | 77.0 | 82.0 | 18.5 | 116809.0 | 106666.6 | 10142.4 | 9.51 |
| 15 | 79.5 | 78.0 | 17.5 | 108517.5 | 106666.6 | 1850.9 | 1.74 |
| Total of volumes V ($\mu m^3$) | | | | 1599998.7 | | | |
| Average AVE of volumes V ($\mu m^3$) | | | | 106666.6 | | | |

TABLE 5

| Cycle | Diameter Dx (μm) | Diameter Dy (μm) | Thickness Tz (μm) | Volume V ($\mu m^3$) | AVE ($\mu m^3$) | AVE − V ($\mu m^3$) | Variation of volume V (%) (AVE − V)/ AVE × 100 |
|---|---|---|---|---|---|---|---|
| Comparative Example 1 | | | | | | | |
| 1 | 71.0 | 71.5 | 13.5 | 68532.8 | 83518.6 | 14985.9 | 17.94 |
| 2 | 71.5 | 72.5 | 15.5 | 80348.1 | 83518.6 | 3170.5 | 3.80 |
| 3 | 78.0 | 76.5 | 13.5 | 80554.5 | 83518.6 | 2964.1 | 3.55 |
| 4 | 73.0 | 75.5 | 15.0 | 82672.5 | 83518.6 | 846.1 | 1.01 |
| 5 | 72.5 | 77.0 | 15.5 | 86528.8 | 83518.6 | 3010.1 | 3.60 |
| 6 | 72.0 | 76.0 | 14.5 | 79344.0 | 83518.6 | 4174.6 | 5.00 |
| 7 | 73.5 | 73.5 | 15.5 | 83734.9 | 83518.6 | 216.3 | 0.26 |
| 8 | 74.5 | 74.0 | 15.5 | 85451.5 | 83518.6 | 1932.9 | 2.31 |
| 9 | 75.5 | 74.5 | 15.0 | 84371.3 | 83518.6 | 852.6 | 1.02 |
| 10 | 74.0 | 75.0 | 15.5 | 86025.0 | 83518.6 | 2506.4 | 3.00 |
| 11 | 74.0 | 76.5 | 15.0 | 84915.0 | 83518.6 | 1396.4 | 1.67 |
| 12 | 75.0 | 75.0 | 15.0 | 84375.0 | 83518.6 | 856.4 | 1.03 |
| 13 | 76.0 | 74.5 | 16.0 | 90592.0 | 83518.6 | 7073.4 | 8.47 |
| 14 | 73.0 | 77.0 | 15.5 | 87125.5 | 83518.6 | 3606.9 | 4.32 |
| 15 | 74.5 | 74.0 | 16.0 | 88208.0 | 83518.6 | 4689.4 | 5.61 |
| Total of volumes V ($\mu m^3$) | | | | 1252778.8 | | | |
| Average AVE of volumes V ($\mu m^3$) | | | | 83518.6 | | | |
| Comparative Example 2 | | | | | | | |
| 1 | 72.0 | 72.5 | 14.0 | 73080.0 | 96119.9 | 23039.9 | 23.97 |
| 2 | 74.0 | 76.5 | 16.5 | 93406.5 | 96119.9 | 2713.4 | 2.82 |
| 3 | 74.0 | 76.5 | 15.0 | 84915.0 | 96119.9 | 11204.9 | 11.66 |
| 4 | 74.5 | 76.5 | 17.0 | 96887.3 | 96119.9 | 767.4 | 0.80 |
| 5 | 76.5 | 75.0 | 18.0 | 103275.0 | 96119.9 | 7155.1 | 7.44 |
| 6 | 78.0 | 77.0 | 17.0 | 102102.0 | 96119.9 | 5982.1 | 6.22 |
| 7 | 76.5 | 77.0 | 17.5 | 103083.8 | 96119.9 | 6963.9 | 7.24 |
| 8 | 75.0 | 77.0 | 17.5 | 101062.5 | 96119.9 | 4942.6 | 5.14 |
| 9 | 75.5 | 78.5 | 15.5 | 91864.6 | 96119.9 | 4255.3 | 4.43 |
| 10 | 74.0 | 78.0 | 17.5 | 101010.0 | 96119.9 | 4890.1 | 5.09 |
| 11 | 75.5 | 78.0 | 17.0 | 100113.0 | 96119.9 | 3993.1 | 4.15 |
| 12 | 74.5 | 77.0 | 17.0 | 97520.5 | 96119.9 | 1400.6 | 1.46 |
| 13 | 74.0 | 76.5 | 17.0 | 96237.0 | 96119.9 | 117.1 | 0.12 |
| 14 | 75.5 | 78.5 | 16.5 | 97791.4 | 96119.9 | 1671.5 | 1.74 |
| 15 | 75.0 | 78.0 | 17.0 | 99450.0 | 96119.9 | 3330.1 | 3.46 |
| Total of volumes V ($\mu m^3$) | | | | 1441798.5 | | | |
| Average AVE of volumes V ($\mu m^3$) | | | | 96119.9 | | | |

TABLE 6

| Cycle | Diameter Dx (μm) | Diameter Dy (μm) | Thickness Tz (μm) | Volume V ($\mu m^3$) | AVE ($\mu m^3$) | AVE − V ($\mu m^3$) | Variation of volume V (%) (AVE − V)/ AVE × 100 |
|---|---|---|---|---|---|---|---|
| 1 | 71.0 | 73.0 | 13.5 | 69970.5 | 95144.8 | 25174.3 | 26.46 |
| 2 | 73.5 | 80.0 | 15.0 | 88200.0 | 95144.8 | 6944.8 | 7.30 |
| 3 | 74.5 | 74.5 | 17.5 | 97129.4 | 95144.8 | 1984.6 | 2.09 |
| 4 | 74.0 | 79.5 | 17.0 | 100011.0 | 95144.8 | 4866.2 | 5.11 |
| 5 | 74.0 | 78.0 | 15.5 | 89466.0 | 95144.8 | 5678.8 | 5.97 |
| 6 | 76.0 | 76.0 | 17.0 | 98192.0 | 95144.8 | 3047.2 | 3.20 |
| 7 | 72.0 | 78.0 | 17.0 | 95472.0 | 95144.8 | 327.2 | 0.34 |
| 8 | 78.0 | 77.0 | 16.5 | 99099.0 | 95144.8 | 3954.2 | 4.16 |
| 9 | 74.0 | 76.5 | 16.5 | 93406.5 | 95144.8 | 1738.3 | 1.83 |
| 10 | 76.5 | 75.0 | 17.0 | 97537.5 | 95144.8 | 2392.7 | 2.51 |
| 11 | 75.0 | 78.5 | 16.0 | 94200.0 | 95144.8 | 944.8 | 0.99 |
| 12 | 79.0 | 76.5 | 16.5 | 99717.8 | 95144.8 | 4573.0 | 4.81 |
| 13 | 73.5 | 79.0 | 16.0 | 92904.0 | 95144.8 | 2240.8 | 2.36 |
| 14 | 75.0 | 78.5 | 17.5 | 103031.3 | 95144.8 | 7886.5 | 8.29 |
| 15 | 74.0 | 79.5 | 18.5 | 108835.5 | 95144.8 | 13690.7 | 14.39 |
| Total of volumes V ($\mu m^3$) | | | | 1427172.4 | | | |
| Average AVE of volumes V ($\mu m^3$) | | | | 95144.8 | | | |
| Comparative Example 4 | | | | | | | |
| 1 | 73.5 | 75.0 | 14.5 | 79931.3 | 102855.0 | 22923.8 | 22.29 |
| 2 | 75.0 | 75.5 | 17.5 | 99093.8 | 102855.0 | 3761.3 | 3.66 |
| 3 | 74.5 | 78.0 | 17.5 | 101692.5 | 102855.0 | 1162.5 | 1.13 |
| 4 | 74.0 | 79.5 | 17.5 | 102952.5 | 102855.0 | 97.5 | 0.09 |

TABLE 6-continued

| Cycle | Diameter Dx (μm) | Diameter Dy (μm) | Thickness Tz (μm) | Volume V (μm³) | AVE (μm³) | AVE − V (μm³) | Variation of volume V (%) (AVE − V)/AVE × 100 |
|---|---|---|---|---|---|---|---|
| 5 | 75.0 | 75.0 | 18.0 | 101250.0 | 102855.0 | 1605.0 | 1.56 |
| 6 | 77.0 | 79.0 | 18.0 | 109494.0 | 102855.0 | 6639.0 | 6.45 |
| 7 | 76.0 | 78.0 | 18.0 | 106704.0 | 102855.0 | 3849.0 | 3.74 |
| 8 | 78.5 | 80.0 | 18.5 | 116180.0 | 102855.0 | 13325.0 | 12.96 |
| 9 | 75.0 | 78.5 | 18.5 | 108918.8 | 102855.0 | 6063.8 | 5.90 |
| 10 | 72.5 | 79.0 | 17.5 | 100231.3 | 102855.0 | 2623.8 | 2.55 |
| 11 | 75.0 | 78.0 | 17.5 | 102375.0 | 102855.0 | 480.0 | 0.47 |
| 12 | 75.5 | 77.0 | 17.0 | 98829.5 | 102855.0 | 4025.5 | 3.91 |
| 13 | 74.5 | 78.0 | 18.0 | 104598.0 | 102855.0 | 1743.0 | 1.69 |
| 14 | 76.0 | 76.0 | 18.5 | 106856.0 | 102855.0 | 4001.0 | 3.89 |
| 15 | 75.5 | 78.5 | 17.5 | 103718.1 | 102855.0 | 863.1 | 0.84 |
| Total of volumes V (μm³) | | | | 1542824.6 | | | |
| Average AVE of volumes V (μm³) | | | | 102855.0 | | | |

TABLE 7

Comparative Example 5

| Cycle | Diameter Dx (μm) | Diameter Dy (μm) | Thickness Tz (μm) | Volume V (μm³) | AVE (μm³) | AVE − V (μm³) | Variation of volume V (%) (AVE − V)/AVE × 100 |
|---|---|---|---|---|---|---|---|
| 1 | 72.0 | 74.5 | 15.5 | 83142.0 | 105098.3 | 21956.3 | 20.89 |
| 2 | 76.0 | 75.5 | 17.5 | 100415.0 | 105098.3 | 4683.3 | 4.46 |
| 3 | 76.5 | 77.0 | 17.5 | 103083.8 | 105098.3 | 2014.6 | 1.92 |
| 4 | 76.0 | 75.0 | 18.5 | 105450.0 | 105098.3 | 351.7 | 0.33 |
| 5 | 78.5 | 79.5 | 17.5 | 109213.1 | 105098.3 | 4114.8 | 3.92 |
| 6 | 76.5 | 81.5 | 17.5 | 109108.1 | 105098.3 | 4009.8 | 3.82 |
| 7 | 76.0 | 78.0 | 18.0 | 106704.0 | 105098.3 | 1605.7 | 1.53 |
| 8 | 76.5 | 76.5 | 18.5 | 108266.6 | 105098.3 | 3168.3 | 3.01 |
| 9 | 73.5 | 78.5 | 17.5 | 100970.6 | 105098.3 | 4127.7 | 3.93 |
| 10 | 77.5 | 77.0 | 17.0 | 101447.5 | 105098.3 | 3650.8 | 3.47 |
| 11 | 76.5 | 75.5 | 18.0 | 103963.5 | 105098.3 | 1134.8 | 1.08 |
| 12 | 73.0 | 79.0 | 18.0 | 103806.0 | 105098.3 | 1292.3 | 1.23 |
| 13 | 77.0 | 79.0 | 19.0 | 115577.0 | 105098.3 | 10478.7 | 9.97 |
| 14 | 77.0 | 82.0 | 18.5 | 116809.0 | 105098.3 | 11710.7 | 11.14 |
| 15 | 79.5 | 78.0 | 17.5 | 108517.5 | 105098.3 | 3419.2 | 3.25 |
| Total of volumes V (μm³) | | | | 1576473.8 | | | |
| Average AVE of volumes V (μm³) | | | | 105098.3 | | | |

Examples 6 to 9 and Comparative Example 6

Besides using a lead frame having 44 electrode leads and a semiconductor chip having 44 electrode pads, wire bonding by the same procedure and under the same conditions as Example 1 was performed. The relationships between the applied energy $E_1$ in the FAB forming step of the first cycle and the applied energy $E_2$ in the FAB forming steps of the second cycle onward in Examples 6 to 9 and Comparative Example 6 were as follows.

Example 6

$$E_1=E_2\times 104(\%)/100$$

Example 7

$$E_1=E_2\times 108(\%)/100$$

Example 8

$$E_1=E_2\times 112(\%)/100$$

Example 9

$$E_1=E_2\times 116(\%)/100$$

Comparative Example 6

$$E_1=E_2\times 100(\%)/100$$

Figure 55:
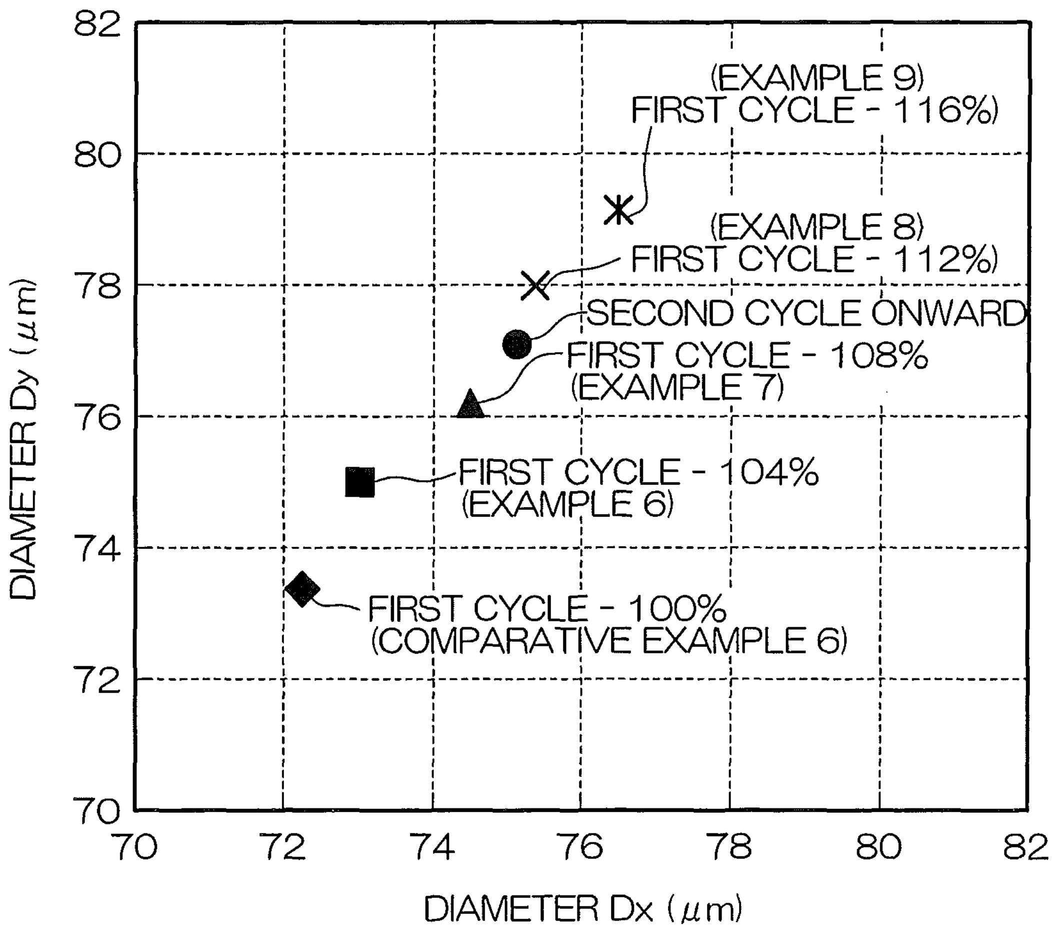
FIG. 55 is a correlation diagram of a relationship between an applied energy $E_1$ of a first cycle and a ball diameter of a pad bond portion.

The diameters in the X and Y directions of the base portion formed in the first cycle and the diameters in the X and Y directions of the base portions formed in the second cycle onward in Examples 6 to 9 and Comparative Example 6 are shown in FIG. 55. In regard to the diameters of the base portions of the second cycle onward, average values are indicated.

The diameters of the base portions of Examples 6 to 9 and Comparative Example 6 were as follows.

Example 6 X-direction Dx: 73.0 μm Y-direction Dy: 75.0 μm
Example 7 X-direction Dx: 75.8 μm Y-direction Dy: 76.8 μm
Example 8 X-direction Dx: 75.4 μm Y-direction Dy: 78.0 μm
Example 9 X-direction Dx: 76.5 μm Y-direction Dy: 79.1 μm
Comparative Example 6 X-direction Dx: 72.2 μm Y-direction Dy: 73.4 μm Second cycle onward (in common to Examples 6 to 9 and Comparative Example 6)

X-direction Dx: 75.2 μm Y-direction Dy: 77.1 μm

The above shows that in Examples 6 to 9, the diameters of both X and Y directions of the base portion in the first cycle were within ranges of ±1 μm of the diameters of the base portions of the second cycle onward. On the other hand, in Comparative Example 6, the diameters of both X and Y directions of the base portion in the first cycle were no less than ±1.5 μm of the diameters of the base portions of the second cycle onward.

Seventh Preferred Embodiment FIG. 56 to FIG. 68

By disclosure of a seventh preferred embodiment, a seventh issue concerning a seventh background art described below can be resolved in addition to the issues described above in the "OBJECT(S) OF THE INVENTION."

(1) Seventh Background Art

In a typical semiconductor device, a semiconductor chip is disposed on a die pad and the semiconductor chip is connected by wires made of Au (gold) to leads disposed at a periphery of the die pad. Specifically, pads made of Al (aluminum) are disposed on a top surface of the semiconductor chip. The wires made of Au are installed so as to form arch-shaped loops between top surfaces of the pads and top surfaces of the leads.

In installing each wire (in wire bonding), an FAB (free air ball) is formed on a tip of a wire held by a capillary of a wire bonder and the FAB is put in contact with a top surface of a pad. In this process, the FAB is pressed toward the pad at a predetermined load by the capillary and a predetermined drive current is supplied to an ultrasonic transducer provided in the capillary to apply ultrasonic vibration to the FAB. Consequently, the FAB is pressed while being rubbed against the top surface of the pad and bonding of the wire to the top surface of the pad is achieved. Thereafter, the capillary is moved toward a lead. The wire is then pressed against a top surface of the lead and the wire is broken while an ultrasonic vibration is applied to the wire. The wire is thereby installed between the top surface of the pad and the top surface of the lead.

Capillaries include standard type capillaries, in which an outer diameter (T dimension) of a face that is a surface that faces a pad during bonding of an FAB and the pad is relatively large and an angle formed by a side surface, connected to the face, and a central axis of the capillary is relatively large, and bottleneck type capillaries, in which an outer shape of the face is relatively small and the angle formed by a side surface, connected to the face, and the central axis of the capillary is relatively small.

(2) Seventh Issue

Recently, price competition of semiconductor devices in the market is becoming severe and further reductions in costs of semiconductor devices are being demanded. As one cost reduction measure, use of wires (copper wires) made of inexpensive Cu (copper) as an alternative to wires (gold wires) made of expensive Au is being examined.

However, an FAB formed on a tip of a copper wire is harder and more difficult to deform than an FAB formed on a tip of a gold wire, and thus in comparison to the FAB formed on the tip of the gold wire, it is difficult to set conditions by which satisfactory bonding to a pad can be achieved.

As long as the size of the FAB is the same, FABs formed on tips of gold wires are satisfactorily bonded to pads using loads of the same magnitude and the same drive current of the ultrasonic transducer regardless of whether the capillary used for wire bonding is a standard type capillary or a bottleneck type capillary. However, with FABs formed on tips of copper wires, even when the load and ultrasonic transducer drive current that enable satisfactory bonding to a pad are known for a case where the capillary used for wire bonding is a standard type capillary, when the capillary is changed to a bottleneck type, satisfactory bonding to a pad cannot be achieved with the load of the same magnitude and the same ultrasonic transducer drive current.

Thus, a seventh object of the present invention related to the seventh preferred embodiment is to provide a wire bonding method that enables magnitudes of a load applied to an FAB and a drive current of an ultrasonic transducer provided in a capillary to be set readily and satisfactory bonding of a copper wire to a pad to be achieved even when the capillary used for wire bonding is changed from a standard type capillary to a bottleneck type capillary.

(3) Disclosure of a Specific Preferred Embodiment

Figure 56:
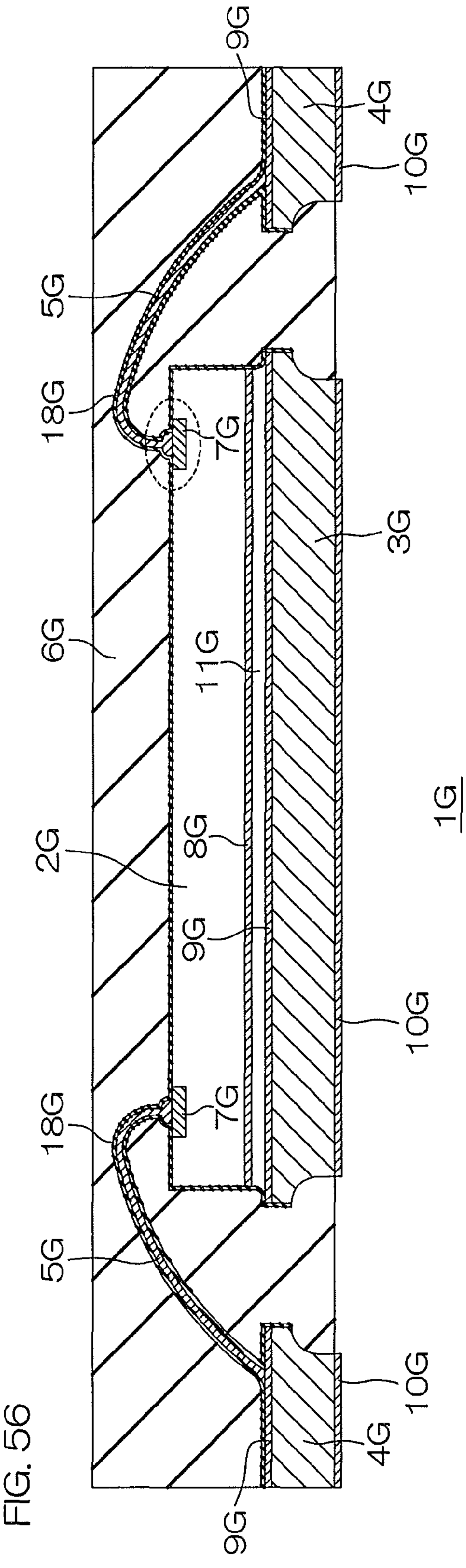
FIG. 56 is a schematic sectional view of a semiconductor device according to a seventh preferred embodiment of the present invention.
Figure 57:
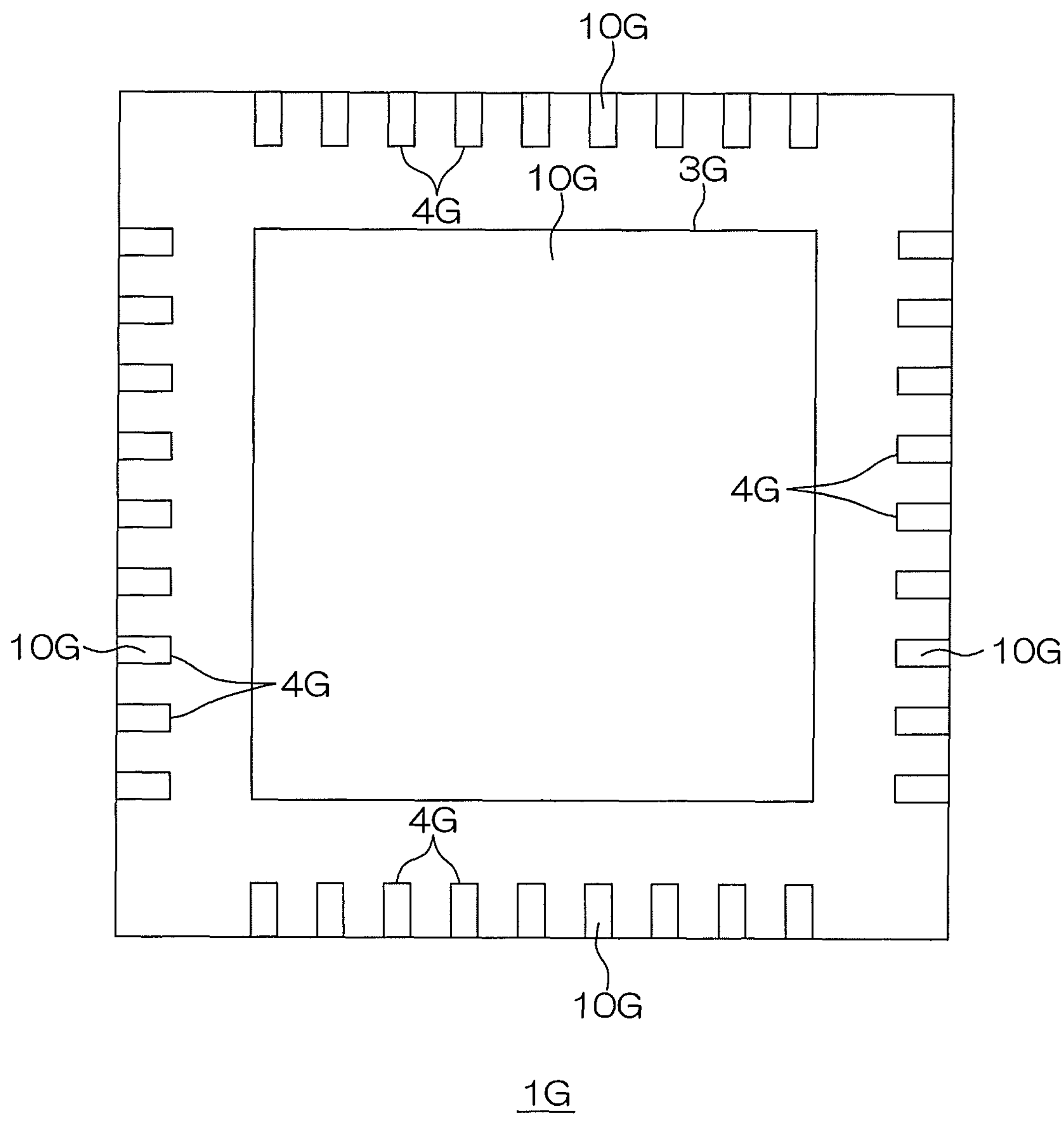
FIG. 57 is a schematic bottom view of the semiconductor device shown in FIG. 56.

FIG. 56 is a schematic sectional view of a semiconductor device according to the seventh preferred embodiment of the present invention. FIG. 57 is a schematic bottom view of the semiconductor device shown in FIG. 56.

The semiconductor device 1G is a semiconductor device to which a QFN (quad flat non-leaded package) configuration is applied and has a structure in which a semiconductor chip 2G is sealed together with a die pad 3G, leads 4G, and copper wires 5G by a resin package 6G. An outer shape of the semiconductor device 1G (resin package 6G) is a flat, rectangular parallelepiped shape.

In the present preferred embodiment, the outer shape of the semiconductor device 1G is a hexahedron having a square shape of 4 mm square as a planar shape and a thickness of 0.85 mm, and dimensions of respective portions of the semiconductor device 1G cited below are an example in the case where the semiconductor device 1G has the above outer dimensions.

The semiconductor chip 2G has a square shape of 2.3 mm in plan view, and the semiconductor chip 2G has a thickness of 0.23 mm. A plurality of pads 7G are disposed at peripheral edge portions of a top surface of the semiconductor chip 2G. Each pad 7G is electrically connected to a circuit built into the semiconductor chip 2G. A rear metal 8G made of a metal layer of Au, Ni (nickel), Ag (silver), etc., is formed on a rear surface of the semiconductor chip 2G.

The die pad 3G and the leads 4G are formed by punching out a metal thin plate (for example, a copper thin plate). The metal thin plate (die pad 3G or lead 4G) has a thickness of 0.2 mm. A plating layer 9G made of Ag is formed on top surfaces of the die pad 3G and leads 4G.

The die pad 3G has a square shape of 2.7 mm in plan view and is disposed at a central portion of the semiconductor device 1G so that its respective side surfaces are parallel to side surfaces of the semiconductor device 1G.

A recess with a substantially quarter-elliptical shape in cross section is formed by performing a squeezing process from the rear surface side across an entire periphery of a peripheral edge portion of the rear surface of the die pad 3G. The resin package 6G enters the recess. The peripheral edge portion of the die pad 3G is thereby sandwiched from above and below by the resin package 6G and prevention of fall-off (retaining) of the die pad 3G with respect to the resin package 6G is thereby achieved.

Also, with the exception of the peripheral edge portion (portion recessed to the substantially quarter-elliptical shape in cross section), the rear surface of the die pad 3G is exposed from a rear surface of the resin package 6G.

An equal number of (for example, nine) leads 4G are disposed at each of positions facing the respective side surfaces of the die pad 3G. At each of the positions facing the side surfaces of the die pad 3G, the leads 4G extend in a direction orthogonal to the facing side surface and are disposed at equal intervals in a direction parallel to the side surface. A longitudinal direction length of each lead 4G is 0.45 mm. An interval between the die pad 3G and the lead 4G is 0.2 mm.

A recess with a substantially quarter-elliptical shape in cross section is formed by performing a squeezing process from the rear surface side at a die pad 3G side end portion of the rear surface of each lead 4G. The resin package 6G enters the recess. The die pad 3G side end portion of the lead 4G is thereby sandwiched from above and below by the resin package 6G and prevention of fall-off (retaining) of the lead 4G with respect to the resin package 6G is thereby achieved.

With the exception of the die pad 3G side end portion (portion recessed to the substantially quarter-elliptical shape in cross section), the rear surface of each lead 4G is exposed from a rear surface of the resin package 6G. Also, a side surface of the lead 4G facing the die pad 3G side is exposed from a side surface of the resin package 6G.

A plating layer 10G formed of solder is formed on portions of the rear surfaces of the die pad 3G and leads 4G that are exposed from the resin package 6G.

With its top surface with the pads 7G disposed thereon facing upward, the semiconductor chip 2G has its rear surface bonded via a bonding material 11G to the top surface (plating layer 10G) of the die pad 3G. For example, a solder paste is used as the bonding material 11G. The bonding material 11G has a thickness of 0.02 mm.

In a case where electrical connection of the semiconductor chip 2G and the die pad 3G is unnecessary, the rear metal 8G may be omitted and the rear surface of the semiconductor chip 2G may be bonded to the top surface of the die pad 3G via a bonding material made of silver paste or other insulating paste. In this case, the planar size of the semiconductor chip 2G is 2.3 mm square. Also, the plating layer 9G on the top surface of the die pad 3G may be omitted.

The copper wires 5G are made, for example, of copper with a purity of no less than 99.99%. One end of each copper wire 5G is bonded to a pad 7G of the semiconductor chip 2G. The other end of the copper wire 5G is bonded to the top surface of a lead 4G. The copper wire 5G is installed so as to form an arch-shaped loop between the semiconductor chip 2G and the lead 4G. A height difference between an apex portion of the loop of the copper wire 5G and the top surface of the semiconductor chip 2G is 0.16 mm.

As in the first preferred embodiment, in the semiconductor device 1G, the entire top surface of the semiconductor chip 2G, the entire top surface and side surfaces of the die pad 3G, the entire top surfaces of the leads 4G, and the entire copper wires 5G are covered by an integral water-impermeable insulating film 18G.

Figure 58:
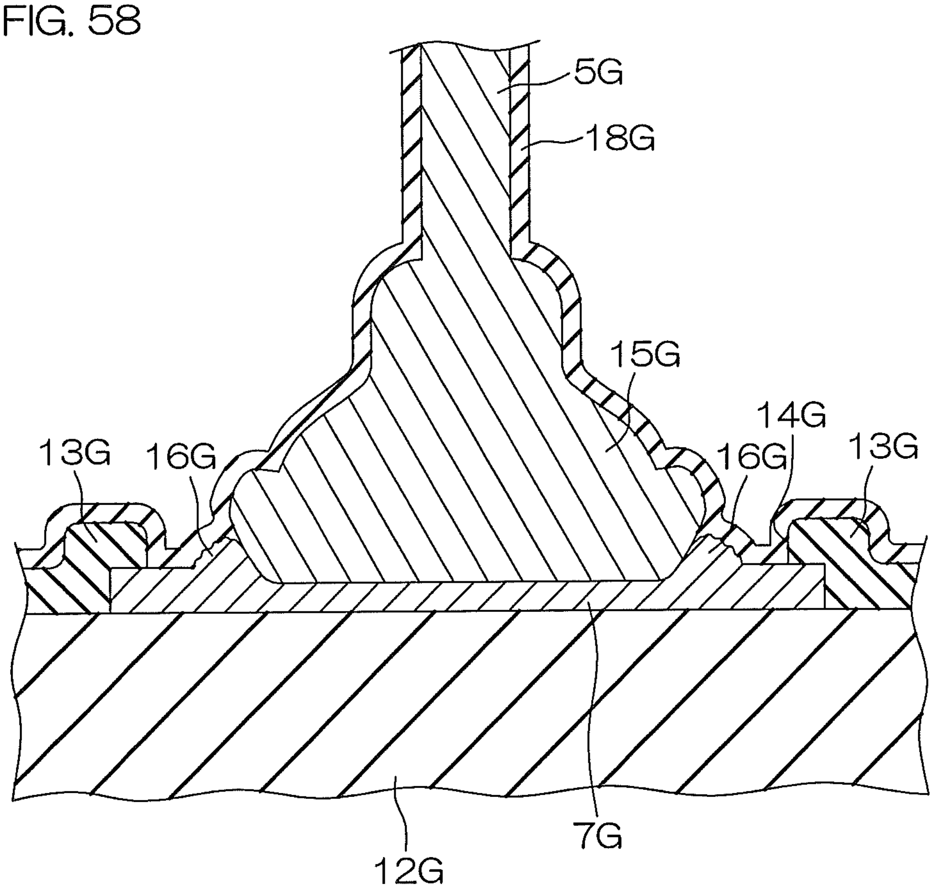
FIG. 58 is an enlarged view of a portion surrounded by broken lines shown in FIG. 56.

FIG. 58 is an enlarged view of a portion surrounded by broken lines shown in FIG. 56.

Each pad 7G is made of a metal that contains aluminum and is formed on an uppermost interlayer insulating film 12G of the semiconductor chip 2G. A top surface protective film 13G is formed on the interlayer insulating film 12G. The pad 7G has its peripheral edge portion covered by the top surface protective film 13G and its central portion is exposed via a pad opening 14G formed in the top surface protective film 13G.

The copper wire 5G is bonded to the central portion of the pad 7G exposed from the top surface protective film 13G. As shall be described below, the copper wire 5G has an FAB formed at its tip and the FAB is pressed against and thereby bonded to the pad 7G. In this process, the FAB deforms to form a first ball portion 15G with a stepped disk shape at the portion of bonding of the copper wire 5G with the pad 7G. Also, at a periphery of the first ball portion 15G, the material of the pad 7G juts out gradually from below the first ball portion 15G so as to form a jutting portion 16G without it being lifted greatly from the top surface of the pad 7G.

For example, in a case where the copper wire 5G has a wire diameter of 25 μm, an intended diameter of the first ball portion 15G (designed diameter of the first ball portion 15G) is 74 to 76 μm, and an intended thickness of the first ball portion 15G (designed thickness of the first ball portion 15G) is 17 to 18 μm.

FIG. 59A to FIG. 59D are schematic sectional views for describing a wire bonding method related to the preferred embodiment of the present invention.

The copper wires 5G are installed across the semiconductor chip 2G and the leads 4G by a wire bonder in a state where the die pad 3G and the leads 4G are connected to a frame (not shown) that surrounds these components, that is, in a state where the die pad 3G and leads 4G make up a lead frame.

Figure 59A:
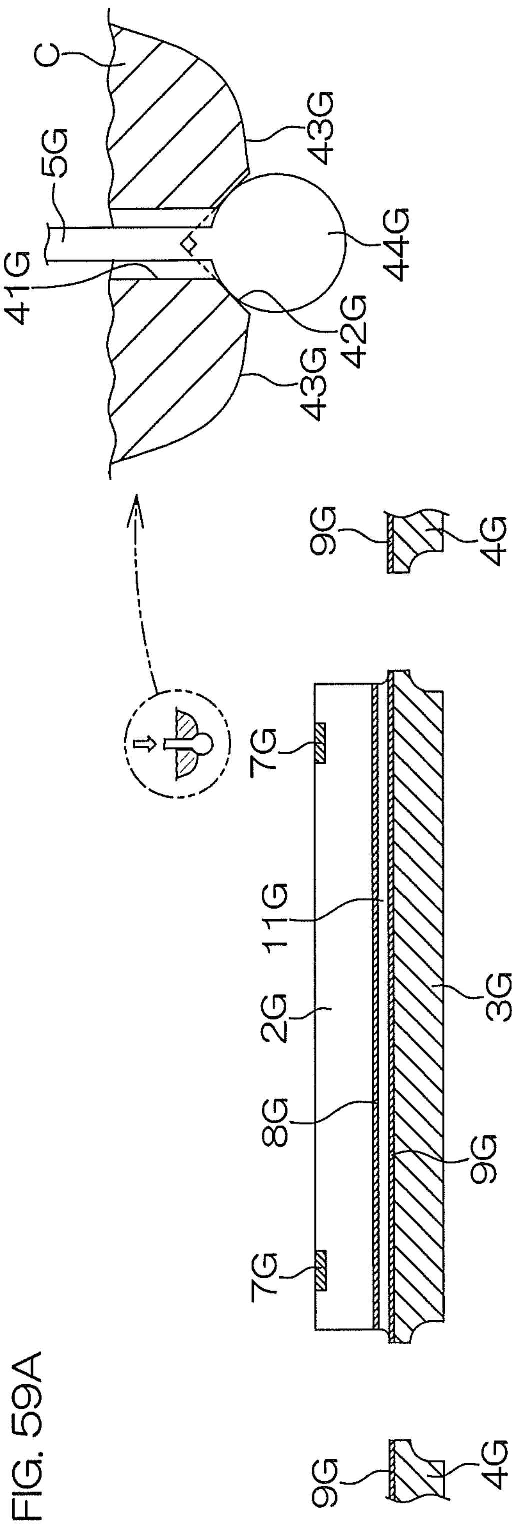
FIG. 59A is a schematic sectional view of a state in a middle of manufacture (middle of wire bonding) of the semiconductor device shown in FIG. 56.

The wire bonder includes a capillary C. As shown in FIG. 59A, the capillary C has a substantially cylindrical shape with a wire insertion hole 41G formed along a central axis. The copper wire 5G is inserted through the wire insertion hole 41G and fed out from a tip (lower end) of the wire insertion hole 41G.

A chamfer 42G of truncated conical shape that is in communication with the wire insertion hole 41G is formed below the wire insertion hole 41G at a tip portion of the capillary C. Also, the tip portion of the capillary C has a face 43G that is continuous with a lower end edge of the chamfer 42G and is a surface that faces a pad 7G or a lead 4G during bonding (during wire bonding) of the copper wire 5G to the pad 7G or the lead 4G. An outer side of the face 43G is gradually inclined upwardly with respect to a plane orthogonal to the central axis of the capillary C.

First, as shown in FIG. 59A, the capillary C is moved to a position directly above the pad 7G. Next, in a state where a tip of the copper wire 5G is positioned at the chamfer 42G, a current is applied to a tip portion of the copper wire 5G and an FAB 44 is thereby formed at the tip portion. The value of the current and the application time are set suitably in accordance with the wire diameter of the copper wire 5G and an intended diameter of the FAB 44 (designed diameter of the FAB 44). A portion of the FAB 44 protrudes below the chamfer 42G.

Figure 59B:
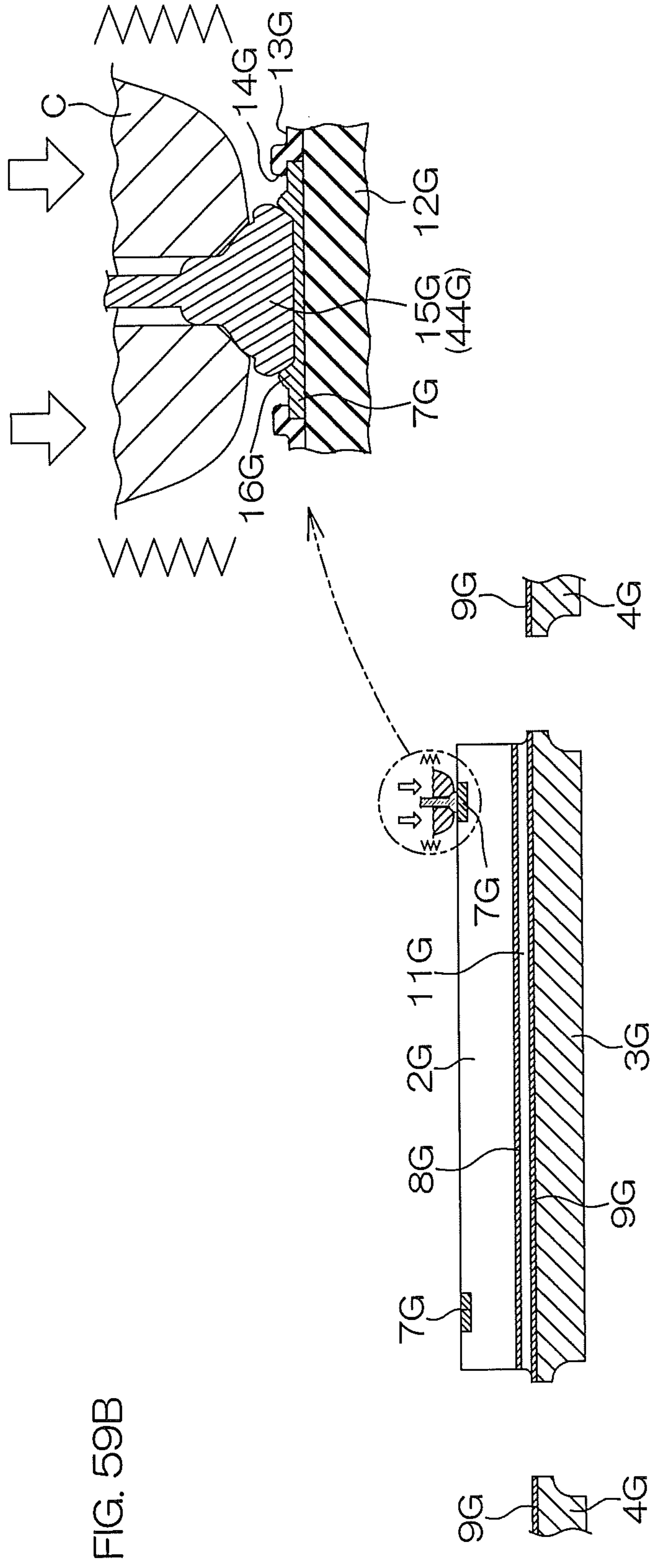
FIG. 59B is a schematic sectional view of a step subsequent to that of FIG. 59A.

Thereafter, as shown in FIG. 59B, the capillary C is lowered toward the pad 7G and the FAB 44 is pressed against the pad 7G by the capillary C. In this process, a load is applied to the FAB 44 by the capillary C and ultrasonic vibration, emitted from an ultrasonic transducer (not shown) provided in the capillary C, is applied to the FAB 44.

Figure 60:
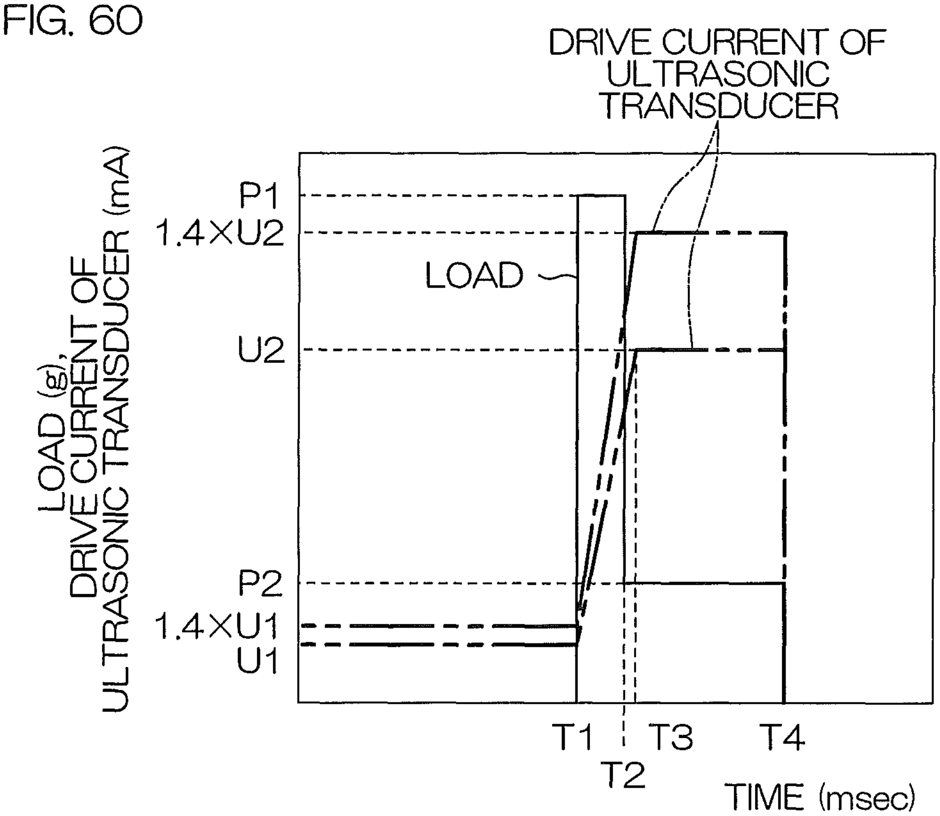
FIG. 60 is a graph of changes with time of a load applied to an FAB and a driving current applied to an ultrasonic transducer during bonding of the FAB to a pad.

FIG. 60 is a graph of changes with time of the load applied to the FAB and a driving current applied to the ultrasonic transducer during the bonding of the FAB to the pad.

For example, as shown in FIG. 60, a relatively large initial load P1 is applied from the capillary C to the FAB 44 from a time T1 at which the FAB 44 contacts the pad 7G to a time T2 after elapse of a predetermined time period (for example, 3 msec). From the time T2 onward, the load applied to the FAB 44 from the capillary C is decreased and a relatively small load P2 (for example, 30 g) is applied to the FAB 44. The load P2 is applied continuously until a time T4 at which the capillary C is raised.

The initial load P1 is set based on a value obtained by multiplying an intended bonding area of the first ball portion 15G with respect to the pad 7G (designed bonding area of the first ball portion 15G with respect to the pad 7G) by a fixed factor (for example, 28786 in a case where the unit of the initial load P1 is g and the unit of the bonding area is $mm^2$). In the present preferred embodiment, the intended bonding area of the first ball portion 15G with respect to the pad 7G is set at 0.00430 $mm^2$ and the initial load P1 is set to 130 g.

In a case where a standard type capillary is used as the capillary C, a drive current of a value U1 is applied to the ultrasonic transducer from before the time T1 at which the FAB 44 contacts the pad 7G. The drive current value U1 is, for example, 15 mA. Then, from the time T1 at which the FAB 44 contacts the pad 7G to a time T3, the value of the drive current applied to the ultrasonic transducer is raised at a fixed rate of change (monotonously) to a value U2. The drive current value U2 is, for example, 90 mA. From the time T3 onward until the time T4, the drive current of the value U2 continues to be applied to the ultrasonic transducer.

Figure 61:
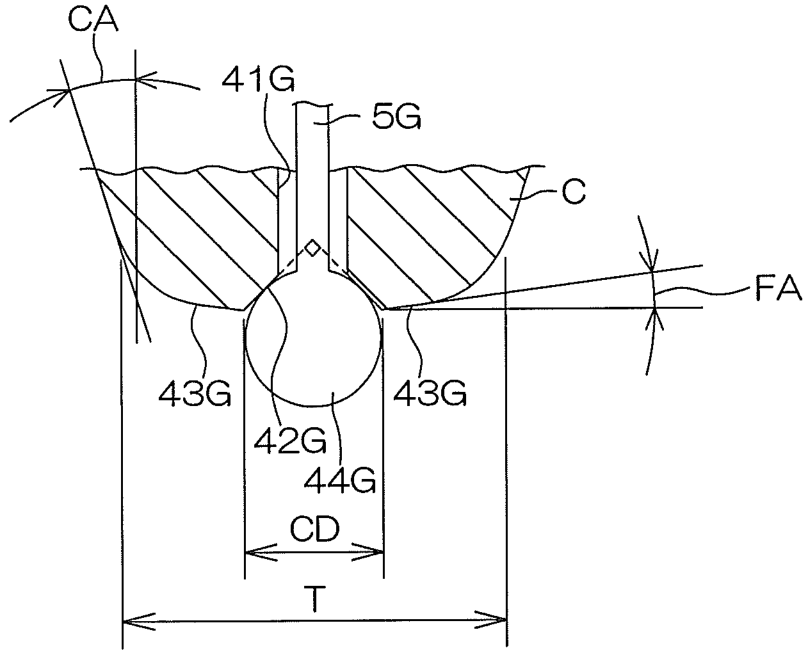
FIG. 61 is a schematic sectional view of a standard type capillary.

The standard type capillary has a shape such as shown in FIG. 61 and has the following dimensions. A CD dimension, which is a diameter of a lower end edge of the chamfer 42G, is 66 μm (0.066 mm). The T dimension, which is the outer diameter of the face 43G, is 178 μm (0.178 mm). A chamfer angle, which two straight lines extending along the side surface of the chamfer 42G form in a cross section of the capillary C taken along a plane that includes the central axis (cross section shown in FIG. 61), is 90°. A face angle FA, which is an angle that the face 43G forms with the plane orthogonal to the central axis of the capillary C, is 8°. An angle CA, which, in the cross section of the capillary C taken along the plane that includes the central axis, a portion of the side surface of the capillary C that extends upward beyond the upper end of the face 43G forms with the central axis, is 20°.

On the other hand, when a bottleneck type capillary is used as the capillary C, a drive current of a value 1.4 times the value U1 is applied to the ultrasonic transducer from before the time T1 at which the FAB 44 contacts the pad 7G as shown in FIG. 60. Then, from the time T1 at which the FAB 44 contacts the pad 7G to a time T3, the value of the drive current applied to the ultrasonic transducer is raised at a fixed rate of change (monotonously) from the value U1 to a value 1.4 times the value U2. From the time T3 onward until the time T4, the drive current of the value 1.4 times the value U2 continues to be applied to the ultrasonic transducer.

Figure 62:
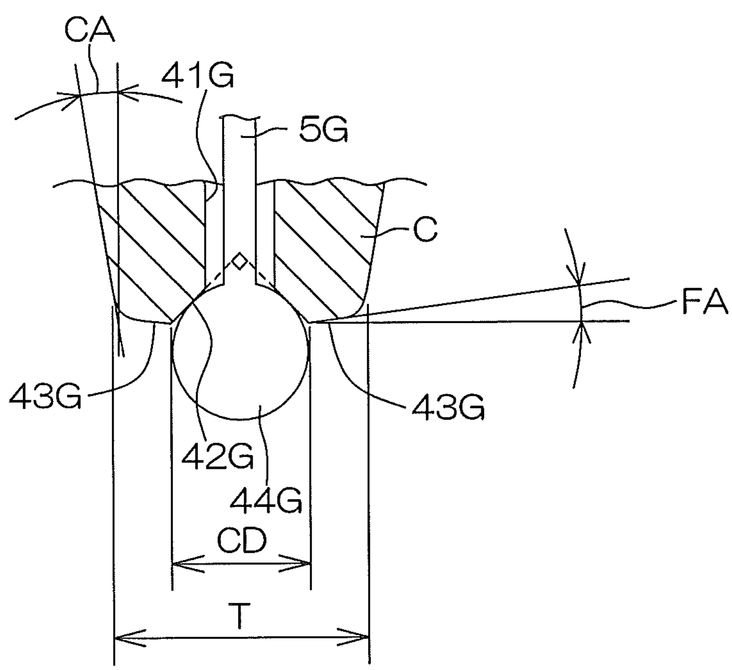
FIG. 62 is a schematic sectional view of a bottleneck type capillary.

The bottleneck type capillary has a shape such as shown in FIG. 62 and has the following dimensions. The CD dimension, which is the diameter of the lower end edge of the chamfer 42G, is 66 μm (0.066 mm). The T dimension, which is the outer diameter of the face 43G, is 178 μm (0.178 mm). The chamfer angle, which two straight lines extending along the side surface of the chamfer 42G form in the cross section of the capillary C taken along a plane that includes the central axis (cross section shown in FIG. 62), is 90°. The face angle FA, which is the angle that the face 43G forms with the plane orthogonal to the central axis of the capillary C, is 8°. The angle CA, which, in the cross section of the capillary C taken along the plane that includes the central axis, the portion of the side surface of the capillary C that extends upward beyond the upper end of the face 43G forms with the central axis, is 10°.

Consequently, the FAB 44 deforms along the shapes of the chamfer 42*g* and the face 43G of the capillary C, and the first ball portion 15G with a stepped click shape is formed on the pad 7G and the jutting portion 16G is formed along its periphery as shown in FIG. 58. Bonding (first bonding) of the copper wire 5G with the pad 7G is thereby achieved.

Figure 59C:
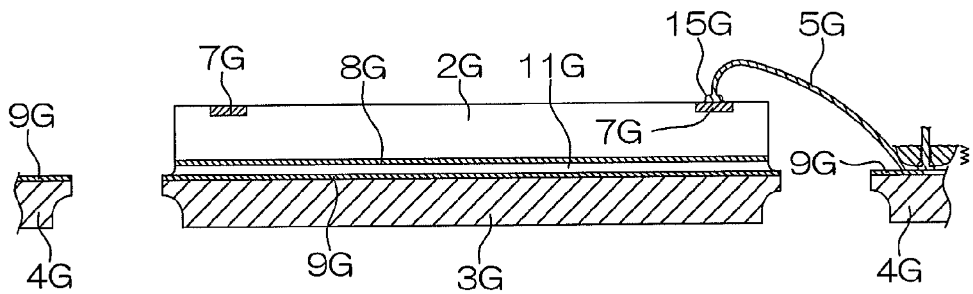
FIG. 59C is a schematic sectional view of a step subsequent to that of FIG. 59B.

When the time T4 arrives upon elapse of a bonding time determined in advance from the time T1, the capillary C separates upwardly from the pad 7G. Thereafter, the capillary C is moved obliquely downward toward the top surface of the lead 4G. Then, as shown in FIG. 59C, the drive current is applied to the ultrasonic transducer, and while ultrasonic vibration is being applied to the capillary C, the copper wire 5G is pressed against the top surface of the lead 4G by the capillary C and then broken. A stitch portion with a wedge shape in side view that is made up of the other end portion of the copper wire 5G is thereby formed on the top surface of the lead 4G and the bonding (second bonding) of the copper wire with respect to the lead 4G is thereby achieved.

Figure 59D:
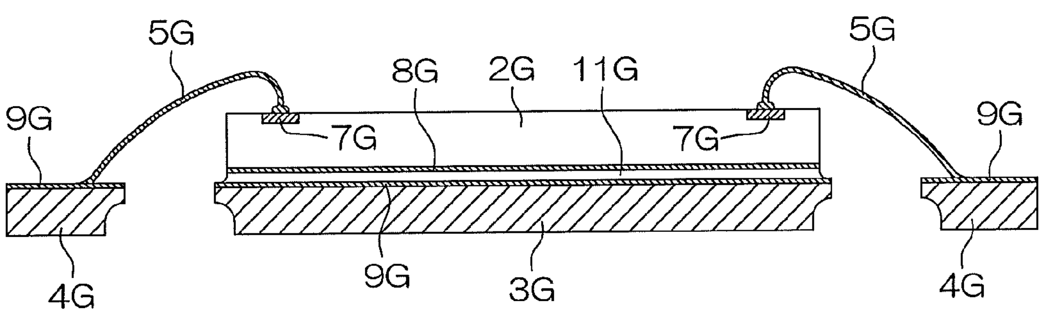
FIG. 59D is a schematic sectional view of a step subsequent to that of FIG. 59C.

Thereafter, the processes shown in FIG. 59A to FIG. 59C are performed on another pad 7G and the corresponding lead 4G. By the processes shown in FIG. 59A to FIG. 59C then being repeated, copper wires 5G are installed across all pads 7G of the semiconductor 2G and the leads 4G as shown in FIG. 59D. After the end of all of the wire bonding, the water-impermeable insulating film 18G is formed by the same method as that of FIG. 4D.

As described above, after the FAB 44 formed on the tip of the copper wire 5G is put in contact with a pad 7G, a load is applied to the FAB 44 by the capillary C. Also, the drive current is applied to the ultrasonic transducer provided in the capillary C. Thus, while the FAB 44 deforms due to the load, the FAB 44 is rubbed against the pad 7G by the ultrasonic vibration propagating from the ultrasonic transducer. Consequently, bonding of the FAB 44 and the pad 7G is achieved.

In the case where the bottleneck type capillary is used as the capillary C, the values of the drive current applied to the ultrasonic transducer are set to values that are 1.4 times the values U1 and U2 of the drive current in the case where the standard type capillary is used as the capillary C. The magnitudes of the load and the ultrasonic transducer drive current are thereby set simply and appropriately and satisfactory bonding of the copper wire 5G to the pad 7G can be achieved even when the capillary C is changed from the standard type capillary to the bottleneck type capillary.

After the FAB 44 contacts the pad 7G, the value of the drive current applied to the ultrasonic transducer is increased gradually at the fixed rate of change. Meanwhile, the load is applied to the FAB 44 so that the FAB 44 deforms in a squeezed manner and an area of the portion of contact of the FAB 44 and the pad 7G increases gradually. The ultrasonic vibration energy propagating from the ultrasonic transducer to the FAB 44 is thereby increased gradually and the area of the FAB 44 rubbed against the pad 7G increases gradually. Consequently, a state of satisfactory bonding to the pad 7G can be obtained up to a peripheral edge portion of the surface of bonding of the first ball portion 15G to the pad 7G while suppressing occurrence of damage in the pad 7G and a layer below the pad 7G due to rapid increase of the ultrasonic vibration energy propagating to the FAB 44 below a central portion of the first ball portion 15G.

Also, the drive current is applied to the ultrasonic transducer from before the contacting of the FAB 44 with the pad 7G. Thus, from the instant at which the FAB 44 contacts the pad 7G, the ultrasonic vibration propagates to the portion of contact of the FAB 44 and the pad 7G and the contact portion is rubbed against the pad 7G. Consequently, a state where a central portion of a surface of the first ball portion 15G that bonds with the pad 7G (portion at which the FAB 44 and the pad 7G first make contact) is satisfactorily bonded to the pad 7G can be obtained.

<Bond State Confirmation Tests>

1. Test 1

The standard type capillary shown in FIG. 61 was used as the capillary C. The capillary C was positioned above a pad 7G, and a 62 μm FAB 44 was formed at the tip of a copper wire 5G of 30 μm wire diameter. The capillary C was then lowered toward the pad 7G and the FAB 44 was pressed against the pad 7G to form a first ball portion 15G on the pad 7G. The intended diameter of the first ball portion 15G was 76 μm and the intended thickness of the first ball portion 15G was 18 μm.

In this process, an initial load of 130 g was applied to the FAB 44 by the capillary C for 3 msec after the contacting of the FAB 44 with the pad 7G, and at the point of elapse of the 3 msec, the load applied to the FAB 44 was reduced to 30 g and a state in which the load of 30 g was applied to the FAB 44 was maintained for 9 msec. Thereafter, the capillary C was raised.

Also, from before the contacting of the FAB 44 with the pad 7G, a drive current of 15 mA was applied to an ultrasonic transducer provided in the capillary C, and after the FAB 44 contacted the pad 7G, the value of the drive current applied to the ultrasonic transducer was raised at a fixed rate of change from 15 mA to 90 mA in an interval of 3.6 msec and then a state in which the drive current of 90 mA was applied to the ultrasonic transducer was maintained for 8.4 msec until the capillary was raised.

Figure 63:
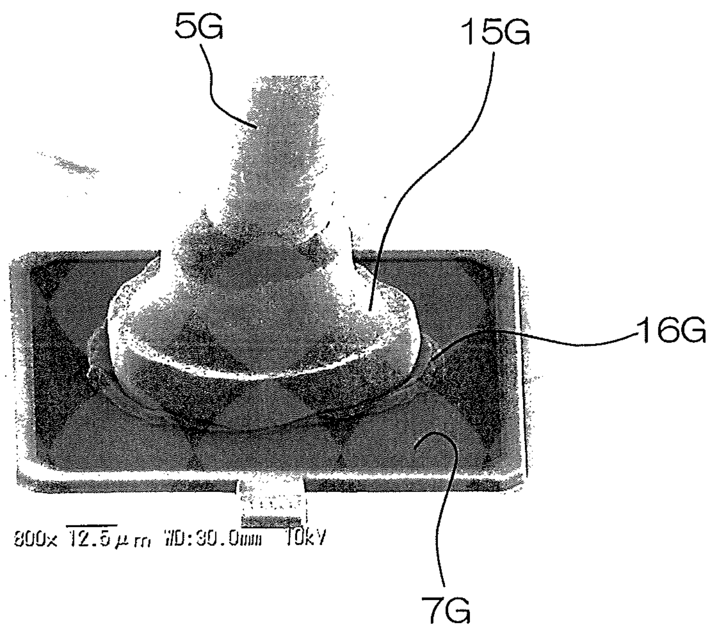
FIG. 63 is an SEM image of a vicinity of a first ball portion obtained in test 1 of the seventh preferred embodiment.

An SEM image obtained by imaging a vicinity of the first ball portion 15G by an SEM (scanning electron microscope) is shown in FIG. 63.

2. Test 2

The bottleneck type capillary shown in FIG. 62 was used as the capillary C. The capillary C was positioned above a pad 7G, and a 59 μm FAB 44 was formed at the tip of a copper wire 5G of 30 μm wire diameter. The capillary C was then lowered toward the pad 7G and the FAB 44 was pressed against the pad 7G to form a first ball portion 15G on the pad 7G. The intended diameter of the first ball portion 15G was 74 μm and the intended thickness of the first ball portion 15G was 17 μm.

In this process, an initial load of 130 g was applied to the FAB 44 by the capillary C for 3 msec after the contacting of the FAB 44 with the pad 7G, and at the point of elapse of the 3 msec, the load applied to the FAB 44 was reduced to 30 g and a state in which the load of 30 g was applied to the FAB 44 was maintained for 9 msec. Thereafter, the capillary C was raised.

Also, from before the contacting of the FAB 44 with the pad 7G, a drive current of 18 mA (15 mA×1.2) was applied to an ultrasonic transducer provided in the capillary C, and after the FAB 44 contacted the pad 7G, the value of the drive current applied to the ultrasonic transducer was raised at a fixed rate of change from 18 mA to 108 mA (90 mA×1.2) in an interval of 3.6 msec and then a state in which the drive current of 108 mA was applied to the ultrasonic transducer was maintained for 8.4 msec until the capillary was raised.

Figure 64:
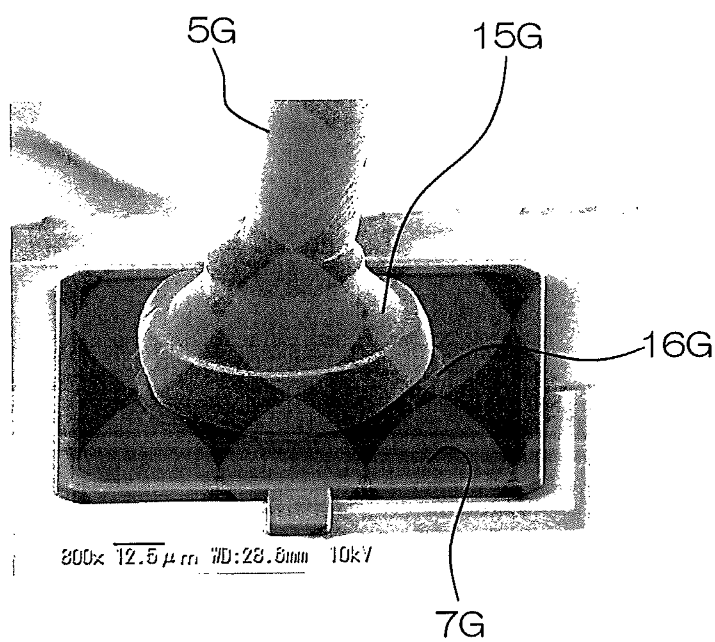
FIG. 64 is an SEM image of a vicinity of a first ball portion obtained in test 2 of the seventh preferred embodiment.

An SEM image of a vicinity of the first ball portion 15G is shown in FIG. 64.

3. Test 3

The bottleneck type capillary shown in FIG. 62 was used as the capillary C. The capillary C was positioned above a pad 7G, and a 59 μm FAB 44 was formed at the tip of a copper wire 5G of 30 μm wire diameter. The capillary C was then lowered toward the pad 7G and the FAB 44 was pressed against the pad 7G to form a first ball portion 15G on the pad 7G. The intended diameter of the first ball portion 15G was 74 μm and the intended thickness of the first ball portion 15G was 17 μm.

In this process, an initial load of 130 g was applied to the FAB 44 by the capillary C for 3 msec after the contacting of the FAB 44 with the pad 7G, and at the point of elapse of the 3 msec, the load applied to the FAB 44 was reduced to 30 g and a state in which the load of 30 g was applied to the FAB 44 was maintained for 9 msec. Thereafter, the capillary C was raised.

Also, from before the contacting of the FAB 44 with the pad 7G, a drive current of 19.5 mA (15 mA×1.3) was applied to an ultrasonic transducer provided in the capillary C, and after the FAB 44 contacted the pad 7G, the value of the drive current applied to the ultrasonic transducer was raised at a fixed rate of change from 19.5 mA to 117 mA (90 mA×1.3) in an interval of 3.6 msec and then a state in which the drive current of 117 mA was applied to the ultrasonic transducer was maintained for 8.4 msec until the capillary was raised.

Figure 65:
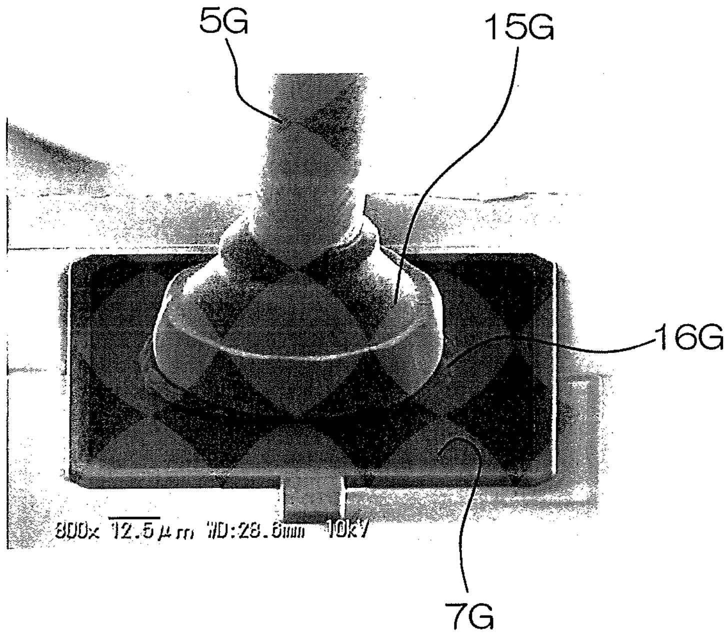
FIG. 65 is an SEM image of a vicinity of a first ball portion obtained in test 3 of the seventh preferred embodiment.

An SEM image of a vicinity of the first ball portion 15G is shown in FIG. 65.

4. Test 4

The bottleneck type capillary shown in FIG. 62 was used as the capillary C. The capillary C was positioned above a pad 7G, and a 59 μm FAB 44 was formed at the tip of a copper wire 5G of 30 μm wire diameter. The capillary C was then lowered toward the pad 7G and the FAB 44 was pressed against the pad 7G to form a first ball portion 15G on the pad 7G. The intended diameter of the first ball portion 15G was 74 μm and the intended thickness of the first ball portion 15G was 17 μm.

In this process, an initial load of 130 g was applied to the FAB 44 by the capillary C for 3 msec after the contacting of the FAB 44 with the pad 7G, and at the point of elapse of the 3 msec, the load applied to the FAB 44 was reduced to 30 g and a state in which the load of 30 g was applied to the FAB 44 was maintained for 9 msec. Thereafter, the capillary C was raised.

Also, from before the contacting of the FAB 44 with the pad 7G, a drive current of 21 mA (15 mA×1.4) was applied to an ultrasonic transducer provided in the capillary C, and after the FAB 44 contacted the pad 7G, the value of the drive current applied to the ultrasonic transducer was raised at a fixed rate of change from 21 mA to 126 mA (90 mA×1.4) in an interval of 3.6 msec and then a state in which the drive current of 126 mA was applied to the ultrasonic transducer was maintained for 8.4 msec until the capillary was raised.

Figure 66:
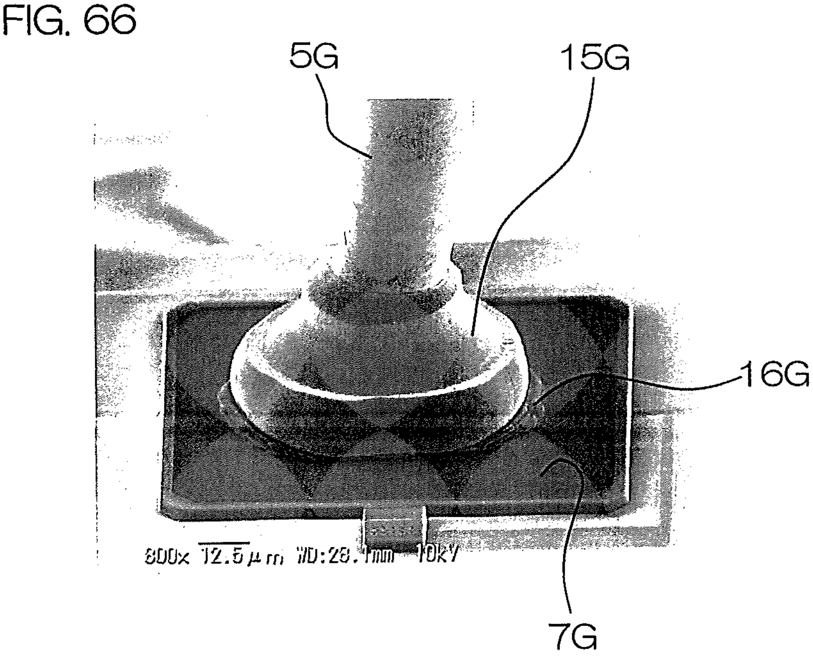
FIG. 66 is an SEM image of a vicinity of a first ball portion obtained in test 4 of the seventh preferred embodiment.

An SEM image of a vicinity of the first ball portion 15G is shown in FIG. 66.

5. Test 5

The bottleneck type capillary shown in FIG. 62 was used as the capillary C. The capillary C was positioned above a pad 7G, and a 59 μm FAB 44 was formed at the tip of a copper wire 5G of 30 μm wire diameter. The capillary C was then lowered toward the pad 7G and the FAB 44 was pressed against the pad 7G to form a first ball portion 15G on the pad 7G. The intended diameter of the first ball portion 15G was 74 μm and the intended thickness of the first ball portion 15G was 17 μm.

In this process, an initial load of 130 g was applied to the FAB 44 by the capillary C for 3 msec after the contacting of the FAB 44 with the pad 7G, and at the point of elapse of the 3 msec, the load applied to the FAB 44 was reduced to 30 g and a state in which the load of 30 g was applied to the FAB 44 was maintained for 9 msec. Thereafter, the capillary C was raised.

Also, from before the contacting of the FAB 44 with the pad 7G, a drive current of 22.5 mA (15 mA×1.5) was applied to an ultrasonic transducer provided in the capillary C, and after the FAB 44 contacted the pad 7G, the value of the drive current applied to the ultrasonic transducer was raised at a fixed rate of change from 22.5 mA to 135 mA (90 mA×1.5) in an interval of 3.6 msec and then a state in which the drive current of 135 mA was applied to the ultrasonic transducer was maintained for 8.4 msec until the capillary was raised.

Figure 67:
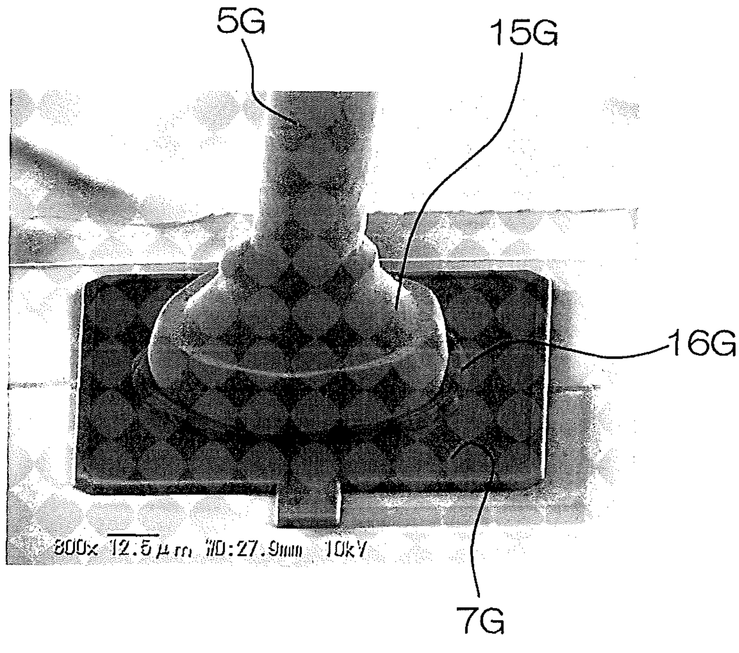
FIG. 67 is an SEM image of a vicinity of a first ball portion obtained in test 5 of the seventh preferred embodiment.

An SEM image of a vicinity of the first ball portion 15G is shown in FIG. 67.

6. Comparison of Tests 1 to 5

In all of tests 1 to 5, the first ball portions 15G with diameters and thicknesses substantially equal to the intended diameters and thicknesses were formed.

The SEM image of test 1 shows that the jutting portion 16G, which juts out to a degree to which it is not lifted from the top surface of pad G7, is formed at the periphery of the first ball portion 15G.

Comparison of the SEM image of test 1 with the SEM image of test 2 shows the size of the jutting portion 16G of test 2 to be smaller than the size of the jutting portion 16G of test 1.

Comparison of the SEM image of test 1 with the SEM images of tests 3 to 5 shows that the size of the jutting portion 16G of test 1 and the size of the jutting portion 16G of each of tests 3 to 5 to be substantially the same and that the shape of the jutting portion 16G of test 1 is especially close to the shape of the jutting portion 16G of test 4.

From the results of tests 1 to 5, it was confirmed that in the case of using the bottleneck type capillary as the capillary C, by setting the value of the drive current applied to the ultrasonic transducer to 1.3 to 1.5 times the value of the drive current applied to the ultrasonic transducer in the case of using the standard type capillary as the capillary C, a state of bonding of the FAB 44 and the pad 7G that is close to that in the case of using the standard type capillary as the capillary C can be obtained. It was also confirmed that in the case of using the bottleneck type capillary as the capillary C, by setting the value of the drive current applied to the ultrasonic transducer to 1.4 times the value of the drive current applied to the ultrasonic transducer in the case of using the standard type capillary as the capillary C, a state of bonding of the FAB 44 and the pad 7G that is substantially the same as that in the case of using the standard type capillary as the capillary C can be obtained.

Although the seventh preferred embodiment of the present invention has been described above, the seventh preferred embodiment may also be modified as follows.

For example, although a QFN package type is applied to the semiconductor device 1G, the present invention may also be applied to the manufacture of a semiconductor device to which another type of non-leaded package, such as an SON (small outlined non-leaded package), is applied.

The present invention may also be applied to the manufacture of not only semiconductor devices to which a so-called singulation type package, with end surfaces of leads being made flush with side surfaces of a resin package, is applied but also semiconductor devices to which a lead cut type non-leaded package, with leads projecting from side surfaces of a resin package, is applied.

Further, the present invention may be applied to the manufacture of not only semiconductor devices to which a non-leaded package is applied but also semiconductor devices to which a QFP (quad flat package) or other package having outer leads formed by leads projecting from a resin package is applied.

Figure 68:
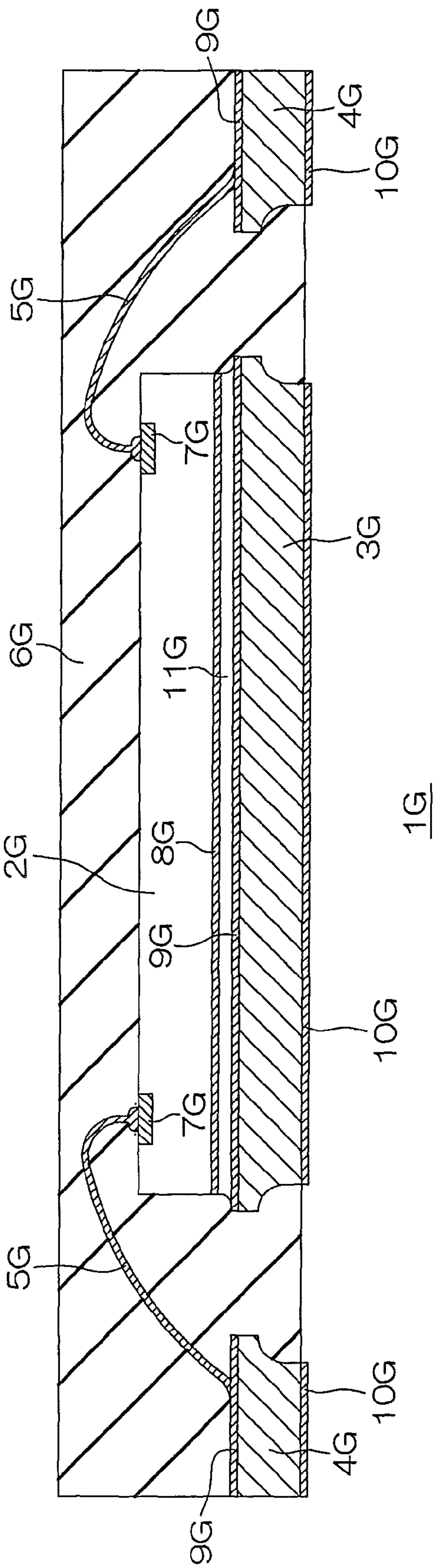
FIG. 68 is a diagram of a modification example of the semiconductor device of FIG. 56.

Also, although with the above-described preferred embodiment, a mode in which the copper wires 5G are covered by the water-impermeable insulating film 18G was described as an example, the water-impermeable insulating film 18G may be omitted as shown in FIG. 68 as long as at least the seventh object for resolving the seventh issue is achieved.

Eighth Preferred Embodiment FIG. 69 to FIG. 73

By disclosure of an eighth preferred embodiment, an eighth issue concerning an eighth background art described below can be resolved in addition to the issues described above in the "OBJECT(S) OF THE INVENTION."

(1) Eighth Background Art

In a typical semiconductor device, a semiconductor chip is disposed on a die pad and the semiconductor chip is connected by wires (gold wires) made of Au (gold) to leads disposed at a periphery of the die pad. Specifically, pads made of Al (aluminum) are disposed on a top surface of the semiconductor chip. The gold wires are installed so as to form arch-shaped loops between top surfaces of the pads and top surfaces of the leads.

Recently, price competition of semiconductor devices in the market is becoming severe and further reductions in costs of semiconductor devices are being demanded. As one cost reduction measure, use of wires (copper wires) made of inexpensive Cu (copper) as an alternative to high-priced gold wires is being examined.

(2) Eighth Issue

However, presently, replacement of gold wires by copper wires is yet to be carried out actively. This is because a copper wire itself is oxidized readily, a portion (first ball portion) of a copper wire that is bonded with a pad is oxidized especially readily, and there are cases where a bond portion becomes oxidized and peeling (first open) of the bond portion from the pad occurs in a humidity resistance evaluation test (such as an HAST (highly accelerated stress test), PCT (pressure cooker test)) performed after sealing of the semiconductor chip and the copper wires in a resin package.

Thus, an eighth object of the present invention related to the eighth preferred embodiment is to provide a semiconductor device with which a portion of a copper wire bonded to a pad is unlikely to be oxidized and peeling of the bond portion from the pad due to the oxidation can be prevented.

(3) Disclosure of a Specific Preferred Embodiment

Figure 69:
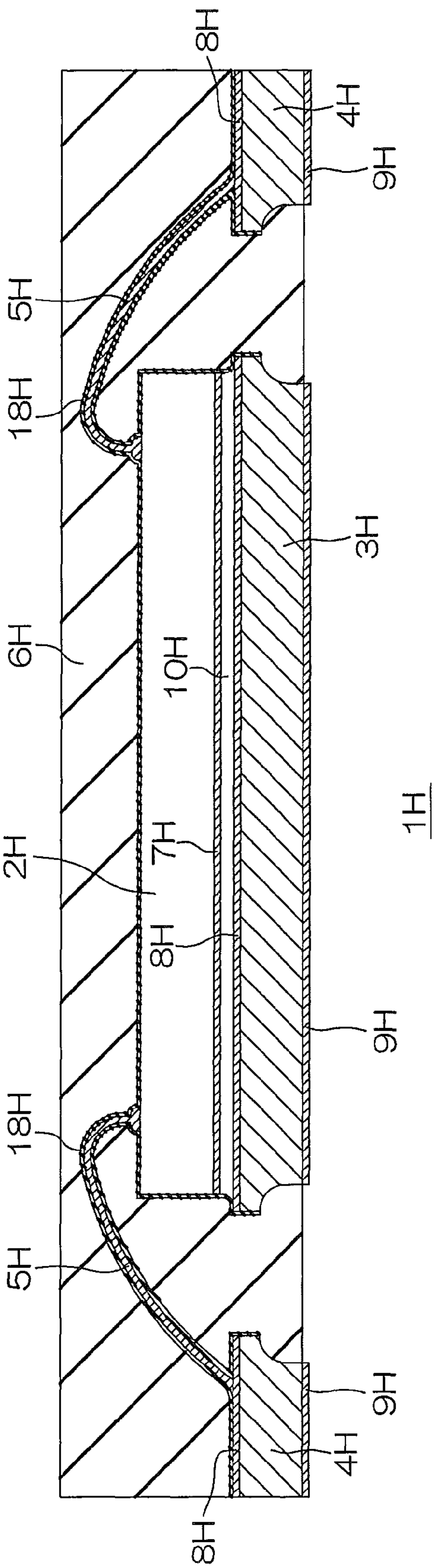
FIG. 69 is a schematic sectional view of a semiconductor device according to an eighth preferred embodiment of the present invention.

FIG. 69 is a schematic sectional view of a semiconductor device according to the eighth preferred embodiment of the present invention.

The semiconductor device 1H is a semiconductor device to which a QFN (quad flat non-leaded package) configuration is applied and has a structure in which a semiconductor chip 2H is sealed together with a die pad 3H, leads 4H, and copper wires 5H by a resin package 6H. An outer shape of the semiconductor device 1H (resin package 6H) is a flat, rectangular parallelepiped shape.

In the present preferred embodiment, the outer shape of the semiconductor device 1H is a hexahedron having a square shape of 4 mm square as a planar shape and a thickness of 0.85 mm, and dimensions of respective portions of the semiconductor device 1H cited below are an example in the case where the semiconductor device 1H has the above outer dimensions.

The semiconductor chip 2H has a square shape of 2.3 mm in plan view, and the semiconductor chip 2H has a thickness of 0.23 mm. A rear metal 7H made of a metal layer of Au, Ni (nickel), Ag (silver), etc., is formed on a rear surface of the semiconductor chip 2H.

The die pad 3H and the leads 4H are formed by punching out a metal thin plate (for example, a copper thin plate). The metal thin plate (die pad 3H or lead 4H) has a thickness of 0.2 mm. A plating layer 8H made of Ag is formed on top surfaces of the die pad 3H and leads 4H.

The die pad 3H has a square shape of 2.7 mm in plan view and is disposed at a central portion of the semiconductor device 1H so that its respective side surfaces are parallel to side surfaces of the semiconductor device 1H.

A recess with a substantially quarter-elliptical shape in cross section is formed by performing a squeezing process from the rear surface side across an entire periphery of a peripheral edge portion of the rear surface of the die pad 3H. The resin package 6H enters the recess. The peripheral edge portion of the die pad 3H is thereby sandwiched from above and below by the resin package 6H and prevention of fall-off (retaining) of the die pad 3H with respect to the resin package 6H is thereby achieved.

Also, with the exception of the peripheral edge portion (portion recessed to the substantially quarter-elliptical shape in cross section), the rear surface of the die pad 3H is exposed from a rear surface of the resin package 6H.

An equal number of (for example, nine) leads 4H are disposed at each of positions facing the respective side surfaces of the die pad 3H. At each of the positions facing the side surfaces of the die pad 3H, the leads 4H extend in a direction orthogonal to the facing side surface and are disposed at equal intervals in a direction parallel to the side surface. A longitudinal direction length of each lead 4H is 0.45 mm. An interval between the die pad 3H and the lead 4H is 0.2 mm.

A recess with a substantially quarter-elliptical shape in cross section is formed by performing a squeezing process from the rear surface side at a die pad 3H side end portion of the rear surface of each lead 4H. The resin package 6H enters the recess. The die pad 3H side end portion of the lead 4H is thereby sandwiched from above and below by the resin package 6H and prevention of fall-off (retaining) of the lead 4H with respect to the resin package 6H is thereby achieved.

With the exception of the die pad 3H side end portion (portion recessed to the substantially quarter-elliptical shape in cross section), the rear surface of each lead 4H is exposed from a rear surface of the resin package 6H. Also, a side surface of the lead 4H facing the die pad 3H side is exposed from a side surface of the resin package 6H.

A plating layer 9H formed of solder is formed on portions of the rear surfaces of the die pad 3H and leads 4H that are exposed from the resin package 6H.

The semiconductor chip 2H has, in a state where its top surface faces upward, its rear surface bonded via a bonding material 10H to the top surface (plating layer 9H) of the die pad 3H. For example, a solder paste is used as the bonding material 10H. The bonding material 10H has a thickness of 0.02 mm.

In a case where electrical connection of the semiconductor chip 2H and the die pad 3H is unnecessary, the rear metal H may be omitted and the rear surface of the semiconductor chip 2H may be bonded to the top surface of the die pad 3H via a bonding material made of silver paste or other insulating paste. In this case, the planar size of the semiconductor chip 2H is 2.3 mm square. Also, the plating layer 8H on the top surface of the die pad 3H may be omitted.

One end of each copper wire 5H is bonded to a top surface of the semiconductor chip 2H. The other end of the copper wire 5H is bonded to the top surface of a lead 4H. The copper wire 5H is installed so as to form an arch-shaped loop between the semiconductor chip 2H and the lead 4H. A height difference between an apex portion of the loop of the copper wire 5H and the top surface of the semiconductor chip 2H is 0.16 mm.

As in the first preferred embodiment, in the semiconductor device 1H, the entire top surface of the semiconductor chip 2H, the entire top surface and side surfaces of the die pad 3H, entire top surfaces of the leads 4H, and the entire copper wires 5H are covered by an integral water-impermeable insulating film 18H.

Figure 70:
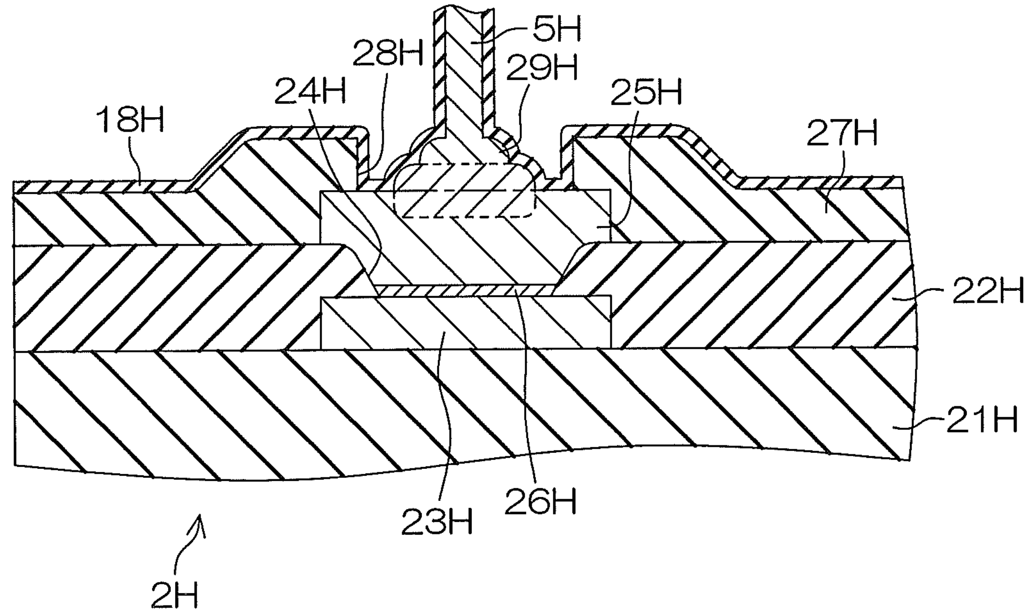
FIG. 70 is a schematic sectional view of a pad and a portion of a copper wire bonded to the pad.

FIG. 70 is a schematic sectional view of a pad and a portion of a copper wire bonded to the pad.

The semiconductor chip 2H includes a silicon substrate or other semiconductor substrate (not shown). A plurality of interlayer insulating films 21H and 22H are laminated on the semiconductor substrate. A plurality of wirings 23H are formed between the uppermost interlayer insulating film 21H and the interlayer insulating film 22H therebelow. The wirings 23H are made of a metal that contains Al.

Openings 24H that expose portions of the respective wirings 23H are formed in the interlayer insulating film 21H at peripheral edge portions of the top surface of the semiconductor chip 2H. Pads 25H are formed at the portions of the wirings 23H that are exposed via the openings 24H. The pads 25H are made of Zn and are formed by sputtering. Each pad 25H completely fills an interior of the corresponding opening 24H and a peripheral edge portion thereof rides on top of the interlayer insulating film 21H. A thickness of the pad 25H above the interlayer insulating film 21H is 7000 to 28000 Å (0.7 to 2.8 μm).

A barrier film 26H is formed between the wirings 23H and the pads 25H. The barrier film 26H has a structure in which a Ti layer made of Ti and a TiN layer made of TiN are laminated in that order from the wiring 23H side.

In FIG. 70, just one each of the wirings 23H, openings 24H, and pads 25H are shown.

A top surface protective film 27H is formed on a topmost surface of the semiconductor chip 2H. The top surface protective film 27H is made, for example, of silicon nitride (SiN). Pad openings 28H for exposing central portions of top surfaces of the pads 25H are formed at positions of the top surface protective film 27H that face the pads 25H.

Each copper wire 5H is made, for example, of copper with a purity of no less than 99.99%. The copper wire 5H is bonded to the central portion of the pad 25H exposed from the top surface protective film 27H. The copper wire 5H has an FAB formed at its tip and the FAB is pressed against and thereby bonded to the pad 25H. In this process, the FAB deforms and a portion (first ball portion) 29 of the copper wire 5H bonded to the pad 25H thereby takes on a stepped disk shape. During thermal aging after the forming of the resin package 6H, the Cu contained in the copper wire 5H and the Zn contained in the pad 25H undergo eutectic bonding and an alloy of Cu and Zn (brass) is formed at least at a lower portion of the bond portion 29H and a portion of the pad 25H that faces the bond portion 29H (portion surrounded by broken lines in FIG. 70). Thermal aging is a process for stabilizing the resin package 6H and is a process of letting the semiconductor device 1H stand for a fixed time under a fixed temperature.

There are cases where the entire pad 25H and bond portion 29H undergo Zn—Cu alloying. For example, when thermal aging is performed for 6 hours under a temperature of 175° C., the entire pad 25H and bond portion 29H undergo Zn—Cu alloying even when a maximum thickness (thickness above the wiring 23H) of the pad 25H is 10 μm.

As described above, the bond portion 29H of the copper wire 5H is made of the Zn—Cu alloy. The bond portion 29H thus does not oxidize readily. Peeling of the bond portion 29H from the pad 25H due to oxidation can thus be prevented.

Also, the barrier film 26H having structure in which the Ti layer made of Ti and the TiN layer made of TiN are laminated in that order from the wiring 23H side is interposed between the wiring 23H and the pad 25H. By the barrier film 26H being interposed, eutectic bonding of the Al contained in the wiring 23H and the Zn contained in the pad 25H can be prevented.

Figure 71:
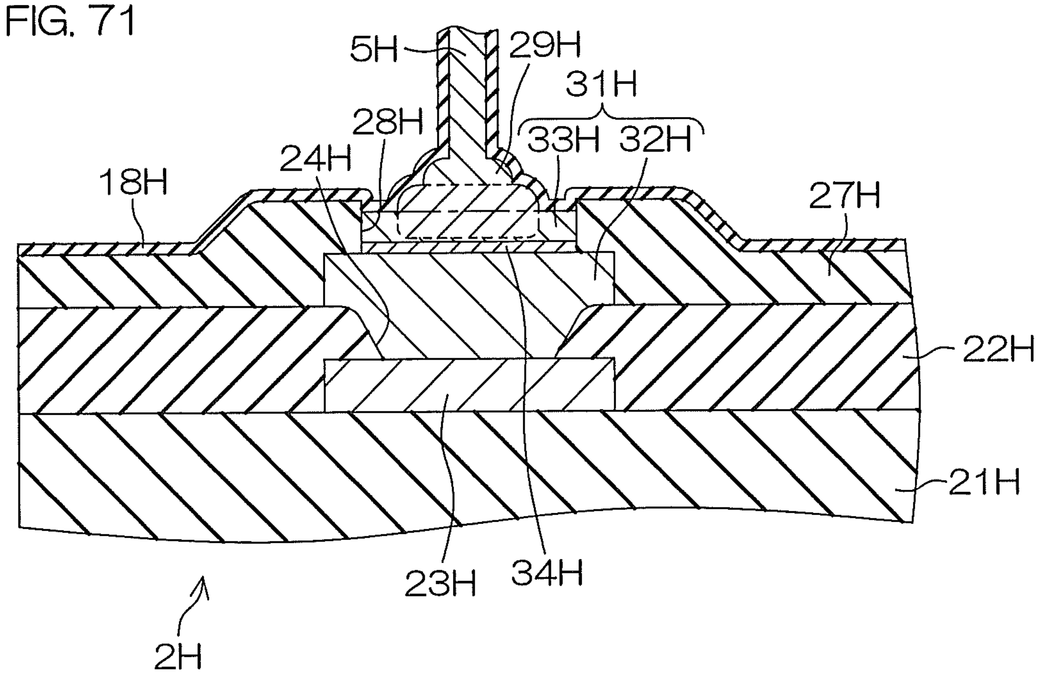
FIG. 71 is a schematic sectional view of a pad and a portion of a copper wire bonded to the pad according to another structure.

FIG. 71 is a schematic sectional view of a pad and a portion of a copper wire bonded to the pad according to another structure. In FIG. 71, portions corresponding to the respective portions shown in FIG. 70 are provided with the same reference symbols as the reference symbols provided to the abovementioned respective portions. In the following description, points of difference of the structure shown in FIG. 71 with respect to the structure shown in FIG. 70 shall be described mainly and description of the portions provided with the same reference symbols as the respective portions shown in FIG. 70 shall be omitted.

A pad 31H is formed on a portion of the wiring 23H exposed via the opening 24H. The pad 31H includes a pad main body portion 32H and a Zn layer 33H formed on a top surface of the pad main body portion 32H.

The pad main body portion 32H is made of Al and is formed by electroplating. The pad main body portion 32H completely fills the interior of the opening 24H and a peripheral edge portion thereof rides on top of the interlayer insulating film 21H. A thickness of the pad main body 32H above the interlayer insulating film 21H is 7000 to 28000 Å (0.7 to 2.8 μm). The pad main body portion 32H contacts the wiring 23H directly.

The Zn layer 33H is made of Zn and is formed by electroless plating. The Zn layer 33H is formed inside the pad opening 28H formed in the top surface protective film 27H so as to cover the portion of the pad main body portion 32H that is exposed from the pad opening 28H.

A barrier film 34H is formed between the pad main body portion 32H and the Zn layer 33H. The barrier film 34H has a structure in which a Ti layer made of Ti and a TiN layer made of TiN are laminated in that order from the pad main body portion 32H side.

Each copper wire 5H is made, for example, of Cu with a purity of no less than 99.99%. The copper wire 5H is bonded to the central portion of the pad 31H (Zn layer 33H) exposed from the top surface protective film 27H. The copper wire 5H has an FAB formed at its tip and the FAB is pressed against and thereby bonded to the pad 31H. In this process, the FAB deforms and a portion (first ball portion) 29 of the copper wire 5H bonded to the pad 31H thereby takes on a stepped disk shape. During thermal aging after the forming of the resin package 6H, the Cu contained in the copper wire 5H and the Zn contained in the Zn layer 33H undergo eutectic bonding and an alloy of Cu and Zn (brass) is formed at least at a lower portion of the bond portion 29H and a portion of the Zn layer 33H of the pad 31H that faces the bond portion 29H (portion surrounded by broken lines in FIG. 71).

There are cases where the entire Zn layer 33H and bond portion 29H undergo Zn—Cu alloying.

The bond portion 29H of the copper wire 5H is made of the Zn—Cu alloy in the present structure as well. The bond portion 29H thus does not oxidize readily. Peeling of the bond portion 29H from the pad 31H due to oxidation can thus be prevented.

Also, the barrier film 34H having structure in which the Ti layer made of Ti and the TiN layer made of TiN are laminated in that order from the pad main body 32H side is interposed between the pad main body portion 32H and the Zn layer 33H of the pad 31H. By the barrier film 34H being interposed, eutectic bonding of the Al contained in the pad main body portion 32H and the Zn contained in the Zn layer 33H can be prevented.

Figure 72:
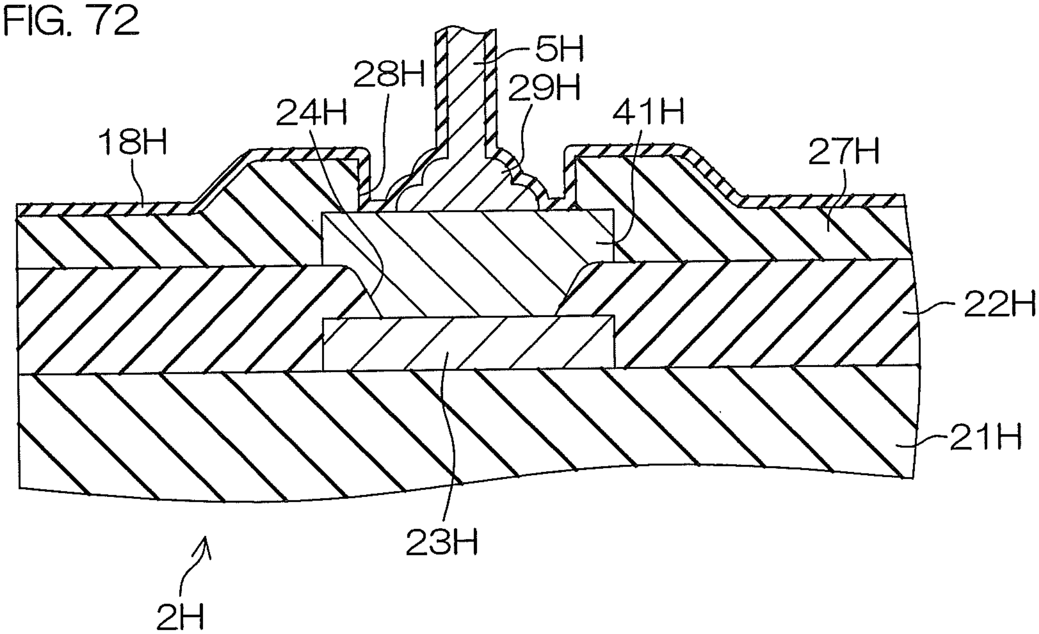
FIG. 72 is a schematic sectional view of a pad and a portion of a copper wire bonded to the pad according to yet another structure.

FIG. 72 is a schematic sectional view of a pad and a portion of a copper wire bonded to the pad according to yet another structure. In FIG. 72, portions corresponding to the respective portions shown in FIG. 70 are provided with the same reference symbols as the reference symbols provided to the abovementioned respective portions. In the following description, points of difference of the structure shown in FIG. 72 with respect to the structure shown in FIG. 70 shall be described mainly and description of the portions provided with the same reference symbols as the respective portions shown in FIG. 70 shall be omitted.

Pads 41H are formed at the portions of the wirings 23H that are exposed via the openings 24H. The pads 41H are made of Al and are formed by electroplating. Each pad 41H completely fills the interior of the corresponding opening 24H and a peripheral edge portion thereof rides on top of the interlayer insulating film 21H. A thickness of the pad 41H above the interlayer insulating film 21H is 7000 to 28000 Å (0.7 to 2.8 μm). Also, the pad 41H contacts the wiring 23H directly.

An entirety of each copper wire 5H is made, for example, of an alloy of Cu and Zn (brass). The copper wire 5H is bonded to the central portion of the pad 41H exposed from the top surface protective film 27H. The copper wire 5H has an FAB formed at its tip and the FAB is pressed against and thereby bonded to the pad 41H. In this process, the FAB deforms and a portion (first ball portion) 29 of the copper wire 5H bonded to the pad 41H thereby takes on a stepped disk shape.

The bond portion 29H of the copper wire 5H is made of the Zn—Cu alloy in the present structure as well. The bond portion 29H thus does not oxidize readily. Peeling of the bond portion 29H from the pad 31H due to oxidation can thus be prevented.

Although the eighth preferred embodiment of the present invention has been described above, the eighth preferred embodiment may also be modified as follows.

For example, with the structures shown in FIGS. 70 and 71, arrangements in which a copper wire made of Cu of a purity of no less than 99.99% was taken up as an example of the copper wire 5H, Cu of a lower purity may be used instead as the copper wire 5H. Also, a copper wire with which the entirety is made of an alloy of Cu and Zn may be used as the copper wire 5H.

Figure 73:
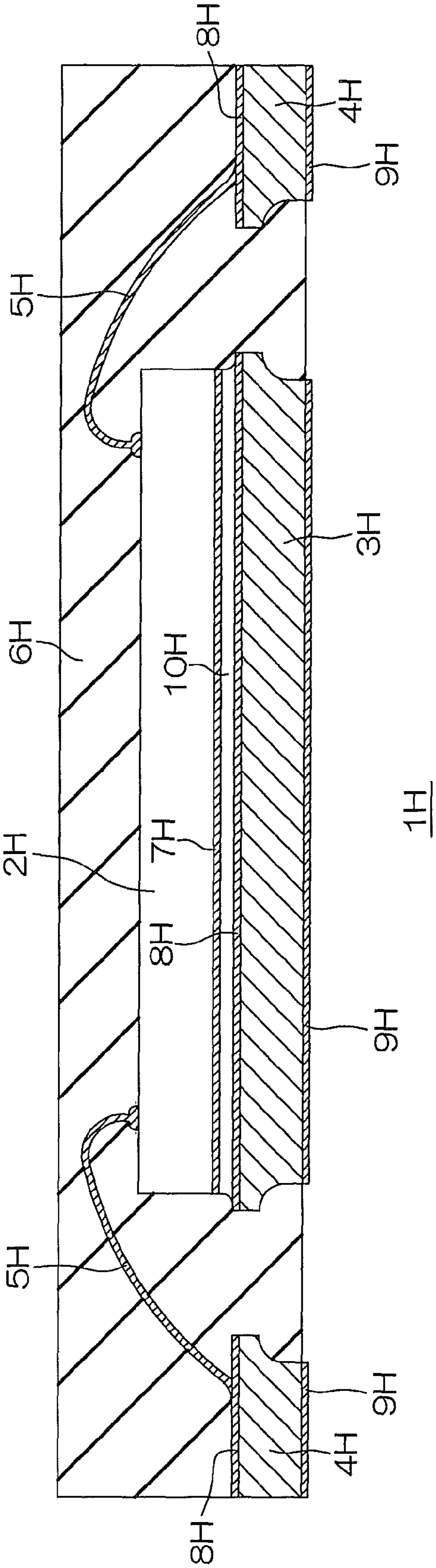
FIG. 73 is a diagram of a modification example of the semiconductor device of FIG. 69.

Also, although with the above-described preferred embodiment, a mode in which the copper wires 5H are covered by the water-impermeable insulating film 18H was described as an example, the water-impermeable insulating film 18H may be omitted as shown in FIG. 73 as long as at least the eighth object for resolving the eighth issue is achieved.

Ninth Preferred Embodiment FIG. 74 to FIG. 82

By disclosure of a ninth preferred embodiment, a ninth issue concerning a ninth background art described below can be resolved in addition to the issues described above in the "OBJECT(S) OF THE INVENTION."

(1) Ninth Background Art

A resin sealed type semiconductor device has a structure in which a semiconductor chip is sealed together with a lead frame by a resin package. The lead frame is formed by punching out a metal thin plate and includes a die pad and a plurality of leads disposed at a periphery of the die pad. The semiconductor chip is die bonded onto an upper surface of the die pad and is electrically connected to the respective leads by bonding wires installed between its top surface and the respective leads.

During operation of the semiconductor device, the semiconductor chip generates heat. The heat generated from the semiconductor chip is transmitted to the resin package through portions of contact of the semiconductor chip with the resin package and is also transmitted to the die pad and the leads and then transmitted to the resin package through portions of contact of the die pad and the leads with the resin package. The heat generated from the semiconductor chip that is thus transmitted to the resin package is radiated from a top surface of the resin package.

When a heat generation amount of a semiconductor chip exceeds a heat radiation amount from the resin package, the semiconductor device may enter an overheated state. Thus, from before, the material of the resin package has been modified to improve heat radiation property.

(2) Ninth Issue

However, there is a limit to improving the head radiation property by modification of the material of the resin package. Especially, with a semiconductor chip in which a power system device is built in, the heat generation amount of the semiconductor chip is high and further improvement in the heat radiation property is demanded.

Thus, a ninth object of the present invention related to the ninth preferred embodiment is to provide a semiconductor device that enables further improvement in the heat radiation property.

(3) Disclosure of a Specific Preferred Embodiment

Figure 74:
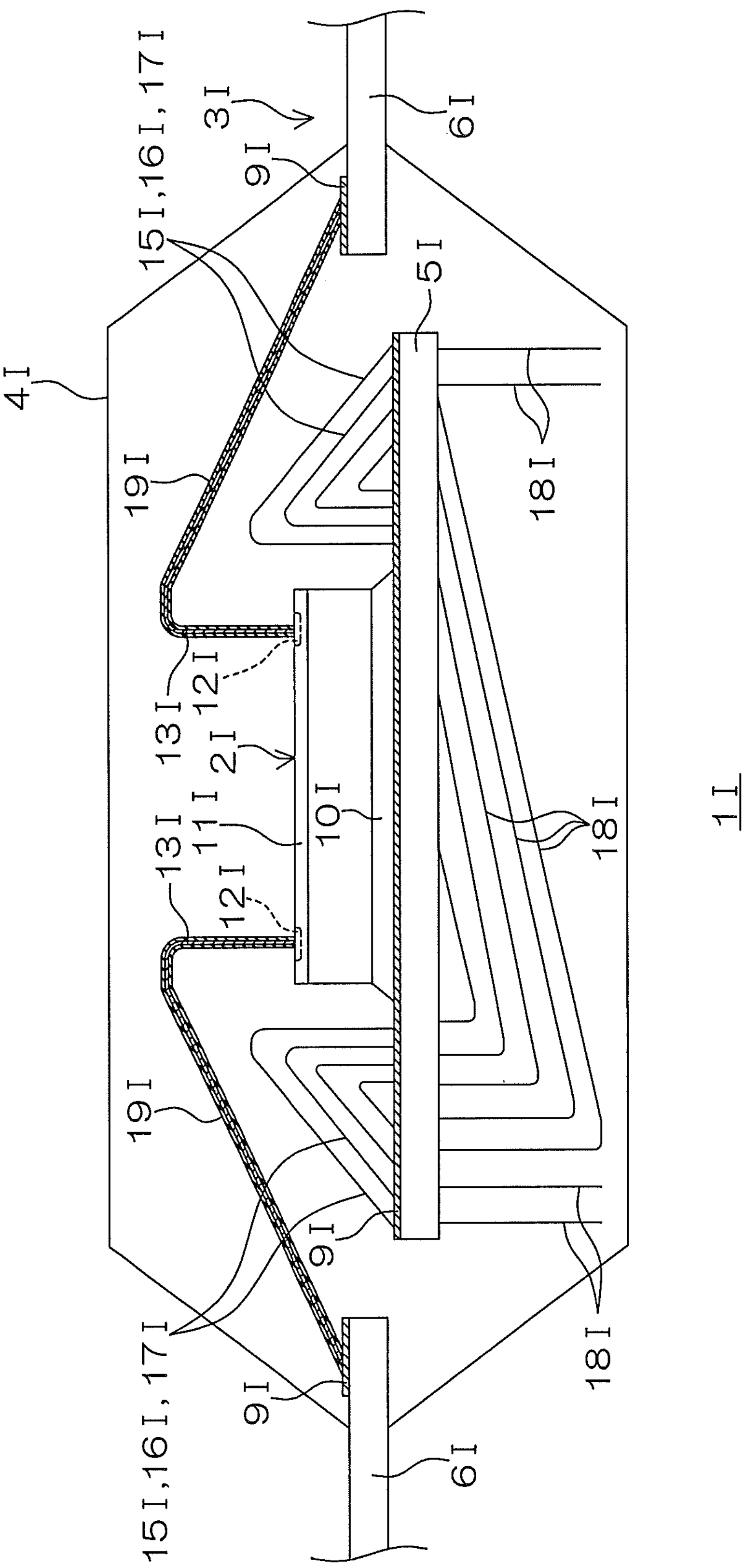
FIG. 74 is a schematic sectional view of a semiconductor device according to a ninth preferred embodiment of the present invention.
Figure 75:
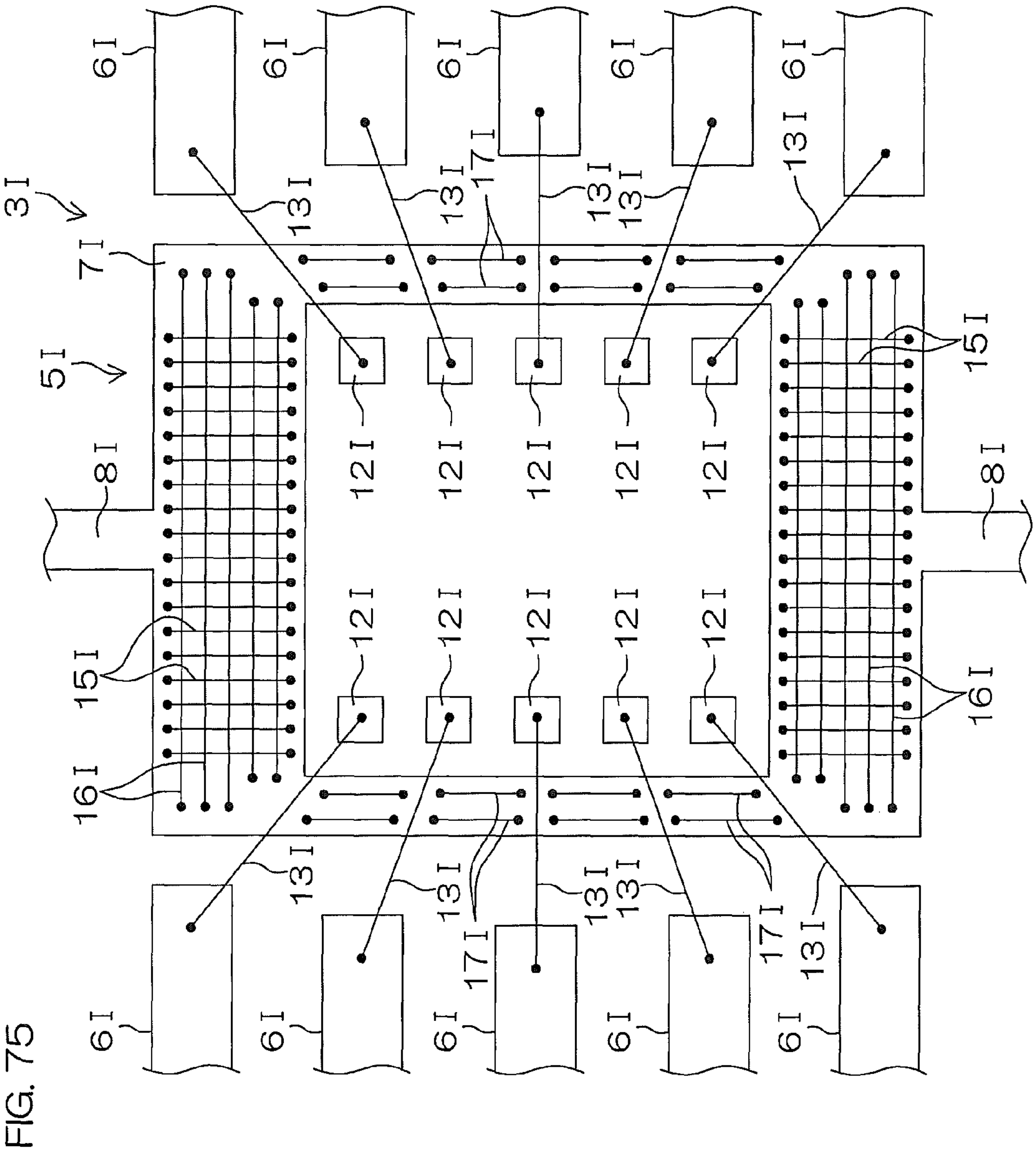
FIG. 75 is a schematic plan view of the semiconductor device shown in FIG. 74 and shows a state where illustration of a resin package is omitted.

FIG. 74 is a schematic sectional view of a semiconductor device according to the ninth preferred embodiment of the present invention. FIG. 75 is a schematic plan view of the semiconductor device shown in FIG. 74 and shows a state where illustration of a resin package is omitted.

The semiconductor device 1I has a structure in which a semiconductor chip 2I is sealed together with a lead frame 31 by a resin package 4I. The resin package 4I is formed to a quadrilateral shape in plan view.

The lead frame 31 includes a die pad 5I disposed at a central portion of the semiconductor device 1I and a plurality of (ten in the present preferred embodiment) leads 6I disposed at a periphery of the die pad 5I. The lead frame 31 is formed, for example, by performing a punching process and a pressing process on a copper (Cu) thin plate.

The die pad 5I integrally includes a central portion 7I of quadrilateral shape in plan view that has its center overlapped with a center of the resin package 4I in plan view and has four sides extending parallel to the respective sides of the resin package 4I, and suspending portions 8I of quadrilateral shape in plan view that extend to side surfaces of the resin package 4I from two mutually opposite sides among the four sides of the central portion 7I.

With respect to the central portion 7I of the die pad 5I, five each of the leads 6I are disposed at equal intervals at each of both sides of a direction orthogonal to a direction of extension (hereinafter, referred to as "extension direction") of the suspending portions 8I.

Each lead 6I penetrates through a side surface of the resin package 4I and a portion that is sealed by the package 4I makes up an inner lead portion to which a bonding wire 13I to be described later is connected and a portion exposed from the resin package 4I makes up an outer lead portion for connection with a circuit board on which the semiconductor device 1I is mounted.

An upper surface of the die pad 5I and upper surfaces of the inner lead portions of the respective leads 6I are coated with silver thin films 9I and 47I by application of a silver (Ag) plating process.

With its top surface at a side with elements formed thereon facing upward, the semiconductor chip 2I has its rear surface bonded (die bonded) to the die pad 5I via a solder bonding material 10I of paste form. The top surface of the semiconductor chip 2I is covered by a top surface protective film 11I. Also, ten pads 12I are formed on the top surface of the semiconductor chip 2I by selective removal of the surface protective film 11I.

Each pad 12I is formed to a quadrilateral shape in plan view, and in the semiconductor chip 2I, five each is provided along an edge portion of each of two sides extending parallel to sides of the die pad 5I that face the leads 6I.

One end of a bonding wire 13I is bonded to each pad 12I. The other end of each bonding wire 13I is bonded to the upper surface of the lead 6I corresponding to the pad 12I. The semiconductor chip 2I is thereby electrically connected to the leads 6I via the bonding wires 13I.

As in the first preferred embodiment, in the semiconductor device 1I, the entire top surface of the semiconductor chip 2I, entire top surface and side surfaces of the die pad 5I, the entire top surfaces of the leads 6I, and the entire bonding wires 13I are covered by an integral water-impermeable insulating film 19I.

In plan view, the semiconductor chip 2I is smaller than the die pad 5I and the top surface of the die pad 5I is exposed at a periphery of the semiconductor chip 2I. A plurality of dummy wires 15I, 16I, and 17I made of copper are bonded to the top surface (silver thin films 9I and 47I) of the die pad 5I exposed at the periphery of the semiconductor chip 2I.

Specifically, as shown in FIG. 75, the plurality of dummy wires 15I, which extend in the extension direction and are mutually spaced at intervals in a direction orthogonal to the extension direction, and the plurality of dummy wires 16I, which are orthogonal to the dummy wires 15I and are mutually spaced at intervals in the extension direction, are provided between the semiconductor chip 2I and the respective suspending portions 8I. Each of the dummy wires 15I and 16I has both end portions thereof bonded to the top surface of the die pad 5I and is formed to an arch shape that is bulged at a central portion. The central portion of a dummy wire 15I may be in mutual contact with the central portion of a dummy wire 16I. Such dummy wires 15I and 16I are obtained using a wire bonder to form the dummy wires 15I and thereafter forming the dummy wires 16I so as to span across the respective dummy wires 15I.

Also, the plurality of dummy wires 17I that extend along the extension direction are formed between the semiconductor chip 2I and the leads 6I. Each dummy wire 17I has both end portions thereof bonded to the top surface of the die pad 5I and is formed to an arch shape that is bulged at a central portion. The central portions of the dummy wires 17I are formed to a height that does not interfere with the respective bonding wires 13I.

Also, a plurality of dummy wires 18I are formed as shown in FIG. 74 at a lower surface of the die pad 5I at the side opposite the surface of bonding with the semiconductor chip 2I. As with the dummy wires 15I and the dummy wires 16I, the dummy wires 18I extend in the extension direction and the direction orthogonal thereto and are formed in a lattice.

The respective dummy wires 15I, 16I, 17I, and 18I thus do not contact the semiconductor chip 2I or anyone of the leads 6I and do not contribute to electrical connection of the semiconductor chip 2I with the die pad 5I and the leads 6I.

As described above, the bonding wires 13I made of copper are installed between the semiconductor chip 2I bonded to the die pad 5I and the leads 6I disposed at the periphery of the die pad 5I. The semiconductor chip 2I and the leads 6I are electrically connected by the bonding wires 13I. Also, the semiconductor device 1I is provided with the dummy wires 15I, 16I, 17I, and 18I that do not contribute to electrical connection of the semiconductor chip 2I with the die pad 5I and the leads 6I. The dummy wires 15I, 16I, 17I, and 18I are made of copper.

During operation of the semiconductor device 1I, heat generated from the semiconductor chip 2I is transmitted to the die pad 5I, the leads 6I, and the dummy wires 15I, 16I, 17I, and 18I. The transmitted heat then propagates through the resin package 4I that seals the above components together and is released (radiated) from the top surface of the resin package 4I. Thus, by the dummy wires 15I, 16I, 17I, and 18I being provided, efficiency of heat transmission to the resin package 4I can be improved and heat radiation property of the semiconductor device 1I can be improved in comparison to an arrangement in which the dummy wires 15I, 16I, 17I, and 18I are not provided.

Also, the dummy wires 15I, 16I, 17I, and 18I do not contribute to electrical connection of the semiconductor chip 2I with the die pad 5I and the leads 6I. Contact of the dummy wires 15I, 16I, 17I, and 18I with each other thus does not have to be considered and there are no restrictions in the positioning thereof, and thus the dummy wires 15I, 16I, 17I, and 18I can be disposed as densely as is physically possible. Consequently, further improvement in the heat radiation property of the semiconductor device 1I can be achieved.

Also, each of the dummy wires 15I, 16I, 17I, and 18I is a looped metal wire having both end portions bonded to the die pad 5I (silver thin film 9I and 47I). The dummy wires 15I, 16I, 17I, and 18I may thus be formed using a wire bonder. Addition of a device for forming the dummy wires 15I, 16I, 17I, and 18I can thus be avoided.

Also, the dummy wires 15I, 16I, 17I, and 18I are made of copper. Copper is inexpensive and the dummy wires 15I, 16I, 17I, and 18I can thus be reduced in material cost. Also, copper is high in heat transfer coefficient and can thus improve a heat radiation amount of the semiconductor device 1I.

Also, the bonding wires 13I are made of copper. Copper is inexpensive and the bonding wires 13I can thus be reduced in material cost. Also, copper is high in electrical conductivity and thus enables reduction in electrical resistance between the semiconductor chip 2I and the leads 6I.

Figure 76:
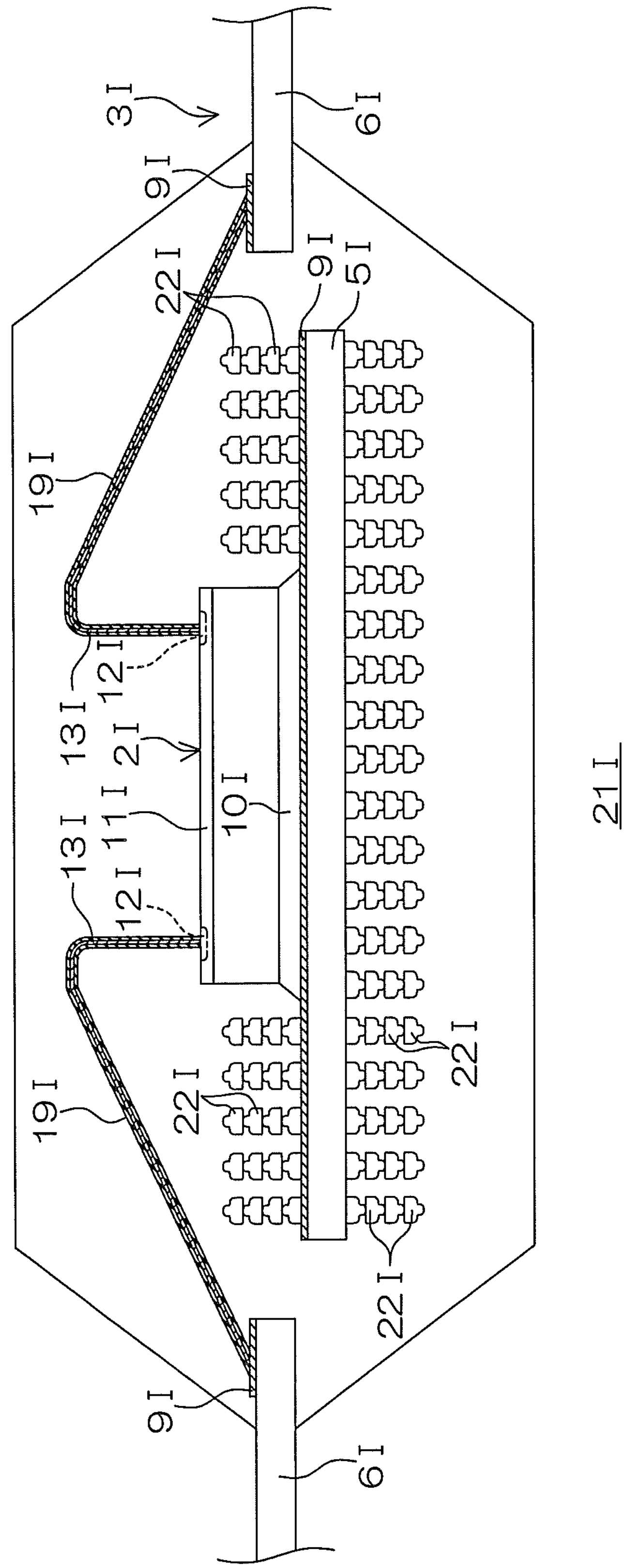
FIG. 76 is a schematic sectional view of a first modification example of the semiconductor device shown in FIG. 74.

FIG. 76 is a schematic sectional view of a first modification example of the semiconductor device shown in FIG. 74. In FIG. 76, portions corresponding to the respective portions shown in FIG. 74 are provided with the same reference symbols as the reference symbols provided to the abovementioned respective portions. In the following description, points of difference of the structure shown in FIG. 76 with respect to the structure shown in FIG. 74 shall be described mainly and description of the portions provided with the same reference symbols as the respective portions shown in FIG. 74 shall be omitted.

In a semiconductor device 21I shown in FIG. 76, a plurality of stud bumps 22I are disposed in place of the dummy wires 15I, 16I, 17I, and 18I shown in FIG. 74.

Each stud bump 22I formed on the upper surface of the die pad 5I is formed to a stepped disk shape that is narrower at an upper side and is disposed overlapplingly in a plurality of steps to a height such that contact is not made with any bonding wire 13I. Meanwhile, each stud bump 22I formed on the lower surface of the die pad 5I is formed to a stepped disk shape that is narrower at a lower side and is disposed overlapplingly in a plurality of steps to a height of not being exposed from the resin package 4I on the lower surface of the semiconductor device 21I.

Such a semiconductor device 21I that includes the stud bumps 22I is obtained, for example, by forming the stud bumps 22I at the upper side in a state where the upper surface of the die pad 5I faces upward and then turning over the semiconductor device 21I to form the stud bumps 22I at the lower side in a state where the lower surface of the die pad 5I faces upward.

The same effects as those of the semiconductor device 1I shown in FIG. 74 can be obtained by the arrangement of the semiconductor device 21I as well.

Also, the stud bumps 22I may be formed using a wire bonder. Addition of a device for forming the stud bumps 22I can thus be avoided. Also, the stud bumps 22I can be positioned without having to consider mutual contact of the stud bumps 22I, and thus the stud bumps 22I can be formed at as small an interval as can be formed using the wire bonder.

Also, a plurality of stud bumps 22I are layered overlappingly. The height of the stud bumps 22I can thus be changed according to a dead space inside the semiconductor device 21I and a surface area of the stud bumps 21I can thus be made even greater. Consequently, further improvement in the heat radiation property of the semiconductor device can be achieved.

Figure 77:
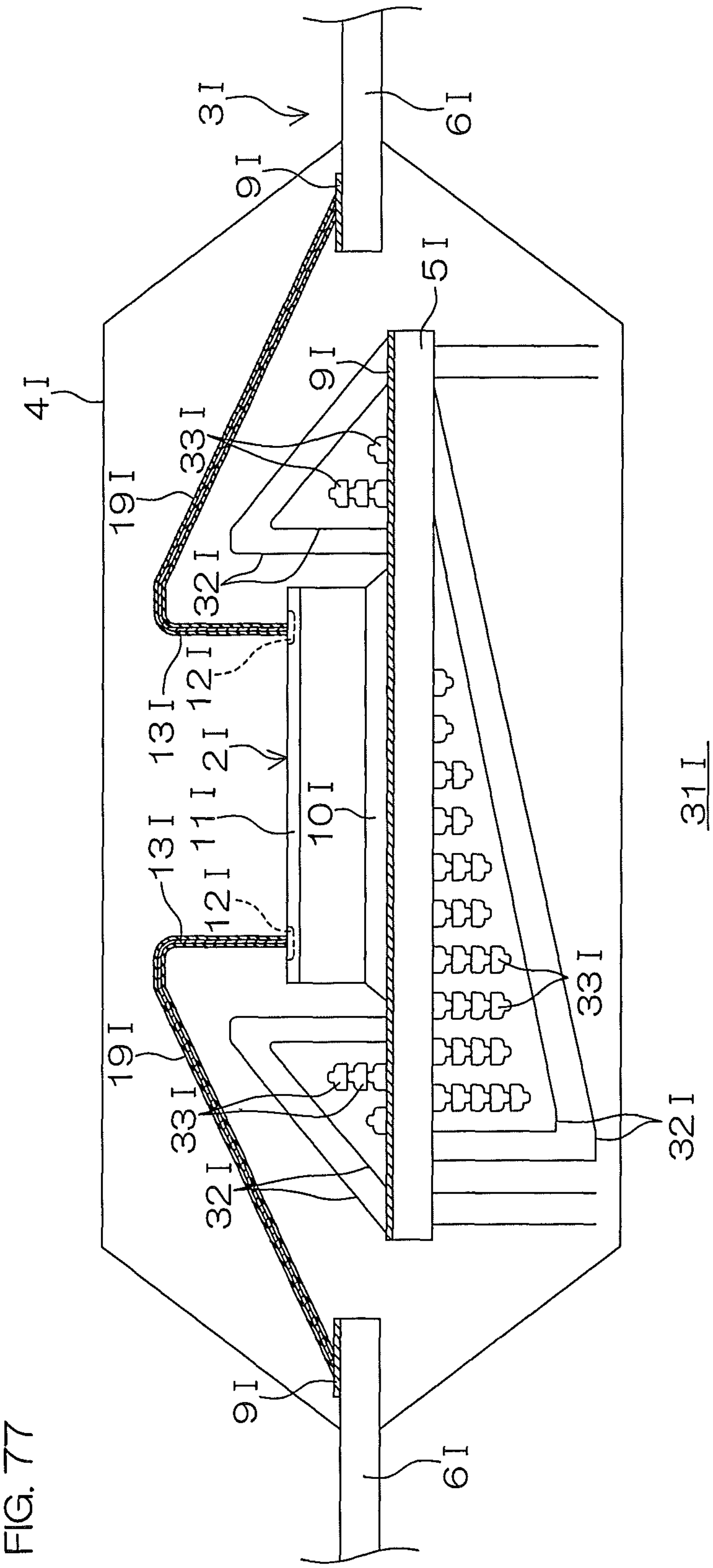
FIG. 77 is a schematic sectional view of a second modification example of the semiconductor device shown in FIG. 74.

FIG. 77 is a schematic sectional view of a second modification example of the semiconductor device shown in FIG. 74. In FIG. 77, portions corresponding to the respective portions shown in FIG. 74 are provided with the same reference symbols as the reference symbols provided to the abovementioned respective portions. In the following description, points of difference of the structure shown in FIG. 77 with respect to the structure shown in FIG. 74 shall be described mainly and description of the portions provided with the same reference symbols as the respective portions shown in FIG. 74 shall be omitted.

With a semiconductor device 31I shown in FIG. 77, the dummy wires 15I, 16I, 17I, and 18I shown in FIG. 74 and the stud bumps 22I shown in FIG. 76 are disposed in a combined state.

Specifically, stud bumps 33I of stepped disk shape are disposed overlappingly in a plurality of steps at the upper surface and the lower surface of the die pad 5I. Dummy wires 32I, each having both end portions thereof connected to the silver thin film 9I or 47I, are disposed so as to span across the stud bumps 33I. Each dummy wire 32I has both end portions thereof bonded to the top surface of the die pad 5I and is formed to an arch shape that is bulged at a central portion. In other words, at an inner side portion of the loop of each dummy wire 32I (portion between the central portion of the dummy wire 32I and the die pad 5I), a plurality of stud bumps 33I are disposed overlappingly in a plurality of steps in accordance with the height of the central portion of the dummy wire 32I.

The same effects as those of the semiconductor device 1I shown in FIG. 74 can be obtained by the arrangement of the semiconductor device 31I as well.

Also, the positional density of the dummy wires 32I and the stud bumps 33I can be made even higher because the stud bumps 33I are disposed at gaps of the loop portions of the dummy wires 32I and thus further improvement in the heat radiation property of the semiconductor device 31I can be achieved.

Figure 78:
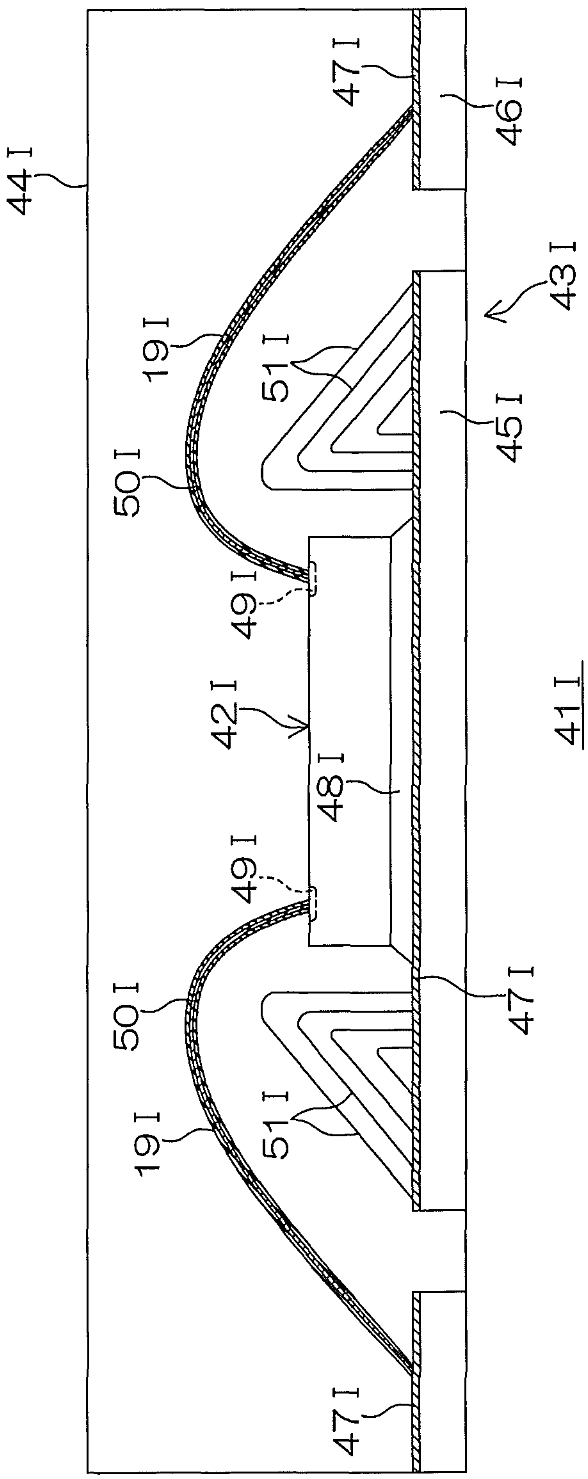
FIG. 78 is a schematic sectional view of a third modification example of the semiconductor device shown in FIG. 74.
Figure 79:
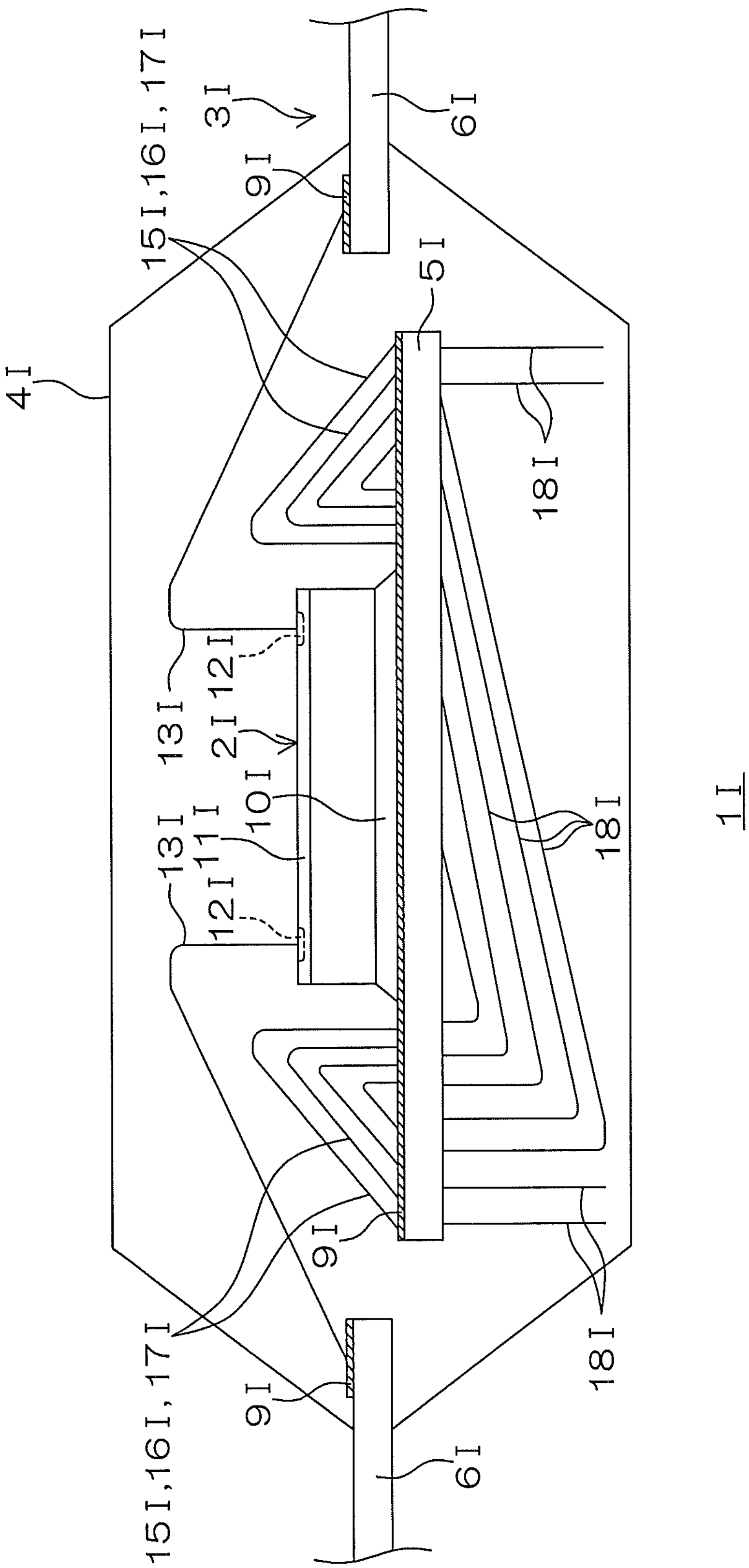
FIG. 79 is a schematic sectional view of a fourth modification example of the semiconductor device shown in FIG. 74.
Figure 80:
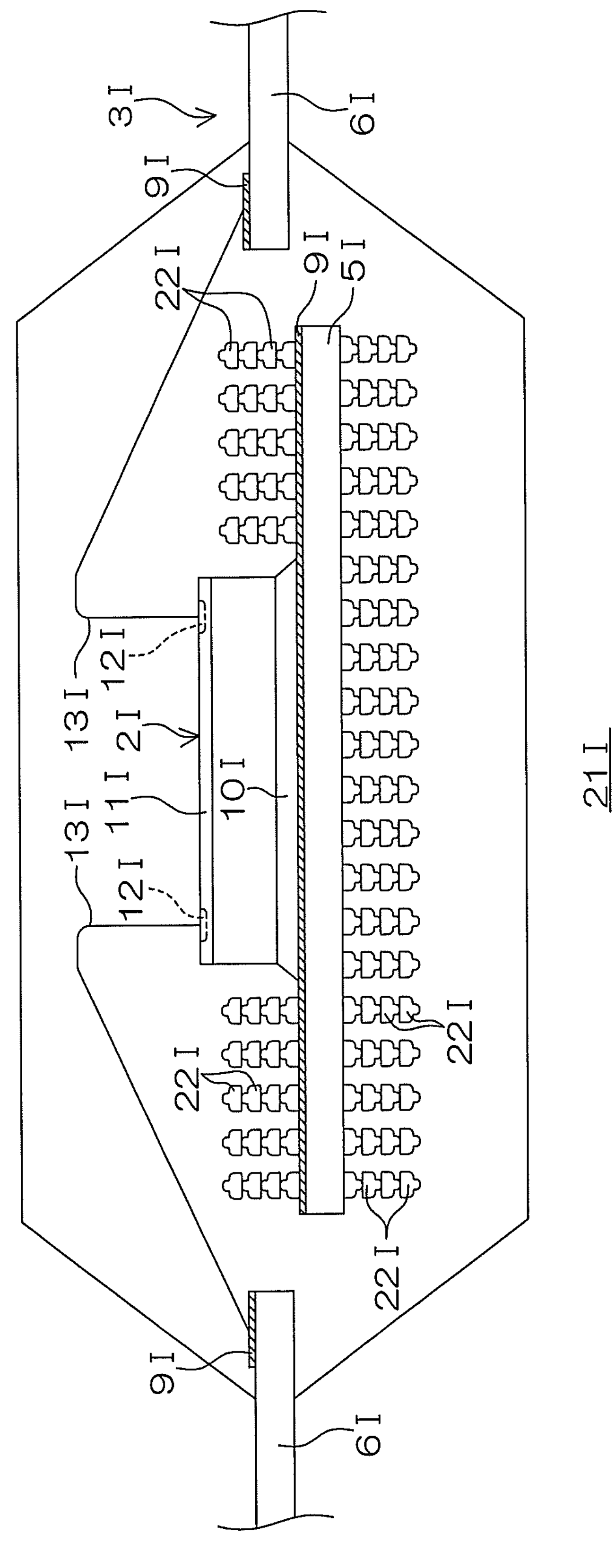
FIG. 80 is a schematic sectional view of a semiconductor device according to another mode of the first modification example.
Figure 81:
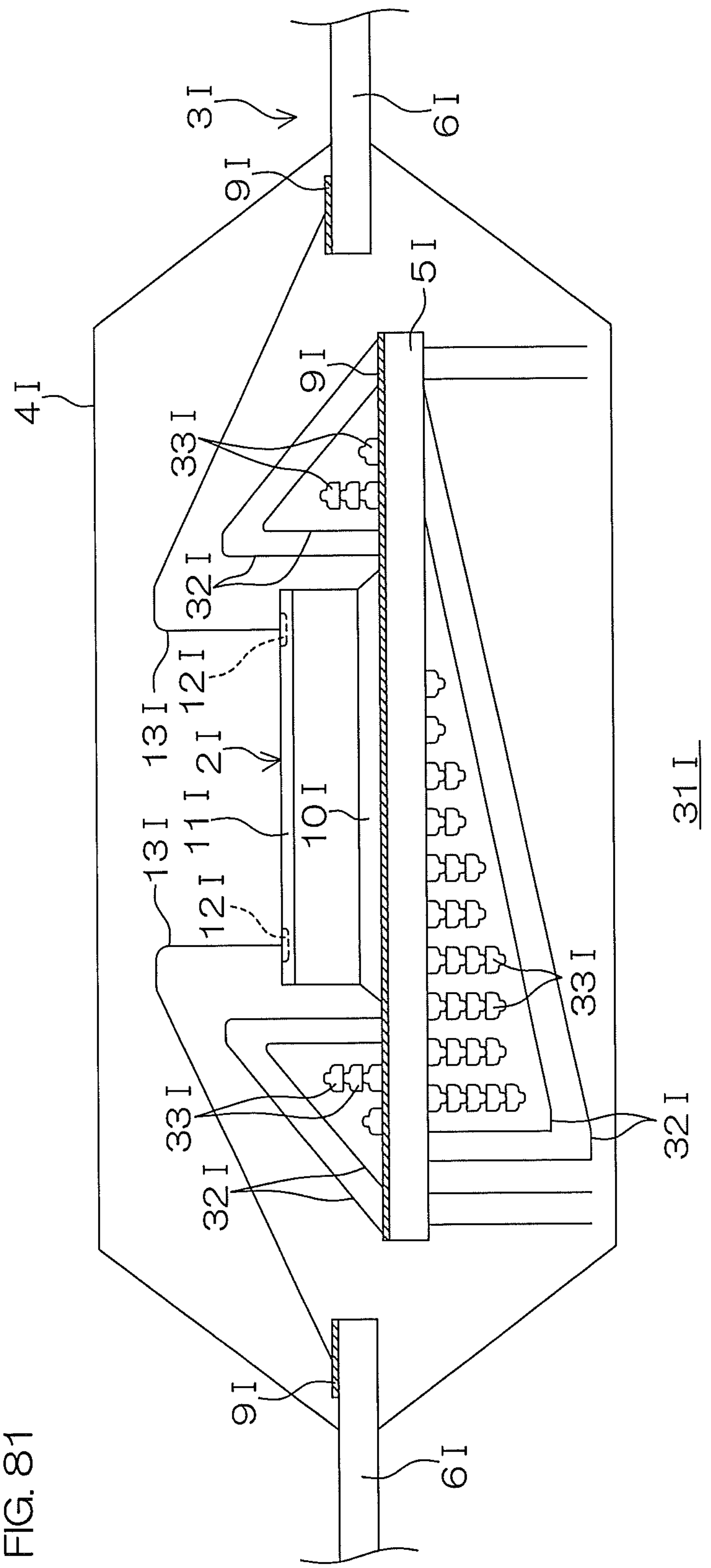
FIG. 81 is a schematic sectional view of a semiconductor device according to another mode of the second modification example.
Figure 82:
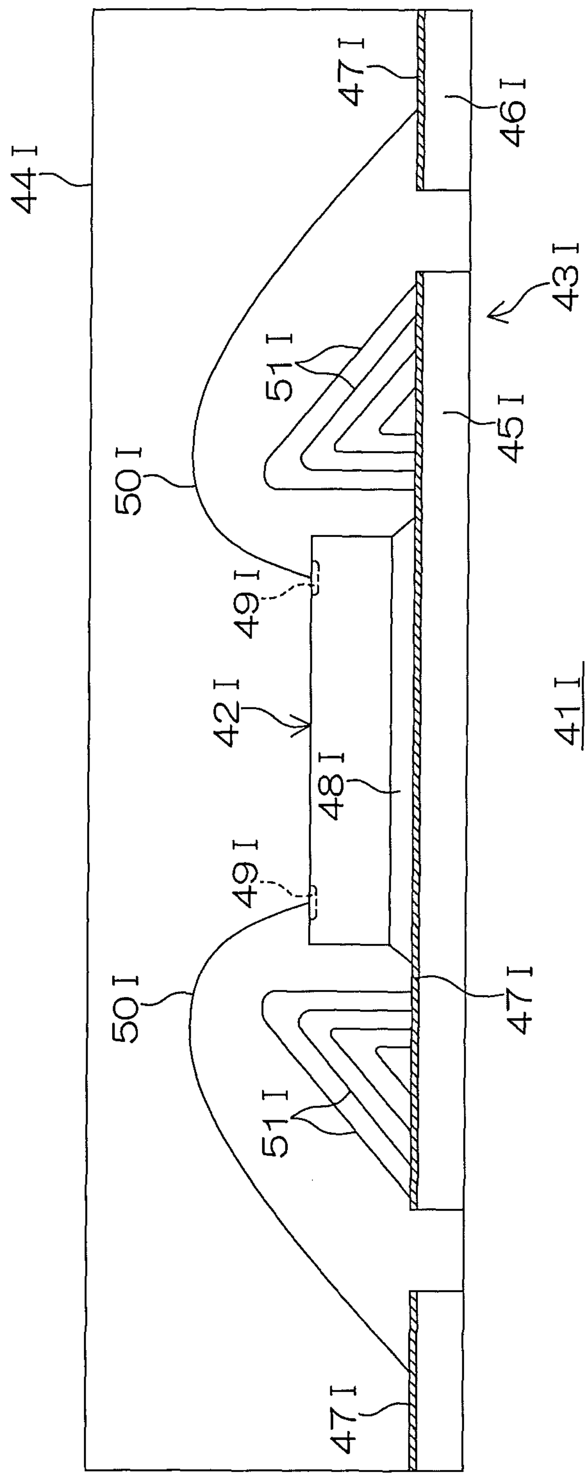
FIG. 82 is a schematic sectional view of a semiconductor device according to another mode of the third modification example.

FIG. 78 is a schematic sectional view of a third modification example of the semiconductor device shown in FIG. 74.

A semiconductor device 41I is a so-called surface mounted type semiconductor device with which rear surfaces of a die pad and leads are exposed from a rear surface of a resin package.

The semiconductor device 41I has a structure in which a semiconductor chip 42I is sealed together with a lead frame 43I by a resin package 44I. An outer shape of the semiconductor device 41I is a flat, rectangular parallelepiped shape (in the present preferred embodiment, a hexahedron having a square shape in plan view).

The lead frame 43I includes a die pad 45I disposed at a central portion of the semiconductor device 1I and a plurality of leads 46I disposed at a periphery of the die pad 45I. The lead frame 43I is formed, for example, by performing a punching process and a pressing process on a copper thin plate.

The die pad 45I has a quadrilateral shape in plan view. A lower surface of the die pad 45I is exposed at a rear surface of the resin package 44I.

The leads 46I are disposed at sides of the die pad 45I in plan view. A lower surface of each lead 46I is exposed at the rear surface of the resin package 44I and functions as an external terminal for connection with a wiring circuit board (not shown).

An upper surface of the die pad 45I and upper surfaces of the respective leads 46I are coated by a silver thin film 47I by application of a silver plating process.

With its top surface at a side with functional elements formed thereon (device forming surface) facing upward, the semiconductor chip 42I has its rear surface bonded (die bonded) to the die pad 45I via a conductive solder bonding material 48I.

At the top surface of the semiconductor chip 42I, pads 49I are formed in correspondence to the respective leads 46I by exposure of portions of a wiring layer from a top surface protective film. Each pad 49I is bonded to one end of a bonding wire 50I made of copper. The other ends of the bonding wires 50I are bonded to the upper surfaces of the respective leads 46I. The semiconductor chip 42I is thereby electrically connected to the leads 46I via the bonding wires 50I.

In plan view, the semiconductor chip 42I is smaller than the die pad 45I and the top surface of the die pad 45I is exposed at a periphery of the semiconductor chip 42I. A plurality of dummy wires 51I made of copper are bonded to the top surface (silver thin films 47I) of the die pad 45I exposed at the periphery of the semiconductor chip 42I. Each of the dummy wires 51I has both end portions thereof bonded to the top surface of the die pad 45I and is formed to an arch shape that is bulged at a central portion while being spaced at intervals from the die pad 45I. Also, the respective dummy wires 51I do not contact the semiconductor chip 42I or any one of the leads 46I and do not contribute to electrical connection of the semiconductor chip 42I with the die pad 45I and the leads 46I.

The same effects as those of the semiconductor device 1I shown in FIG. 74 can be obtained by the arrangement of the semiconductor device 431I as well.

In the semiconductor device 41I, stud bumps may be provided in place of the dummy wires 51I in the same manner as in the semiconductor device 21I shown in FIG. 76, or a combination of the dummy wires 51I and stud bumps may be adopted in the same manner as in the semiconductor device 31I shown in FIG. 77.

Although the ninth preferred embodiment of the present invention has been described above, the ninth preferred embodiment may also be modified as follows.

For example, with each of the semiconductor devices 1I, 21I, 31I, and 41I shown in FIG. 74 to FIG. 78, the dummy wires 15I, 16I, 17I, 18I, or 51I and/or the stud bumps 22I or 33I are formed on the die pad 5I. However, the dummy wires 15I, 16I, 17I, 18I, or 51I and/or the stud bumps 22I or 33I may instead be formed on the leads 6I or 46I.

In each of the semiconductor devices 1I, 21I, and 31I, the silver thin films 9I and 47I are formed on the upper surface of the die pad 5I and the upper surfaces of the inner lead portions of the lead 6I to enable the bonding wires 13I to be bonded satisfactorily to the leads 6I and the dummy wires 15I, 16I, and 17I to be bonded satisfactorily to the die pad 5I.

Also, in the semiconductor device 41I, the silver thin film 47I is formed on the upper surface of the die pad 45I and the upper surfaces of the lead 46I to enable the bonding wires 50I to be bonded satisfactorily to the leads 46I and the dummy wires 51I to be bonded satisfactorily to the die pad 45I.

However, the silver thin films 9I and 47I are not required necessarily and the bonding of the bonding wires 13I or 50I to the leads 6I or 46I and the bonding of the dummy wires 15I, 16I, 17I, or 51I to the die pad 5I or 45I can be achieved even if the silver thin films 9I and 47I are omitted.

By omission of the silver thin films 9I and 47I, reduction in material cost can be achieved. Also, the silver plating process for forming the silver thin films 9I and 47I is omitted and a number of manufacturing steps of each of the semiconductor devices 1I, 21I, 31I, and 41I can be reduced.

Also, although in the preferred embodiment of FIG. 74, the dummy wires 15I and the dummy wires 16I are disposed so as to be mutually orthogonal and form a lattice in plan view, the respective dummy wires 15I, 16I, 17I, and 18I do not have to form a lattice in plan view and lengths and directions thereof may be changed freely.

Also, although with the above-described preferred embodiment, a mode in which the bonding wires 13I are covered by the water-impermeable insulating film 19I was described as an example, the water-impermeable insulating film 19I may be omitted as shown in each of FIG. 79 to FIG. 82 as long as at least the ninth object for resolving the ninth issue is achieved.

Tenth Preferred Embodiment FIG. 83 to FIG. 94

By disclosure of a tenth preferred embodiment, a tenth issue concerning a tenth background art described below can be resolved in addition to the issues described above in the "OBJECT(S) OF THE INVENTION."

(1) Tenth Background Art

A resin sealed type semiconductor device has a structure in which a semiconductor chip is sealed together with a lead frame by a resin package. The lead frame is formed by punching out a metal thin plate and includes an island and a plurality of leads disposed at a periphery of the island. The semiconductor chip is die bonded onto the island. A plurality of pads are disposed on a top surface of the semiconductor chip, and between each pad and each lead, a wire for electrical connection is installed for electrical connection thereof.

In a case where a rear surface of the semiconductor chip and the island need to be connected electrically, a conductive bonding material is interposed between the semiconductor chip and the island. A solder paste is used most widely as the conductive bonding material.

(2) Tenth Issue

As a part of measures for environmental protection, making of semiconductor device Pb (lead) free is being examined recently. Making of an outer packaging portion of a semiconductor device Pb-free has been completed, and if a highly adhesive type Ag (silver) paste or solder having Bi (bismuth) or Zn (zinc) as a main component is adopted as the bonding material interposed between the semiconductor chip and the island, making of an interior of the semiconductor device Pb-free can be realized.

A lead solder, which is generally used as a bonding material, is used, for example, for a purpose of securing electrical conductivity by an ohmic bonding. A lead solder may also be used for a purpose where a high heat radiating property is to be secured but an ohmic bonding is not necessary.

Metal (solder) bonding is essential for realizing ohmic bonding of a semiconductor chip and an island. Meanwhile, in order to achieve the second purpose, a bonding material (paste) having a high heat radiating property must be adopted. For exhibition of a high heat radiating property, an amount of metal particles (for example, Ag) contained in the bonding material is increased. However, when the amount of metal particles is increased, an amount of epoxy resin or other organic component decreases and the bonding material decreases in adhesion property.

Also, in a case where a solder having Bi or Zn as a main component is used as the bonding material, the solder forms dissimilar metal films with the semiconductor chip and with the island and these need to be increased in adhesive properties, thus leading to increase of the number of manufacturing steps and increase of manufacturing cost of the semiconductor device. Solders having Bi or Zn as a main component are thus still in a stage of evaluation around the world.

Thus, a tenth object of the present invention related to the tenth preferred embodiment is to provide a semiconductor device that enables electrical connection (ohmic connection) to be achieved between a rear surface of a semiconductor chip and an island even when a bonding material other than solder is used.

(3) Disclosure of a Specific Preferred Embodiment

Figure 83:
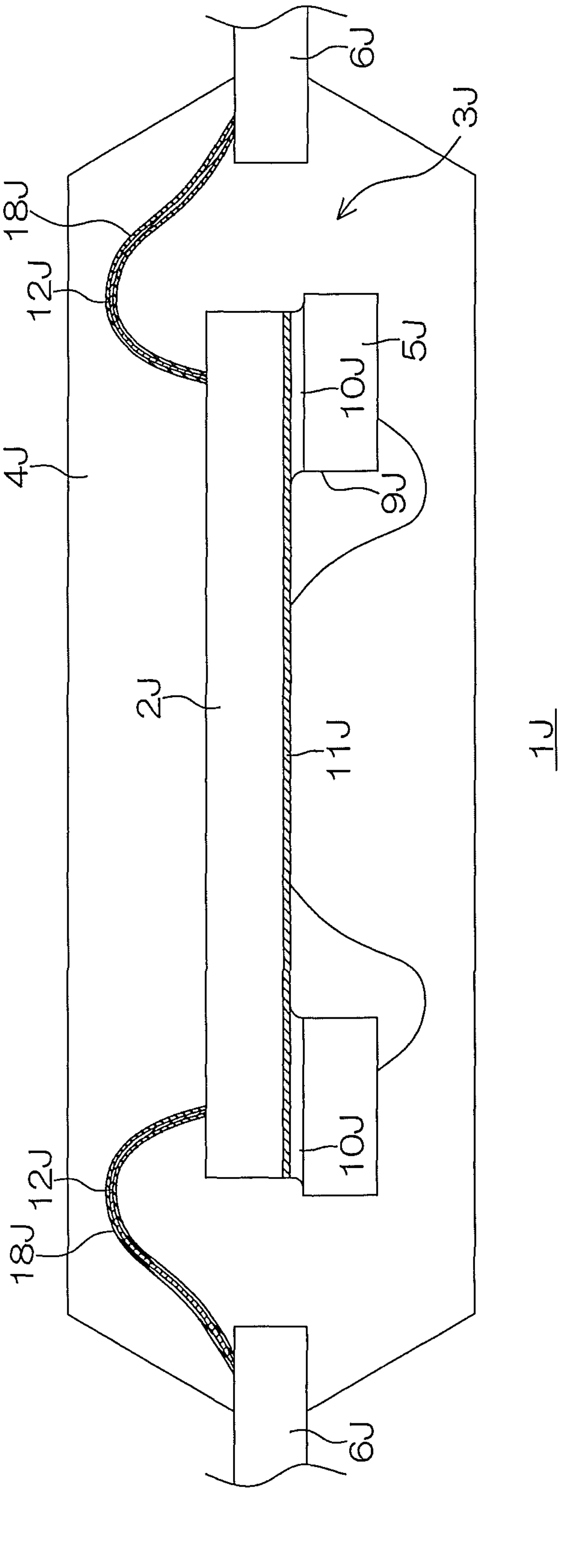
FIG. 83 is a schematic sectional view of a semiconductor device according to a tenth preferred embodiment of the present invention.
Figure 84:
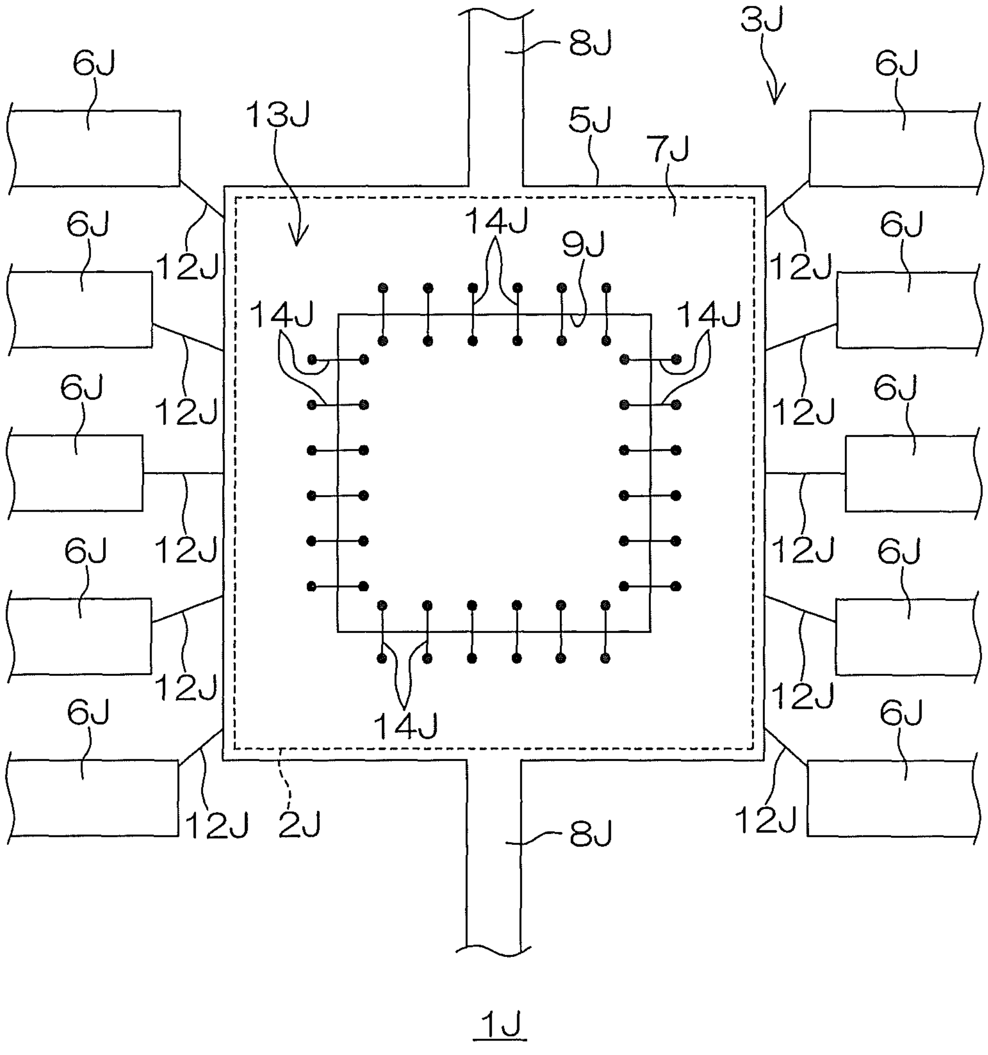
FIG. 84 is a schematic plan view of the semiconductor device shown in FIG. 83 as viewed from a rear surface side and shows a state where illustration of a resin package is omitted.

FIG. 83 is a schematic sectional view of a semiconductor device according to the tenth preferred embodiment of the present invention. FIG. 84 is a schematic plan view of the semiconductor device shown in FIG. 83 as viewed from a rear surface side and shows a state where illustration of a resin package is omitted.

The semiconductor device 1J has a structure in which a semiconductor chip 2J is sealed together with a lead frame 3J by a resin package 4J. The resin package 4J is formed to a quadrilateral shape in plan view.

The lead frame 3J includes an island 5J disposed at a central portion of the semiconductor device 1J and a plurality of (ten in the present preferred embodiment) leads 6J disposed at a periphery of the island 5J. The lead frame 3J is formed, for example, by performing a punching process and a pressing process on a copper (Cu) thin plate.

The island 5J integrally includes a main body portion 7J of quadrilateral shape in plan view that has its center overlapped with a center of the resin package 4J in plan view and has four sides extending parallel to the respective sides of the resin package 4J, and suspending portions 8J of quadrilateral shape in plan view that extend from two mutually opposite sides among the four sides of the main body portion 7J to side surfaces of the resin package 4J. As shown in FIG. 84, the main body portion 7J has formed therein a through-hole 9J passing through its thickness direction. The through-hole 9J is formed to a quadrilateral shape smaller than the semiconductor chip 2J in plan view.

With respect to the main body portion 7J of the island 5J, the same number each of the leads 6J are disposed at equal intervals at each of both sides of a direction orthogonal to a direction of extension of the suspending portions 8J.

Each lead 6J penetrates through a side surface of the resin package 4J and a portion that is sealed by the resin package 4J makes up an inner lead portion to which a top surface wire 12J to be described later is connected and a portion exposed from the resin package 4J makes up an outer lead portion for connection with a circuit board on which the semiconductor device 1J is mounted.

The semiconductor chip 2J is formed to a quadrilateral shape in plan view. An alloy film 11J is coated onto an entirety of a rear surface of the semiconductor chip 2J. The alloy film 11J has a structure in which, for example, Au (gold) and Ni (nickel) are laminated in that order from the semiconductor chip 2J side.

The semiconductor chip 2J is disposed facing the island 5J so that its rear surface (alloy film 11J) faces the island 5J. In this state, a peripheral portion of the through-hole 9J in the island 5J faces a peripheral edge portion of the rear surface of the semiconductor chip 2J. A silver paste 10J with an insulating property is interposed between the peripheral portion of the through-hole 9J and the peripheral edge portion of the semiconductor chip 2J. The rear surface of the semiconductor chip 2J is thereby bonded (die bonded) to the island 5J via the silver paste 10J.

Pads (not shown) of the same number as the leads 6J are formed on the top surface of the semiconductor chip 2J in correspondence to the respective leads 6J. One end of a top surface wire 12J is bonded to each pad. The other end of each top surface wire 12J is bonded to the upper surface of the lead 6J corresponding to the pad. The respective pads are thereby electrically connected to the leads 6J via the top surface wires 12J.

As in the first preferred embodiment, in the semiconductor device 1J, the entire top surface of the semiconductor chip 2J, entire top surface and side surfaces of the island 5J, the entire top surfaces of the leads 6J, and the entire top surface wires 12J are covered by an integral water-impermeable insulating film 18J.

A plurality of rear surface wires 14J are installed between the rear surface (alloy film 11J) of the semiconductor chip 2J and the island 5J. Specifically, one end portion of each rear surface wire 14J is bonded to a portion of the rear surface of the semiconductor chip 2J that faces the through-hole 9J. Each rear surface wire 14J is inserted through the through-hole 9J and the other end portion thereof is bonded to a rear surface of the island 5J. The rear surface wires 14J are, for example, disposed at equal intervals along respective sides of the through-hole 9J of quadrilateral shape as shown in FIG. 84. The rear surface of the semiconductor chip 2J and the island 5J are thereby connected electrically by the plurality of rear surface wires 14J.

As described above, the semiconductor chip 2J has its rear surface bonded to the island 5J by the silver paste 10J with the insulating property. At the sides of the island 5J, the leads 6J are disposed separatedly from the island 5J. The top surface wires 12J are installed between the pads formed on the top surface of the semiconductor chip 2J and the leads 6J. The pads and the leads 6J are thereby connected electrically.

Also, the rear surface wires 14J that electrically connect the semiconductor chip 2J and the island 5J are installed between the rear surface of the semiconductor chip 2J and the island 5J. Thus, even if the silver paste 10J with the insulating property is used as the bonding material, the rear surface of the semiconductor chip 2J and the island 5J can be connected electrically via the rear surface wires 14J. That is, even when a bonding material other than solder that contains Pb is used, electrical connection of rear surface of the semiconductor chip 2J and the island 5J can be achieved regardless of the electrical characteristics of the bonding material.

The rear surface wires 14J are made of copper. Copper is inexpensive in comparison to gold, which is widely used as wire material, and thus the rear surface wires 14J can be reduced in material cost. Also, copper is high in electrical conductivity and thus enables reduction in electrical resistance between the semiconductor chip 2J and the island 5J.

Both the top surface wires 12J and the rear surface wires 14J are made of copper. The top surface wires 12J and the rear surface wires 14J can thus be formed by a wire bonder without changing a material set in the wire bonder. A manufacturing process of the semiconductor device 1J can thus be simplified.

Also, the through-hole 9J is formed to pass through the island 5J in its thickness direction, and the rear surface wires 14J are installed between the rear surface of the semiconductor chip 2J and the island 5J through the through-hole 9J. The rear surface (alloy film 11J) of the semiconductor chip 2J is thereby exposed from the through-hole 9J and electrical connection of the rear surface of the semiconductor chip 2J and the island 5J can be achieved by the rear surface wires 14J being connected to the exposed portion. In this case, an area of a portion of the island 5J that faces the rear surface of the semiconductor chip 2J is necessarily made smaller than an area of the rear surface of the semiconductor chip 2J and the silver paste 10J with the insulating property is interposed just at facing portions of the semiconductor chip 2J and the island 5J. The silver paste 10J is thus not used at the facing portions of the semiconductor chip 2J and the through-hole 9J and thus the silver paste 10J can be reduced in usage amount. Consequently, the semiconductor chip 1J can be reduced in material cost.

Also, the rear surface wires 14J are disposed in plurality. Reliability of the electrical connection of the semiconductor chip 2J and the island 5J can thereby be improved.

Figure 85:
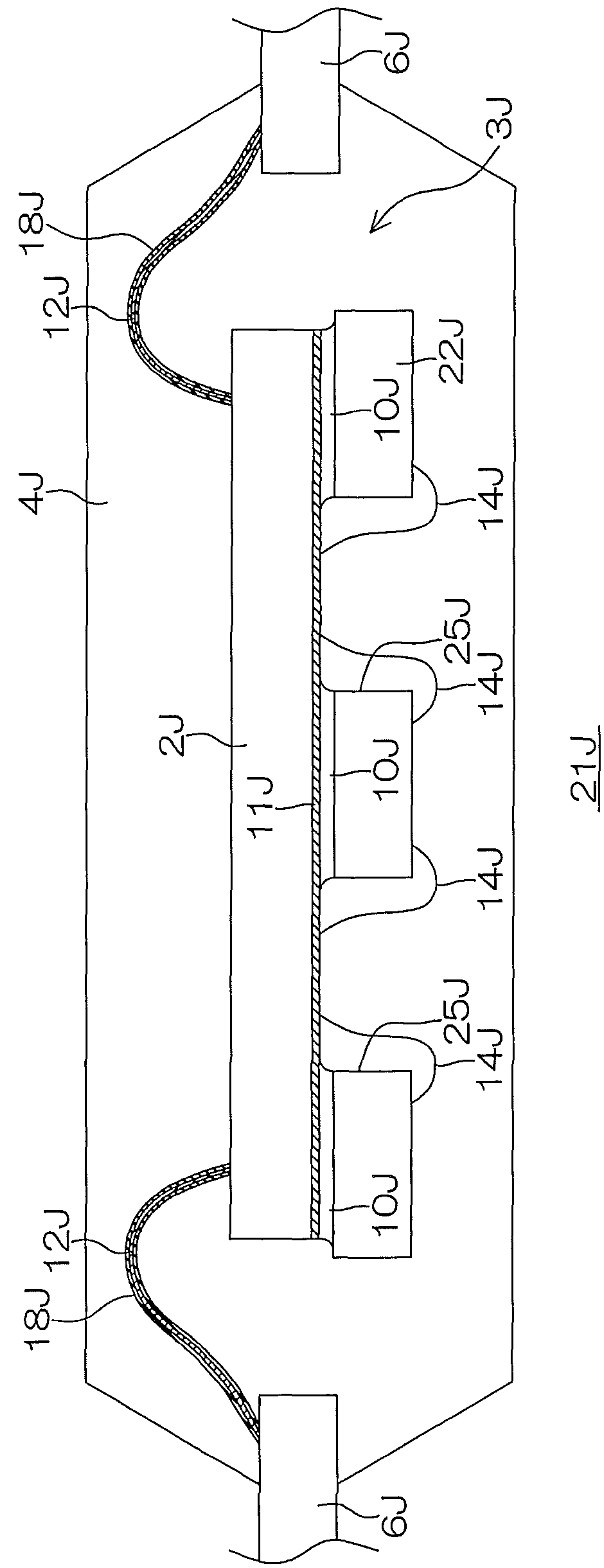
FIG. 85 is a schematic sectional view of a first modification example of the semiconductor device shown in FIG. 83.
Figure 86:
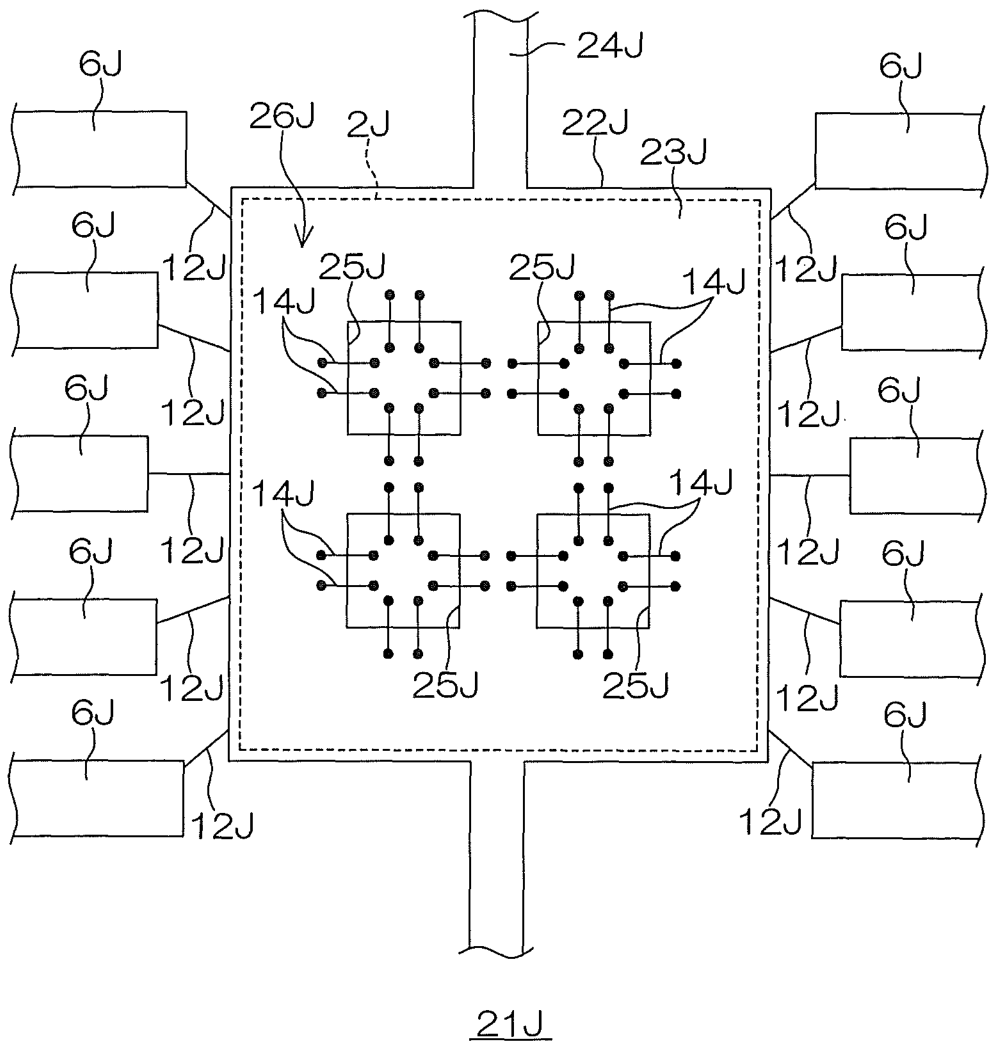

FIG. 85 is a schematic sectional view of a first modification example of the semiconductor device shown in FIG. 83. FIG. 86 is a schematic plan view of the semiconductor device shown in FIG. 85 as viewed from a rear surface side and shows a state where illustration of a resin package is omitted. In FIGS. 85 and 86, portions corresponding to the respective portions shown in FIGS. 83 and 84 are provided with the same reference symbols as the reference symbols provided to the abovementioned respective portions. In the following description, points of difference of the structure shown in FIGS. 85 and 86 with respect to the structure shown in FIGS. 83 and 84 shall be described mainly and description of the portions provided with the same reference symbols as the respective portions shown in FIGS. 83 and 84 shall be omitted.

The semiconductor device 21J shown in FIG. 85 has an island 22J that differs in structure from the island 5J shown in FIG. 83.

The island 22J integrally includes a main body portion 23J of quadrilateral shape in plan view that has four sides extending parallel to the respective sides of the resin package 4J, and suspending portions 24J of quadrilateral shape in plan view that extend from two mutually opposite sides among the four sides of the main body portion 23J to side surfaces of the resin package 4J.

As shown in FIG. 86, the main body portion 23J has formed therein four through-holes 25J that penetrate through its thickness direction. The four through-holes 25J are disposed at equiangular intervals about a center of the island 22J.

The semiconductor chip 2J is disposed facing the island 22J so that its rear surface (alloy film 11J) faces the island 22J. In this state, peripheral portions of the respective through-holes 25J in the island 22J face peripheral edge portions of the rear surface of the semiconductor chip 2J. The silver paste 10J with the insulating property is interposed between the peripheral portions of the through-holes 25J and the peripheral edge portions of the semiconductor chip 2J. The rear surface of the semiconductor chip 2J is thereby bonded (die bonded) to the island 22J via the silver paste 10J.

A plurality of rear surface wires 14J are installed between the rear surface (alloy film 11J) of the semiconductor chip 2J and the island 22J. Specifically, one end portion of each rear surface wire 14J is bonded to a portion of the rear surface of the semiconductor chip 2J that faces a through-hole 25J. Each rear surface wire 14J is inserted through the through-hole 25J and the other end thereof is bonded to a rear surface of the island 22J. The rear surface wires 14J are, for example, disposed at equal intervals along respective sides of each through-hole 25J. The rear surface of the semiconductor chip 2J and the island 22J are thereby connected electrically via the plurality of rear surface wires 14J.

The same effects as those of the semiconductor device 1J shown in FIG. 83 can be obtained by the arrangement of the semiconductor device 21J as well.

Figure 87:
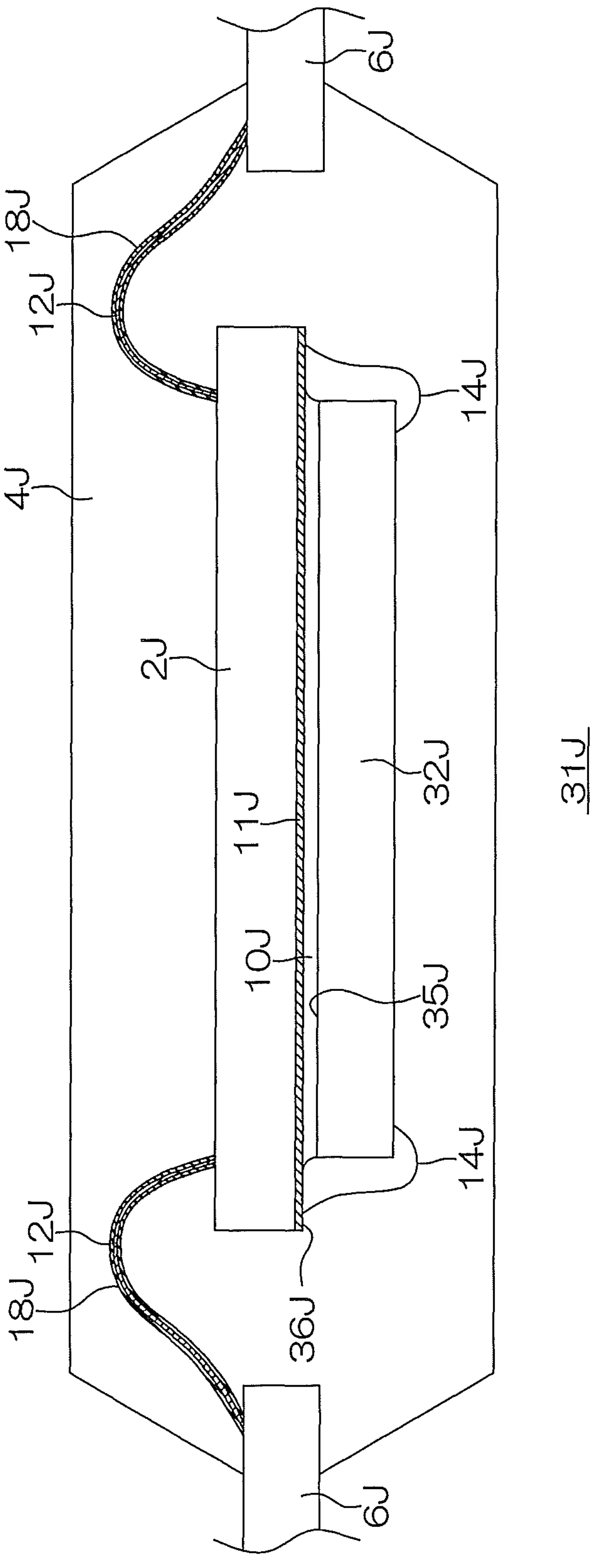
Figure 88:
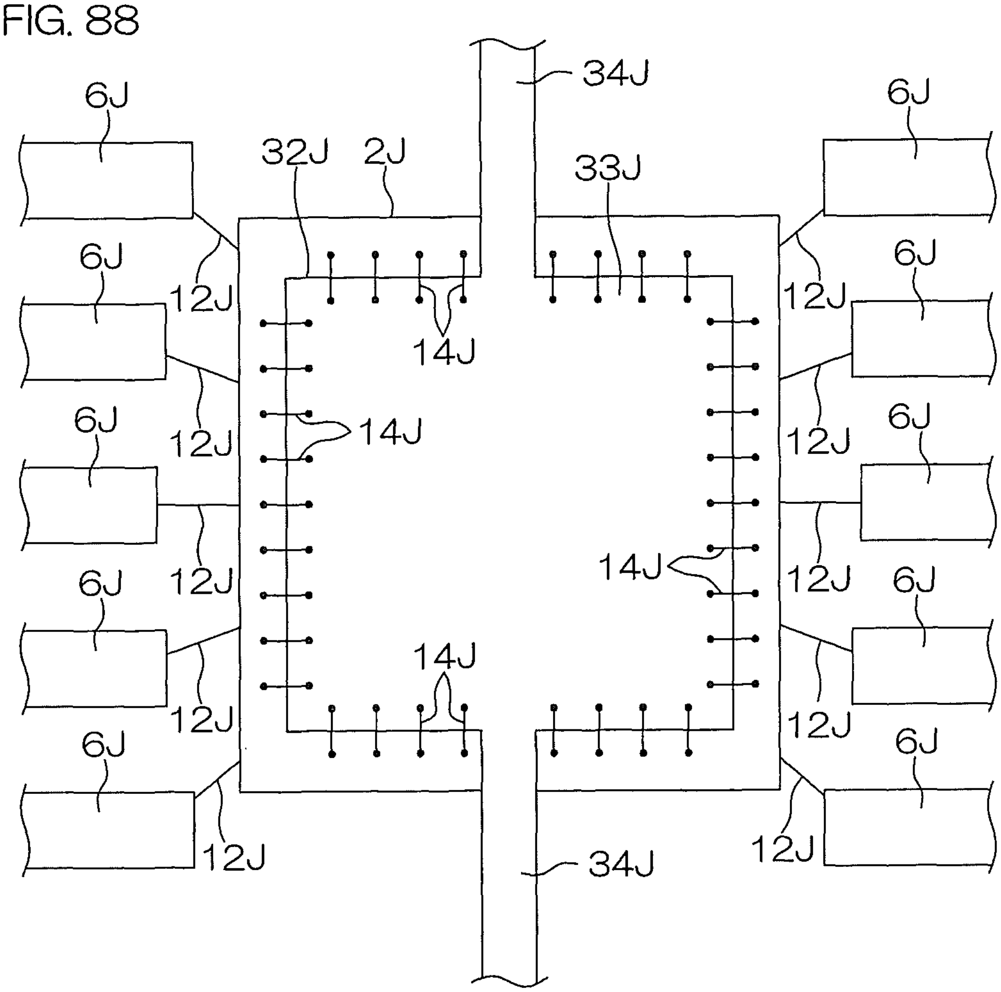

FIG. 87 is a schematic sectional view of a second modification example of the semiconductor device shown in FIG. 83. FIG. 88 is a schematic plan view of the semiconductor device shown in FIG. 87 as viewed from a rear surface side and shows a state where illustration of a resin package is omitted. In FIGS. 87 and 88, portions corresponding to the respective portions shown in FIGS. 83 and 84 are provided with the same reference symbols as the reference symbols provided to the abovementioned respective portions. In the following description, points of difference of the structure shown in FIGS. 87 and 88 with respect to the structure shown in FIGS. 83 and 84 shall be described mainly and description of the portions provided with the same reference symbols as the respective portions shown in FIGS. 83 and 84 shall be omitted.

The semiconductor device 31J shown in FIG. 87 has an island 32J that differs in structure from the island 5J shown in FIG. 83. Also, the semiconductor device 31J and the semiconductor device 1J differ in the structure for electrically connecting the rear surface of the semiconductor chip 2J and the island 5J or 32J.

The island 32J integrally includes a main body portion 33J of quadrilateral shape that has four sides extending parallel to the respective sides of the resin package 4J and is formed to a smaller size than the semiconductor chip 2J in plan view, and suspending portions 34J of quadrilateral shape in plan view that extend from two mutually opposite sides among the four sides of the main body portion 33J to side surfaces of the resin package 4J.

The semiconductor chip 2J is disposed facing the island 32J so that its rear surface (alloy film 11J) faces the island 32J. In plan view, the island 32J is smaller than the semiconductor chip 2J and a rear surface 36J of the semiconductor chip 2J is exposed from a periphery of the island 32J. That is, an area of an upper surface 35J of the island 32J that faces the semiconductor chip 2J is smaller than an area of the rear surface 36J of the semiconductor chip 2J.

In this state, the silver paste 10J with the insulating property is interposed between the upper surface 35J of the island and the rear surface 36J of the semiconductor chip 2J. The rear surface 36J of the semiconductor chip 2J is thereby bonded (die bonded) to the upper surface 35J of the island 32J via the silver paste 10J.

The plurality of rear surface wires 14J are installed between the rear surface 36J of the semiconductor chip 2J and the island 32J. Specifically, one end portion of each rear surface wire 14J is bonded to the rear surface 36J (alloy film 11J) of the semiconductor chip 2J that is exposed at the periphery of the island 32J. Each rear surface wire 14J loops around a side of the island 32J, extends to a rear surface side of the island 32J, and the other end portion thereof is bonded to the rear surface of the island 32J. The rear surface wires 14J are disposed at equal intervals along respective sides of the island 32J. The rear surface 36J of the semiconductor chip 2J and the island 32J are thereby connected electrically via the plurality of rear surface wires 14J.

The same effects as those of the semiconductor device 1J shown in FIG. 83 can be obtained by the arrangement of the semiconductor device 31J as well.

Figure 89:
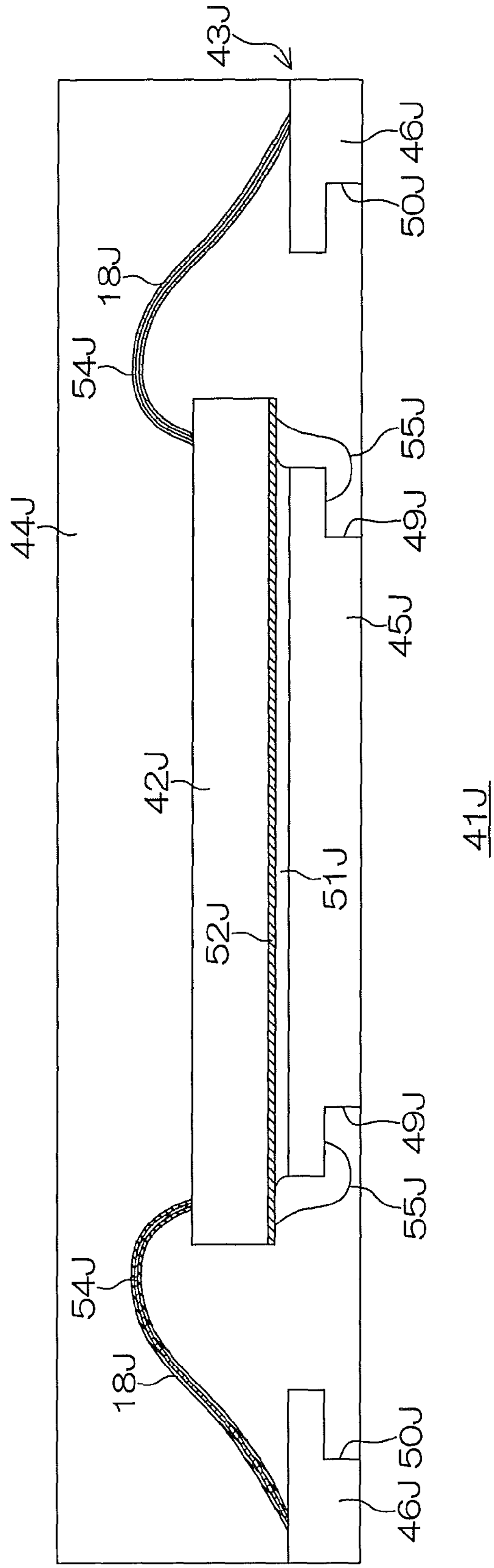
Figure 90:
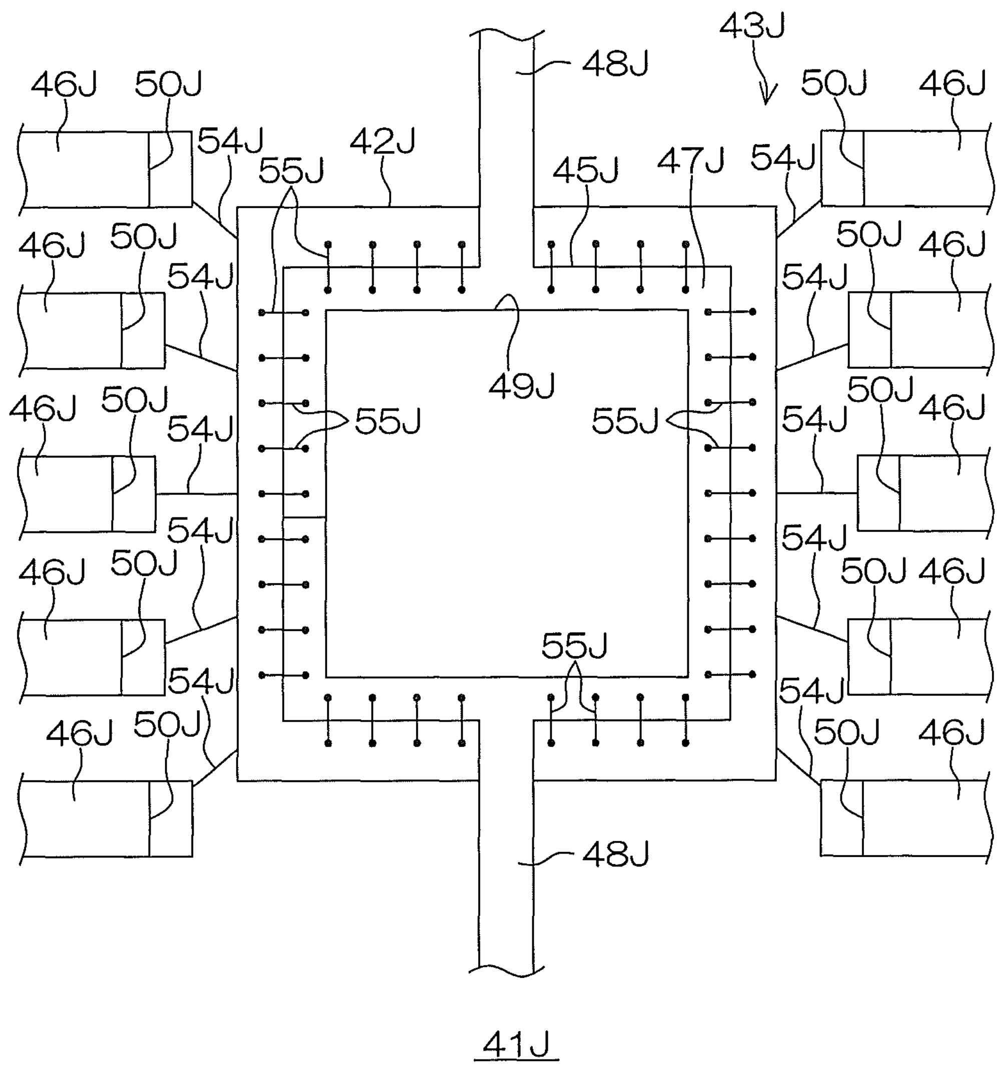
Figure 91:
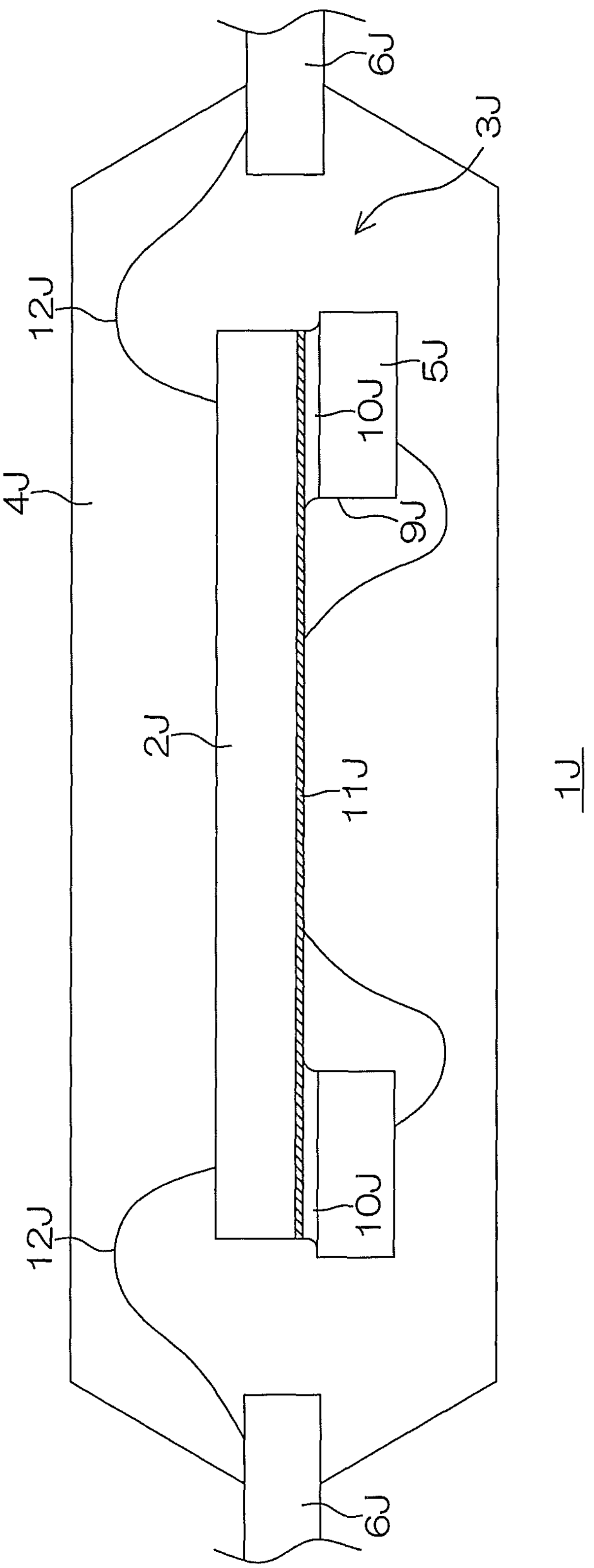
Figure 92:
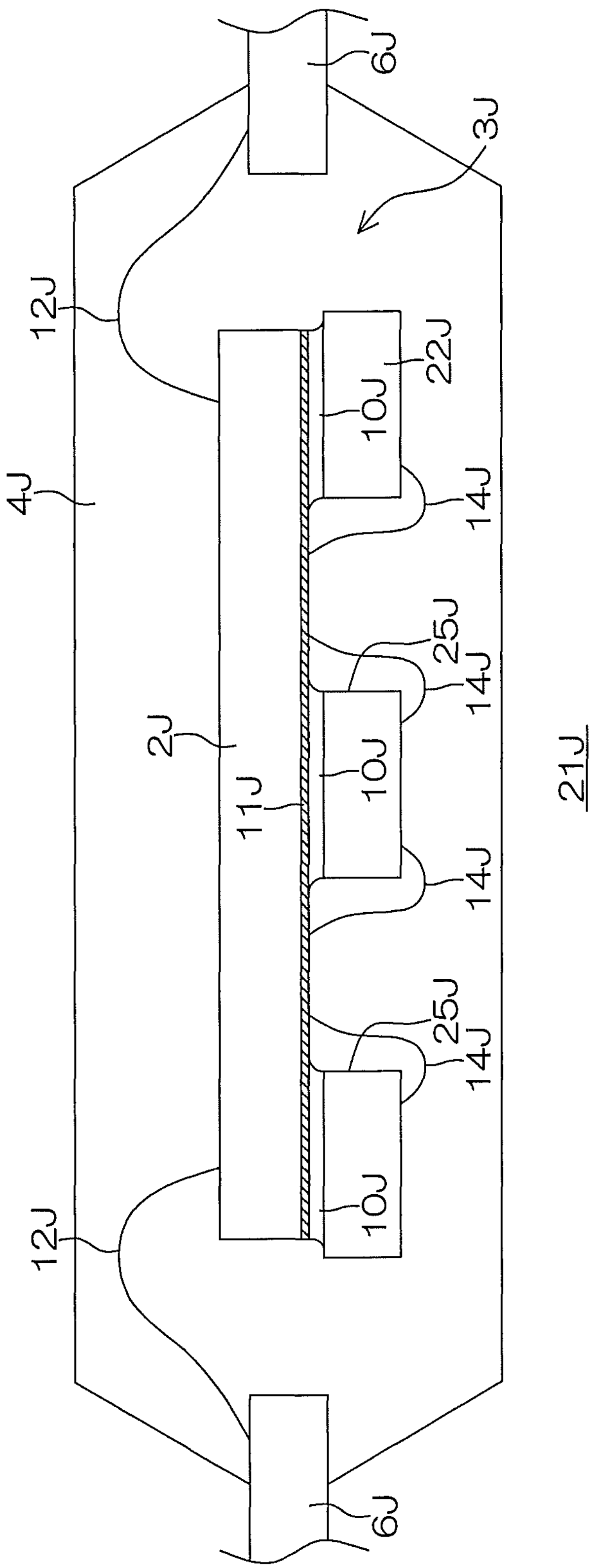
Figure 93:
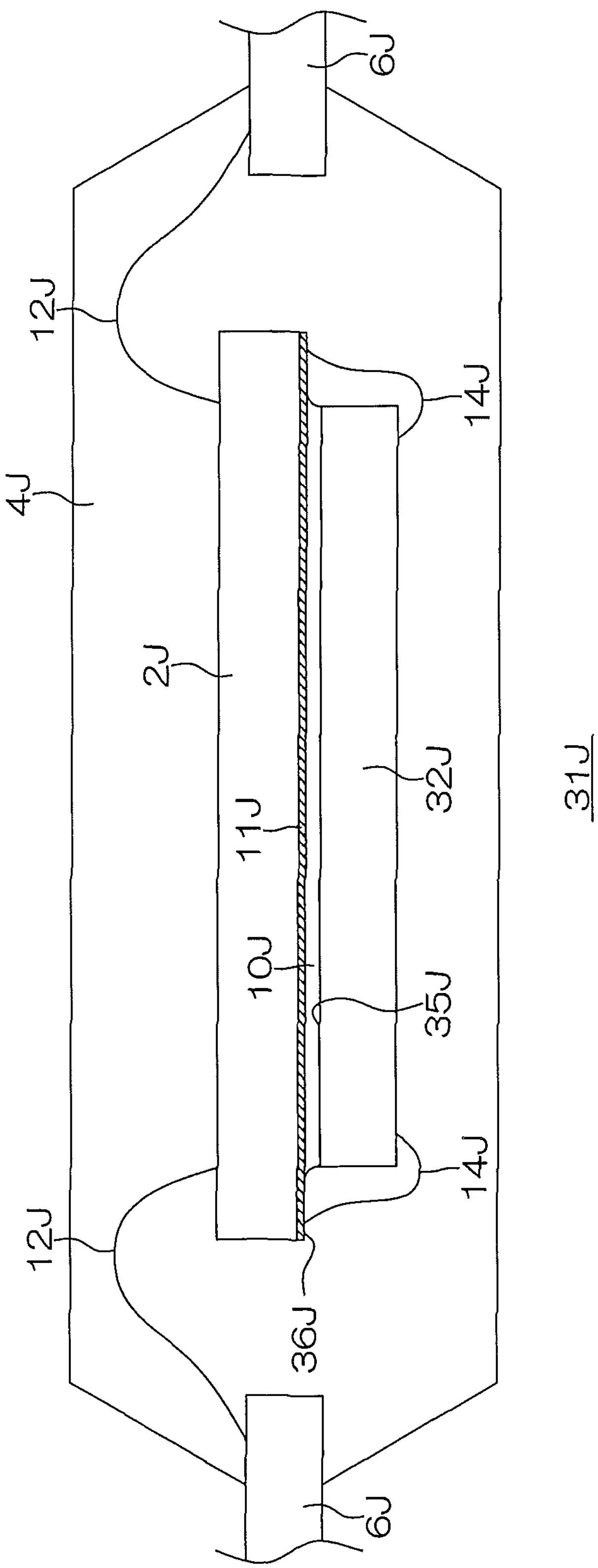
Figure 94:
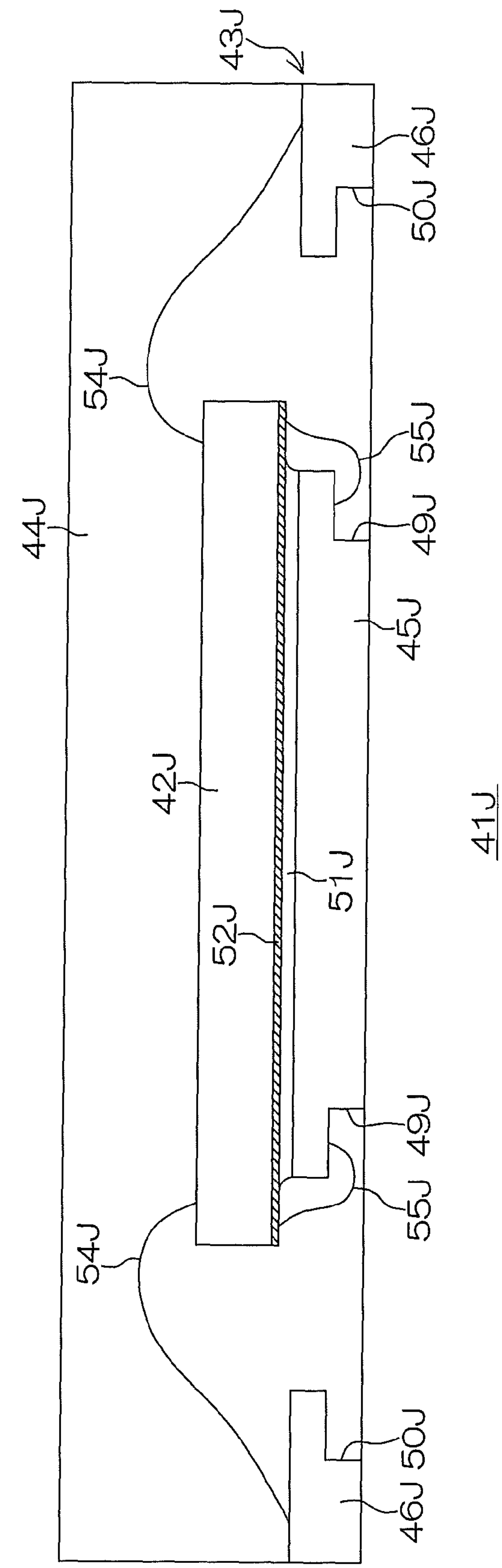

FIG. 89 is a schematic sectional view of a third modification example of the semiconductor device shown in FIG. 83. FIG. 90 is a schematic plan view of the semiconductor device shown in FIG. 89 as viewed from a rear surface side and shows a state where illustration of a resin package is omitted.

The semiconductor device 41J is a so-called surface mounted type semiconductor device with which rear surfaces of an island and leads are exposed from a rear surface of a resin package. The semiconductor device 41J has a structure in which a semiconductor chip 42J is sealed together with a lead frame 43J by a resin package 44J. An outer shape of the semiconductor device 41J is a flat, rectangular parallelepiped shape (in the present preferred embodiment, a hexahedron having a square shape in plan view).

The lead frame 43J includes an island 45J disposed at a central portion of the semiconductor device 1J and a plurality of leads 46J disposed at a periphery of the island 45J. The lead frame 43J is formed, for example, by performing a punching process and a pressing process on a copper thin plate.

The island 45J integrally includes a main body portion 47J of quadrilateral shape in plan view that has its center overlapped with a center of the resin package 44J in plan view and has four sides extending parallel to the respective sides of the resin package 44J, and suspending portions 48J of quadrilateral shape in plan view that extend from two mutually opposite sides among the four sides of the main body portion 47J to side surfaces of the resin package 44J. The main body portion 47J is formed to a smaller size than the semiconductor chip 42J in plan view. Also, end surfaces of the respective suspending portions 48J are flush with the side surfaces of the resin package 44J and are exposed at the side surfaces.

Across an entire periphery of a peripheral edge portion of a rear surface of the island 45J, a recess portion 49J with a shape such that the island 45J is dug in from its rear surface side is formed by performing a squeezing process from the rear surface side. The recess portion 49J of such a shape may be formed, for example, by selectively etching the peripheral edge portion of the island 45J from the rear surface side instead of squeezing.

Also, with the exception of the peripheral edge portion (recess portion 49J), the rear surface of the island 45J is exposed as a rear surface connection terminal at the rear surface of the resin package 44J. For example, in a case where a central portion (portion exposed from the resin package 44J) of the island 45J has a thickness of 200 μm, the peripheral edge portion of the island 45J has a thickness of 100 μm.

An equal number of the leads 46J are disposed at each of positions facing the respective side surfaces of the island 45J. At each of the positions facing the side surfaces of the island 45J, the leads 46J extend in a direction orthogonal to the facing side surface and are disposed at equal intervals in a direction parallel to the side surface.

At an end portion at the island 45J side of a rear surface of each lead 46J, a recess portion 50J with a shape such that the lead 46J is dug in from its rear surface side is formed by performing a squeezing process from the rear surface side.

With the exception of the edge portion (recess portion 50J), the rear surface of the lead 46J is exposed from the rear surface of the resin package 44J. Also, aside surface of the lead 46J opposite the island 45J side is exposed from a side surface of the resin package 44J. For example, in a case where a portion of the lead 46J that is exposed from rear surface of the resin package 44J has a thickness of 200 μm, the end portion at the island 45J side of the lead 46J (portion at which the recess portion 50J is formed) has a thickness of 100 μm.

The semiconductor chip 42J is formed to a quadrilateral shape in plan view. An alloy film 52J is coated onto the entire rear surface of the semiconductor chip 42J. The alloy film 52J has, for example, the same laminated structure as that of the alloy film 11J shown in FIG. 83.

The semiconductor chip 42J is disposed facing the island 45J so that its rear surface (alloy film 52J) faces the island 45J. In plan view, the island 45J is smaller than the semiconductor chip 42J and the rear surface (alloy film 52J) of the semiconductor chip 2J is exposed at a periphery of the island 45J.

In this state, a silver paste 51J with an insulating property is interposed between the entire upper surface of the island 45J and the rear surface of the semiconductor chip 42J. The rear surface of the semiconductor chip 42J is thereby bonded (die bonded) to the upper surface of the island 45J via the silver paste 51J.

Pads (not shown) of the same number as the leads 46J are formed on the top surface of the semiconductor chip 42J in correspondence to the respective leads 46J. One end of a top surface wire 54J made of copper is bonded to each pad. The other end of each top surface wire 54J is bonded to the upper surface of a lead 46J. The respective pads are thereby electrically connected to the leads 46J via the top surface wires 54J.

A plurality of rear surface wires 55J made of copper are installed between the semiconductor chip 42J and the island 45J. Specifically, one end portion of each rear surface wire 55J is bonded to the rear surface (alloy film 52J) of the semiconductor chip 42J that is exposed at the periphery of the island 45J. Each rear surface wire 55J loops around a side of the island 45J, extends to the rear surface side of the island 45J, and the other end thereof is directed upward so as to form an arc and is bonded to a lower surface of the main body portion 47J of the island 45J inside the recess portion 49J. The rear surface of the semiconductor chip 42J and the island 45J are thereby connected electrically by the plurality of rear surface wires 55J. Also, the other end portion of each rear surface wire 55J is formed so that a height of an apex portion (width in the thickness direction of the island 45J) thereof with respect to the lower surface of the main body portion 47J of the island 45J inside the recess portion 49J is, for example, 70 μm. Exposure of the rear surface wires 55J to the rear surface side of the semiconductor device 41J from the resin package 44J can thereby be prevented.

The same effects as those of the semiconductor device 1J shown in FIG. 83 can be obtained by the arrangement of the semiconductor device 41J as well.

Although the tenth preferred embodiment of the present invention has been described above, the tenth preferred embodiment may also be modified as follows.

For example, although each of the alloy films 11J and 52J was described having the structure where Au and Ni are laminated in that order from the semiconductor chip 2J or 42J side, a laminated film having structure where Au, Ti (titanium), and Ni are laminated in that order from the semiconductor chip 2J or 42J side may be adopted instead or a laminated film having structure where Au, Ti, Ni, and Au are laminated in that order from the semiconductor chip 2J or 42J side may be adopted instead as the alloy film 11J or 52J.

Also, although with the above-described preferred embodiment, a mode in which the surface wires 12J are covered by the water-impermeable insulating film 18J was described as an example, the water-impermeable insulating film 18J may be omitted as shown in each of FIG. 91 to FIG. 94 as long as at least the tenth object for resolving the tenth issue is achieved.

Eleventh Preferred Embodiment FIG. 95 to FIG. 105

By disclosure of an eleventh preferred embodiment, an eleventh issue concerning an eleventh background art described below can be resolved in addition to the issues described above in the "OBJECT(S) OF THE INVENTION."

(1) Eleventh Background Art

From before, reduction in usage amounts of lead in semiconductor devices has been demanded from a standpoint of environmental impact.

With a semiconductor device, lead is used in external component materials used at an exterior of the device, such as an outer plating of outer leads in an SOP (small outline package) or a QFP (quad flat package), solder balls in a BGA (ball grid array), as well as in internal component materials used in an interior of the device, such as a bonding material between a semiconductor chip and a lead frame in an interior of a package.

In regard to external component materials, lead free conditions of a lead content of no more than a certain fixed proportion have been substantially attained through research on alternative materials. In contrast, for internal component materials, there are no materials that are suited as alternatives. Thus, a metal containing lead, for example, Pb-xSn-yAg (where x and y are positive numbers), etc., is used.

(2) Eleventh Issue

In a process of evaluating metal materials of various compositions as alternative materials for internal component materials, Bi, which is low in environmental impact, came to be noted as a choice for an alternative material. Bi meets, for example, melting point and bonding properties required of a bonding material used in the interior of a device and further meets various environmental impact characteristics.

However, a thermal expansion coefficient of Bi (approximately $13.4\times10^{-6}$/° C.) is low in comparison to a thermal expansion coefficient (for example, approximately $28.5\times10^{-6}$/° C.) of a generally used Pb-xSn-yAg. Thus, when performing reflow for mounting a semiconductor device, etc., a lead frame undergoes thermal expansion and becomes warped, a stress generated in a bonding material due to the warping of the lead frame may not be relaxed sufficiently by the bonding material. In this case, the stress that could not be relaxed may be applied to a semiconductor chip to cause the semiconductor chip to warp and when an amount of the warp is large, a crack (for example, a horizontal crack, vertical crack, etc.) may occur in the semiconductor chip.

It may be possible to alleviate the warp amount of the semiconductor chip by increasing a thickness of the semiconductor chip or the lead frame. However, there is a problem in that a package main body becomes large when the thickness of the semiconductor chip or the lead frame is increased.

Also, it may be possible to alleviate the warp amount of the semiconductor chip by increasing a thickness of the bonding material. However, even if a usage amount of the bonding material is increased, the thickness of the bonding material decreases when the bonding material is pressed by a weight of the semiconductor chip. It is thus difficult to control the thickness of the bonding material to a desired thickness.

Further, a thermal conductivity (approximately 9 W/m·K) of Bi is low in comparison to a thermal conductivity (for example, approximately 35 W/m·K) of Pb-xSn-yAg. Thus, with a bonding material using Bi, a problem that heat generated by the semiconductor chip is not readily radiated arises.

Thus, an eleventh object of the present invention related to the eleventh preferred embodiment is to provide a semiconductor device with which a Bi-based material is used in a bonding material between a semiconductor chip and a lead frame to enable achievement of lead free conditions and yet a heat radiation property of the semiconductor chip can be secured while reducing a warp amount of the semiconductor chip due to thermal expansion of the lead frame.

(3) Disclosure of a Specific Preferred Embodiment

Figure 95:
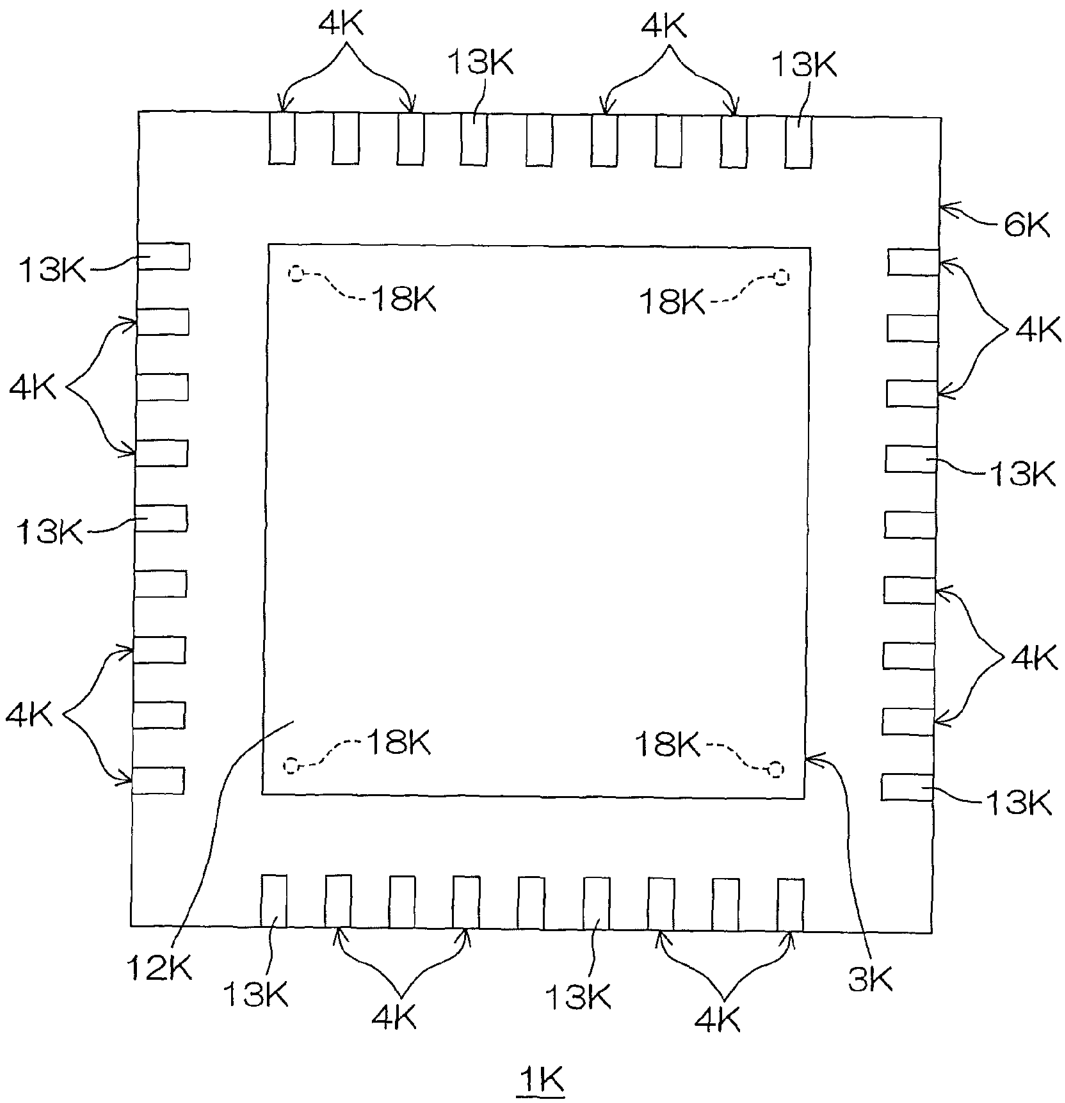
Figure 97:
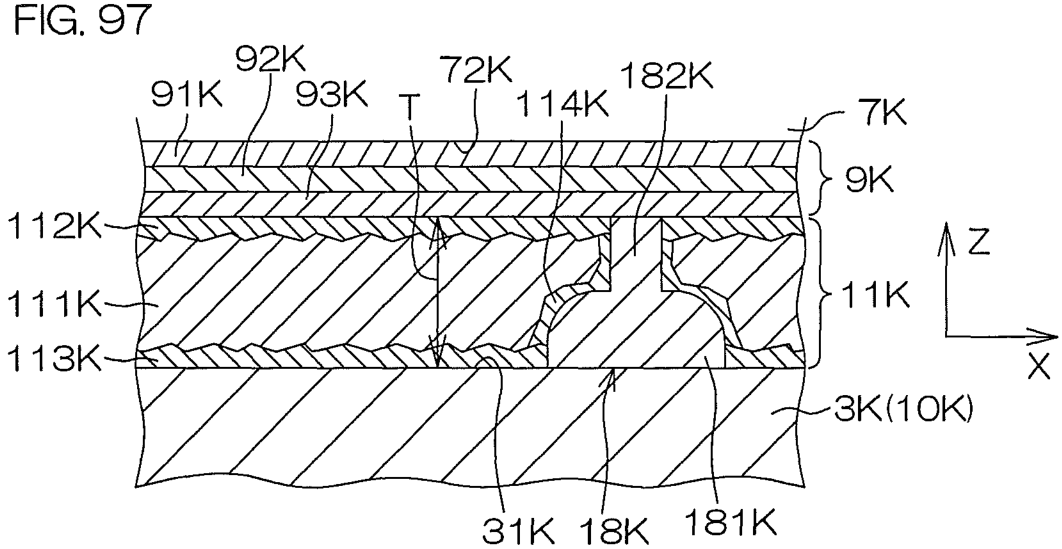

FIG. 95 is a schematic bottom view of a semiconductor device according to the eleventh preferred embodiment of the present invention. FIG. 96 is a schematic sectional view of the semiconductor device according to the eleventh preferred embodiment of the present invention. FIG. 97 is an enlarged view of principal portions of a portion surrounded by a broken-line circle in FIG. 96.

The semiconductor device 1K is a semiconductor device to which a QFN (quad flat non-leaded) configuration is applied. The semiconductor device 1K includes a semiconductor chip 2K, a die pad 3K on which the semiconductor chip 2K is mounted, a plurality of electrode leads 4K disposed at a periphery of the die pad 3K, bonding wires 5K electrically connecting the semiconductor chip 2K and the electrode leads 4K, and a resin package 6K sealing the above components.

In the following description, the present preferred embodiment shall be described with a direction in which the semiconductor chip 2K faces the die pad 3K being a Z direction and a direction orthogonal to the Z direction being an X direction.

The semiconductor chip 2K includes an Si substrate 7K of quadrilateral shape in plan view.

The Si substrate 7K has a thickness, for example, of 220 to 240 μm (preferably, approximately 230 μm). A multilayer wiring structure (not shown) arranged by laminating a plurality of wiring layers via interlayer insulating films is formed on a top surface 71K of the Si substrate 7K, and a topmost surface of the multilayer wiring structure is covered by a top surface protective film (not shown). A plurality of pad openings for exposing an uppermost wiring layer of the multilayer wiring structure are formed in the top surface protective film. A portion of the wiring layer is thereby exposed from each pad opening as an electrode pad 8K of the semiconductor chip 2K.

The uppermost wiring layer exposed as the electrode pads 8K is made, for example, of a metal material containing Al (aluminum) and is specifically made of a metal material having Al as a main component (for example, an Al—Cu alloy, etc.).

Meanwhile, a rear metal 9K is formed on a rear surface 72K (surface facing the die pad 3K) of the Si substrate 7K.

As shown in FIG. 97, the rear metal 9K has a three-layer structure in which an Au layer 91K, a Ni layer 92K, and a Cu layer 93K are laminated in that order from the Si substrate 7K side. The Au layer 91K can be put in ohmic contact enabling conduction of electricity with an Si semiconductor and contacts the rear surface 72K of the Si substrate 7K. The Ni layer 92K is formed at the Si substrate 7K side relative to the Cu layer 93K, which makes up a topmost surface of the rear metal 9K, and is a layer for preventing Si nodules, by which the Si in the Si substrate 7K precipitates at the topmost surface of the rear metal 9K.

The die pad 3K and the plurality of electrode leads 4K are formed of the same metal thin plate and are formed as a lead frame 10K. The metal thin plate making up the lead frame 10K is made of a Cu-based material that mainly contains Cu and is specifically made, for example, of a high-purity copper of no less than 99.9999% (6N) purity or no less than 99.99% (4N) purity or an alloy of Cu and a dissimilar metal (for example, a Cu—Fe—P alloy, etc.). The metal thin plate may also be made of an Fe-based material, such as 42 alloy (Fe-42% Ni). Also, the lead frame 10K (metal thin plate) has a thickness, for example, of 190 to 210 μm (preferably, approximately 200 μm).

The die pad 3K has a larger quadrilateral shape (for example, of 2.7 mm square in plan view) than the semiconductor chip 2K in plan view. A top surface 31K (surface facing the semiconductor chip 2K) of the die pad 3K is an uncovered surface that is not covered by a metal thin film by plating, sputtering, or other process and the Cu-based material that makes up lead frame 10K is exposed across the entire top surface 31K.

A plurality of Cu stud bumps 18K are provided on the top surface 31K of the die pad 31K. In plan view, one Cu stud bump 18K is disposed at each corner of the die pad 3K and a total of four thereof are provided. Each Cu stud bump 18K is formed by a known wire bonding method and has a humped shape in sectional view that integrally includes a base portion 181K of relatively large diameter that contacts the top surface 31K and a tip portion 182K of relatively small diameter that projects from the base portion 181K toward the semiconductor chip 2K side.

The semiconductor chip 2K, in a state of being supported by the Cu stud bumps 18K in a manner such that the rear metal 9K contacts the tip portions 182K of the Cu stud bumps 18K, is bonded to the die pad 3K by a bonding layer 11K being interposed between the rear surface 72K of the Si substrate 7K and the top surface 31K of the die pad 3K.

The bonding layer 11K includes a Bi-based material layer 111K as a relatively thick main layer and Cu—Sn alloy layers 112K, 113K, and 114K as relatively thin sub layers.

The Bi-based material layer 111K contains Bi as a main component and may contain Sn, Zn, etc., of amounts that do not influence physical properties of Bi as sub components.

Each of the Cu—Sn alloy layers 112K, 113K, and 114K is made of an alloy of Cu and Sn, which is a dissimilar metal differing from Cu, and contains Cu as a main component.

The Cu—Sn alloy layer 112K at the semiconductor chip 2K side is formed near and across an entire range of an interface of the bonding layer 11K with the Cu layer 93K of the rear metal 9K. The Cu—Sn alloy layer 112K thus contacts the Cu layer 93K of the rear metal 9K. The Cu—Sn alloy layer 112K has, for example, in the Z direction, a laminated structure expressed as Cu6Sn5/Cu3Sn from the Bi-based material layer 111K side toward the semiconductor chip 2K side.

Meanwhile, the Cu—Sn alloy layer 113K at the die pad 3K side is formed near and across an entire range of an interface of the bonding layer 11K with the top surface 31K of the die pad 3K. The Cu—Sn alloy layer 113K thus contacts the top surface 31K of the die pad 31K. The Cu—Sn alloy layer 113K has, for example, in the Z direction, a laminated structure expressed as Cu6Sn5/Cu3Sn from the Bi-based material layer 111K side toward the die pad 3K side.

Near the interface of the bonding layer 11K with the top surface 31K of the die pad 3K and near the interface of the bonding layer 11K with the Cu layer 93K of the rear metal 9K, the Cu—Sn alloy layers 112K and 113K may be formed across partial ranges of the respective interfaces.

The Cu—Sn alloy layer 114K is formed so as to cover the Cu stud bumps 18K.

The Bi-based material layer 111K and the Cu—Sn alloy layers 112K and 113K form, between the top surface 31K of the die pad 3K and the Cu layer 93K of the rear metal 9K, a three-layer structure (Cu—Sn alloy layer 112K/Bi-based material layer 111K/Cu—Sn alloy layer 113K) in which the Bi-based material layer 111K is sandwiched by the Cu—Sn alloy layers 112K and 113K from respective sides in Z direction.

The above-described bonding layer 11K has a melting point, for example, of 260 to 280° C. and preferably 265 to 275° C. Also, in a state where the semiconductor chip 2K and the die pad 3K are bonded, a total thickness T of the bonding layer 11K (total of a thickness of the Bi-based material layer 111K and thicknesses of the Cu—Sn alloy layers 112K and 113K) is, for example, 30.5 to 50 μm. In regard to the thicknesses of the respective layers, for example, the thickness of the Bi-based material layer 111K is 30 to 50 μm and the thickness of Cu—Sn alloy layers 112K and 113K is 0.5 to 3 μm.

A rear surface 32K (surface of mounting onto a wiring circuit board) of the die pad 3K is exposed from the resin package 6K. The exposed rear surface 32K has formed thereon a rear surface plating layer 12K made of a metal material, such as tin (Sn), tin-silver alloy (Sn—Ag).

The electrode leads 4K are disposed at the periphery of the die pad 3K with the same number thereof being disposed at both sides in respective directions orthogonal to respective side surfaces of the die pad 3K. The electrode leads 4K that face each side surface of the die pad 3K are disposed at equal intervals in a direction parallel to the facing side surface. A length of each electrode lead 4A in the direction of facing the die pad 3K is, for example, 440 to 460 μm (preferably, approximately 450 μm). Atop surface 41K (surface to which the bonding wire 5K is connected) of each electrode lead 4K is an uncovered surface that is not covered by a metal thin film by plating, sputtering, or other process and the Cu-based material that makes up lead frame 10K is exposed across the entire top surface 41K.

Meanwhile, a rear surface 42K (surface of mounting onto a wiring circuit board) of each electrode lead 4K is exposed from the resin package 6K. A rear surface plating layer 13K made, for example, of a metal material, such as tin (Sn), tin-silver alloy (Sn—Ag), is formed on the exposed rear surface 42K.

Each bonding wire 5K is made of copper (for example, a high-purity copper of no less than 99.9999% (6N) purity or no less than 99.99% (4N) purity that may contain a minute amount of impurity). Each bonding wire 5K connects a single electrode pad 8K and a single electrode lead 4K in a one-to-one manner.

As in the first preferred embodiment, in the semiconductor device 1K, the entire top surface and side surfaces of the semiconductor chip 2K, the entire top surface 31K and side surfaces of the die pad 3K, the entire top surfaces 41K and side surfaces inside the resin package 6K of the electrode leads 4K, and the entire bonding wires 5K are covered by an integral water-impermeable insulating film 25K.

As the resin package 6K, a known material, such as an epoxy resin, may be applied. The resin package 6K makes up an outer shape of the semiconductor device 1K and is formed to a substantially rectangular parallelepiped shape. In terms of size, the resin package 6K has a planar size, for example, of approximately 4 mm square and a thickness, for example, of 0.80 to 0.90 mm and preferably, approximately 0.85 mm.

FIG. 98A to FIG. 98D are schematic sectional views for describing a method for manufacturing the semiconductor device shown in FIG. 2 in order of process.

To manufacture the semiconductor device 1K, the rear metal 9K is formed by successively laminating the Au layer 91K, the Ni layer 92K, and the Cu layer 93K on the rear surface 72K of the Si substrate 7K of the semiconductor chip 2K by a plating method, sputter method, etc., for example, as shown in FIG. 98A.

Meanwhile, as shown in FIG. 98A, the lead frame 10K that includes a plurality of units each integrally having a die pad 3K and electrode leads 4F is prepared. In FIG. 98A to FIG. 98E, an entire view of the lead frame 10K is abbreviated and the die pad 3K and electrode leads 4K of just a single unit necessary for mounting a single semiconductor chip 2K are shown.

Next, as shown in FIG. 98B, the plurality of Cu stud bumps 18K are formed on the top surface 31K of the die pad 3K by a known wire bonding method. In succession, the bonding paste 14K made of the Bi-based material that contains Sn is coated onto the top surface 31K of the die pad 3K.

An Sn content of the bonding paste 14K is, for example, preferably an amount such that the entire amount diffuses among the Cu in the Cu layer 93K of the rear metal 9K and the top surface 31K of the die pad 3K and is, for example, no more than 4 wt %, preferably, 1 to 3 wt %, and more preferably, 1.5 to 2.5 wt %.

After coating of the bonding paste 14K, the bonding paste 14K is sandwiched by the semiconductor chip 2K and the die pad 3K so that the Cu layer 93K of the rear metal 9K contacts the tip portions 182K of the Cu stud bumps 18K and the bonding paste 14K as shown in FIG. 98C. In succession, reflow (heat treatment) is executed, for example, at 250 to 260° C.

The Sn in the bonding paste 14K is thereby made to react respectively with the Cu in the Cu layer 93K of the rear metal 9K, the Cu in the top surface 31K of the die pad 3K, and the Cu in the Cu stud bumps 18K to form the Cu—Sn alloy layers 112K and 113K near the Cu layer 93K and the top surface 31K as shown in FIG. 98D. Also, the Cu stud bumps 18K are covered by the Cu—Sn alloy layer 114K. Meanwhile, the Bi in the bonding paste 14K hardly reacts with Cu and thus remains as the Bi-based material layer 111K sandwiched between the Cu—Sn alloy layers 112K and 113K.

Thereafter, the respective electrode pads 8K of all semiconductor chips 2K and the electrode leads 4K corresponding to the respective electrode pads 8K are connected by the bonding wires 5K.

After all of the wire bonding ends, the water-impermeable insulating film 25K is formed by the same method as that of FIG. 4D. After the forming of the water-impermeable insulating film 25K, the lead frame 10K is set in a forming mold and all semiconductor chips 2K are sealed in a batch together with the lead frame 10K by the resin package 6K. Rear surface plating layers 12K and 13K are then formed on the rear surfaces 32K of the die pads 3K and the rear surfaces 42K of the electrode leads 4K that are exposed from the resin package 6K. Lastly, a dicing saw is used to cut the lead frame 10K together with the resin package 6K to sizes of the respective semiconductor devices 1K and the individual semiconductor devices 1K one of which is shown in FIG. 96 are thereby obtained.

As described above, with the semiconductor device 1K, the Si substrate 7K is supported by the Cu stud bumps 18K and thus a distance between the die pad 3K and the semiconductor chip 2K can be maintained at least at the height of the Cu stud bumps 18K. Thus, by suitable adjustment of the height of the stud bumps 18K, the bonding layer 11K having the total thickness T can be interposed between the die pad 3K and the semiconductor chip 2K. Consequently, stress due to differences in the linear expansion coefficients among the Si substrate 7K, the bonding layer 11K, and the lead frame 10K can be relaxed adequately. A warping amount of the Si substrate 7K (semiconductor chip 2K) can thus be reduced. Also, occurrence of crack in the Si substrate 7K can be prevented. Also, there is no need to make the thicknesses of the Si substrate 7K and the lead frame 10K large and thus a package main body of the semiconductor device 1K does not become large.

Further, a thermal conductive property between the lead frame 10K and the Si substrate 7K can be improved because the Cu stud bumps 18K make up a spacer that supports the Si substrate 7K and thermal conductivity (approximately 398 W/m·K) of Cu is extremely large in comparison to thermal conductivity (approximately 9 W/m·K) of Bi. Heat generated at the semiconductor chip 2K can thus be released to the lead frame 10K via the Cu stud bumps 18K. An adequate heat radiation property can thus be secured for the semiconductor chip 2K.

Also, four Cu stud bumps 18K are provided and the Si substrate 7K can thus be supported at four points. The semiconductor chip 2K can thus be stabilized on the Cu stud bumps 18K so as not to tilt with respect to the top surface 31K of the die pad 3K. A distance between the lead frame 10K and the semiconductor chip 2K can thus be made substantially uniform in magnitude. Consequently, the bonding layer 11K is made uniform in linear expansion coefficient in the Z direction so that biasing of stress in the bonding layer 11K can be suppressed and stress can be relaxed as a whole. Also, the heat generated at the semiconductor chip 2K can be released using the four Cu stud bumps 18K and the heat radiation property of the semiconductor chip 2K can thus be improved further.

Also, when the lead frame 10K undergoes thermal expansion, the heat of the lead frame 10K is transmitted to the Si substrate 7K via the Cu stud bumps 18K. Thus, during reflow performed in mounting of the semiconductor device 1K, the Si substrate 7K can be made to undergo thermal expansion by the heat transmitted from the lead frame 10K. Consequently, a difference between a thermal expansion amount of the lead frame 10K and a thermal expansion amount of the Si substrate 7K can be made small and the Si substrate 7K can thus be reduced in warp amount.

Also, as the material of a lead frame, for example, an Fe-based material, such as 42 alloy (Fe-42% Ni), is known besides Cu of the lead frame 10K. A thermal expansion coefficient of 42 alloy is approximately 4.4 to $7.0\times10^{-6}/°$ C. With a lead frame made from 42 alloy, the thermal expansion amount is less than the lead frame 10K made of Cu (with a thermal expansion coefficient of approximately $16.7\times10^{-6}/°$ C.) and a warp amount of the lead frame can thereby be made small. However, in a case where 42 alloy is used, the cost is higher and the heat radiation property decreases in comparison to a case where Cu is used.

In contrast, with the semiconductor device 1K, the stress due to warping of the lead frame 10K can be relaxed adequately by the bonding layer 11K even in the case of the lead frame 10K made of Cu. Cu can thus be used without any problem as the material of the lead frame 10K to maintain the cost and the heat radiation property.

Also, in the manufacturing process described above, the bonding paste 14K coated onto the top surface 31K of the die pad 3K is sandwiched by the semiconductor chip 2K and the die pad 3K so as to contact the Cu layer 93K of the rear metal 9K. Thereafter, the bonding layer 11K, having the Bi-based material layer 111K and the Cu—Sn alloy layers 112K, 113K, and 114K, is formed by execution of reflow (heat treatment).

In forming the bonding layer 11K, the components (Bi-based material and Sn) in the bonding paste 14K do not come in contact with metal elements other than Cu and further, the Cu—Sn alloy layers 112K and 113K are formed at respective sides of the Bi-based material layer 111K in the directions of facing the semiconductor chip 2K and the die pad 3K.

Diffusion of an inhibitory metal element, such as the Au in the Au layer 91K of the rear metal 9K, the Ni in the Ni layer 92K, that may degrade the characteristics of the Bi-based material layer 111K, into the Bi-based material layer 111K can thus be prevented. Consequently, forming of an intermetallic compound of Bi and an abovementioned inhibitory metal element or forming of a eutectic composition of Bi and an abovementioned inhibitory metal element can be prevented. A temperature cycle resistance of the bonding layer 11K can thus be improved and a melting point of the bonding layer 11K can be maintained at a high level.

Meanwhile, although the Bi-based material layer 111K contacts the Cu—Sn alloy layers 112K, 113K, and 114K, Cu hardly reacts with Bi and there is hardly any possibility of lowering of the melting point and degradation of the temperature cycle resistance of the bonding layer 11K due to mutual contact of these layers. Also, the contact of the Si substrate 7K and the Cu stud bumps 18K is contact of the same metal species of the Cu layer 93K and the Cu stud bumps 18K, and influences (for example, increased resistance of the Cu stud bumps 18K, erosion of the Cu stud bumps 18K, etc.) due to contact of the Si substrate 7K and the Cu stud bumps 18K can be reduced.

Also, the making of the bonding layer 111K lead free can be achieved because the bonding layer 11K is made of the Bi-based material layer 111K and the Cu—Sn alloy layers 112K, 113K, and 114K.

Also, the Cu—Sn alloy is not a hard, brittle metal such as a Bi—Au alloy, Bi—Ag alloy, but is a high-strength metal. The semiconductor chip 2K and the lead frame 10K can thus be improved in strength of bonding with the bonding layer 11K by the Cu—Sn alloy layers 12K and 113K.

Also, the thermal conductivity of Sn is approximately 73 W/m·K and high in comparison to the thermal conductivity of Bi (approximately 90 W/m·K). The thermal conductivity of the bonding layer 11K can thus be improved in comparison to a case where the bonding layer 11K is made of only Bi. Consequently, the heat radiation property of the semiconductor chip 2K can be improved further.

Also, the Au layer 91K is in contact with the rear surface 72K of the Si substrate 7K and the Cu layer 93K and the Si substrate 7K can thus be made electrically continuous via the Au layer 91K. The Si substrate 7K and the die pad 3K can thereby be connected electrically.

Also, both the top surface 31K of the die pad 3K and the top surfaces 41K of the electrode leads 4K are uncovered surfaces that are not covered by a metal thin film by plating, sputtering, or other process, and thus there is no need to perform plating, sputtering or other process on the lead frame 10K in manufacturing the semiconductor device 1K and the cost can thus be reduced.

Although the eleventh preferred embodiment of the present invention has been described above, the eleventh preferred embodiment may also be modified as follows.

For example, although a QFN type semiconductor device was taken up in the preferred embodiment, the present invention may also be applied to semiconductor devices of other package types, such as the QFP (quad flat package), SOP (small outline package).

Also, the number of Cu stud bumps 18K may be one to three or may be no less than five. A larger number of stud bumps enables the usage amount of the bonding paste 14K to be reduced further, thereby enabling reduction in cost and further improvement in the heat radiation property.

Also, for example, the Cu spacer that supports the Si substrate 7K may be Cu wirings 19K, each being formed by forming a ball bond (first bond) of a Cu wire on the top surface 31K of the die pad 3K by a wire bonding method, then leading the Cu wire to form a ring, bonding the side opposite the ball bond to the top surface 31K (second bond), and breaking the Cu wire from the position of the second bond.

Also, for example, the sub layers of the bonding layer 11K do not have to be the Cu—Sn alloy layers 112K, 113K, and 114K and may, for example, be Cu—Zn alloy layers made of an alloy of Cu and Zn (with a thermal conductivity of 120 W/m·K), which is a dissimilar metal that differs from Cu, and containing Cu as a main component.

Also, for example, the top surface of the lead frame 10K (the top surface 31K of the die pad 3K and the top surfaces 41K of the electrode leads 4K) do not need to be uncovered surfaces and a cover layer 15K may be formed by a plating or sputtering process as shown in FIG. 100.

In this case, the Cu must be exposed at the topmost surface of the lead frame 10K as at the rear surface 72K of the Si substrate 7K.

For example, on the top surface 31K of the die pad 3K, the cover layer 15K has a two-layer structure in which an Ag layer 16K and a Cu layer 17K are laminated successively from the die pad 3K side as shown in FIG. 101A. By laminating the Cu layer 17K above the Ag layer 16K, Cu can be exposed over the entire surface (top surface 31K) of the lead frame 10K facing the semiconductor chip 2K.

Meanwhile, on the top surfaces 41K of the electrode leads 4K, the cover layer 15K has a single-layer structure with which only an Ag layer 16K is formed as shown in FIG. 101B. Ag can thereby be exposed over the entire surfaces of connection with the bonding wires 5K. Thus, not only Cu wires but Au wires and other various wires may be used as the bonding wires 5K to be connected to the electrode leads 4K.

Also, although the rear metal 9K was described as having the three-layer structure in which one layer each of the Au layer 91K, the Ni layer 92K, and the Cu layer 93K are laminated, it is not limited thereto, and at least one type among the above layers may be laminated in plurality. In this case, the plurality of layers may be laminated continuously or a layer of another type may be interposed between the plurality of layers.

Also, the rear metal 9K may include layers differing from an Au layer, Ni layer, or Cu layer. For example, an Ag layer or a Ti layer may be included. A Ti layer can be put in ohmic contact with a Si semiconductor and may thus be applied in place of the Au layer 91K.

Also, for example, the rear metal 19K and the tip portions 182K of the Cu stud bumps 18K may be separated as shown in FIG. 102. In this case, the total thickness of the bonding layer 11K is greater than the height of the Cu stud bumps 18K in the state where the semiconductor chip 2K and the die pad 3K are bonded. The linear expansion of the bonding layer 11K in the Z direction can thus be increased and the linear expansion of the bonding layer 11K in the X direction can be suppressed. The stress applied to the semiconductor chip 2K can thus be relaxed effectively.

Also, although with the above-described preferred embodiment, a mode in which the bonding wires 5K are covered by the water-impermeable insulating film 25K was described as an example, the water-impermeable insulating film 25K may be omitted as shown in each of FIGS. 103 to 105 as long as at least the eleventh object for resolving the eleventh issue is achieved.

Twelfth Preferred Embodiment FIG. 106 to FIG. 156

By disclosure of a twelfth preferred embodiment, a twelfth issue concerning a twelfth background art described below can be resolved in addition to the issues described above in the "OBJECT(S) OF THE INVENTION."

(1) Twelfth Background Art

In a typical semiconductor device, a semiconductor chip is disposed on a die pad and the semiconductor chip is connected by wires made of Au (gold) to leads disposed at a periphery of the die pad. Specifically, pads made of Al (aluminum) are disposed on a top surface of the semiconductor chip. The wires made of Au are installed so as to form arch-shaped loops between top surfaces of the pads and top surfaces of the leads.

In installing each wire (in wire bonding), an FAB (free air ball) is formed on a tip of a wire held by a capillary of a wire bonder and the FAB is put in contact with a top surface of a pad. In this process, the FAB is pressed toward the pad at a predetermined load by the capillary and a predetermined drive current is supplied to an ultrasonic transducer provided in the capillary to apply ultrasonic vibration to the FAB. Consequently, the FAB is pressed while being rubbed against the top surface of the pad and bonding of the wire to the top surface of the pad is achieved. Thereafter, the capillary is moved toward a lead. The wire is then pressed against a top surface of the lead and the wire is broken while an ultrasonic vibration is applied to the wire. The wire is thereby installed between the top surface of the pad and the top surface of the lead.

(2) Twelfth Issue

Recently, price competition of semiconductor devices in the market is becoming severe and further reductions in costs of semiconductor devices are being demanded. As one cost reduction measure, use of wires (copper wires) made of inexpensive Cu (copper) as an alternative to wires (gold wires) made of expensive Au is being examined.

However, an FAB formed on a tip of a copper wire is harder than an FAB formed on a tip of a gold wire, and thus if a copper wire is bonded to a pad under the same conditions (magnitudes of load and ultrasonic transducer drive current, etc.) as those for a gold wire, satisfactory bonding of the copper wire and the pad cannot be obtained. Presently, conditions that enable satisfactory bonding of a copper wire and a pad to be achieved are not clear and replacement of gold wires by copper wires is yet to take place.

Thus, a twelfth object of the present invention related to the twelfth preferred embodiment is to provide a wire bonding method that enables satisfactory bonding of a copper wire to a pad to be achieved.

(3) Disclosure of a Specific Preferred Embodiment

FIG. 106 is a schematic sectional view of a semiconductor device according to the twelfth preferred embodiment of the present invention. FIG. 107 is a schematic bottom view of the semiconductor device shown in FIG. 106.

The semiconductor device 1L is a semiconductor device to which a QFN (quad flat non-leaded package) configuration is applied and has a structure in which a semiconductor chip 2L is sealed together with a die pad 3L, leads 4L, and copper wires 5L by a resin package 6L. An outer shape of the semiconductor device 1L (resin package 6L) is a flat, rectangular parallelepiped shape.

In the present preferred embodiment, the outer shape of the semiconductor device 1L is a hexahedron having a square shape of 4 mm square as a planar shape and a thickness of 0.85 mm, and dimensions of respective portions of the semiconductor device 1L cited below make up an example in the case where the semiconductor device 1L has the above outer dimensions.

The semiconductor chip 2L has a square shape of 2.3 mm in plan view. The semiconductor chip 2L has a thickness of 0.23 mm. A plurality of pads 7L are disposed at peripheral edge portions of a top surface of the semiconductor chip 2L. Each pad 7L is electrically connected to a circuit built into the semiconductor chip 2L. A rear metal 8L made of a metal layer of Au, Ni (nickel), Ag (silver), etc., is formed on a rear surface of the semiconductor chip 2L.

The die pad 3L and the leads 4L are formed by punching out a metal thin plate (for example, a copper thin plate). The metal thin plate (die pad 3 or lead 4L) has a thickness of 0.2 mm. A plating layer 9L made of Ag is formed on top surfaces of the die pad 3L and leads 4L.

The die pad 3L has a square shape of 2.7 mm in plan view and is disposed at a central portion of the semiconductor device 1L so that its respective side surfaces are parallel to side surfaces of the semiconductor device 1L.

A recess with a substantially quarter-elliptical shape in cross section is formed by performing a squeezing process from the rear surface side across an entire periphery of a peripheral edge portion of the rear surface of the die pad 3L. The resin package 6L enters the recess. The peripheral edge portion of the die pad 3L is thereby sandwiched from above and below by the resin package 6L and prevention of fall-off (retaining) of the die pad 3L with respect to the resin package 6L is thereby achieved.

Also, with the exception of the peripheral edge portion (portion recessed to the substantially quarter-elliptical shape in cross section), the rear surface of the die pad 3L is exposed from a rear surface of the resin package 6L.

An equal number of (for example, nine) leads 4L are disposed at each of positions facing the respective side surfaces of the die pad 3L. At each of the positions facing the side surfaces of the die pad 3L, the leads 4L extend in a direction orthogonal to the facing side surface and are disposed at equal intervals in a direction parallel to the side surface. A longitudinal direction length of each lead 4L is 0.45 mm. Also, an interval between the die pad 3L and the lead 4L is 0.2 mm.

A recess with a substantially quarter-elliptical shape in cross section is formed by performing a squeezing process from the rear surface side at a die pad 3L side end portion of the rear surface of each lead 4L. The resin package 6L enters the recess. The die pad 3L side end portion of the lead 4L is thereby sandwiched from above and below by the resin package 6L and prevention of fall-off (retaining) of the lead 4L with respect to the resin package 6L is thereby achieved.

With the exception of the die pad 3L side end portion (portion recessed to the substantially quarter-elliptical shape in cross section), the rear surface of each lead 4L is exposed from a rear surface of the resin package 6L. Also, a side surface of the lead 4L facing the die pad 3L side is exposed from a side surface of the resin package 6L.

A plating layer 10L formed of solder is formed on portions of the rear surfaces of the die pad 3L and leads 4L that are exposed from the resin package 6L.

With its top surface with the pads 7L disposed thereon facing upward, the semiconductor chip 2L has its rear surface bonded via a bonding material 11L to the top surface (plating layer 10L) of the die pad 3L. For example, a solder paste is used as the bonding material 11L. The bonding material 11L has a thickness of 0.02 mm.

In a case where electrical connection of the semiconductor chip 2L and the die pad 3L is unnecessary, the rear metal 8L may be omitted and the rear surface of the semiconductor chip 2L may be bonded to the top surface of the die pad 3L via a bonding material made of silver paste or other insulating paste. In this case, the planar size of the semiconductor chip 2L is 2.3 mm square. Also, the plating layer 9L on the top surface of the die pad 3L may be omitted.

The copper wires 5L are made, for example, of copper with a purity of no less than 99.99%. One end of each copper wire 5L is bonded to a pad 7L of the semiconductor chip 2L. The other end of the copper wire 5L is bonded to the top surface of a lead 4L. The copper wire 5L is installed so as to form an arch-shaped loop between the semiconductor chip 2L and the lead 4L. A height difference between an apex portion of the loop of the copper wire 5L and the top surface of the semiconductor chip 2L is 0.16 mm.

As in the first preferred embodiment, in the semiconductor device 1L, the entire top surface and side surfaces of the semiconductor chip 2L, the entire top surface and side surfaces of the die pad 3L, entire top surfaces of the leads 4L, and the entire copper wires 5L are covered by an integral water-impermeable insulating film 25L.

FIG. 108 is an enlarged view of a portion surrounded by broken lines shown in FIG. 106.

Each pad 7L is made of a metal that contains Al and is formed on an uppermost interlayer insulating film 12L of the semiconductor chip 2L. A top surface protective film 13L is formed on the interlayer insulating film 12L. The pad 7L has its peripheral edge portion covered by the top surface protective film 13L and its central portion is exposed via a pad opening 14L formed in the top surface protective film 13L.

The copper wire 5L is bonded to the central portion of the pad 7L exposed from the top surface protective film 13L. As shall be described below, the copper wire 5L has an FAB formed at its tip and the FAB is pressed against and thereby bonded to the pad 7L. In this process, the FAB deforms to form a first ball portion 15L with a stepped disk shape at the portion of bonding of the copper wire 5L with the pad 7L. Also, at a periphery of the first ball portion 15L, the material of the pad 7L juts out gradually from below the first ball portion 15L so as to form a jutting portion 16L without it being lifted greatly from the top surface of the pad 7L.

For example, in a case where the copper wire 5L has a wire diameter of 25 μm, an intended diameter of the first ball portion 15L (designed diameter of the first ball portion 15L) is 74 to 76 μm and an intended thickness of the first ball portion 15L (designed thickness of the first ball portion 15L) is 17 to 18 μm.

FIG. 109A to FIG. 109D are schematic sectional views of states in a middle of manufacture (middle of wire bonding) of the semiconductor device shown in FIG. 106.

The copper wires 5L are installed across the semiconductor chip 2L and the leads 4L by a wire bonder in a state where the die pad 3L and the leads 4L are connected to a frame (not shown) that surrounds these components, that is, in a state where the die pad 3L and leads 4L make up a lead frame.

The wire bonder includes a capillary C. As shown in FIG. 109A, the capillary C has a substantially cylindrical shape with a wire insertion hole 41L formed along a central axis. The copper wire 5L is inserted through the wire insertion hole 41L and fed out from a tip (lower end) of the wire insertion hole 41L.

A chamfer 42L of truncated conical shape that is in communication with the wire insertion hole 41L is formed below the wire insertion hole 41L at a tip portion of the capillary C. Also, the tip portion of the capillary C has a face 43L that is continuous with a lower end edge of the chamfer 42L and is a surface that faces a pad 7L and a lead 4L during bonding (during wire bonding) of the copper wire 5L to these components. An outer side of the face 43L is gradually inclined upwardly with respect to a plane orthogonal to the central axis of the capillary C.

First, as shown in FIG. 109A, the capillary C is moved to a position directly above the pad 7L. Next, in a state where a tip of the copper wire 5L is positioned at the chamfer 42L, a current is applied to a tip portion of the copper wire 5L and an FAB 44 is thereby formed at the tip portion. The value and application time of the current are set suitably in accordance with the wire diameter of the copper wire 5L and an intended diameter of the FAB 44 (designed diameter of the FAB 44). A portion of the FAB 44 protrudes below the chamfer 42L.

Thereafter, as shown in FIG. 109B, the capillary C is lowered toward the pad 7L and the FAB 44 is pressed against the pad 7L by the capillary C. In this process, a load is applied to the FAB 44 by the capillary C and ultrasonic vibration, emitted from an ultrasonic transducer (not shown) provided in the capillary C, is applied to the FAB 44.

FIG. 110 is a graph of changes with time of the load applied to the FAB and a driving current applied to the ultrasonic transducer during the bonding of the FAB to the pad.

Specifically, as shown in FIG. 110, a relatively large initial load P1 is applied from the capillary C to the FAB 44 from a time T1 at which the FAB 44 contacts the pad 7L to a time T2 after elapse of a predetermined time period. The predetermined time period is set to 3 msec. Also, the initial load P1 is set based on a value obtained by multiplying an intended bonding area of the first ball portion 15L with respect to the pad 7L (designed bonding area of the first ball portion 15L with respect to the pad 7L) by a fixed factor (for example, 28786 in a case where the unit of the initial load P1 is g and the unit of the bonding area is $mm^2$). From the time T2 onward, the load applied to the FAB 44 from the capillary C is lowered and a relatively small load P2 is applied to the FAB 44. The load P2 is applied continuously until a time T4 at which the capillary C is raised.

Meanwhile, a drive current of a relatively small value U1 is applied to the ultrasonic transducer from before the time T1 at which the FAB 44 contacts the pad 7L. The drive current value U1 is set to less than 30 mA.

Then, from the time T1 at which the FAB 44 contacts the pad 7L to a time T3, the value of the drive current applied to the ultrasonic transducer is raised at a fixed rate of change (monotonously) from the value U1 to a relatively large value U2. The rate of change is set to no more than 21 mA/msec. Also, the value U2 of the drive current that is applied to the ultrasonic transducer in a final stage is set so that a value obtained by dividing the value U2 by the intended bonding area of the first ball portion 15L is no more than 0.0197 mA/$\mu m^2$. Further, the drive current values U1 and U2 are set so that an integrated value of the drive current applied to the ultrasonic transducer during the predetermined time period in which the initial load is applied to the FAB 44 is no more than 146 mA·msec. From the time T3 onward until the time T4, the drive current of the value U2 continues to be applied to the ultrasonic transducer.

Consequently, the FAB 44 deforms along the shapes of the chamfer 42L and the face 43L of the capillary C, and the first ball portion 15L with a stepped disk shape is formed on the pad 7L with the jutting portion 16L being formed along its periphery as shown in FIG. 108. Bonding (first bonding) of the copper wire 5L with the pad 7L is thereby achieved.

When the time T4 arrives upon elapse of a bonding time determined in advance from the time T1, the capillary C separates upwardly from the pad 7L. Thereafter, the capillary C is moved obliquely downward toward the top surface of the lead 4L. Then, as shown in FIG. 109C, the drive current is applied to the ultrasonic transducer, and while ultrasonic vibration is being applied to the capillary C, the copper wire 5L is pressed against the top surface of the lead 4L by the capillary C and then broken. A stitch portion with a wedge shape in side view that is made up of the other end portion of the copper wire 5L is thereby formed on the top surface of the lead 4L and the bonding (second bonding) of the copper wire with respect to the lead 4L is thereby achieved.

Thereafter, the processes shown in FIG. 109A to FIG. 109C are performed on another pad 7L and the corresponding lead 4L. By the processes shown in FIG. 109A to FIG. 109C then being repeated, copper wires 5L are installed across all pads 7L of the semiconductor chip 2L and the leads 4L as shown in FIG. 109D. After the end of all of the wire bonding, the water-impermeable insulating film 25L is formed by the same method as that of FIG. 4D.

<Relationship Between Bonding Area and Initial Load>

FIG. 111 is a graph of a relationship between the area of bonding of a first ball portion to a pad and the initial load.

The following tests 1 to 4 were performed to examine relationships between the area of bonding of a first ball portion 15L to a pad 7L and the initial load.

(1) Test 1

A 45 μm FAB 44 was formed at a tip of a copper wire 5L of 25 μm wire diameter, a capillary C was lowered toward a pad 7L, and the FAB 44 was pressed against the pad 7L to form a first ball portion 15L on the pad 7L by deformation of the FAB 44. The magnitude of the load applied to the FAB 44 after contacting of the FAB 44 with the pad 7L was changed variously. The intended diameter of the first ball portion 15L was 58 μm and the intended area of bonding of the first ball portion to the pad was 0.00264 $mm^2$.

The load at which a first ball portion 15L close to the intended diameter and the intended bonding area was obtained was 80 g. Also, this load was divided by the bonding area that was actually obtained to determine a load per unit area (unit area load) necessary for forming the first ball portion 15L with the shape close to the intended shape, and the unit area load thus determined was 30295 g/$mm^2$.

(2) Test 2

A 59 μm FAB 44 was formed at a tip of a copper wire 5L of 25 μm wire diameter, the capillary C was lowered toward a pad 7L, and the FAB 44 was pressed against the pad 7L to form a first ball portion 15L on the pad 7L by deformation of the FAB 44. The magnitude of the load applied to the FAB 44 after contacting of the FAB 44 with the pad 7L was changed variously. The intended diameter of the first ball portion 15L was 74 μm and the intended bonding area of the first ball portion with respect to the pad was 0.0043 $mm^2$.

The load at which a first ball portion 15L close to the intended diameter and the intended bonding area was obtained was 130 g. Also, this load was divided by the bonding area that was actually obtained to determine the load per unit area (unit area load) necessary for forming the first ball portion 15L with the shape close to the intended shape, and the unit area load thus determined was 30242 g/$mm^2$.

(3) Test 3

A 59 μm FAB 44 was formed at a tip of a copper wire 5L of 30 μm wire diameter, the capillary C was lowered toward a pad 7L, and the FAB 44 was pressed against the pad 7L to form a first ball portion 15L on the pad 7L by deformation of the FAB 44. The magnitude of the load applied to the FAB 44 after contacting of the FAB 44 with the pad 7L was changed variously. The intended diameter of the first ball portion 15L was 74 μm and the intended area of bonding of the first ball portion to the pad was 0.0043 $mm^2$.

The load with which the first ball portion 15L close to the intended diameter and the intended bonding area was obtained was 130 g. Also, this load was divided by the bonding area that was actually obtained to determine the load per unit area (unit area load) necessary for forming the first ball portion 15L with the shape close to the intended shape, and the unit area load thus determined was 30242 g/mm$^2$.

(4) Test 4

An 84 μm FAB 44 was formed at a tip of a copper wire 5L of 38 μm wire diameter, the capillary C was lowered toward a pad 7L, and the FAB 44 was pressed against the pad 7L to form a first ball portion 15L on the pad 7L by deformation of the FAB 44. The magnitude of the load applied to the FAB 44 after contacting of the FAB 44 with the pad 7L was changed variously. The intended diameter of the first ball portion 15L was 104 μm and the intended area of bonding of the first ball portion to the pad was 0.00849 mm$^2$.

The load at which a first ball portion 15L close to the intended diameter and the intended bonding area was obtained was 240 g. Also, this load was divided by the bonding area that was actually obtained to determine the load per unit area (unit area load) necessary for forming the first ball portion 15L with the shape close to the intended shape, and the unit area load thus determined was 28267 g/mm$^2$.

From the results of tests 1 to 4, it was confirmed that the load per unit area (unit area load) necessary for forming the first ball portion 15L with the shape close to the intended shape was substantially the same regardless of the wire diameter of the copper wire 5L and the intended diameter and intended bonding area of the first ball portion 15L.

Also, FIG. 111 shows a plot of the values, determined as the loads at which the first ball portion 15L close to the intended diameter and the intended bonding area was obtained in the respective tests 1 to 4, as initial loads P1 on a graph area having the intended bonding area as an X axis and the initial load as a Y axis. As shown in FIG. 111, it was confirmed that there is a substantially proportional relationship between the initial load P1 and the area of bonding the first ball portion 15L to the pad 7L.

<Setting of the Predetermined Time Period>

The following tests 1 to 3 were performed to appropriately set the predetermined time period during which the initial load P1 is applied to an FAB.

(1) Test 1

An FAB 44 was formed at a tip of a copper wire 5L of 25 μm wire diameter, the capillary C was lowered toward a pad 7L, the FAB 44 was pressed against the pad 7L, and a fixed load was applied to the FAB 44 to form a first ball portion 15L on the pad 7L by deformation of the FAB 44. The intended diameter of the first ball portion 15L was 58 μm and the intended thickness thereof was 10 μm. For each of cases where the magnitude of the load applied to the FAB 44 was set to 50 g, 80 g, and 110 g, changes of the diameter and the thickness of the first ball portion 15L with time elapsed from the contacting of the FAB 44 with the pad 7L were examined. Changes with time of the diameter (ball diameter) are shown in FIG. 112, and changes with time of the thickness (ball thicknesses) are shown in FIG. 113.

(2) Test 2

An FAB 44 was formed at a tip of a copper wire 5L of 25 μm wire diameter, the capillary C was lowered toward a pad 7L, the FAB 44 was pressed against the pad 7L, and a fixed load was applied to the FAB 44 to form a first ball portion 15L on the pad 7L by deformation of the FAB 44. The intended diameter of the first ball portion 15L was 76 μm and the intended thickness thereof was 18 μm. For each of cases where the magnitude of the load applied to the FAB 44 was set to 70 g, 90 g, 110 g, 130 g, 150 g, and 200 g, changes of the diameter and the thickness of the first ball portion 15L with time elapsed from the contacting of the FAB 44 with the pad 7L were examined. Changes with time of the diameter (ball diameter) are shown in FIG. 114, and changes with time of the thickness (ball thicknesses) are shown in FIG. 115.

(3) Test 3

An FAB 44 was formed at a tip of a copper wire 5L of 38 μm wire diameter, the capillary C was lowered toward a pad 7L, the FAB 44 was pressed against the pad 7L, and a fixed load was applied to the FAB 44 to form a first ball portion 15L on the pad 7L by deformation of the FAB 44. The intended diameter of the first ball portion 15L was 104 μm and the intended thickness thereof was 25 μm. For each of cases where the magnitude of the load applied to the FAB 44 was set to 200 g, 230 g, 250 g, 300 g, 400 g, and 500 g, changes of the diameter and the thickness of the first ball portion 15L with time elapsed from the contacting of the FAB 44 with the pad 7L were examined. Changes with time of the diameter (ball diameter) are shown in FIG. 116, and changes with time of the thickness (ball thicknesses) are shown in FIG. 117.

As can be understood from reference to FIG. 112 to FIG. 117, regardless of the wire diameter of the copper wire 5L, the magnitude of the load, and the intended diameter and intended thickness of the first ball portion 15L, the deformation of the FAB 44 is not completed in less than 2 msec from contact with the pad 7L. On the other hand, it is considered that, after 4 msec from the contacting of the FAB 44 with the pad 7L, the diameter and thickness of the FAB 44 are substantially unchanged and the deformation of the FAB 44 is reliably completed. To be more detailed, it is considered that, regardless of the wire diameter of the copper wire 5L, the magnitude of the load, and the intended diameter and intended thickness of the first ball portion 15L, the changes of the diameter and thickness of the FAB 44 are ended and the deformation of the FAB 44 is completed at a point of elapse of substantially 3 msec from the contacting of the FAB 44 with the pad 7L.

It is thus considered that the predetermined time period during which the initial load P1 is applied to an FAB is appropriately in a range of 2 to 4 msec and is more appropriately 3 msec.

As described above, after the FAB 44 formed on the tip of the copper wire 5L is put in contact with a pad, a relatively large initial load P1 is applied to the FAB 44 by the capillary C. The FAB 44, which is made of Cu that is a harder metal than Au, is thereby deformed satisfactorily and thus the initial load P1 applied to the FAB 44 can be made to contribute to the bonding of the FAB 44 and the pad 7L while it is suitably attenuated by the deformation of the FAB 44.

Also, the ultrasonic transducer vibrates from before the contacting of the FAB 44 with the pad 7L. Thus, from the instant at which the FAB 44 contacts the pad 7L, the ultrasonic vibration propagates to the portion of contact of the FAB 44 and the pad 7L and the contact portion is rubbed against the pad 7L. Consequently, a state can be realized where the FAB 44 after completion of bonding (first ball portion 15L) has its central portion of surface of bonding with the pad 7L (portion at which the FAB 44 and the pad 7L first make contact) satisfactorily bonded to the pad 7L.

After the FAB 44 contacts the pad 7L, the value of the drive current applied to the ultrasonic transducer is increased gradually from the value U1 to the value U2. Meanwhile, the FAB 44 deforms in a squeezed manner and an area of the portion of contact of the FAB 44 and the pad 7L increases gradually. The ultrasonic vibration energy propagating from the ultrasonic transducer to the FAB 44 is thereby increased gradually and the area of the FAB 44 rubbed against the pad 7L increases gradually. Consequently, a state of satisfactory bonding to the pad 7L can be obtained up to a peripheral edge portion of the surface of bonding of the first ball portion 15L with the pad 7L while suppressing occurrence of crack or other damage in the pad 7L and the interlayer insulating film 12L below the pad 7L due to rapid increase of the ultrasonic vibration energy propagating to the FAB 44 below the central portion of the first ball portion 15L.

The deformation of the FAB 44 due to the pressing of the FAB 44 against the pad 7L ends when the predetermined time period elapses from the contacting of the FAB 44, made of Cu, with the pad 7L. That is, the shape of the first ball portion 15L is completed when the predetermined time period elapses from the contacting of the FAB 44, made of Cu, with the pad 7L. Thus, if the large initial load P1 continues to be applied to the FAB 44 thereafter, the ultrasonic vibration will not propagate satisfactorily to the portion of contact of the FAB 44 and the pad 7L. The load applied to the FAB 44 is thus decreased to the load P2 after the elapse of the predetermined time period from the contacting of the FAB 44 with the pad 7L. The ultrasonic vibration can thereby be made to propagate satisfactorily to the portion of contact of the FAB 44 and the pad 7L.

Thus, by the wire bonding method according to the present preferred embodiment, satisfactory bonding of the copper wire 5L to a pad 7L, that is, a state where the entire surface of bonding of the first ball portion 15L with the pad 7L is bonded satisfactorily to the pad 7L can be realized while preventing occurrence of damage in the pad 7L and the interlayer insulating film 12L below the pad 7L.

After the contacting of the FAB 44 with the pad 7L, the value of the drive current applied to the ultrasonic transducer is increased at the fixed rate of change from the value U1 to the value U2. The rate of change is set to no more than 21 mA/msec. Occurrence of damage in the pad 7L and the interlayer insulating film 12L due to rapid increase of the ultrasonic vibration energy propagating to the FAB 44 can thereby be prevented effectively.

As a method for bonding the FAB 44 to a pad 7L, continued application of a fixed load to the FAB 44 and continued application of a fixed drive current to the ultrasonic transducer after the contacting of the FAB 44 with the pad 7L may be considered. However, with this method, no matter what magnitude the load applied to the FAB 44 and value of the drive current applied to the ultrasonic transducer are set to, the FAB 44 is not adequately bonded to the pad 7L or so-called splash, in which the material of the pad 7L protrudes greatly outward in a form of a thin collar to sides of the FAB 44 (first ball portion 15L), occurs.

With the wire bonding method according to the present preferred embodiment, the occurrence of splash is prevented by the value of the drive current applied to the ultrasonic transducer from before the contacting of the FAB 44 with the pad 7L and the magnitude of the initial load being set appropriately.

That is, the value U1 of the drive current applied to the ultrasonic transducer from before the contacting of the FAB 44 with the pad 7L is set to less than 30 mA. The ultrasonic vibration energy that propagates to the FAB 44 immediately after the FAB 44 contacts the pad 7L can thereby be prevented from being excessive. Consequently, occurrence of splash and occurrence of damage in the pad 7L and the interlayer insulating film 12L below the central portion of the first ball portion 15L can be prevented satisfactorily.

Also, the initial load P1 and the bonding area of the first ball portion 15L with respect to the pad 7L are in a substantially proportional relationship regardless of the wire diameter of the copper wire 5L, and thus the magnitude of the initial load P1 is set based on a value obtained by multiplying the intended bonding area of the first ball portion 15L with respect to the pad 7L by a fixed factor. The magnitude of the initial load P1 can thus be set appropriately regardless of the wire diameter of the copper wire 5L. Consequently, satisfactory deformation of the FAB 44 can be achieved and the state where the central portion of the surface of bonding of the first ball portion 15L to the pad 7L is bonded satisfactorily to the pad 7L can be realized while satisfactorily preventing the occurrence of splash and occurrence of damage in the pad 7L and the layer below the pad 7L below the central portion of the first ball portion 15L.

The deformation of the FAB 44 is completed in substantially 3 msec from the contacting of the FAB 44 with the pad 7L regardless of the magnitude of the initial load P1 and the intended diameter and thickness of the first ball portion 15L, and thus after the elapse of 3 msec from the contacting of the FAB 44 with the pad 7L, the load applied to the FAB 44 is decreased from the initial load P1 to the load P2.

Also, the predetermined time period and the drive current values U1 and U2 are set so that the integrated value of the drive current applied to the ultrasonic transducer during the predetermined time period is no more than 146 mA·msec. Ultrasonic vibration of the appropriate energy amount is thereby made to propagate to the FAB 44 within the predetermined time period from the contacting of the FAB 44 with the pad 7L, and thus a state where satisfactory bonding to the pad 7L is achieved up to the peripheral edge portion of the surface of bonding of the first ball portion 15L with the pad 7L can be realized while preventing the occurrence of damage in the pad 7L and the interlayer insulating film 12L below the central portion of the first ball portion 15L.

The value U2 of the drive current that is applied to the ultrasonic transducer in the final stage is set so that the value obtained by dividing the value U2 by the intended bonding area of the first ball portion 15L is no more than 0.0197 mA/$\mu m^2$. The ultrasonic vibration energy that propagates to the FAB 44 after the end of deformation of the FAB 44 can thereby be prevented from being excessive and occurrence of damage in the pad 7L and the interlayer insulating film 12L below the peripheral edge portion of the first ball portion 15L can be prevented satisfactorily.

In the present preferred embodiment, the initial load P1 that is greater than the load P2 is applied for the predetermined time period from the contacting of the FAB 44 with the pad 7L. However, the load applied to the FAB 44 at the instant and immediately after the FAB 44 contacts the pad 7L is increased in an apparent manner and the same action and effect as those in the case where the initial load P1 is applied to the FAB 44 are also obtained by increasing a movement speed of the capillary C when the FAB 44 is made to approach the pad 7L and applying a fixed load to the FAB over the entire bonding time.

An FAB 44 was formed at a tip of a copper wire 5L, the capillary C was lowered toward a pad 7L at a fixed speed of 0.4 mil/msec (approximately 10.2 μm/msec) to press the FAB 44 against the pad 7L, a load of 130 g was applied as the initial load P1 to the FAB 44 for 3 msec, and thereafter, the load P2 was applied to the FAB 44 for 9 msec to form a first ball portion 15L on the pad 7L by deformation of the FAB 44. An SEM image obtained by imaging a vicinity of the first ball portion in this process by SEM (scanning electron microscope) is shown in FIG. 118.

Also, an FAB 44 was formed at a tip of a copper wire 5L, the capillary C was lowered toward a pad 7L at a fixed speed of 1.00 mil/msec (approximately 2.45 m/msec) to press the FAB 44 against the pad 7L, and a load of 45 g was applied to the FAB 44 for 12 msec from the contacting of the FAB 44 with the pad 7L to forma first ball portion 15L on the pad 7L by deformation of the FAB 44. An SEM image of the first ball portion in this process is shown in FIG. 119.

From a comparison of FIG. 118 and FIG. 119, it can be understood that the shapes of the first ball portions 15L and the shapes of the jutting portions 16L are substantially the same.

Although the twelfth preferred embodiment of the present invention has been described above, the twelfth preferred embodiment may also be modified as follows.

For example, although a QFN is applied to the semiconductor device 1L, the present invention may also be applied to the manufacture of a semiconductor device to which another type of non-leaded package, such as an SON (small outlined non-leaded package), is applied.

The present invention may also be applied to the manufacture of not only semiconductor devices to which a so-called singulation type package, with end surfaces of leads being made flush with side surfaces of a resin package, is applied but also semiconductor devices to which a lead cut type non-leaded package, with leads projecting from side surfaces of a resin package, is applied.

Further, the present invention may be applied to the manufacture of not only semiconductor devices to which a non-leaded package is applied but also semiconductor devices to which a QFP (quad flat package) or other package having outer leads formed by leads projecting from a resin package is applied.

Also, although with the above-described preferred embodiment, a mode in which the copper wires 5L are covered by the water-impermeable insulating film 25L was described as an example, the water-impermeable insulating film 25L may be omitted as shown in FIG. 120 as long as at least the twelfth object for resolving the twelfth issue is achieved.

Experiments related to the present twelfth preferred embodiment were performed. The present invention is not restricted to the examples described below.

1. Evaluation Test 1

A capillary made by Micro-Swiss was used. The capillary has the following dimensions. ACD dimension that is a diameter of a lower end edge of a chamfer is 66 μm (0.066 mm). A T dimension that is an outer diameter of a face is 178 μm (0.178 mm). A chamfer angle, which two straight lines extending along a side surface of the chamfer form in a cross section of the capillary taken along a plane that includes a central axis (see cross section shown in FIG. 109A), is 90°. A face angle FA that is an angle that the face forms with a plane orthogonal to the central axis of the capillary is 8°. An angle, which, in the cross section of the capillary taken along the plane that includes the central axis, a portion of the side surface of the capillary that extends upward beyond the upper end of the face forms with the central axis, is 20°. An upper end portion of the face is arcuate and an OR dimension that is a radius of curvature of this portion is 20 μm (0.020 mm).

The capillary was positioned at a position of 7 mil (approximately 178 μm) height from a top surface of a pad made of an Al—Cu-based alloy and an FAB of 2.33 mil (approximately 60 μm) diameter was formed on a tip of a copper wire with a wire diameter of 25 μm. The capillary was then lowered toward the pad at a speed of 0.4 mil/msec (approximately 10.2 μm/msec) to press the FAB against the pad and form a first ball portion on the pad by deformation of the FAB. The intended diameter of the first ball portion was 74 μm and the intended bonding area of the first ball portion with respect to the pad was 0.0043 $mm^2$.

Example 1

As shown in FIG. 121, for 3 msec after contacting of the FAB with the pad, an initial load of 130 g was applied to the FAB by the capillary, and at the point of elapse of the 3 msec, the load applied to the FAB was decreased to 30 g and the state of applying the load of 30 g to the FAB was maintained for 9 msec. Thereafter, the capillary was raised.

Also, from before the contacting of the FAB with the pad, a drive current of 15 mA was applied to an ultrasonic transducer provided in the capillary, and after the FAB contacted the pad, the value of the drive current applied to the ultrasonic transducer was raised in a period of 3.6 msec from 15 mA to 90 mA at a fixed rate of change (approximately 20.83 mA/msec) and the state of applying the drive current of 90 mA to the ultrasonic transducer was maintained for 8.4 msec until the capillary was raised (until 29.5 msec elapsed from the start of descent of the capillary). The integrated value of the drive current applied to the ultrasonic transducer in the period of 3 msec during which the initial load of 130 g was applied to the FAB was 138.75 mA·msec. Also, a value obtained by dividing the value of the drive current applied at the final stage to the ultrasonic transducer by a square of the intended diameter of the first ball portion was approximately 0.0164 mA/$\mu m^2$ and less than 0.0197 mA/$\mu m^2$.

Comparative Example 1

As shown in FIG. 122, for 3 msec after contacting of the FAB with the pad, an initial load of 130 g was applied to the FAB by the capillary, and at the point of elapse of the 3 msec, the load applied to the FAB was decreased to 30 g and the state of applying the load of 30 g to the FAB was maintained for 9 msec. Thereafter, the capillary was raised.

Also, before the contacting of the FAB with the pad, a drive current was not applied to the ultrasonic transducer provided in the capillary, and after the FAB contacted the pad, the value of the drive current applied to the ultrasonic transducer was raised in a period of 3.6 msec from 0 mA to 90 mA at a fixed rate of change (25 mA/msec) and the state of applying the drive current of 90 mA to the ultrasonic transducer was maintained for 8.4 msec until the capillary was raised (until 29.5 msec elapsed from the start of descent of the capillary). In this case, the integrated value of the drive current applied to the ultrasonic transducer in the period of 3 msec during which the initial load of 130 g was applied to the FAB was 112.5 mA·msec.

Comparative Example 2

As shown in FIG. 123, for 3 msec after contacting of the FAB with the pad, an initial load of 130 g was applied to the FAB by the capillary, and at the point of elapse of the 3 msec, the load applied to the FAB was decreased to 30 g and the state of applying the load of 30 g to the FAB was maintained for 9 msec. Thereafter, the capillary was raised.

Also, from before the contacting of the FAB with the pad, a drive current of 15 mA was applied to the ultrasonic transducer provided in the capillary, and at the point of elapse of 3.6 msec after the FAB contacted the pad, the value of the drive current applied to the ultrasonic transducer was raised instantaneously from 15 mA to 90 mA and the state of applying the drive current of 90 mA to the ultrasonic transducer was maintained for 8.4 msec until the capillary was raised (until 29.5 msec elapsed from the start of descent of the capillary). In this case, the drive current is not applied to the ultrasonic transducer in the period of 3 msec during which the initial load of 130 g was applied to the FAB.

Comparative Example 3

As shown in FIG. 124, for 3 msec after contacting of the FAB with the pad, an initial load of 130 g was applied to the FAB by the capillary, and at the point of elapse of the 3 msec, the load applied to the FAB was decreased to 30 g and the state of applying the load of 30 g to the FAB was maintained for 9 msec. Thereafter, the capillary was raised.

Also, before the contacting of the FAB with the pad, a drive current was not applied to the ultrasonic transducer provided in the capillary, and at the point of elapse of 3.6 msec after the FAB contacted the pad, the value of the drive current applied to the ultrasonic transducer was raised instantaneously from 0 mA to 90 mA and the state of applying the drive current of 90 mA to the ultrasonic transducer was maintained for 8.4 msec until the capillary was raised (until 29.5 msec elapsed from the start of descent of the capillary). In this case, the drive current is not applied to the ultrasonic transducer in the period of 3 msec during which the initial load of 130 g was applied to the FAB.

(1) Splash Evaluation (Appearance Evaluation)

With each of Example 1 and Comparative Examples 1 to 3, a vicinity of the first ball portion was observed using SEM. An SEM image of the vicinity of the first ball portion of Example 1 is shown in FIG. 125. SEM images of the vicinities of the first ball portions of Comparative Example 1 to 3 are respectively shown in FIG. 126 to FIG. 128.

As shown in FIG. 126 to FIG. 128, with all of Example 1 and Comparative Examples 1 to 3, it was confirmed that the material of the pad jutted out slightly to the side of the first ball portion and splash did not occur.

(2) Evaluation of Rear Side of the Ball

The first ball portions of Example 1 and Comparative Examples 1 to 3 were peeled from the pads and the surface of bonding of the first ball portion with the pad was observed using SEM. An SEM image of the bond surface of the first ball portion of Example 1 is shown in FIG. 129. SEM images of the bond surfaces of the first ball portions of Comparative Examples 1 to 3 are shown in FIG. 130 to FIG. 132.

As shown in FIG. 129, it was confirmed that, with the first ball portion of Example 1, fine scars due to ultrasonic vibration were made over substantially the entire bond surface. This confirms that the ultrasonic vibration propagates satisfactorily to the FAB over the entire period from the instant the FAB contacts the pad to the completion of the shape of the first ball portion and that the entire contact portion of the FAB with respect to the pad is rubbed against the pad by the ultrasonic vibration.

As shown in FIG. 130, it was confirmed that, with the first ball portion of Comparative Example 1, a portion Po1 that is not scarred by ultrasonic vibration is present at a portion of a central portion of the bond surface. It is considered that such a portion Po1 is present because the ultrasonic vibration does not propagate to the FAB immediately after the FAB contacts the pad and the contact portion of the FAB with respect to the pad is not rubbed.

As shown in FIG. 131, it was confirmed that, with the first ball portion of Comparative Example 2, a portion Po2 that is not scarred by ultrasonic vibration is present between a central portion and a peripheral edge portion of the bond surface. It is considered that such a portion Po2 is present because although the ultrasonic vibration propagates to the FAB from the instant the FAB contacts the pad, the ultrasonic vibration is inadequate in the process of deformation of the FAB to the first ball portion.

As shown in FIG. 132, it was confirmed that, with the first ball portion of Comparative Example 3, fine scars due to ultrasonic vibration were made only at a peripheral edge portion of the bonding portion and a portion Po3 that is not scarred is present at a central portion. It is considered that such a portion Po3 is present because the ultrasonic vibration propagates to the FAB only after the FAB has deformed to the first ball portion.

(3) Evaluation of Upper Side of the Pad

The copper wires, including the first ball portions, of Example 1 and Comparative Examples 1 to 3 were dissolved with fuming nitric acid and the surfaces of bonding of the pads with the first ball portions were observed using an optical microscope. An image of the pad of Example 1 is shown in FIG. 133. Images of the pads of Comparative Examples 1 to 3 are shown in FIG. 134 to FIG. 136.

Before the present evaluation test, EDS (electric die sort) for inspecting whether or not a semiconductor chip is non-defective was performed and before the bonding of the FAB, needle marks due to pressing of an EDS inspection probe were made on the top surfaces of the respective pads.

As shown in FIG. 133, it was confirmed that the needle marks have disappeared from the pad of Example 1. This confirms that the FAB was pressed against the pad to a degree such that the needle marks disappeared from the pad and the FAB (first ball portion) was bonded firmly to the pad.

On the other hand, as shown in FIG. 134 to FIG. 136, it was confirmed that the needle marks remained on the pads of Comparative Examples 1 to 3.

(4) Evaluation of Portion below the Pad

The copper wires, including the first ball portions, of Example 1 and Comparative Examples 1 to 3 were dissolved with fuming nitric acid, the pads were further removed, and the exposed top surfaces of the interlayer insulating films were observed using an optical microscope. An image of the top surface of the interlayer insulating film of Example 1 is shown in FIG. 137. Images of the top surfaces of the interlayer insulating films of Comparative Examples 1 to 3 are shown in FIG. 138 to FIG. 140.

As shown in FIG. 137 to FIG. 140, it was confirmed that crack or other damage did not occur in the interlayer insulating film of any one of Example 1 and Comparative Examples 1 to 3.

2. Evaluation Test 2

A capillary made by Micro-Swiss was used. The capillary has the following dimensions. The CD dimension that is the diameter of the lower end edge of the chamfer is 66 μm (0.066 mm). The T dimension that is the outer diameter of the face is 178 μm (0.178 mm). The chamfer angle, which two straight lines extending along the side surface of the chamfer form in the cross section of the capillary taken along the plane that includes the central axis (see cross section shown in FIG. 109A), is 90°. The face angle FA that is the angle that the face forms with the plane orthogonal to the central axis of the capillary is 8°. The angle, which, in the cross section of the capillary taken along the plane that includes the central axis, the portion of the side surface of the capillary that extends upward beyond the upper end of the face forms with the central axis, is 20°. The upper end portion of the face is arcuate and the OR dimension that is the radius of curvature of this portion is 20 μm (0.020 mm).

The capillary was positioned at a position of 7 mil (approximately 178 μm) height from the top surface of a pad made of an Al—Cu-based alloy and an FAB of 2.33 mil (approximately 60 μm) diameter was formed on the tip of a copper wire with a wire diameter of 25 μm. The capillary was then lowered toward the pad at a speed of 0.4 mil/msec (approximately 10.2 μm/msec) to press the FAB against the pad and form a first ball portion on the pad by deformation of the FAB. The intended diameter of the first ball portion was 74 μm and the intended bonding area of the first ball portion with respect to the pad was 0.00430 $mm^2$.

As shown in FIG. 141, for 3 msec after contacting of the FAB with the pad, an initial load of 130 g was applied to the FAB by the capillary, and at the point of elapse of the 3 msec, the load applied to the FAB was decreased to 30 g and the state of applying the load of 30 g to the FAB was maintained for 9 msec. Thereafter, the capillary was raised.

Also, from before the contacting of the FAB with the pad, a drive current of 20 mA was applied to the ultrasonic transducer provided in the capillary, and after the FAB contacted the pad, the value of the drive current applied to the ultrasonic transducer was raised from 20 mA to 90 mA at a fixed rate of change and the state of applying the drive current of 90 mA to the ultrasonic transducer was maintained until the capillary was raised (until 29.5 msec elapsed from the start of descent of the capillary). Example 2 and Comparative Examples 4 to 8 differ in a time (ramp-up time) taken for the value of the drive current applied to the ultrasonic transducer to reach 90 mA from 20 mA. In all of Example 2 and Comparative Examples 4 to 8, the value obtained by dividing the value of the drive current applied at the final stage to the ultrasonic transducer by the intended bonding area of the first ball portion was approximately 0.0164 mA/$\mu m^2$ and less than 0.0197 mA/$\mu m^2$.

Example 2

In Example 2, the ramp-up time was set to 3.6 msec. In other words, 30% of the time period from the contacting of the FAB with the pad to the raising of the capillary (12 msec, hereinafter referred to as the "bonding time") was set as the ramp-up time. The drive current applied to the ultrasonic transducer after the contacting of the FAB with the pad was thereby raised from 20 mA to 90 mA at a rate of change of approximately 19.44 mA/msec. The integrated value of the drive current applied to the ultrasonic transducer in the period of 3 msec during which the initial load of 130 g was applied to the FAB was 147.5 mA·msec.

Comparative Example 4

In Comparative Example 4, the ramp-up time was set to 3.0 msec. In other words, 25% of the bonding time was set as the ramp-up time. The drive current applied to the ultrasonic transducer after the contacting of the FAB with the pad was thereby raised from 20 mA to 90 mA at a rate of change of approximately 23.33 mA/msec. The integrated value of the drive current applied to the ultrasonic transducer in the period of 3 msec during which the initial load of 130 g was applied to the FAB was 165 mA·msec.

Comparative Example 5

In Comparative Example 5, the ramp-up time was set to 2.4 msec. In other words, 20% of the bonding time was set as the ramp-up time. The drive current applied to the ultrasonic transducer after the contacting of the FAB with the pad was thereby raised from 20 mA to 90 mA at a rate of change of approximately 29.17 mA/msec. The integrated value of the drive current applied to the ultrasonic transducer in the period of 3 msec during which the initial load of 130 g was applied to the FAB was 207 mA·msec.

Comparative Example 6

In Comparative Example 6, the ramp-up time was set to 1.8 msec. In other words, 15% of the bonding time was set as the ramp-up time. The drive current applied to the ultrasonic transducer after the contacting of the FAB with the pad was thereby raised from 20 mA to 90 mA at a rate of change of approximately 38.89 mA/msec. The integrated value of the drive current applied to the ultrasonic transducer in the period of 3 msec during which the initial load of 130 g was applied to the FAB was 228 mA·msec.

Comparative Example 7

In Comparative Example 7, the ramp-up time was set to 1.2 msec. In other words, 10% of the bonding time was set as the ramp-up time. The drive current applied to the ultrasonic transducer after the contacting of the FAB with the pad was thereby raised from 20 mA to 90 mA at a rate of change of approximately 58.33 mA/msec. The integrated value of the drive current applied to the ultrasonic transducer in the period of 3 msec during which the initial load of 130 g was applied to the FAB was 249 mA·msec.

Comparative Example 8

In Comparative Example 8, the ramp-up time was set to 0 msec. In other words, 0% of the bonding time was set as the ramp-up time.

(1) Crack Evaluation

With each of Example 2 and Comparative Examples 4 to 8, FABs were bonded to 48 pads, whether or not a crack formed in the interlayer insulating film at the lower layer of each pad was examined, and a crack occurrence rate (number of pads with which a crack formed in the interlayer insulating film at the lower layer/48×100) was computed. The computation results are shown in FIG. 142.

As shown in FIG. 142, with Example 1, with which the ramp-up time was 30% of the bonding time and the rate of change of the drive current was approximately 19.44 mA/msec, it was confirmed that a crack did not occur in the interlayer insulating film.

On the other hand, with each of Comparative Examples 4 to 8, with which the ramp-up time was no more than 25% of the bonding time and the rate of change of the drive current was no less than approximately 23.33 mA/msec, it was confirmed that a crack occurred in the interlayer insulating film.

3. Evaluation Test 3

A capillary made by Micro-Swiss was used. The capillary has the following dimensions. The CD dimension that is the diameter of the lower end edge of the chamfer is 66 μm (0.066 mm). The T dimension that is the outer diameter of the face is 178 μm (0.178 mm). The chamfer angle, which two straight lines extending along the side surface of the chamfer form in the cross section of the capillary taken along the plane that includes the central axis (see cross section shown in FIG. 109A), is 90°. The face angle that is the angle that the face forms with the plane orthogonal to the central axis of the capillary is 8°. The angle, which, in the cross section of the capillary taken along the plane that includes the central axis, the portion of the side surface of the capillary that extends upward beyond the upper end of the face forms with the central axis, is 20°. The upper end portion of the face is arcuate and the OR dimension that is the radius of curvature of this portion is 20 μm (0.020 mm).

The capillary was positioned at a position of 7 mil (approximately 178 μm) height from the top surface of a pad made of an Al—Cu-based alloy and an FAB of 2.33 mil (approximately 60 μm) diameter was formed on the tip of a copper wire with a wire diameter of 25 μm. The capillary was then lowered toward the pad at a speed of 0.4 mil/msec (approximately 10.2 μm/msec) to press the FAB against the pad and form a first ball portion on the pad by deformation of the FAB. The intended diameter of the first ball portion was 74 μm and the intended bonding area of the first ball portion with respect to the pad was 0.00430 $mm^2$.

As shown in FIG. 143, for 3 msec after contacting of the FAB with the pad, an initial load of 130 g was applied to the FAB by the capillary, and at the point of elapse of the 3 msec, the load applied to the FAB was decreased to 30 g and the state of applying the load of 30 g to the FAB was maintained for 9 msec. Thereafter, the capillary was raised.

Also, from before the contacting of the FAB with the pad, a drive current was applied to the ultrasonic transducer provided in the capillary, and after the FAB contacted the pad, the value of the drive current applied to the ultrasonic transducer was raised to 90 mA at a fixed rate of change in the period of 3.6 msec and the state of applying the drive current of 90 mA to the ultrasonic transducer was maintained until the capillary was raised (until 29.5 msec elapsed from the start of descent of the capillary). Examples 3 to 7 and Comparative Examples 9 to 11 differ in the value of the drive current applied to the ultrasonic transducer from before the FAB contacted the pad. In all of Examples 3 to 7 and Comparative Examples 4 to 8, the value obtained by dividing the value of the drive current applied at the final stage to the ultrasonic transducer by the intended bonding area of the first ball portion was approximately 0.0164 $mA/\mu m^2$ and less than 0.0197 $mA/\mu m^2$.

Example 3

In Example 3, the value of the drive current applied to the ultrasonic transducer from before the FAB contacted the pad was set to 0 mA. The drive current applied to the ultrasonic transducer after the contacting of the FAB with the pad was thereby raised from 0 mA to 90 mA at a rate of change of 25 mA/msec. The integrated value of the drive current applied to the ultrasonic transducer in the period of 3 msec during which the initial load of 130 g was applied to the FAB was 112.5 mA·msec.

Example 4

In Example 4, the value of the drive current applied to the ultrasonic transducer from before the FAB contacted the pad was set to 10 mA. The drive current applied to the ultrasonic transducer after the contacting of the FAB with the pad was thereby raised from 10 mA to 90 mA at a rate of change of approximately 22.22 mA/msec. The integrated value of the drive current applied to the ultrasonic transducer in the period of 3 msec during which the initial load of 130 g was applied to the FAB was 130 mA·msec.

Example 5

In Example 5, the value of the drive current applied to the ultrasonic transducer from before the FAB contacted the pad was set to 15 mA. The drive current applied to the ultrasonic transducer after the contacting of the FAB with the pad was thereby raised from 15 mA to 90 mA at a rate of change of approximately 20.83 mA/msec. The integrated value of the drive current applied to the ultrasonic transducer in the period of 3 msec during which the initial load of 130 g was applied to the FAB was 138.75 mA·msec.

Example 6

In Example 6, the value of the drive current applied to the ultrasonic transducer from before the FAB contacted the pad was set to 20 mA. The drive current applied to the ultrasonic transducer after the contacting of the FAB with the pad was thereby raised from 20 mA to 90 mA at a rate of change of approximately 19.44 mA/msec. The integrated value of the drive current applied to the ultrasonic transducer in the period of 3 msec during which the initial load of 130 g was applied to the FAB was 147.5 mA·msec.

Example 7

In Example 7, the value of the drive current applied to the ultrasonic transducer from before the FAB contacted the pad was set to 25 mA. The drive current applied to the ultrasonic transducer after the contacting of the FAB with the pad was thereby raised from 25 mA to 90 mA at a rate of change of approximately 18.04 mA/msec. The integrated value of the drive current applied to the ultrasonic transducer in the period of 3 msec during which the initial load of 130 g was applied to the FAB was 156.25 mA·msec.

Comparative Example 9

In Comparative Example 9, the value of the drive current applied to the ultrasonic transducer from before the FAB contacted the pad was set to 30 mA. The drive current applied to the ultrasonic transducer after the contacting of the FAB with the pad was thereby raised from 30 mA to 90 mA at a rate of change of approximately 16.67 mA/msec. The integrated value of the drive current applied to the ultrasonic transducer in the period of 3 msec during which the initial load of 130 g was applied to the FAB was 165 mA·msec.

Comparative Example 10

In Comparative Example 10, the value of the drive current applied to the ultrasonic transducer from before the FAB contacted the pad was set to 60 mA. The drive current applied to the ultrasonic transducer after the contacting of the FAB with the pad was thereby raised from 60 mA to 90 mA at a rate of change of approximately 8.34 mA/msec. The integrated value of the drive current applied to the ultrasonic transducer in the period of 3 msec during which the initial load of 130 g was applied to the FAB was 255 mA·msec.

Comparative Example 11

In Comparative Example 11, the value of the drive current applied to the ultrasonic transducer from before the FAB contacted the pad was set to 90 mA. The drive current applied to the ultrasonic transducer thus does not change before and after the contacting of the FAB with the pad. The integrated value of the drive current applied to the ultrasonic transducer in the period of 3 msec during which the initial load of 130 g was applied to the FAB was 270 mA·msec.

(1) Crack Evaluation

With each of Examples 3 to 7 and Comparative Examples 9 to 11, FABs were bonded to 48 pads, whether or not a crack formed in the interlayer insulating film at the lower layer of each pad was examined, and a crack occurrence rate (number of pads with which a crack formed in the interlayer insulating film at the lower layer/48×100) was computed.

The computation results are shown in FIG. 144.

As shown in FIG. 144, it was confirmed that, with each of Examples 3 to 7, with which the value of the drive current applied to the ultrasonic transducer from before the FAB contacted the pad was no more than 25 mA, a crack did not occur in the interlayer insulating film.

On the other hand, it was confirmed that, with each of Comparative Examples 9 to 11, with which the value of the drive current applied to the ultrasonic transducer from before the FAB contacted the pad was no less than 30 mA, a crack occurred in the interlayer insulating film.

4. Evaluation Test 4

A capillary made by Micro-Swiss was used. The capillary has the following dimensions. The CD dimension that is the diameter of the lower end edge of the chamfer is 66 μm (0.066 mm). The T dimension that is the outer diameter of the face is 178 μm (0.178 mm). The chamfer angle, which two straight lines extending along the side surface of the chamfer form in the cross section of the capillary taken along the plane that includes the central axis (see cross section shown in FIG. 109A), is 90°. The face angle FA that is the angle that the face forms with the plane orthogonal to the central axis of the capillary is 8°. The angle, which, in the cross section of the capillary taken along the plane that includes the central axis, the portion of the side surface of the capillary that extends upward beyond the upper end of the face forms with the central axis, is 20°. The upper end portion of the face is arcuate and the OR dimension that is the radius of curvature of this portion is 20 μm (0.020 mm).

The capillary was positioned at a position of 7 mil (approximately 178 μm) height from the top surface of a pad made of an Al—Cu-based alloy and an FAB of 2.33 mil (approximately 60 μm) diameter was formed on the tip of a copper wire with a wire diameter of 25 μm. The capillary was then lowered toward the pad at a speed of 0.4 mil/msec (approximately 10.2 μm/msec) to press the FAB against the pad and form a first ball portion on the pad by deformation of the FAB. The intended diameter of the first ball portion was 76 μm and the intended thickness of the first ball portion was 18 μm.

Example 8

For 3 msec after contacting of the FAB with the pad, an initial load of 130 g was applied to the FAB by the capillary, and at the point of elapse of the 3 msec, the load applied to the FAB was decreased to 30 g and the state of applying the load of 30 g to the FAB was maintained for 9 msec. Thereafter, the capillary was raised.

Also, a state of applying a drive current of 90 mA to the ultrasonic transducer was maintained from the FAB contacted the pad until the capillary was raised (until 29.5 msec elapsed from the start of descent of the capillary). The value obtained by dividing the value of the drive current applied to the ultrasonic transducer by the intended bonding area of the first ball portion was approximately 0.0164 mA/$\mu m^2$ and less than 0.0197 mA/$\mu m^2$.

Comparative Example 12

A state of applying a load of 30 g to the FAB was maintained from the contacting of the FAB with the pad until the raising of the capillary.

Also, a state of applying a drive current of 130 mA to the ultrasonic transducer was maintained from the FAB contacted the pad until the capillary was raised (until 29.5 msec elapsed from the start of descent of the capillary).

Comparative Example 13

A state of applying a load of 90 g to the FAB was maintained from the contacting of the FAB with the pad until the raising of the capillary.

Also, a state of applying a drive current of 130 mA to the ultrasonic transducer was maintained from the FAB contacted the pad until the capillary was raised (until 29.5 msec elapsed from the start of descent of the capillary).

Comparative Example 14

For 3 msec after contacting of the FAB with the pad, an initial load of 130 g was applied to the FAB by the capillary, and at the point of elapse of the 3 msec, the load applied to the FAB was decreased to 30 g and the state of applying the load of 30 g to the FAB was maintained for 9 msec. Thereafter, the capillary was raised.

Also, a state of applying a drive current of 70 mA to the ultrasonic transducer was maintained from the FAB contacted the pad until the capillary was raised (until 29.5 msec elapsed from the start of descent of the capillary).

(1) Splash Evaluation (Appearance Evaluation 1)

With each of Example 8 and Comparative Examples 12 to 14, a vicinity of the first ball portion was observed using SEM. An SEM image of the vicinity of the first ball portion of Example 8 is shown in FIG. 145. SEM images of the vicinities of the first ball portions of Comparative Example 12 to 14 are respectively shown in FIG. 146 to FIG. 148.

As shown in FIGS. 145 and 148, with each of Example 8 and Comparative Example 14 with which the initial load is applied to the FAB after contacting of the FAB with the pad, it was confirmed that the material of the pad jutted out slightly to the side of the first ball portion and splash did not occur.

On the other hand, as shown in FIGS. 146 and 147, with each of Comparative Examples 12 and 13, with which an initial load is not applied to the FAB, it was confirmed that the material of the pad protruded greatly outward in a form of a thin collar to sides of the first ball portion and splash occurred.

(2) Shear Test Evaluation 1

With each of Example 8 and Comparative Examples 12 to 14, a shear tester (bonding strength tester) was used and the bonding portion of the first ball portion and the pad was broken by pushing the bonding portion from a side thereof in a direction parallel to the top surface of the pad in a shearing manner by a tool of the shear tester. An image observed by an optical microscope of the pad after breakage of Example 8 is shown in FIG. 149. An image observed by the optical microscope of the pad after breakage of Comparative Example 12 is shown in FIG. 150. An image observed by the optical microscope of the pad after breakage of Comparative Example 13 is shown in FIG. 151, and an image observed by the optical microscope of a bottom surface of the first ball portion (surface joined to the pad) after breakage is shown in FIG. 152. An image observed by the optical microscope of the pad after breakage of Comparative Example 14 is shown in FIG. 153.

As can be understood from comparing FIGS. 149 and 153 with FIGS. 150 and 151, with each of Comparative Example 12 in which a large load is applied to the FAB over the entire bonding time and Comparative Example 13 in which a drive current of a large value is applied to the ultrasonic transducer, the first ball portion strongly penetrates into the pad in comparison to the first ball portions of Example 8 and Comparative Example 14. It was thus visually confirmed that the bonding strength of the first ball portion and the pad is large in each of Comparative Examples 12 and 13 in comparison to Example 8 and Comparative Example 14.

However, as can be understood from FIG. 152, with Comparative Example 13, the energy of the ultrasonic vibration propagating to the first ball portion is too large and thus the first ball portion penetrates into the pad excessively and a portion of the first ball portion close to the copper wire is cut. It is thus considered that the bonding strength only appears to be high and the actual bonding strength is not that high.

(3) Appearance Evaluation 2

With each of Example 8 and Comparative Examples 12 to 14, FABs were bonded to 80 pads and the diameters and thicknesses of the first ball portions formed thereby were measured. Each first ball portion is not a complete circle in plan view and thus the diameter thereof was measured for the two directions of the X direction and Y direction parallel to the top surface of the pad. The diameter measurement results are shown in FIG. 154. The thickness measurement results are shown in FIG. 155.

As shown in FIGS. 154 and 155, it was confirmed that although with all of Example 8 and Comparative Examples 12 to 14, first ball portions of the intended diameter and intended thickness can be formed, with the first ball portions of Comparative Examples 12 and 13, the diameter and thickness were both high in variation in comparison to the first ball portions of Example 8 and Comparative Example 14.

(4) Shear Test Evaluation 2

A force (shear strength) required for breaking by pushing the bonding portion of the first ball portion and the pad from the side in shear test evaluation 1 was measured. The measurement results are shown in FIG. 156.

As shown in FIG. 156, it was confirmed that, with Comparative Examples 12 and 13, although the shear strengths are high in comparison to those of Example 8 and Comparative Example 14, the variations thereof are also large.

It was also confirmed that with Example 8, the shear strength is higher than that of Comparative Example 14.

Thirteenth Preferred Embodiment FIG. 157 to FIG. 168

By disclosure of a thirteenth preferred embodiment, a thirteenth issue concerning a thirteenth background art described below can be resolved in addition to the issues described above in the "OBJECT(S) OF THE INVENTION."

(1) Thirteenth Background Art

In a typical semiconductor device, a semiconductor chip is disposed on a die pad and leads disposed in peripheries of the semiconductor chip and the die pad are connected by wires made of Au (gold). Specifically, pads made of Al (aluminum) are disposed on a top surface of the semiconductor chip. The wires made of Au are installed so as to form arch-shaped loops between top surfaces of the pads and top surfaces of the leads.

In installing each wire (in wire bonding), an FAB (free air ball) is formed on a tip of a wire held by a capillary of a wire bonder and the FAB is put in contact with a top surface of a pad. In this process, the FAB is pressed toward the pad at a predetermined load by the capillary and a predetermined drive current is supplied to an ultrasonic transducer provided in the capillary to apply ultrasonic vibration to the FAB. Consequently, the FAB is pressed while being rubbed against the top surface of the pad and bonding of the wire to the top surface of the pad is achieved. Thereafter, the capillary is moved toward a lead. The wire is then pressed against a top surface of the lead and the wire is broken while an ultrasonic vibration is applied to the wire. The wire is thereby installed between the top surface of the pad and the top surface of the lead.

(2) Thirteenth Issue

Recently, price competition of semiconductor devices in the market is becoming severe and further reductions in costs of semiconductor devices are being demanded. As one cost reduction measure, use of wires (copper wires) made of inexpensive Cu (copper) as an alternative to wires (gold wires) made of expensive Au is being examined.

However, an FAB formed on a tip of a copper wire is harder than an FAB formed on a tip of a gold wire, and thus, if a copper wire is bonded to a pad under the same conditions (magnitudes of load and ultrasonic transducer drive current, etc.) as those for a gold wire, satisfactory bonding of the copper wire and the pad cannot be obtained. Presently, conditions that enable satisfactory bonding of a copper wire and a pad to be achieved are not clear and active replacement of gold wires by copper wires is yet to take place.

Thus, a thirteenth object of the present invention related to the thirteenth preferred embodiment is to provide a wire bonding method that enables satisfactory bonding of a copper wire to a pad to be achieved.

(3) Disclosure of a Specific Preferred Embodiment

FIG. 157 is a schematic sectional view of a semiconductor device according to the thirteenth preferred embodiment of the present invention. FIG. 158 is a schematic bottom view of the semiconductor device shown in FIG. 157.

The semiconductor device 1M is a semiconductor device to which a QFN (quad flat non-leaded package) configuration is applied and has a structure in which a semiconductor chip 2M is sealed together with a die pad 3M, leads 4M, and copper wires 5M by a resin package 6M. An outer shape of the semiconductor device 1M (resin package 6M) is a flat, rectangular parallelepiped shape.

In the present preferred embodiment, the outer shape of the semiconductor device 1M is a hexahedron having a square shape of 4 mm square as a planar shape and a thickness of 0.85 mm, and dimensions of respective portions of the semiconductor device 1M cited below make up an example in the case where the semiconductor device 1M has the above outer dimensions.

The semiconductor chip 2M has a square shape of 2.3 mm in plan view, and the semiconductor chip 2M has a thickness of 0.23 mm. A plurality of pads 7M are disposed at peripheral edge portions of a top surface of the semiconductor chip 2M. Each pad 7M is electrically connected to a circuit built into the semiconductor chip 2M. A rear metal 8M made of a metal layer of Au, Ni (nickel), Ag (silver), etc., is formed on a rear surface of the semiconductor chip 2M.

The die pad 3M and the leads 4M are formed by punching out a metal thin plate (for example, a copper thin plate). The metal thin plate (die pad 3 or lead 4M) has a thickness of 0.2 mm. A plating layer 9M made of Ag is formed on top surfaces of the die pad 3M and leads 4M.

The die pad 3M has a square shape of 2.7 mm in plan view and is disposed at a central portion of the semiconductor device 1M so that its respective side surfaces are parallel to side surfaces of the semiconductor device 1M.

A recess with a substantially quarter-elliptical shape in cross section is formed by performing a squeezing process from the rear surface side across an entire periphery of a peripheral edge portion of the rear surface of the die pad 3M. The resin package 6M enters the recess. The peripheral edge portion of the die pad 3M is thereby sandwiched from above and below by the resin package 6M and prevention of fall-off (retaining) of the die pad 3M with respect to the resin package 6M is thereby achieved.

Also, with the exception of the peripheral edge portion (portion recessed to the substantially quarter-elliptical shape in cross section), the rear surface of the die pad 3M is exposed from a rear surface of the resin package 6M.

An equal number of (for example, nine) leads 4M are disposed at each of positions facing the respective side surfaces of the die pad 3M. At each of the positions facing the side surfaces of the die pad 3M, the leads 4M extend in a direction orthogonal to the facing side surface and are disposed at equal intervals in a direction parallel to the side surface. A longitudinal direction length of each lead 4M is 0.45 mm. Also, an interval between the die pad 3M and the lead 4M is 0.2 mm.

A recess with a substantially quarter-elliptical shape in cross section is formed by performing a squeezing process from the rear surface side at a die pad 3M side end portion of the rear surface of each lead 4M. The resin package 6M enters the recess. The die pad 3M side end portion of the lead 4M is thereby sandwiched from above and below by the resin package 6M and prevention of fall-off (retaining) of the lead 4M with respect to the resin package 6M is thereby achieved.

With the exception of the die pad 3M side end portion (portion recessed to the substantially quarter-elliptical shape in cross section), the rear surface of each lead 4M is exposed from a rear surface of the resin package 6M. Also, a side surface of the lead 4M facing the die pad 3M side is exposed from a side surface of the resin package 6M.

A plating layer 10M formed of solder is formed on portions of the rear surfaces of the die pad 3M and leads 4M that are exposed from the resin package 6M.

With its top surface with the pads 7M disposed thereon facing upward, the semiconductor chip 2M has its rear surface bonded via a bonding material 11M to the top surface (plating layer 10M) of the die pad 3M. For example, a solder paste is used as the bonding material 11M. The bonding material 11M has a thickness of 0.02 mm.

In a case where electrical connection of the semiconductor chip 2M and the die pad 3M is unnecessary, the rear metal 8M may be omitted and the rear surface of the semiconductor chip 2M may be bonded to the top surface of the die pad 3M via a bonding material made of silver paste or other insulating paste. In this case, the planar size of the semiconductor chip 2M is 2.3 mm square. Also, the plating layer 9M on the top surface of the die pad 3M may be omitted.

The copper wires 5M are made, for example, of copper with a purity of no less than 99.99%. One end of each copper wire 5M is bonded to a pad 7M of the semiconductor chip 2M. The other end of the copper wire 5M is bonded to the top surface of a lead 4M. The copper wire 5M is installed so as to form an arch-shaped loop between the semiconductor chip 2M and the lead 4M. A height difference between an apex portion of the loop of the copper wire 5M and the top surface of the semiconductor chip 2M is 0.16 mm.

As in the first preferred embodiment, in the semiconductor device 1M, the entire top surface and side surfaces of the semiconductor chip 2M, the entire top surface and side surfaces of the die pad 3M, entire top surfaces of the leads 4M, and the entire copper wires 5M are covered by an integral water-impermeable insulating film 25M.

FIG. 159 is an enlarged view of a portion surrounded by broken lines shown in FIG. 157.

Each pad 7M is made of a metal that contains aluminum and is formed on an uppermost interlayer insulating film 12M of the semiconductor chip 2M. A top surface protective film 13M is formed on the interlayer insulating film 12M. The pad 7M has its peripheral edge portion covered by the top surface protective film 13M and its central portion is exposed via a pad opening 14M formed in the top surface protective film 13M.

The copper wire 5M is bonded to the central portion of the pad 7M exposed from the top surface protective film 13M. As shall be described below, the copper wire 5M has an FAB formed at its tip and the FAB is pressed against and thereby bonded to the pad 7M. In this process, the FAB deforms to form a first ball portion 15M with a stepped disk shape at the portion of bonding of the copper wire 5M with the pad 7M. Also, at a periphery of the first ball portion 15M, the material of the pad 7M juts out gradually from below the first ball portion 15M so as to form a jutting portion 16M without it being lifted greatly from the top surface of the pad 7M.

For example, in a case where the copper wire 5M has a wire diameter of 25 μm, an intended diameter of the first ball portion 15M (designed diameter of the first ball portion 15M) is 74 to 76 μm, and an intended thickness of the first ball portion 15M (designed thickness of the first ball portion 15M) is 17 to 18 μm.

FIG. 160A to FIG. 160D are schematic sectional views for describing a method for manufacturing the semiconductor device according to the thirteenth preferred embodiment in order of process.

The copper wires 5M are installed across the semiconductor chip 2M and the leads 4M by a wire bonder in a state where the die pad 3M and the leads 4M are connected to a frame (not shown) that surrounds these components, that is, in a state where the die pad 3M and leads 4M make up a lead frame.

The wire bonder includes a capillary C. As shown in FIG. 160A, the capillary C has a substantially cylindrical shape with a wire insertion hole 41M formed along a central axis. The copper wire 5M is inserted through the wire insertion hole 41M and fed out from a tip (lower end) of the wire insertion hole 41M.

A chamfer 42M of truncated conical shape that is in communication with the wire insertion hole 41M is formed below the wire insertion hole 41M at a tip portion of the capillary C. Also, the tip portion of the capillary C has a face 43M that is continuous with a lower end edge of the chamfer 42M and is a surface that faces a pad 7M and a lead 4M during bonding (during wire bonding) of the copper wire 5M to these components. An outer side of the face 43M is gradually inclined upwardly with respect to a plane orthogonal to the central axis of the capillary C.

First, as shown in FIG. 160A, the capillary C is moved to a position directly above the pad 7M. Next, in a state where a tip of the copper wire 5M is positioned at the chamfer 42M, a current is applied to a tip portion of the copper wire 5M and an FAB 44 is thereby formed at the tip portion. The value and application time of the current are set suitably in accordance with the wire diameter of the copper wire 5M and an intended diameter of the FAB 44 (designed diameter of the FAB 44). A portion of the FAB 44 protrudes below the chamfer 42M.

Thereafter, as shown in FIG. 160B, the capillary 44 is lowered toward the pad 7M and the FAB 44 is pressed against the pad 7M by the capillary C. In this process, a load is applied to the FAB 44 by the capillary C and ultrasonic vibration, emitted from an ultrasonic transducer (not shown) provided in the capillary C, is applied to the FAB 44.

FIG. 161 is a graph of changes with time of the load applied to the FAB and a driving current applied to the ultrasonic transducer during the bonding of the FAB to the pad.

For example, as shown in FIG. 161, a relatively large initial load P1 is applied from the capillary C to the FAB 44 from a time T1 at which the FAB 44 contacts the pad 7M to a time T2 after elapse of a predetermined time period. The predetermined time period is set to no more than 3 msec. Also, the initial load P1 is set based on a value obtained by multiplying an intended bonding area of the first ball portion 15M with respect to the pad 7 (designed bonding area of the first ball portion 15M with respect to the pad 7) by a fixed factor (for example, 28786 in a case where the unit of the initial load P1 is g and the unit of the bonding area is $mm^2$). From the time T2 onward, the load applied to the FAB 44 from the capillary C is lowered and a relatively small load P2 is applied to the FAB 44. The load P2 is applied continuously until a time T4 at which the capillary C is raised.

Meanwhile, a drive current of a relatively small value U1 is applied to the ultrasonic transducer from before the time T1 at which the FAB 44 contacts the pad 7M. The drive current value U1 is set to less than 30 mA.

Then, from the time T1 at which the FAB 44 contacts the pad 7M to a time T3, the value of the drive current applied to the ultrasonic transducer is raised at a fixed rate of change (monotonously) from the value U1 to a relatively large value U2. Also, the drive current values U1 and U2 are set so that an integrated value of the drive current applied to the ultrasonic transducer during the predetermined time period in which the initial load is applied to the FAB 44 is no more than 146 mA·msec. From the time T3 onward until the time T4, the drive current of the value U2 continues to be applied to the ultrasonic transducer.

Consequently, the FAB 44 deforms along the shapes of the chamfer 42M and the face 43M of the capillary C, and the first ball portion 15M with a stepped disk shape is formed on the pad 7M with the jutting portion 16M being formed along its periphery as shown in FIG. 159. Bonding (first bonding) of the copper wire 5M with the pad 7M is thereby achieved. The drive current value U1 may be set to zero, and in this case, the drive current is not applied to the ultrasonic transducer before the time T1.

When the time T4 arrives upon elapse of a bonding time determined in advance from the time T1, the capillary C separates upwardly from the pad 7M. Thereafter, the capillary C is moved obliquely downward toward the top surface of the lead 4M. Then, as shown in FIG. 160C, the drive current is applied to the ultrasonic transducer, and while ultrasonic vibration is being applied to the capillary C, the copper wire 5M is pressed against the top surface of the lead 4M by the capillary C and then broken. A stitch portion with a wedge shape in side view that is made up of the other end portion of the copper wire 5M is thereby formed on the top surface of the lead 4M and the bonding (second bonding) of the copper wire with respect to the lead 4M is thereby achieved.

Thereafter, the processes shown in FIG. 160A to FIG. 160C are performed on another pad 7M and the corresponding lead 4M. By the processes shown in FIG. 160A to FIG. 160C then being repeated, copper wires 5M are installed across all pads 7M of the semiconductor chip 2M and the leads 4M as shown in FIG. 160D. After the end of all of the wire bonding, the water-impermeable insulating film 25M is formed by the same method as that of FIG. 4D.

As described above, after the FAB 44 formed on the tip of the copper wire 5M is put in contact with a pad 7M, a relatively large initial load P1 is applied to the FAB 44 by the capillary C. The FAB 44, which is made of Cu that is a harder metal than Au, is thereby deformed satisfactorily and thus the initial load P1 applied to the FAB 44 can be made to contribute to the bonding of the FAB 44 and the pad 7M while it is suitably attenuated by the deformation of the FAB 44.

Also, the drive current is applied to the ultrasonic transducer and thus the ultrasonic vibration propagates from the ultrasonic transducer to FAB 44 and the FAB 44 is rubbed against the pad 7M by the ultrasonic vibration. The drive current applied to the ultrasonic transducer is controlled so that the integrated value of the drive current during the predetermined time period from the contacting of the FAB 44 with the pad 7M is less than 162 mA·msec. Ultrasonic vibration of an appropriate energy amount is thereby made to propagate to the FAB 44 within the predetermined time period from the contacting of the FAB 44 with the pad 7M. Consequently, the FAB 44 and the pad 7M can be bonded satisfactorily by the ultrasonic vibration while preventing occurrence of damage of the pad 7M and the interlayer insulating film 12M below the pad 7M due to excessive energy of the ultrasonic vibration.

The deformation of the FAB 44 due to the pressing of the FAB 44 against the pad 7M ends when the predetermined time period elapses from the contacting of the FAB 44, made of Cu, with the pad 7M. That is, the shape of the first ball portion 15M is completed when the predetermined time period elapses from the contacting of the FAB 44, made of Cu, with the pad 7M. Thus, if a large load continues to be applied to the FAB 44 thereafter, the ultrasonic vibration will not propagate satisfactorily to the portion of contact of the FAB 44 and the pad 7M. The load applied to the FAB 44 is thus decreased after the elapse of the predetermined time period from the contacting of the FAB 44 with the pad 7M. The ultrasonic vibration can thereby be made to propagate satisfactorily to the portion of contact of the FAB 44 and the pad 7M.

Thus, by the wire bonding method according to the present preferred embodiment, satisfactory bonding of the copper wire 5M to a pad 7M can be realized while preventing occurrence of damage in the pad 7M and the interlayer insulating film 12M.

After the contacting of the FAB 44 with the pad 7M, the value of the drive current applied to the ultrasonic transducer is increased gradually. Meanwhile, by the initial load P1 being applied to the FAB 44, the FAB 44 deforms in a squeezed manner and an area of the portion of contact of the FAB 44 and the pad 7M increases gradually. The ultrasonic vibration energy propagating from the ultrasonic transducer to the FAB 44 is thereby increased gradually and the area of the FAB 44 rubbed against the pad 7M also increases gradually. Consequently, a state of satisfactory bonding to the pad 7M can be realized up to a peripheral edge portion of the surface of bonding of the first ball portion 15M to the pad 7M while suppressing occurrence of damage in the pad 7M and the interlayer insulating film 12M due to rapid increase of the ultrasonic vibration energy propagating to the FAB 44 below a central portion of the first ball portion 15L.

Also, in the case where the drive current is applied to the ultrasonic transducer from before the contacting of the FAB 44 with the pad 7M, the ultrasonic vibration propagates to the portion of contact of the FAB 44 and the pad 7M from the instant at which the FAB 44 contacts the pad 7M, and the contacting portion is rubbed against the pad 7M. Consequently, a state where a central portion of a surface of the first ball portion 15M that bonds with the pad 7M (portion at which the FAB 44 and the pad 7M first make contact) is satisfactorily bonded to the pad 7M can be realized.

As a method for bonding the FAB 44 to a pad 7M, continued application of a fixed load to the FAB 44 and continued application of a fixed drive current to the ultrasonic transducer after contacting of the FAB 44 with the pad 7M may be considered. However, with this method, no matter what magnitude the load applied to the FAB 44 and value the drive current applied to the ultrasonic transducer are set, the FAB 44 is not adequately bonded to the pad 7M or so-called splash, in which the material of the pad 7M protrudes greatly outward in a form of a thin collar to sides of the first ball portion 15M, occurs.

With the wire bonding method according to the present preferred embodiment, the occurrence of splash is prevented by the value of the drive current applied to the ultrasonic transducer from before the contacting of the FAB 44 with the pad 7M and the magnitude of the initial load being set appropriately.

That is, the value U1 of the drive current applied to the ultrasonic transducer from before the contacting of the FAB 44 with the pad 7M is set to less than 30 mA. The ultrasonic vibration energy that propagates to the FAB 44 immediately after the FAB 44 contacts the pad 7M can thereby be prevented from being excessive. Consequently, occurrence of splash and occurrence of damage in the pad 7M and the interlayer insulating film 12M below the central portion of the first ball portion 15M can be prevented satisfactorily.

Also, the magnitude of the initial load P1 is set to a value obtained by multiplying the intended bonding area of the first ball portion 15M with respect to the pad 7M by a fixed factor. The magnitude of the initial load P1 can thus be set appropriately in accordance with the intended bonding area of the first ball portion 15M. Consequently, satisfactory deformation of the FAB 44 can be achieved while satisfactorily preventing the occurrence of splash and occurrence of damage of the pad 7M and the interlayer insulating film 12M below the central portion of the first ball portion 15M.

Although the thirteenth preferred embodiment of the present invention has been described above, the thirteenth preferred embodiment may also be modified as follows.

For example, although a QFN package type is applied to the semiconductor device 1M, the present invention may also be applied to the manufacture of a semiconductor device to which another type of non-leaded package, such as an SON (small outlined non-leaded package), is applied.

The present invention may also be applied to the manufacture of not only semiconductor devices to which a so-called singulation type package, with end surfaces of leads being made flush with side surfaces of a resin package, is applied but also semiconductor devices to which a lead cut type non-leaded package, with leads projecting from side surfaces of a resin package, is applied.

Further, the present invention may be applied to the manufacture of not only semiconductor devices to which a non-leaded package is applied but also semiconductor devices to which a QFP (quad flat package) or other package having outer leads formed by leads projecting from a resin package is applied.

Also, although with the above-described preferred embodiment, a mode in which the copper wires 5M are covered by the water-impermeable insulating film 25M was described as an example, the water-impermeable insulating film 25M may be omitted as shown in FIG. 162 as long as at least the thirteenth object for resolving the thirteenth issue is achieved.

Experiments related to the present thirteenth preferred embodiment were performed. The present invention is not restricted to the examples described below.

1. Evaluation Test 1

A capillary made by Micro-Swiss was used. The capillary has the following dimensions. ACD dimension that is a diameter of a lower end edge of a chamfer is 66 μm (0.066 mm). A T dimension that is an outer diameter of a face is 178 μm (0.178 mm). A chamfer angle, which two straight lines extending along a side surface of the chamfer form in a cross section of the capillary taken along a plane that includes a central axis (see cross section shown in FIG. 160A), is 90°. A face angle that is an angle that the face forms with a plane orthogonal to the central axis of the capillary is 8°. An angle, which, in the cross section of the capillary taken along the plane that includes the central axis, a portion of the side surface of the capillary that extends upward beyond the upper end of the face forms with the central axis, is 20°. An upper end portion of the face is arcuate and an OR dimension that is a radius of curvature of this portion is 20 μm (0.020 mm).

The capillary was positioned at a position of 7 mil (approximately 178 μm) height from a top surface of a pad made of an Al—Cu-based alloy and an FAB of 2.33 mil (approximately 60 μm) diameter was formed on a tip of a copper wire with a wire diameter of 25 μm. The capillary was then lowered toward the pad at a speed of 0.4 mil/msec (approximately 10.2 μm/msec) to press the FAB against the pad and form a first ball portion on the pad by deformation of the FAB. The intended diameter of the first ball portion was 74 μm and the intended bonding area of the first ball portion with respect to the pad was 0.00430 $mm^2$.

As shown in FIG. 163, for 3 msec after contacting of the FAB with the pad, an initial load of 130 g was applied to the FAB by the capillary, and at the point of elapse of the 3 msec, the load applied to the FAB was decreased to 30 g and the state of applying the load of 30 g to the FAB was maintained for 9 msec. Thereafter, the capillary was raised.

Also, from before the contacting of the FAB with the pad, a drive current of 20 mA was applied to the ultrasonic transducer provided in the capillary, and after the FAB contacted the pad, the value of the drive current applied to the ultrasonic transducer was raised from 20 mA to 90 mA at a fixed rate of change and the state of applying the drive current of 90 mA to the ultrasonic transducer was maintained until the capillary was raised (until 29.5 msec elapsed from the start of descent of the capillary). Example 1 and Comparative Examples 1 to 5 differ in a time (ramp-up time) taken for the drive current applied to the ultrasonic transducer to reach 90 mA from 20 mA.

Example 1

In Example 1, the ramp-up time was set to 3.6 msec. In other words, 30% of the time period from the contacting of the FAB with the pad to the raising of the capillary (12 msec, hereinafter referred to as the “bonding time”) was set as the ramp-up time. In this case, the integrated value of the drive current applied to the ultrasonic transducer in the period of 3 msec during which the initial load of 130 g was applied to the FAB was 147.5 mA·msec.

Comparative Example 1

In Comparative Example 1, the ramp-up time was set to 3.0 msec. In other words, 25% of the bonding time was set as the ramp-up time. In this case, the integrated value of the drive current applied to the ultrasonic transducer in the period of 3 msec during which the initial load of 130 g was applied to the FAB was 165 mA·msec.

Comparative Example 2

In Comparative Example 2, the ramp-up time was set to 2.4 msec. In other words, 20% of the bonding time was set as the ramp-up time. In this case, the integrated value of the drive current applied to the ultrasonic transducer in the period of 3 msec during which the initial load of 130 g was applied to the FAB was 207 mA·msec.

Comparative Example 3

In Comparative Example 3, the ramp-up time was set to 1.8 msec. In other words, 15% of the bonding time was set as the ramp-up time. In this case, the integrated value of the drive current applied to the ultrasonic transducer in the period of 3 msec during which the initial load of 130 g was applied to the FAB was 228 mA·msec.

Comparative Example 4

In Comparative Example 4, the ramp-up time was set to 1.2 msec. In other words, 10% of the bonding time was set as the ramp-up time. In this case, the integrated value of the drive current applied to the ultrasonic transducer in the period of 3 msec during which the initial load of 130 g was applied to the FAB was 249 mA·msec.

Comparative Example 5

In Comparative Example 5, the ramp-up time was set to 0 msec. In other words, 0% of the bonding time was set as the ramp-up time. In this case, the integrated value of the drive current applied to the ultrasonic transducer in the period of 3 msec during which the initial load of 130 g was applied to the FAB was 270 mA·msec.

(1) Crack Evaluation

With each of Example 1 and Comparative Examples 1 to 5, FABs were bonded to 48 pads, whether or not a crack formed in the interlayer insulating film at the lower layer of each pad was examined, and a crack occurrence rate (number of pads with which a crack formed in the interlayer insulating film at the lower layer/48×100) was computed. The computation results are shown in FIG. 164.

As shown in FIG. 164, with Example 1, with which the ramp-up time was 30% of the bonding time and the integrated value of the drive current was 147.5 mA·msec, it was confirmed that a crack did not occur in the interlayer insulating film.

On the other hand, with each of Comparative Examples 1 to 4, with which the ramp-up time was no more than 25% of the bonding time and the integrated value of the drive current was 165 mA·msec, it was confirmed that a crack occurred in the interlayer insulating film.

2. Evaluation Test 2

A capillary made by Micro-Swiss was used. The capillary has the following dimensions. The CD dimension that is the diameter of the lower end edge of the chamfer is 66 μm (0.066 mm). The T dimension that is the outer diameter of the face is 178 μm (0.178 mm). The chamfer angle, which two straight lines extending along the side surface of the chamfer form in the cross section of the capillary taken along the plane that includes the central axis (see cross section shown in FIG. 160A), is 90°. The face angle FA that is the angle that the face forms with the plane orthogonal to the central axis of the capillary is 8°. The angle, which, in the cross section of the capillary taken along the plane that includes the central axis, the portion of the side surface of the capillary that extends upward beyond the upper end of the face forms with the central axis, is 20°. The upper end portion of the face is arcuate and the OR dimension that is the radius of curvature of this portion is 20 μm (0.020 mm).

The capillary was positioned at a position of 7 mil (approximately 178 μm) height from the top surface of a pad made of an Al—Cu-based alloy and an FAB of 2.33 mil (approximately 60 μm) diameter was formed on the tip of a copper wire with a wire diameter of 25 μm. The capillary was then lowered toward the pad at a speed of 0.4 mil/msec (approximately 10.2 μm/msec) to press the FAB against the pad and form a first ball portion on the pad by deformation of the FAB. The intended diameter of the first ball portion was 74 μm and the intended bonding area of the first ball portion with respect to the pad was 0.00430 $mm^2$.

As shown in FIG. 165, for 3 msec after contacting of the FAB with the pad, an initial load of 130 g was applied to the FAB by the capillary, and at the point of elapse of the 3 msec, the load applied to the FAB was decreased to 30 g and the state of applying the load of 30 g to the FAB was maintained for 9 msec. Thereafter, the capillary was raised.

Also, from before the contacting of the FAB with the pad, a drive current was applied to the ultrasonic transducer provided in the capillary, and after the FAB contacted the pad, the value of the drive current applied to the ultrasonic transducer was raised to 90 mA at a fixed rate of change in the period of 3.6 msec and the state of applying the drive current of 90 mA to the ultrasonic transducer was maintained until the capillary was raised (until 29.5 msec elapsed from the start of descent of the capillary). Examples 2 to 6 and Comparative Examples 6 to 8 differ in the value of the drive current applied to the ultrasonic transducer from before the contacting of the FAB with the pad.

Example 2

In Example 2, the value of the drive current applied to the ultrasonic transducer from before the FAB contacted the pad was set to 0 mA. In this case, the integrated value of the drive current applied to the ultrasonic transducer in the period of 3 msec during which the initial load of 130 g was applied to the FAB was 112.5 mA·msec.

Example 3

In Example 3, the value of the drive current applied to the ultrasonic transducer from before the FAB contacted the pad was set to 10 mA. In this case, the integrated value of the drive current applied to the ultrasonic transducer in the period of 3 msec during which the initial load of 130 g was applied to the FAB was 130 mA·msec.

Example 4

In Example 4, the value of the drive current applied to the ultrasonic transducer from before the FAB contacted the pad was set to 15 mA. In this case, the integrated value of the drive current applied to the ultrasonic transducer in the period of 3 msec during which the initial load of 130 g was applied to the FAB was 138.75 mA·msec.

Example 5

In Example 5, the value of the drive current applied to the ultrasonic transducer from before the FAB contacted the pad was set to 20 mA. In this case, the integrated value of the drive current applied to the ultrasonic transducer in the period of 3 msec during which the initial load of 130 g was applied to the FAB was 147.5 mA·msec.

Example 6

In Example 6, the value of the drive current applied to the ultrasonic transducer from before the FAB contacted the pad was set to 25 mA. In this case, the integrated value of the drive current applied to the ultrasonic transducer in the period of 3 msec during which the initial load of 130 g was applied to the FAB was 156.25 mA·msec.

Comparative Example 6

In Comparative Example 6, the value of the drive current applied to the ultrasonic transducer from before the FAB contacted the pad was set to 30 mA. In this case, the integrated value of the drive current applied to the ultrasonic transducer in the period of 3 msec during which the initial load of 130 g was applied to the FAB was 165 mA·msec.

Comparative Example 7

In Comparative Example 7, the value of the drive current applied to the ultrasonic transducer from before the FAB contacted the pad was set to 60 mA. In this case, the integrated value of the drive current applied to the ultrasonic transducer in the period of 3 msec during which the initial load of 130 g was applied to the FAB was 255 mA·msec.

Comparative Example 8

In Comparative Example 8, the value of the drive current applied to the ultrasonic transducer from before the FAB contacted the pad was set to 90 mA. That is, the drive current applied to the ultrasonic transducer does not change before and after the contacting of the FAB with the pad. In this case, the integrated value of the drive current applied to the ultrasonic transducer in the period of 3 msec during which the initial load of 130 g was applied to the FAB was 270 mA·msec.

(1) Crack Evaluation

With each of Examples 2 to 6 and Comparative Examples 6 to 8, FABs were bonded to 48 pads, whether or not a crack formed in the interlayer insulating film at the lower layer of each pad was examined, and a crack occurrence rate (number of pads with which a crack formed in the interlayer insulating film at the lower layer/48×100) was computed. The computation results are shown in FIG. 166.

As shown in FIG. 166, it was confirmed that, with each of Examples 2 to 6, with which the value of the drive current applied to the ultrasonic transducer from before the FAB contacted the pad was no more than 25 mA and the integrated value of the drive current was no more than 6.25 mA·msec, a crack did not occur in the interlayer insulating film.

On the other hand, it was confirmed that, with each of Comparative Examples 6 to 8, with which the value of the drive current applied to the ultrasonic transducer from before the FAB contacted the pad was no less than 30 mA and the integrated value of the drive current was no less than 255 mA·m, a crack occurred in the interlayer insulating film.

3. Evaluation Test 3

A capillary made by Micro-Swiss was used. The capillary has the following dimensions. The CD dimension that is the diameter of the lower end edge of the chamfer is 66 μm (0.066 mm). The T dimension that is the outer diameter of the face is 178 μm (0.178 mm). The chamfer angle, which two straight lines extending along the side surface of the chamfer form in the cross section of the capillary taken along the plane that includes the central axis (see cross section shown in FIG. 160A), is 90°. The face angle FA that is the angle that the face forms with the plane orthogonal to the central axis of the capillary is 8°. The angle, which, in the cross section of the capillary taken along the plane that includes the central axis, the portion of the side surface of the capillary that extends upward beyond the upper end of the face forms with the central axis, is 20°. The upper end portion of the face is arcuate and the OR dimension that is the radius of curvature of this portion is 20 μm (0.020 mm).

The capillary was positioned at a position of 7 mil (approximately 178 μm) height from the top surface of a pad made of an Al—Cu-based alloy and an FAB of 2.33 mil (approximately 60 μm) diameter was formed on the tip of a copper wire with a wire diameter of 25 μm. The capillary was then lowered toward the pad at a speed of 0.4 mil/msec (approximately 10.2 μm/msec) to press the FAB against the pad and form a first ball portion on the pad by deformation of the FAB. The intended diameter of the first ball portion was 74 μm and the intended bonding area of the fast ball portion with respect to the pad was 0.00430 mm$^2$.

As shown in FIG. 167, for 3 msec after contacting of the FAB with the pad, an initial load of 130 g was applied to the FAB by the capillary, and at the point of elapse of the 3 msec, the load applied to the FAB was decreased to 30 g and the state of applying the load of 30 g to the FAB was maintained for 9 msec. Thereafter, the capillary was raised.

Also, before the contacting of the FAB with the pad, a drive current was not applied to the ultrasonic transducer provided in the capillary, and after the FAB contacted the pad, the value of the drive current applied to the ultrasonic transducer was increased from 0 mA to 90 mA at a fixed rate of change and the state of applying the drive current of 90 mA to the ultrasonic transducer was maintained until the capillary was raised (until 29.5 msec elapsed from the start of descent of the capillary). Examples 7 and 8 and Comparative Examples 9 to 12 differ in a time (ramp-up time) taken for the drive current applied to the ultrasonic transducer to reach 90 mA from 0 mA.

Example 7

In Example 7, the ramp-up time was set to 3.6 msec. In other words, 30% of the bonding time was set as the ramp-up time. In this case, the integrated value of the drive current applied to the ultrasonic transducer in the period of 3 msec during which the initial load of 130 g was applied to the FAB was 112.5 mA·msec.

Example 8

In Example 8, the ramp-up time was set to 3.0 msec. In other words, 25% of the bonding time was set as the ramp-up time. In this case, the integrated value of the drive current applied to the ultrasonic transducer in the period of 3 msec during which the initial load of 130 g was applied to the FAB was 135 mA·msec.

Comparative Example 9

In Comparative Example 9, the ramp-up time was set to 2.4 msec. In other words, 20% of the bonding time was set as the ramp-up time. In this case, the integrated value of the drive current applied to the ultrasonic transducer in the period of 3 msec during which the initial load of 130 g was applied to the FAB was 162 mA·msec.

Comparative Example 10

In Comparative Example 10, the ramp-up time was set to 1.8 msec. In other words, 15% of the bonding time was set as the ramp-up time. In this case, the integrated value of the drive current applied to the ultrasonic transducer in the period of 3 msec during which the initial load of 130 g was applied to the FAB was 189 mA·msec.

Comparative Example 11

In Comparative Example 11, the ramp-up time was set to 1.2 msec. In other words, 10% of the bonding time was set as the ramp-up time. In this case, the integrated value of the drive current applied to the ultrasonic transducer in the period of 3 msec during which the initial load of 130 g was applied to the FAB was 216 mA·msec.

Comparative Example 12

In Comparative Example 6, the ramp-up time was set to 0 msec. In other words, 0% of the bonding time was set as the ramp-up time. In this case, the integrated value of the drive current applied to the ultrasonic transducer in the period of 3 msec during which the initial load of 130 g was applied to the FAB was 270 mA·msec.

Crack Evaluation

With each of Examples 7 and 8 and Comparative Examples 9 to 12, FABs were bonded to 48 pads, whether or not a crack formed in the interlayer insulating film at the lower layer of each pad was examined, and a crack occurrence rate (number of pads with which a crack formed in the interlayer insulating film at the lower layer/48×100) was computed. The computation results are shown in FIG. 168.

As shown in FIG. 168, it was confirmed that, with each of Examples 7 and 8, with which the ramp-up time was no less than 25% of the bonding time and the integrated value of the drive current was 135 mA·msec, a crack did not occur in the interlayer insulating film.

On the other hand, it was confirmed that, with each of Comparative Examples 9 to 12, with which the ramp-up time was no more than 20% of the bonding time and the integrated value of the drive current was 162 mA·m, a crack occurred in the interlayer insulating film.

From the results of evaluation tests 1 to 3, it was confirmed that a crack does not occur in the interlayer insulating film if the integrated value of the drive current applied to the ultrasonic transducer in the period of 3 msec during which the initial load of 130 g is applied to the FAB is less than 162 mA·msec.

Fourteenth Preferred Embodiment FIG. 169 to FIG. 187

By disclosure of a fourteenth preferred embodiment, a fourteenth issue concerning a fourteenth background art described below can be resolved in addition to the issues described above in the "OBJECT(S) OF THE INVENTION."

(1) Fourteenth Background Art

In a typical semiconductor device, a semiconductor chip is disposed on a die pad and leads disposed in peripheries of the semiconductor chip and the die pad are connected by wires made of Au (gold). Specifically, pads made of Al (aluminum) are disposed on a top surface of the semiconductor chip. The wires made of Au are installed so as to form arch-shaped loops between top surfaces of the pads and top surfaces of the leads.

In installing each wire (in wire bonding), an FAB (free air ball) is formed on a tip of a wire held by a capillary of a wire bonder and the FAB is put in contact with a top surface of a pad. In this process, the FAB is pressed toward the pad at a predetermined load by the capillary and a predetermined drive current is supplied to an ultrasonic transducer provided in the capillary to apply ultrasonic vibration to the FAB. Consequently, the FAB is pressed while being rubbed against the top surface of the pad and bonding of the wire to the top surface of the pad is achieved. Thereafter, the capillary is moved toward a lead. The wire is then pressed against a top surface of the lead and the wire is broken while an ultrasonic vibration is applied to the wire. The wire is thereby installed between the top surface of the pad and the top surface of the lead.

(2) Fourteenth Issue

Recently, price competition of semiconductor devices in the market is becoming severe and further reductions in costs of semiconductor devices are being demanded. As one cost reduction measure, use of wires (copper wires) made of inexpensive Cu (copper) as an alternative to wires (gold wires) made of expensive Au (gold) is being examined.

However, an FAB formed on a tip of a copper wire is harder than an FAB formed on a tip of a gold wire, and thus if a copper wire is bonded to a pad under the same conditions (magnitudes of load and ultrasonic transducer drive current, etc.) as those for a gold wire, satisfactory bonding of the copper wire and the pad cannot be obtained. Presently, conditions that enable satisfactory bonding of a copper wire and a pad to be achieved are not clear and active replacement of gold wires by copper wires is yet to take place.

Thus, a fourteenth object of the present invention related to the fourteenth preferred embodiment is to provide a wire bonding method that enables satisfactory bonding of a copper wire to a pad to be achieved.

(3) Disclosure of a Specific Preferred Embodiment

FIG. 169 is a schematic sectional view of a semiconductor device according to the fourteenth preferred embodiment of the present invention. FIG. 170 is a schematic bottom view of the semiconductor device shown in FIG. 169.

The semiconductor device 1N is a semiconductor device to which a QFN (quad flat non-leaded package) configuration is applied and has a structure in which a semiconductor chip 2N is sealed together with a die pad 3N, leads 4N, and copper wires 5N by a resin package 6N. An outer shape of the semiconductor device 1N (resin package 6N) is a flat, rectangular parallelepiped shape.

In the present preferred embodiment, the outer shape of the semiconductor device 1N is a hexahedron having a square shape of 4 mm square as a planar shape and a thickness of 0.85 mm, and dimensions of respective portions of the semiconductor device 1N cited below make up an example in the case where the semiconductor device 1N has the above outer dimensions.

The semiconductor chip 2N has a square shape of 2.3 mm in plan view, and the semiconductor chip 2N has a thickness of 0.23 mm. A plurality of pads 7N are disposed at peripheral edge portions of a top surface of the semiconductor chip 2N. Each pad 7N is electrically connected to a circuit built into the semiconductor chip 2N. A rear metal 8N made of a metal layer of Au, Ni (nickel), Ag (silver), etc., is formed on a rear surface of the semiconductor chip 2N.

The die pad 3N and the leads 4N are formed by punching out a metal thin plate (for example, a copper thin plate). The metal thin plate (die pad 3 or lead 4N) has a thickness of 0.2 mm. A plating layer 9N made of Ag is formed on top surfaces of the die pad 3N and leads 4N.

The die pad 3N has a square shape of 2.7 mm in plan view and is disposed at a central portion of the semiconductor device 1N so that its respective side surfaces are parallel to side surfaces of the semiconductor device 1N.

A recess with a substantially quarter-elliptical shape in cross section is formed by performing a squeezing process from the rear surface across an entire periphery of a peripheral edge portion of the rear surface of the die pad 3N. The resin package 6N enters the recess. The peripheral edge portion of the die pad 3N is thereby sandwiched from above and below by the resin package 6N and prevention of fall-off (retaining) of the die pad 3N with respect to the resin package 6N is thereby achieved.

Also, with the exception of the peripheral edge portion (portion recessed to the substantially quarter-elliptical shape in cross section), the rear surface of the die pad 3N is exposed from a rear surface of the resin package 6N.

An equal number of (for example, nine) leads 4N are disposed at each of positions facing the respective side surfaces of the die pad 3N. At each of the positions facing the side surfaces of the die pad 3N, the leads 4N extend in a direction orthogonal to the facing side surface and are disposed at equal intervals in a direction parallel to the side surface. A longitudinal direction length of each lead 4N is 0.45 mm. Also, an interval between the die pad 3N and the lead 4N is 0.2 mm.

A recess with a substantially quarter-elliptical shape in cross section is formed by performing a squeezing process from the rear surface at a die pad 3N side end portion of the rear surface of each lead 4N. The resin package 6N enters the recess. The die pad 3N side end portion of the lead 4N is thereby sandwiched from above and below by the resin package 6N and prevention of fall-off (retaining) of the lead 4N with respect to the resin package 6N is thereby achieved.

With the exception of the die pad 3N side end portion (portion recessed to the substantially quarter-elliptical shape in cross section), the rear surface of each lead 4N is exposed from a rear surface of the resin package 6N. Also, a side surface of the lead 4N facing the die pad 3N side is exposed from a side surface of the resin package 6N.

A plating layer 10N formed of solder is formed on portions of the rear surfaces of the die pad 3N and leads 4N that are exposed from the resin package 6N.

With its top surface with the pads 7N disposed thereon facing upward, the semiconductor chip 2N has its rear surface bonded via a bonding material 11N to the top surface (plating layer 10N) of the die pad 3N. For example, a solder paste is used as the bonding material 11N. The bonding material 11N has a thickness of 0.02 mm.

In a case where electrical connection of the semiconductor chip 2N and the die pad 3N is unnecessary, the rear metal 8N may be omitted and the rear surface of the semiconductor chip 2N may be bonded to the top surface of the die pad 3N via a bonding material made of silver paste or other insulating paste. In this case, the planar size of the semiconductor chip 2N is 2.3 mm square. Also, the plating layer 9N on the top surface of the die pad 3N may be omitted.

The copper wires 5N are made, for example, of copper with a purity of no less than 99.99%. One end of each copper wire 5N is bonded to a pad 7N of the semiconductor chip 2N. The other end of the copper wire 5N is bonded to the top surface of a lead 4N. The copper wire 5N is installed so as to form an arch-shaped loop between the semiconductor chip 2N and the lead 4N. A height difference between an apex portion of the loop of the copper wire 5N and the top surface of the semiconductor chip 2N is 0.16 mm.

As in the first preferred embodiment, in the semiconductor device 1N, the entire top surface and side surfaces of the semiconductor chip 2N, the entire top surface and side surfaces of the die pad 3N, entire top surfaces of the leads 4N, and the entire copper wires 5N are covered by an integral water-impermeable insulating film 25N.

FIG. 171 is an enlarged view of a portion surrounded by broken lines shown in FIG. 169.

Each pad 7N is made of a metal that contains Al and is formed on an uppermost interlayer insulating film 12N of the semiconductor chip 2N. A top surface protective film 13N is formed on the interlayer insulating film 12N. The pad 7N has its peripheral edge portion covered by the top surface protective film 13N and its central portion is exposed via a pad opening 14N formed in the top surface protective film 13N.

The copper wire 5N is bonded to the central portion of the pad 7N exposed from the top surface protective film 13N. As shall be described below, the copper wire 5N has an FAB formed at its tip and the FAB is pressed against and thereby bonded to the pad 7N. In this process, the FAB deforms to form a first ball portion 15N with a stepped disk shape at the portion of bonding of the copper wire 5N with the pad 7N. Also, at a periphery of the first ball portion 15N, the material of the pad 7N juts out gradually from below the first ball portion 15N so as to form a jutting portion 16N without it being lifted greatly from the top surface of the pad 7N.

For example, in a case where the copper wire 5N has a wire diameter of 25 μm, an intended diameter of the first ball portion 15N (designed diameter of the first ball portion 15N) is 76 μm, and an intended thickness of the first ball portion 15N (designed thickness of the first ball portion 15N) is 17 μm.

FIG. 172A to FIG. 172D are schematic sectional views for describing a method for manufacturing the semiconductor device according to the fourteenth preferred embodiment of the present invention in order of process.

The copper wires 5N are installed across the semiconductor chip 2N and the leads 4N by a wire bonder in a state where the die pad 3N and the leads 4N are connected to a frame (not shown) that surrounds these components, that is, in a state where the die pad 3N and leads 4N make up a lead frame.

The wire bonder includes a capillary C. As shown in FIG. 172A, the capillary C has a substantially cylindrical shape with a wire insertion hole 41N formed along a central axis. The copper wire 5N is inserted through the wire insertion hole 41N and fed out from a tip (lower end) of the wire insertion hole 41N.

A chamfer 42N of truncated conical shape that is in communication with the wire insertion hole 41N is formed below the wire insertion hole 41N at a tip portion of the capillary C. Also, the tip portion of the capillary C has a face 43N that is continuous with a lower end edge of the chamfer 42N and is a surface that faces a pad 7N and a lead 4N during bonding (during wire bonding) of the copper wire 5N to these components. An outer side of the face 43N is gradually inclined upwardly with respect to a plane orthogonal to the central axis of the capillary C.

First, as shown in FIG. 172A, the capillary C is moved to a position directly above the pad 7N. Next, in a state where a tip of the copper wire 5N is positioned at the chamfer 42N, a current is applied to a tip portion of the copper wire 5N and an FAB 44 is thereby formed at the tip portion. The value and application time of the current are set suitably in accordance with the wire diameter of the copper wire 5N and an intended diameter of the FAB 44 (designed diameter of the FAB 44). A portion of the FAB 44 protrudes below the chamfer 42N.

Thereafter, as shown in FIG. 172B, the capillary C is lowered toward the pad 7N and the FAB 44 is pressed against the pad 7N by the capillary C. In this process, a load is applied to the FAB 44 by the capillary C and ultrasonic vibration, emitted from an ultrasonic transducer (not shown) provided in the capillary C, is applied to the FAB 44.

FIG. 173 is a graph of changes with time of the load applied to the FAB and a driving current applied to the ultrasonic transducer during the bonding of the FAB to the pad.

For example, as shown in FIG. 173, a relatively large initial load P1 is applied from the capillary C to the FAB 44 from a time T1 at which the FAB 44 contacts the pad 7N to a time T2 after elapse of a predetermined time period. The predetermined time period is set, for example, to 3 msec. Also, the initial load P1 is set based on a value obtained by multiplying an intended bonding area of the first ball portion 15N with respect to the pad 7N (designed bonding area of the first ball portion 15N with respect to the pad 7) by a fixed factor (for example, 28786 in a case where the unit of the initial load P1 is g and the unit of the bonding area is $mm^2$). From the time T2 onward, the load applied to the FAB 44 from the capillary C is lowered and a relatively small load P2 is applied to the FAB 44. The load P2 is applied continuously until a time T4 at which the capillary C is raised.

Meanwhile, when the FAB 44 contacts the pad 7N, supplying of a drive current to the ultrasonic transducer is started, and from that time T1 to a time T3, the value of the drive current is raised at a fixed rate of change (monotonously) to a value U. The value U of the drive current applied to the ultrasonic transducer from the time T3 onward is set so that a value obtained by dividing the value U by the intended bonding area of the first ball portion 15N is no more than 0.0197 mA/$\mu m^2$. Thereafter, the drive current of the value U continues to be applied to the ultrasonic transducer until a time T4.

Consequently, the FAB 44 deforms along the shapes of the chamfer 42N and the face 43N of the capillary C, and the first ball portion 15N with a stepped disk shape is formed on the pad 7N with the jutting portion 16N being formed along its periphery as shown in FIG. 171. Bonding (first bonding) of the copper wire 5N with the pad 7N is thereby achieved. When the time T4 arrives upon elapse of a bonding time determined in advance from the time T1, the capillary C separates upwardly from the pad 7N. Thereafter, the capillary C is moved obliquely downward toward the top surface of the lead 4N. Then, as shown in FIG. 172C, the drive current is applied to the ultrasonic transducer, and while ultrasonic vibration is being applied to the capillary C, the copper wire 5N is pressed against the top surface of the lead 4N by the capillary C and then broken. A stitch portion with a wedge shape in side view that is made up of the other end portion of the copper wire 5N is thereby formed on the top surface of the lead 4N and the bonding (second bonding) of the copper wire with respect to the lead 4N is thereby achieved.

Thereafter, the processes shown in FIG. 172A to FIG. 172C are performed on another pad 7N and the corresponding lead 4N. By the processes shown in FIG. 172A to FIG. 172C then being repeated, copper wires 5N are installed across all pads 7N of the semiconductor chip 2N and the leads 4N as shown in FIG. 172D. After the end of all of the wire bonding, the water-impermeable insulating film 25N is formed by the same method as that of FIG. 4D.

<Setting of the Predetermined Time Period>

The following tests 1 to 3 were performed to appropriately set the predetermined time period during which the initial load P1 is applied to an FAB.

(1) Test 1

An FAB 44 was formed at a tip of a copper wire 5N of 25 μm wire diameter, the capillary C was lowered toward a pad 7N, the FAB 44 was pressed against the pad 7N, and a fixed load was applied to the FAB 44 to form a first ball portion 15N on the pad 7N by deformation of the FAB 44. The intended diameter of the first ball portion 15N was 58 μm and the intended thickness thereof was 10 μm. For each of cases where the magnitude of the load applied to the FAB 44 was set to 50 g, 80 g, and 110 g, changes of the diameter and the thickness of the first ball portion 15N with time elapsed from the contacting of the FAB 44 with the pad 7N were examined. Changes with time of the diameter (ball diameter) are shown in FIG. 174, and changes with time of the thickness (ball thicknesses) are shown in FIG. 175.

(2) Test 2

An FAB 44 was formed at a tip of a copper wire 5N of 25 μm wire diameter, the capillary C was lowered toward a pad 7N, the FAB 44 was pressed against the pad 7N, and a fixed load was applied to the FAB 44 to form a first ball portion 15N on the pad 7N by deformation of the FAB 44. The intended diameter of the first ball portion 15N was 76 μm and the intended thickness thereof was 18 μm. For each of cases where the magnitude of the load applied to the FAB 44 was set to 70 g, 90 g, 110 g, 130 g, 150 g, and 200 g, changes of the diameter and the thickness of the first ball portion 15N with time elapsed from the contacting of the FAB 44 with the pad 7N were examined. Changes with time of the diameter (ball diameter) are shown in FIG. 176, and changes with time of the thickness (ball thicknesses) are shown in FIG. 177.

(3) Test 3

An FAB 44 was formed at a tip of a copper wire 5N of 38 μm wire diameter, the capillary C was lowered toward a pad 7N, the FAB 44 was pressed against the pad 7N, and a fixed load was applied to the FAB 44 to form a first ball portion 15N on the pad 7N by deformation of the FAB 44. The intended diameter of the first ball portion 15N was 104 μm and the intended thickness thereof was 25 μm. For each of cases where the magnitude of the load applied to the FAB 44 was set to 200 g, 230 g, 250 g, 300 g, 400 g, and 500 g, changes of the diameter and the thickness of the first ball portion 15N with time elapsed from the contacting of the FAB 44 with the pad 7N were examined. Changes with time of the diameter (ball diameter) are shown in FIG. 178, and changes with time of the thickness (ball thicknesses) are shown in FIG. 179.

As can be understood from reference to FIG. 174 to FIG. 179, regardless of the wire diameter of the copper wire 5N, the magnitude of the load, and the intended diameter and intended thickness of the first ball portion 15N, the deformation of the FAB 44 is not completed in less than 2 msec from contact with the pad 7N. On the other hand, it is considered that, beyond 4 msec from the contacting of the FAB 44 with the pad 7N, the diameter and thickness of the FAB 44 are substantially unchanged and the deformation of the FAB 44 is reliably completed. To be more detailed, it is considered that, regardless of the wire diameter of the copper wire 5N, the magnitude of the load, and the intended diameter and intended thickness of the first ball portion 15N, the changes of the diameter and thickness of the FAB 44 are ended and the deformation of the FAB 44 is completed at a point of elapse of substantially 3 msec from the contacting of the FAB 44 with the pad 7N.

It is thus considered that the predetermined time period during which the initial load P1 is applied to an FAB is appropriately in a range of 2 to 4 msec and is more appropriately 3 msec.

As described above, after the FAB 44 formed on the tip of the copper wire 5N is put in contact with a pad, a load is applied to the FAB 44 by the capillary C. Also, in parallel, a drive current is applied to the ultrasonic transducer provided in the capillary C. Thus, while the FAB 44 is deformed by the load, the FAB is rubbed against the pad 7N by the ultrasonic vibration propagating from the ultrasonic transducer.

The value of the drive current applied to the ultrasonic transducer after elapse of the predetermined time period from the contacting of the FAB 44 with the pad 7N is set so that the value obtained by dividing the drive current value by the intended bonding area of the first ball portion 15N is no more than 0.0197 mA/$\mu m^2$. Application of ultrasonic vibration of an excessive energy amount to the FAB 44 after the predetermined time period from the contacting of the FAB 44 with the pad 7N can thereby be prevented.

Satisfactory bonding of the copper wire 5N (FAB 44) to the pad 7N can thereby be achieved while preventing occurrence of crack or other damage in the pad 7N and the interlayer insulating film 12N below the pad 7N due to excessive energy of the ultrasonic vibration.

The deformation of the FAB 44 due to the load ends within 3 msec from the contacting of the FAB 44 with the pad 7N. That is, the shape of the FAB 44 after completion of bonding (first ball portion) is completed within 3 msec from the contacting of the FAB 44 with the pad 7N. When the deformation of the FAB 44 ends, the ultrasonic vibration applied to the FAB 44 propagates to the bonding portion of the FAB 44 and the pad 7N substantially without attenuation. Thus, when ultrasonic vibration of an excessive energy amount is applied to the FAB 44 after the end of deformation of the FAB 44, crack or other damage may occur in the pad 7N or the interlayer insulating film 12N below a peripheral edge portion of the first ball portion 15N.

The predetermined time period is thus set to the time period from the point of contacting of the FAB 44 with the pad 7N to the point at which the deformation of the FAB 44 ends substantially, that is, to 3 msec. Occurrence of damage in the pad 7N or the interlayer insulating film 12N below the peripheral edge portion of the first ball portion 15N can thereby be prevented.

Also, if the large initial load P1 continues to be applied to the first ball portion 15N after completion of the shape of the first ball portion 15N, the ultrasonic vibration will not propagate satisfactorily to the portion of contact of the first ball portion 15N and the pad 7N.

Thus, when the predetermined time period elapses from the contacting of the FAB 44 with the pad 7N, the load applied to the FAB 44 by the capillary C is decreased from the initial load P1 to the lower load P2. By the relatively large initial load P1 being applied to the FAB 44 after contacting of the FAB 44 with the pad 7N, the FAB 44, which is made of Cu that is a harder metal than Au, can be deformed satisfactorily. When the predetermined time period elapses from the contacting of the FAB 44 with the pad 7N, the load applied to the FAB 44 is decreased to the load P2 and thus the ultrasonic vibration can be made to propagate satisfactorily to the portion of contact of the FAB 44 (first ball portion 15N) and the pad 7N.

The magnitude of the initial load P1 is preferably set based on a value obtained by multiplying the intended bonding area of the first ball portion 15N with respect to the pad 7N by a fixed factor. The magnitude of the initial load P1 can thereby be set appropriately in accordance with the intended bonding area of the first ball portion 15N. Consequently, satisfactory deformation of the FAB 44 can be achieved while satisfactorily preventing the occurrence of damage in the pad 7N and the interlayer insulating layer 12N below the central portion of the first ball portion 15N.

After the FAB 44 contacts the pad 7N, the value of the drive current applied to the ultrasonic transducer is increased gradually at the fixed rate of change. Meanwhile, the load is applied to the FAB so that the FAB 44 deforms in a squeezed manner and an area of the portion of contact of the FAB 44 and the pad 7N increases gradually. The ultrasonic vibration energy propagating from the ultrasonic transducer to the FAB 44 is thereby increased gradually and the area of the FAB 44 rubbed against the pad 7N also increases gradually. Consequently, a state of satisfactory bonding to the pad 7N can be realized up to the peripheral edge portion of the surface of bonding of the first ball portion 15N to the pad 7N while suppressing occurrence of damage in the pad 7N and the interlayer insulating film 12N due to rapid increase of the ultrasonic vibration energy propagating to the FAB 44 below a central portion of the first ball portion 15N.

Although the fourteenth preferred embodiment of the present invention has been described above, the fourteenth preferred embodiment may also be modified as follows.

For example, although a QFN package type is applied to the semiconductor device 1N, the present invention may also be applied to the manufacture of a semiconductor device to which another type of non-leaded package, such as an SON (small outlined non-leaded package), is applied.

The present invention may also be applied to the manufacture of not only semiconductor devices to which a so-called singulation type package, with end surfaces of leads being made flush with side surfaces of a resin package, is applied but also semiconductor devices to which a lead cut type non-leaded package, with leads projecting from side surfaces of a resin package, is applied.

Further, the present invention may be applied to the manufacture of not only semiconductor devices to which a non-leaded package is applied but also semiconductor devices to which a QFP (quad flat package) or other package having outer leads formed by leads projecting from a resin package is applied.

Also, although with the above-described preferred embodiment, a mode in which the copper wires 5N are covered by the water-impermeable insulating film 25N was described as an example, the water-impermeable insulating film 25N may be omitted as shown in FIG. 180 as long as at least the fourteenth object for resolving the fourteenth issue is achieved.

Next, experiments related to the present fourteenth preferred embodiment were performed. In addition, the present invention is not restricted to the examples described below.

1. Evaluation Test 1

A capillary made by Micro-Swiss was used. The capillary has the following dimensions. The CD dimension that is the diameter of the lower end edge of the chamfer is 66 μm (0.066 mm). The T dimension that is the outer diameter of the face is 178 μm (0.178 mm). The chamfer angle, which two straight lines extending along the side surface of the chamfer form in a cross section of the capillary taken along the plane that includes the central axis (see cross section shown in FIG. 172A), is 90°. The face angle that is the angle that the face forms with the plane orthogonal to the central axis of the capillary is 8°. The angle, which, in the cross section of the capillary taken along the plane that includes the central axis, the portion of the side surface of the capillary that extends upward beyond the upper end of the face forms with the central axis, is 20°. The upper end portion of the face is arcuate and the OR dimension that is the radius of curvature of this portion is 20 μm (0.020 mm).

The capillary was positioned at a position of 7 mil (approximately 178 μm) height from a top surface of a pad made of an Al—Cu-based alloy and an FAB of 45 μm diameter was formed on a tip of a copper wire with a wire diameter of 25 μm. The capillary was then lowered toward the pad at a speed of 0.4 mil/msec (approximately 10.2 μm/msec) to press the FAB against the pad and form a first ball portion on the pad by deformation of the FAB. The intended diameter of the first ball portion was 60 μm, the intended thickness of the first ball portion was 13 μm, and the intended bonding area of the first ball portion with respect to the pad was 2826 μm$^2$.

As shown in FIG. 181, for 3 msec after contacting of the FAB with the pad, an initial load of 80 g was applied to the FAB by the capillary, and at the point of elapse of the 3 msec, the load applied to the FAB was decreased to 30 g and the state of applying the load of 30 g to the FAB was maintained for 9 msec. Thereafter, the capillary was raised.

Also, supplying of the drive current to the ultrasonic transducer provided in the capillary was started when the FAB contacted the pad, and thereafter, the value of the drive current was raised to a predetermined value at a fixed rate of change in a period of 3.6 msec and then a state of applying the drive current of the predetermined value to the ultrasonic transducer was maintained until the capillary was raised (for 8.4 msec). Examples 1 to 3 and Comparative Examples 1 to 4 differ in the predetermined value that is the value of the drive current applied to the ultrasonic transducer in the final stage.

Example 1

In Example 1, the predetermined value was set to 40 mA.

Example 2

In Example 2, the predetermined value was set to 50 mA.

Example 3

In Example 3, the predetermined value was set to 60 mA.

Comparative Example 1

In Comparative Example 1, the predetermined value was set to 70 mA.

Comparative Example 2

In Comparative Example 2, the predetermined value was set to 80 mA.

Comparative Example 3

In Comparative Example 3, the predetermined value was set to 90 mA.

Comparative Example 4

In Comparative Example 4, the predetermined value was set to 100 mA.

<Crack Evaluation>

With each of Examples 1 to 3 and Comparative Examples 1 to 4, FABs were bonded to 84 pads, whether or not a crack formed in the interlayer insulating film at the lower layer of each pad was examined, and a crack occurrence rate (number of pads with which a crack formed in the interlayer insulating film at the lower layer/84×100) was computed. The computation results are shown in FIG. 182.

As shown in FIG. 182, it was confirmed that, with each of Examples 1 to 3, with which the predetermined value was no more than 60 mA and the value obtained by dividing the predetermined value by the intended bonding area of the first ball portion was no more than 0.0212 mA/μm$^2$, a crack did not occur in the interlayer insulating film.

On the other hand, it was confirmed that, with each of Comparative Examples 1 to 4, with which the predetermined value was no less than 70 mA and the value obtained by dividing the predetermined value by the intended bonding area of the first ball portion was no less than 0.0248 mA/μm$^2$, a crack occurred in the interlayer insulating film.

2. Evaluation Test 2

A capillary made by Micro-Swiss was used. The capillary has the following dimensions. The CD dimension that is the diameter of the lower end edge of the chamfer is 66 μm (0.066 mm). The T dimension that is the outer diameter of the face is 178 μm (0.178 mm). The chamfer angle, which two straight lines extending along the side surface of the chamfer form in a cross section of the capillary taken along the plane that includes the central axis (see cross section shown in FIG. 172A), is 90°. The face angle FA that is the angle that the face forms with the plane orthogonal to the central axis of the capillary is 8°. The angle, which, in the cross section of the capillary taken along the plane that includes the central axis, the portion of the side surface of the capillary that extends upward beyond the upper end of the face forms with the central axis, is 20°. The upper end portion of the face is arcuate and the OR dimension that is the radius of curvature of this portion is 20 μm (0.020 mm).

The capillary was positioned at a position of 7 mil (approximately 178 μm) height from a top surface of a pad made of an Al—Cu-based alloy and an FAB of 59 μm diameter was formed on a tip of a copper wire with a wire diameter of 30 μm (or a wire diameter of 25 μm). The capillary was then lowered toward the pad at a speed of 0.4 mil/msec (approximately 10.2 μm/msec) to press the FAB against the pad and form a first ball portion on the pad by deformation of the FAB. The intended diameter of the first ball portion was 76 μm, the intended thickness of the first ball portion was 17 μm, and the intended bonding area of the first ball portion with respect to the pad was 4534.16 $\mu m^2$.

As shown in FIG. 183, for 3 msec after contacting of the FAB with the pad, an initial load of 130 g was applied to the FAB by the capillary, and at the point of elapse of the 3 msec, the load applied to the FAB was decreased to 30 g and the state of applying the load of 30 g to the FAB was maintained for 9 msec. Thereafter, the capillary was raised.

Also, supplying of the drive current to the ultrasonic transducer provided in the capillary was started when the FAB contacted the pad, and thereafter, the value of the drive current was raised to a predetermined value at a fixed rate of change in a period of 3.6 msec and then a state of applying the drive current of the predetermined value to the ultrasonic transducer was maintained until the capillary was raised (for 8.4 msec). Examples 4 and 5 and Comparative Examples 5 to 9 differ in the predetermined value that is the value of the drive current applied to the ultrasonic transducer in the final stage.

Example 4

In Example 4, the predetermined value was set to 90 mA.

Example 5

In Example 5, the predetermined value was set to 100 mA.

Comparative Example 5

In Comparative Example 5, the predetermined value was set to 110 mA.

Comparative Example 6

In Comparative Example 6, the predetermined value was set to 120 mA.

Comparative Example 7

In Comparative Example 7, the predetermined value was set to 130 mA.

Comparative Example 8

In Comparative Example 8, the predetermined value was set to 140 mA.

Comparative Example 9

In Comparative Example 9, the predetermined value was set to 150 mA.

<Crack Evaluation>

With each of Examples 4 and 5 and Comparative Examples 5 to 9, FABs were bonded to 84 pads, whether or not a crack formed in the interlayer insulating film at the lower layer of each pad was examined, and a crack occurrence rate (number of pads with which a crack formed in the interlayer insulating film at the lower layer/84×100) was computed. The computation results are shown in FIG. 184.

As shown in FIG. 184, it was confirmed that, with each of Examples 4 and 5, with which the predetermined value was no more than 100 mA and the value obtained by dividing the predetermined value by the intended bonding area of the first ball portion was no more than 0.0221 mA/$\mu m^2$, a crack did not occur in the interlayer insulating film.

On the other hand, it was confirmed that, with each of Comparative Examples 5 to 9, with which the predetermined value was no less than 110 mA and the value obtained by dividing the predetermined value by the intended bonding area of the first ball portion was no less than 0.0243 mA/$\mu m^2$, a crack occurred in the interlayer insulating film.

3. Evaluation Test 3

A capillary made by Micro-Swiss was used. The capillary has the following dimensions. The CD dimension that is the diameter of the lower end edge of the chamfer is 66 μm (0.066 mm). The T dimension that is the outer diameter of the face is 178 μm (0.178 mm). The chamfer angle, which two straight lines extending along the side surface of the chamfer form in a cross section of the capillary taken along the plane that includes the central axis (see cross section shown in FIG. 172A), is 90°. The face angle that is the angle that the face forms with the plane orthogonal to the central axis of the capillary is 8°. The angle, which, in the cross section of the capillary taken along the plane that includes the central axis, the portion of the side surface of the capillary that extends upward beyond the upper end of the face forms with the central axis, is 20°. The upper end portion of the face is arcuate and the OR dimension that is the radius of curvature of this portion is 20 μm (0.020 mm).

The capillary was positioned at a position of 7 mil (approximately 178 μm) height from a top surface of a pad made of an Al—Cu-based alloy and an FAB of 45 μm diameter was formed on a tip of a copper wire with a wire diameter of 38 μm. The capillary was then lowered toward the pad at a speed of 0.4 mil/msec (approximately 10.2 μm/msec) to press the FAB against the pad and form a first ball portion on the pad by deformation of the FAB. The intended diameter of the first ball portion was 104 μm, the intended thickness of the first ball portion was 24 μm, and the intended bonding area of the first ball portion with respect to the pad was 8490.56 $\mu m^2$.

As shown in FIG. 185, for 3 msec after contacting of the FAB with the pad, an initial load of 240 g was applied to the FAB by the capillary, and at the point of elapse of the 3 msec, the load applied to the FAB was decreased to 30 g and the state of applying the load of 30 g to the FAB was maintained for 9 msec. Thereafter, the capillary was raised.

Also, supplying of the drive current to the ultrasonic transducer provided in the capillary was started when the FAB contacted the pad, and thereafter, the value of the drive current was raised to a predetermined value at a fixed rate of change in a period of 3.6 msec and then a state of applying the drive current of the predetermined value to the ultrasonic transducer was maintained until the capillary was raised (for 8.4 msec). Examples 6 to 8 and Comparative Examples 10 to 13 differ in the predetermined value that is the value of the drive current applied to the ultrasonic transducer in the final stage.

Example 6

In Example 6, the predetermined value was set to 90 mA.

Example 7

In Example 7, the predetermined value was set to 150 mA.

Example 8

In Example 8, the predetermined value was set to 160 mA.

Comparative Example 10

In Comparative Example 10, the predetermined value was set to 170 mA.

Comparative Example 11

In Comparative Example 11, the predetermined value was set to 180 mA.

Comparative Example 12

In Comparative Example 12, the predetermined value was set to 190 mA.

Comparative Example 13

In Comparative Example 13, the predetermined value was set to 200 mA.

<Crack Evaluation>

With each of Examples 6 to 8 and Comparative Examples 10 to 13, FABs were bonded to 84 pads, whether or not a crack formed in the interlayer insulating film at the lower layer of each pad was examined, and a crack occurrence rate (number of pads with which a crack formed in the interlayer insulating film at the lower layer/84×100) was computed. The computation results are shown in FIG. 186.

As shown in FIG. 186, it was confirmed that, with each of Examples 1 to 3, with which the predetermined value was no more than 160 mA and the value obtained by dividing the predetermined value by the intended bonding area of the first ball portion was no more than 0.0188 mA/$\mu m^2$, a crack did not occur in the interlayer insulating film.

On the other hand, it was confirmed that, with each of Comparative Examples 1 to 4, with which the predetermined value was no less than 170 mA and the value obtained by dividing the predetermined value by the intended bonding area of the first ball portion was no less than 0.0200 mA/$\mu m^2$, a crack occurred in the interlayer insulating film.

<Bonding Area—Drive Current of Ultrasonic Transducer>

FIG. 187 shows a plot of the values of the drive current applied to the ultrasonic transducer in Examples 3, 5, and 8 on a graph area having the intended bonding area of the first ball portion as the X axis and the drive current of the ultrasonic transducer as the Y axis, and it was confirmed that there is a proportional relationship expressed by y=0.0197× between the intended bonding area and the value of the drive current of the ultrasonic transducer.

Fifteenth Preferred Embodiment FIG. 188 to FIG. 203

By disclosure of a fifteenth preferred embodiment, a fifteenth issue concerning a fifteenth background art described below can be resolved in addition to the issues described above in the "OBJECT(S) OF THE INVENTION."

(1) Fifteenth Background Art

In a typical semiconductor device, a semiconductor chip is disposed on a die pad and leads disposed in peripheries of the semiconductor chip and the die pad are connected by wires made of Au (gold). Specifically, pads made of Al (aluminum) are disposed on a top surface of the semiconductor chip. The wires made of Au are installed so as to form arch-shaped loops between top surfaces of the pads and top surfaces of the leads.

In installing each wire (in wire bonding), an FAB (free air ball) is formed on a tip of a wire held by a capillary of a wire bonder and the FAB is put in contact with a top surface of a pad. In this process, the FAB is pressed toward the pad at a predetermined load by the capillary and a predetermined drive current is supplied to an ultrasonic transducer provided in the capillary to apply ultrasonic vibration to the FAB. Consequently, the FAB is pressed while being rubbed against the top surface of the pad and bonding of the wire to the top surface of the pad is achieved. Thereafter, the capillary is moved toward a lead. The wire is then pressed against a top surface of the lead and the wire is broken while an ultrasonic vibration is applied to the wire. The wire is thereby installed between the top surface of the pad and the top surface of the lead.

(2) Fifteenth Issue

Recently, price competition of semiconductor devices in the market is becoming severe and further reductions in costs of semiconductor devices are being demanded. As one cost reduction measure, use of wires (copper wires) made of inexpensive Cu (copper) as an alternative to wires (gold wires) made of expensive Au is being examined.

However, an FAB formed on a tip of a copper wire is harder than an FAB formed on a tip of a gold wire, and thus if a copper wire is bonded to a pad under the same conditions (magnitudes of load and ultrasonic transducer drive current, etc.) as those for a gold wire, satisfactory bonding of the copper wire and the pad cannot be obtained. Presently, conditions that enable satisfactory bonding of a copper wire and a pad to be achieved are not clear and active replacement of gold wires by copper wires is yet to take place.

Thus, a fifteenth object of the present invention related to the fifteenth preferred embodiment is to provide a wire bonding method that enables satisfactory bonding of a copper wire to a pad to be achieved.

(3) Disclosure of a Specific Preferred Embodiment

FIG. 188 is a schematic sectional view of a semiconductor device according to the fifteenth preferred embodiment of the present invention. FIG. 189 is a schematic bottom view of the semiconductor device shown in FIG. 188.

The semiconductor device 1P is a semiconductor device to which a QFN (quad flat non-leaded package) configuration is applied and has a structure in which a semiconductor chip 2P is sealed together with a die pad 3P, leads 4P, and copper wires 5P by a resin package 6P. An outer shape of the semiconductor device 1P (resin package 6P) is a flat, rectangular parallelepiped shape.

In the present preferred embodiment, the outer shape of the semiconductor device 1P is a hexahedron having a square shape of 4 mm square as a planar shape and a thickness of 0.85 mm, and dimensions of respective portions of the semiconductor device 1P cited below make up an example in the case where the semiconductor device 1P has the above outer dimensions.

The semiconductor chip 2P has a square shape of 2.3 mm in plan view, and the semiconductor chip 2P has a thickness of 0.23 mm. A plurality of pads 7P are disposed at peripheral edge portions of a top surface of the semiconductor chip 2P. Each pad 7P is electrically connected to a circuit built into the semiconductor chip 2P. A rear metal 8P made of a metal layer of Au, Ni (nickel), Ag (silver), etc., is formed on a rear surface of the semiconductor chip 2P.

The die pad 3P and the leads 4P are formed by punching out a metal thin plate (for example, a copper thin plate). The metal thin plate (die pad 3 or lead 4P) has a thickness of 0.2 mm. A plating layer 9P made of Ag is formed on top surfaces of the die pad 3P and leads 4P.

The die pad 3P has a square shape of 2.7 mm in plan view and is disposed at a central portion of the semiconductor device 1P so that its respective side surfaces are parallel to side surfaces of the semiconductor device 1P.

A recess with a substantially quarter-elliptical shape in cross section is formed by performing a squeezing process from the rear surface across an entire periphery of a peripheral edge portion of the rear surface of the die pad 3P. The resin package 6P enters the recess. The peripheral edge portion of the die pad 3P is thereby sandwiched from above and below by the resin package 6P and prevention of fall-off (retaining) of the die pad 3P with respect to the resin package 6P is thereby achieved.

Also, with the exception of the peripheral edge portion (portion recessed to the substantially quarter-elliptical shape in cross section), the rear surface of the die pad 3P is exposed from a rear surface of the resin package 6P.

An equal number of (for example, nine) leads 4P are disposed at each of positions facing the respective side surfaces of the die pad 3P. At each of the positions facing the side surfaces of the die pad 3P, the leads 4P extend in a direction orthogonal to the facing side surface and are disposed at equal intervals in a direction parallel to the side surface. A longitudinal direction length of each lead 4P is 0.45 mm. Also, an interval between the die pad 3P and the lead 4P is 0.2 mm.

A recess with a substantially quarter-elliptical shape in cross section is formed by performing a squeezing process from the rear surface at a die pad 3P side end portion of the rear surface of each lead 4P. The resin package 6P enters the recess. The die pad 3P side end portion of the lead 4P is thereby sandwiched from above and below by the resin package 6P and prevention of fall-off (retaining) of the lead 4P with respect to the resin package 6P is thereby achieved.

With the exception of the die pad 3P side end portion (portion recessed to the substantially quarter-elliptical shape in cross section), the rear surface of each lead 4P is exposed from a rear surface of the resin package 6P. Also, a side surface of the lead 4P facing the die pad 3P side is exposed from a side surface of the resin package 6P.

A plating layer 10P formed of solder is formed on portions of the rear surfaces of the die pad 3P and leads 4P that are exposed from the resin package 6P.

With its top surface with the pads 7P disposed thereon facing upward, the semiconductor chip 2P has its rear surface bonded via a bonding material 11P to the top surface (plating layer 10P) of the die pad 3P. For example, a solder paste is used as the bonding material 11P. The bonding material 11P has a thickness of 0.02 mm.

In a case where electrical connection of the semiconductor chip 2P and the die pad 3P is unnecessary, the rear metal 8P may be omitted and the rear surface of the semiconductor chip 2P may be bonded to the top surface of the die pad 3P via a bonding material made of silver paste or other insulating paste. In this case, the planar size of the semiconductor chip 2P is 2.3 mm square. Also, the plating layer 9P on the top surface of the die pad 3P may be omitted.

The copper wires 5P are made, for example, of copper with a purity of no less than 99.99%. One end of each copper wire 5P is bonded to a pad 7P of the semiconductor chip 2P. The other end of the copper wire 5P is bonded to the top surface of a lead 4P. The copper wire 5P is installed so as to form an arch-shaped loop between the semiconductor chip 2P and the lead 4P. A height difference between an apex portion of the loop of the copper wire 5P and the top surface of the semiconductor chip 2P is 0.16 mm.

As in the first preferred embodiment, in the semiconductor device 1P, the entire top surface and side surfaces of the semiconductor chip 2P, the entire top surface and side surfaces of the die pad 3P, entire top surfaces of the leads 4P, and the entire copper wires 5P are covered by an integral water-impermeable insulating film 25P.

FIG. 190 is an enlarged view of a portion surrounded by broken lines shown in FIG. 188.

Each pad 7P is made of a metal that contains Al and is formed on an uppermost interlayer insulating film 12P of the semiconductor chip 2P. A top surface protective film 13P is formed on the interlayer insulating film 12P. The pad 7P has its peripheral edge portion covered by the top surface protective film 13P and its central portion is exposed via a pad opening 14P formed in the top surface protective film 13P.

The copper wire 5P is bonded to the central portion of the pad 7P exposed from the top surface protective film 13P. As shall be described below, the copper wire 5P has an FAB formed at its tip and the FAB is pressed against and thereby bonded to the pad 7P. In this process, the FAB deforms to form a first ball portion 15P with a stepped disk shape at the portion of bonding of the copper wire 5P with the pad 7P. Also, at a periphery of the first ball portion 15P, the material of the pad 7P juts out gradually from below the first ball portion 15P so as to form a jutting portion 16P without it being lifted greatly from the top surface of the pad 7P.

For example, in a case where the copper wire 5P has a wire diameter of 25 μm, an intended diameter of the first ball portion 15P (designed diameter of the first ball portion 15P) is 76 μm, and an intended thickness of the first ball portion 15P (designed thickness of the first ball portion 15P) is 17 μm. FIG. 191A to FIG. 191D are schematic sectional views for describing a method for manufacturing the semiconductor device according to the fifteenth preferred embodiment of the present invention in order of process.

The copper wires 5P are installed across the semiconductor chip 2P and the leads 4P by a wire bonder in a state where the die pad 3P and the leads 4P are connected to a frame (not shown) that surrounds these components, that is, in a state where the die pad 3P and leads 4P make up a lead frame.

The wire bonder includes a capillary C. As shown in FIG. 191A, the capillary C has a substantially cylindrical shape with a wire insertion hole 41P formed along a central axis. The copper wire 5P is inserted through the wire insertion hole 41P and fed out from a tip (lower end) of the wire insertion hole 41P.

A chamfer 42P of truncated conical shape that is in communication with the wire insertion hole 41P is formed below the wire insertion hole 41P at a tip portion of the capillary C. Also, the tip portion of the capillary C has a face 43P that is continuous with a lower end edge of the chamfer 42P and is a surface that faces a pad 7P and a lead 4P during bonding (during wire bonding) of the copper wire 5P to these components. An outer side of the face 43P is gradually inclined upwardly with respect to a plane orthogonal to the central axis of the capillary C.

First, as shown in FIG. 191A, the capillary C is moved to a position directly above the pad 7P. Next, in a state where a tip of the copper wire 5P is positioned at the chamfer 42P, a current is applied to a tip portion of the copper wire 5P and an FAB 44 is thereby formed at the tip portion. The value and application time of the current are set suitably in accordance with the wire diameter of the copper wire 5P and an intended diameter of the FAB 44 (designed diameter of the FAB 44). A portion of the FAB 44 protrudes below the chamfer 42P.

Thereafter, as shown in FIG. 191B, the capillary C is lowered toward the pad 7P and the FAB 44 is pressed against the pad 7P by the capillary C. In this process, a load is applied to the FAB 44 by the capillary C and ultrasonic vibration, emitted from an ultrasonic transducer (not shown) provided in the capillary C, is applied to the FAB 44.

FIG. 192 is a graph of changes with time of the load applied to the FAB and a driving current applied to the ultrasonic transducer during the bonding of the FAB to the pad.

For example, as shown in FIG. 192, a relatively large initial load P1 is applied from the capillary C to the FAB 44 from a time T1 at which the FAB 44 contacts the pad 7P to a time T2 after elapse of a predetermined time period. The predetermined time period is set, for example, to 3 msec. Also, the initial load P1 is set based on a value obtained by multiplying an intended bonding area of the first ball portion 15P with respect to the pad 7P (designed bonding area of the first ball portion 15P with respect to the pad 7P) by a fixed factor (for example, 28786 in a case where the unit of the initial load P1 is g and the unit of the bonding area is $mm^2$). By the application of the initial load to the FAB 44, the FAB 44 deforms along the shapes of the chamfer 42P and the face 43P of the capillary C and the first ball portion 15P of stepped disk shape is thereby formed on the pad 7P as shown in FIG. 190

From the time T2 onward, the load applied to the FAB 44 from the capillary C is lowered and a relatively small load P2 is applied to the FAB 44. The load P2 is applied continuously until a time T4 at which the capillary C is raised.

Also, when a time T3 subsequent to the time T2 arrives, supplying of a drive current to the ultrasonic transducer is started. The value of the drive current supplied to the ultrasonic transducer is raised instantaneously from zero to a value U. Thereafter, the drive current of the value U continues to be applied to the ultrasonic transducer until a time T4 arrives. By the drive current being supplied to the ultrasonic transducer, ultrasonic vibration is emitted from the ultrasonic transducer, and by propagation of the ultrasonic vibration to the FAB 44, the FAB 44 is rubbed against the pad 7P. Consequently, the jutting portion 16P is formed at the periphery of the pad 7P as shown in FIG. 190. Bonding (first bonding) of the copper wire 5P with the pad 7P is thereby achieved.

When the time T4 arrives upon elapse of a bonding time determined in advance from the time T1, the capillary C separates upwardly from the pad 7P. Thereafter, the capillary C is moved obliquely downward toward the top surface of the lead 4P. Then, as shown in FIG. 191C, the drive current is applied to the ultrasonic transducer, and while ultrasonic vibration is being applied to the capillary C, the copper wire 5P is pressed against the top surface of the lead 4P by the capillary C and then broken. A stitch portion with a wedge shape in side view that is made up of the other end portion of the copper wire 5P is thereby formed on the top surface of the lead 4P and the bonding (second bonding) of the copper wire with respect to the lead 4P is thereby achieved.

Thereafter, the processes shown in FIG. 191A to FIG. 191C are performed on another pad 7P and the corresponding lead 4P. By the processes shown in FIG. 191A to FIG. 191C then being repeated, copper wires 5P are installed across all pads 7P of the semiconductor chip 2P and the leads 4P as shown in FIG. 191D. After the end of all of the wire bonding, the water-impermeable insulating film 25P is formed by the same method as that of FIG. 4D.

<Setting of the Predetermined Time Period>

The following tests 1 to 3 were performed to appropriately set the predetermined time period during which the initial load P1 is applied to an FAB.

(1) Test 1

An FAB 44 was formed at a tip of a copper wire 5P of 25 μm wire diameter, the capillary C was lowered toward a pad 7P, the FAB 44 was pressed against the pad 7P, and a fixed load was applied to the FAB 44 to form a first ball portion 15P on the pad 7P by deformation of the FAB 44. The intended diameter of the first ball portion 15P was 58 μm and the intended thickness thereof was 10 μm. For each of cases where the magnitude of the load applied to the FAB 44 was set to 50 g, 80 g, and 110 g, changes of the diameter and the thickness of the first ball portion 15P with time elapsed from the contacting of the FAB 44 with the pad 7P were examined. Changes with time of the diameter (ball diameter) are shown in FIG. 193, and changes with time of the thickness (ball thicknesses) are shown in FIG. 194.

(2) Test 2

An FAB 44 was formed at a tip of a copper wire 5P of 25 μm wire diameter, the capillary C was lowered toward a pad 7P, the FAB 44 was pressed against the pad 7P, and a fixed load was applied to the FAB 44 to form a first ball portion 15P on the pad 7P by deformation of the FAB 44. The intended diameter of the first ball portion 15P was 76 μm and the intended thickness thereof was 18 μm. For each of cases where the magnitude of the load applied to the FAB 44 was set to 70 g, 90 g, 110 g, 130 g, 150 g, and 200 g, changes of the diameter and the thickness of the first ball portion 15P with time elapsed from the contacting of the FAB 44 with the pad 7P were examined. Changes with time of the diameter (ball diameter) are shown in FIG. 195, and changes with time of the thickness (ball thicknesses) are shown in FIG. 196.

(3) Test 3

An FAB 44 was formed at a tip of a copper wire 5P of 38 μm wire diameter, the capillary C was lowered toward a pad 7P, the FAB 44 was pressed against the pad 7P, and a fixed load was applied to the FAB 44 to form a first ball portion 15P on the pad 7P by deformation of the FAB 44. The intended diameter of the first ball portion 15P was 104 μm and the intended thickness thereof was 25 μm. For each of cases where the magnitude of the load applied to the FAB 44 was set to 200 g, 230 g, 250 g, 300 g, 400 g, and 500 g, changes of the diameter and the thickness of the first ball portion 15P with time elapsed from the contacting of the FAB 44 with the pad 7P were examined. Changes with time of the diameter (ball diameter) are shown in FIG. 197, and changes with time of the thickness (ball thicknesses) are shown in FIG. 198.

As can be understood from reference to FIG. 193 to FIG. 198, regardless of the wire diameter of the copper wire 5P, the magnitude of the load, and the intended diameter and intended thickness of the first ball portion 15P, the FAB 44 is not completed in less than 2 msec from contact with the pad 7P. On the other hand, it is considered that, after 4 msec from the contacting of the FAB 44 with the pad 7P, the diameter and thickness of the FAB 44 are substantially unchanged and the deformation of the FAB 44 is reliably completed. To be more detailed, it is considered that, regardless of the wire diameter of the copper wire 5P, the magnitude of the load, and the intended diameter and intended thickness of the first ball portion 15P, the changes of the diameter and thickness of the FAB 44 are ended and the deformation of the FAB 44 is completed at a point of elapse of substantially 3 msec from the contacting of the FAB 44 with the pad 7P.

It is thus considered that the predetermined time period during which the initial load P1 is applied to an FAB is appropriately in a range of 2 to 4 msec and is more appropriately 3 msec.

As described above, after the FAB 44 formed on the tip of the copper wire 5P is put in contact with a pad 7P, a load is applied to the FAB 44 by the capillary C. The FAB 44 in contact with the pad 7P is thereby deformed.

When an excessive ultrasonic vibration is applied to the FAB 44 during the deforming of the FAB 44, the energy of the ultrasonic vibration applied to the FAB 44 may cause crack or other damage to occur in the pad 7P and/or the interlayer insulating film 12P below the pad 7P below the portion of contact of the FAB 44 and the pad 7P (central portion of the first ball portion 15P).

The drive current is thus applied to the ultrasonic transducer provided in the capillary C after the end of deformation of the FAB 44. The ultrasonic vibration is thus not applied to the FAB 44 in the process of deforming and thus occurrence of damage in the pad 7P and the interlayer insulating film 12P below the central portion of the first ball portion 15P can be prevented. Then, by the application of the ultrasonic vibration to the FAB 44 after the end of deformation, the FAB can be rubbed against the pad 7P and satisfactory bonding of the FAB 44 and the pad 7P can be achieved.

Satisfactory bonding of the copper wire 5P (FAB 44) with the pad 7P can thus be obtained while being able to prevent the occurrence of crack or other damage in the pad 7P and the interlayer insulating film 12P below the central portion of the first ball portion 15P.

A load of some magnitude must be applied to the FAB 44 in order to satisfactorily deform the FAB 44, which is made of Cu that is a harder metal than Au. However, if a large load continues to be applied to the first ball portion 15P after the end of deformation of the FAB 44, the ultrasonic vibration will not propagate satisfactorily to the portion of contact of the first ball portion 15P and the pad 7P.

Thus, the relatively large initial load P1 is applied to the FAB 44 by the capillary C after the contacting of the FAB 44 with the pad 7P and after elapse of the predetermined time period from the contacting of the FAB 44 with the pad 7P, the relatively small load P2 is applied to the FAB 44 by the capillary C. By the relatively large initial load P1 being applied to the FAB 44 after contacting of the FAB 44 with the pad 7P, the FAB 44, which is made of Cu that is a harder metal than Au, can be deformed satisfactorily. When the predetermined time period elapses from the contacting of the FAB 44 with the pad 7P, the load applied to the FAB 44 is decreased to the load P1 and thus the ultrasonic vibration can be made to propagate satisfactorily to the portion of contact of the FAB 44 (first ball portion 15P) and the pad 7P.

The magnitude of the initial load P1 is preferably set based on a value obtained by multiplying the intended bonding area of the first ball portion 15P with respect to the pad 7P by a fixed factor. The magnitude of the initial load P1 can thereby be set appropriately in accordance with the intended bonding area of the first ball portion 15P. Consequently, satisfactory deformation of the FAB 44 can be achieved while satisfactorily preventing the occurrence of damage in the pad 7P and the interlayer insulating layer 12P below the central portion of the first ball portion 15P.

Although the fifteenth preferred embodiment of the present invention has been described above, the fifteenth preferred embodiment may also be modified as follows.

For example, although a QFN package type is applied to the semiconductor device 1P, the present invention may also be applied to the manufacture of a semiconductor device to which another type of non-leaded package, such as an SON (small outlined non-leaded package), is applied.

The present invention may also be applied to the manufacture of not only semiconductor devices to which a so-called singulation type package, with end surfaces of leads being made flush with side surfaces of a resin package, is applied but also semiconductor devices to which a lead cut type non-leaded package, with leads projecting from side surfaces of a resin package, is applied.

Further, the present invention may be applied to the manufacture of not only semiconductor devices to which a non-leaded package is applied but also semiconductor devices to which a QFP (quad flat package) or other package having outer leads formed by leads projecting from a resin package is applied.

Also, although with the above-described preferred embodiment, a mode in which the copper wires 5P are covered by the water-impermeable insulating film 25P was described as an example, the water-impermeable insulating film 25P may be omitted as shown in FIG. 199 as long as at least the fourteenth object for resolving the fifteenth issue is achieved. Experiments related to the present fifteenth preferred embodiment were performed. The present invention is not restricted to the examples described below.

1. Evaluation Test 1

A capillary made by Micro-Swiss was used. The capillary has the following dimensions. The CD dimension that is the diameter of the lower end edge of the chamfer is 66 μm (0.066 mm). The T dimension that is the outer diameter of the face is 178 μm (0.178 mm). The chamfer angle, which two straight lines extending along the side surface of the chamfer form in a cross section of the capillary taken along the plane that includes the central axis (see cross section shown in FIG. 191A), is 90°. The face angle that is the angle that the face forms with the plane orthogonal to the central axis of the capillary is 8°. The angle, which, in the cross section of the capillary taken along the plane that includes the central axis, the portion of the side surface of the capillary that extends upward beyond the upper end of the face forms with the central axis, is 20°. The upper end portion of the face is arcuate and the OR dimension that is the radius of curvature of this portion is 20 μm (0.020 mm).

The capillary was positioned at a position of 7 mil (approximately 178 μm) height from a top surface of a pad made of an Al—Cu-based alloy and an FAB of 59 μm diameter was formed on a tip of a copper wire with a wire diameter of 25 μm. The capillary was then lowered toward the pad at a speed of 0.4 mil/msec (approximately 10.2 μm/msec) to press the FAB against the pad and form a first ball portion on the pad by deformation of the FAB. The intended diameter of the first ball portion was 76 μm, the intended thickness of the first ball portion was 17 μm, and the intended bonding area of the first ball portion with respect to the pad was 4534.16 $\mu m^2$.

As shown in FIG. 200, for 3 msec after contacting of the FAB with the pad, an initial load of 130 g was applied to the FAB by the capillary, and at the point of elapse of the 3 msec, the load applied to the FAB was decreased to 30 g and the state of applying the load of 30 g to the FAB was maintained for 13 msec. Thereafter, the capillary was raised.

Also, supplying of the drive current to the ultrasonic transducer provided in the capillary was started after the FAB contacted the pad, and the value of the drive current was raised instantaneously from zero to 90 mA and then a state of applying the drive current of 90 mA to the ultrasonic transducer was maintained until the capillary was raised (until 33.5 msec elapsed from the start of descent of the capillary). Examples 1 and 2 and Comparative Examples 1 to 3 differ in the timing of start of supplying of the drive current applied to the ultrasonic transducer.

Example 1

In Example 1, the drive current to the ultrasonic transducer was started 3 msec after the contacting of the FAB with the pad.

Example 2

In Example 2, the drive current to the ultrasonic transducer was started 4 msec after the contacting of the FAB with the pad.

Comparative Example 1

In Comparative Example 1, the drive current to the ultrasonic transducer was started 0 msec after the contacting of the FAB with the pad, in other words, at the same time as the contacting of the FAB with the pad.

Comparative Example 2

In Comparative Example 2, the drive current to the ultrasonic transducer was started 1 msec after the contacting of the FAB with the pad.

Comparative Example 3

In Comparative Example 3, the drive current to the ultrasonic transducer was started 2 msec after the contacting of the FAB with the pad.

<Crack Evaluation>

With each of Examples 1 and 2 and Comparative Examples 1 to 3, FABs were bonded to 48 pads, whether or not a crack formed in the interlayer insulating film at the lower layer of each pad was examined, and a crack occurrence rate (number of pads with which a crack formed in the interlayer insulating film at the lower layer/48×100) was computed. The computation results are shown in FIG. 201.

As shown in FIG. 201, it was confirmed that, with each of Examples 1 and 2, with which the time (delay time) of start of supplying of the drive current applied to the ultrasonic transducer after the contacting of the FAB with the pad was no less then 3 msec, a crack did not occur in the interlayer insulating film.

On the other hand, it was confirmed that, with each of Comparative Examples 1 to 3, with which the delay time was no more then 2 msec, a crack occurred in the interlayer insulating film.

2. Evaluation Test 2

A capillary made by Micro-Swiss was used. The capillary has the following dimensions. The CD dimension that is the diameter of the lower end edge of the chamfer is 66 μm (0.066 mm). The T dimension that is the outer diameter of the face is 178 μm (0.178 mm). The chamfer angle, which two straight lines extending along the side surface of the chamfer form in a cross section of the capillary taken along the plane that includes the central axis (see cross section shown in FIG. 191A), is 90°. The face angle that is the angle that the face forms with the plane orthogonal to the central axis of the capillary is 8°. The angle, which, in the cross section of the capillary taken along the plane that includes the central axis, the portion of the side surface of the capillary that extends upward beyond the upper end of the face forms with the central axis, is 20°. The upper end portion of the face is arcuate and the OR dimension that is the radius of curvature of this portion is 20 μm (0.020 mm).

The capillary was positioned at a position of 7 mil (approximately 178 μm) height from a top surface of a pad made of an Al—Cu-based alloy and an FAB of 59 μm diameter was formed on a tip of a copper wire with a wire diameter of 25 μm. The capillary was then lowered toward the pad at a speed of 0.4 mil/msec (approximately 10.2 μm/msec) to press the FAB against the pad and form a first ball portion on the pad by deformation of the FAB. The intended diameter of the first ball portion was 76 μm, the intended thickness of the first ball portion was 17 μm, and the intended bonding area of the first ball portion with respect to the pad was 4534.16 $\mu m^2$.

Example 3

As shown in FIG. 202, for 6 msec after contacting of the FAB with the pad, an initial load of 130 g was applied to the FAB by the capillary, and at the point of elapse of the 6 msec, the load applied to the FAB was decreased to 30 g and the state of applying the load of 30 g to the FAB was maintained for 10 msec. That is, the time of the start of supplying of the driving current to the ultrasonic transducer was delayed by just 2 msec in comparison to Example 2. Thereafter, the capillary was raised.

Also, supplying of the drive current to the ultrasonic transducer provided in the capillary was started 4 msec after the FAB contacted the pad, and the value of the drive current was raised instantaneously from zero to 90 mA and then the state of applying the drive current of 90 mA to the ultrasonic transducer was maintained until the capillary was raised (until 33.5 msec elapsed from the start of descent of the capillary).

Example 4

As shown in FIG. 203, for 3 msec after contacting of the FAB with the pad, an initial load of 130 g was applied to the FAB by the capillary, and at the point of elapse of the 3 msec, the load applied to the FAB was decreased to 30 g and the state of applying the load of 30 g to the FAB was maintained for 31 msec That is, the time during which the load of 30 g was applied to the FAB was extended by just 28 msec in comparison to Example 2. Thereafter, the capillary was raised.

Also, supplying of the drive current to the ultrasonic transducer provided in the capillary was started 4 msec after the FAB contacted the pad, and the value of the drive current was raised instantaneously from zero to 90 mA and then the state of applying the drive current of 90 mA to the ultrasonic transducer was maintained until the capillary was raised (until 51.5 msec elapsed from the start of descent of the capillary).

<Crack Evaluation>

With each of Examples 3 and 4, FABs were bonded to 48 pads and upon examining whether or not a crack formed in the interlayer insulating film at the lower layer of each pad, it was confirmed that a crack did not occur in the interlayer insulating film.

Sixteenth Preferred Embodiment FIG. 204 to FIG. 208

A sixteenth preferred embodiment is related to a semiconductor device having electrode pads made of copper and although it is not used to explain the present invention, it is a preferred embodiment that uses copper bonding wires in the same manner as the semiconductor device according to the first preferred embodiment. By disclosure of the sixteenth preferred embodiment, a sixteenth issue concerning a sixteenth background art described below can be resolved.

(1) Sixteenth Background Art

Al (aluminum) is widely used as wiring material for semiconductor devices. For example, in a multilayer wiring structure using Al as the wiring material, interlayer insulating films with flat top surfaces and wirings disposed on the flat top surfaces of the interlayer insulating films are laminated alternately. A passivation film, made of SiN (silicon nitride), is formed on the uppermost interlayer insulating film. The wiring (uppermost layer wiring) disposed on this interlayer insulating film is covered by the passivation film and portions thereof are exposed as electrode pads (Al pads). Bonding wires are connected to the exposed electrode pads and, for example, as a connection method therefor, ultrasonic bonding using a wire bonder is widely adopted.

(2) Sixteenth Issue

Recently, reduction in wiring resistance is being desired, Especially, in power semiconductor devices that consume large amounts of electric power. The present inventor has thus been examining the adoption of Cu (copper), which is higher in electrical conductivity than Al, as a material of the uppermost layer wiring.

Meanwhile, with conventional Al pads, inter diffusion with Au (gold), which is widely used as bonding wires, occurs readily. Thus, under a high temperature environment, interdiffusion of Al and Au occurs and a bonding wire may thereby become removed from an electrode pad. A measure for preventing such interdiffusion must thus be taken.

Thus, a sixteenth object of the present invention related to the sixteenth preferred embodiment is to provide a semiconductor device that is excellent in high temperature standing resistance while being reduced in wiring resistance and enables improvement in connection reliability of electrode pads and bonding wires.

(3) Disclosure of a Specific Preferred Embodiment

FIG. 204 is an illustrative plan view of a semiconductor device. FIG. 205 is a sectional view taken along line A-A of the semiconductor device shown in FIG. 204.

The semiconductor device Q includes a semiconductor chip 2Q, a die pad 3Q for die bonding the semiconductor chip 2Q, a plurality of electrode leads 4Q disposed at a periphery of the semiconductor chip 2Q, bonding wires 5Q electrically connecting the semiconductor chip 2Q and the electrode leads 4Q, and a resin package 6Q sealing the above components.

The semiconductor chip 2Q has a quadrilateral shape (for example, of approximately 2.3 mm square) in plan view and has a thickness, for example, of approximately 230 μm. Also, the semiconductor chip 2Q has a multilayer wiring structure arranged by laminating a plurality of wiring layers via interlayer insulating films. A specific arrangement of the multilayer wiring structure shall be described in detail later with reference to FIG. 206.

An analog circuit 7Q, a digital circuit 8Q, and three power transistor circuits 9Q are formed on a top surface 21Q of the semiconductor chip 2Q. Specifically, in the plan view shown in FIG. 204, the analog circuit 7Q and the digital circuit 8Q are formed side by side in an upper half region, and the three power transistor circuits 9Q are formed side by side in a lower half region.

In the regions in which the respective circuits 7Q to 9Q are formed, a plurality of electrode pads 10Q for electrical connection of the respective circuits 7Q to 9Q with the exterior are disposed at suitable positions.

Also, an alignment mark 11Q having an L-shape in plan view is disposed in a region in which the right side power transistor circuit 9Q is formed in FIG. 204.

For example, by scanning the top surface of the semiconductor device Q by a laser beam and recognizing the alignment mark 11Q, a position (0 position) of semiconductor device Q about an axis orthogonal to the surface of the semiconductor device Q can be detected. Also, positions (X positions, Y positions, and Z positions) of respective portions of the semiconductor device Q can be detected based on the position of the alignment mark 11Q.

Meanwhile, a rear metal 12Q that contains, for example, Au, Ni, Ag, etc., is formed on a rear surface 22Q (surface facing the die pad 3Q) of the semiconductor chip 2Q.

The die pad 3Q and the plurality of electrode leads 4Q are formed of the same metal thin plate and are formed as a lead frame 13Q. The metal thin plate making up the lead frame 13Q is made of a Cu-based material and is specifically made, for example, of a high-purity copper of no less than 99.9999% (6N) purity or no less than 99.99% (4N) purity or an alloy of Cu and a dissimilar metal (for example, a Cu—Fe—P alloy, etc.). The metal thin plate may also be made of an Fe-based material, such as 42 alloy (Fe-42% Ni). Also, the lead frame 13Q (metal thin plate) has a thickness of approximately 200 μm.

A top surface 31Q (surface facing the semiconductor chip 2Q) of the die pad 3Q is a surface that is sealed by the resin package 6Q and has formed thereon a sealed-side plating layer 14Q that contains Ag, etc.

The semiconductor chip 2Q and the die pad 3Q are bonded to each other in a state where the rear surface 22Q of the semiconductor chip 2Q and the top surface 31Q of the die pad 3Q face each other as bond surfaces with a bonding material 15Q interposed between the rear surface 22Q and the top surface 31Q. The semiconductor chip 2Q is thereby supported by the die pad 3Q in an orientation where the top surface 21Q faces upward.

The bonding material 15Q is made, for example, of solder paste or other conductive paste. As the bonding material 15Q, an insulating paste, such as a silver paste, an alumina paste, may be applied and in this case, the rear metal 12Q and/or the sealed-side plating layer 14Q may be omitted. Also, in the state where the semiconductor chip 2Q and the die pad 3Q are bonded, a thickness of the bonding material 15Q is, for example, approximately 20 μm.

A rear surface 32Q (surface of mounting to a wired circuit board) of the die pad 3Q is exposed from the resin package 6Q. A mounted-side plating layer 16Q made, for example, of a metal material, such as tin (Sn), tin-silver alloy (Sn—Ag), is formed on the exposed rear surface 32Q.

The electrode leads 4Q are disposed at the periphery of the die pad 3Q with the same number thereof being disposed at both sides in respective directions orthogonal to respective side surfaces of the die pad 3Q. The electrode leads 4Q that face each side surface of the die pad 3Q are disposed at equal intervals in a direction parallel to the facing side surface. A length (length at the rear surface 42Q side) of each electrode lead 4Q in the direction of facing the die pad 3Q is, for example, approximately 450 μm.

A top surface 41Q (surface of connection to the bonding wire 5Q) of each electrode lead 4Q is a surface that is sealed by the resin package 6Q and has formed thereon a sealed-side plating layer 17Q that contains Ag, etc.

Meanwhile, a rear surface 42Q (surface of mounting onto the wiring circuit board) of each electrode lead 4Q is exposed from the resin package 6Q. A mounted-side plating layer 18Q made, for example, of a metal material, such as tin (Sn), tin-silver alloy (Sn—Ag), is formed on the exposed rear surface 42Q.

Each bonding wire 5Q is made of copper (for example, a high-purity copper of no less than 99.9999% (6N) purity or no less than 99.99% (4N) purity that may contain a minute amount of impurity). Each bonding wire 5Q includes a linearly-extending, cylindrical wire main body 51Q, a pad-side end portion 52Q formed at one end of the wire main body 51Q and bonded by stitch bonding to an electrode pad 10Q, and a lead-side end portion 53Q formed at the other end of the wire main body 51Q and bonded by ball bonding to an electrode lead 4Q.

The wire main body 51Q is bent above the electrode lead 4Q, passes above the semiconductor chip 2Q (a substrate 19Q to be described later) from the bending position, inclines smoothly so as to be substantially rectilinear toward the electrode pad 10Q, and the other end thereof is integrally connected to the flat pad-side end portion 52Q. A height $H_1$ of the wire main body 51Q with respect to a peripheral edge (edge) of the semiconductor chip 2Q (substrate 19Q) is, for example, 50 to 100 μm.

The resin package 6Q makes up an outer shape of the semiconductor device Q and is formed to a substantially rectangular parallelepiped shape. In terms of size, the resin package 6Q has a planar size, for example, of approximately 4 mm square and a thickness, for example, of approximately 0.85 mm. Such a resin package 6Q is made of a known molded resin, such as epoxy resin.

FIG. 206 is an enlarged view of principal portions of a portion surrounded by a broken-line circle in FIG. 205.

The multilayer wiring structure of the semiconductor chip 2Q shall now be described with reference to FIG. 206.

The semiconductor chip 2Q includes a substrate 19Q, made of silicon (Si), as a semiconductor substrate. On the substrate 19Q, a first interlayer insulating film 20Q and a second interlayer insulating film 23Q are laminated successively from a top surface 24Q side of the substrate 19Q. The first interlayer insulating film 20Q and the second interlayer insulating film 23Q are made of $SiO_2$ (silicon oxide). Although not appearing in FIG. 2, a plurality of interlayer insulating films are interposed between the first interlayer insulating film 20Q and the second interlayer insulating film 23Q.

On the second interlayer insulating film 23Q, a lower wiring 25Q and a fuse 26Q are formed with an interval in between. The lower wiring 25Q and the fuse 26Q are made of aluminum (Al). A characteristic (for example, a resistance value, etc.) of the power transistor circuit 9Q (see FIG. 204) can be changed by breaking or not breaking the fuse 26Q.

A third interlayer insulating film 27Q is laminated on the second interlayer insulating film 23Q, the lower wiring 25Q, and the fuse 26Q. The third interlayer insulating film 27Q is made of $SiO_2$. On the top surface of the third interlayer insulating film 27Q, a step difference of substantially the same height as the lower wiring 25Q and the fuse 26Q is formed between a portion formed on the second interlayer insulating film 23Q and a portion formed on the lower wiring 25Q and the fuse 26Q.

On the third interlayer insulating film 27Q, a TEOS (tetraethoxysilane) film 28Q is formed so as to eliminate the step difference formed on the top surface of the third interlayer insulating film 27Q.

A fourth interlayer insulating film 29Q is laminated on the third interlayer insulating film 27Q and the TEOS film 28Q. The fourth interlayer insulating film 29Q is formed of SiN (silicon nitride).

Also, in the third interlayer insulating film 27Q and the fourth interlayer insulating film 29Q, a via hole 30Q that penetrates through these films in a thickness direction is formed at portions facing the lower wiring 25Q in the thickness direction. The via hole 30Q has a tapered shape that increases in opening area toward the upper side.

On the fourth interlayer insulating film 29Q, an upper wiring 33Q that is an uppermost layer wiring and the alignment mark 11Q are formed with an interval in between.

The upper wiring 33Q is formed on a region that includes the via hole 30Q in plan view and is formed so as to project upward from the fourth interlayer insulating film 29Q. The upper wiring 33Q has a thickness T such that an amount of projection from a top surface of the fourth interlayer insulating film 29Q is no less than 10 μm and preferably 10 μm to 15 μm. A lower end portion of the upper wiring 33Q enters inside the via hole 30Q and is connected to the lower wiring 25Q. The upper wiring 33Q is made of copper (Cu) (for example, a high-purity copper of no less than 99.9999% (6N) purity or no less than 99.99% (4N) purity that may contain a minute amount of impurity).

Between the upper wiring 33Q and the lower wiring 25Q, the third interlayer insulating film 27Q, and the fourth interlayer insulating film 29Q is interposed a barrier film 34Q having a barrier property against diffusion of Cu ions. The barrier film 34Q is made of Ti (titanium).

A passivation film 35Q is formed on the fourth interlayer insulating film 29Q and the upper wiring 33Q. The passivation film 35Q is made of SiN. A pad opening 36Q for partially exposing an upper surface of the upper wiring 33Q as an electrode pad 10Q (see FIG. 204) is formed in the passivation film 35Q so as to penetrate through in the thickness direction. Also, the passivation film 35Q is removed from above the alignment mark 11Q and a periphery thereof. Also, the alignment mark 11Q is made of Al (aluminum).

The electrode pad 10Q (the portion of the upper wiring 33Q exposed from the pad opening 36Q) is covered by a copper oxide film 37Q. The copper oxide film 37Q is a thin film that is formed by the electrode pad 10Q being oxidized naturally and changing chemically to CuO (copper (I) oxide) or $Cu_2O$ (Cu (II) oxide), and a thickness thereof is less than that of the passivation film 35Q and is, for example, 10 nm to 50 nm.

The end portion (pad-side end portion 52Q) of the bonding wire 5Q at the electrode pad 10Q side penetrates through the thin-film copper oxide film 37Q and is directly bonded to the electrode pad 10Q.

Specifically, at the electrode pad 10Q side, the copper oxide film 37Q is broken in accordance with a shape of the pad-side end portion 52Q that has been deformed to a flat shape by stitch bonding, and the pad-side end portion 52Q is directly bonded to the electrode pad 10Q exposed at the broken and open portion. One end of the main body (wire main body 51Q) of the bonding wire 5Q is integrally connected to the end portion of the flat pad-side end portion 52Q.

FIG. 207A to FIG. 207F are schematic sectional views of states in a middle of manufacture of the semiconductor device shown in FIG. 205.

In a manufacturing process of the semiconductor device Q, first, the multilayer wiring structure is formed on the substrate 19Q. For example, first, the first interlayer insulating film 20Q and the second interlayer insulating film 23Q are laminated on the substrate 19Q by a CVD (chemical vapor deposition) method. Thereafter, an aluminum film that is to be the material of the lower wiring 25Q and the fuse 26Q is formed on the second interlayer insulating film 23Q by a sputter method. The lower wiring 25Q and the fuse 26Q are then formed by the aluminum film being patterned by photolithography and etching.

Next, the third interlayer insulating film 27Q is formed on the second interlayer insulating film 23Q, the lower wiring 25Q, and the fuse 26Q by an HDP (high density plasma)-CVD method. Thereafter, the TEOS film 28Q is formed on the third interlayer insulating film 27Q by the CVD method. The TEOS film 28Q is then polished from its top surface by a CMP (chemical mechanical polishing) method. The polishing of the TEOS film 28Q is continued until the top surface of the TEOS film 28Q is flush with the top surface of the portions of the third interlayer insulating film 27Q formed above the lower wiring 25Q and the fuse 26Q.

The fourth interlayer insulating film 29Q is then formed on the third interlayer insulating film 27Q and the TEOS film 28Q by the plasma CVD method. Thereafter, the third interlayer insulating film 27Q and the fourth interlayer insulating film 29Q are removed selectively as shown in FIG. 207A by photolithography and etching to form the via hole 30Q that penetrates through the films in the thickness direction.

Next, the barrier film 34Q is formed on the fourth interlayer insulating film 29Q, including an inner surface of the via hole 30Q, by the sputter method as shown in FIG. 207B. A seed film 38Q, made of Cu, is then formed on the barrier film 34Q by the sputter method. Thereafter, a resist pattern 39Q, having an opening at a portion facing a region that includes the via hole 30Q in plan view, is formed on the barrier film 34Q and the seed film 38Q.

Next, Cu is grown by plating inside the opening of the resist pattern 39C. The interior of the opening of the resist pattern 39Q is thereby completely filled with Cu as shown in 207C, thereby forming the upper wiring 33Q made of Cu. After forming of the upper wiring 33Q, the resist pattern 39Q is removed.

Thereafter, as shown in FIG. 207D, the portions of the barrier film 34Q and the seed film 38Q formed below the resist pattern 39Q are removed by etching.

Next, an aluminum film is formed on the fourth interlayer insulating film 29Q by the sputter method. The aluminum film is then removed selectively by photolithography and dry etching (for example, RIE) to form the alignment mark 11Q as shown in FIG. 207E. Thereafter, the passivation film 35Q is formed on the fourth interlayer insulating film 29Q and the alignment mark 11Q by the CVD method.

Then, by photolithography and etching, the pad opening 36Q is formed in the passivation film 35Q and the passivation film 35Q is removed from above the alignment mark 1Q and a peripheral portion thereof. The semiconductor chip 2Q is thereby obtained.

After the semiconductor chip 2Q has been prepared, the semiconductor chip 2Q is die bonded to the lead frame 13Q (see FIG. 205) that integrally includes the die pad 3Q and the electrode leads 4Q. Meanwhile, in the semiconductor chip 2Q, the upper surface (electrode pads 10Q) of the upper wiring 33Q exposed from the pad openings 36Q are oxidized naturally and the electrode pads 10Q are thereby covered by the copper oxide film 37Q. Next, an FAB (free air ball) is formed on a tip portion of a bonding wire 5Q held by a capillary 40Q of a wire bonder (not shown) by application of a current to the tip portion.

Next, the capillary 40Q moves to a position directly above an electrode lead 4Q and descends so that the FAB contacts the electrode lead 4Q. In this process, a load and ultrasonic waves are applied from the capillary 40Q to the FAB, for example, for 10 msec to 20 msec. The FAB is thereby deformed according to a shape of the capillary 40Q. The tip portion of the bonding wire 5Q is thereby ball bonded as the lead-side end portion 53Q to the electrode lead 4Q.

Thereafter, the capillary 40Q rises to a fixed height and moves to a position directly above an electrode pad 10Q. Then, as shown in FIG. 207F, the capillary 40Q descends again and the bonding wire 5Q, with its shape maintained (with the diameter being the wire diameter as it is), contacts the electrode pad 10Q. In this process, a load (open arrows in FIG. 207B) and ultrasonic waves (zigzag lines in FIG. 207F) are applied from the capillary 40Q to the bonding wire 5Q, for example, for 10 msec to 20 msec. The bonding wire 5Q is thereby deformed flatly according to the shape of the capillary 40Q, the copper oxide film 37Q is broken by the actions of the load and the ultrasonic waves, and the bonding wire 5Q is stitch bonded as the pad-side end portion 52Q to the electrode pad 10Q.

The capillary 40Q then rises and in a state where a tail of a fixed length is secured from a tip of the capillary 40Q, the bonding wire 5Q is broken from a position of the pad side end portion 52Q.

Thereafter, the same processes as those of FIG. 207F to FIG. 207F are performed so that the respective electrode pads 10Q of the semiconductor chip 2Q and the electrode leads 4Q corresponding to the respective electrode pads 10Q are connected by the bonding wires 5Q. By the above processes, the semiconductor device Q shown in FIG. 205 is obtained.

With the semiconductor device Q, the uppermost layer wiring (upper wiring 33Q) of the multilayer wiring structure is made of Cu and thus the wiring resistance can be reduced in comparison to a case where an Al wiring is adopted as the uppermost layer wiring.

In addition, the wiring 33Q is exposed as the electrode pads 10Q and the bonding wires 5Q (Cu wires) made of Cu are bonded to the electrode pads 10Q and thus the connections of the electrode pads 10Q and the bonding wires 5Q can be arranged as bonds (Cu—Cu bonds) of the same species of metal. Thus, even if the semiconductor device Q is left to stand under a high temperature environment, interdiffusion of the components (that is, Cu) of the electrode pad 10Q and the bonding wire 5Q does not occur and the bonding of the electrode pad 10Q and the bonding wire 5Q can be maintained. A semiconductor device of excellent high temperature standing resistance and connection reliability can thus be provided.

Also, with the semiconductor device Q, even if a large stress is applied to an electrode pad 10Q due to application of load and ultrasonic waves to a bonding wire 5Q (see FIG. 207F), the stress can be relaxed by the electrode pad 10Q that is made of Cu.

Specifically, in a case where Al is adopted in the upper wiring 33Q, the thickness of the upper wiring 33Q (Al wiring) can only be made approximately 3 μm at the most by a plating method. On the other hand, the upper wiring 33Q can be made no less than 10 μm in thickness T by making use of the characteristic that Cu can be made thicker in plating thickness more readily than Al. Stress applied to the second interlayer insulating film 23Q can thus be relaxed reliably by the comparatively thick upper wiring 33Q. Consequently, occurrence of crack in the second interlayer insulating film 23Q, etc., can be suppressed.

Further, a bonding position (stitch bonding position) of the bonding wire 5Q with respect to the electrode pad 10Q can be raised adequately with respect to the top surface 24Q of the substrate 19Q because the thickness T of the upper wiring 33Q is no less than 10 μm. The height $H_1$ of the bonding wire 5Q with respect to the top surface 24Q of the substrate 19Q can be made adequately high as if there is a stud bump. Thus, even if the bonding wire 5Q is stitch bonded directly to the electrode pad 10Q, a drooped portion of the wire main body 51Q hardly ever reaches the edge of the substrate 19Q. Edge shorting due to contact of the wire main body 51Q and the substrate 19Q can thus be suppressed.

FIG. 208 is a diagram of a modification example of the semiconductor device of FIG. 205. In FIG. 208, portions corresponding to respective portions shown in FIG. 206 are provided with the same reference symbols as the respective portions. Also, detailed description concerning portions provided with the same reference symbols shall be omitted in the following description.

In a semiconductor device 50Q, an end portion (pad-side end portion 55Q) of a bonding wire 54Q at the electrode pad 10Q side penetrates through the thin-film copper oxide film 37Q and is directly bonded to the electrode pad 10Q. However, whereas with the semiconductor device Q described above, the pad-side end portion 52Q is directly bonded to the electrode pad 10Q as a stitch bond (see FIG. 206), in the present modification example, the pad-side end portion 55Q serves a role of a stud bump in the bonding with the electrode pad 10Q.

More specifically, the copper oxide film 37Q is broken in accordance with a shape of a substantially bell-shaped (substantially umbrella-shaped) stud bump (pad-side end portion 55Q) and the pad-side end portion 55Q is directly bonded to the electrode pad 10Q exposed at the broken and open portion. One end of a main body (wire main body 56Q) of the bonding wire 54Q is stitch bonded to an upper end portion of the pad-side end portion 55Q.

In particular in the present modification example, even if, in forming the stud bump (pad-side end portion 55Q) on the electrode pad 10Q, strong ultrasonic waves for forming the stud bump are applied to the FAB, splashing, with which the electrode pad 10Q peels upward, hardly occurs, unlike in a case where an Al pad is adopted. Also, although in the process of bonding of the bonding wire 54Q and the electrode pad 10Q, ultrasonic waves (stress), corresponding to two times of application for the stud bump and the stitch bonding, act on the electrode pad 10Q, the electrode pad 10Q can withstand the stress because it is made of copper.

Although the sixteenth preferred embodiment of the present invention has been described above, the sixteenth preferred embodiment may be modified as follows.

Although with the preferred embodiment described above, modes of stitch bonding (first example) and stitch bonding onto a stud bump (second example) were cited as examples of forms of bonding of the bonding wire with respect to the electrode pad 10Q, for example, stitch bonding to the electrode lead 4Q may be performed to perform direct ball bonding in the manner of breaking the copper oxide film 37Q at the electrode pad 10Q side instead.

Also, although Ti was given as an example of the material of the barrier film 34Q, the material of the barrier film 34Q suffices to be a material having conductivity and a barrier property against the diffusion of copper ions, and besides Ti, TiN (titanium nitride), WN (tungsten nitride), TaN (tantalum nitride), Ta (tantalum), W (tungsten), or TiW (titanium tungsten alloy), etc., can be cited as examples.

Seventeenth Preferred Embodiment FIG. 209 to FIG. 213

By disclosure of a seventeenth preferred embodiment, a seventeenth issue concerning a seventeenth background art described below can be resolved in addition to the issues described above in the “OBJECT(S) OF THE INVENTION.”

(1) Seventeenth Background Art

Semiconductor devices are normally distributed in a state where a semiconductor chip is sealed (packaged) together with bonding wires by a resin. Inside the package, bonding wires are electrically connected to electrode pads made of aluminum of the semiconductor chip.

Although conventionally, gold wires are mainly used as the bonding wires connected to the electrode pads, recently, the use of copper wires, which are cheaper than gold wires, is being examined for reducing the use of high-priced gold.

(2) Seventeenth Issue

However, copper wires are readily oxidized in comparison to gold wires. Thus, under circumstances where water enters readily into an interior of the package, such as during an HAST (highly accelerated temperature and humidity stress test), corrosion of the aluminum pads (electrode pads) proceeds readily due to water entering into bond interfaces. Consequently an electrically open state may arise between the pad and the wire.

Thus, a seventeenth object of the present invention related to the seventeenth preferred embodiment is to provide a semiconductor device that can be improved in reliability of connection of an electrode pad made of a metal material that contains aluminum and a bonding wire made of copper.

(3) Disclosure of a Specific Preferred Embodiment

FIG. 209 is a schematic sectional view of a semiconductor device according to the seventeenth preferred embodiment of the present invention. FIG. 210A is an enlarged view of principal portions of a portion surrounded by a broken-line circle A in FIG. 209. FIG. 210B is an enlarged view of principal portions of a portion surrounded by a broken-line circle B in FIG. 209.

The semiconductor device 1R is a semiconductor device to which a QFN (quad flat non-leaded) configuration is applied. The semiconductor device 1R includes a semiconductor chip 2R, a die pad 3R on which the semiconductor chip 2R is mounted, a plurality of electrode leads 4R disposed at a periphery of the die pad 3R, bonding wires 5R electrically connecting the semiconductor chip 2R and the electrode leads 4R, and a resin package 6R sealing the above components.

The semiconductor chip 2R has a quadrilateral shape (for example, of approximately 2.3 mm square) in plan view and has, for example, a multilayer wiring structure arranged by laminating a plurality of wiring layers via interlayer insulating films. Also, the semiconductor chip 2R has a thickness, for example, of approximately 230 μm. As shown in FIG. 210A, a top surface 21R of the semiconductor chip 2R is covered by a top surface protective film 7R.

A plurality of pad openings 8R for exposing an uppermost wiring layer of the multilayer wiring structure are formed in the top surface protective film 7R.

Each pad opening 8R has a quadrilateral shape in plan view and the same number thereof are provided at each edge of the semiconductor chip 2R. The respective pad openings 8R are disposed at equal intervals along the respective sides of the semiconductor chip 2R. A portion of the wiring layer is exposed as an electrode pad 9R of the semiconductor chip 2R from each pad opening 8R.

The uppermost wiring layer exposed as the electrode pads 9R is made of a metal material that contains Al (aluminum) and is specifically made of a metal material having Al as a main component (for example, an Al—Cu alloy, etc.).

Meanwhile, a rear surface metal 10R that contains, for example, Au, Ni, Ag, etc., is formed on a rear surface 22R (surface facing the die pad 3R) of the semiconductor chip 2R.

The die pad 3R and the plurality of electrode leads 4R are formed of the same metal thin plate and are formed as a lead frame 11R. The metal thin plate making up the lead frame 11R is made of a Cu-based material that mainly contains Cu and is specifically made, for example, of a high-purity copper of no less than 99.9999% (6N) purity or no less than 99.99% (4N) purity or an alloy of Cu and a dissimilar metal (for example, a Cu—Fe—P alloy, etc.). The metal thin plate may also be made of an Fe-based material, such as 42 alloy (Fe-42% Ni). Also, the lead frame 11R (metal thin plate) has a thickness of approximately 200 μm.

A top surface 31R (surface facing the semiconductor chip 2R) of the die pad 3R is a surface that is sealed by the resin package 6R and has formed thereon a sealed-side plating layer 12R that contains Ag, etc.

The semiconductor chip 2R and the die pad 3R are bonded to each other in a state where the rear surface 22R of the semiconductor chip 2R and the top surface 31R of the die pad 3R face each other as bond surfaces with a bonding material 13R interposed between the rear surface 22R and the top surface 31R. The semiconductor chip 2R is thereby supported by the die pad 3R in an orientation where the top surface 21R faces upward.

The bonding material 13R is made, for example, of solder paste or other conductive paste. As the bonding material 13R, an insulating paste, such as a silver paste, an alumina paste, may be applied and in this case, the rear metal 10R and/or the sealed-side plating layer 12R may be omitted and a planar size of the semiconductor chip 2R may be 2.4 mm square. Also, in the state where the semiconductor chip 2R and the die pad 3R are bonded, a thickness of the bonding material 13R is, for example, approximately 20 μm.

A rear surface 32R (surface of mounting to a wired circuit board) of the die pad 3R is exposed from the resin package 6R. A mounted-side plating layer 14R made, for example, of a metal material, such as tin (Sn), tin-silver alloy (Sn—Ag), is formed on the exposed rear surface 32R.

The electrode leads 4R are disposed at the periphery of the die pad 3R with the same number thereof being disposed at both sides in respective directions orthogonal to respective side surfaces of the die pad 3R. The electrode leads 4R that face each side surface of the die pad 3R are disposed at equal intervals in a direction parallel to the facing side surface. A length (length at the rear surface 42R side) of each electrode lead 4R in the direction of facing the die pad 3R is, for example, approximately 450 μm.

A top surface 41R (surface of connection to the bonding wire 5R) of each electrode lead 4R is a surface that is sealed by the resin package 6R and has formed thereon a sealed-side plating layer 15R that contains Ag, etc.

Meanwhile, a rear surface 42R (surface of mounting onto the wiring circuit board) of each electrode lead 4R is exposed from the resin package 6R. A mounted-side plating layer 16R made, for example, of a metal material, such as tin (Sn), tin-silver alloy (Sn—Ag), is formed on the exposed rear surface 42R.

Each bonding wire 5R is made of copper (for example, a high-purity copper of no less than 99.9999% (6N) purity or no less than 99.99% (4N) purity that may contain a minute amount of impurity). Each bonding wire 5R includes a linearly-extending, cylindrical main body portion 51R and includes a pad bond portion 52R and a lead bond portion 53R formed at respective ends of the main body portion 51R and respectively bonded to an electrode pad 9R and an electrode lead 4R.

The main body portion 51R is curved parabolically upward from the one end at the electrode pad 9R side toward an outer side of the semiconductor chip 2R and made impingent at an acute angle at the other end on the top surface 41R of the electrode lead 4R. An interval I between a lower end at a topmost portion of the main body portion 51R and the top surface 21R of the semiconductor chip 2R is, for example, approximately 160 μm.

The pad bond portion 52R has a humped shape in sectional view that integrally includes a disk-shaped base portion with a side bonded to the electrode pad 9R entering uniformly into a top layer portion of the electrode pad 9R, and a bell-shaped projecting portion projecting from an upper side of the base portion and having a tip connected to the one end of the main body portion 51R.

The lead bond portion 53R has a wedge-like shape in sectional view that is relatively thick at the one end side close to the main body portion 51R and becomes relatively thinner toward the other end side away from the main body portion 51R. As in the first preferred embodiment, in the semiconductor device 1R, the entire top surface 21R and side surfaces 23R of the semiconductor chip 2R, the entire top surface 31R and side surfaces of the die pad 3R, the entire top surfaces 41R and side surfaces inside the resin package 6R of the electrode leads 4R, and the entire bonding wires 5R are covered by an integral water-impermeable insulating film 25R.

The resin package 6R is made of a material containing, for example, an epoxy resin, a curing agent, a curing accelerator, a coupling agent, a mold release agent, a pH adjuster, etc.

The epoxy resin contained is not restricted in particular as long as it is that used as an epoxy resin for resin packages, and phenol novolac type epoxy resins, ortho-cresol novolac type epoxy resins, epoxy resins having a triphenylmethane skeleton (triphenylmethane type epoxy resins), stilbene type epoxy resins, hydroquinone type epoxy resins, glycidyl ester type epoxy resins, glycidyl amine type epoxy resins, dicyclopentadiene type epoxy resins, naphthalene type epoxy resins, epoxy compounds of aralkyl type phenol resins, biphenylene type epoxy resins, trimethylol propane type epoxy resins, terpene modified epoxy resins, linear aliphatic epoxy resins, alicyclic epoxy resins, sulfur-atom-containing epoxy resin, etc., can be cited as examples. Each of these may be used solitarily or two or more types may be used in combination.

The curing agent contained is not restricted in particular as long as it is that used as a curing agent for resin packages, and novolac type phenol resins, aralkyl type phenol resins, such as phenol-aralkyl resins, naphthol-aralkyl resins, biphenyl-aralkyl resins, dicyclopentadiene type phenol resins, terpene modified phenol resins, triphenylmethane type phenol resins, etc., can be cited as examples. Each of these may be used solitarily or two or more types may be used in combination.

The curing accelerator contained is not restricted in particular as long as it is that used as a curing accelerator for resin packages, and cycloamidine compounds, such as 1,8-diazabicyclo(5,4,0)undecene-7,1,5-diazabicyclo(4,3,0)nonene, 5,6-dibutylamino-1,8-diazabicyclo(5,4,0) undecene-7, and compounds having intramolecular polarization formed by adding a compound with a π-bond, such as maleic anhydride, a quinione compound, such as 1,4-benzoquinone, 2,5-tolquinone, 1,4-naphthoquinone, 2,3-dimethylbenzoquinone, 2,6-dimethylbenzoquinone, 2,3-dimethoxy-5-methyl-1,4-benzoquinone, 2,3-dimethoxy-1,4-benzoquinone, phenyl-1,4-benzoquinone, diazophenylmethane, phenol resin, etc., to an abovementioned cycloamidine compound, tertiary amines, such as benzyldimethylamine, triethanolamine, dimethylaminoethanol, tris(dimethylaminomethyl)phenol, and derivatives thereof, imidazoles, such as 2-methylimidazole, 2-phenylimidazole, 2-phenyl-4-methylimidazole, and derivatives thereof, phosphine compounds, such as tributylphosphine, methyldiphenylphosphine, triphenylphosphine, tris(4-methylphenyl)phosphine, diphenylphosphine, phenylphosphine, and phosphorus compounds having intramolecular polarization formed by adding a compound with a π-bond, such as maleic anhydride, an abovementioned quinone compound, diazophenylmethane, phenol resin, to an abovementioned phosphine compound, tetraphenylboron salts, such as tetraphenylphosphonium tetraphenylborate, triphenylphosphine tetraphenylborate, 2-ethyl-4-methylimidazole tetraphenylborate, N-methylmorpholine tetraphenylborate, and derivatives thereof, etc., can be cited as examples. Each of these may be used solitarily or two or more types may be used in combination.

The coupling agent contained is not restricted in particular as long as it is that used as a coupling agent for resin packages, and silane compounds having at least one primary, secondary, or tertiary amine group, various silane-based compounds, such as epoxy silanes, mercapto silanes, alkyl silanes, ureido silanes, vinyl silanes, titanium based compounds, aluminum chelates, aluminum/zirconium-based compounds, etc., can be cited as examples. Each of these may be used solitarily or two or more types may be used in combination.

The mold release agent contained is not restricted in particular as long as it is that used as a mold release agent for resin packages, and higher fatty acids, such as carnauba wax, montanic acid, stearic acid, metal salts of higher fatty acids, ester-based waxes, such as montanic acid esters, polyolefin-based waxes, such as oxidized polyethylene, non-oxidized polyethylene, can be cited as examples. Each of these may be used solitarily or two or more types may be used in combination.

As examples of the pH adjuster contained, inorganic fillers, such as wollastonite (calcium silicate), talc (magnesium silicate), aluminum hydroxide, magnesium carbonate, calcium carbonate, can be cited. Each of these may be used solitarily or two or more types may be used in combination.

The resin package 6R may also contain an additive, such as a diluent, colorant, flame retardant, leveling agent, anti-foaming agent, as necessary.

A pH of the resin package 6R with the above composition exceeds 4.5, and from a need to maintain the pH of the resin package 6R at an acidic pH, the pH preferably exceeds 4.5 and is less than 7.0 and more preferably, is no less than 6.0 and less than 7. Also, the resin package 6R makes up an outer shape of the semiconductor device 1R and is formed to a substantially rectangular parallelepiped shape. In terms of size, the resin package 6R has a planar size, for example, of approximately 4 mm square and a thickness, for example, of approximately 0.85 mm.

With the semiconductor device 1R, an interval L1 between the top surface 21R of the semiconductor chip 2R and a top surface (upper surface) 61 of the resin package 6R is less than a minimum distance W between the side surface 23R of the semiconductor chip 2R and a side surface 63R of the resin package 6R. Specifically, the interval L1 is, for example, 375 to 425 μm and preferably, approximately 400 μm, and the minimum distance W is, for example, 800 to 1000 μm and preferably, approximately 900 μm.

Also, the interval L1 is no more than a distance L2 (for example, of 425 to 475 μm and preferably, approximately 450 μm) between the top surface 21R of the semiconductor chip 2R and a rear surface 62R of the resin package 6R (rear surface 32R of the die pad 3R).

By being designed so that the interval L1 is comparatively small as described above, the semiconductor device 1R is formed as a thin type QFN package.

As described above, with the semiconductor device 1R, the pH of the resin package 6R exceeds 4.5 and thus the bonding wires 5R are placed in a pH environment of higher pH than a low pH environment (for example, an environment of a pH of no more than 4.5).

Forming of cupric oxide (CuO) can thus be suppressed and increase of volume of cupric oxide can be suppressed. Consequently, occurrence of peeling at the bond interface (wire bond interface 17R) of each bonding wire 5R and the resin package 6R can be suppressed.

Thus, even when the semiconductor device 1R is placed in a situation where water enters readily into the interior of the package, as in a PCT (pressure cooker test) or HAST (highly accelerated temperature and humidity stress test), etc., there is no movement path for water in the wire bond interfaces 17R and thus entry of water into the bond interface (pad bond interface 18R) of each electrode pad 9R and bonding wire 5R (pad bond portion 52R) can be suppressed. Contact of water with the pad bond interfaces 18R can thus be suppressed. Consequently, progress of corrosion of the electrode pads 9R (aluminum pads) can be suppressed and thus electrically open states across pad-wire intervals can be suppressed. Connection reliability of the semiconductor device 1R can thus be improved.

Electrically open states across pad-wire intervals can be suppressed effectively especially in an HAST in which oxidation of the bonding wires 5R is readily accelerated by Joule heating of cupric oxide (CuO) of high internal resistance due to application of current to the bonding wires 5R.

Also, although in a thin package, such as the semiconductor device 1R, the pad bond portions 52R on the semiconductor chip 2R tend to be exposed to water entering into an interior of the package from a top surface 61R of the resin package 6R, even with such a thin-package semiconductor device 1R, the connection reliability of the semiconductor device 1R can be improved effectively.

Although the seventeenth preferred embodiment of the present invention has been described above, the seventeenth preferred embodiment may also be modified as follows.

For example, although a QFN type semiconductor device was taken up in the above description of the preferred embodiment, the present invention may also be applied to semiconductor devices of other package types, such as QFP (quad flat package), SOP (small outline package).

Also, although with the above-described preferred embodiment, a mode in which the bonding wires 5R are covered by the water-impermeable insulating film 25R was described as an example, the water-impermeable insulating film 25R may be omitted as shown in FIG. 211 as long as at least the seventeenth object for resolving the seventeenth issue is achieved.

Next, experiments related to the seventeenth preferred embodiment were performed. The present invention is not restricted by the following examples.

Examples 1 to 3 and Comparative Example 1

Semiconductor devices of the structure shown in FIG. 209 were prepared. 8-pin SOP lead frames made of Cu alloy were used. Also, in regard to the composition of the resin package, one each of an epoxy resin, curing agent, curing accelerator, coupling agent, mold release agent, pH adjuster, and flame retardant were selected from the examples mentioned above and Examples 1 to 3 and Comparative Example 1 were made completely the same besides differing in an added amount of the pH adjuster.

<Evaluation Tests>

(1) HAST

Ten semiconductor devices that were prepared from each of Examples 1 to 3 and Comparative Example 1 were used as test samples. An HAST was carried out on the ten test samples. The HAST conditions were made the same for all semiconductor devices (130° C./85% RH (relative humidity), 5V bias).

In the HAST, each semiconductor device subject to the HAST was analyzed at respective elapses of 100 hours, 200 hours, 300 hours, 500 hours, 700 hours, and 1000 hours from the start of the test, and a semiconductor device with which an electrically open state occurred between a pad and a wire was judged to be defective and discontinued from further testing. The number of semiconductor devices in which an electrically open state occurred between a pad and a wire (number of defective devices) and a cumulative occurrence rate (defect rate) are shown in accordance with the progress of the HAST in Table 8 below and in FIG. 212.

(2) PCT 30 semiconductor devices that were prepared from each of Examples 1 to 3 and Comparative Example 1 were used as test samples. A PCT was carried out on the 30 test samples. The PCT conditions were made the same for all semiconductor devices (121° C./100% RH (relative humidity)).

In the PCT, each semiconductor device subject to the PCT was analyzed at respective elapses of 100 hours, 300 hours, 500 hours, 700 hours, and 1000 hours from the start of the test, and a semiconductor device with which an electrically open state occurred between a pad and a wire was judged to be defective and discontinued from further testing. The number of semiconductor devices in which an electrically open state occurred between a pad and a wire (number of defective devices) and a cumulative occurrence rate (defect rate) are shown in accordance with the progress of the PCT in Table 9 below and in FIG. 213.

TABLE 8

| | | pH adjuster | | | | Evaluation | | | | | |
|---|---|---|---|---|---|---|---|---|---|---|---|
| | | Used/ Not used | Added amount (weight %) | ph | | 100 hours | 200 hours | 300 hours | 500 hours | 700 hours | 1000 hours |
| HAST 130° C. 85% 5 V Bias | Example 1 | Used | 0.25 | 6.5 | *1 | 0/10 | 0/10 | 0/10 | 0/9 | 1/9 | 1/8 |
| | | | | | | 0 | 0 | 0 | 0 | 11 | 22 |
| | Example 2 | Used | 0.15 | 6.1 | | 0/10 | 0/10 | 0/10 | 2/9 | 2/7 | 4/5 |
| | | | | | | 0 | 0 | 0 | 22 | 44 | 89 |
| | Example 3 | Used | 0.05 | 5.9 | | 0/10 | 0/10 | 0/10 | 2/9 | 2/7 | 3/5 |
| | | | | | | 0 | 0 | 0 | 22 | 44 | 78 |
| | Comparative Example 1 | Not used | 0 | 4.4 | | 5/10 | 3/5 | 0/2 | 1/1 | — | — |
| | | | | | | 56 | 89 | 89 | 100 | 100 | 100 |

*1 In regard to the evaluation, the number of defective items is indicated in the upper box and the defect rate (%) is indicated in the lower box.

TABLE 9

| | | pH adjuster | | | | Evaluation | | | | |
|---|---|---|---|---|---|---|---|---|---|---|
| | | Used/ Not used | Added amount (weight %) | ph | | 100 hours | 200 hours | 300 hours | 500 hours | 700 hours |
| PCT 121° C. 100% | Example 1 | Used | 0.25 | 6.5 | *2 | 0/30 | 0/30 | 0/30 | 0/30 | 0/30 |
| | | | | | | 0 | 0 | 0 | 0 | 0 |
| | Example 2 | Used | 0.15 | 6.1 | | 0/30 | 0/30 | 0/30 | 0/30 | 0/30 |
| | | | | | | 0 | 0 | 0 | 0 | 0 |
| | Example 3 | Used | 0.05 | 5.9 | | 0/30 | 0/30 | 0/30 | 0/30 | 0/30 |
| | | | | | | 0 | 0 | 0 | 0 | 0 |
| | Comparative Example 1 | Not used | 0 | 4.4 | | 0/30 | 0/30 | 6/30 | 12/24 | 11/12 |
| | | | | | | 0 | 0 | 20 | 60 | 97 |

*2 In regard to the evaluation, the number of defective items is indicated in the upper box and the defect rate (%) is indicated in the lower box.

Each of the fractions in the evaluation columns of Table 8 and Table 9 express the following: (numerator/denominator)=(number of semiconductor devices judged to be defective by analysis at the point of elapse of the corresponding test time/number of semiconductor devices subject to the test at the point of elapse of the corresponding test time). For example, the fraction, 2/9, at the point of elapse of 500 hours of Example 2 in Table 8 expresses that at the point of elapse of 500 hours, nine semiconductor devices were subject to the HAST and two of the nine were judged to be defective by the analysis at the point of elapse of 500 hours.

Also, the semiconductor devices that were judged to be non-defective by the analysis at the point of elapse of each test time were continued to be tested, and thus the denominator of each fraction in the evaluation columns of Table 8 and Table 9 is, as a rule, equal to the difference between the denominator and the numerator (denominator-numerator) of the fraction at the column adjacent to the left. However, the denominator 9 of the fraction 2/9 at the point of elapse of 500 hours for Example 2 in Table 8 is not equal to the difference between the denominator 10 and the numerator 0 (10−0=10) of 0/10 of the column adjacent to the left (for the point of elapse of 300 hours) and there is a difference of one semiconductor device. This difference resulted from extracting one semiconductor device at the point of elapse of 300 hours and subjecting it to a non-defective analysis, and the same applies to other cases where the denominator of the fraction of an evaluation column is not equal to (denominator-numerator) of the column adjacent to the left.

From Tables 8 and 2 and FIG. 212 and FIG. 213, it was confirmed that, with the semiconductor devices with which the pH of the resin package was no more than 4.5 (Comparative Example 1), the occurrence of an electrically open state of the pad-wire began at least from the elapse of 100 hours in the HAST and by the time of elapse of 500 hours, an electrically open state occurred in all semiconductor devices. Also, in the PCT, the occurrence of an electrically open state began at least from the elapse of 500 hours and by the time of elapse of 1000 hours, an electrically open state occurred in substantially all semiconductor devices.

In contrast, with the semiconductor devices with which the pH of the resin package exceeded 4.5 (Examples 1 to 3), an electrically open state did not occur in any one of the semiconductor devices at the point of elapse of 300 hours in the HAST, which is considered necessary for practical use. Also, in the PCT, the occurrence of an electrically open state did not occur at all even at the point of elapse of 1000 hours.

Eighteenth Preferred Embodiment FIG. 214 to FIG. 230

By disclosure of an eighteenth preferred embodiment, an eighteenth issue concerning an eighteenth background art described below can be resolved in addition to the issues described above in the "OBJECT(S) OF THE INVENTION."

(1) Eighteenth Background Art

In a typical semiconductor device, a semiconductor chip is disposed on a die pad and the semiconductor chip is connected by wires (gold wires) made of Au (gold) to leads disposed at a periphery of the die pad. Specifically, aluminum pads made of Al (aluminum) are disposed on a top surface of the semiconductor chip. The gold wires are installed so as to form arch-shaped loops between top surfaces of the pads and top surfaces of the leads.

Recently, price competition of semiconductor devices in the market is becoming severe and further reductions in costs of semiconductor devices are being demanded. As one cost reduction measure, use of wires (copper wires) made of inexpensive Cu (copper) as an alternative to expensive gold wires is being examined.

(2) Eighteenth Issue

However, presently, active replacement of gold wires by copper wires is yet to take place. This is because there are cases where a continuity fault between copper wires and aluminum pads occurs in a humidity resistance test (for example, an HAST (highly accelerated stress test), PCT (pressure cooker test)) that is performed after sealing of the semiconductor chip and the copper wires in a resin package.

Thus, an eighteenth object of the present invention related to the eighteenth preferred embodiment is to provide a semiconductor device with which occurrence of a continuity fault between a first member made of a material that contains aluminum and a second member made of copper can be prevented.

(3) Disclosure of a Specific Preferred Embodiment

<Manufacture of Semiconductor Device>

FIG. 214 is a schematic sectional view of a semiconductor device according to the eighteenth preferred embodiment of the present invention.

The semiconductor device 1S is a semiconductor device to which a QFN (quad flat non-leaded package) configuration is applied and has a structure in which a semiconductor chip 2S is sealed together with a die pad 3S, leads 4S, and copper wires 5S by a resin package 6S. An outer shape of the semiconductor device 1S (resin package 6S) is a flat, rectangular parallelepiped shape.

The semiconductor chip 2S has, for example, a square shape in plan view. A plurality of aluminum pads 7S are disposed at peripheral edge portions of a top surface of the semiconductor chip 2S. Each aluminum pad 7S is electrically connected to a circuit built into the semiconductor chip 2S. A rear metal 8S made of a metal layer of Au, Si (nickel), Ag (silver), etc., is formed on a rear surface of the semiconductor chip 2S.

The die pad 3S and the leads 4S are formed by punching out a metal thin plate (for example, a copper thin plate). A plating layer 9S made of Ag is formed on top surfaces of the die pad 3S and leads 4S.

The die pad 3S is disposed at a central portion of the semiconductor device 1S so that its respective side surfaces are parallel to side surfaces of the semiconductor device 1S.

A recess with a substantially quarter-elliptical shape in cross section is formed by performing a squeezing process from the rear surface side across an entire periphery of a peripheral edge portion of the rear surface of the die pad 3S. The resin package 6S enters the recess. The peripheral edge portion of the die pad 3S is thereby sandwiched from above and below by the resin package 6S and prevention of fall-off (retaining) of the die pad 3S with respect to the resin package 6S is thereby achieved.

Also, with the exception of the peripheral edge portion (portion recessed to the substantially quarter-elliptical shape in cross section), the rear surface of the die pad 3S is exposed from a rear surface of the resin package 6S.

An equal number of (for example, nine) leads 4S are disposed at each of positions facing the respective side surfaces of the die pad 3S. At each of the positions facing the side surfaces of the die pad 3S, the leads 4S extend in a direction orthogonal to the facing side surface and are disposed at equal intervals in a direction parallel to the side surface.

A recess with a substantially quarter-elliptical shape in cross section is formed by performing a squeezing process from the rear surface side at a die pad 3S side end portion of the rear surface of each lead 4S. The resin package 6S enters the recess. The die pad 3S side end portion of the lead 4S is thereby sandwiched from above and below by the resin package 6S and prevention of fall-off (retaining) of the lead 4S with respect to the resin package 6S is thereby achieved.

With the exception of the die pad 3S side end portion (portion recessed to the substantially quarter-elliptical shape in cross section), the rear surface of each lead 4S is exposed from a rear surface of the resin package 6S. Also, a side surface of the lead 4S facing the die pad 3S side is exposed from a side surface of the resin package 6S.

A plating layer 10S formed of solder is formed on portions of the rear surfaces of the die pad 3S and leads 4S that are exposed from the resin package 6S.

With its top surface with the aluminum pads 7S disposed thereon facing upward, the semiconductor chip 2S has its rear surface bonded via a bonding material 11S to the top surface (plating layer 10S) of the die pad 3S. For example, a solder paste is used as the bonding material 11S.

In a case where electrical connection of the semiconductor chip 2S and the die pad 3S is unnecessary, the rear metal 8S may be omitted and the rear surface of the semiconductor chip 2S may be bonded to the top surface of the die pad 3S via a bonding material made of silver paste or other insulating paste. In this case, the plating layer 9S on the top surface of the die pad 3S may be omitted.

The copper wires 5S are made, for example, of copper with a purity of no less than 99.99%. One end of each copper wire 5S is bonded to an aluminum pad 7S of the semiconductor chip 2S. The other end of the copper wire 5S is bonded to the top surface of a lead 4S. The copper wire 5S is installed so as to form an arch-shaped loop between the semiconductor chip 2S and the lead 4S.

As in the first preferred embodiment, in the semiconductor device 1S, the entire top surface and side surfaces of the semiconductor chip 2S, the entire top surface and side surfaces of the die pad 3S, entire top surfaces of the leads 4S, and the entire copper wires 5S are covered by an integral water-impermeable insulating film 25S.

The resin package 6S is made of a material having an epoxy resin as a main component and having an ion capturing component, with a property of capturing $Cl^-$, added in the epoxy resin. Substances having a hydroxyl group, specifically, hydrotalcite and antimony-bismuth-based hydrous oxides can be cited as examples of the ion capturing component.

FIG. 215 is a schematic sectional view of a bond portion of a pad with a copper wire (portion surrounded by broken lines shown in FIG. 214).

Each aluminum pad 7S is made of a metal that contains Al and is formed on an uppermost interlayer insulating film 12S of the semiconductor chip 2S. The interlayer insulating film 12S is made, for example, of $SiO_2$ (silicon oxide).

A top surface protective film 13S is formed on the interlayer insulating film 12S. The top surface protective film 13S is made, for example, of SiN (silicon nitride). The aluminum pad 7S has its peripheral edge portion covered by the top surface protective film 13S and its central portion is exposed via a pad opening 14S formed in the top surface protective film 13S.

The copper wire 5S is bonded to the central portion of the aluminum pad 7S exposed from the top surface protective film 13S. The copper wire 5S has an FAB formed at its tip and the FAB is pressed against and thereby bonded to the aluminum pad 7S. In this process, the FAB deforms to form a first ball portion 15S with a stepped disk shape at the tip of the copper wire 5S.

<Clarification of Mechanism of Occurrence of Continuity Fault between a Copper Wire and an Aluminum Pad>

1. Analysis of Component Elements

To clarify the mechanism of occurrence of continuity fault between a copper wire and an aluminum pad, the present inventors prepared, as a sample, a semiconductor device having the same structure as the semiconductor device 1S shown in FIG. 214 besides being different in the material of the resin package 6S. As the material of the resin package of the sample, a material having epoxy resin as a main component and not having an ion capturing component added thereto was used.

A portion of bonding of a peripheral edge portion of a first ball portion with an aluminum pad (vicinity of a bond interface) in the sample was observed by a TEM (transmission electron microscope). FIG. 216 is a TEM image that was taken in this process.

Also, an energy dispersion type X-ray microanalyzer was used on four locations D0, D1, D2, and D3 indicated in the TEM image of FIG. 216 to analyze component elements at the respective locations D0, D1, D2, and D3. The analysis results of the respective locations D0, D1, D2, and D3 are shown in FIGS. 217, 218, 219, and 220, respectively.

From the analysis results shown in FIG. 217 to FIG. 220, it was found that Cl (chlorine) is not included among the component elements at the portion of bonding of the peripheral edge portion of the first ball portion with the aluminum pad.

Next, a portion of bonding of a central portion of the first ball portion with the aluminum pad (vicinity of the bond interface) in the sample was observed by the TEM. FIG. 221 is a TEM image that was taken in this process.

Also, the energy dispersion type X-ray microanalyzer was used on five locations C0, C1, C2, C3, and C4 indicated in the TEM image of FIG. 221 to analyze the component elements at the respective locations C0, C1, C2, C3, and C4. The analysis results of the respective locations C0, C1, C2, C3, and C4 are shown in FIGS. 222, 223, 224, 225, and 226 respectively.

From the analysis results shown in FIG. 222 to FIG. 226, it was found that Cl is included among the component elements at the locations C0, C1, and C2.

2. Transition of State with Elapse of Time

Each of FIGS. 227A, 227B, and 227C is an illustrative sectional view of a bond portion of a copper wire with an aluminum pad. In each of FIGS. 227A to 227C, hatching of respective portions is omitted.

The present inventors further examined bond portions of first ball portions with aluminum pads at different points in time in several samples.

As shown in FIG. 227A, immediately after the bonding of the copper wire and the aluminum pad, an AlCu alloy is formed at the bond portion of the first ball portion with the aluminum pad. The AlCu alloy has a $Cu_9Al_4$ composition at a portion near the copper wire and has a $CuAl_2$ composition at a portion near the aluminum pad. Also, a natural oxide film ($Al_2O_3$) was formed on a top surface of a peripheral edge portion of the aluminum pad (portion at which the first ball portion is not bonded).

When the bond portion of the first ball portion with the aluminum pad was examined upon removing the resin package after elapse of a suitable first time period from the sealing of the copper wire and the aluminum pad in the resin package, it was found that comparatively small pitting (recesses due to corrosion) had occurred at a portion of the top surface of the peripheral edge portion of the aluminum pad as shown in FIG. 227B.

When the bond portion of the first ball portion with the aluminum pad was examined upon removing the resin package after elapse of a second time period longer than the first time period from the sealing of the copper wire and the aluminum pad in the resin package, it was found that the pitting had progressed to the bond portion of the first ball portion with the aluminum pad as shown in FIG. 227C. Also, the peripheral edge portion of the AlCu alloy that had the $Cu_9Al_4$ composition had changed to $Al_2O_3$.

3. Mechanism of Occurrence of Continuity Fault

Cl is not included among the component elements of the copper wire and the aluminum pad before bonding but is present in the material of the resin package. The Cl present at the portion of bonding of the central portion of the first ball portion with the aluminum pad is considered to have diffused gradually from the portion of bonding of the peripheral edge portion of the first ball portion with the central portion to the portion of bonding of the central portion of the first ball portion with the aluminum pad after the bonding of the copper wire and the aluminum pad.

Meanwhile, at the portion of bonding of the peripheral edge portion of the first ball portion with the aluminum pad, Cl is not present, and with the elapse of time, the peripheral edge portion of the AlCu alloy that had the $Cu_9Al_4$ composition changed to $Al_2O_3$.

From the above discussion, the present inventors considered the mechanism by which a continuity fault occurs between a copper wire and an aluminum pad to be as follows.

When the pitting of the top surface of the aluminum pad progresses to the portion of bonding of the peripheral edge portion of the first ball portion with the aluminum pad, the Cl ($Cl^-$) that is present in an ionic state in the resin package reaches the bond portion and reactions of the following formulae (1) and (2) occur.

$$Cu_9Al_4+12Cl \rightarrow 4AlCl_3+9Cu \quad (1)$$

$$2AlCl_3+3O \rightarrow Al_2O_3+6Cl \quad (2)$$

As a result of the above reactions, $Al_2O_3$ forms at the portion of bonding of the peripheral edge portion of the first ball portion with the aluminum pad. In the reaction of formula (2), Cl is formed along with $Al_2O_3$. Thus, once the reactions of formulae (1) and (2) occur, the Cl formed by the reaction of formula (2) progresses toward the portion of bonding of the central portion of the first ball portion with the aluminum pad and is used in the reaction of formula (1). That is, the reactions of formulae (1) and (2) occur in chain-like manner once these occur. Consequently, $Al_2O_3$ spreads rapidly toward the portion of bonding of the central portion of the first ball portion with the aluminum pad.

When $Al_2O_3$ forms across the entirety of the portion of bonding of the first ball portion with the aluminum pad, the first ball portion and the aluminum pad are insulatingly separated by the $Al_2O_3$ and a continuity fault occurs between the copper wire (first ball portion) and the aluminum pad.

It is considered that Cl was not present at the portion of bonding of the peripheral edge portion of the first ball portion with the aluminum pad shown in FIG. 216 because the reactions of formulae (1) and (2) were already ended at that portion and Cl was present at the portion of bonding of the central portion of the first ball portion with the aluminum pad shown in FIG. 221 because the reactions of formulae (1) and (2) were in the middle of occurring at that portion.

Actions and Effects

Upon clarifying the mechanism of occurrence of a continuity fault between a copper wire and an aluminum pad as described above, the present inventor considered adding an ion capturing component, having a property of capturing $Cl^-$, to the material of the resin package. Reaction of an AlCu alloy ($Cu_9Al_4$) and $Cl^-$ at the bond portion of the copper wire 5S and the aluminum pad 7S can thereby be suppressed and the formation of $Al_2O_3$, which is the reaction product, can be prevented. Consequently, the copper wire 5S and the aluminum pad 7S can be prevented from being insulatingly separated by $Al_2O_3$. Occurrence of a continuity fault between the copper wire 5S and the aluminum pad 7S can thus be prevented.

Modification Examples

Although the eighteenth preferred embodiment of the present invention has been described above, the eighteenth preferred embodiment may also be modified as follows.

For example, the present invention may be applied to structures having wires made of a metal that contains aluminum bonded with pads made of copper and to structures having a die pad or leads made of copper bonded with wires made of a metal that contains aluminum.

Also, although a QFN is applied to the semiconductor device 1S, the present invention may also be applied to the manufacture of a semiconductor device to which another type of non-leaded package, such as an SON (small outlined non-leaded package), is applied.

The present invention may also be applied to the manufacture of not only semiconductor devices to which a non-leaded package is applied but also semiconductor devices to which a QFP (quad flat package) or other package having outer leads formed by leads projecting from a resin package is applied.

Also, although with the above-described preferred embodiment, a mode in which the copper wires 5S are covered by the water-impermeable insulating film 25S was described as an example, the water-impermeable insulating film 25S may be omitted as shown in FIG. 228 as long as at least the eighteenth object for resolving the eighteenth issue is achieved.

Next, experiments related to the eighteenth preferred embodiment were performed. The present invention is not restricted by the following examples.

As semiconductor devices according to an example, 40 semiconductor devices having the same structure as the semiconductor device 1S shown in FIG. 214 (structure related to the preferred embodiment of the present invention) were prepared.

As semiconductor devices according to a comparative example, 40 semiconductor devices having the same structure as the semiconductor device 1S shown in FIG. 214 with the exception of differing in the material of the resin package 6S were prepared. As the material of the resin packages of the semiconductor devices according to the comparative example, a material having epoxy resin as a main component and not having an ion capturing component added thereto was used.

Ten semiconductor devices from each of the semiconductor devices according to the example and the semiconductor devices according to the comparative example were subject to a highly accelerated stress test (HAST) of a temperature condition of 130° C. and a humidity condition of 85%, and continuity states between the copper wire and the aluminum pad were examined after the elapse of 100 hours (100 h), 200 hours (200 h), 300 hours (300 h), 500 hours (500 h), 700 hours (700 h), and 1000 hours (1000 h) from the start of the test. The results are shown in FIG. 229.

Also, 30 semiconductor devices from each of the semiconductor devices according to the example and the semiconductor devices according to the comparative example were subject to a pressure cooker test (PCT) of a temperature condition of 121° C. and a humidity condition of 100%, and continuity states between the copper wire and the aluminum pad were examined after the elapse of 100 hours (100 h), 300 hours (300 h), 500 hours (500 h), 700 hours (700 h), and 1000 hours (1000 h) from the start of the test. The results are shown in FIG. 230.

As shown in FIG. 229, in the highly accelerated stress test, a fault occurred in five of the ten semiconductor devices according to the comparative example at the point of elapse of 100 hours from the start of the test and a fault occurred in all of the semiconductor devices according to the comparative example at the point of elapse of 500 hours from the start of the test. On the other hand, with the semiconductor device according to the example, no faults occurred at the point of elapse of 300 hours from the start of the test and a fault occurred in only two of nine semiconductor devices even at the point of elapse of 500 hours from the start of the test.

At the point of elapse of 300 hours from the start of the highly accelerated stress test, one each of the semiconductor devices according to the example and the semiconductor devices according to the comparative example were removed from being subject to the highly accelerated stress test and thus from that point onward, the number of the semiconductor devices according to the example and the number of the semiconductor devices according to the comparative example that were subject to the highly accelerated stress test were decreased by one each.

As shown in FIG. 230, in the pressure cooker test, whereas a fault occurred in six of the 30 semiconductor devices according to the comparative example at the point of elapse of 300 hours from the start of the test, no faults occurred in the semiconductor devices according to the example even after the elapse of 500 hours from the start of the test.

From the results of the highly accelerated stress test and the pressure cooker test, it was confirmed that a continuity fault between a copper wire and an aluminum pad does not occur readily in a semiconductor device according to the example, that is, a semiconductor device having a resin package made of material with an ion capturing component added to an epoxy resin, and the effect of the present invention was thus confirmed and it was confirmed that the mechanism of occurrence of the continuity fault is correct.

Nineteenth Preferred Embodiment FIG. 231 to FIG. 239

The nineteenth preferred embodiment is a preferred embodiment for resolving the third to fifth, the seventh, the twelfth, the seventeenth, and the eighteenth issues.

FIG. 231 is a schematic bottom view of a semiconductor device according to the nineteenth preferred embodiment. FIG. 232 is a schematic sectional view of the semiconductor device according to the nineteenth preferred embodiment.

The semiconductor device 1T is a semiconductor device to which a QFN (quad flat non-leaded) configuration is applied. The semiconductor device 1T includes a semiconductor chip 2T, a die pad 3T supporting the semiconductor chip 2T, a plurality of electrode leads 4T disposed at a periphery of the semiconductor chip 2T, bonding wires 5T electrically connecting the semiconductor chip 2T and the electrode leads 4T, and a resin package 6T sealing the above components.

The semiconductor chip 2T has a quadrilateral shape in plan view and has a multilayer wiring structure arranged by laminating a plurality of wirings via interlayer insulating films. The multilayer wiring structure of the semiconductor chip 2T shall be described in detail later with reference to FIG. 233 and FIG. 235. The semiconductor chip 2T has a thickness, for example, of 220 to 240 μm (preferably, approximately 230 μm). A top surface 21T (surface at one side in a thickness direction) of the semiconductor chip 2T is covered by a top surface protective film 7T to be described later (see FIG. 233).

At the top surface 21T of the semiconductor chip 2T, portions of a wiring (a third wiring 28T to be described below) of the multilayer wiring structure are exposed as electrode pads 9T from pad openings 8T to be described below.

Meanwhile, a rear surface metal 10T that contains, for example, Au, Ni, Ag, etc., is formed on a rear surface 22T (surface at the other side in the thickness direction) of the semiconductor chip 2T.

The die pad 3T is made, for example, of a metal thin plate (for example, Cu or 42 alloy (an alloy containing Fe-42% Ni) and has a larger quadrilateral shape (for example, approximately 2.7 mm square in plan view) than the semiconductor chip 2T. Also, the die pad 3T has a thickness of 190 to 210 μm (preferably, approximately 200 μm). A pad plating layer 11T that contains Ag, etc., is formed on a top surface 31T (surface at one side in the thickness direction) of the die pad 3T.

The semiconductor chip 2T and the die pad 3T are bonded to each other in a state where the rear surface 22T of the semiconductor chip 2T and the top surface 31T of the die pad 3T face each other as bond surfaces with a bonding material 12T interposed between the rear surface 22T and the top surface 31T. The semiconductor chip 2T is thereby supported by the die pad 3T in an orientation where the top surface 21T faces upward.

The bonding material 12T is made, for example, of solder paste or other conductive paste. As the bonding material 12T, an insulating paste, such as a silver paste, an alumina paste, may be applied and in this case, the rear surface metal 10T and/or the pad plating layer 11T may be omitted. Also, in the state where the semiconductor chip 2T and the die pad 3T are bonded, a thickness of the bonding material 12T is, for example, 10 to 20 μm.

A rear surface 32T (surface at the other side in the thickness direction) of the die pad 3T is exposed from the resin package 6T. A solder plating layer 13T made, for example, of a metal material, such as tin (Sn), tin-silver alloy (Sn—Ag), is formed on the exposed other-side surface.

The electrode leads 4T are made of the same metal thin plate (containing, for example, Cu or 42 alloy (Fe-42% Ni, etc.) as the die pad 3T. The electrode leads 4T are disposed at the periphery of the semiconductor chip 2T at both sides in respective directions orthogonal to respective side surfaces of the die pad 3T. The electrode leads 4T that face each side surface of the die pad 3T are disposed at equal intervals in a direction parallel to the facing side surface. A length of each electrode lead 4T in the direction of facing the die pad 3T is, for example, 240 to 260 μm (preferably, approximately 250 μm). A lead plating layer 14T that contains Ag, etc., is formed on atop surface 41T (surface at one side in the thickness direction) of each electrode lead 4T.

Meanwhile, a rear surface 42T (surface at the other side in the thickness direction) of each electrode lead 4T is exposed from the resin package 6T. A solder plating layer 15T made, for example, of a metal material, such as tin (Sn), tin-silver alloy (Sn—Ag), is formed on the exposed rear surface 42T.

Each bonding wire 5T is made of copper (for example, a high-purity copper of no less than 99.9999% (6N) purity or no less than 99.99% (4N) purity that may contain a minute amount of impurity). Each bonding wire 5T includes a linearly-extending, cylindrical main body portion 51T and includes a pad bond portion 52T and a lead bond portion 53T formed at respective ends of the main body portion 51T and respectively bonded to an electrode pad 9T and an electrode lead 4T.

The main body portion 51T is curved parabolically upward from the one end at the electrode pad 9T side toward an outer side of the semiconductor chip 2T and made impingent at an acute angle at the other end on the top surface 41T of the electrode lead 4T.

The lead bond portion 53T has a wedge-like shape in sectional view that is relatively thick at the one end side close to the main body portion 51T and becomes relatively thinner toward the other end side away from the main body portion 51T.

The resin package 6T is made of a material that has an epoxy resin as a main component, contains a curing agent, a curing accelerator, a coupling agent, a mold release agent, a pH adjuster, etc., and further has an ion capturing component, with a property of capturing $Cl^-$, added in the epoxy resin. Substances having a hydroxyl group, specifically, hydrotalcite and antimony-bismuth-based hydrous oxides can be cited as examples of the ion capturing component.

The epoxy resin contained is not restricted in particular as long as it is that used as an epoxy resin for resin packages, and phenol novolac type epoxy resins, ortho-cresol novolac type epoxy resins, epoxy resins having a triphenylmethane skeleton (triphenylmethane type epoxy resins), stilbene type epoxy resins, hydroquinone type epoxy resins, glycidyl ester type epoxy resins, glycidyl amine type epoxy resins, dicyclopentadiene type epoxy resins, naphthalene type epoxy resins, epoxy compounds of aralkyl type phenol resins, biphenylene type epoxy resins, trimethylol propane type epoxy resins, terpene modified epoxy resins, linear aliphatic epoxy resins, alicyclic epoxy resins, sulfur-atom-containing epoxy resin, etc., can be cited as examples. Each of these may be used solitarily or two or more types may be used in combination.

The curing agent contained is not restricted in particular as long as it is that used as a curing agent for resin packages, and novolac type phenol resins, aralkyl type phenol resins, such as phenol-aralkyl resins, naphthol-aralkyl resins, biphenyl-aralkyl resins, dicyclopentadiene type phenol resins, terpene modified phenol resins, triphenylmethane type phenol resins, etc., can be cited as examples. Each of these may be used solitarily or two or more types may be used in combination.

The curing accelerator contained is not restricted in particular as long as it is that used as a curing accelerator for resin packages, and cycloamidine compounds, such as 1,8-diazabicyclo(5,4,0)undecene-7,1,5-diazabicyclo(4,3,0)nonene, 5,6-dibutylamino-1,8-diazabicyclo(5,4,0)undecene-7, and compounds having intramolecular polarization formed by adding a compound with a π-bond, such as maleic anhydride, a quinione compound, such as 1,4-benzoquinone, 2,5-tolquinone, 1,4-naphthoquinone, 2,3-dimethylbenzoquinone, 2,6-dimethylbenzoquinone, 2,3-dimethoxy-5-methyl-1,4-benzoquinone, 2,3-dimethoxy-1,4-benzoquinone, phenyl-1,4-benzoquinone, diazophenylmethane, phenol resin, etc., to an abovementioned cycloamidine compound, tertiary amines, such as benzyldimethylamine, triethanolamine, dimethylaminoethanol, tris(dimethylaminomethyl)phenol, and derivatives thereof, imidazoles, such as 2-methylimidazole, 2-phenylimidazole, 2-phenyl-4-methylimidazole, and derivatives thereof, phosphine compounds, such as tributylphosphine, methyldiphenylphosphine, triphenylphosphine, tris(4-methylphenyl)phosphine, diphenylphosphine, phenylphosphine, and phosphorus compounds having intramolecular polarization formed by adding a compound with a π-bond, such as maleic anhydride, an abovementioned quinone compound, diazophenylmethane, phenol resin, to an abovementioned phosphine compound, tetraphenylboron salts, such as tetraphenylphosphonium tetraphenylborate, triphenylphosphine tetraphenylborate, 2-ethyl-4-methylimidazole tetraphenylborate, N-methylmorpholine tetraphenylborate, and derivatives thereof, etc., can be cited as examples. Each of these may be used solitarily or two or more types may be used in combination.

The coupling agent contained is not restricted in particular as long as it is that used as a coupling agent for resin packages, and silane compounds having at least one primary, secondary, or tertiary amine group, various silane-based compounds, such as epoxy silanes, mercapto silanes, alkyl silanes, ureido silanes, vinyl silanes, titanium based compounds, aluminum chelates, aluminum/zirconium-based compounds, etc., can be cited as examples. Each of these may be used solitarily or two or more types may be used in combination.

The mold release agent contained is not restricted in particular as long as it is that used as a mold release agent for resin packages, and higher fatty acids, such as carnauba wax, montanic acid, stearic acid, metal salts of higher fatty acids, ester-based waxes, such as montanic acid esters, polyolefin-based waxes, such as oxidized polyethylene, non-oxidized polyethylene, can be cited as examples. Each of these may be used solitarily or two or more types may be used in combination.

As examples of the pH adjuster contained, inorganic fillers, such as wollastonite (calcium silicate), talc (magnesium silicate), aluminum hydroxide, magnesium carbonate, calcium carbonate, can be cited. Each of these may be used solitarily or two or more types may be used in combination.

The resin package 6T may also contain an additive, such as a diluent, colorant, flame retardant, leveling agent, anti-foaming agent, as necessary.

A pH of the resin package 6T with the above composition exceeds 4.5, and from a need to maintain the pH of the resin package 6T at an acidic pH, the pH preferably exceeds 4.5 and is less than 7.0 and more preferably, is no less than 6.0 and less than 7. Also, the resin package 6T makes up an outer shape of the semiconductor device 1T and is formed to a substantially rectangular parallelepiped shape. In terms of size, the resin package 6T has a planar size, for example, of approximately 4 mm square and a thickness, for example, of approximately 0.85 mm.

With the semiconductor device 1T, an interval L1 between the top surface 21T of the semiconductor chip 2T and a top surface (upper surface) of the resin package 6T is less than a minimum distance W between a side surface of the semiconductor chip 2T and a side surface of the resin package 6T. Specifically, the interval L1 is, for example, 375 to 425 μm and preferably, approximately 400 μm, and the minimum distance W is, for example, 800 to 1000 μm and preferably, approximately 900 μm.

Also, the interval L1 is no more than a distance L2 (for example, of 425 to 475 μm and preferably, approximately 450 μm) between the top surface 21T of the semiconductor chip 2T and a rear surface of the resin package 6T (rear surface 32T of the die pad 3T).

FIG. 233 is an enlarged view of a portion surrounded by a broken-line circle in FIG. 232. FIG. 234 is a conceptual diagram for determining a volume of a pad bond portion. FIG. 235 is a plan view of an electrode pad shown in FIG. 233.

The semiconductor chip 2T includes a semiconductor substrate 16T, first to third interlayer insulating films 17T to 19T laminated successively on the semiconductor substrate 16T, first to third barrier layers 23T to 25T formed on respective top surfaces of the first to third interlayer insulating films 17T to 19T, and the top surface protective film 7T covering the top surface 21T of the semiconductor chip 2T.

The semiconductor substrate 16T is made, for example, of silicon.

The first to third interlayer insulating films 17T to 19T are made, for example, of silicon oxide. A first wiring 26T is formed via the first barrier layer 23T on the first interlayer insulating film 17T. Also, a second wiring 27T is formed via the second barrier layer 24T on the second interlayer insulating film 18T. Also, the third wiring 28T is formed via the third barrier layer 25T on the third interlayer insulating film 19T.

The first to third wirings 26T to 28T are made of a metal material that is softer than the material of the first to third barrier layers 23T to 25T, and are made specifically of a metal material that contains Al (aluminum), and made specifically of a metal material having Al as a main component (for example, an Al—Cu alloy, etc.).

By being covered by the top surface protective film 7T, the third wiring 28T is formed between the interlayer insulating film (third interlayer insulating film 19T) that is an uppermost layer and the top surface protective film 7T. The third wiring 28T has a quadrilateral shape (for example, a quadrilateral shape of 120 μm×120 μm) in plan view. Also, the third wiring 28T has a thickness, for example, of no less than 500 Å and preferably, 7000 to 28000 Å.

The pad openings 8T for exposing the third wiring 28T as the electrode pads 9T are formed in the top surface protective film 7T that covers the third wiring 28T.

By being covered by the third interlayer insulating film 19T, the second wiring 27T is formed between the second interlayer insulating film 18T and the third interlayer insulating film 19T. The second wiring 27T is formed in a predetermined pattern. For example, it is formed in a pattern that does not overlap with the electrode pads 9T in plan view. Also, the second wiring 27T has a thickness, for example, of 3000 to 9000 Å.

By being covered by the second interlayer insulating film 18T, the first wiring 26T is formed between the first interlayer insulating 17T and the second interlayer insulating film 18T. The first wiring 26T is formed in a predetermined pattern. For example, directly below each electrode pad 9T, the first wiring 26T has a plurality of rectilinear portions 29T that extend parallel to each other and connecting portions 30T that connect ends at one side of adjacent rectilinear portions 29T and alternately connect ends at the other side of adjacent rectilinear portions 29T and is thereby formed in a meandering pattern that is bent in a substantially sinusoidal form. A single electrode pad 9T (third wiring 28T) thereby faces a plurality of rectilinear portions 29T and sandwiched portions 20T of the second interlayer insulating film 18T that are sandwiched between the rectilinear portions 29T.

Mutual intervals between adjacent rectilinear portions 29T (pitch W of the rectilinear portion 29T) are, for example, all equal and are specifically 2 to 10 μm. Also, the first wiring 26T has a thickness, for example, of 3000 to 9000 Å.

The patterns of the first to third wirings 26T to 28T may be changed as suited in accordance with design rules of the semiconductor chip 2T and are not limited to the above-described patterns.

Each of the first to third barrier layers 23T to 25T is made, for example, titanium (TiN), titanium nitride (TiN), tungsten nitride (TiW), or a laminated structure of these, etc. Each of the first to third barrier layers 23T to 25T has a thickness that is less than the thickness of each of the first to third wirings 26T to 28T and is, for example, 500 to 2000 Å.

In plan view, the pad bond portion 52T of the bonding wire 5T that is bonded to the electrode pad 9T is smaller than the electrode pad 9T. The pad bond portion 52T has a humped shape in sectional view that integrally includes a substantially cylindrical base portion 54T, which, at its one side in the thickness direction, contacts a top surface of the electrode pad 9T, and a substantially umbrella-shaped projecting portion 55T projecting from the other side of the base portion 54T and having a tip connected to the one end of the main body portion 51T.

As shall be described below, the bonding wire 5T has an FAB formed at its tip and the FAB is pressed against and thereby bonded to the electrode pad 9T. In this process, the FAB deforms to form the pad bond portion 52T with the humped shape in sectional view at the bond portion of the bonding wire 5T with the electrode pad 9T. Also, at a periphery of the pad bond portion 52T, the material of the electrode pad 9T juts out gradually from below the pad bond portion 52T so as to form a jutting portion 34T without it being lifted greatly from the top surface of the electrode pad 9T.

Also, with the bonding wire 5T, a ratio $(V/(D_w)^3)$ of a volume V of the pad bond portion 52T with respect to a cube of a wire diameter $D_w$ of the main body portion 51T (diameter of the main body portion 51T) is 1.8 to 5.6.

The volume V of the pad bond portion 52T is determined, for example, by determining a volume $V_b$ of the substantially cylindrical base portion 54T and a volume $V_p$ of the substantially umbrella-shaped projecting portion 55T as approximate values and adding the approximate values.

The volume $V_b$ of the base portion 54T can be determined as an approximate value based on a volume of a cylinder with a diameter $D_b$ and a height $H_b$ which the base portion 54T is conceptually deemed to be as shown in FIG. 234. That is, the volume Vb of the base portion 54T can be expressed as $V_b \approx \pi(D_b/2)^2 \cdot H_b$.

Meanwhile, the projecting portion 55T has a substantially umbrella-like shape formed by using a cone as a base and forming a top portion of the cone to a cylindrical shape having a height direction as an axis, and thus the volume $V_p$ of the projecting portion 55T can be determined as an approximate value based on a volume of a cone with a diameter $D_p$ and a height $H_p$ which the projecting portion 55T is conceptually deemed to be as shown in FIG. 234. Thus, the volume $V_p$ of the projecting portion 55T can be expressed as $V_b \approx \pi(D_p/2)^2 \cdot H_p/3$.

Also, with the semiconductor device 1T, an area of the first wiring 26T (area of slanted line portion in FIG. 235) that overlaps a bond region 33T of the bonding wire 5T and the electrode pad 9T in plan view is no more than 26.8% and preferably, 0 to 25% of an area S of the bond region 33T.

The bond region 33T is a region of circular shape in plan view in which the base portion 54T of the pad bond portion 52T contacts the top surface of the electrode pad 9T, and the area S thereof can be determined by a formula: $S=\pi(D_b/2)^2$ using a diameter $D_b$ of the base portion 54T.

FIG. 236A to FIG. 236D are schematic sectional views for describing a method for manufacturing the semiconductor device shown in FIG. 232 in order of process.

To manufacture the semiconductor device 1T, for example, first, a lead frame 70T that includes a plurality of units each integrally having a die pad 3T and electrode leads 4T is prepared. In FIG. 236A to FIG. 236D, an entire view of the lead frame 70T is abbreviated and the die pad 3T and electrode leads 4T of just a single unit necessary for mounting a single semiconductor chip 2T are shown.

Next, a metal plating of Ag, etc., is applied to a top surface of the lead frame 70T by a plating method. The pad plating layer 11T and the lead plating layer 14T are thereby formed at the same time.

Next, as shown in FIG. 236A, the semiconductor chips 2T are die bonded via the bonding material 12T to all die pads 3T on the lead frame 70T.

Next, bonding of each bonding wire 5T is performed by a wire bonder (not shown) that includes a capillary C.

As shown in FIG. 236A, the capillary C has a substantially cylindrical shape with a wire insertion hole 61T formed along a central axis. The bonding wire 5T is inserted through the wire insertion hole 61T and fed out from a tip (lower end) of the wire insertion hole 61T. Also, the capillary C is made of a material with a thermal conductivity of 15 to 45 W/m·K and preferably, 17 to 43 W/m·K. Specifically, the capillary C is made of polycrystalline ruby (with a thermal conductivity, for example, of approximately 17 to 19 W/m·K) or monocrystalline ruby (with a thermal conductivity, for example, of approximately 41 to 43 W/m·K).

A chamfer 62T of truncated conical shape that is in communication with the wire insertion hole 61T is formed below the wire insertion hole 61T at a tip portion of the capillary C. Also, the tip portion of the capillary C has a face 63T that is continuous with a lower end edge of the chamfer 62T and is a surface that faces an electrode pad 9T and an electrode lead 4T during bonding (during wire bonding) of the bonding wire 5T to the electrode pad 9T and the electrode lead 4T. An outer side of the face 63T is gradually inclined upwardly with respect to a plane orthogonal to the central axis of the capillary C.

First, as shown in FIG. 236A, the capillary C is moved to a position directly above the electrode pad 9T. Next, in a state where a tip of the bonding wire 5T is positioned at the chamfer 62T, a current is applied to the tip portion of the bonding wire 5T and an FAB 64 is thereby formed at the tip portion. The value and application time of the current are set suitably in accordance with the wire diameter of the bonding wire 5T and an intended diameter of the FAB 64 (designed diameter of the FAB 64).

For example, the value I of the current is set to a larger value the larger the wire diameter $D_w$ of the main body portion 51T of the bonding wire 5T, and for example, I=40 mA when $D_w$=25 μm, I=60 mA when $D_w$=30 μm, and I=120 mA when $D_w$=38 μm. A current application time is set to an appropriate length according to a diameter $D_f$ of the FAB 64.

A volume $V_f$ of the FAB 64 thus formed may be expressed using the diameter $D_f$ of the FAB 64 as $V_f=4/3\cdot\pi\cdot(D_f/2)^3$. Also, a portion of the FAB 64 protrudes below the chamfer 62T.

Thereafter, as shown in FIG. 236B, the capillary C is lowered toward the electrode pad 9T and the FAB 64 is pressed against the electrode pad 9T by the capillary C. In this process, a load is applied to the FAB 64 by the capillary C and ultrasonic vibration, emitted from an ultrasonic transducer (not shown) provided in the capillary C, is applied to the FAB 64.

FIG. 237 is a graph of a changes with time of the load applied to the FAB and a driving current applied to the ultrasonic transducer during the bonding of the FAB to the pad.

For example, as shown in FIG. 237, a relatively large initial load P1 is applied from the capillary C to the FAB 64 from a time T1 at which the FAB 64 contacts the electrode pad 9T to a time T2 after elapse of a predetermined time period (for example, 3 msec). From the time T2 onward, the load applied to the FAB 64 from the capillary C is lowered and a relatively small load P2 (for example, 30 g) is applied to the FAB 64. The load P2 is applied continuously until a time T4 at which the capillary C is raised.

The initial load P1 is set based on a value obtained by multiplying an intended bonding area of the pad bond portion 52T with respect to the electrode pad 9T (designed bonding area ($S=\pi(D_b/2)^2$) of the pad bond portion 52T with respect to the pad 9T) by a fixed factor (for example, 28786 in a case where the unit of the initial load P1 is g and the unit of the bonding area is $mm^2$). In the present preferred embodiment, the intended bonding area S of the pad bond portion 52T with respect to the pad 9T is set at 0.00430 $mm^2$ and the initial load P1 is set to 130 g.

In a case where a standard type capillary is used as the capillary C, a drive current of a relatively small value U1 is applied to the ultrasonic transducer from before the time T1 at which the FAB 64 contacts the electrode pad 9T. The drive current value U1 is, for example, 15 mA. When the FAB 64 contacts the electrode pad 9T, the value of the drive current applied to the ultrasonic transducer is raised from the time T1 to a time T3 at a fixed rate of change (monotonously) from a value U1 to a value U2. The rate of change is set to no more than 21 mA/msec. Also, the value U2 of the drive current that is applied to the ultrasonic transducer in a final stage is set so that a value obtained by dividing the value U2 by the intended bonding area of the pad bond portion 52T is no more than 0.0197 mA/$\mu m^2$. In the present preferred embodiment, the drive current value U2 is, for example, 90 mA. Further, the drive current values U1 and U2 are set so that an integrated value of the drive current applied to the ultrasonic transducer during the predetermined time period in which the initial load is applied to the FAB 44 is no more than 146 ma·msec. From the time T3 onward until the time T4, the drive current of the value U2 continues to be applied to the ultrasonic transducer.

The standard type capillary has a shape such as shown in FIG. 238 and has the following dimensions. A CD dimension, which is a diameter of a lower end edge of the chamfer 62T, is 66 μm (0.066 mm). The T dimension, which is the outer diameter of the face 63T, is 178 μm (0.178 mm). A chamfer angle, which two straight lines extending along the side surface of the chamfer 62T form in a cross section of the capillary C taken along a plane that includes the central axis (cross section shown in FIG. 238), is 90°. A face angle FA, which is an angle that the face 63T forms with the plane orthogonal to the central axis of the capillary C, is 8°. An angle CA, which, in the cross section of the capillary C taken along the plane that includes the central axis, a portion of the side surface of the capillary C that extends upward beyond the upper end of the face 63T forms with the central axis, is 20°.

On the other hand, when a bottleneck type capillary is used as the capillary C, a drive current of a value 1.4 times the value U1 is applied to the ultrasonic transducer from before the time T1 at which the FAB 64 contacts the electrode pad 9T as shown in FIG. 237. Then, from the T1 at which the FAB 64 contacts the electrode pad 9T to a time T3, the value of the drive current applied to the ultrasonic transducer is raised at a fixed rate of change (monotonously) from the value U1 to a value 1.4 times the value U2. From the time T3 onward until the time T4, the drive current of the value 1.4 times the value U2 continues to be applied to the ultrasonic transducer.

The bottleneck type capillary has a shape such as shown in FIG. 239 and has the following dimensions. The CD dimension, which is the diameter of the lower end edge of the chamfer 62T, is 66 μm (0.066 mm). The T dimension, which is the outer diameter of the face 63T, is 178 μm (0.178 mm). The chamfer angle, which two straight lines extending along the side surface of the chamfer 62T form in the cross section of the capillary C taken along a plane that includes the central axis (cross section shown in FIG. 239), is 90°. The face angle FA, which is the angle that the face 63T forms with the plane orthogonal to the central axis of the capillary C, is 8°. The angle CA, which, in the cross section of the capillary C taken along the plane that includes the central axis, the portion of the side surface of the capillary C that extends upward beyond the upper end of the face 63T forms with the central axis, is 10°.

Consequently, the FAB 64 deforms along the shapes of the chamfer 62T and the face 63T of the capillary C, and the pad bond portion 52T with a stepped disk shape is formed on the electrode pad 9T with the jutting portion 34T being formed along its periphery as shown in FIG. 236B. Bonding (first bonding) of the bonding wire 5T with the electrode pad 9T is thereby achieved.

When the time T4 arrives upon elapse of a bonding time determined in advance from the time T1, the capillary C is separated upwardly from the electrode pad 9T. Thereafter, the capillary C is moved obliquely downward toward the top surface of the electrode lead 4T. Then, as shown in FIG. 236C, the drive current is applied to the ultrasonic transducer, and while ultrasonic vibration is being applied to the capillary C, the bonding wire 5T is pressed against the top surface of the electrode lead 4T by the capillary C and then broken. A stitch portion (lead bond portion 53T) with a wedge shape in side view that is made up of the other end portion of the bonding wire 5T is thereby formed on the top surface of the electrode lead 4T and the bonding (second bonding) of the copper wire with respect to the electrode lead 4T is thereby achieved.

Thereafter, the processes shown in FIG. 236A to FIG. 236C are performed on another electrode pad 9T and the corresponding electrode lead 4T. By the processes shown in FIG. 236A to FIG. 236C then being repeated, bonding wires 5T are installed across all electrode pads 9T of the semiconductor chip 2T and the electrode leads 4T as shown in FIG. 236D.

After the end of all of the wire bonding, the lead frame 70T is set in a forming mold and all semiconductor chips 2T are sealed in a batch together with the lead frame 70T by the resin package 6T. Solder plating layers 13T and 15T are then formed on the rear surfaces 32T of the die pads 3T and the rear surfaces 42T of the electrode leads 4T that are exposed from the resin package 6T. Lastly, a dicing saw is used to cut the lead frame 70T together with the resin package 6T to sizes of the respective semiconductor devices 1T and the individual semiconductor devices 1T one of which is shown in FIG. 232 are thereby obtained.

The nineteenth preferred embodiment corresponds to the third, fifth, seventh, twelfth, seventeenth, and eighteenth preferred embodiments, and the entire disclosures of these preferred embodiments are incorporated herein by reference. That is, by the nineteenth preferred embodiment, the same actions and effects as the third to fifth, seventh, twelfth, seventeenth, and eighteenth preferred embodiments can be achieved.

Twentieth Preferred Embodiment FIG. 240 to FIG. 249

The twentieth preferred embodiment is a preferred embodiment for resolving the third to the fifth, the seventh, the eleventh, the twelfth, the seventeenth, and the eighteenth issues.

FIG. 240 is a schematic bottom view of a semiconductor device according to the twentieth preferred embodiment. FIG. 241 is a schematic sectional view of the semiconductor device according to the twentieth preferred embodiment. FIG. 242 is an enlarged view of principal portions of a portion surrounded by a broken-line circle A in FIG. 241. FIG. 243 is an enlarged view of principal portions of a portion surrounded by a broken-line circle B in FIG. 241. FIG. 244 is a conceptual diagram for determining a volume of a pad bond portion. FIG. 245 is a plan view of an electrode pad shown in FIG. 244.

The semiconductor device 1U is a semiconductor device to which a QFN (quad flat non-leaded) configuration is applied. The semiconductor device 1U includes a semiconductor chip 2U, a die pad 3U on which the semiconductor chip 2U is mounted, a plurality of electrode leads 4U disposed at a periphery of the die pad 3U, bonding wires 5U electrically connecting the semiconductor chip 2U and the electrode leads 4U, and a resin package 6U sealing the above components.

In the following description, the present preferred embodiment shall be described with a direction in which the semiconductor chip 2U faces the die pad 3U being a Z direction and a direction orthogonal to the Z direction being an X direction.

The semiconductor chip 2U includes an Si substrate 7U of quadrilateral shape in plan view.

The Si substrate 7U has a thickness, for example, of 220 to 240 μm (preferably, approximately 230 μm). A multilayer wiring structure (see FIG. 243) arranged by laminating a plurality of wiring layers via interlayer insulating films is formed on a top surface 71U of the Si substrate 7U, and a topmost surface of the multilayer wiring structure is covered by a top surface protective film 16U (to be described later).

The uppermost wiring layer exposed as the electrode pads 8U is made, for example, of a metal material containing Al (aluminum) and is specifically made of a metal material having Al as a main component (for example, an Al—Cu alloy, etc.).

Meanwhile, a rear metal 9U is formed on a rear surface 72U (surface facing the die pad 3U) of the Si substrate 7U.

As shown in FIG. 242, the rear metal 9U has a three-layer structure in which an Au layer 91U, a Ni layer 92U, and a Cu layer 93U are laminated in that order from the Si substrate 7U side. The Au layer 91U can be put in ohmic contact enabling conduction of electricity with an Si semiconductor and contacts the rear surface 72U of the Si substrate 7U. The Ni layer 92U is formed at the Si substrate 7U side relative to the Cu layer 93U, which makes up a topmost surface of the rear metal 9U, and is a layer for preventing Si nodules, by which the Si in the Si substrate 7U precipitates at the topmost surface of the rear metal 9U.

The die pad 3U and the plurality of electrode leads 4U are formed of the same metal thin plate and are formed as a lead frame 10U. The metal thin plate making up the lead frame 10U is made of a Cu-based material that mainly contains Cu and is specifically made, for example, of a high-purity copper of no less than 99.9999% (6N) purity or no less than 99.99% (4N) purity or an alloy of Cu and a dissimilar metal (for example, a Cu—Fe—P alloy, etc.). The metal thin plate may also be made of an Fe-based material, such as 42 alloy (Fe-42% Ni). Also, the lead frame 10U (metal thin plate) has a thickness, for example, of 190 to 210 μm (preferably, approximately 200 μm).

The die pad 3U has a larger quadrilateral shape (for example, of 2.7 mm square in plan view) than the semiconductor chip 2U in plan view. A top surface 31U (surface facing the semiconductor chip 2U) of the die pad 3U is an uncovered surface that is not covered by a metal thin film by plating, sputtering, or other process and the Cu-based material that makes up lead frame 10U is exposed across the entire top surface 31U.

A plurality of Cu stud bumps 18U are provided on the top surface 31U of the die pad 3U. In plan view, one Cu stud bump 18U is disposed at each corner of the die pad 3U and a total of four thereof are provided. Each Cu stud bump 18U is formed by a known wire bonding method and has a humped shape in sectional view that integrally includes a base portion 181U of relatively large diameter that contacts the top surface 31U and a tip portion 182U of relatively small diameter that projects from the base portion 181U toward the semiconductor chip 2U side.

The semiconductor chip 2U, in a state of being supported by the Cu stud bumps 18U in a manner such that the rear metal 9U contacts the tip portions 182U of the Cu stud bumps 18U, is bonded to the die pad 3U by a bonding layer 11U being interposed between the rear surface 72U of the Si substrate 7U and the top surface 31U of the die pad 3U.

The bonding layer 11U includes a Bi-based material layer 111U as a relatively thick main layer and Cu—Sn alloy layers 112U, 113U, and 114U as relatively thin sub layers.

The Bi-based material layer 111U contains Bi as a main component and may contain Sn, Zn, etc., of amounts that do not influence physical properties of Bi as sub components.

Each of the Cu—Sn alloy layers 112U, 113U, and 114U is made of an alloy of Cu and Sn, which is a dissimilar metal differing from Cu, and contains Cu as a main component.

The Cu—Sn alloy layer 112U at the semiconductor chip 2U side is formed near and across an entire range of an interface of the bonding layer 11U with the Cu layer 93U of the rear metal 9U. The Cu—Sn alloy layer 112U thus contacts the Cu layer 93U of the rear metal 9U. The Cu—Sn alloy layer 112U has, for example, in the Z direction, a laminated structure expressed as Cu6Sn5/Cu3Sn from the Bi-based material layer 111U side toward the semiconductor chip 2U side.

Meanwhile, the Cu—Sn alloy layer 113U at the die pad 3U side is formed near and across an entire range of an interface of the bonding layer 11U with the top surface 31U of the die pad 3U. The Cu—Sn alloy layer 113U thus contacts the top surface 31U of the die pad 31U. The Cu—Sn alloy layer 113U has, for example, in the Z direction, a laminated structure expressed as Cu6Sn5/Cu3Sn from the Bi-based material layer 111U side toward the die pad 3U side.

Near the interface of the bonding layer 11U with the top surface 31U of the die pad 3U and near the interface of the bonding layer 11U with the Cu layer 93U of the rear metal 9U, the Cu—Sn alloy layers 112U and 113U may be formed across partial ranges of the respective interfaces.

The Cu—Sn alloy layer 114U is formed so as to cover the Cu stud bumps 18U.

The Bi-based material layer 111U and the Cu—Sn alloy layers 112U and 113U form, between the top surface 31U of the die pad 3U and the Cu layer 93U of the rear metal 9U, a three-layer structure (Cu—Sn alloy layer 112U/Bi-based material layer 111U/Cu—Sn alloy layer 113U) in which the Bi-based material layer 111U is sandwiched by the Cu—Sn alloy layers 112U and 113U from respective sides in Z direction.

The above-described bonding layer 11U has a melting point, for example, of 260 to 280° C. and preferably 265 to 275° C. Also, in a state where the semiconductor chip 2U and the die pad 3U are bonded, a total thickness T of the bonding layer 11U (total of a thickness of the Bi-based material layer 111U and thicknesses of the Cu—Sn alloy layers 112U and 113U) is, for example, 30 to 53 μm. In regard to the thicknesses of the respective layers, for example, the thickness of the Bi-based material layer 111U is 30 to 50 μm and the thickness of Cu—Sn alloy layers 112U and 113U is 0.5 to 3 μm.

A rear surface 32U (surface of mounting onto a wiring circuit board) of the die pad 3U is exposed from the resin package 6U. The exposed rear surface 32U has formed thereon a rear surface plating layer 12U made of a metal material, such as tin (Sn), tin-silver alloy (Sn—Ag).

The electrode leads 4U are disposed at the periphery of the die pad 3U with the same number thereof being disposed at both sides in respective directions orthogonal to respective side surfaces of the die pad 3U. The electrode leads 4U that face each side surface of the die pad 3U are disposed at equal intervals in a direction parallel to the facing side surface. A length of each electrode lead 4U in the direction of facing the die pad 3U is, for example, 440 to 460 μm (preferably, approximately 450 μm). Atop surface 41U (surface to which the bonding wire 5U is connected) of each electrode lead 4U is an uncovered surface that is not covered by a metal thin film by plating, sputtering, or other process and the Cu-based material that makes up lead frame 10U is exposed across the entire top surface 41U.

Meanwhile, a rear surface 42U (surface of mounting onto a wiring circuit board) of each electrode lead 4U is exposed from the resin package 6U. A rear surface plating layer 13U made, for example, of a metal material, such as tin (Sn), tin-silver alloy (Sn—Ag), is formed on the exposed rear surface 42U.

Each bonding wire 5U is made of copper (for example, a high-purity copper of no less than 99.9999% (6N) purity or no less than 99.99% (4N) purity that may contain a minute amount of impurity). Each bonding wire 5U includes a linearly-extending, cylindrical main body portion 51U and includes a pad bond portion 52U and a lead bond portion 53U formed at respective ends of the main body portion 51U and respectively bonded to an electrode pad 8U and an electrode lead 4U.

The main body portion 51U is curved parabolically upward from the one end at the electrode pad 8U side toward an outer side of the semiconductor chip 2U and made impingent at an acute angle at the other end on the top surface 41U of the electrode lead 4U.

The lead bond portion 53U has a wedge-like shape in sectional view that is relatively thick at the one end side close to the main body portion 51U and becomes relatively thinner toward the other end side away from the main body portion 51U.

The resin package 6U is made of a material that has an epoxy resin as a main component, contains a curing agent, a curing accelerator, a coupling agent, a mold release agent, a pH adjuster, etc., and further has an ion capturing component, with a property of capturing $Cl^-$, added in the epoxy resin. Substances having a hydroxyl group, specifically hydrotalcite and antimony-bismuth-based hydrous oxides can be cited as examples of the ion capturing component.

The epoxy resin contained is not restricted in particular as long as it is that used as an epoxy resin for resin packages, and phenol novolac type epoxy resins, ortho-cresol novolac type epoxy resins, epoxy resins having a triphenylmethane skeleton (triphenylmethane type epoxy resins), stilbene type epoxy resins, hydroquinone type epoxy resins, glycidyl ester type epoxy resins, glycidyl amine type epoxy resins, dicyclopentadiene type epoxy resins, naphthalene type epoxy resins, epoxy compounds of aralkyl type phenol resins, biphenylene type epoxy resins, trimethylol propane type epoxy resins, terpene modified epoxy resins, linear aliphatic epoxy resins, alicyclic epoxy resins, sulfur-atom-containing epoxy resin, etc., can be cited as examples. Each of these may be used solitarily or two or more types may be used in combination.

The curing agent contained is not restricted in particular as long as it is that used as a curing agent for resin packages, and novolac type phenol resins, aralkyl type phenol resins, such as phenol-aralkyl resins, naphthol-aralkyl resins, biphenyl-aralkyl resins, dicyclopentadiene type phenol resins, terpene modified phenol resins, triphenylmethane type phenol resins, etc., can be cited as examples. Each of these may be used solitarily or two or more types may be used in combination.

The curing accelerator contained is not restricted in particular as long as it is that used as a curing accelerator for resin packages, and cycloamidine compounds, such as 1,8-diazabicyclo(5,4,0)undecene-7,1,5-diazabicyclo(4,3,0)nonene, 5,6-dibutylamino-1,8-diazabicyclo(5,4,0)undecene-7, and compounds having intramolecular polarization formed by adding a compound with a π-bond, such as maleic anhydride, a quinione compound, such as 1,4-benzoquinone, 2,5-tolquinone, 1,4-naphthoquinone, 2,3-dimethylbenzoquinone, 2,6-dimethylbenzoquinone, 2,3-dimethoxy-5-methyl-1,4-benzoquinone, 2,3-dimethoxy-1,4-benzoquinone, phenyl-1,4-benzoquinone, diazophenylmethane, phenol resin, etc., to an abovementioned cycloamidine compound, tertiary amines, such as benzyldimethylamine, triethanolamine, dimethylaminoethanol, tris(dimethylaminomethyl)phenol, and derivatives thereof, imidazoles, such as 2-methylimidazole, 2-phenylimidazole, 2-phenyl-4-methylimidazole, and derivatives thereof, phosphine compounds, such as tributylphosphine, methyldiphenylphosphine, triphenylphosphine, tris(4-methylphenyl)phosphine, diphenylphosphine, phenylphosphine, and phosphorus compounds having intramolecular polarization formed by adding a compound with a π-bond, such as maleic anhydride, an abovementioned quinone compound, diazophenylmethane, phenol resin, to an abovementioned phosphine compound, tetraphenylboron salts, such as tetraphenylphosphonium tetraphenylborate, triphenylphosphine tetraphenylborate, 2-ethyl-4-methylimidazole tetraphenylborate, N-methylmorpholine tetraphenylborate, and derivatives thereof, etc., can be cited as examples. Each of these may be used solitarily or two or more types may be used in combination.

The coupling agent contained is not restricted in particular as long as it is that used as a coupling agent for resin packages, and silane compounds having at least one primary, secondary, or tertiary amine group, various silane-based compounds, such as epoxy silanes, mercapto silanes, alkyl silanes, ureido silanes, vinyl silanes, titanium based compounds, aluminum chelates, aluminum/zirconium-based compounds, etc., can be cited as examples. Each of these may be used solitarily or two or more types may be used in combination.

The mold release agent contained is not restricted in particular as long as it is that used as a mold release agent for resin packages, and higher fatty acids, such as carnauba wax, montanic acid, stearic acid, metal salts of higher fatty acids, ester-based waxes, such as montanic acid esters, polyolefin-based waxes, such as oxidized polyethylene, non-oxidized polyethylene, can be cited as examples. Each of these may be used solitarily or two or more types may be used in combination.

As examples of the pH adjuster contained, inorganic fillers, such as wollastonite (calcium silicate), talc (magnesium silicate), aluminum hydroxide, magnesium carbonate, calcium carbonate, can be cited. Each of these may be used solitarily or two or more types may be used in combination.

The resin package 6U may also contain an additive, such as a diluent, colorant, flame retardant, leveling agent, anti-foaming agent, as necessary.

A pH of the resin package 6U with the above composition exceeds 4.5, and from a need to maintain the pH of the resin package 6U at an acidic pH, the pH preferably exceeds 4.5 and is less than 7.0 and more preferably, is no less than 6.0 and less than 7. Also, the resin package 6U makes up an outer shape of the semiconductor device 1U and is formed to a substantially rectangular parallelepiped shape. In terms of size, the resin package 6U has a planar size, for example, of approximately 4 mm square and a thickness, for example, of approximately 0.85 mm.

With the semiconductor device 1U, an interval L1 between the top surface of the semiconductor chip 2U and a top surface (upper surface) of the resin package 6U is less than a minimum distance W between a side surface of the semiconductor chip 2U and a side surface of the resin package 6U. Specifically, the interval L1 is, for example, 375 to 425 μm and preferably, approximately 400 μm, and the minimum distance W is, for example, 800 to 1000 μm and preferably, approximately 900 μm.

Also, the interval L1 is no more than a distance L2 (for example, of 425 to 475 μm and preferably, approximately 450 μm) between the top surface of the semiconductor chip 2U and a rear surface of the resin package 6U (rear surface 32U of the die pad 3U).

First to third interlayer insulating films 37U to 39U are laminated successively on the Si substrate 7U. First to third barrier layers 23U to 25U and a top surface protective film 16U covering the top surface of the semiconductor chip 2U are formed on respective top surfaces of the first to third interlayer insulating films 37U to 39U.

The first to third interlayer insulating films 37U to 39U are made, for example, of silicon oxide. A first wiring 26U is formed via the first barrier layer 23U on the first interlayer insulating film 37U. Also, a second wiring 27U is formed via the second barrier layer 24U on the second interlayer insulating film 38U. Also, the third wiring 28U is formed via the third barrier layer 25U on the third interlayer insulating film 39U.

The first to third wirings 26U to 28U are made of a metal material that is softer than the material of the first to third barrier layers 23U to 25U, and are made specifically of a metal material that contains Al (aluminum), and made specifically of a metal material having Al as a main component (for example, an Al—Cu alloy, etc.).

By being covered by the top surface protective film 16U, the third wiring 28U is formed between the interlayer insulating film (third interlayer insulating film 39U) that is an uppermost layer and the top surface protective film 16U. The third wiring 28U has a quadrilateral shape (for example, a quadrilateral shape of 120 μm×120 μm) in plan view. Also, the third wiring 28U has a thickness, for example, of no less than 5000 Å and preferably 7000 to 28000 Å.

The pad openings 21U for exposing the third wiring 28U as the electrode pads 8U are formed in the top surface protective film 16U that covers the third wiring 28U.

By being covered by the third interlayer insulating film 39U, the second wiring 27U is formed between the second interlayer insulating film 38U and the third interlayer insulating film 39U. The second wiring 27U is formed in a predetermined pattern. For example, it is formed in a pattern that does not overlap with the electrode pads 8U. The second wiring 27U has a thickness, for example, of 3000 to 9000 Å.

By being covered by the second interlayer insulating film 38U, the first wiring 26U is formed between the first interlayer insulating film 37U and the second interlayer insulating film 38U. The first wiring 26U is formed in a predetermined pattern. For example, directly below each electrode pad 8U, the first wiring 26U has a plurality of rectilinear portions 29U that extend parallel to each other and connecting portions 30U that connect ends at one side of adjacent rectilinear portions 29U and alternately connect ends at the other side of adjacent rectilinear portions 29U and is thereby formed in a meandering pattern that is bent in a substantially sinusoidal form. A single electrode pad 8U (third wiring 28U) thereby faces a plurality of rectilinear portions 29U and sandwiched portions 20U of the second interlayer insulating film 38U that are sandwiched between the rectilinear portions 29U.

Mutual intervals between adjacent rectilinear portions 29U (pitch W of the rectilinear portion 29U) are, for example, all equal and are specifically 2 to 10 μm. Also, the first wiring 26U has a thickness of 3000 to 9000 Å.

The patterns of the first to third wirings 26U to 28U may be changed as suited in accordance with design rules of the semiconductor chip 2U and are not limited to the above-described patterns.

Each of the first to third barrier layers 23U to 25U is made, for example, of titanium (TiN), titanium nitride (TiN), tungsten nitride (TiW), or a laminated structure of these, etc. Each of the first to third barrier layers 23U to 25U has a thickness that is less than the thickness of each of the first to third wirings 26U to 28U and is, for example, 500 to 2000 Å.

In plan view, the pad bond portion 52U of the bonding wire 5U that is bonded to the electrode pad 8U is smaller than the electrode pad 8U. The pad bond portion 52U has a humped shape in sectional view that integrally includes a substantially cylindrical base portion 54U, which, at its one side in the thickness direction, contacts a top surface of the electrode pad 8U, and a substantially umbrella-shaped projecting portion 55U projecting from the other side of the base portion 54U and having a tip connected to the one end of the main body portion 51U.

As shall be described below, the bonding wire 5U has an FAB formed at its tip and the FAB is pressed against and thereby bonded to the electrode pad 8U. In this process, the FAB deforms to form a pad bond portion 52U with a humped shape in sectional view at the bond portion of the bonding wire 5U with the electrode pad 8U. Also, at a periphery of the pad bond portion 52U, the material of the electrode pad 8U juts out gradually from below the pad bond portion 52U so as to form a jutting portion 34U without it being lifted greatly from the top surface of the electrode pad 8U.

Also, with the bonding wire 5U, ratio $(V/(D_w)^3)$ of a volume V of the pad bond portion 52U with respect to a cube of a wire diameter $D_w$ of the main body portion 51U (diameter of the main body portion 51U) is 1.8 to 5.6.

The volume V of the pad bond portion 52U is determined, for example, by determining a volume $V_b$ of the substantially cylindrical base portion 54U and volume $V_p$ of the substantially umbrella-shaped projecting portion 55U as approximate values and adding the approximate values.

The volume $V_b$ of the base portion 54U can be determined as an approximate value based on a volume of a cylinder with a diameter $D_b$ and a height $H_b$ which the base portion 54U is conceptually deemed to be as shown in FIG. 234. Thus, the volume $V_b$ of the base portion 54U can be expressed as $V_b \approx \pi(D_b/2)^2 \cdot H_b$.

Meanwhile, the projecting portion 55U has a substantially umbrella-like shape formed by using a cone as a base and forming a top portion of the cone to a cylindrical shape having a height direction as an axis, and thus the volume $V_p$ of the projecting portion 55U can be determined as an approximate value based on a volume of a cone with a diameter $D_p$ and a height $H_p$ which the projecting portion 55U is conceptually deemed to be as shown in FIG. 244. Thus, the volume $V_p$ of the projecting portion 55U can be expressed as $V_b \approx \pi \cdot (D_p/2)^2 \cdot H_p/3$.

Also, with the semiconductor device 1U, an area of the first wiring 26U (area of slanted line portion in FIG. 245) that overlaps a bond region 33U of the bonding wire 5U and the electrode pad 8U in plan view is no more than 26.8% and preferably 0 to 25% of an area S of the bond region 33U.

The bond region 33U is a region of circular shape in plan view in which the base portion 54U of the pad bond portion 52U contacts the top surface of the electrode pad 8U, and its area S can be determined by a formula: $S=\pi(D_b/2)^2$ using a diameter $D_b$ of the base portion 54U.

FIG. 246A to FIG. 246H are schematic sectional views for describing a method for manufacturing the semiconductor device shown in FIG. 241 in order of process.

To manufacture the semiconductor device 1U, the rear metal 9U is formed by successively laminating the Au layer 91U, the Ni layer 92U, and the Cu layer 93U on the rear surface 72U of the Si substrate 7U of the semiconductor chip 2U by a plating method, sputter method, etc., for example, as shown in FIG. 246A.

Meanwhile, as shown in FIG. 246A, the lead frame 10U that includes a plurality of units each integrally having a die pad 3U and electrode leads 4U is prepared. In FIG. 246A to FIG. 246H, an entire view of the lead frame 10U is abbreviated and the die pad 3U and electrode leads 4U of just a single unit necessary for mounting a single semiconductor chip 2U are shown.

Next, as shown in FIG. 246B, the plurality of Cu stud bumps 18U are formed on the top surface 31U of the die pad 3U by a known wire bonding method. In succession, the bonding paste 14U made of the Bi-based material that contains Sn is coated onto the top surface 31U of the die pad 3U.

An Sn content of the bonding paste 14U is, for example, preferably an amount such that the entire amount diffuses among the Cu in the Cu layer 93U of the rear metal 9U and the top surface 31U of the die pad 3U and is, for example, no more than 4 wt %, preferably, 1 to 3 wt %, and more preferably, 1.5 to 2.5 wt %.

After coating of the bonding paste 14U, the bonding paste 14U is sandwiched by the semiconductor chip 2U and the die pad 3U so that the Cu layer 93U of the rear metal 9U contacts the tip portions 182U of the Cu stud bumps 18U and bonding paste 14U as shown in FIG. 246C. In succession, reflow (heat treatment) is executed, for example, at 250 to 260° C.

The Sn in the bonding paste 14U is thereby made to react respectively with the Cu in the Cu layer 93U of the rear metal 9U, the Cu in the top surface 31U of the die pad 3U, and the Cu in the Cu stud bumps 18U to form the Cu—Sn alloy layers 112U and 113U near the Cu layer 93U and the top surface 31U as shown in FIG. 246D. Also, the Cu stud bumps 18U are covered by the Cu—Sn alloy layer 114U. Meanwhile, the Bi in the bonding paste 14U hardly reacts with Cu and thus remains as the Bi-based material layer 111U sandwiched between the Cu—Sn alloy layers 112U and 113U.

Next, as shown in FIG. 246E, bonding of each bonding wire 5U is performed by a wire bonder (not shown) that includes a capillary C.

As shown in FIG. 246E, the capillary C has a substantially cylindrical shape with a wire insertion hole 61U formed along a central axis. The bonding wire 5U is inserted through the wire insertion hole 61U and fed out from a tip (lower end) of the wire insertion hole 61U. Also, the capillary C is made of a material with a thermal conductivity of 15 to 45 W/m·K and preferably, 17 to 43 W/m·K. Specifically, the capillary C is made of polycrystalline ruby (with a thermal conductivity, for example, of approximately 17 to 19 W/m·K) or monocrystalline ruby (with a thermal conductivity, for example, of approximately 41 to 43 W/m·K).

A chamfer 62U of truncated conical shape that is in communication with the wire insertion hole 61U is formed below the wire insertion hole 61U at a tip portion of the capillary C. Also, the tip portion of the capillary C has a face 63U that is continuous with a lower end edge of the chamfer 62U and is a surface that faces an electrode pad 8U and an electrode lead 4U during bonding (during wire bonding) of the bonding wire 5U to the electrode pad 8U and the electrode lead 4U. An outer side of the face 63U is gradually inclined upwardly with respect to a plane orthogonal to the central axis of the capillary C.

First, as shown in FIG. 246E, the capillary C is moved to a position directly above the electrode pad 8U. Next, in a state where a tip of the bonding wire 5U is positioned at the chamfer 62U, a current is applied to the tip portion of the bonding wire 5U and an FAB 64 is thereby formed at the tip portion. The value and application time of the current are set suitably in accordance with the wire diameter of the bonding wire 5U and an intended diameter of the FAB 64 (designed diameter of the FAB 64).

For example, the value I of the current is set to a larger value the larger the wire diameter $D_w$ of the main body portion 51U of the bonding wire, and for example, I=40 mA when $D_w$=25 μm, I=60 mA when $D_w$=30 μm, and I=120 mA when $D_w$=38 μm. A current application time is set to an appropriate length according to a diameter $D_f$ of the FAB 64.

A volume $V_f$ of the FAB 64 thus formed may be expressed using the diameter $D_f$ of the FAB 64 as $V_f=4/3\cdot\pi\cdot(D_f/2)^3$. Also, a portion of the FAB 64 protrudes below the chamfer 62U.

Thereafter, as shown in FIG. 246F, the capillary C is lowered toward the electrode pad 8U and the FAB 64 is pressed against the electrode pad 8U by the capillary C. In this process, a load is applied to the FAB 64 by the capillary C and ultrasonic vibration, emitted from an ultrasonic transducer (not shown) provided in the capillary C, is applied to the FAB 64.

FIG. 247 is a graph of a changes with time of the load applied to the FAB and a driving current applied to the ultrasonic transducer during the bonding of the FAB to the pad.

For example, as shown in FIG. 247, a relatively large initial load P1 is applied from the capillary C to the FAB 64 from a time T1 at which the FAB 64 contacts the electrode pad 8U to a time T2 after elapse of a predetermined time period (for example, 3 msec). From the time T2 onward, the load applied to the FAB 64 from the capillary C is lowered and a relatively small load P2 (for example, 30 g) is applied to the FAB 64. The load P2 is applied continuously until a time T4 at which the capillary C is raised.

The initial load P1 is set based on a value obtained by multiplying an intended bonding area of the pad bond portion 52U with respect to the electrode pad 8U (designed bonding area ($S=\pi(D_b/2)^2$) of the pad bond portion 52U with respect to the pad 8U) by a fixed factor (for example, 28786 in a case where the unit of the initial load P1 is g and the unit of the bonding area is $mm^2$). In the present preferred embodiment, the intended bonding area S of the pad bond portion 52U with respect to the pad 8U is set at 0.00430 $mm^2$ and the initial load P1 is set to 130 g.

In a case where a standard type capillary is used as the capillary C, a drive current of a relatively small value U1 is applied to the ultrasonic transducer from before the time T1 at which the FAB 64 contacts the electrode pad 8U. The drive current value U1 is, for example, 15 mA. Then, from the time T1 at which the FAB 64 contacts the electrode pad 8U to a time T3, the value of the drive current applied to the ultrasonic transducer is raised at a fixed rate of change (monotonously) from a value U1 to a value U2. The rate of change is set to no more than 21 mA/msec. Also, the value U2 of the drive current that is applied to the ultrasonic transducer in a final stage is set so that a value obtained by dividing the value U2 by the intended bonding area of the pad bond portion 52U is no more than 0.0197 mA/$\mu m^2$. In the present preferred embodiment, the drive current value U2 is, for example, 90 mA. Further, the drive current values U1 and U2 are set so that an integrated value of the drive current applied to the ultrasonic transducer during the predetermined time period in which the initial load is applied to the FAB 44 is no more than 146 mA·msec. From the time T3 onward until the time T4, the drive current of the value U2 continues to be applied to the ultrasonic transducer.

The standard type capillary has a shape such as shown in FIG. 248 and has the following dimensions. A CD dimension, which is a diameter of a lower end edge of the chamfer 62U, is 66 μm (0.066 mm). The T dimension, which is the outer diameter of the face 63U, is 178 μm (0.178 mm). A chamfer angle, which two straight lines extending along the side surface of the chamfer 62U form in a cross section of the capillary C taken along a plane that includes the central axis (cross section shown in FIG. 248), is 90°. A face angle FA, which is an angle that the face 63U forms with the plane orthogonal to the central axis of the capillary C, is 8°. An angle CA, which, in the cross section of the capillary C taken along the plane that includes the central axis, a portion of the side surface of the capillary C that extends upward beyond the upper end of the face 63U forms with the central axis, is 20°.

On the other hand, when a bottleneck type capillary is used as the capillary C, a drive current of a value 1.4 times the value U1 is applied to the ultrasonic transducer from before the time T1 at which the FAB 64 contacts the electrode pad 8U as shown in FIG. 247. Then, from the time T1 at which the FAB 64 contacts the electrode pad 8U to a time T3, the value of the drive current applied to the ultrasonic transducer is raised at a fixed rate of change (monotonously) from the value U1 to a value 1.4 times the value U2. From the time T3 onward until the time T4, the drive current of the value 1.4 times the value U2 continues to be applied to the ultrasonic transducer.

The bottleneck type capillary has a shape such as shown in FIG. 249 and has the following dimensions. The CD dimension, which is the diameter of the lower end edge of the chamfer 62U, is 66 μm (0.066 mm). The T dimension, which is the outer diameter of the face 63U, is 178 μm (0.178 mm). The chamfer angle, which two straight lines extending along the side surface of the chamfer 62U form in the cross section of the capillary C taken along a plane that includes the central axis (cross section shown in FIG. 249), is 90°. The face angle FA, which is the angle that the face 63U forms with the plane orthogonal to the central axis of the capillary C, is 8°. The angle CA, which, in the cross section of the capillary C taken along the plane that includes the central axis, the portion of the side surface of the capillary C that extends upward beyond the upper end of the face 63U forms with the central axis, is 10°.

Consequently, the FAB 64 deforms along the shapes of the chamfer 62U and the face 63U of the capillary C, and the pad bond portion 52U with a stepped disk shape is formed on the electrode pad 8U with the jutting portion 34U being formed along its periphery as shown in FIG. 246F. Bonding (first bonding) of the bonding wire 5U with the electrode pad 8U is thereby achieved.

When the time T4 arrives upon elapse of a bonding time determined in advance from the time T1, the capillary C is separated upwardly from the electrode pad 8U. Thereafter, the capillary C is moved obliquely downward toward the top surface of the electrode lead 4U. Then, as shown in FIG. 246G, the drive current is applied to the ultrasonic transducer, and while ultrasonic vibration is being applied to the capillary C, the bonding wire 5U is pressed against the top surface of the electrode lead 4U by the capillary C and then broken. A stitch portion (lead bond portion 53U) with a wedge shape in side view that is made up of the other end portion of the bonding wire 5U is thereby formed on the top surface of the electrode lead 4U and the bonding (second bonding) of the bonding wire with respect to the electrode lead 4U is thereby achieved.

Thereafter, the processes shown in FIG. 246E to FIG. 246G are performed on another electrode pad 8U and the corresponding electrode lead 4U. By the processes shown in FIG. 246E to FIG. 246G then being repeated, bonding wires 5U are installed across all electrode pads 8U of the semiconductor chip 2U and the electrode leads 4U as shown in FIG. 246H.

After the end of all of the wire bonding, the lead frame 10U is set in a forming mold and all semiconductor chips 2U are sealed in a batch together with the lead frame 10U by the resin package 6U. Rear surface plating layers 12U and 13U are then formed on the rear surfaces 32U of the die pads 3U and the rear surfaces 42U of the electrode leads 4U that are exposed from the resin package 6U. Lastly, a dicing saw is used to cut the lead frame 10U together with the resin package 6U to sizes of the respective semiconductor devices 1U and the individual semiconductor devices 1U one of which is shown in FIG. 241 are thereby obtained.

The twentieth preferred embodiment corresponds to the third, fifth, seventh, eleventh, twelfth, seventeenth, and eighteenth preferred embodiments, and the entire disclosures of these preferred embodiments are incorporated herein by reference. That is, by the twentieth preferred embodiment, the same actions and effects as the third, fifth, seventh, eleventh, twelfth, seventeenth, and eighteenth preferred embodiments can be achieved. Also, the modification examples of the third to fifth, seventh, eleventh, twelfth, seventeenth, and eighteenth preferred embodiments may be applied to the present preferred embodiment as well.

Although preferred embodiments of the present invention have been described in detail above, these are merely specific examples used for clarifying the technical details of the present invention and the present invention should not be interpreted as being limited to these specific examples and the spirit and scope of the present invention are to be limited only by the appended claims.

Also, with the semiconductor device according to the present invention, the entire top surfaces of the electrode leads and the entire lead bond portions are preferably covered integrally by the water impermeable film.

With the present arrangement, the water-impermeable film integrally covers the entire top surfaces of the electrode leads and the entire lead bond portions. The peripheral edges of the bond interfaces (lead bond interfaces) of the electrode leads and lead bond portions are thereby covered by the water-impermeable film without exposure.

Thus, even if water penetrates into the interior of the resin package, the water can be blocked by the water-impermeable insulating film and contact of the lead bond interfaces with water can be suppressed. The reliability of lead-wire connections can thus be maintained.

Also, with the semiconductor device, the water-impermeable film may be an insulating film and the insulating film may integrally covers the entire top surface of the semiconductor chip and the entire bonding wires.

With the present arrangement, the water-impermeable film is an insulating film and the insulating film integrally covers the entire top surface of the semiconductor chip and the entire bonding wires. Thus, even if a metal portion besides the electrode pads is exposed at the top surface of the semiconductor chip, the metal portion is covered by the insulating film that covers the entire chip top surface. Contact of the metal portion with the water penetrating into the interior of the resin package can thus be suppressed. Consequently, corrosion of the metal portion can be suppressed. Also, mutual electrical insulation can be secured among such metal members as the metal portion, the electrode pads, the bonding wires.

As the insulating film, for example, a silicon oxide film or a silicon nitride film, etc., may be applied.

Also, with the semiconductor device, the water-impermeable film may be a metal film and the entire electrode pads and the entire bonding wires may be covered by the metal film.

With the present arrangement, the water-impermeable film is a metal film, and the metal film integrally covers the entire electrode pads and the entire bonding wires. An alloy may thus form at an interface between the electrode pad and/or bonding wire and the metal film to improve the covering property of the metal film.

As the metal film, for example, a nickel film or a palladium film, etc., may be applied.

Also, with the semiconductor device, an interval between the top surface of the semiconductor chip and the top surface of the resin package may be smaller than a minimum distance between a side surface of the semiconductor chip and a side surface of the resin package. Also, the interval between the top surface of the semiconductor chip and the top surface of the resin package may be smaller than a distance between the top surface of the semiconductor chip and the rear surface of the resin package.

With a thin package semiconductor device with which the interval between the top surface of the semiconductor chip and the top surface of the resin package is comparatively small as in the present arrangement, there is a possibility for the pad bond portions to be exposed to water entering into the interior of the package from the top surface of the resin package. However, the entirety of each pad bond portion is covered by the water-impermeable film and the connection reliability of the semiconductor device can thus be improved effectively even with such a thin package type semiconductor device.

Also, with the semiconductor device, the water-impermeable film may be 0.5 μm to 3 μm thick.

Also, with the semiconductor device, each pad bond portion preferably has a humped shape in sectional view that is greater in diameter than the main body portion and includes abase portion contacting the electrode pad, an intermediate portion formed on the base portion, and a projecting portion projecting from the intermediate portion and being continuous with the base portion via the intermediate portion, and the intermediate portion has a side surface having a non-rectilinear cross-sectional shape in a section taken perpendicular to the electrode pad.

With the present arrangement, stress applied to the intermediate portion along the direction of application of ultrasonic waves during bonding of a bonding wire can be dispersed across the side surface of non-rectilinear form and prevented from concentrating at specific locations of the intermediate portion. Stress applied to the electrode pad can thereby be relaxed. Consequently, occurrence of damage at a portion below the electrode pad can be suppressed.

Also, with the semiconductor device, the side surface of non-rectilinear form may be a curved surface that curves toward an interior of the pad bond portion. The cross-sectional shape of the side surface of non-rectilinear form may be a curved waveform. Also, the cross-sectional shape of the side surface of non-rectilinear form may be a rectilinear waveform.

Also, with the semiconductor device, the side surface of non-rectilinear form is preferably formed across the entire circumference of the pad bond portion.

With the present arrangement, the stress applied to the intermediate portion can be dispersed efficiently across the entire side surface of the intermediate portion because the side surface of non-rectilinear form is formed across the entire circumference. The stress applied to the electrode pad can thus be relaxed further.

Also, with the semiconductor device, the ratio of the volume of the pad bond portion with respect to the cube of the wire diameter of the main body portion is preferably 1.8 to 5.6.

By the present arrangement, the pad bond portion has a volume of 1.8 to 5.6 times the cube of the wire diameter of the main body portion of the bonding wire. That is, the ratio of the volume of the bond portion with respect to the cube of the wire diameter of the main body portion of the bonding wire (volume/(wire diameter)$^3$) is 1.8 to 5.6. The bonding wire can thus be improved in thermal conductivity and electrical conductivity because a comparatively thick bonding wire can be used regardless of the magnitude of the pitch of the electrode pads. Also, the cost can be reduced in comparison to a case where gold wires are used because copper wires are used.

Also, with the semiconductor device, the semiconductor chip may include a semiconductor substrate, a wiring formed on the semiconductor substrate, an insulating layer covering the wiring, and a barrier layer formed on the insulating layer. In this case, the electrode pads are formed at positions on the barrier layer that face portions of the wiring, and in plan view, the area of the wiring that overlaps the bond region of the bonding wire and the electrode pad is preferably no more than 26.8% of the area of the bond region.

The area by which the barrier layer directly below the electrode pad faces the wiring is comparatively small because the area of the wiring (overlap area of the wiring) that overlaps the bond region of the bonding wire and the electrode pad is no more than 26.8% of the area of the bond region in plan view. Thus, for example, even if the barrier layer is pressed toward the wiring side during bonding of the bonding wire and the electrode pad, deformations of the wiring and the interlayer insulating film due to the pressing are unlikely to occur, and concentration of stress at the barrier layer due to such deformations can be prevented. Consequently, occurrence of crack in the barrier layer can be prevented and the semiconductor device can thus be improved in reliability.

Also, the insulating layer may include a first interlayer insulating film and a second interlayer insulating film laminated on the first interlayer insulating film, and in this case, the wiring may be covered by the first interlayer insulating film and another wiring does not have to be present between the first interlayer insulating film and the second interlayer insulating film.

The semiconductor device may further include a lower interlayer insulating film laminated on the semiconductor substrate and an upper interlayer insulating film laminated on the lower interlayer insulating film, and in this case, the wiring may be formed between the upper interlayer insulating film and the insulating layer and another wiring does not have to be present between the upper interlayer insulating film and the lower interlayer insulating film.

Also, a plurality of wirings may be provided in a mutually spaced manner and in this case, each electrode pad preferably faces at least one of the wirings and a portion of the insulating layer sandwiched between wirings.

With the arrangement in which the plurality of wirings are provided in a mutually spaced manner, an area of overlap of the plurality of wirings is a total of the areas of overlap of the respective wirings, and the total is no more than 26.8% of the area of the bond region. Thus, for all of the wirings, the overlap area of each wiring is thus less than 26.8% of the area of the bond region.

Each electrode pad faces at least one of the wirings and a portion of the insulating layer sandwiched between wirings. The plurality of wirings, the overlap area of each of which is less than 26.8% of the area of the bond region, thus face the bond region of the electrode pad in a dispersed manner. Thus, when the barrier layer is pressed toward the wiring side, a deformation amount of the wiring and the insulating layer due to the pressing can be suppressed to a small amount. Stress concentration at a specific location in the barrier layer can consequently be suppressed. Occurrence of crack in the barrier layer can thus be prevented further.

Also, with the semiconductor device, Zn is preferably contained in the pad bond portion of the bonding wire.

With the present arrangement, Zn is contained in the pad bond portion. In other words, the pad bond portion of a copper wire is made of an alloy of Cu and Zn (brass). The pad bond portion thus does not oxidize readily. Peeling of the pad bond portion from the pad due to oxidation can thus be prevented. As long as the electrode pad has a Zn layer made of Zn at least at a top layer portion, the electrode pad may be a laminate of an Al layer, made of Al, and the Zn layer.

However, in a case where the electrode pad is made of an Al layer and a Zn layer and these are in direct contact, the Al and Zn undergo eutectic bonding. Whereas the melting point of Al is 660° C. and the melting point of Zn is 419° C., the melting point of a Zn—Al alloy in which Al and Zn are eutectically bonded is low and, for example, the melting point of a 78Zn-22Al alloy is 275° C. Thus, when an electrode pad has a Zn—Al alloy, the pad may melt during a heat treatment.

Thus, preferably between the Al layer and the Zn layer, a barrier film, having a structure where a Ti layer made of Ti and a TiN layer made of TiN are laminated in that order from the Al layer side, is interposed.

By interposition of the barrier film, eutectic bonding of the Al contained in the Al layer and the Zn contained in the Zn layer can be prevented.

Also, with the semiconductor device, Zn may be contained in the entirety of the copper wire. That is, the copper wire may be a wire made of pure copper or may be a wire made of brass. If the copper wire is a wire made of brass, the pad bond portion will be made of brass and peeling of the pad bond portion from the pad due to oxidation of the pad connection portion can be prevented even when the electrode pad does not have a Zn layer.

Also, preferably, the semiconductor device further includes a die pad to which the semiconductor chip is bonded and a lead disposed at a periphery of the die pad, has the bonding wire provided across the semiconductor chip and the lead, and further includes a nonelectrical connection member that is made of a metal material and does not contribute to electrical connection of the semiconductor chip with the die pad and the lead.

With the present arrangement, the bonding wire is installed between the semiconductor chip bonded to the die pad and the lead disposed at the periphery of the die pad. The semiconductor chip and the lead are electrically connected by the bonding wire. Also, the semiconductor device is provided with the nonelectrical connection member that does not contribute to electrical connection of the semiconductor chip with the die pad and the lead. The nonelectrical connection member is made of the metal material. During operation of the semiconductor device, heat generated from the semiconductor chip is transmitted to the die pad, the lead, and the nonelectrical connection member. The transmitted heat propagates through the resin package and is released (radiated) from the top surface of the resin package. Thus, in comparison to an arrangement that is not provided with the nonelectrical connection member, the efficiency of heat transmission to the resin package can be improved and the heat radiation property of the semiconductor device can be improved by the nonelectrical connection member being provided.

Also, the nonelectrical connection member does not contribute to electrical connection of the semiconductor chip with the die pad and the lead. There is thus no need to take into consideration contact of nonelectrical connection members with each other and restrictions are not placed in the positioning of the nonelectrical connection members, and thus the nonelectrical connection members can be positioned as densely as is physically possible. Consequently, the heat radiation property of the semiconductor device can be improved further.

Also, the nonelectrical connection member may be a looped metal wire having both end portions bonded to one of either the die pad or the lead.

In the case where the nonelectrical connection member is a looped metal wire, the nonelectrical connection member can be formed using a wire bonder. Addition of a device for forming the nonelectrical connection member can thus be avoided. Also, nonelectrical connection members can be positioned without taking into consideration contact of metal wires with each other and thus the nonelectrical connection members can be formed at as small an interval as can be formed using the wire bonder.

Also, the nonelectrical connection member may be a stud bump disposed on one of either the die pad or the lead.

In the case where the nonelectrical connection member is a stud bump, the nonelectrical connection member can be formed using a wire bonder. Addition of a device for forming the nonelectrical connection member can thus be avoided. Also, nonelectrical connection members can be positioned without taking into consideration contact of stud bumps with each other and thus the nonelectrical connection members can be formed at as small an interval as can be formed using the wire bonder. Further, the nonelectrical connection member may be a combination of a looped metal wire and a stud bump. In this case, the stud bump can be disposed at a gap of the loop portion of the metal wire and the positioning density of the nonelectrical connection member can thus be made even higher to achieve further improvement in the radiation property of the semiconductor device.

Also, the plurality of stud bumps may be layered overlappingly.

The height of the stud bumps can thereby be changed in accordance with a dead space inside the semiconductor device and the nonelectrical connection members can thus be made even greater in surface area. Consequently, further improvement in the radiation property of the semiconductor device can be achieved.

Also, the nonelectrical connection member is preferably made of copper. Copper is inexpensive and the nonelectrical connection member can thus be reduced in material cost. Also, copper is high in thermal conductivity and the heat radiation amount of the semiconductor device can be improved.

Also, in the case where the nonelectrical connection member is made of copper, a silver plating may be applied to the nonelectrical connection member bonding portion of the die pad and/or the lead.

Also, the semiconductor device preferably further includes an island disposed so as to face the rear surface of the semiconductor chip, a bonding material with an insulating property that is interposed between the island and the rear surface of the semiconductor chip, a lead disposed separately from the island at a side of the island, a top surface wire installed as the bonding wire between the electrode pad and the lead and electrically connecting the electrode pad and the lead, and a rear surface wire installed between the rear surface of the semiconductor chip and the island and electrically connecting the rear surface of the semiconductor chip and the island.

With the present arrangement, the semiconductor chip has its rear surface bonded to the island by the bonding material with the insulating property. At the side of the island, the lead is disposed separatedly from the island. The top surface wire is installed between the pad, formed on the top surface of the semiconductor chip, and the lead. The pad and the lead are thereby connected electrically.

Also, the rear surface wire that electrically connects the semiconductor chip and the island is installed between the rear surface of the semiconductor chip and the island. The rear surface of the semiconductor chip and the island can thereby be connected electrically via the rear surface wire even if the bonding material has an insulating property. That is, even when a bonding material other than solder is used, electrical connection of the rear surface of the semiconductor chip and the island can be achieved regardless of the electrical characteristics of the bonding material.

The rear surface wire is preferably made of copper. Copper is inexpensive in comparison to gold, which is widely used as wire material, and the rear surface wire can thus be reduced in material cost. Also, copper is high in electrical conductivity and can thus reduce the electrical resistance between the semiconductor chip and the island. Also, the rear surface wire that is made of copper is good in heat radiation property and it is thus effective to provide a plurality of rear surface wires made of copper from the standpoint of heat radiation property. In this case, the top surface wire (bonding wire) and the rear surface wires are made of the same material and the top surface wire and the rear surface wires can thus be formed by a wire bonder without changing a material set in the wire bonder. A manufacturing process of the semiconductor device can thus be simplified.

Also, a through-hole may be formed to pass through the island in its thickness direction, and the rear surface wire may be installed between the rear surface of the semiconductor chip and the island through the through-hole. The rear surface of the semiconductor chip is thereby exposed from the through-hole and electrical connection of the rear surface of the semiconductor chip and the island can be achieved by the rear surface wire being connected to the exposed portion. In this case, an area of a portion of the island that faces the rear surface of the semiconductor chip is necessarily made smaller than an area of the rear surface of the semiconductor chip, the bonding material with the insulating property suffices to be interposed just at facing portions of the semiconductor chip and the island, and thus the bonding material can be reduced in usage amount. Consequently, the semiconductor device can be reduced in material cost.

Also, the rear surface wire is preferably provided in plurality. Reliability of the electrical connection of the semiconductor chip and the island can thereby be improved. Also, the area of the portion of the island facing the rear surface of the semiconductor chip may be smaller than the area of the rear surface of the semiconductor chip.

Also, the semiconductor device may further include a lead frame to which the semiconductor chip is bonded, a bonding material made of a Bi-based material and interposed between the lead frame and the semiconductor chip, and a spacer made of Cu and provided on a surface of the lead frame that faces the semiconductor chip.

With the present arrangement, making of the bonding material lead free can be achieved because the bonding material bonding the lead frame and the semiconductor chip is made of the Bi-based material.

Also, a distance between the lead frame and the semiconductor chip can be maintained at least at a height of the spacer because the spacer is provided between the lead frame and the semiconductor chip. Thus, by suitable adjustment of the height of the spacer, a bonding material having a sufficient thickness can be interposed between the lead frame and the semiconductor chip. Consequently, even when stress due to warping of the lead frame occurs in the bonding material, the stress can be relaxed adequately. A warping amount of the semiconductor chip can thus be reduced. Occurrence of crack in the semiconductor chip can thus be prevented. Also, there is no need to make the thicknesses of the semiconductor chip and the lead frame large and thus a package main body of the semiconductor device does not become large.

Further, a thermal conductive property between the lead frame and the semiconductor chip can be improved because the spacer is made of Cu and the thermal conductivity (approximately 398 W/m·K) of Cu is extremely large in comparison to the thermal conductivity (approximately 9 W/m·K) of Bi. Heat generated at the semiconductor chip can thus be released to the lead frame via the Cu spacer. An adequate heat radiation property can thus be secured for the semiconductor chip.

Also, in a case where the spacer is made of a metal element, such as Au, Ag, Ni, the Bi in the bonding material may react with the spacer to form a compound with the metal element or form a eutectic composition. An intermetallic compound of Bi and an abovementioned metal element is hard and brittle and may thus become a starting point of breakage during a temperature cycle test (TCY test) of the semiconductor device. Also, a melting point of a eutectic composition of Bi and an abovementioned metal element is lower than the melting point of Bi alone. For example, whereas the melting point of Bi alone is approximately 271° C., the melting point of a eutectic composition of Bi and Au is approximately 241° C., and the melting point of a eutectic composition of Bi and Ag is approximately 262° C. The bonding material may thus remelt during reflow (peak temperature: approximately 260° C.) for mounting the semiconductor device.

In contrast, Cu hardly reacts with Bi, and with the semiconductor device with which the spacer is made of Cu, lowering of the melting point of the bonding material and degradation of temperature cycle resistance can be suppressed.

The lead frame may be made of Cu.

As the material of the lead frame, for example, an Fe-based material, such as 42 alloy (Fe-42% Ni), is known besides Cu. The thermal expansion coefficient of 42 alloy is approximately 4.4 to $7.0\times10^{-6}$/° C. With a lead frame made from 42 alloy, the thermal expansion amount is less than a lead frame made of Cu (with a thermal expansion coefficient of approximately $16.7\times10^{-6}$/° C.) and the warp amount of the lead frame can thereby be made small. However, in a case where 42 alloy is used, the cost is higher and the heat radiation property decreases in comparison to a case where Cu is used.

In contrast, with the semiconductor device described above, the stress due to warping of the lead frame can be relaxed adequately by the bonding material even in the case where the lead frame is made of Cu. Cu can thus be used without any problem as the material of the lead frame to maintain the cost and the heat radiation property.

The Cu used as the material of the lead frame is a Cu-based material that mainly contains Cu and includes high-purity coppers of no less than 99.9999% (6N) purity or no less than 99.99% (4N) purity, alloys of Cu and a dissimilar metal (for example, a Cu—Fe—P alloy, etc.), etc.

Also, with the semiconductor device, the semiconductor chip may be made of an Si substrate. In this case, the Si substrate is supported by the spacer.

With the present arrangement, the Si substrate is supported by the spacer and thus the Si substrate and the lead frame are connected in a manner enabling heat exchange via the spacer. Thus, when the lead frame undergoes thermal expansion, the heat of the lead frame is transmitted to the Si substrate. Thus, during reflow for mounting the semiconductor device, the Si substrate can be thermally expanded by the heat transmitted from the lead frame. Consequently, the difference between the thermal expansion amount of the lead frame and the thermal expansion amount of the Si substrate can be made small and the Si substrate can thus be reduced in warp amount.

Also, with the semiconductor device, a Cu layer is preferably formed at a surface of the semiconductor chip that faces the lead frame.

With the present arrangement, the bonding material is bonded to the Cu layer in the semiconductor device. As mentioned above, Cu and Bi hardly react with each other and thus lowering of the melting point of the bonding material and degradation of temperature cycle resistance can be suppressed. Also, in a case where the semiconductor chip and the spacer are in contact, the contact is contact of the same metal species of the Cu layer and the Cu spacer, and influences (for example, increased resistance of the Cu spacer, erosion of the Cu spacer, etc.) due to contact of the semiconductor chip and the spacer can be reduced.

Also, the bonding material preferably contains Sn or Zn.

With the present arrangement, the bonding material contains Sn or Zn and the bonding material can thus be improved in wetting property with respect to the lead frame and the semiconductor chip.

For example, in the case where the Cu layer is formed at the surface of the semiconductor chip that faces the lead frame, a portion made of a Cu—Sn alloy or a Cu—Zn alloy can be formed near the interface of the bonding material with the Cu layer. The bonding strength of the semiconductor chip and the bonding material can thus be improved by the alloy portion.

Also, the thermal conductivity of Sn is approximately 73 W/m·K, the thermal conductivity of Zn is approximately 120 W/m·K, and these are higher than the thermal conductivity (approximately 9 W/m·K) of Bi. The thermal conductivity of the bonding material can thus be improved in comparison to a case where the bonding material is made of only Bi. Consequently, the heat radiation property of the semiconductor chip can be improved further.

Also, the spacer may be formed by a wire bonding method.

With the present arrangement, the wire bonding method, which is a method that is conventionally-proven from before, is used to form the spacer on the lead frame. The spacer can thus be formed easily. The spacer formed by the wire bonding method is, for example, a stud bump, wire ring, etc.

Also, preferably, no less than three spacers are installed.

With the present arrangement, the semiconductor chip can be supported at least at three points because no less than three spacers are provided. The semiconductor chip can thus be stabilized on the spacers so as not to tilt with respect to the top surface of the lead frame. The distance between the lead frame and the semiconductor chip can thus be made substantially uniform in magnitude. Consequently, the bonding material is made uniform in linear expansion coefficient in the directions of facing the lead frame and semiconductor chip (vertical direction) so that biasing of stress in the bonding material can be suppressed and stress can be relaxed as a whole. Also, the heat generated at the semiconductor chip can be released using the no less than three spacers and the heat radiation property of the semiconductor chip can thus be improved further. Also, preferably with the semiconductor device, the pH of the resin package exceeds 4.5.

Upon diligent examination of the cause of an electrically open state between a pad and a wire, the present inventors found that the pH of the resin package is the cause. Specifically, when water enters into the interior of the package, copper is oxidized by the water and a film made of cuprous oxide ($CuO_2$) and cupric oxide (CuO) covers the wire top surface. With such a top surface film, oxidation of copper is accelerated and the volume proportion of cupric oxide increases when the resin package is under a low pH environment of comparative low pH (for example, pH=4.2 to 4.5). When the volume proportion of cupric oxide increases, the copper wire and the resin package may peel apart. A gap formed by the peeling apart of the copper wire and the resin package becomes a movement path for water and causes water to enter readily into the bond interface of the electrode pad and the copper wire. Corrosion of the aluminum pad (electrode pad) due to water entering into the bond interface thus progresses during an HAST, etc., and an electrically open state occurs.

In contrast, with the present arrangement, the pH of the resin package exceeds 4.5 and the bonding wire is placed under an environment of higher pH than a low pH environment (for example, an environment of pH of no more than 4.5).

The forming of cupric oxide can thus be suppressed and volume increase of cupric oxide can be suppressed. The occurrence of peeling between the copper wire and the resin package can thus be suppressed.

Thus, even when the semiconductor device is placed in a situation where water enters readily into the interior of the package, as in a PCT (pressure cooker test) or HAST (highly accelerated temperature and humidity stress test), etc., there is no movement path for water between the copper wire and the resin package and thus entry of water into the bond interface of the electrode pad and the copper wire can be suppressed. Contact of water with the bond interface can thus be suppressed. Consequently, progress of corrosion of the electrode pad (aluminum pad) can be suppressed and thus an electrically open state across the pad-wire interval can be suppressed. The connection reliability of the semiconductor device can thus be improved.

Also, the pH of the resin package preferably exceeds 4.5 and is less than 7.0 and more preferably, is no less than 6.0 and less than 7.0. When the pH of the resin package is in such a range, occurrence of peeling between the copper wire and the resin package can be suppressed further.

Also, the semiconductor device may include a lead frame having a die pad on which the semiconductor chip is mounted and a plurality of electrode leads disposed at a periphery of the die pad. In this case, the lead frame is preferably made of a Cu-based material that mainly contains Cu.

With the present arrangement, the bond of an electrode lead and a bonding wire is a mutual bond of the same metal species (Cu—Cu bond) and thus the formation of cupric oxide (CuO) at the interface of the electrode lead and the bonding wire can be suppressed. Volume increase of cupric oxide can thus be suppressed. Consequently, occurrence of peeling at the bond interface of the bonding wire and the resin package can be suppressed.

Also, preferably with the semiconductor device, the material of the resin package contains an ion capturing component having a property of capturing chlorine ions.

With the present arrangement, reaction of an AlCu alloy ($Cu_9Al_4$) and $Cl^-$ at the bond portion of the electrode pad and the bonding wire can be suppressed and formation of $Al_2O_3$ (alumina), which is the reaction product, can be prevented. Consequently, the electrode pad and the bonding wire can be prevented from being insulatingly separated by $Al_2O_3$. Occurrence of a continuity fault between the electrode pad and the bonding wire can thus be prevented.

The ion capturing component preferably has a hydroxyl group. In this case, the ion capturing component can capture $Cl^-$ satisfactorily by an anion exchange reaction of the hydroxyl group and $Cl^-$.

Examples of other features to be ascertained from the disclosure of the present application in addition to the features described in the claims include the following.

Features to be Ascertained from the Disclosure of the Second Preferred Embodiment For example, the following inventions of (1) to (7) can be ascertained from the disclosure of the second preferred embodiment.

The invention of (1) provides a semiconductor device including a semiconductor chip, an electrode pad formed on the semiconductor chip, and a bonding wire having a linearly-extending main body portion and a bond portion that is formed on one end of the main body portion, is bonded to the electrode pad, and has a larger diameter than the main body portion, and with which the bond portion has a humped shape in sectional view that includes a base portion contacting the electrode pad, an intermediate portion formed on the base portion, and a projecting portion projecting from the intermediate portion and being continuous with the base portion via the intermediate portion, and the intermediate portion has a side surface having a non-rectilinear cross-sectional shape in a section taken perpendicular to the electrode pad.

The semiconductor device of (1) can be manufactured, for example, by the invention of (7), that is (7) a method for manufacturing semiconductor device including a ball forming step of forming a metal ball at a tip portion of a bonding wire held by a capillary having a straight hole formed therein through which the bonding wire is inserted, and a bonding step of ultrasonically vibrating while pressing the metal ball by the capillary against an electrode pad formed on a semiconductor chip to bond the metal ball to the electrode pad and with which the capillary includes a chamfer portion that has a side surface having a non-rectilinear cross-sectional shape in a section taken along an axial direction of the straight hole, and in the bonding step, the metal ball is ultrasonically vibrated along a direction intersecting the non-rectilinear side surface.

By the present method, the bonding wire is bonded to the electrode pad by the metal ball being ultrasonically vibrated along the direction intersecting the non-rectilinear side surface of the chamfer portion while being pressed against the electrode pad.

By application of ultrasonic waves, a portion of the metal ball spreads below the capillary and forms the base portion and another portion is pushed into the straight hole to form the projecting portion. The intermediate portion is formed by the remaining portion remaining inside the chamfer portion.

With the bond portion formed using such a capillary, the intermediate portion is formed in accordance with the shape of the side surface of the chamfer portion. The intermediate portion thus has the side surface having the non-rectilinear cross-sectional shape in the section taken perpendicular to the electrode pad in the direction in which the ultrasonic waves are applied.

Stress applied to the intermediate portion along the direction of application of ultrasonic waves during bonding of the bonding wire can thus be dispersed across the side surface of non-rectilinear form and prevented from concentrating at specific locations of the intermediate portion. Stress applied to the electrode pad can thereby be relaxed. Consequently, occurrence of damage at a portion below the electrode pad can be suppressed.

The non-rectilinear side surface may be of modes of the following inventions of (2) to (4). The invention of (2) provides the semiconductor device according to (1) in which the non-rectilinear side surface is a curved surface that curves toward an interior of the pad bond portion. The invention of (3) provides the semiconductor device according to (1) in which the cross-sectional shape of the non-rectilinear side surface is a curved waveform. The invention of (4) provides the semiconductor device according to (1) in which the cross-sectional shape of the non-rectilinear side surface is a rectilinear waveform.

Also, the invention of (5) provides the semiconductor device according to any one of (1) to (4) in which the non-rectilinear side surface is formed across the entire circumference of the bond portion.

With the present arrangement, the stress applied to the intermediate portion can be dispersed efficiently across the entire side surface of the intermediate portion because the side surface of non-rectilinear form is formed across the entire circumference. Therefore, stress applied to the electrode pad can be relaxed.

Also, the invention of (6) provides the semiconductor device according to any one of (1) to (5) in which the bonding wire is made of copper.

Copper is harder and more difficult to deform than gold and thus in forming the first bond, the load and the ultrasonic waves must be made greater than those in the case of a gold wire. The stress applied to the intermediate portion of the bond portion is thus greater than that in the case of using the gold wire and when the large stress is applied to the electrode pad, a major damage, such as forming of a crack in the semiconductor chip at a portion below the electrode pad, may occur.

However, with the shape of the intermediate portion described above, a large stress can be relaxed effectively even when it is applied. Damage below the electrode pad can thus be suppressed effectively.

Features to be Ascertained from the Disclosure of the Third Preferred Embodiment For example, the following inventions of (1) to (5) can be ascertained from the disclosure of the third preferred embodiment.

The invention of (1) provides a semiconductor device including a semiconductor chip, an electrode pad formed on the semiconductor chip, and a bonding wire having a linearly-extending main body portion and a bond portion that is formed on one end of the main body portion and is bonded to the electrode pad, and with which the bonding wire is made of copper and a ratio of a volume of the bond portion with respect to a cube of a wire diameter of the main body portion is 1.8 to 5.6.

Also, the invention of (2) provides a method for manufacturing semiconductor device including a ball forming step of forming a metal ball at a tip portion of a bonding wire, made of copper and held by a capillary made of a material with a thermal conductivity of 15 to 45 W/m·K, by thermally fusing the tip portion of the bonding wire, and a bonding step of ultrasonically vibrating while pressing the metal ball by the capillary against an electrode pad formed on a semiconductor chip to bond the metal ball to the electrode pad.

With the present method, the capillary made of the material with a thermal conductivity of 15 to 45 W/m·K is used in forming the metal ball at the bonding wire made of copper. A metal ball with a comparatively small diameter with a magnitude of the diameter being 1.5 to 2.2 times the wire diameter of the main body portion of the bonding wire can thereby be formed with stability.

A volume of an FAB of such a diameter is 1.8 to 5.6 times the cube of the wire diameter of the main body portion of the bonding wire.

The bond portion of the bonding wire formed by the metal ball of the above diameter being ultrasonically vibrated while being pressed by the capillary has a volume of 1.8 to 5.6 times the cube of the wire diameter of the main body portion of the bonding wire as in the semiconductor device of (1). That is, the ratio of the volume of the bond portion with respect to the cube of the wire diameter of the main body portion of the bonding wire (volume/(wire diameter)$^3$) is 1.8 to 5.6.

The bonding wire can thus be improved in thermal conductivity and electrical conductivity because a comparatively thick bonding wire can be used regardless of the magnitude of the pitch of the electrode pads. Also, the cost can be reduced in comparison to a case where gold wires are used because copper wires are used.

Also, the invention of (3) provides the method for manufacturing semiconductor device according to (2) in which the capillary is made of polycrystalline ruby. Also, the invention of (4) provides the method for manufacturing semiconductor device according to (2) in which the capillary is made of monocrystalline ruby.

That is, as the material of the capillary, for example, the polycrystalline ruby (with a thermal conductivity, for example, of approximately 17 to 19 W/m·K) of (3) or the monocrystalline ruby (with a thermal conductivity, for example, of approximately 41 to 43 W/m·K) of (4) may be used.

Also, the invention of (5) provides the method for manufacturing semiconductor device according to any one of (2) to (4) in which, in the ball forming step, a current applied to the bonding wire is made greater the greater the wire diameter of the bonding wire.

With the present method, a metal ball closer to a true sphere can be formed efficiently because the current applied to the wire during forming of the metal ball is made grater the greater the wire diameter.

Features to be Ascertained from the Disclosure of the Fourth Preferred Embodiment For example, the following inventions of (1) to (4) can be ascertained from the disclosure of the fourth preferred embodiment.

The invention of (1) provides a wire bonding method including a ball forming step of forming a metal ball at a tip portion of a bonding wire, made of copper and held by a capillary, by thermally fusing the tip portion of the bonding wire, and a bonding step of ultrasonically vibrating while pressing the metal ball by the capillary against an electrode pad made of a metal and formed on a semiconductor chip to bond the metal ball to the electrode pad, and with which in the bonding step, the capillary applies a relatively large load instantaneously to the metal ball at an initial stage of pressing and thereafter applies relatively small load to the metal ball.

Also, the invention of (3) provides a semiconductor device including a semiconductor chip, an electrode pad made of metal and formed on the semiconductor chip, and a bonding wire having a linearly-extending main body portion and a bond portion that is formed on one end of the main body portion and is bonded to the electrode pad, and in which the bonding wire is made of copper and a protruding portion of a material of the electrode pad that protrudes during bonding from a region of the electrode pad bonded to the bond portion contacts a top surface of the electrode pad.

With the wire bonding method of (1), the metal ball is bonded to the electrode pad by ultrasonically vibrating while pressing the metal ball against the electrode pad after forming the metal ball at the tip portion of the bonding wire made of copper.

During bonding of the metal ball, a fixed load and ultrasonic waves are not applied to the metal ball for the same time period but while the ultrasonic wave is applied, the relatively large load is applied at an initial stage of pressing and thereafter the relatively small load is applied.

With such a wire bonding method, the metal ball can be deformed effectively by the relatively large load that is applied instantaneously at the initial stage of pressing of the metal ball.

Meanwhile, after the initial stage of pressing, the load applied to the metal ball is made relatively small and thus the bonding wire can be bonded to the electrode pad with excellent bonding strength by the ultrasonic waves that are applied together with the relatively small load.

When in forming the first bond of a copper wire, which is harder and more difficult to deform than gold, the load and ultrasonic waves are made greater than in the conditions for a gold wire, so-called excessive splash, in which the material of the pad that is pressingly spread by the metal ball is lifted from the top surface of the electrode pad and protrudes outward largely, may occur. Also, a large load is applied to a portion directly below the electrode pad and consequently, a crack may occur in the semiconductor chip main body.

However, with the method of (1), the load is made small after the initial stage of pressing and thus the pressingly spreading of the electrode pad by the metal ball, to which the ultrasonic waves are applied, can be suppressed. The occurrence of excessive splash at the electrode pad can thus be suppressed. Also, the initial period is the only period during which the relatively large load is applied to the electrode pad, and thus application of a large load to a portion directly below the electrode pad can be suppressed.

Consequently, occurrence of crack in the semiconductor chip can be suppressed.

With the semiconductor device prepared using the present method, for example, a protruding portion of the pad material that protrudes from the bond region of the electrode pad during bonding of the bonding wire can be made to contact the top surface of the electrode pad without being lifted above a top surface of the electrode pad as in the semiconductor device of (3).

Also, the invention of (4) provides the semiconductor device according to (3) in which the electrode pad is made of a metal material that contains aluminum. With a semiconductor device in which electrode pad is made of a metal material that contains aluminum as in the semiconductor device of (4), excessive splash occurs readily when a copper wire is used. However, even with such a semiconductor device, the excessive splash can be suppressed effectively by using the wire bonding method described above. Also, the invention of (2) provides the wire bonding method according to (1) in which, in the bonding step, the relatively large load is applied for a first time period from contact of the metal ball with the electrode pad and thereafter, the relatively small load is applied for a second time period that is longer than the first time period.

With the present method, by making the second time period during which the relatively small load is applied longer than the first time period during which the relatively large load is applied to the metal ball, the bonding strength of the bonding wire with respect to the electrode pad can be improved.

Features to be Ascertained from the Disclosure of the Fifth Preferred Embodiment For example, the following inventions of (1) to (4) can be ascertained from the disclosure of the fifth preferred embodiment.

The invention of (1) provides a semiconductor device including a semiconductor substrate, a wiring formed on the semiconductor substrate, an insulating layer covering the wiring, a barrier layer formed on the insulating layer, an electrode pad formed on the barrier layer at a position facing a portion of the wiring, and a bonding wire made of copper and bonded to the electrode pad, and in which in plan view, the area of the wiring that overlaps a bond region of the bonding wire and the electrode pad is no more than 26.8% of the area of the bond region.

The area by which the barrier layer directly below the electrode pad faces the wiring is comparatively small because the area of the wiring (overlap area of the wiring) that overlaps the bond region in plan view is no more than 26.8% of the area of the bond region. Thus, for example, even if the barrier layer is pressed toward the wiring side during bonding of the bonding wire and the electrode pad, deformations of the wiring and the insulating film due to the pressing are unlikely to occur, and concentration of stress at the barrier layer due to such deformations can be prevented. Consequently, occurrence of crack in the barrier layer can be prevented and the semiconductor device can thus be improved in reliability.

Also, the invention of (2) provides the semiconductor device according to (1) in which the insulating layer includes a first interlayer insulating film and a second interlayer insulating film laminated on the first interlayer insulating film, and the wiring is covered by the first interlayer insulating film That is, the insulating layer may include the first interlayer insulating film and the second interlayer insulating film laminated on the first interlayer insulating film, and in this case, the wiring may be covered by the first interlayer insulating film and another wiring does not have to be present between the first interlayer insulating film and the second interlayer insulating film.

Also, the invention of (3) provides the semiconductor device according to (1), which further includes a lower interlayer insulating film laminated on the semiconductor substrate and an upper interlayer insulating film laminated on the lower interlayer insulating film, and in which the wiring is formed between the upper interlayer insulating film and the insulating layer.

That is, the semiconductor device may include the lower interlayer insulating film laminated on the semiconductor substrate and the upper interlayer insulating film laminated on the lower interlayer insulating film, and in this case, the wiring may be formed between the upper interlayer insulating film and the insulating layer and another wiring does not have to be present between the upper interlayer insulating film and the lower interlayer insulating film.

Also, the invention of (4) provides the semiconductor device according to any one of (1) to (3) in which a plurality of wirings are provided in a mutually spaced manner and the electrode pad faces at least one of the wirings and a portion of the insulating layer sandwiched between wirings.

That is, a plurality of wirings may be provided in a mutually spaced manner and in this case, the electrode pad preferably faces at least one of the wirings and the portion of the insulating layer sandwiched between wirings.

With the arrangement in which the plurality of wirings are provided in a mutually spaced manner, an area of overlap of the plurality of wirings is a total of an area of overlap of each wiring, and the total is no more than 26.8% of the area of the bond region. Thus, for all wirings, the overlap area of each wiring is less than 26.8% of the area of the bond region.

The electrode pad faces at least one of the wirings and the portion of the insulating layer sandwiched between wirings. The plurality of wirings, the overlap areas of each of which is less than 26.8% of the area of the bond region, thus face the bond region of the electrode pad in a dispersed manner. Thus, when the barrier layer is pressed toward the wiring side, a deformation amount of the wiring and the insulating layer due to the pressing can be suppressed to a small amount. Stress concentration at a specific location in the barrier layer can consequently be suppressed. Occurrence of crack in the barrier layer can thus be prevented further.

Features to be Ascertained from the Disclosure of the Sixth Preferred Embodiment For example, the following inventions of (1) to (4) can be ascertained from the disclosure of the sixth preferred embodiment.

The invention of (1) provides a method for manufacturing semiconductor device by connecting bonding wires to a plurality of bonding objects, including a ball forming step of applying an electrical discharge energy to a tip portion of a bonding wire, made of copper and held by a capillary, to fuse the tip portion and thereby form a metal ball, a bonding step of bonding the metal ball to an abovementioned bonding object made of a metal material, and a cutting step of severing the bonding wire, extending from the metal ball, from the capillary, and in which, in a case of repeating the ball forming step, the bonding step, and the cutting step in that order a plurality of times to successively connect the bonding wires to the bonding objects, a first electrical discharge energy in the ball forming step in a first cycle is made higher than a second electrical discharge energy in the ball forming step in a second cycle onward.

The first electrical discharge energy applied to the bonding wire in the ball forming step in the first cycle is made higher than the second electrical discharge energy applied to the bonding wire in the ball forming step in a second cycle onward. Thus, in the first cycle, an ambient temperature environment of the bonding wire can be stabilized. Consequently, a comparatively large metal ball can be formed in the first cycle.

Thus, by suitably adjusting the first electrical discharge energy, a size of the metal ball in the first cycle can be made substantially the same as a size of the metal ball in the second cycle onward. Consequently, variation of size of the metal balls can be suppressed throughout all cycles.

Also, the ball forming step, the bonding step, and the cutting step are executed as one series of steps and thus the metal ball that is prepared is bonded immediately to a bonding object without being left to stand for a while. Oxidation of the metal ball can thus be suppressed and connection defects of the bonding wires with respect to the bonding objects can be suppressed.

Also, the invention of (2) provides the method for manufacturing semiconductor device according to (1) in which the first electrical discharge energy is set to 105 to 115% of the second discharge energy. That is, with the method for manufacturing semiconductor device, the first electrical discharge energy is preferably set to 105 to 115% of the second discharge energy. When the first electrical discharge energy is within the above range, the variation of size of the metal ball can be suppressed further. For example, a semiconductor device of (3) can be manufactured by the method for manufacturing semiconductor device. That is, the invention of (3) provides a semiconductor device including a semiconductor chip, a plurality of electrode pads formed on the semiconductor chip, and a plurality of bonding wires, each made of copper, being connected one by one to each of the plurality of electrode pads, and having a pad bond portion bonded to the electrode pad, and in which a variation of volumes of the bond portions of all bonding wires with respect to an average volume of the bonding portions is within ±15%.

Also, the invention of (4) provides the semiconductor device according to (3) in which the variation of volumes of the bond portions of all bonding wires with respect to the average volume of the bonding portions is within ±100. That is, with the present semiconductor device, the variation of volumes of the bond portions of all bonding wires with respect to the average volume of the bonding portions is preferably within ±10%.

Features to be Ascertained from the Disclosure of the Seventh Preferred Embodiment For example, the following inventions of (1) to (5) can be ascertained from the disclosure of the seventh preferred embodiment.

The invention of (1) provides a wire bonding method including a step of forming an FAB at a tip of a copper wire held by a capillary, a step of making the capillary approach a pad formed on a top surface of a semiconductor chip and making the FAB contact the pad, a step of applying a load to the FAB by means of the capillary after the contacting of the FAB with the pad, and a step of applying a drive current to an ultrasonic transducer provided in the capillary.

With the present wire bonding method, after the FAB formed on the tip of the copper wire is put in contact with a pad, a load is applied to the FAB by the capillary. Also, the drive current is applied to the ultrasonic transducer provided in the capillary in a period partially overlapping with the period in which the load is applied to the FAB. Thus, while the FAB deforms due to the load, the FAB is rubbed against the pad by the ultrasonic vibration propagating from the ultrasonic transducer. Consequently, bonding of the FAB and the pad is achieved.

In a case where a bottleneck type capillary is used as the capillary, a value of the drive current applied to the ultrasonic transducer is set to a value that is no less than 1.3 times and no more then 1.5 times the value of the drive current in a case where a standard type capillary is used as the capillary. Specifically, the value of the drive current may be set to 1.4 times as in the invention of (2) described below.

That is, the invention of (2) provides the wire bonding method according to (1) in which a value of the drive current in a case where a bottleneck type capillary is used as the capillary is set to 1.4 times the value of the drive current in a case where a standard type capillary is used as the capillary.

Magnitudes of the load applied to the FAB and the drive current for the ultrasonic transducer provided in the capillary can thereby be set simply and satisfactory bonding of the copper wire to the pad can be achieved even when the capillary used for wire bonding is changed from the standard type capillary to the bottleneck type capillary.

Also, the invention of (3) provides the wire bonding method according to (1) or (2) in which the value of the drive current applied to the ultrasonic transducer is gradually increased to a predetermined value after contacting of the FAB with the pad.

By the value of the drive current applied to the ultrasonic transducer being increased gradually while applying the load to the FAB as in the wire bonding method of (3), the FAB deforms in a squeezed manner and an area of a portion of contact of the FAB and the pad increases gradually. The ultrasonic vibration energy propagating from the ultrasonic transducer to the FAB is thereby increased gradually and the area of the FAB rubbed against the pad increases gradually. Consequently, a state of satisfactory bonding to the pad can be realized up to a peripheral edge portion of the surface of bonding of the first ball portion with the pad while suppressing occurrence of damage in the pad and a layer below the pad due to rapid increase of the ultrasonic vibration energy propagating to the FAB below a central portion of the FAB (first ball portion) after completion of bonding.

Also, the invention of (4) provides the wire bonding method according to (3) in which the value of the drive current applied to the ultrasonic transducer is increased to the predetermined value at a fixed rate of change after contacting of the FAB with the pad.

Also, the invention of (5) provides the wire bonding method according to any one of (1) to (4) in which the drive current is applied to the ultrasonic transducer from before the contacting of the FAB with the pad.

In this case, the ultrasonic vibration propagates to the portion of contact of the FAB and the pad from the instant at which the FAB contacts the pad and the contact portion is rubbed against the pad. Consequently, a state where a central portion of a surface of the first ball portion that bonds with the pad (portion at which the FAB and the pad first make contact) is satisfactorily bonded to the pad can be realized.

Features to be Ascertained from the Disclosure of the Eighth Preferred Embodiment For example, the following inventions of (1) to (6) can be ascertained from the disclosure of the eighth preferred embodiment.

The invention of (1) provides a semiconductor device including a semiconductor chip having a pad provided on a top surface and a copper wire having one end connected to the pad and containing Zn (zinc) at least at a portion of bonding with the pad.

The copper wire contains Zn at least at a portion (hereinafter, referred to as "pad bond portion" in the present section) of bonding with the pad on the semiconductor chip. In other words, the pad bond portion of the copper wire is made of an alloy (brass) of Cu and Zn. The pad bond portion is thus difficult to oxidize. Peeling of the pad bond portion from the pad due to oxidation can thus be prevented.

Also, the invention of (2) provides the semiconductor device according to (1) in which the pad has a Zn layer made of Zn at least at a top layer portion. Also, the invention of (3) provides the semiconductor device according to (2) in which the pad is made of a single layer of the Zn layer. Also, the invention of (4) provides the semiconductor device according to (2) in which the pad further has an Al layer made of Al and the Zn layer is formed on the Al layer.

That is, as long as the pad has a Zn layer made of Zn at least at the top layer portion, the pad may be a single layer of the Zn layer or a laminate of an Al layer, made of Al, and the Zn layer.

However, in a case where the pad is made of an Al layer and a Zn layer and these are in direct contact, the Al and Zn undergo eutectic bonding. Whereas the melting point of Al is 660° C. and the melting point of Zn is 419° C., the melting point of a Zn—Al alloy in which Al and Zn are eutectically bonded is low and, for example, the melting point of a 78Zn-22Al alloy is 275° C. Thus, when a pad has a Zn—Al alloy, the pad may melt during a heat treatment.

Thus, the invention of (5) provides the semiconductor device according to (4) further including a barrier film, interposed between the Al layer and the Zn layer and having a structure where a Ti layer made of Ti and a TiN layer made of TiN are laminated in that order from the Al layer side.

By interposition of the barrier film, eutectic bonding of the Al contained in the Al layer and the Zn contained in the Zn layer can be prevented.

Also, the invention of (6) provides the semiconductor device according to any one of (1) to (5) in which Zn is contained in the entirety of the copper wire.

That is, the copper wire may be a wire made of pure copper or may be a wire made of brass. If the copper wire is a wire made of brass, the pad bond portion will be made of brass and peeling of the pad bond portion from the pad due to oxidation of the pad connection portion can be prevented even if the pad does not have a Zn layer.

Features to be Ascertained from the Disclosure of the Ninth Preferred Embodiment For example, the following inventions of (1) to (7) can be ascertained from the disclosure of the ninth preferred embodiment.

The invention of (1) provides a semiconductor device including a semiconductor chip, a die pad to which the semiconductor chip is bonded, a lead disposed at a periphery of the die pad, a bonding wire made of a metal material, provided across the semiconductor chip and the lead, and electrically connecting the semiconductor chip and the lead, and a nonelectrical connection member made of a metal material and not contributing to electrical connection of the semiconductor chip with the die pad and the lead.

With the present semiconductor device, the bonding wire made of the metal material is installed between the semiconductor chip bonded to the die pad and the lead disposed at the periphery of the die pad. The semiconductor chip and the lead are electrically connected by the bonding wire. Also, the semiconductor device is provided with the nonelectrical connection member that does not contribute to electrical connection of the semiconductor chip with the die pad and the lead. The nonelectrical connection member is made of the metal material.

During operation of the semiconductor device, heat generated from the semiconductor chip is transmitted to the die pad, the lead, and the nonelectrical connection member. The transmitted heat propagates through a sealing resin that seals the above components in a batch and is released (radiated) from the top surface of the sealing resin. Thus, in comparison to an arrangement that is not provided with the nonelectrical connection member, the efficiency of heat transmission to the sealing resin can be improved and the heat radiation property of the semiconductor device can be improved by the nonelectrical connection member being provided.

Also, the nonelectrical connection member does not contribute to electrical connection of the semiconductor chip with the die pad and the lead. There is thus no need to take into consideration contact of nonelectrical connection members with each other and restrictions are not placed in the positioning of the nonelectrical connection members, and thus the nonelectrical connection members can be positioned as densely as is physically possible. Consequently, the heat radiation property of the semiconductor device can be improved further.

Also, the invention of (2) provides the semiconductor device according to (1) in which the nonelectrical connection member includes a looped metal wire having both end portions bonded to one of either the die pad or the lead. In the case where the nonelectrical connection member is a looped metal wire, the nonelectrical connection member can be formed using a wire bonder. Addition of a device for forming the nonelectrical connection member can thus be avoided. Also, nonelectrical connection members can be positioned without taking into consideration contact of metal wires with each other and thus the nonelectrical connection members can be formed at as small an interval as can be formed using the wire bonder.

Also, the invention of (3) provides the semiconductor device according to (1) or (2) in which the nonelectrical connection member includes a stud bump disposed on one of either the die pad or the lead.

In the case where the nonelectrical connection member is a stud bump, the nonelectrical connection member can be formed using a wire bonder. Addition of a device for forming the nonelectrical connection member can thus be avoided. Also, nonelectrical connection members can be positioned without taking into consideration contact of stud bumps with each other and thus the nonelectrical connection members can be formed at as small an interval as can be formed using the wire bonder.

Further, the nonelectrical connection member may be a combination of a looped metal wire and a stud bump. In this case, the stud bump can be disposed at a gap of the loop portion of the metal wire and the positioning density of the nonelectrical connection member can thus be made even higher to achieve further improvement in the radiation property of the semiconductor device.

Also, the invention of (4) provides the semiconductor device according to (3) in which the plurality of stud bumps are layered overlappingly. The height of the stud bumps can thereby be changed in accordance with a dead space inside the semiconductor device and the nonelectrical connection members can thus be made even greater in surface area.

Consequently, further improvement in the radiation property of the semiconductor device can be achieved.

Also, the invention of (5) provides the semiconductor device according to any one of (1) to (4) in which the nonelectrical connection member is made of copper. Copper is inexpensive and the nonelectrical connection member can thus be reduced in material cost. Also, copper is high in thermal conductivity and the heat radiation amount of the semiconductor device can thus be improved.

Also, the invention of (6) provides the semiconductor device according to (5) in which a silver plating is applied to the nonelectrical connection member bonding portion of the die pad and/or the lead.

Also, the invention of (7) provides the semiconductor device according to any one of (1) to (6) in which the bonding wire is made of copper. That is, the bonding wire is preferably made of copper. Copper is inexpensive and thus enables reduction in the material cost of the bonding wire. Also, copper is high in electrical conductivity and thus an electrical resistance between the semiconductor chip and the lead can be reduced.

Features to be Ascertained from the Disclosure of the Tenth Preferred Embodiment For example, the following inventions of (1) to (6) can be ascertained from the disclosure of the tenth preferred embodiment.

The invention of (1) provides a semiconductor device including a semiconductor chip, an island disposed so as to face a rear surface of the semiconductor chip, a bonding material with an insulating property that is interposed between the island and the rear surface of the semiconductor chip, a lead disposed separatedly from the island at a side of the island, a top surface wire installed between a pad, formed on a top surface of the semiconductor chip, and the lead and electrically connecting the pad and the lead, and a rear surface wire installed between the rear surface of the semiconductor chip and the island and electrically connecting the rear surface of the semiconductor chip and the island. With the present semiconductor device, the semiconductor chip has its rear surface bonded to the island by the bonding material with the insulating property. At the side of the island, the lead is disposed separatedly from the island. The top surface wire is installed between the pad, formed on the top surface of the semiconductor chip, and the lead. The pad and the lead are thereby connected electrically.

Also, the rear surface wire that electrically connects the semiconductor chip and the island is installed between the rear surface of the semiconductor chip and the island. The rear surface of the semiconductor chip and the island can thereby be connected electrically via the rear surface wire even if the bonding material has an insulating property. That is, even when a bonding material other than solder is used, electrical connection of the rear surface of the semiconductor chip and the island can be achieved regardless of the electrical characteristics of the bonding material.

Also, the invention of (2) provides the semiconductor device according to (1) in which the rear surface wire is made of copper. That is, the rear surface wire is preferably made of copper. Copper is inexpensive in comparison to gold, which is widely used as wire material, and the rear surface wire can thus be reduced in material cost. Also, copper is high in electrical conductivity and can thus reduce the electrical resistance between the semiconductor chip and the island. Also, the rear surface wire that is made of copper is good in heat radiation property and it is thus effective to provide a plurality of rear surface wires made of copper from the standpoint of heat radiation property.

Also, the invention of (3) provides the semiconductor device according to (1) or (2) in which the top surface wire and the rear surface wire are made of the same material. That is, the top surface wire and the rear surface wire are preferably made of the same material. If the surface wire and the rear surface wire are made of the same material, the top surface wire and the rear surface wire can be formed by a wire bonder without changing a material set in the wire bonder. A manufacturing process of the semiconductor device can thus be simplified.

Also, the invention of (4) provides the semiconductor device according to any one of (1) to (3) in which a through-hole is formed to pass through the island in its thickness direction, and the rear surface wire is installed between the rear surface of the semiconductor chip and the island through the through-hole. The rear surface of the semiconductor chip is thereby exposed from the through-hole and electrical connection of the rear surface of the semiconductor chip and the island can be achieved by the rear surface wire being connected to the exposed portion. In this case, an area of a portion of the island that faces the rear surface of the semiconductor chip is necessarily made smaller than an area of the rear surface of the semiconductor chip, the bonding material with the insulating property suffices to be interposed just at facing portions of the semiconductor chip and the island, and thus the bonding material can be reduced in usage amount. Consequently, the semiconductor chip can be reduced in material cost.

Also, the invention of (5) provides the semiconductor device according to any one of (1) to (4) in which the rear surface wire is provided in plurality. Reliability of the electrical connection of the semiconductor chip and the island can thereby be improved.

Also, the invention of (6) provides the semiconductor device according to any one of (1) to (5) in which the area of the portion of the island facing the rear surface of the semiconductor chip is smaller than the area of the rear surface of the semiconductor chip.

Features to be Ascertained from the Disclosure of the Eleventh Preferred Embodiment For example, the following inventions of (1) to (7) can be ascertained from the disclosure of the eleventh preferred embodiment.

The invention of (1) provides a semiconductor device including a lead frame, a semiconductor chip bonded to the lead frame, a bonding material made of a Bi-based material and interposed between the lead frame and the semiconductor chip, and a spacer made of Cu and provided on a surface of the lead frame that faces the semiconductor chip.

With the present arrangement, making of the bonding material lead free can be achieved because the bonding material bonding the lead frame and the semiconductor chip is made of the Bi-based material.

Also, a distance between the lead frame and the semiconductor chip can be maintained at least at a height of the spacer because the spacer is provided between the lead frame and the semiconductor chip. Thus, by suitable adjustment of the height of the spacer, a bonding material having a sufficient thickness can be interposed between the lead frame and the semiconductor chip. Consequently, even when stress due to warping of the lead frame occurs in the bonding material, the stress can be relaxed adequately. A warping amount of the semiconductor chip can thus be reduced.

Occurrence of crack in the semiconductor chip can thus be prevented. Also, there is no need to make the thicknesses of the semiconductor chip and the lead frame large and thus a package main body of the semiconductor device does not become large.

Further, a thermal conductive property between the lead frame and the semiconductor chip can be improved because the spacer is made of Cu and the thermal conductivity (approximately 398 W/m·K) of Cu is extremely large in comparison to the thermal conductivity (approximately 9 W/m·K) of Bi. Heat generated at the semiconductor chip can thus be released to the lead frame via the Cu spacer. An adequate heat radiation property can thus be secured for the semiconductor chip.

Also, in a case where the spacer is made of a metal element, such as Au, Ag, Ni, the Bi in the bonding material may react with the spacer to form a compound with the metal element or form a eutectic composition. An intermetallic compound of Bi and an abovementioned metal element is hard and brittle and may thus become a starting point of breakage during a temperature cycle test (TCY test) of the semiconductor device. Also, a melting point of a eutectic composition of Bi and an abovementioned metal element is lower than the melting point of Bi alone. For example, whereas the melting point of Bi alone is approximately 271° C., the melting point of a eutectic composition of Bi and Au is approximately 241° C., and the melting point of a eutectic composition of Bi and Ag is approximately 262° C. The bonding material may thus remelt during reflow (peak temperature: approximately 260° C.) for mounting the semiconductor device.

In contrast, Cu hardly reacts with Bi, and with the semiconductor device with which the spacer is made of Cu, lowering of the melting point of the bonding material and degradation of temperature cycle resistance can be suppressed.

Also, the invention of (2) provides the semiconductor device according to (1) in which the lead frame is made of Cu.

As the material of the lead frame, for example, an Fe-based material, such as 42 alloy (Fe-42% Ni), is known besides the Cu of (2). The thermal expansion coefficient of 42 alloy is approximately 4.4 to $7.0\times10^{-6}$/° C. With a lead frame made from 42 alloy, the thermal expansion amount is less than the lead frame made of Cu (with a thermal expansion coefficient of approximately $16.7\times10^{-6}$/° C.) and the warp amount of the lead frame can thereby be made small. However, in a case where 42 alloy is used, the cost is higher and the heat radiation property decreases in comparison to a case where Cu is used.

In contrast, with the semiconductor device described above, the stress due to warping of the lead frame can be relaxed adequately by the bonding material even in the case where the lead frame is made of Cu. Cu can thus be used without problem as the material of the lead frame to maintain the cost and the heat radiation property.

The Cu used as the material of the lead frame is a Cu-based material that mainly contains Cu and includes high-purity coppers of no less than 99.9999% (6N) purity or no less than 99.99% (4N) purity, alloys of Cu and a dissimilar metal (for example, a Cu—Fe—P alloy, etc.), etc.

Also, the invention of (3) provides the semiconductor device according to (1) or (2) in which the semiconductor chip includes an Si substrate and the Si substrate is supported by the spacer.

With the present arrangement, the Si substrate is supported by the spacer and thus the Si substrate and the lead frame are connected in a manner enabling heat exchange via the spacer. Thus, when the lead frame undergoes thermal expansion, the heat of the lead frame is transmitted to the Si substrate. Thus, during reflow for mounting the semiconductor device, the Si substrate can be thermally expanded by the heat transmitted from the lead frame. Consequently, the difference between the thermal expansion amount of the lead frame and the thermal expansion amount of the Si substrate can be made small and the Si substrate can thus be reduced in warp amount.

Also, the invention of (4) provides the semiconductor device according to any one of (1) to (3) in which a Cu layer is formed at a surface of the semiconductor chip that faces the lead frame.

With the present arrangement, the bonding material is bonded to the Cu layer in the semiconductor device. As mentioned above, Cu and Bi hardly react with each other and thus lowering of the melting point of the bonding material and degradation of temperature cycle resistance can be suppressed. Also, in a case where the semiconductor chip and the spacer are in contact, the contact is contact of the same metal species of the Cu layer and the Cu spacer, and influences (for example, increased resistance of the Cu spacer, erosion of the Cu spacer, etc.) due to contact of the semiconductor chip and the spacer can be reduced.

Also, the invention of (5) provides the semiconductor device according to any one of (1) to (4) in which the bonding material contains Sn or Zn.

With the present arrangement, the bonding material contains Sn or Zn and the bonding material can thus be improved in wetting property with respect to the lead frame and the semiconductor chip.

For example, in the case where the Cu layer is formed at the surface of the semiconductor chip that faces the lead frame, a portion made of a Cu—Sn alloy or a Cu—Zn alloy can be formed near the interface of the bonding material with the Cu layer. The bonding strength of the semiconductor chip and the bonding material can thus be improved by the alloy portion.

Also, the thermal conductivity of Sn is approximately 73 W/m·K, the thermal conductivity of Zn is approximately 120 W/m·K, and these are higher than the thermal conductivity (approximately 9 W/m·K) of Bi. The thermal conductivity of the bonding material can thus be improved in comparison to a case where the bonding material is made of only Bi. Consequently, the heat radiation property of the semiconductor chip can be improved further.

Also, the invention of (6) provides the semiconductor device according to any one of (1) to (5) in which the spacer is formed by a wire bonding method.

With the present arrangement, the wire bonding method, which is a method that is conventionally-proven from before, is used to form the spacer on the lead frame. The spacer can thus be formed easily. The spacer formed by the wire bonding method is, for example, a stud bump, wire ring, etc.

Also, the invention of (7) provides the semiconductor device according to any one of (1) to (6) in which no less than three spacers are installed.

With the present arrangement, the semiconductor chip can be supported at least at three points because no less than three spacers are provided. The semiconductor chip can thus be stabilized on the spacers so as not to tilt with respect to the top surface of the lead frame. The distance between the lead frame and the semiconductor chip can thus be made substantially uniform in magnitude. Consequently, the bonding material is made uniform in linear expansion coefficient in the directions of facing the lead frame and semiconductor chip (vertical direction) so that biasing of stress in the bonding material can be suppressed and stress can be relaxed as a whole. Also, the heat generated at the semiconductor chip can be released using the no less than three Cu spacers and the heat radiation property of the semiconductor chip can thus be improved further.

Features to be Ascertained from the Disclosure of the Twelfth Preferred Embodiment For example, the following inventions of (1) to (7) can be ascertained from the disclosure of the twelfth preferred embodiment.

The invention of (1) provides a wire bonding method including a step of forming an FAB at a tip of a copper wire held by a capillary, a step of making the capillary approach a pad formed on a top surface of a semiconductor chip and making the FAB contact the pad, a step of applying a relatively large initial load to the FAB by means of the capillary after the contacting of the FAB with the pad and, after elapse of a predetermined time period from the contacting of the FAB with the pad, applying a relatively small load to the FAB by means of the capillary, and a step of applying a drive current to an ultrasonic transducer provided in the capillary from before a value of the contacting of the FAB with the pad and gradually increasing a value of the drive current applied to the ultrasonic transducer to a predetermined value after the contacting of the FAB with the pad.

With the present wire bonding method, after the FAB formed on the tip of the copper wire is put in contact with a pad, a relatively large initial load is applied to the FAB by the capillary. The FAB, which is made of Cu that is a harder metal than Au, is thereby deformed satisfactorily and thus the initial load applied to the FAB can be made to contribute to the bonding of the FAB and the pad while it is suitably attenuated by the deformation of the FAB.

Also, the ultrasonic transducer provided in the capillary vibrates from before the contacting of the FAB with the pad. Thus, from the instant at which the FAB contacts the pad, the ultrasonic vibration propagates to the portion of contact of the FAB and the pad and the contact portion is rubbed against the pad. Consequently, a state where a central portion of a surface of bonding of the FAB (first ball portion) after completion of bonding with the pad (portion at which the FAB and the pad first make contact) is satisfactorily bonded to the pad can be realized.

After the FAB contacts the pad, the value of the drive current applied to the ultrasonic transducer is increased gradually. Meanwhile, the FAB deforms in a squeezed manner and an area of the portion of contact of the FAB and the pad increases gradually. The ultrasonic vibration energy propagating from the ultrasonic transducer to the FAB is thereby increased gradually and the area of the FAB rubbed against the pad increases gradually. Consequently, a state of satisfactory bonding to the pad can be realized up to a peripheral edge portion of the surface of bonding of the first ball portion with the pad while suppressing occurrence of crack or other damage in the pad and a layer below the pad due to rapid increase of the ultrasonic vibration energy propagating to the FAB below a central portion of the first ball portion.

The deformation of the FAB due to the pressing of the FAB against the pad ends when the predetermined time period elapses from the contacting of the FAB, made of Cu, with the pad. That is, the shape of the first ball portion is completed when the predetermined time period elapses from the contacting of the FAB, made of Cu, with the pad. Thus, if the large load continues to be applied to the FAB thereafter, the ultrasonic vibration will not propagate satisfactorily to the portion of contact of the FAB and the pad, and the load applied to the FAB is thus decreased after the elapse of the predetermined time period from the contacting of the FAB with the pad. The ultrasonic vibration can thereby be made to propagate satisfactorily to the portion of contact of the FAB (first ball portion) and the pad.

Thus, by the wire bonding method according to the invention of (1), satisfactory bonding of the copper wire to a pad, that is, a state where the entire surface of bonding of the first ball portion with the pad is bonded satisfactorily to the pad can be realized while preventing occurrence of damage in the pad and a layer below the pad.

The invention of (2) provides the wire bonding method according to (1) in which, after the contacting of the FAB with the pad, the value of the drive current applied to the ultrasonic transducer is increased at a fixed rate of change to the predetermined value. Also, the invention of (3) provides the wire bonding method according to (2) in which the rate of change is set to no more than 21 mA/msec. That is, the value of the drive current applied to the ultrasonic transducer may be increased at the fixed rate of change to the predetermined value after the contacting of the FAB with the pad. In this case, the rate of change is preferably no more than 21 mA/msec. If the rate of change is no more than 21 mA/msec, occurrence of damage in the pad and the layer below the pad due to rapid increase of the ultrasonic vibration energy propagating to the FAB can be prevented effectively.

As a method for bonding the FAB to a pad, continued application of a fixed load to the FAB and continued application of a fixed drive current to the ultrasonic transducer after the contacting of the FAB with the pad may be considered. However, with the present method, no matter what magnitude the load applied to the FAB and value the drive current applied to the ultrasonic transducer are set to, the FAB is not adequately bonded to the pad or so-called splash, in which the material of the pad protrudes greatly outward in a form of a thin collar to sides of the FAB (first ball portion), occurs.

With the wire bonding method according to the invention of (1), the occurrence of splash is prevented by the value of the drive current applied to the ultrasonic transducer from before the contacting of the FAB with the pad and the magnitude of the initial load being set appropriately.

Also, the invention of (4) provides the wire bonding method according to any one of (1) to (3) in which the value of the drive current applied to the ultrasonic transducer from before the contacting of the FAB with the pad is less than 30 mA. The value of the drive current applied to the ultrasonic transducer from before the contacting of the FAB with the pad is preferably less than 30 mA. The ultrasonic vibration energy that propagates to the FAB immediately after the FAB contacts the pad can thereby be prevented from being excessive. Consequently, occurrence of splash and occurrence of damage in the pad and the layer below the pad below the central portion of the first ball portion can be prevented satisfactorily.

Also, the invention of (5) provides the wire bonding method according to any one of (1) to (4), in which the magnitude of the initial load is set based on a value obtained by multiplying an intended bonding area of the FAB after completion of bonding with the pad by a fixed factor. The initial load and the bonding area of the first ball portion with respect to the pad (bonding area of the first ball portion and the pad) are in a substantially proportional relationship regardless of the wire diameter of the copper wire, and thus the magnitude of the initial load is preferably set based on the value obtained by multiplying the intended bonding area of the first ball portion with respect to the pad by the fixed factor. The magnitude of the initial load can thereby be set appropriately regardless of the wire diameter of the copper wire. Consequently, satisfactory deformation of the FAB can be achieved and the state where the central portion of the surface of bonding of the first ball portion with the pad is bonded satisfactorily to the pad can be realized while satisfactorily preventing the occurrence of splash and occurrence of damage in the pad and the layer below the pad below the central portion of the first ball portion.

Regardless of the magnitude of the initial load and the intended diameter and intended thickness of the first ball portion, the deformation of the FAB is not completed in less than 2 msec from the contact of the FAB with the pad. On the other hand, it is considered that, beyond 4 msec from the contacting of the FAB with the pad, the deformation of the FAB is reliably completed and it is meaningless to continue to apply the relatively large load to the FAB thereafter. It is thus preferable to set the period during which the initial load is applied to the FAB within no less than 2 msec and no more than 4 sec from the contacting of the FAB with the pad. With the magnitude of a load that is normally used as the initial load, the deformation of the FAB is completed in 3 msec and it is thus more preferable to decrease the load applied to the FAB at the point of elapse of 3 msec from the contacting of the FAB with the pad.

Also, the invention of (6) provides the wire bonding method according to any one of (1) to (5) in which an integrated value of the drive current applied to the ultrasonic transducer during the predetermined time period is less than 165 mA·msec. Ultrasonic vibration of the appropriate energy amount is thereby propagated to the FAB within the predetermined time period from the contacting of the FAB with the pad, and thus a state where satisfactory bonding to the pad is achieved up to the peripheral edge portion of the surface of bonding of the first ball portion with the pad can be realized while preventing the occurrence of damage in the pad and the layer below the pad below the central portion of the first ball portion.

Also, the invention of (7) provides the wire bonding method according to any one of (1) to (6) in which a value obtained by dividing the predetermined value by the intended bonding area of the FAB after completion of bonding is no more than 0.0197 mA/$\mu m^2$. By the present setting, the ultrasonic vibration energy that propagates to the FAB after the end of deformation of the FAB can be prevented from being excessive and occurrence of damage in the pad and the layer below the pad below the peripheral edge portion of the first ball portion can be prevented satisfactorily.

Features to be Ascertained from the Disclosure of the Thirteenth Preferred Embodiment For example, the following inventions of (1) to (6) can be ascertained from the disclosure of the thirteenth preferred embodiment.

The invention of (1) provides a wire bonding method including a step of forming an FAB at a tip of a copper wire held by a capillary, a step of making the capillary approach a pad formed on a top surface of a semiconductor chip and making the FAB contact the pad, a step of applying a relatively large initial load to the FAB by means of the capillary after the contacting of the FAB with the pad and, after elapse of a predetermined time period from the contacting of the FAB with the pad, applying a relatively small load to the FAB by means of the capillary, and a step of applying a drive current to an ultrasonic transducer provided in the capillary.

With the present wire bonding method, after the FAB formed on the tip of the copper wire is put in contact with a pad, a relatively large initial load is applied to the FAB by the capillary. The FAB, which is made of Cu that is a harder metal than Au, is thereby deformed satisfactorily and thus the initial load applied to the FAB can be made to contribute to the bonding of the FAB and the pad while it is suitably attenuated by the deformation of the FAB.

Also, the drive current is applied to the ultrasonic transducer provided in the capillary and thus the ultrasonic vibration propagates from the ultrasonic transducer to FAB and the FAB is rubbed against the pad by the ultrasonic vibration. The drive current applied to the ultrasonic transducer is controlled so that the integrated value of the drive current during the predetermined time period from the contacting of the FAB with the pad is less than 162 mA·msec. Ultrasonic vibration of an appropriate energy amount is thereby made to propagate to the FAB within the predetermined time period from the contacting of the FAB with the pad. Consequently, the FAB and the pad can be bonded satisfactorily by the ultrasonic vibration while preventing occurrence of damage of the pad and the layer below the pad due to excessive energy of the ultrasonic vibration.

The deformation of the FAB due to the pressing of the FAB against the pad ends when the predetermined time period elapses from the contacting of the FAB, made of Cu, with the pad. That is, the shape of the FAB (first ball portion) after completion of bonding is completed when the predetermined time period elapses from the contacting of the FAB, made of Cu, with the pad. Thus, if a large load continues to be applied to the FAB thereafter, the ultrasonic vibration will not propagate satisfactorily to the portion of contact of the FAB and the pad and the load applied to the FAB is thus decreased after the elapse of the predetermined time period from the contacting of the FAB with the pad. The ultrasonic vibration can thereby be made to propagate satisfactorily to the portion of contact of the FAB (first ball portion) and the pad.

Thus, by the wire bonding method according to (1), satisfactory bonding of the copper wire to a pad can be realized while preventing occurrence of damage in the pad and the layer below the pad.

Also, the invention of (2) provides the wire bonding method according to (1) in which, after the contacting of the FAB with the pad, the value of the drive current applied to the ultrasonic transducer is increased gradually to a predetermined value. That is, after the contacting of the FAB with the pad, the value of the drive current applied to the ultrasonic transducer is preferably increased gradually. Meanwhile, by the initial load being applied to the FAB, the FAB deforms in a squeezed manner and an area of the portion of contact of the FAB and the pad increases gradually. The ultrasonic vibration energy propagating from the ultrasonic transducer to the FAB is thereby increased gradually and the area of the FAB rubbed against the pad also increases gradually. Consequently, a state of satisfactory bonding to the pad can be realized up to a peripheral edge portion of the surface of bonding of the first ball portion with the pad while suppressing occurrence of damage in the pad and the layer below the pad due to rapid increase of the ultrasonic vibration energy propagating to the FAB below the central portion of the first ball portion.

Also, the invention of (3) provides the wire bonding method according to (2) in which the value of the drive current applied to the ultrasonic transducer is increased to the predetermined value at a fixed rate of change after the contacting of the FAB with the pad. That is, the value of the drive current applied to the ultrasonic transducer may be increased to the predetermined value at a fixed rate of change after the contacting of the FAB with the pad.

Also, the invention of (4) provides the wire bonding method according to any one of (1) to (3) in which the drive current is applied to the ultrasonic transducer from before the contacting of the FAB with the pad. In this case, the ultrasonic vibration propagates to the portion of contact of the FAB and the pad from the instant at which the FAB contacts the pad, and the contacting portion is rubbed against the pad. Consequently, a state where a central portion of a surface of the first ball portion that bonds with the pad (portion at which the FAB and the pad first make contact) is satisfactorily bonded to the pad can be realized.

As a method for bonding the FAB to a pad, continued application of a fixed load to the FAB and continued application of a fixed drive current to the ultrasonic transducer after the contacting of the FAB with the pad may be considered. However, with the present method, no matter what magnitude the load applied to the FAB and value of the drive current applied to the ultrasonic transducer are set to, the FAB is not adequately bonded to the pad or so-called splash, in which the material of the pad protrudes greatly outward in a form of a thin collar to sides of the FAB (first ball portion), occurs.

With the wire bonding method according to (1), the occurrence of splash is prevented by the value of the drive current applied to the ultrasonic transducer from before the contacting of the FAB with the pad and the magnitude of the initial load being set appropriately.

Also, the invention of (5) provides the wire bonding method according to (4) in which the value of the drive current applied to the ultrasonic transducer from before the contacting of the FAB with the pad is less than 30 mA. The ultrasonic vibration energy that propagates to the FAB immediately after the FAB contacts the pad can thereby be prevented from being excessive. Consequently, occurrence of splash and occurrence of damage in the pad and the layer below the pad below the central portion of the first ball portion can be prevented satisfactorily.

Also, the invention of (6) provides the wire bonding method according to any one of (1) to (5) in which the magnitude of the initial load is set to a value obtained by multiplying the intended bonding area of the FAB after completion of bonding with the pad by a fixed factor. The magnitude of the initial load can thus be set appropriately in accordance with the intended bonding area of the first ball portion. Consequently, satisfactory deformation of the FAB can be achieved while satisfactorily preventing the occurrence of splash and occurrence of damage of the pad and the layer below the pad below the central portion of the first ball portion.

Features to be Ascertained from the Disclosure of the Fourteenth Preferred Embodiment For example, the following inventions of (1) to (6) can be ascertained from the disclosure of the fourteenth preferred embodiment.

The invention of (1) provides a wire bonding method including a step of forming an FAB (free air ball) at a tip of a copper wire held by a capillary, a step of making the capillary approach a pad formed on a top surface of a semiconductor chip and making the FAB contact the pad, a step of applying a load to the FAB by means of the capillary after the contacting of the FAB with the pad, and a step of applying a drive current to an ultrasonic transducer provided in the capillary at least partially overlapping with the step of applying the load to the FAB.

With the present wire bonding method, after the FAB formed on the tip of the copper wire is put in contact with a pad, a load is applied to the FAB by the capillary. Also, the drive current is applied to the ultrasonic transducer provided in the capillary at least partially overlapping with a period in which the load is applied to the FAB. Thus, while the FAB is deformed by the load, the FAB is rubbed against the pad by the ultrasonic vibration propagating from the ultrasonic transducer.

The value of the drive current applied to the ultrasonic transducer after elapse of the predetermined time period from the contacting of the FAB with the pad is set so that the value obtained by dividing the drive current value by an intended bonding area of the FAB (first ball portion) after completion of bonding with the pad is no more than 0.0197 mA/μm². Application of ultrasonic vibration of an excessive energy amount to the FAB after the predetermined time period from the contacting of the FAB with the pad can thereby be prevented.

Satisfactory bonding of the copper wire (FAB) to the pad can thereby be achieved while preventing occurrence of crack or other damage in the pad and the layer below the pad due to excessive energy of the ultrasonic vibration.

The deformation of the FAB due to the load ends after some time from the contacting of the FAB with the pad. That is, the shape of the first ball portion is completed after some time from the contacting of the FAB with the pad. When the deformation of the FAB ends, the ultrasonic vibration applied to the FAB propagates to the bonding portion of the FAB and the pad substantially without attenuation. Thus, when ultrasonic vibration of an excessive energy amount is applied to the FAB after the end of deformation of the FAB, crack or other damage may occur in the pad or the layer below the pad below a peripheral edge portion of the first ball portion.

Thus, the invention of (2) provides the wire bonding method according to (1) in which the predetermined time period is set to a time period from the contacting of the FAB with the pad to the point at which the deformation of the FAB is substantially ended. Occurrence of damage in the pad or the layer below the pad below the peripheral edge portion of the first ball portion can thereby be prevented.

Also, if a large load continues to be applied to the first ball portion after completion of the shape of the first ball portion, the ultrasonic vibration will not propagate satisfactorily to the portion of contact of the FAB and the pad.

Thus, the invention of (3) provides the wire bonding method according to (2) in which in the step of applying the load to the FAB, a relatively large initial load is applied to the FAB by means of the capillary after the contacting of the FAB with the pad and, after the predetermined time period elapses from the contacting of the FAB with the pad, a relatively small load is applied to the FAB by means of the capillary. By the relatively large initial load being applied to the FAB after contacting of the FAB with the pad, the FAB, which is made of Cu that is a harder metal than Au, can be deformed satisfactorily. When the predetermined time period elapses from the contacting of the FAB with the pad, the load applied to the FAB is decreased and thus the ultrasonic vibration can be made to propagate satisfactorily to the portion of contact of the FAB (first ball portion) and the pad.

Also, the invention of (4) provides the wire bonding method according to (3) in which the magnitude of the initial load is set based on a value obtained by multiplying the intended bonding area of the FAB after completion of bonding with the pad by a fixed factor. The magnitude of the initial load can thereby be set appropriately in accordance with the intended bonding area of the first ball portion. Consequently, satisfactory deformation of the FAB can be achieved while satisfactorily preventing the occurrence of damage in the pad and the layer below the pad below a central portion of the first ball portion.

Also, the invention of (5) provides the wire bonding method according to any one of (1) to (4) in which, the value of the drive current applied to the ultrasonic transducer is increased gradually to the predetermined value after the FAB contacts the pad. Meanwhile, the FAB deforms in a squeezed manner and an area of the portion of contact of the FAB and the pad increases gradually. The ultrasonic vibration energy propagating from the ultrasonic transducer to the FAB is thereby increased gradually and the area of the FAB rubbed against the pad also increases gradually. Consequently, a state of satisfactory bonding to the pad can be realized up to the peripheral edge portion of the surface of bonding of the first ball portion with the pad while suppressing occurrence of damage in the pad and the layer below the pad due to rapid increase of the ultrasonic vibration energy propagating to the FAB below the central portion of the first ball portion.

Also, the invention of (6) provides the wire bonding method according to (5) in which the value of the drive current applied to the ultrasonic transducer is increased gradually to the predetermined value at a fixed rate of change after the FAB contacts the pad.

Features to be Ascertained from the Disclosure of the Fifteenth Preferred Embodiment For example, the following inventions of (1) to (3) can be ascertained from the disclosure of the fifteenth preferred embodiment.

The invention of (1) provides a wire bonding method including a step of forming an FAB (free air ball) at a tip of a copper wire held by a capillary, a step of making the capillary approach a pad formed on a top surface of a semiconductor chip and making the FAB contact the pad, a step of applying a load to the FAB by means of the capillary after the contacting of the FAB with the pad, and a step of applying a drive current to an ultrasonic transducer provided in the capillary after deformation of the FAB due to the application of the load to the FAB ends.

With the present wire bonding method, after the FAB formed on the tip of the copper wire is put in contact with a pad, a load is applied to the FAB by the capillary. The FAB in contact with the pad is thereby deformed.

When an excessive ultrasonic vibration is applied to the FAB during the deforming of the FAB, the energy of the ultrasonic vibration applied to the FAB may cause a crack or other damage to occur in the pad and/or the layer below the pad below a portion of contact of the FAB and the pad (central portion of the FAB (first ball portion) after completion of bonding).

The drive current is thus applied to the ultrasonic transducer provided in the capillary after the end of deformation of the FAB. The ultrasonic vibration is thus not applied to the FAB in the process of deforming and thus occurrence of damage in the pad and the layer below the pad below the central portion of the first ball portion can be prevented. Then, by the application of the ultrasonic vibration to the FAB after the end of deformation, the FAB can be rubbed against the pad and satisfactory bonding of the FAB and the pad can be achieved.

Satisfactory bonding of the copper wire (FAB) with the pad can thus be achieved while being able to prevent the occurrence of crack or other damage in the pad and the layer below the pad below the central portion of the first ball portion.

A load of some magnitude must be applied to the FAB in order to satisfactorily deform the FAB, which is made of Cu that is a harder metal than Au. However, if a large load continues to be applied to the first ball portion after the end of deformation of the FAB, the ultrasonic vibration will not propagate satisfactorily to the portion of contact of the first ball portion and the pad.

Thus, the invention of (2) provides the wire bonding method according to (1) in which, in the step of applying the load to the FAB, a relatively large initial load is applied to the FAB by means of the capillary after the contacting of the FAB with the pad and after elapse of the predetermined time period from the contacting of the FAB with the pad, a relatively small load is applied to the FAB by means of the capillary. By the relatively large initial load being applied to the FAB after contacting of the FAB with the pad, the FAB, which is made of Cu that is a harder metal than Au, can be deformed satisfactorily. When the predetermined time period elapses from the contacting of the FAB with the pad, the load applied to the FAB is decreased and thus the ultrasonic vibration can be made to propagate satisfactorily to the portion of contact of the FAB (first ball portion) and the pad.

Also, the invention of (3) provides the wire bonding method according to (2) in which the magnitude of the initial load is set based on a value obtained by multiplying the intended bonding area of the FAB after completion of bonding with the pad by a fixed factor. The magnitude of the initial load can thereby be set appropriately in accordance with the intended bonding area of the first ball portion. Consequently, satisfactory deformation of the FAB can be achieved while satisfactorily preventing the occurrence of damage in the pad and the layer below the pad below the central portion of the first ball portion.

Features to be Ascertained from the Disclosure of the Sixteenth Preferred Embodiment For example, the following inventions of (1) to (5) can be ascertained from the disclosure of the sixteenth preferred embodiment.

The invention of (1) provides a semiconductor device including an interlayer insulating film formed on a semiconductor substrate, an uppermost layer wiring made of copper and formed on the interlayer insulating film, a passivation film formed on the uppermost layer wiring and selectively exposing a top surface of the uppermost layer wiring as an electrode pad, and a bonding wire made of copper and bonded directly to the electrode pad.

With the present arrangement, the uppermost layer wiring is made of Cu (copper) and thus a wiring resistance can be reduced in comparison to a case where an Al (aluminum) wiring is adopted as the uppermost layer wiring.

Also, the bonding wire (Cu wire) made of Cu is bonded to the uppermost layer wiring (Cu wiring) that is exposed as the electrode pad and thus the connection of the electrode pad and the bonding wires can be arranged as a bond (Cu—Cu bond) of the same species of metal. Thus, even if the present semiconductor device is left to stand under a high temperature environment, interdiffusion of the components (that is, Cu) of the electrode pad and the bonding wire does not occur and the bonding of the electrode pad and the bonding wire can be maintained. A semiconductor device of excellent high temperature standing resistance and connection reliability can thus be provided.

Also, with the present invention, even if a stress is applied to the electrode pad or the interlayer insulating film directly below due to ultrasonic bonding of the Cu wire, the stress can be relaxed by the Cu pad. For example, in a case where the wiring is formed by a plating method, the characteristic that Cu can be made thicker in plating thickness more readily than Al can be taken into consideration to make the plating thickness of the Cu wiring (Cu pad) large and thereby further reduce the stress applied to the interlayer insulating film directly below the Cu pad. Consequently occurrence of crack in the interlayer insulating film directly below the Cu pad can be suppressed.

Also, the invention of (2) provides the semiconductor device according to (1) in which the bonding wire is stitch bonded directly to the electrode pad.

That is, with the semiconductor device of (1), the bonding wire may be stitch bonded directly to the electrode pad. Normally, with a mode of so-called reverse bonding in which the bonding wire is stitch bonded to the electrode pad, the bonding wire (wire main body) is bonded to the electrode pad via a stud bump unlike in the mode of ball bonding the bonding wire to the electrode pad. A height of the wire with respect to a top surface of the semiconductor substrate is thus made the same as in the case of ball bonding. Consequently, even if the bonding wire droops, there is no danger of the drooped portion contacting an edge of the semiconductor substrate and causing edge shorting.

However, by making the Cu pad thicker by the plating method in consideration of the characteristic that Cu can be made thicker in plating thickness more readily than Al, a bonding position (stitch bonding position) of the bonding wire with respect to the Cu pad can be raised adequately with respect to the top surface of the semiconductor substrate. The height of the bonding wire with respect to the top surface of the semiconductor substrate can thereby be made adequately high as if there is a stud bump, and thus even if the wire main body is stitch bonded directly to the electrode pad, a drooped portion of the wire will not reach the edge of the semiconductor substrate. That is, contact of the bonding wire with the semiconductor substrate can be prevented and thus edge shorting can be prevented.

That is, although in the case of stitch bonding to an electrode pad, a capillary load and a strength of ultrasonic waves must normally be applied at two to three times that in the case of ball bonding (first bonding), if the electrode pad is a Cu pad, it can withstand damage applied to an application portion of the electrode pad. Also, as a structural merit, low looping of the bonding wire is enabled while avoiding edge shorting and the device can thus be made compact. Further, time required for bonding can be shortened significantly in comparison to the case of performing ball bonding to the Cu pad.

Also, the invention of (3) provides the semiconductor device according to (1) in which the bonding wire is bonded to the electrode pad by a stud bump. That is, with the semiconductor device according to (1), the bonding wire may be bonded to the electrode pad by a stud bump. In this mode, even if strong ultrasonic waves are applied to a ball for forming the stud bump in forming the stud bump on the Cu pad, splash, with which the electrode pad peels upward, hardly occurs unlike in a case where an Al pad is adopted.

Also, the invention of (4) provides the semiconductor device according to any one of (1) to (3) in which a thickness of the electrode pad is no less than 10 μm. The invention of (5) provides the semiconductor device according to any one of (1) to (4) in which the thickness of the electrode pad is 10 μm to 15 μm.

Features to be Ascertained from the Disclosure of the Seventeenth Preferred Embodiment For example, the following inventions of (1) to (4) can be ascertained from the disclosure of the seventeenth preferred embodiment.

The invention of (1) provides a semiconductor device including a semiconductor chip, an electrode pad made of a metal material that contains aluminum and formed on a top surface of the semiconductor chip, a bonding wire made of copper and connected to the electrode pad, and a resin package sealing the semiconductor chip and the bonding wire, and in which a pH of the resin package exceeds 4.5.

To achieve the seventeenth object, the present inventors diligently examined the cause of an electrically open state between a pad and a wire and thereby found that the pH of the resin package is the cause.

Specifically, when water enters into the interior of the package, copper is oxidized by the water and a film made of cuprous oxide ($CuO_2$) and cupric oxide (CuO) covers the wire top surface. With such a top surface film, oxidation of copper is accelerated and the volume proportion of cupric oxide increases when the resin package is under a low pH environment of comparative low pH (for example, pH=4.2 to 4.5). When the volume proportion of cupric oxide increases, the copper wire and the resin package may peel apart. A gap formed by the peeling apart of the copper wire and the resin package becomes a movement path for water and causes water to enter readily into the bond interface of the electrode pad and the copper wire. Corrosion of the aluminum pad (electrode pad) due to water entering into the bond interface thus progresses during an HAST, etc., and an electrically open state occurs.

In contrast, with the semiconductor device according to (1), the pH of the resin package exceeds 4.5 and the bonding wire is placed under an environment of higher pH than a low pH environment (for example, an environment of pH of no more than 4.5).

The forming of cupric oxide can thus be suppressed and volume increase of cupric oxide can be suppressed. The occurrence of peeling between the copper wire and the resin package can thus be suppressed.

Thus, even when the semiconductor device is placed in a situation where water enters readily into the interior of the package, as in a PCT (pressure cooker test) or HAST (highly accelerated temperature and humidity stress test), etc., there is no movement path for water between the copper wire and the resin package and thus entry of water into the bond interface of the electrode pad and the copper wire can be suppressed. Contact of water with the bond interface can thus be suppressed. Consequently, progress of corrosion of the electrode pad (aluminum pad) can be suppressed and thus an electrically open state across the pad-wire interval can be suppressed. The connection reliability of the semiconductor device can thus be improved.

Also, the invention of (2) provides the semiconductor device according to (1) in which the pH of the resin package exceeds 4.5 and is less than 7.0. Also, the invention of (3) provides the semiconductor device according to (1) or (2) in which the pH of the resin package is no less than 6.0 and less than 7.0.

That is, the pH of the resin package preferably exceeds 4.5 and is less than 7.0 as in the semiconductor device according to (2) and more preferably, is no less than 6.0 and less than 7.0 as in the semiconductor device according to (3). When the pH of the resin package is in such a range, occurrence of peeling between the copper wire and the resin package can be suppressed further. Also, the invention of (4) provides the semiconductor device according to any one of (1) to (3) that includes a lead frame having a die pad on which the semiconductor chip is mounted and a plurality of electrode leads disposed at a periphery of the die pad, and the lead frame is made of a Cu-based material that mainly contains Cu.

With the present arrangement, the bond of an electrode lead and a bonding wire is a mutual bond of the same metal species (Cu—Cu bond) and thus the formation of cupric oxide (CuO) at the interface of the electrode lead and the bonding wire can be suppressed. Volume increase of cupric oxide can thus be suppressed. Consequently, occurrence of peeling at the bond interface of the bonding wire and the resin package can be suppressed.

Features to be Ascertained from the Disclosure of the Eighteenth Preferred Embodiment For example, the following inventions of (1) to (5) can be ascertained from the disclosure of the eighteenth preferred embodiment.

The invention of (1) provides a semiconductor device including a first member made of a material that contains Al, a second member made of Cu and bonded with the first member, and a resin package that seals the first member and the second member, and in which a material of the resin package contains an ion capturing component having a property of capturing $Cl^-$ (chlorine ions).

Reaction of an AlCu alloy ($Cu_9Al_4$) and $Cl^-$ at the bond portion of the first member and the second member can thus be suppressed and formation of $Al_2O_3$ (alumina), which is the reaction product, can be prevented. Consequently, the first portion and the second portion can be prevented from being insulatingly separated by $Al_2O_3$. That is, occurrence of a continuity fault between the first member and the second member can be prevented.

Also, the invention of (2) provides the semiconductor device according to (1) further including a semiconductor chip and in which the first member is a pad provided on a top surface of the semiconductor chip and the second member is a wire with one end portion bonded to the pad. Also, the invention of (3) provides the semiconductor device according to (1) further including a semiconductor chip and in which the second member is a pad provided on a top surface of the semiconductor chip and the first member is a wire with one end portion bonded to the pad. Further, the invention of (4) provides the semiconductor device according to (1) further including a semiconductor chip and in which the second member is a frame provided at a periphery of the semiconductor chip and the first member is a wire with one end portion bonded to the frame.

That is, the first member may be a pad provided on a top surface of a semiconductor chip and the second member may be a wire with one end portion bonded to the pad.

Also, the first member may be a wire and the second member may be a pad provided on a top surface of the semiconductor chip and with one end portion of the wire bonded thereto.

Further, the first member may be a wire and the second member may be a frame provided at a periphery of the semiconductor chip and with one end portion of the wire bonded thereto. The frame may be a die pad to which a rear surface of the semiconductor chip is bonded or may be a lead disposed at the periphery of the semiconductor chip.

Also, the invention of (5) provides the semiconductor device according to any one of (1) to (4) in which the ion capturing component has a hydroxyl group.

That is, the ion capturing component preferably has a hydroxyl group. In this case, the ion capturing component can capture $Cl^-$ satisfactorily by an anion exchange reaction of the hydroxyl group and $Cl^-$.

Features to be Ascertained from the Disclosure of the Nineteenth and Twentieth Preferred Embodiments For example, the following inventions of (1) to (10) can be ascertained from the disclosure of the nineteenth and twentieth preferred embodiments.

The invention of (1) provides a semiconductor device including a first member made of a material that contains aluminum, a second member made of copper and bonded with the first member, and a resin package that seals the first member and the second member, and in which a material of the resin package contains an ion capturing component having a property of capturing chlorine ions and a pH of the resin package exceeds 4.5.

Also, the invention of (2) provides the semiconductor device according to (1) further including a semiconductor chip and in which the first member is a pad provided on a top surface of the semiconductor chip and the second member is a wire with one end portion bonded to the pad.

Also, the invention of (3) provides the semiconductor device according to (1) further including a semiconductor chip and in which the second member is a pad provided on a top surface of the semiconductor chip and the first member is a wire with one end portion bonded to the pad.

Also, the invention of (4) provides the semiconductor device according to (1), further including a semiconductor chip and in which the second member is a frame provided at a periphery of the semiconductor chip and the first member is a wire with one end portion bonded to the frame.

Also, the invention of (5) provides the semiconductor device according to (4) in which the semiconductor chip, includes an electrode pad formed thereon, the wire has a linearly-extending main body portion and a bond portion formed on one end of the main body portion and bonded to the electrode pad, and a ratio of the volume of the bond portion with respect to a cube of a wire diameter of the main body portion of the wire is 1.8 to 5.6.

Also, the invention of (6) provides the semiconductor device according to (4) in which the semiconductor chip includes a semiconductor substrate, a wiring formed on the semiconductor substrate, an insulating layer covering the wiring, a barrier layer formed on the insulating layer, and an electrode pad formed on the barrier layer at a position facing a portion of the wiring and bonded to the wire, and in plan view, an area of the wiring that overlaps a bond region of the wire and the electrode pad is no more than 26.8% of the area of the bond region.

Also, the invention of (7) provides the semiconductor device according to (4) in which the frame includes a die pad supporting the semiconductor chip, a bonding material made of a Bi-based material is interposed between the die pad and the semiconductor chip, and a spacer made of Cu is provided on a surface of the die pad that faces the semiconductor chip.

Also, the invention of (8) provides a semiconductor device including a semiconductor chip, an electrode pad formed on the semiconductor chip, a bonding wire made of copper and having a linearly-extending main body portion and a bond portion formed on one end of the main body portion and bonded to the electrode pad, and a resin package sealing the semiconductor chip and the bonding wire, and in which a material of the resin package contains an ion capturing component having a property of capturing chlorine ions and a ratio of the volume of the bond portion with respect to a cube of a wire diameter of the main body portion of the bonding wire is 1.8 to 5.6.

Also, the invention of (9) provides a semiconductor device including a semiconductor substrate, a wiring formed on the semiconductor substrate, an insulating layer covering the wiring, a barrier layer formed on the insulating layer, an electrode pad formed on the barrier layer at a position facing a portion of the wiring, a bonding wire made of copper and bonded to the electrode pad, and a resin package sealing the semiconductor substrate and the bonding wire, and in which a material of the resin package contains an ion capturing component having a property of capturing chlorine ions and in plan view, the area of the wiring that overlaps a bond region of the bonding wire and the electrode pad is no more than 26.8% of the area of the bond region. Also, the invention of (10) provides a semiconductor device including a semiconductor chip, a lead frame in turn including a die pad supporting the semiconductor chip and a lead surrounding the die pad, a bonding wire connecting an electrode pad of the semiconductor chip and the lead, a bonding material made of a Bi-based material and interposed between the die pad and the semiconductor chip, a spacer made of Cu and provided on a surface of the die pad that faces the semiconductor chip, and a resin package sealing the semiconductor chip and the bonding wire, and in which a material of the resin package contains an ion capturing component having a property of capturing chlorine ions.

The above characteristics ascertained from the disclosures of the first to twentieth preferred embodiments may be combined mutually among different preferred embodiments. Also, components indicated in the respective preferred embodiments may be combined within the scope of the present invention.

The present application corresponds to

Japanese Patent Application No. 2009-145637 filed in the Japan Patent Office on Jun. 18, 2009, Japanese Patent Application No. 2009-149856 filed in the Japan Patent Office on Jun. 24, 2009, Japanese Patent Application No. 2009-153919 filed in the Japan Patent Office on Jun. 29, 2009, Japanese Patent Application No. 2009-256873 filed in the Japan Patent Office on Nov. 10, 2009, Japanese Patent Application No. 2009-206139 filed in the Japan Patent Office on Sep. 7, 2009, Japanese Patent Application No. 2009-241547 filed in the Japan Patent Office on Oct. 20, 2009, Japanese Patent Application No. 2009-256874 filed in the Japan Patent Office on Nov. 10, 2009, Japanese Patent Application No. 2009-241548 filed in the Japan Patent Office on Oct. 20, 2009, Japanese Patent Application No. 2009-256875 filed in the Japan Patent Office on Nov. 10, 2009, Japanese Patent Application No. 2009-241549 filed in the Japan Patent Office on Oct. 20, 2009, Japanese Patent Application No. 2009-241591 filed in the Japan Patent Office on Oct. 20, 2009, Japanese Patent Application No. 2009-256877 filed in the Japan Patent Office on Nov. 10, 2009, Japanese Patent Application No. 2009-256878 filed in the Japan Patent Office on Nov. 10, 2009, Japanese Patent Application No. 2009-256879 filed in the Japan Patent Office on Nov. 10, 2009, Japanese Patent Application No. 2009-256880 filed in the Japan Patent Office on Nov. 10, 2009, Japanese Patent Application No. 2010-040398 filed in the Japan Patent Office on Feb. 25, 2010, Japanese Patent Application No. 2009-266678 filed in the Japan Patent Office on Nov. 24, 2009, and Japanese Patent Application No. 2010-000556 filed in the Japan Patent Office on Jan. 5, 2010, and the entire disclosures of the applications are incorporated herein by reference.

DESCRIPTION OF SYMBOLS

1A . . . Semiconductor device, 2A . . . Semiconductor chip, 4A . . . Electrode lead, 5A . . . Bonding wire, 6A . . . Resin package, 9A . . . Electrode pad, 16A . . . Water-impermeable insulating film, 21A . . . Top surface (of the semiconductor chip), 28A . . . Side surface (of the semiconductor chip), 41A . . . Top surface (of the electrode lead), 43A . . . Water-impermeable metal film, 50A . . . . Semiconductor device, 51A . . . Main body portion, 52A . . . . Pad bond portion, 53A . . . Lead bond portion, 61 . . . Top surface (of the resin package), 62A . . . Rear surface (of the resin package), 63A . . . Side surface (of the resin package), 71A . . . Electrode lead, 80A . . . Semiconductor device, 90A . . . Semiconductor device, 1B . . . Semiconductor device, 2B . . . Semiconductor chip, 5B . . . . Bonding wire, 9B . . . Electrode pad, 43B . . . Side surface (of a mesa portion), 45B . . . Side surface (of the mesa portion), 46B . . . Side surface (of the mesa portion), 51B . . . Main body portion, 52B . . . Pad bond portion, 54B . . . Base portion, 55B . . . Mesa portion, 56B . . . Projecting portion, 58B . . . Side surface (of the mesa portion), 1C . . . Semiconductor device, 2C . . . Semiconductor chip, 5C . . . . Bonding wire, 9C . . . Electrode pad, 23C . . . Capillary, 24C . . . FAB, 51C . . . Main body portion, 52C . . . . Pad bond portion, 1E . . . Semiconductor device, 9E . . . Electrode pad, 16E . . . Semiconductor substrate, 17E . . . First interlayer insulating film, 18E . . . Second interlayer insulating film, 19E . . . Third interlayer insulating film, 20E . . . Sandwiched portion, 24E . . . Second barrier layer, 25E . . . Third barrier layer, 26E . . . First wiring, 27E . . . Second wiring, 28E . . . Third wiring, 29E . . . Rectilinear portion, 33E . . . Bond region, 34E . . . Rectilinear portion, 1H . . . Semiconductor device, 2H . . . Semiconductor chip, 5H . . . . Copper wire, 25H . . . Pad, 29H . . . Bond portion, 31H . . . Pad, 32H . . . Pad main body portion (Al layer), 33H . . . Zn layer, 34H . . . Barrier layer, 41H . . . Pad, 1I . . .

Semiconductor device, 2I . . . Semiconductor chip, 5I . . . . Die pad, 6I . . . Lead, 9I . . . Silver thin film (silver plating), 13I . . . Bonding wire, 15I . . . Dummy wire (nonelectrical connecting member), 16I . . . Dummy wire (nonelectrical connecting member), 17I . . . Dummy wire (nonelectrical connecting member), 18I . . . Dummy wire (nonelectrical connecting member), 21I . . . Semiconductor device, 22I . . . Stud bump (nonelectrical connecting member), 31I . . . Semiconductor device, 32I . . . Dummy wire (nonelectrical connecting member), 33I . . . Stud bump (nonelectrical connecting member), 41I . . . Semiconductor device, 42I . . . Semiconductor chip, 45I . . . . Die pad, 46I . . . Lead, 47I . . . Silver thin film (silver plating), 50I . . . Bonding wire, 51I . . . Dummy wire (nonelectrical connecting member), 1J . . . Semiconductor device, 2J . . . Semiconductor chip, 5J . . . Island, 9J . . . Through-hole, 10J . . . Silver paste (bonding member), 14J . . . Rear surface wire, 22J . . . Island, 32J . . . Island, 35J . . . Upper surface, 36J . . . Rear surface, 41J . . . Semiconductor device, 42J . . . Semiconductor chip, 45J . . . Island, 51J . . . Silver paste (bonding member), 55J . . . Rear surface wire, 1K . . . Semiconductor device, 2K . . . Semiconductor chip, 3K . . . Die pad, 4K . . . Electrode lead, 7K . . . Si substrate, 10K . . . Lead frame, 11K . . . Bonding layer, 18K . . . Cu stud bump (spacer), 19K . . . Cu wire ring, 31K . . . Top surface (of the die pad), 72K . . . Rear surface (of the Si substrate), 93K . . . Cu layer, 111K . . . Bi-based material layer, 112K . . . Cu—Sn alloy layer, 113K . . . Cu—Sn alloy layer, 1R . . . Semiconductor device, 2R . . . Semiconductor chip, 5R . . . Bonding wire, 6R . . . Resin package, 9R . . . Electrode pad, 1S . . . Semiconductor device, 2S . . . Semiconductor chip, 3S . . . Die pad (frame), 4S . . . Lead (frame), 5S . . . Copper wire (second member), 6S . . . Resin package, 7S . . . Aluminum pad (first member)

What is claimed is:

1. A wire bonding method, comprising:
- forming an FAB at a tip of a copper wire held by a capillary;
- making the capillary approach a pad on a top surface of a semiconductor chip and making the FAB contact the pad;
- applying a load to the FAB by means of the capillary after the contacting of the FAB with the pad; and
- applying a drive current to an ultrasonic transducer provided in the capillary, the value of the drive current applied to the ultrasonic transducer being gradually increased to a predetermined value after contacting of the FAB with the pad.

2. The wire bonding method according to claim 1, wherein
- in a case where a bottleneck type capillary is used as the capillary, a value of the drive current applied to the ultrasonic transducer is set to a value that is no less than 1.3 times and no more than 1.5 times the value of the drive current in a case where a standard type capillary is used as the capillary.

3. The wire bonding method according to claim 2, wherein
- a value of the drive current in a case where a bottleneck type capillary is used as the capillary is set to 1.4 times the value of the drive current in a case where a standard type capillary is used as the capillary.

4. The wire bonding method according to claim 1, wherein
- the value of the drive current applied to the ultrasonic transducer is increased to the predetermined value at a fixed rate of change after contacting of the FAB with the pad.

5. The wire bonding method according to claim 1, wherein
- the drive current is applied to the ultrasonic transducer before the contacting of the FAB with the pad.

6. A method for manufacturing a semiconductor device comprising:
- forming an FAB at a tip of a copper wire held by a capillary;
- making the capillary approach a pad on a top surface of a semiconductor chip and making the FAB contact the pad;
- applying a load to the FAB by means of the capillary after the contacting of the FAB with the pad; and
- applying a drive current to an ultrasonic transducer provided in the capillary, the value of the drive current applied to the ultrasonic transducer being gradually increased to a predetermined value after contacting of the FAB with the pad.

7. The method for manufacturing a semiconductor device according to claim 6, wherein
- in a case where a bottleneck type capillary is used as the capillary, a value of the drive current applied to the ultrasonic transducer is set to a value that is no less than 1.3 times and no more than 1.5 times the value of the drive current in a case where a standard type capillary is used as the capillary.

8. The method for manufacturing a semiconductor device according to claim 7, wherein
- a value of the drive current in a case where a bottleneck type capillary is used as the capillary is set to 1.4 times the value of the drive current in a case where a standard type capillary is used as the capillary.

9. The method for manufacturing a semiconductor device according to claim 6, wherein
- the value of the drive current applied to the ultrasonic transducer is increased to the predetermined value at a fixed rate of change after contacting of the FAB with the pad.

10. The method for manufacturing a semiconductor device according to claim 6, wherein
- the drive current is applied to the ultrasonic transducer before the contacting of the FAB with the pad.

11. The method for manufacturing a semiconductor device according to claim 6, further comprising:
- bonding the copper wire to a lead around the semiconductor chip.

12. The method for manufacturing a semiconductor device according to claim 6, further comprising:
- forming a water-impermeable film so as to integrally cover the entire pad and an entire pad bond portion of the copper wire.

13. The method for manufacturing a semiconductor device according to claim 12, wherein
- the entire copper wire is covered with the water-impermeable film.

14. The method for manufacturing a semiconductor device according to claim 11, further comprising:
- forming a water-impermeable film so as to integrally cover the entire pad, an entire pad bond portion of the copper wire, the entire lead and an entire lead bond portion of the copper wire.

15. The method for manufacturing a semiconductor device according to claim 12, wherein the water-impermeable film includes an insulating film.

16. The method for manufacturing a semiconductor device according to claim 12, wherein the water-impermeable film includes a metal film.

17. The method for manufacturing a semiconductor device according to claim 16, wherein the metal film is made of nickel or palladium.

18. The method for manufacturing a semiconductor device according to claim 12, wherein the water-impermeable film is 0.5 μm to 3 μm thick.

19. A method for manufacturing a semiconductor device, comprising:

forming an FAB at a tip of a copper wire held by a capillary;

making the capillary approach a pad on a top surface of a semiconductor chip and making the FAB contact the pad;

applying a load to the FAB by means of the capillary after the contacting of the FAB with the pad;

applying a drive current to an ultrasonic transducer provided in the capillary; and forming a water-impermeable film, that includes a metal film, so as to integrally cover the entire pad and an entire pad bond portion of the copper wire.

20. The method for manufacturing a semiconductor device according to claim 19, wherein the metal film is made of nickel or palladium.

* * * * *